US012484435B2

(12) United States Patent
Kashiwazaki et al.

(10) Patent No.: US 12,484,435 B2
(45) Date of Patent: Nov. 25, 2025

(54) COMPOUND, LIGHT-EMITTING MATERIAL AND ORGANIC LIGHT-EMITTING ELEMENT

(71) Applicant: KYULUX, INC., Fukuoka (JP)

(72) Inventors: Takahiro Kashiwazaki, Fukuoka (JP); Yong Joo Cho, Fukuoka (JP); Terumichi Enomoto, Fukuoka (JP); Kaori Fujisawa, Fukuoka (JP); Momoko Morio, Fukuoka (JP); Aiko Goto, Fukuoka (JP); Kei Morimoto, Fukuoka (JP); Yuka Kodama, Fukuoka (JP); Kousei Kanahara, Fukuoka (JP); Kiyomasa Sueishi, Fukuoka (JP); Hiroaki Ozawa, Fukuoka (JP)

(73) Assignee: KYULUX, INC., Fukuoka (JP)

( * ) Notice: Subject to any disclaimer, the term of this patent is extended or adjusted under 35 U.S.C. 154(b) by 754 days.

(21) Appl. No.: 17/839,891

(22) Filed: Jun. 14, 2022

(65) Prior Publication Data

US 2023/0064110 A1 Mar. 2, 2023

(30) Foreign Application Priority Data

Jun. 23, 2021 (JP) ................................ 2021-103702
Sep. 17, 2021 (JP) ................................ 2021-151805

(51) Int. Cl.
*H10K 85/30* (2023.01)
*C07F 5/02* (2006.01)
(Continued)

(52) U.S. Cl.
CPC ........... *H10K 85/322* (2023.02); *C07F 5/027* (2013.01); *C09K 11/06* (2013.01);
(Continued)

(58) Field of Classification Search
CPC .. H10K 85/322; H10K 2101/90; H10K 50/11; C07F 5/027; C09K 11/06; C09K 2211/1018
(Continued)

(56) References Cited

U.S. PATENT DOCUMENTS

2022/0123228 A1 4/2022 Hoshi

FOREIGN PATENT DOCUMENTS

CN 110407858 A 11/2019
CN 110872316 A 3/2020
(Continued)

OTHER PUBLICATIONS

Extended European Search Report dated Dec. 17, 2024 issued in the corresponding European patent application No. 22828271.1.
(Continued)

*Primary Examiner* — Anita Nassiri-Motlagh
(74) *Attorney, Agent, or Firm* — Troutman Pepper Locke LLP

(57) ABSTRACT

A compound of the following structure has excellent luminescence characteristics. One of $X^1$ and $X^2$ is N and the other is B, and $R^1$ to $R^{26}$, $A^1$, and $A^2$ are H or substituents.
(Continued)

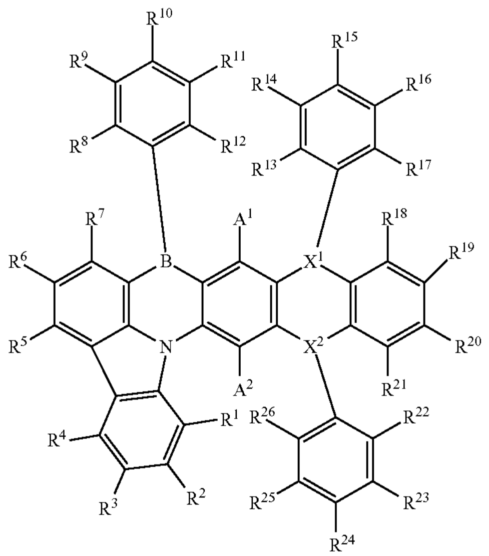

19 Claims, 1 Drawing Sheet

(51) Int. Cl.
*C09K 11/06* (2006.01)
*H10K 50/11* (2023.01)
*H10K 101/00* (2023.01)

(52) U.S. Cl.
CPC ...... *C09K 2211/1018* (2013.01); *H10K 50/11* (2023.02); *H10K 2101/90* (2023.02)

(58) Field of Classification Search
USPC ..................................................... 252/301.16
See application file for complete search history.

(56) References Cited

FOREIGN PATENT DOCUMENTS

| | | | |
|---|---|---|---|
| CN | 112174992 | A | 1/2021 |
| CN | 112341482 | A | 2/2021 |
| CN | 113402537 | A | 9/2021 |
| JP | 2020-132636 | A | 8/2020 |
| TW | 202000676 | A | 1/2020 |
| WO | 2015022974 | A1 | 2/2015 |
| WO | 2019052940 | A1 | 3/2019 |
| WO | 2021/245221 | A1 | 12/2021 |
| WO | 2022/270600 | A1 | 12/2022 |
| WO | 2022/270602 | A1 | 12/2022 |

OTHER PUBLICATIONS

Hansch, et al., A Survey of Hammett Substituent Constants and Resonance and Field Parameters, Chem. Rev., 91:165-195 (1991).

International Preliminary Report on Patentability with translation for International application No. PCT/JP2022/023781 dated Dec. 14, 2023.

International Search Report for International application No. PCT/JP2022/023781 dated Aug. 30, 2022.

International Preliminary Report on Patentability with translation for International application No. PCT/JP2022/025188 dated Dec. 14, 2023.

International Search Report for International application No. PCT/JP2022/025188 dated Aug. 16, 2022.

International Preliminary Report on Patentability with translation for International application No. PCT/JP2022/025197 dated Dec. 14, 2023.

International Search Report for International application No. PCT/JP2022/025197 dated Aug. 16, 2022.

Extended European Search Report dated Aug. 27, 2024 issued in the related European patent application No. 22828518.5.

Extended European Search Report dated Aug. 29, 2024 issued in the related European patent application No. 22828516.9.

Hatakeyama, et al. "Ultrapure Blue Thermally Activated Delayed Fluorescence Molecules: Effi cient HOMO-LUMO Separation by the Multiple Resonance Effect", Adv. Mater. 2016, 28, pp. 2777-2781 (2016).

Liang et al., "Peripheral Amplification of Multi-Resonance Induced Thermally Activated Delayed Fluorescence for Highly Efficient OLEDs", Angew. Chem. Int. Ed. 2018, 57, pp. 11316-11320 (2018).

Komino et al., "Dipole orientation analysis without optical simulation: application to thermally activated delayef luorescence emitters doped in host matrix", Scientific reports 7.1 (Aug. 2017), pp. 1-8.

Office Action dated Jun. 4, 2025 issued in the related U.S. Appl. No. 18/572,986.

Office Action dated Sep. 17, 2025, issued in the corresponding Taiwanese patent application No. 111122371 with its English Translation.

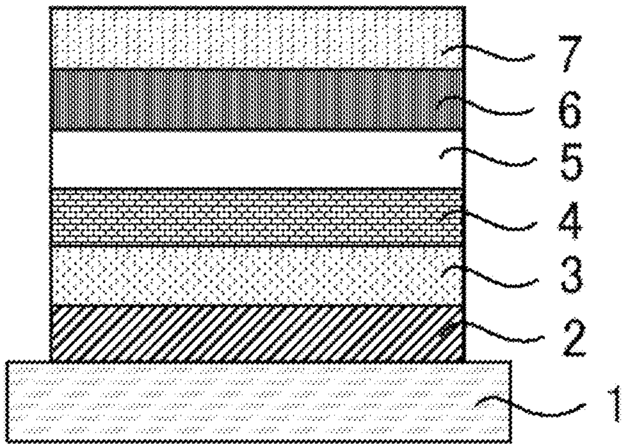
7
6
5
4
3
2
1

COMPOUND, LIGHT-EMITTING MATERIAL AND ORGANIC LIGHT-EMITTING ELEMENT

BACKGROUND ART

The present invention relates to a compound having good luminescence characteristics. Further, the present invention also relates to a light-emitting material using the compound and an organic light-emitting device.

Researches have been actively conducted to improve the luminous efficiency of organic light-emitting devices such as organic light emitting diodes (OLEDs). For example, Non-Patent Document 1 describes that when a compound that exhibits a multiple resonance effect, such as 5,9-diphenyl-5H,9H-[1,4]benzazaborino[2,3,4-kl]phenazaborine (DABNA-1), is used, thermal activation-type delayed fluorescence is expressed by an inverse intersystem crossing process, and then light emission with narrow half width and high color purity is realized. Such light emission is useful in display-oriented purposes because high luminous efficiency can be achieved.

Non-Patent Document 1 Adv. Mater. 2016, 28, 2777-2781

Non-Patent Document 2 Angew. Chem. Int. Ed. 2018, 57, 11316-11320

Further, Non-Patent Documents 1 and 2 describe that through modification of DABNA-1, energy levels such as the highest occupied molecular orbital (HOMO) and the lowest unoccupied molecular orbital (LUMO) are adjusted, and a fluorescence radiation process or an inverse intersystem crossing process which contributes to light emission is promoted, thereby improving the electroluminescence quantum efficiency.

SUMMARY OF INVENTION

In this manner, although various studies have been conducted on compounds that exhibit the multiple resonance effect, there are also many unknown points about the relationship between the structure and the luminescence characteristics. In order to manufacture a practical light emitting device, it is required to provide a material having excellent luminescence characteristics as much as possible.

Therefore, the present inventors have examined the relationship between the derivative of a compound exhibiting the multiple resonance effect and the luminescence characteristics, and have conducted intensive studies for the purpose of generalizing a structure exhibiting excellent luminescence characteristics.

The present inventors have conducted the intensive studies, and as a result, have found that among compounds exhibiting the multiple resonance effect, those having a specific structure have excellent luminescence characteristics. The present invention is suggested on the basis of such findings, and has the following configurations.

[1] A compound represented by the following formula (1).

Formula (1)

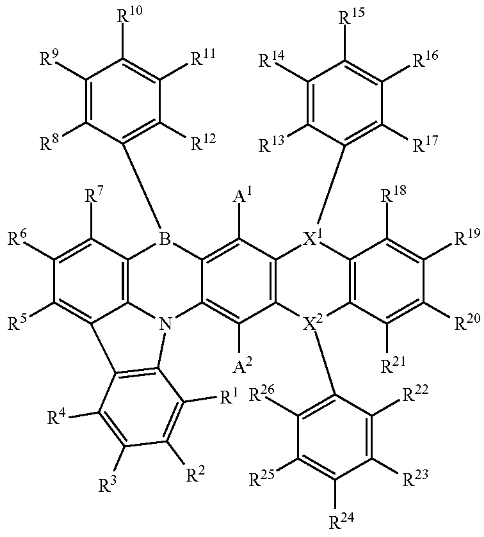

[In the formula (1), one of $X^1$ and $X^2$ is a nitrogen atom, and the other is a boron atom. Each of $R^1$ to $R^{26}$, $A^1$, and $A^2$ independently represents a hydrogen atom, a deuterium atom, or a substituent. $R^1$ and $R^2$, $R^2$ and $R^3$, $R^3$ and $R^4$, $R^4$ and R, $R^5$ and $R^6$, $R^6$ and $R^7$, $R^7$ and $R^8$, $R^8$ and $R^9$, $R^9$ and $R^{10}$, $R^{10}$ and $R^{11}$, $R^{11}$ and $R^{12}$, $R^{13}$ and $R^{14}$, $R^{14}$ and $R^{15}$, $R^{15}$ and $R^{16}$, $R^{16}$ and $R^{17}$, $R^{17}$ and $R^{18}$, $R^{18}$ and $R^{19}$, $R^{19}$ and $R^{20}$, $R^{20}$ and $R^{21}$, $R^{21}$ and $R^{22}$, $R^{22}$ and $R^{23}$, $R^{23}$ and $R^{24}$, $R^{24}$ and $R^{25}$, and $R^{25}$ and $R^{26}$ may be bonded to each other to form ring structures. Here, when $X^1$ is a nitrogen atom, $R^7$ and $R^{18}$ are bonded to each other to form a single bond and to form a pyrrole ring, and when $X^2$ is a nitrogen atom. $R^{21}$ and $R^{22}$ are bonded to each other to form a single bond and to form a pyrrole ring.

Here, when $X^1$ is a nitrogen atom, $R^7$ and $R^8$ and $R^{21}$ and $R^{22}$ are bonded via nitrogen atoms to form 6-membered rings, and $R^{17}$ and $R^{18}$ are bonded to each other to form a single bond, at least one of $R^1$ to $R^6$ is a substituted or unsubstituted aryl group, or an aromatic ring or a heteroaromatic ring is formed through bonding in any of $R^1$ and $R^2$, $R^2$ and $R^3$, $R^3$ and $R^4$, $R^4$ and $R^5$, and $R^5$ and $R^6$.

Further, when $X^1$ is a boron atom, $X^2$ is a nitrogen atom, and $R^7$ and $R^8$, and $R^7$ and $R^{18}$ are bonded to each other to form boron atom-containing ring structures, the ring structure is a 5 to 7-membered ring. In the case of a 6-membered ring, $R^7$ and $R^8$, and $R^{17}$ and $R^{18}$ are bonded to each other to form —B($R^{32}$)—, —CO—, —CS— or —N($R^{27}$)—. $R^{27}$ represents a hydrogen atom, a deuterium atom, or a substituent.

Further, when any of $R^7$ to $R^8$ is a substituted amino group, at least $R^5$ is a substituted amino group.

Further, the case where $R^7$ and $R^8$ are not bonded to each other to form a ring structure is represented by the following formula (1a) or the following formula (1b)]

Formula (1a)

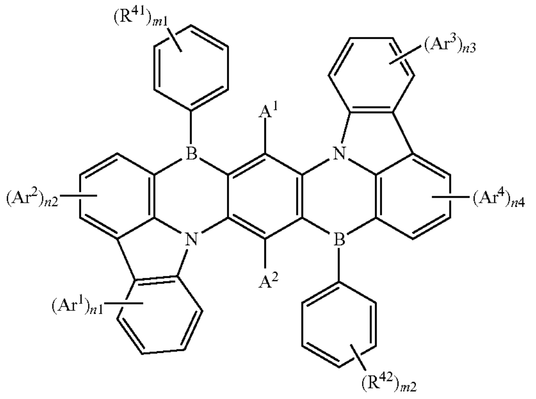

Formula (1b)

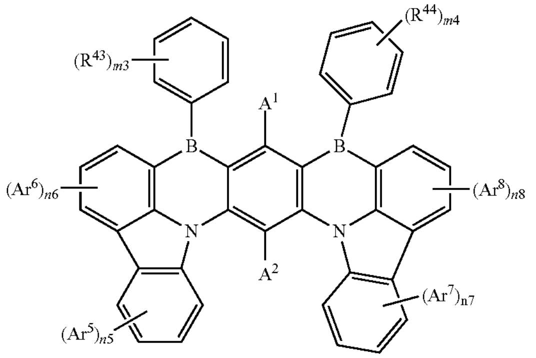

[In the formula (1a), each of $Ar^1$ to $Ar^4$ independently represents a substituted or unsubstituted aryl group, a substituted or unsubstituted heteroaryl group, or a substituted or unsubstituted alkyl group. Each of $R^{41}$ and $R^{42}$ independently represents a substituted or unsubstituted alkyl group. Each of m1 and m2 independently represents an integer of 1 to 5, each of n1 and n3 independently represents an integer of 0 to 4, and each of n2 and n4 independently represents an integer of 0 to 3. Here, at least one of n1 to n4 is 1 or more. Each of $A^1$ and $A^2$ independently represents a hydrogen atom, a deuterium atom, or a substituent.

In the formula (1b), each of $Ar^5$ to $Ar^8$ independently represents a substituted or unsubstituted aryl group, a substituted or unsubstituted heteroaryl group, or a substituted or unsubstituted alkyl group. Each of $R^{43}$ and $R^{44}$ independently represents a substituted or unsubstituted alkyl group. Each of m3 and m4 independently represents an integer of 1 to 5, each of n5 and n7 independently represents an integer of 0 to 4, and each of n6 and n8 independently represents an integer of 0 to 3. Here, at least one of n5 to n8 is 1 or more. Each of $A^1$ and $A^2$ independently represents a hydrogen atom, a deuterium atom, or a substituent.]

[2] The compound described in [1], in which $X^1$ is a nitrogen atom, and $X^2$ is a boron atom.

[2'] The compound described in [1], in which $X^1$ is a boron atom, and $X^2$ is a nitrogen atom.

[3] The compound described in any one of [1] to [2'], in which benzofuran rings or benzothiophene rings are newly formed through bonding in one to six sets among $R^1$ and $R^2$, $R^2$ and $R^3$, $R^3$ and $R^4$, $R^4$ and $R^5$, $R^5$ and $R^6$, $R^6$ and $R^7$, $R^8$ and $R^9$, $R^9$ and $R^{10}$, $R^{10}$ and $R^{11}$, $R^{11}$ and $R^{12}$, $R^{13}$ and $R^{14}$, $R^{14}$ and $R^{15}$, $R^{15}$ and $R^{16}$, $R^{16}$ and $R^{17}$, $R^{18}$ and $R^{19}$, $R^{19}$ and $R^{20}$, $R^{20}$ and $R^{21}$, $R^{22}$ and $R^{23}$, $R^{23}$ and $R^{24}$, $R^{24}$ and $R^{25}$, and $R^{25}$ and $R^{26}$.

[4] The compound described in any one of [1] to [3], in which at least one of $R^3$ and $R^6$ is a substituent.

[5] The compound described in any one of [1] to [3], in which both $R^3$ and $R^6$ are substituents.

[6] The compound described in [4] or [5], in which the substituent represented by $R^3$ and $R^6$ is one group selected from the group consisting of an alkyl group and an aryl group, or a group formed by combining two or more thereof.

[7] The compound described in any one of [1] to [6], in which both $R^8$ and $R^{12}$ are substituents, preferably alkyl groups having 3 or more carbon atoms.

[8] The compound described in [1], which is represented by the formula (1a).

[8'] The compound described in [1], which is represented by the formula (1 b).

[9] The compound described in any one of [1] to [8'], in which each of $A^1$ and $A^2$ is independently a group having a Hammett σp value greater than 0.2.

[10] The compound described in [9], in which both $A^1$ and $A^2$ are cyano groups.

[11] The compound described in [9], in which both $A^1$ and $A^2$ are halogen atoms.

[12] The compound described in any one of [11] to [11], which has a rotationally symmetric structure.

[13] The compound described in [1], which has any of following structures.

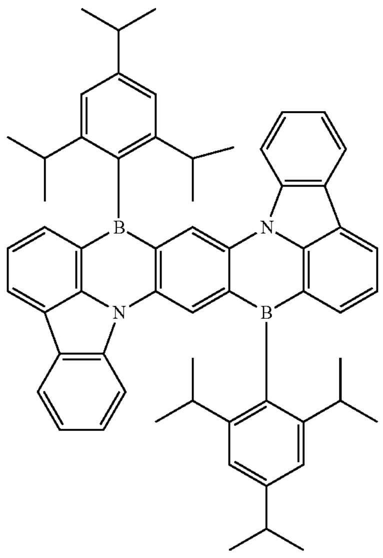

-continued
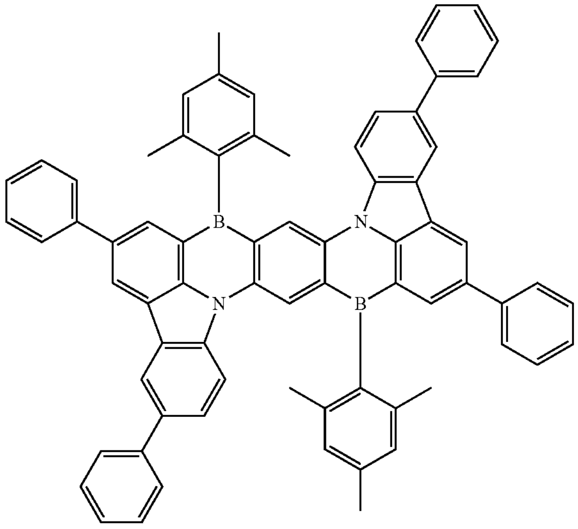
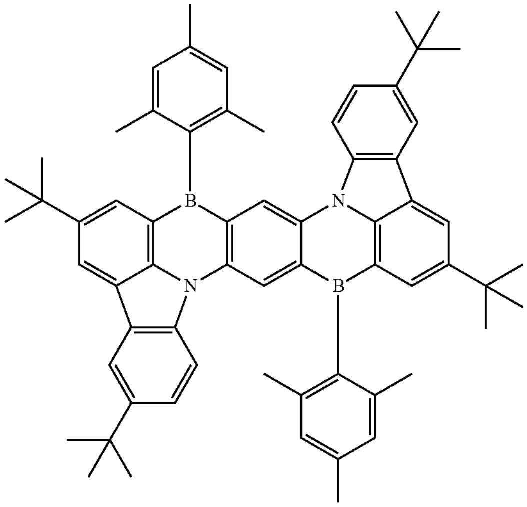
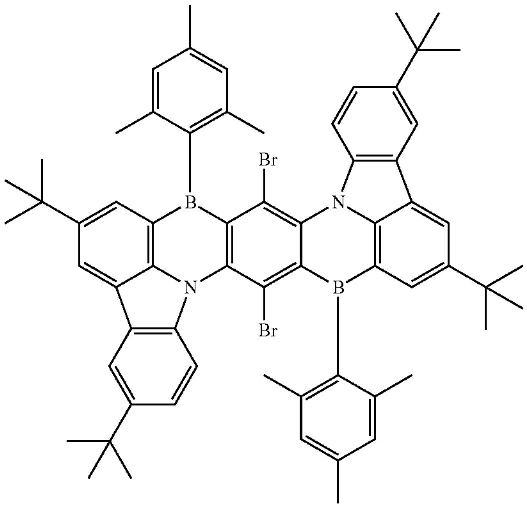
-continued
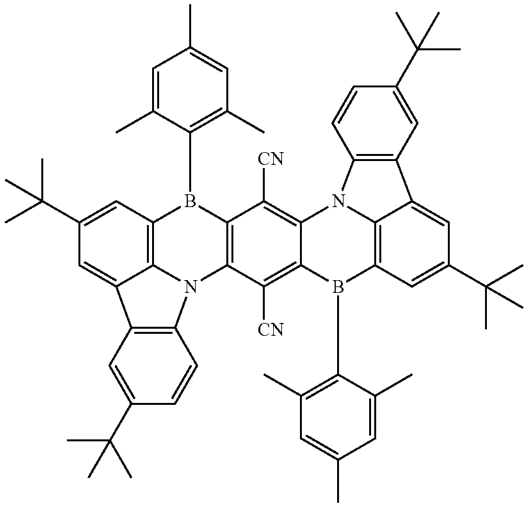
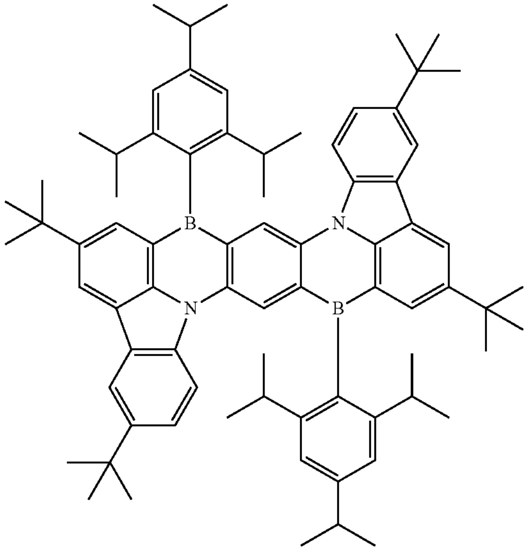
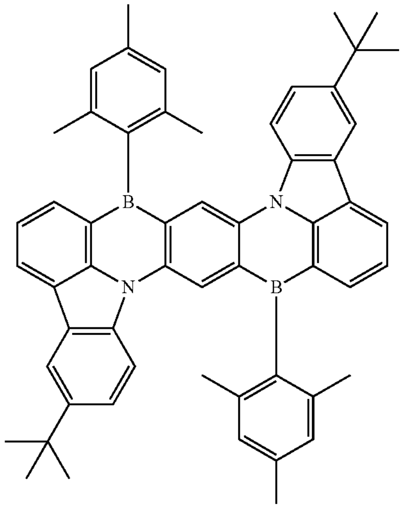

-continued

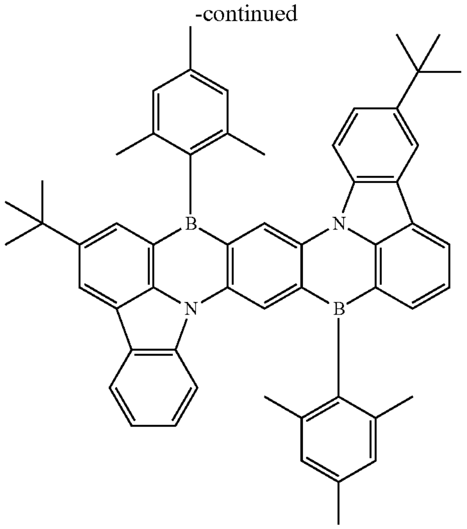

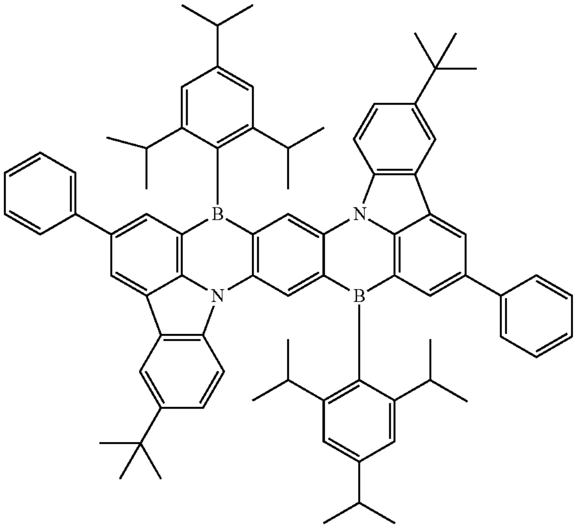

[15] A light-emitting material including the compound described in any one of [1] to [14].

[16] A film including the compound described in any one of [1] to [14].

[17] An organic semiconductor device including the compound described in any one of [1] to [14].

[18] An organic light-emitting device including the compound described in any one of [1] to [14].

[19] The organic light-emitting device described in [18], which has a light emitting layer including a host material, a delayed fluorescence material, and the compound, in which among materials included in the device, the amount of light emitted from the compound is the largest.

[20] The organic light-emitting device described in [18] or [19], which emits delayed fluorescence.

The compound of the present invention exhibits excellent luminescence characteristics. The compound of the present invention is useful as a material of an organic light-emitting device.

BRIEF DESCRIPTION OF DRAWINGS

The drawing is a schematic sectional view illustrating a configuration example of a layer of an organic electroluminescence device.

DESCRIPTION OF EMBODIMENTS

Hereinafter, the contents of the present invention will be described in detail. The descriptions on constituent elements to be described below may be made on the basis of representative embodiments or specific examples of the present invention, but the present invention is not limited to such embodiments or specific examples. The numerical value range represented by using "to" in the present specification means a range including numerical values described before and after "to", as the lower limit value and the upper limit value. Further, a part or all of hydrogen atoms present in the molecule of the compound used in the present invention may be replaced with deuterium atoms ($^2H$, deuterium D). In the chemical structural formula of the present specification, the hydrogen atom is indicated by H, or the indication thereof is omitted. For example, when the indication of an atom bonded to a ring skeleton forming carbon atom of a benzene ring is omitted, it is assumed that, at a location where the indication is omitted. H is bonded to the ring skeleton forming carbon atom. In the present specification, the term of "substituent" means an atom or a group of atoms other than a hydrogen atom and a deuterium atom. Meanwhile, the term of "substituted or unsubstituted" means that a hydrogen atom may be substituted with a deuterium atom or a substituent.

[Compound Represented by Formula (I)]

A compound represented by the following formula (1) will be described.

Formula (1)

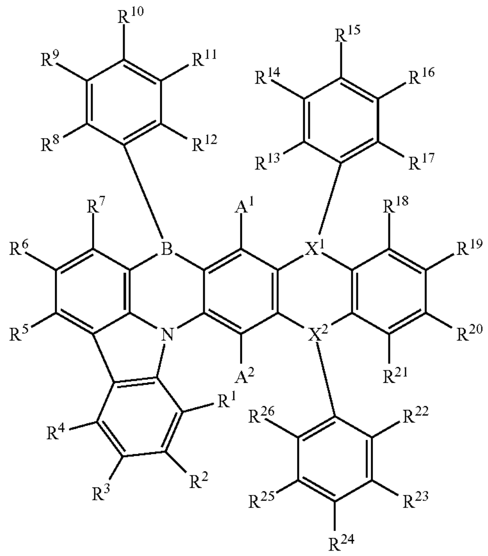

In the formula (1), one of $X^1$ and $X^2$ is a nitrogen atom, and the other is a boron atom. In one aspect of the present invention, $X^1$ is a nitrogen atom, and $X^2$ is a boron atom. Here, $R^{17}$ and $R^{18}$ are bonded to each other to form a single bond so as to form a pyrrole ring. In another aspect of the present invention, $X^1$ is a boron atom, and $X^2$ is a nitrogen atom. Here. $R^{21}$ and $R^{22}$ are bonded to each other to form a single bond so as to form a pyrrole ring.

In the formula (1), each of $R^1$ to $R^{26}$, $A^1$, and $A^2$ independently represents a hydrogen atom, a deuterium atom, or a substituent.

$R^1$ and $R^2$, $R^2$ and $R^3$, $R^3$ and $R^4$, $R^4$ and $R^5$, $R^5$ and $R^6$, $R^6$ and $R^7$, $R^7$ and $R^8$, $R^8$ and $R^9$, $R^9$ and $R^{10}$, $R^{10}$ and $R^{11}$, $R^{11}$ and $R^{12}$, $R^{13}$ and $R^{14}$, $R^{14}$ and $R^{15}$, $R^{15}$ and $R^{16}$, $R^{16}$ and $R^{17}$, $R^{17}$ and $R^{18}$, $R^{18}$ and $R^{19}$, $R^{19}$ and $R^{20}$, $R^{20}$ and $R^{21}$, $R^{21}$ and $R^{22}$, $R^{22}$ and $R^{23}$, $R^{23}$ and $R^{24}$, $R^{24}$ and $R^{25}$, and $R^{25}$ and $R^{26}$ may be bonded to each other to form ring structures.

The ring structure formed by combining $R^7$ and $R^8$ includes a boron atom and four carbon atoms as ring skeleton forming atoms. The ring structure formed by combining $R^{17}$ and $R^{18}$ includes a boron atom and four carbon atoms as ring skeleton forming atoms when $X^1$ is a boron atom. When $X^1$ is a nitrogen atom, the ring structure is limited to a pyrrole ring. The ring structure formed by combining $R^{21}$ and $R^{22}$ includes a boron atom and four carbon atoms as ring skeleton forming atoms when $X^2$ is a boron atom. When $X^2$ is a nitrogen atom, the ring structure is limited to a pyrrole ring. When $R^7$ and $R^8$, $R^{17}$ and $R^{18}$, and $R^{21}$ and $R^{22}$ are bonded to each other to form boron atom-containing ring structures, the ring structure is preferably a 5 to 7-membered ring, more preferably a 5 or 6-membered ring, further preferably a 6-membered ring. When $R^7$ and $R^8$, $R^{17}$ and $R^{18}$, and $R^{21}$ and $R^{12}$ are bonded to each other, these preferably form a single bond, —O—, —S—, —N($R^{27}$)—, —C($R^{28}$)($R^{29}$)—, —Si($R^{30}$)($R^{31}$)—, —B($R^{32}$)—, —CO—, or —CS— by combining with each other, more preferably form —O—, —S— or —N($R^{27}$)—, further preferably form —N($R^{27}$)—. Here, each of $R^{27}$ to $R^{32}$ independently represents a hydrogen atom, a deuterium atom, or a substituent. As the substituent, a group selected from any of substituent groups A to E to be described below may be employed, but a substituted or unsubstituted alkyl group, a substituted or unsubstituted aryl group, or a substituted or unsubstituted heteroaryl group is preferable. In particular, $R^{27}$ is preferably a substituted or unsubstituted aryl group. When $R^{27}$ to $R^{32}$ are substituents, $R^{27}$ to $R^{32}$ in the ring formed by bonding $R^7$ and $R^8$ to each other may further form a ring structure by bonding to at least one of $R^6$ and $R^9$, $R^{27}$ to $R^{32}$ in the ring formed by bonding $R^{17}$ and $R^{18}$ to each other may further form a ring structure by bonding to at least one of $R^{16}$ and $R^{19}$, and $R^{27}$ to $R^{32}$ in the ring formed by bonding $R^{20}$ and $R^{22}$ to each other may further form a ring structure by bonding to at least one of $R^{20}$ and $R^{23}$. In one aspect of the present invention, in only one set among $R^7$ and $R^8$, $R^{17}$ and $R^{18}$, and $R^{21}$ and $R^{22}$, these are bonded to each other. In one aspect of the present invention, in only two sets among $R^7$ and $R^8$, $R^{17}$ and $R^{18}$, and $R^{21}$ and $R^{22}$, these are bonded to each other. In one aspect of the present invention, all of $R^7$ and $R^8$, $R^{17}$ and $R^{18}$, and $R^{21}$ and $R^{22}$ are bonded to each other.

The ring structure formed by bonding $R^1$ and $R^2$, $R^2$ and $R^3$, $R^3$ and $R^4$, $R^4$ and $R^5$, $R^5$ and $R^6$, $R^6$ and $R^7$, $R^8$ and $R^9$, $R^9$ and $R^{10}$, $R^{10}$ and $R^{11}$, $R^{11}$ and $R^{12}$, $R^{13}$ and $R^{14}$, $R^{14}$ and $R^{15}$, $R^{15}$ and $R^{16}$, $R^{16}$ and $R^{17}$, $R^{18}$ and $R^{19}$, $R^{19}$ and $R^{20}$, $R^{20}$ and $R^{21}$, $R^{22}$ and $R^{23}$, $R^{23}$ and $R^{24}$, $R^{24}$ and $R^{25}$, and $R^{25}$ and $R^{26}$ to each other may be an aromatic ring or an adipose ring, or may include a heteroatom. Further, one or more rings, as other rings, may be condensed. The heteroatom mentioned herein is preferably one selected from the group consisting of a nitrogen atom, an oxygen atom, and a sulfur atom. Examples of the ring structure to be formed include a benzene ring, a pyridine ring, a pyridazine ring, a pyrimidine ring, a pyrazine ring, a pyrrole ring, an imidazole ring, a pyrazole ring, a triazole ring, an imidazoline ring, a furan ring, a thiophene ring, an oxazole ring, an isooxazole ring, a thiazole ring, an isothiazole ring, a cyclohexadiene ring, a cyclohexene ring, a cyclopentene ring, a cycloheptatriene ring, a cycloheptadiene ring, a cycloheptene ring, and a ring in which one or more rings selected from the group consisting of these rings are further condensed. In a preferred aspect of the present invention, the ring structure is a substituted or unsubstituted benzene ring (further, a ring may be condensed), and is for example, a benzene ring which may be substituted with an alkyl group or an aryl group. In a preferred aspect of the present invention, the ring structure is a substituted or unsubstituted heteroaromatic ring, preferably a furan ring of benzofuran, or a thiophene ring of benzothiophene. Among $R^1$ and $R^2$, $R^2$ and $R^3$, $R^3$ and $R^4$, $R^4$ and $R^5$, $R^5$ and $R^6$, $R^6$ and $R^7$, $R^8$ and $R^9$, $R^9$ and $R^{10}$, $R^{10}$ and $R^{11}$, $R^{11}$ and $R^{12}$, $R^{13}$ and $R^{14}$, $R^{14}$ and $R^{15}$, $R^{15}$ and $R^{16}$, $R^{16}$ and $R^{17}$, $R^{18}$ and $R^{19}$, $R^{19}$ and $R^{20}$, $R^{20}$ and $R^{21}$, $R^{22}$ and $R^{23}$, $R^{23}$ and $R^{24}$, $R^{24}$ and $R^{25}$, and $R^{25}$ and $R^{26}$, the number of combinations that are bonded to each other to form ring structures may be 0, or may be, for example, any one of 1 to 6. For example, it may be any one of 1 to 4, 1 may be selected, 2 may be selected, or 3 or 4 may be selected. In one aspect of the present invention, in one set selected from $R^1$ and $R^2$, $R^2$ and $R^3$, and $R^3$ and $R^4$, a ring structure is formed through bonding. In one aspect of the present invention, $R^5$ and $R^6$ are bonded to each other to form a ring structure. In one aspect of the present invention, in one set selected from $R^9$ and $R^{10}$, $R^{10}$ and $R^{11}$, and $R^{11}$ and $R^{12}$, a ring structure is formed through bonding. In one aspect of the present invention, in both of $R^1$ and $R^2$, and $R^{13}$ and $R^{14}$, ring structures are formed through bonding. In one aspect of the present invention, in one set selected from $R^1$ and $R^2$, $R^2$ and $R^3$, and $R^3$ and $R^4$, a ring structure is formed through bonding, and moreover $R^5$ are $R^6$ are bonded to each other to form a ring structure. In one aspect of the present invention, in both of $R^5$ and $R^6$, and $R^{19}$ and $R^{20}$, ring structures are formed through bonding.

$R^1$ to $R^{26}$ which are not bonded to adjacent $R^n$ (n=1 to 26) together are hydrogen atoms, deuterium atoms or substituents. As the substituent, a group selected from any of substituent groups A to E to be described below may be employed.

preferable substituents that may be possessed by $R^1$ to $R^{26}$ are a substituted or unsubstituted alkyl group, a substituted or unsubstituted aryl group, and a substituted or unsubstituted heteroaryl group. For example, the substituent may be a substituted or unsubstituted aryl group, and for example the substituent may be a substituted or unsubstituted alkyl group. As the substituent of the alkyl group, the aryl group, or the heteroaryl group mentioned herein, a group selected from any of substituent groups A to E may also be employed. Meanwhile, one or more groups selected from the group consisting of an alkyl group, an aryl group and a heteroaryl group are preferred, and a group of a substituent group E is more preferred, and it may be unsubstituted. In a preferred aspect of the present invention, at least one of $R^1$ to $R^6$ is a substituent, preferably a group of a substituent group E. For example at least one of $R^2$ to $R^6$ is a substituent, preferably a group of a substituent group E. For example, at least one of $R^5$ and $R^6$ is a substituent, preferably a group of a substituent group E. In a preferred aspect of the present invention, at least one of $R^3$ and $R^6$ is a substituent, more preferably both are substituents, and a group of a substituent group E is preferred. In a preferred aspect of the present invention, when $X^1$ is a nitrogen atom, at least one of $R^{15}$ and $R^{2U}$ is a substituent, more preferably both are substituents, and a group of a substituent group E is preferred. Here, $R^{17}$ and $R^{18}$ are bonded to each other to form a single bond. In a preferred aspect of the present invention, when $X^2$ is a nitrogen atom, at least one of $R^{19}$ and $R^{24}$ is a substituent, more preferably both are substituents, and a group of a substituent group E is preferred. Here, $R^{11}$ and $R^{22}$ are bonded to each other to form a single bond. In one aspect of the present invention, at least one of $R^8$ and $R^{12}$ is a substituent, and preferably both are substituents. In one aspect of the present invention, $R^8$, $R^{10}$ and $R^{12}$ are substituents. As for the substituent of $R^8$ to $R^{12}$, an unsubstituted alkyl group is preferable. In particular, the case where $R^8$ and $R^{12}$ are alkyl groups having 2 or more carbon atoms (preferably alkyl groups having 3 or more carbon atoms, more preferably alkyl groups having 3 to 8 carbon atoms, further preferably alkyl groups having 3 to 4 carbon atoms) is preferable because orientation becomes high when a film is formed. Among them, particularly preferred is a case where $R^8$ and $R^{12}$ are substituents (preferably alkyl groups, more preferably alkyl groups having 2 or more carbon atoms, further preferably alkyl groups having 3 or more carbon atoms, still further preferably alkyl groups having 3 to 8 carbon atoms, particularly preferably alkyl groups having 3 or 4 carbon atoms), and moreover, at least one of $R^1$ to $R^6$ is a substituent (preferably a group of a substituent group E). When $X^1$ is a boron atom, at least one of $R^{13}$ and $R^{17}$ is a substituent, and preferably both are substituents. In one aspect of the present invention, when $X^1$ is a boron atom, $R^{13}$, $R^{15}$ and $R^{17}$ are substituents. When $X^1$ is a boron atom, as for the substituent of $R^{13}$ to $R^{17}$, an unsubstituted alkyl group is preferable. When $X^2$ is a boron atom, at least one of $R^{22}$ and $R^{26}$ is a substituent, and preferably both are substituents. In one aspect of the present invention, when $X^2$ is a boron atom, $R^{22}$, $R^{24}$ and $R^{26}$ are substituents. When $X^2$ is a boron atom, as for the substituent of $R^{22}$ to $R^{26}$, an unsubstituted alkyl group is preferable. Specific examples of the group that is bonded to the boron atom represented by B in the formula (1) or the boron atom represented by $X^1$ or $X^2$ will be given below. Meanwhile, groups bonded to the boron atom, which may be adopted in the present invention, are not construed as limiting to the following specific examples. In the present specification, indication of $CH_3$ is omitted for a methyl group. * represents a bond position.

Ar1

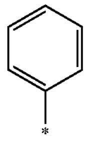

Ar2

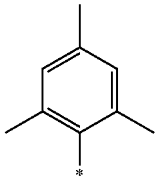

Ar3

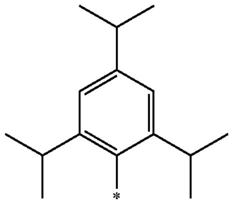

Ar4

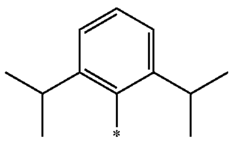

-continued

Ar5

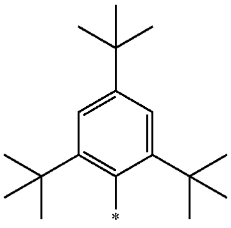

Ar6

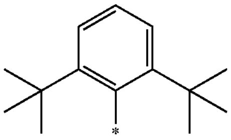

Ar7

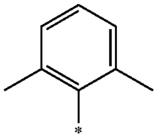

Ar8

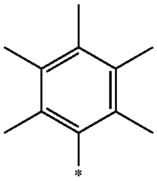

Hereinafter, specific examples of $R^1$ to $R^{26}$ in the formula (1) will be given. Z1 to Z9 are preferable as $R^1$ to $R^7$, as $R^{13}$ to $R^{21}$ when $X^1$ is a nitrogen atom, and as $R^{18}$ to $R^{26}$ when $X^2$ is a nitrogen atom. Z1 to Z7 are preferable as $R^8$ to $R^{12}$, as $R^{22}$ to $R^{26}$ when $X^1$ is a nitrogen atom, and as $R^{13}$ to $R^{17}$ when $X^2$ is a nitrogen atom. Meanwhile, groups bonded to the boron atom, which may be adopted in the present invention, are not construed as limiting to the following specific examples. D represents a deuterium atom. * represents a bond position.

Z1

*—H

Z2

*—D

Z3

*—$CH_3$

Z4

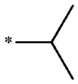

Z5

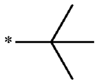

Z6

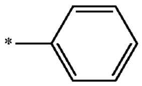

Z7

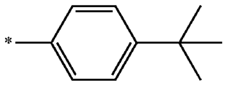

-continued

Z8

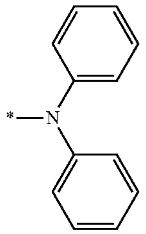

Z9

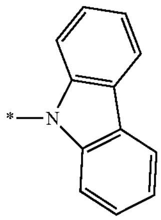

$A^1$ and $A^2$ are hydrogen atoms, deuterium atoms or substituents. As for the substituent, a group selected from any of substituent groups A to E to be described below may be adopted.

In a preferred aspect of the present invention, each of $A^1$ and $A^2$ is independently a hydrogen atom or a deuterium atom. For example, $A^1$ and $A^2$ are hydrogen atoms. For example, $A^1$ and $A^2$ are deuterium atoms.

One of $A^1$ and $A^2$ may be a substituent. Further, each of $A^1$ and $A^2$ may be independently a substituent. A preferable substituent that may be possessed by $A^1$ and $A^2$ is an acceptor group. The acceptor group is a group having a positive Hammett σp value. Here, the "Hammett σp value", which is proposed by L. P. Hammett, indicates the quantified effect of a substituent on the reaction rate or equilibrium of a para-substituted benzene derivative. Specifically, it is a constant (σp) peculiar to the substituent in the following equation, which is established between the substituent in the para-substituted benzene derivative and the reaction rate constant or the equilibrium constant:

$$\log(k/k_0)=\rho\sigma p$$

or $$\log(K/K_0)=\rho\sigma p.$$

In the equation, $k_0$ represents a rate constant of a benzene derivative having no substituent, k represents a rate constant of a benzene derivative substituted with a substituent, $K_0$ represents an equilibrium constant of a benzene derivative having no substituent, K represents an equilibrium constant of a benzene derivative substituted with a substituent, and ρ represents a reaction constant determined by the type and condition of the reaction. In relation to descriptions on "the Hammett σp value" and the numerical value of each substituent in the present invention, the description on the σp value may be referred to in Hansch, C. et. al., Chem. Rev., 91, 165-195(1991).

The acceptor group that may be possessed by $A^1$ and $A^2$ is more preferably a group having a Hammett σp value greater than 0.2. Examples of the group having a Hammett σp value greater than 0.2 include a cyano group, an aryl group substituted with at least a cyano group, a fluorine atom-containing group, and a substituted or unsubstituted heteroaryl group containing a nitrogen atom as a ring skeleton forming atom. The aryl group substituted with at least a cyano group, which is mentioned herein, may be substituted with a substituent other than the cyano group (for example, an alkyl group or an aryl group), but may be an aryl group substituted with only a cyano group. The aryl group substituted with at least a cyano group is preferably a phenyl group substituted with at least a cyano group. The number of substitutions of the cyano group is preferably one or two, and, for example, may be one or may be two. As the fluorine atom-containing group, a fluorine atom, an alkyl fluoride group, and an aryl group substituted with at least a fluorine atom or an alkyl fluoride group may be mentioned. The alkyl fluoride group is preferably a perfluoroalkyl group, and the number of carbon atoms is preferably 1 to 6, more preferably 1 to 3. Further, the heteroaryl group containing a nitrogen atom as a ring skeleton forming atom may be a monocycle, or may be a condensed ring in which two or more rings are condensed. In the case of a condensed ring, the number of rings after condensation is preferably two to six, and, for example, may be selected from two to four or may be two. Specific examples of the ring forming the heteroaryl group include a pyridine ring, a pyrimidine ring, a pyrazine ring, a triazine ring, a quinoline ring, an isoquinoline ring, a quinazoline ring, a quinoxaline ring, and a naphthyridine ring other than the quinazoline ring or the quinoxaline ring. The ring forming the heteroaryl group may be substituted with a deuterium atom or a substituent, and as for the substituent, for example, one group selected from the group consisting of an alkyl group, an aryl group and a heteroaryl group or a group formed by combining two or more thereof may be mentioned. As the acceptor group that $A^1$ and $A^2$ may have, a cyano group is particularly preferable.

In one aspect of the present invention, at least one of $A^1$ and $A^2$ is an acceptor group. In one aspect of the present invention, only one of $A^1$ and $A^2$ is an acceptor group. In one aspect of the present invention, both $A^1$ and $A^2$ are the same acceptor groups. In one aspect of the present invention. $A^1$ and $A^2$ are different acceptor groups. In one aspect of the present invention, $A^1$ and $A^2$ are cyano groups. In one aspect of the present invention, $A^1$ and $A^2$ are halogen atoms, e.g., bromine atoms.

Hereinafter, specific examples of the acceptor group that may be adopted in the present invention will be illustrated. Meanwhile, the acceptor group that may be used in the present invention is not construed as limiting to the following specific examples. In the present specification, indication of $CH_3$ is omitted for a methyl group. Thus, for example, A15 indicates a group including two 4-methylphenyl groups. Further, "D" represents a deuterium atom. * represents a bond position.

A1

A2

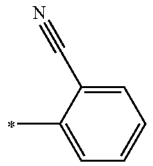

A3

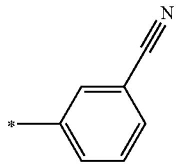

-continued
A4
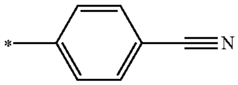
A5
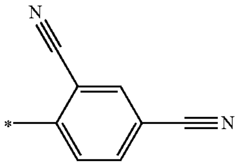
A6
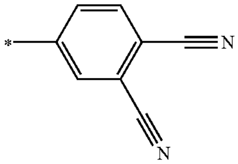
A7
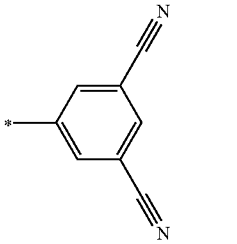
A8
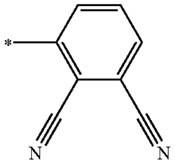
A9
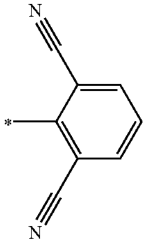
A10
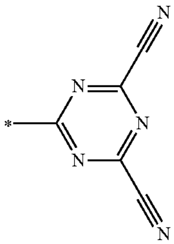
-continued
A11
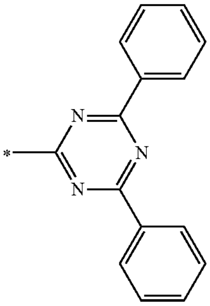
A12
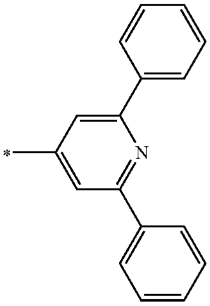
A13
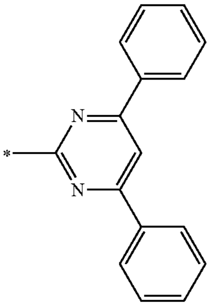
A14
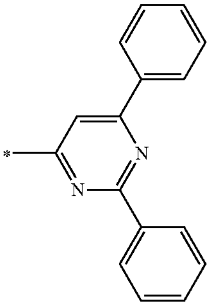
A15
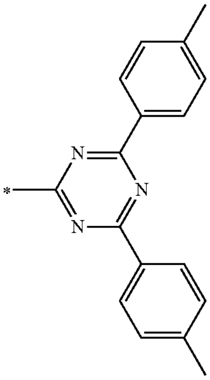

-continued
A16
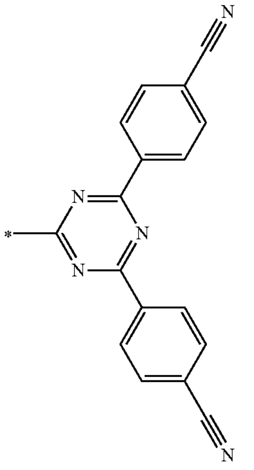
A17
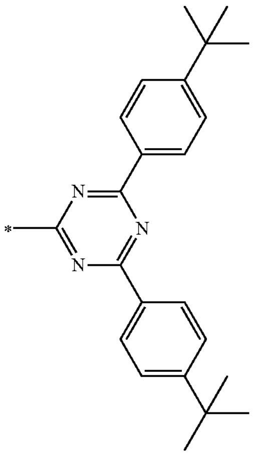
A18
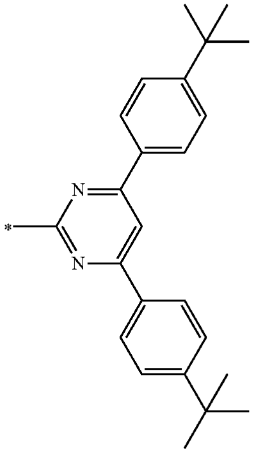
-continued
A19
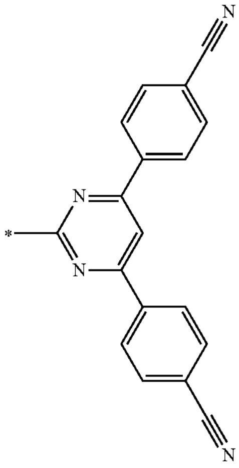
A20
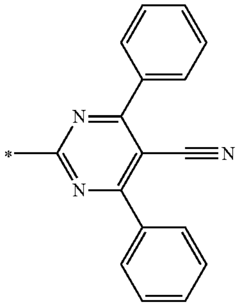
A21
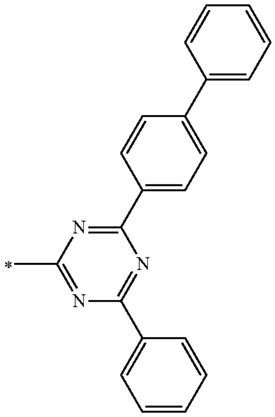
A22
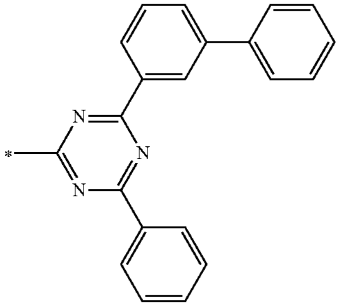

-continued
A23
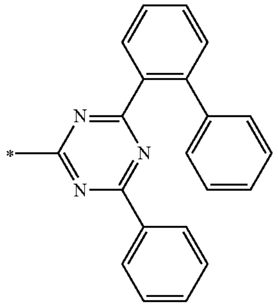
A24
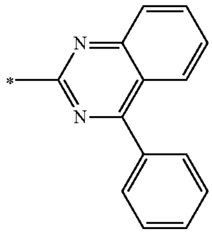
A25
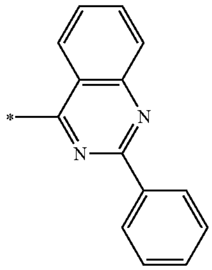
A26
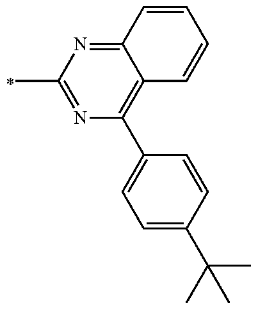
A27
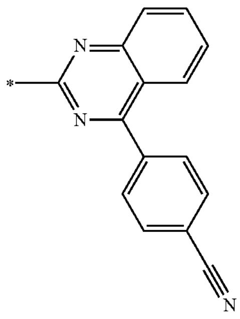
-continued
A28
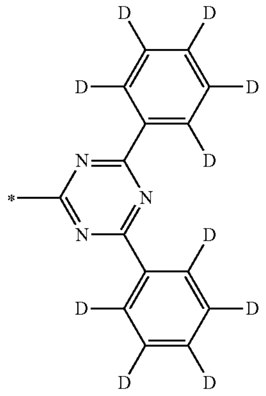
A29
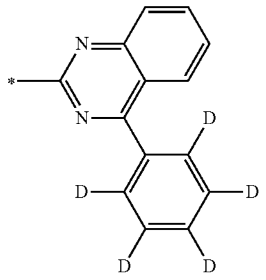
A30
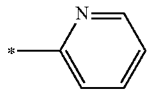
A31
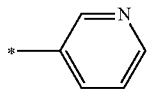
A32
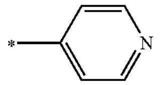
A33
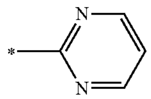
A34
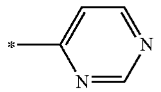
A35
*—$CF_3$
A36
*—$C_2F_5$
A37
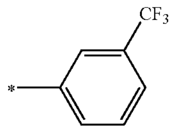
A38
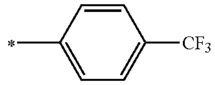
A39
*—F
A40
*—Cl -continued

A41

*—Br

A42

*—I

When $X^1$ is a nitrogen atom, $R^7$ and $R^8$ are bonded via a nitrogen atom to form a 6-membered ring, $R^{21}$ and $R^{22}$ are bonded via a nitrogen atom to form a 6-membered ring, and $R^{17}$ and $R^{18}$ are bonded to each other to form a single bond, at least one of $R^1$ to $R^6$ is a substituted or unsubstituted aryl group, or in any of $R^1$ and $R^2$, $R^2$ and $R^3$, $R^3$ and $R^4$, $R^4$ and $R^5$, and $R^5$ and $R^6$, an aromatic ring (a substituted or unsubstituted benzene ring which may be condensed) or a heteroaromatic ring (preferably a substituted or unsubstituted furan ring of benzofuran which may be condensed, or a substituted or unsubstituted thiophene ring of benzothiophene which may be condensed) is formed through bonding.

Further, when $X^1$ is a boron atom, $X^2$ is a nitrogen atom, and $R^7$ and $R^8$, and $R^{17}$ and $R^{18}$ are bonded to each other to form boron atom-containing ring structures, the ring structure is a 5 to 7-membered ring. In the case of a 6-membered ring, $R^7$ and $R^8$, and $R^{17}$ and $R^{18}$ are bonded to each other to form $-B(R^{32})-$, $-CO-$, $-CS-$ or $-N(R^{27})-$. $R^{27}$ preferably represents a hydrogen atom, a deuterium atom, or a substituent.

When $X^1$ of the formula (1) is a nitrogen atom, the compound of the present invention has the following skeleton (1a). When $X^2$ of the formula (1) is a nitrogen atom, the compound of the present invention has the following skeleton (1b).

Skeleton (1a)

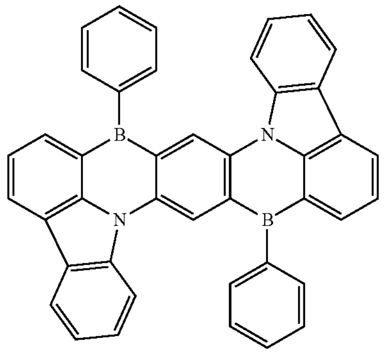

Skeleton (1b)

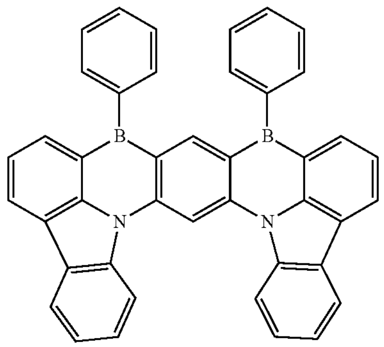

In the skeletons (1a) and (1b), each hydrogen atom may be substituted with a deuterium atom or a substituent. Further, it may be substituted with a linking group together with an adjacent hydrogen atom to form a ring structure. For details, corresponding descriptions on $R^1$ to $R^{26}$, $A^1$, and $A^2$ in the formula (1) may be referred to. Compounds, in which all phenyl groups bonded to boron atoms in the skeletons (1a) and (1b) are substituted with mesityl groups, 2,6-diisopropylphenyl groups or 2,4,6-triisopropylphenyl groups, may be exemplified. In one aspect of the present invention, each hydrogen atom in the skeletons (1a) and (1b) is not substituted with a linking group together with an adjacent hydrogen atom to form a ring structure.

As one preferable group of compounds having the skeleton (1a), compounds represented by the following formula (1a) may be exemplified.

Formula (1a)

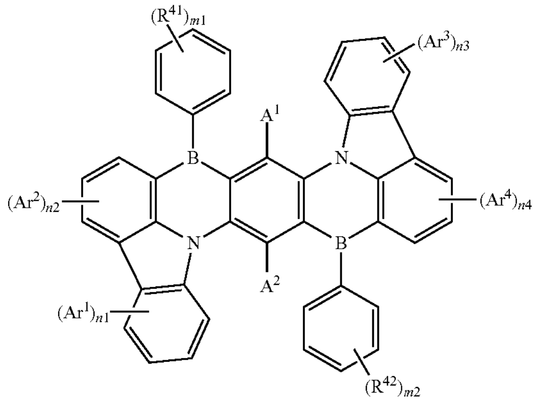

In the formula (1a), each of $Ar^1$ to $Ar^4$ independently represents a substituted or unsubstituted aryl group, a substituted or unsubstituted heteroaryl group, or a substituted or unsubstituted alkyl group, and, for example, a substituted or unsubstituted aryl group may be preferably selected. Each of $R^{41}$ and $R^{42}$ independently represents a substituted or unsubstituted alkyl group. Each of m1 and m2 independently represents an integer of 0 to 5, each of n1 and n3 independently represents an integer of 0 to 4, and each of n2 and n4 independently represents an integer of 0 to 3. Each of $A^1$ and $A^2$ independently represents a hydrogen atom, a deuterium atom, or a substituent.

In one aspect of the present invention, each of n1 to n4 independently represents an integer of 0 to 2. In a preferred aspect of the present invention, at least one of n1 to n4 is 1 or more. Preferably, at least one of n1 and n2 is 1 or more, and at least one of n3 and n4 is 1 or more. In one aspect of the present invention, each of n1 and n3 is independently 1 or 2, and n2 and n4 are 0. In one aspect of the present invention, each of n2 and n4 is independently 1 or 2, and n1 and n3 are 0. In one aspect of the present invention, each of n1 to n4 is independently 1 or 2. In one aspect of the present invention, n1 and n3 are the same, and n2 and n4 are the same. In one aspect of the present invention, n1 and n3 are 1, and n2 and n4 are 0. In one aspect of the present invention, n1 and n3 are 0, and n2 and n4 are 1. In one aspect of the present invention, n1 to n4 are all 1. The bond positions of $Ar^1$ to $Ar^4$ may be at least one of 3 and 6 positions in a carbazole ring, may be at least one of 2 and 7 positions, may be at least one of 1 and 8 positions, or may be at least one of 4 and 5 positions. The bond positions of $Ar^1$ to $A^4$ may be both of 3 and 6 positions in the carbazole ring, may be both of 2 and 7 positions, may be both of 1 and 8 positions, or may be both of 4 and 5 positions. For example, at least one of 3 and 6 positions may be preferably selected, or both of 3 and 6 positions may be further preferably selected. In a preferred aspect of the present invention, $Ar^1$ to $Ar^4$ are all the same group. In a preferred aspect of the present invention, each of $Ar^1$ to $Ar^4$ is independently a substituted or unsubstituted aryl group, more preferably a substituted or unsubstituted phenyl group or naphthyl group, further preferably a substituted or unsubstituted phenyl group. As the substituent, a group selected from any of substituent groups A to E to be described below may be mentioned, but an unsubstituted phenyl group is also preferable. Specific preferable examples of $Ar^1$ to $Ar^4$ include a phenyl group, an o-biphenyl group, a m-biphenyl group, a p-biphenyl group, and a terphenyl group.

In one aspect of the present invention, each of m1 and m2 is independently 0. In one aspect of the present invention, each of m1 and m2 is independently any integer of 1 to 5. In one aspect of the present invention, m1 and m2 are the same. In one aspect of the present invention, $R^{41}$ and $R^{42}$ are alkyl groups having 1 to 6 carbon atoms and may be selected from, for example, alkyl groups having 1 to 3 carbon atoms, or a methyl group may be selected. When a carbon atom bonded to a boron atom is the 1-position, as the substitution position of the alkyl group, only the 2-position, only the 3-position, only the 4-position, the 3 and 5 positions, the 2 and 4 positions, the 2 and 6 positions, the 2, 4, and 6 positions, and the like may be exemplified. At least the 2-position is preferable, and at least 2 and 6 positions are more preferable.

For descriptions and preferable ranges of $A^1$ and $A^2$, corresponding descriptions on the formula (1) may be referred to.

Hereinafter, specific examples of the compound represented by the formula (1a) will be given. Compounds of the formula (1a) that may be used in the present invention are not construed as limiting to specific examples in the following one group. For example, as one preferable group, a group including all the following compounds, except for the compound at the center in the eighth row, may be mentioned.

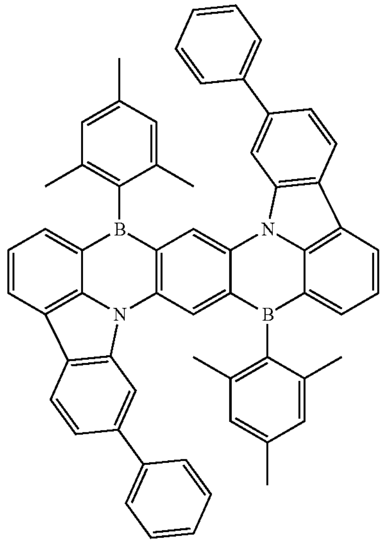

-continued

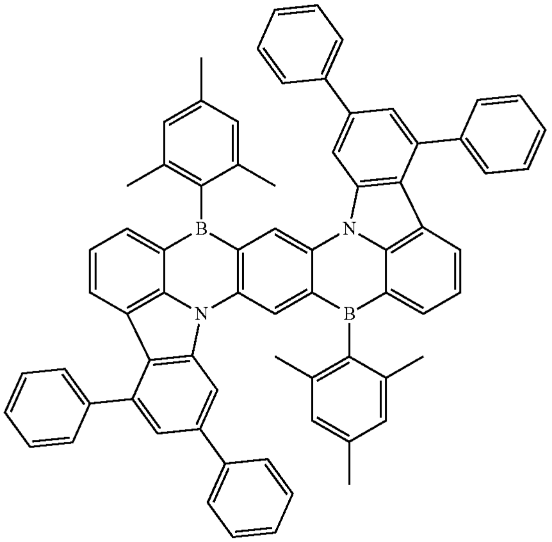

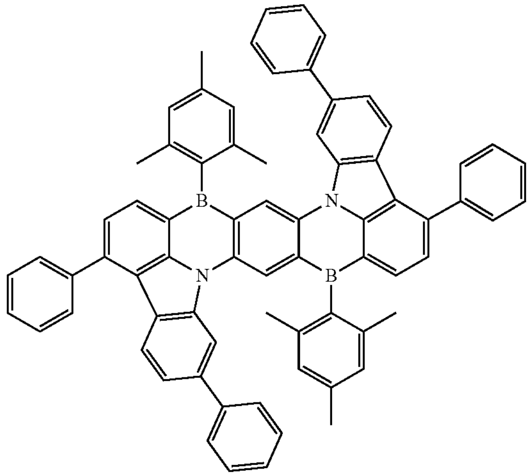

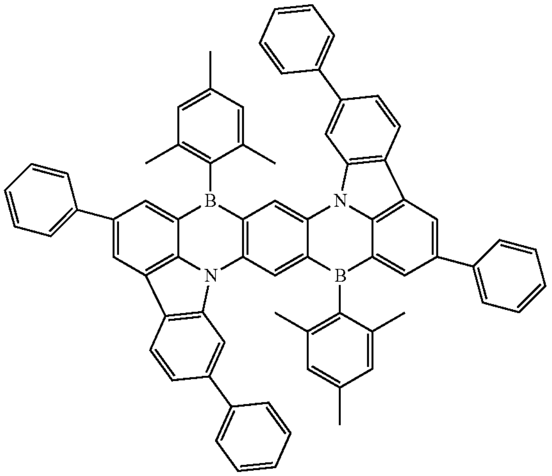

-continued
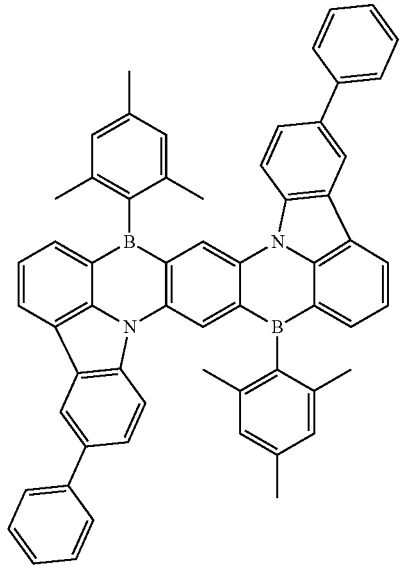
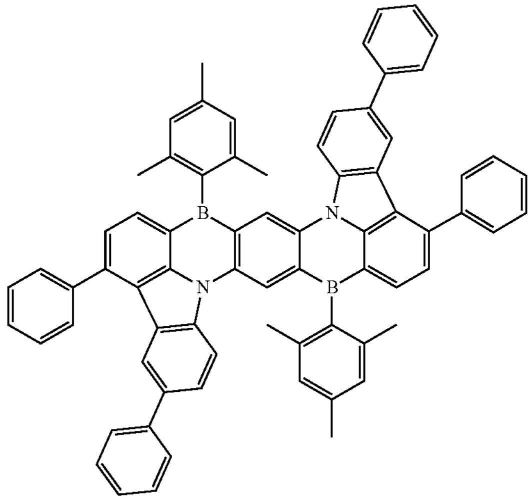
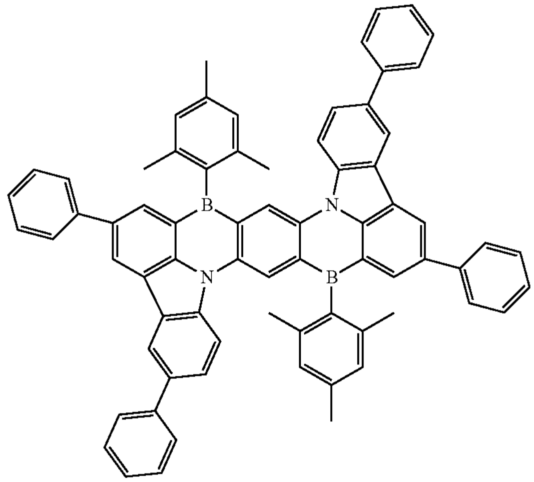
-continued
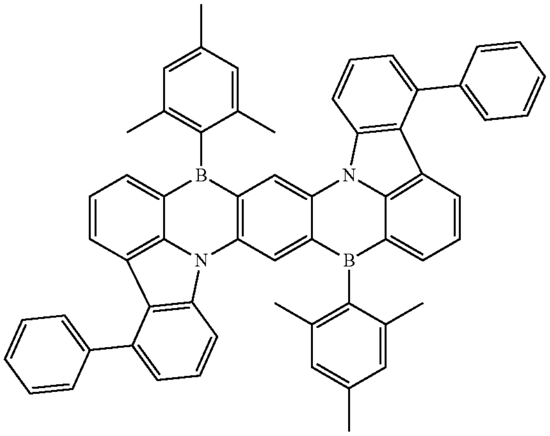
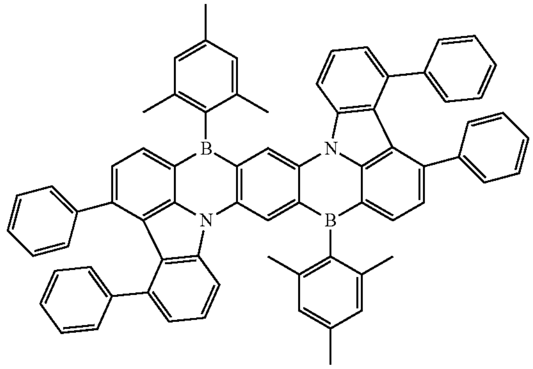
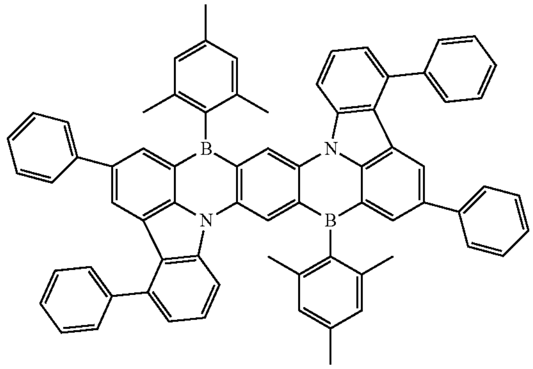
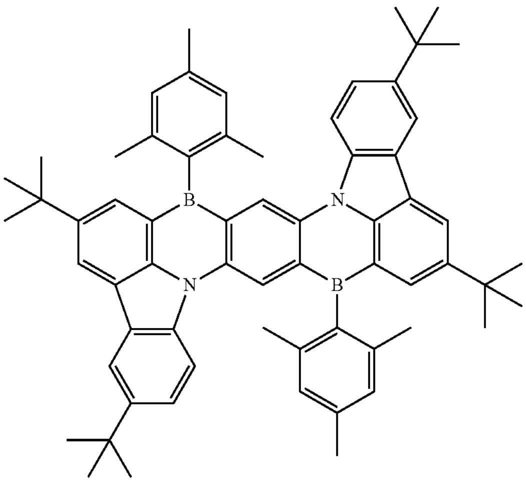

-continued
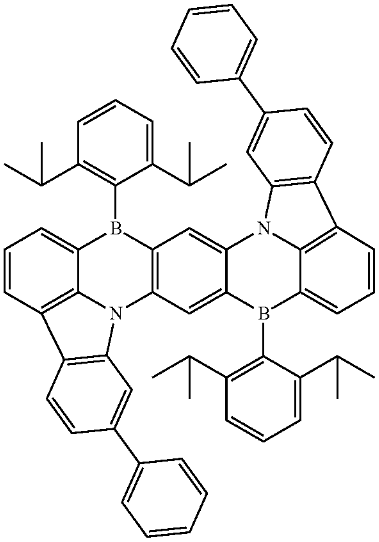
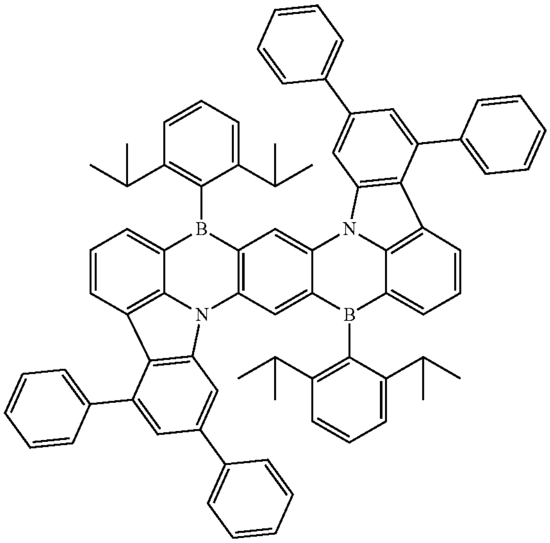
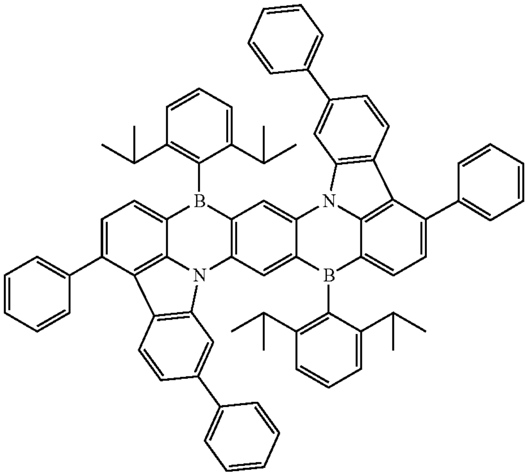
-continued
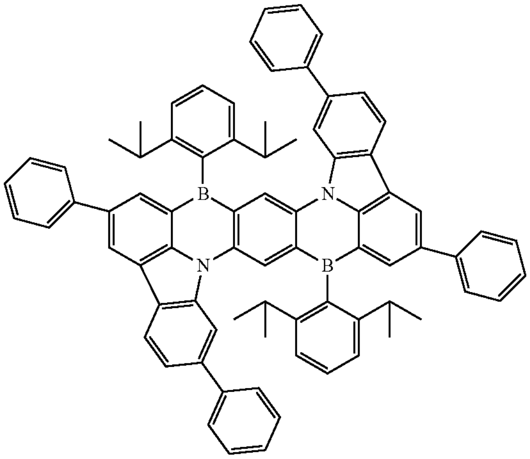
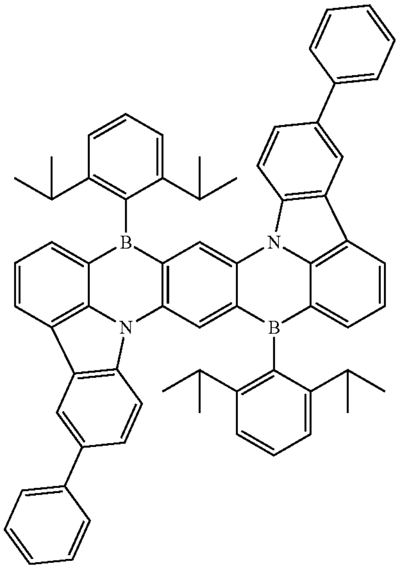
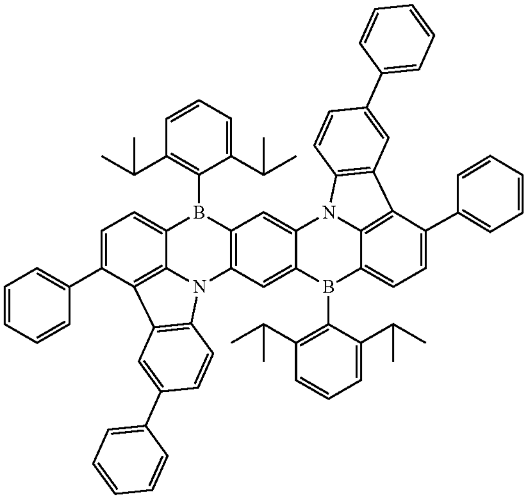

-continued
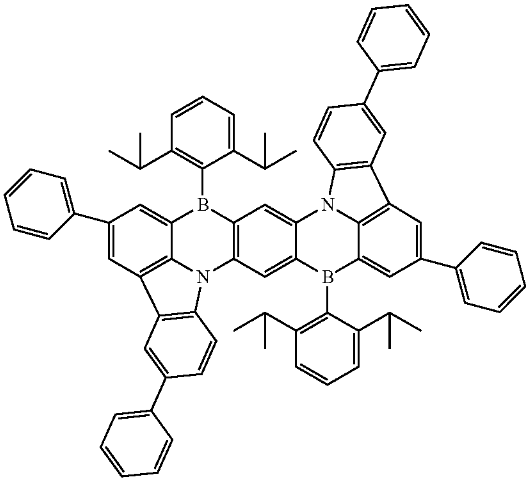
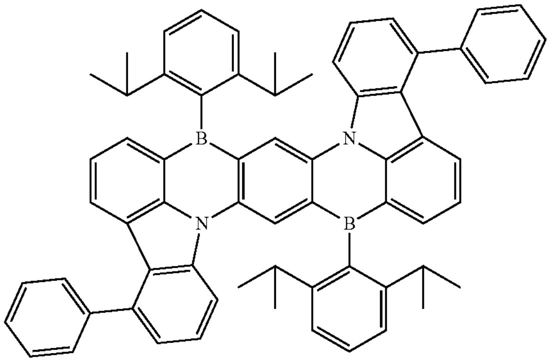
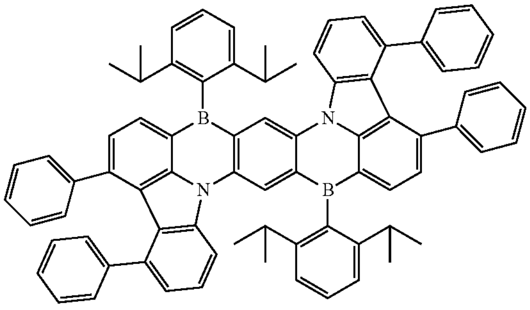
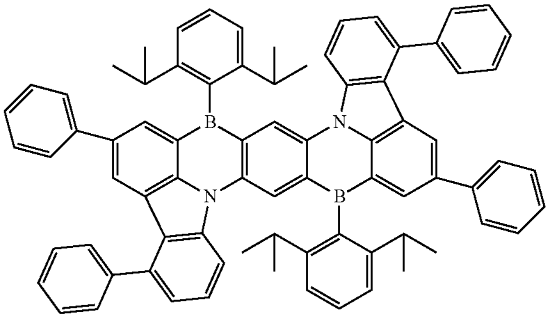
-continued
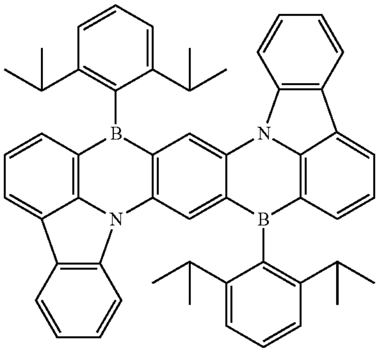
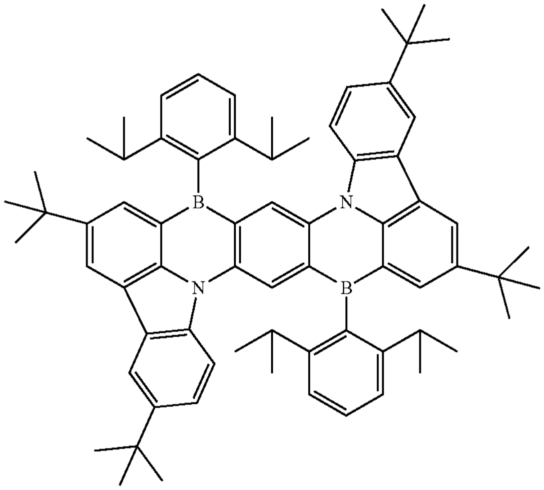
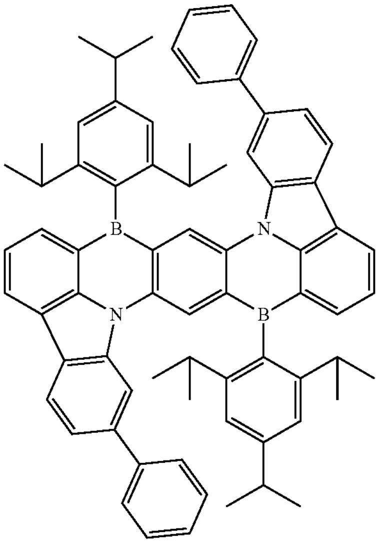

-continued
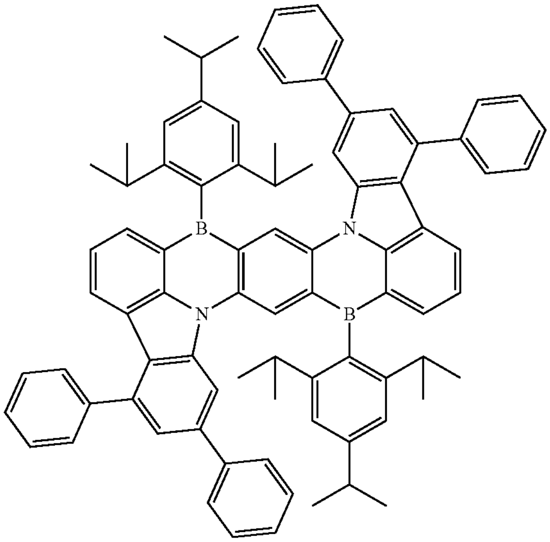
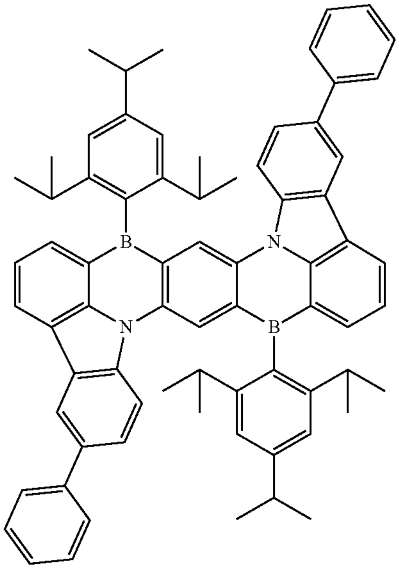
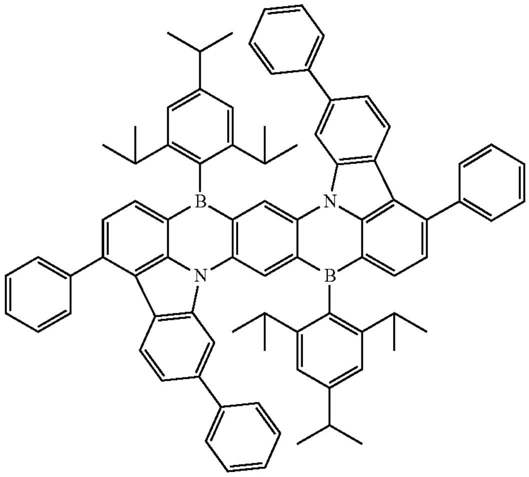
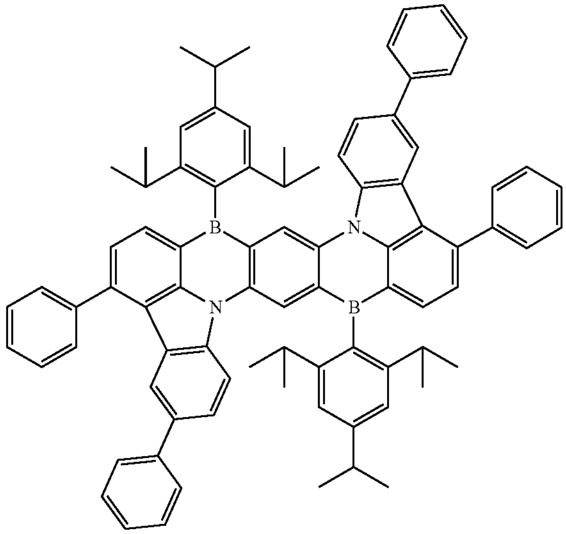
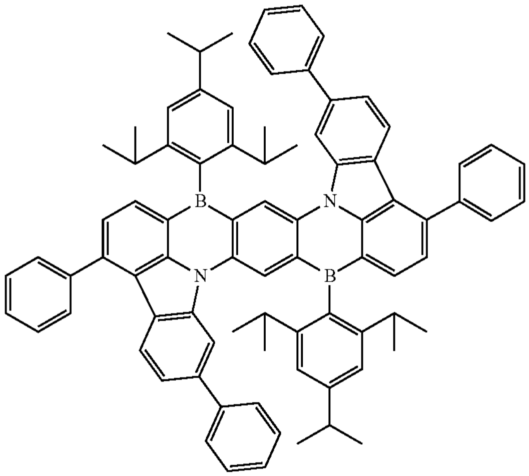
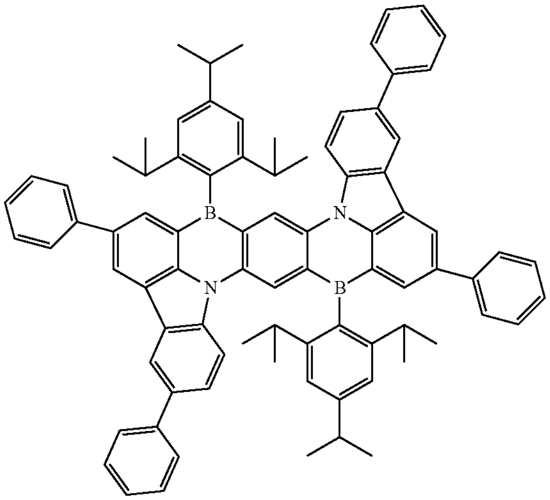
-continued -continued
-continued
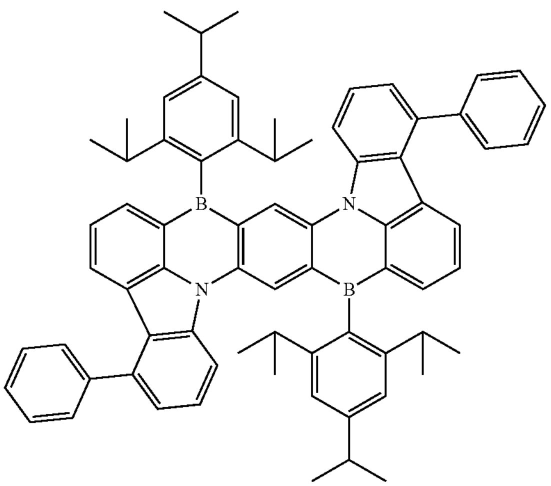
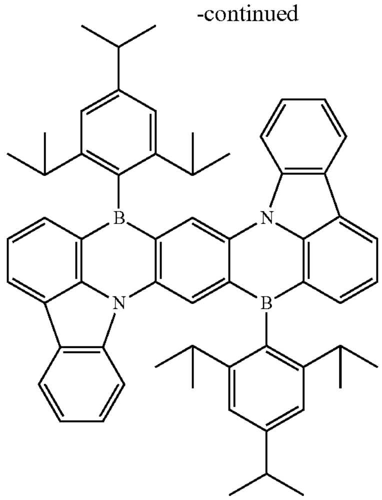
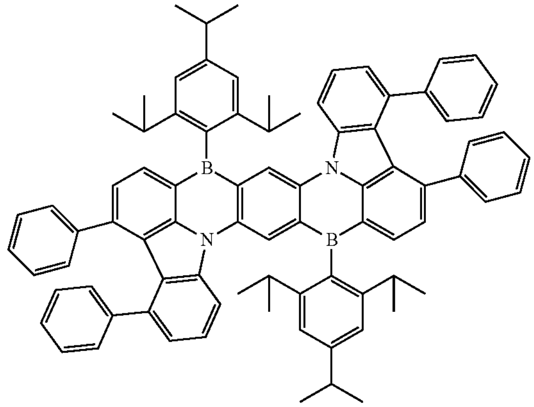
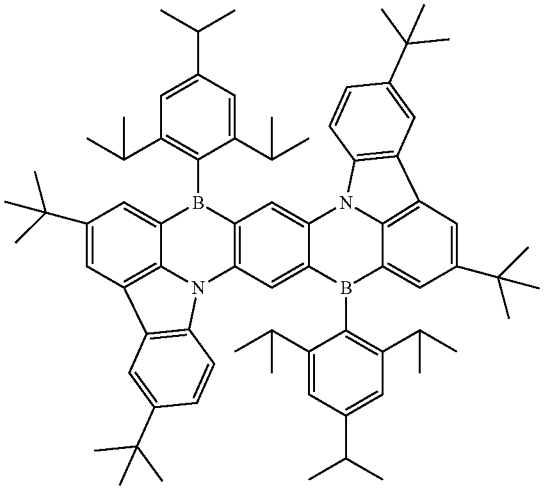
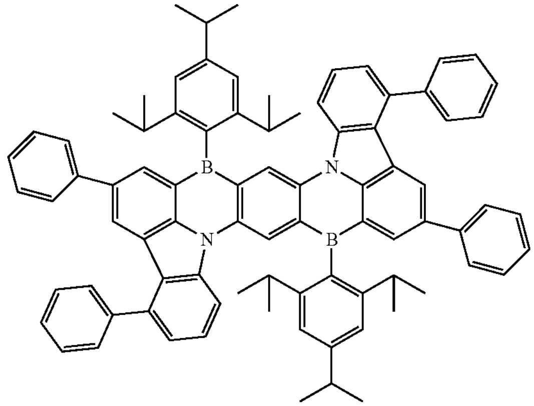
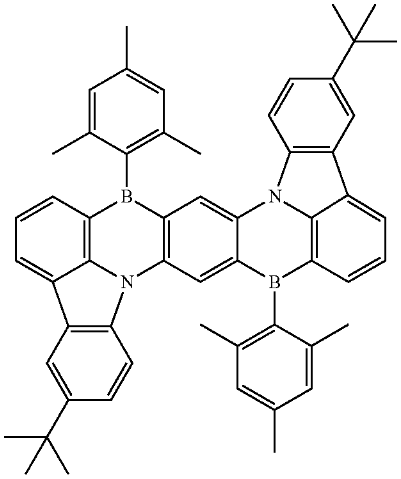

-continued
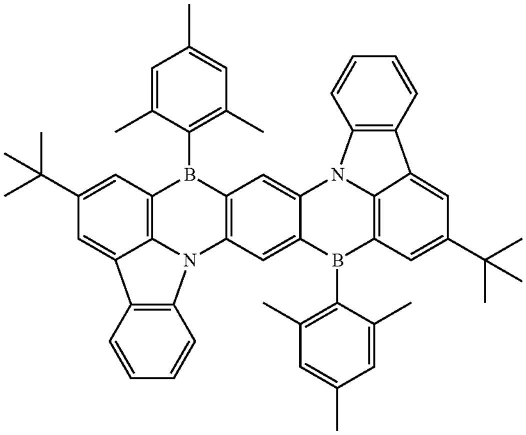
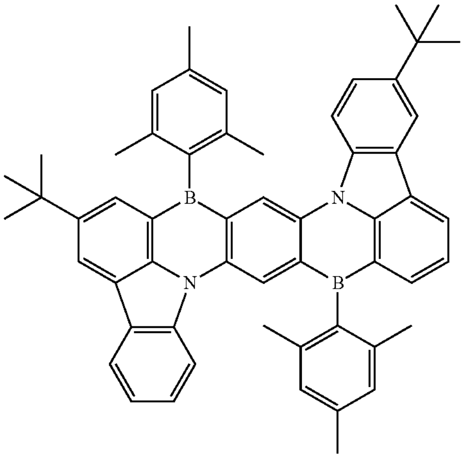
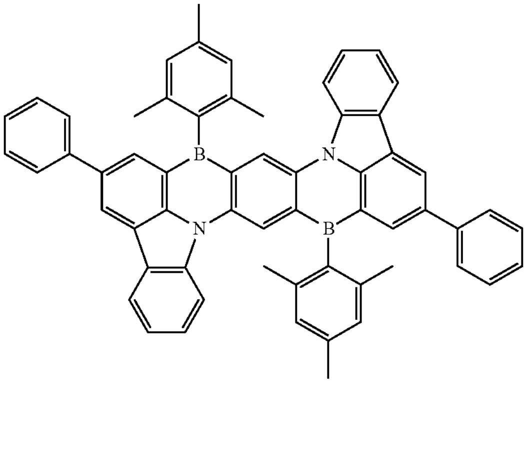
-continued
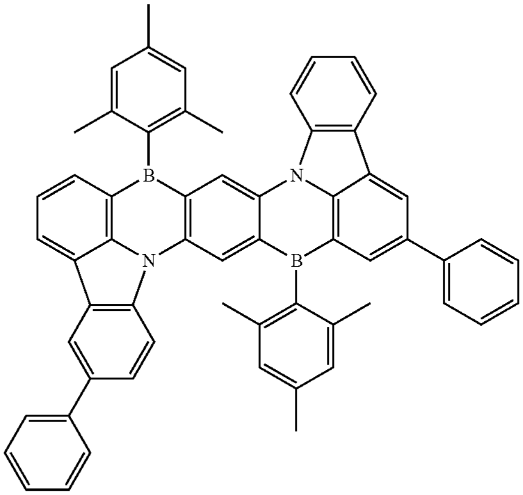
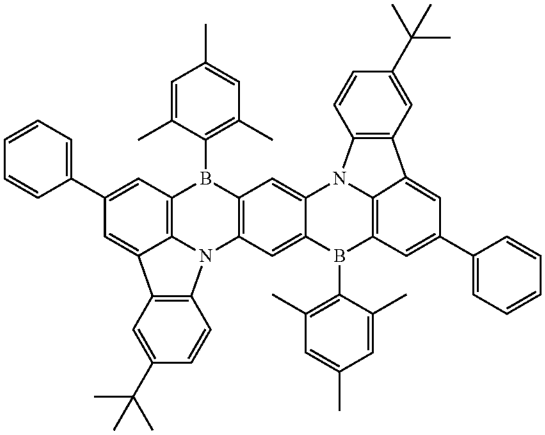
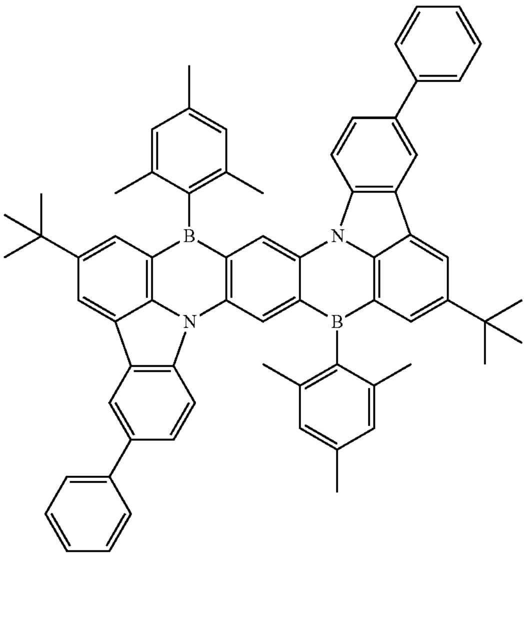

-continued
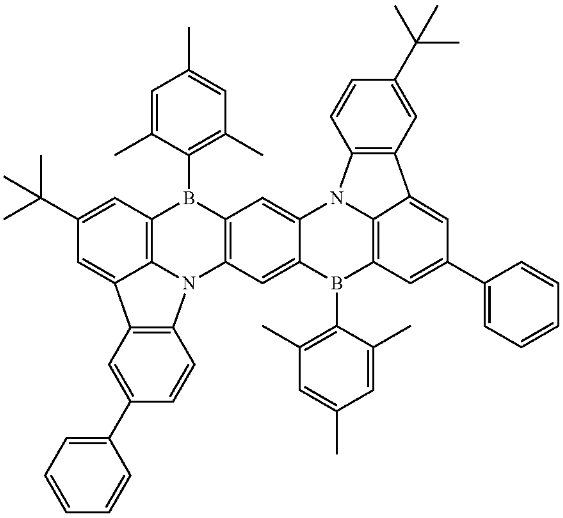
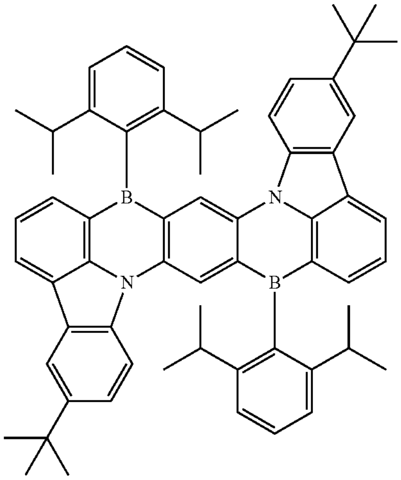
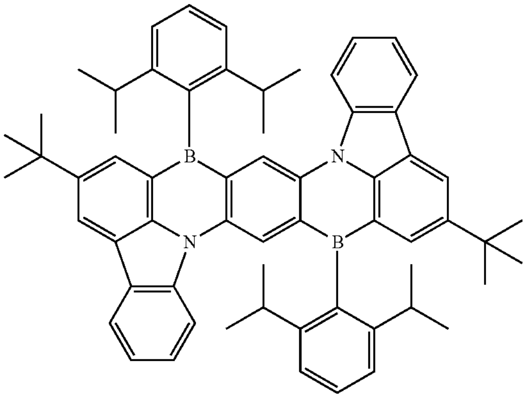
-continued
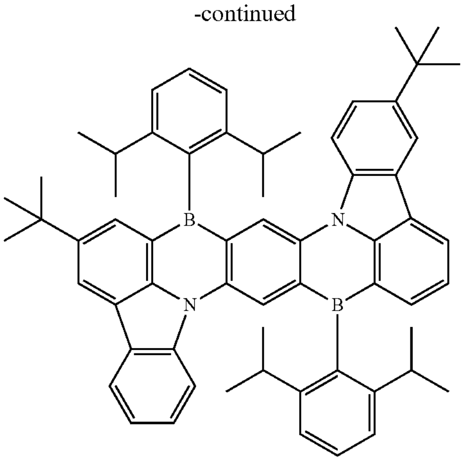
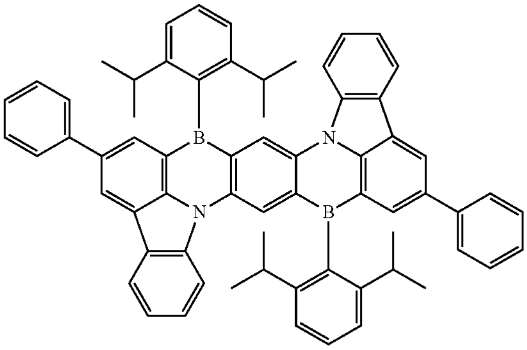
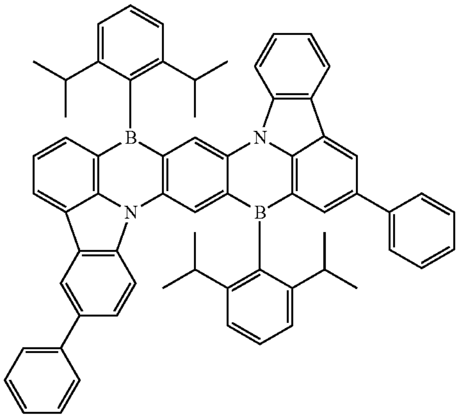
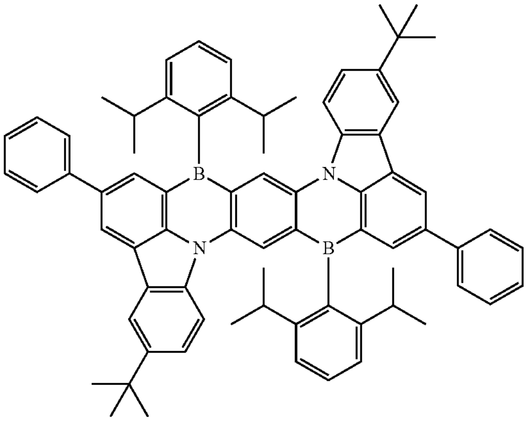

-continued
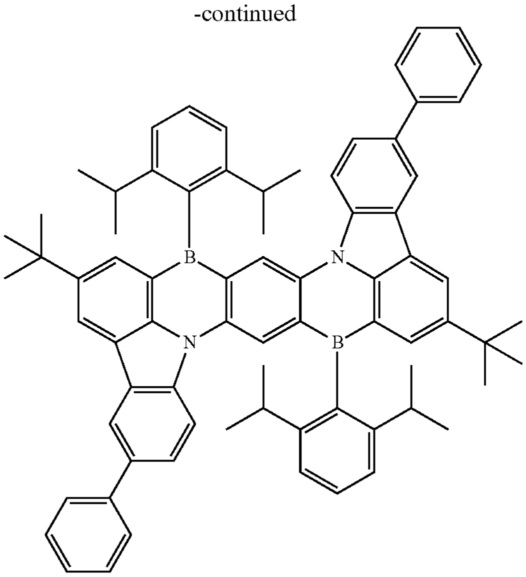
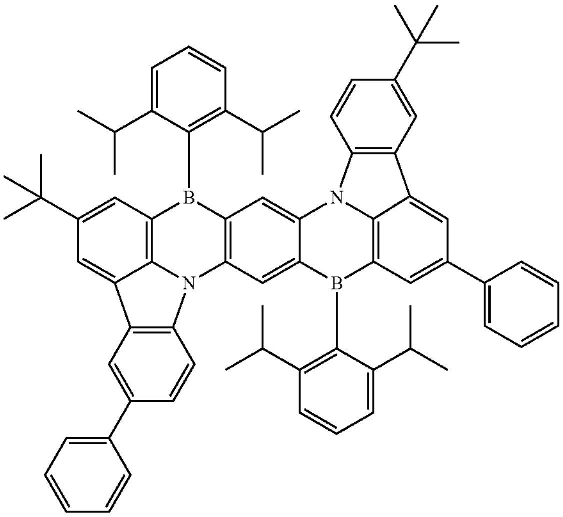
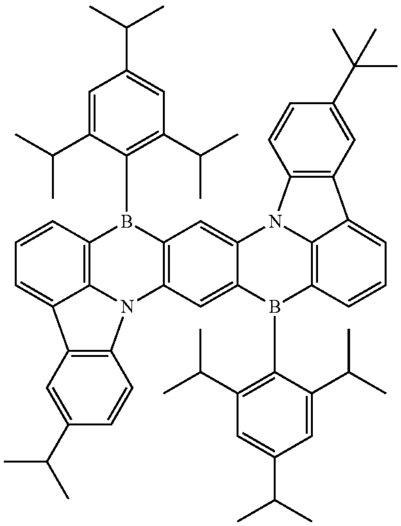
-continued
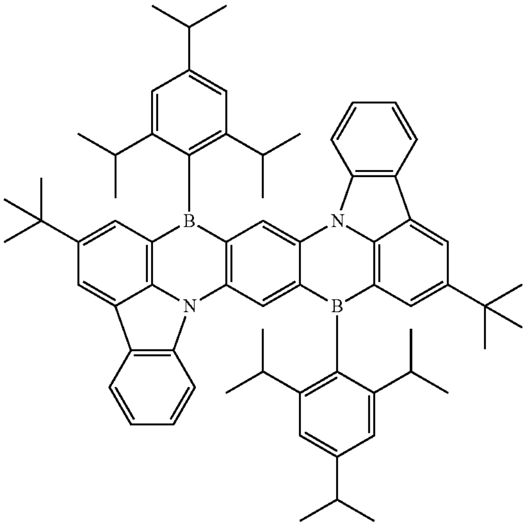
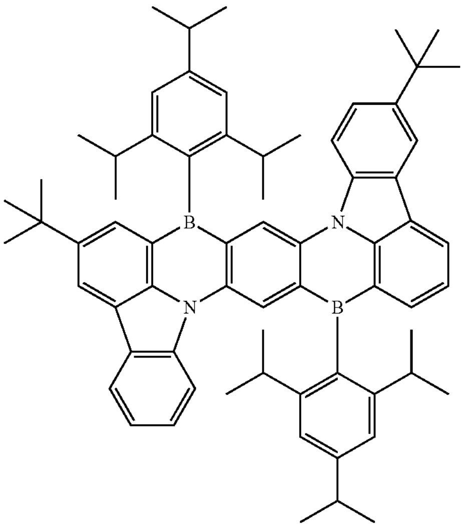
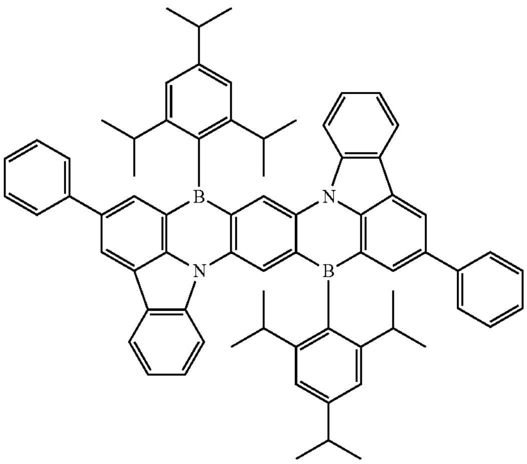

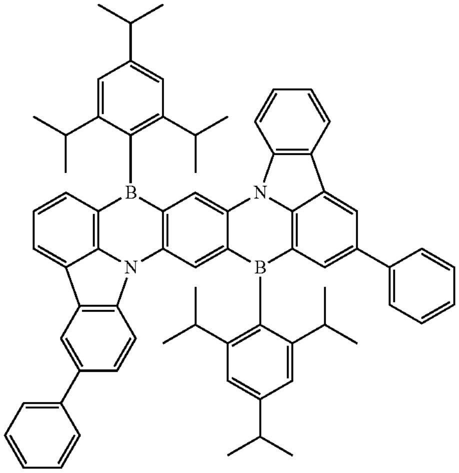
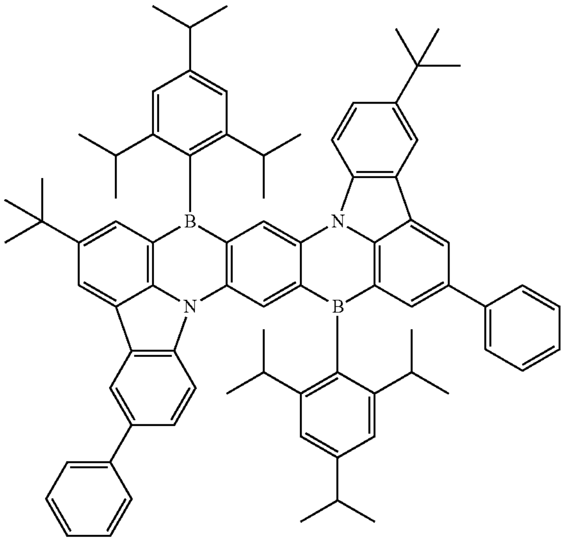
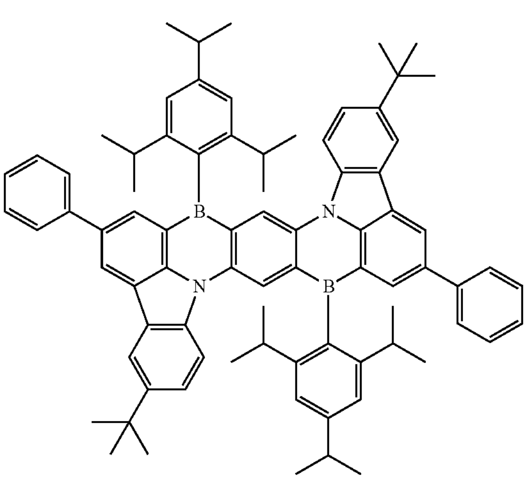
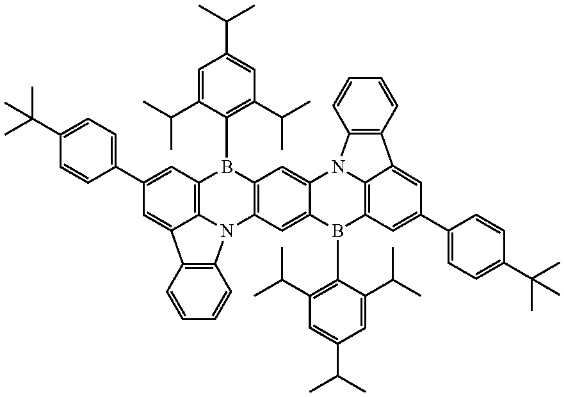
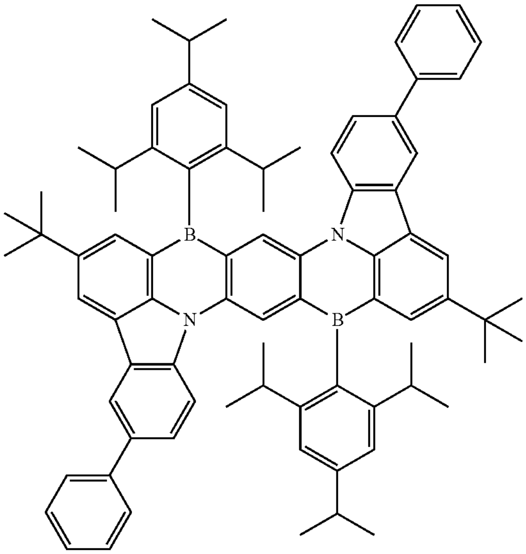
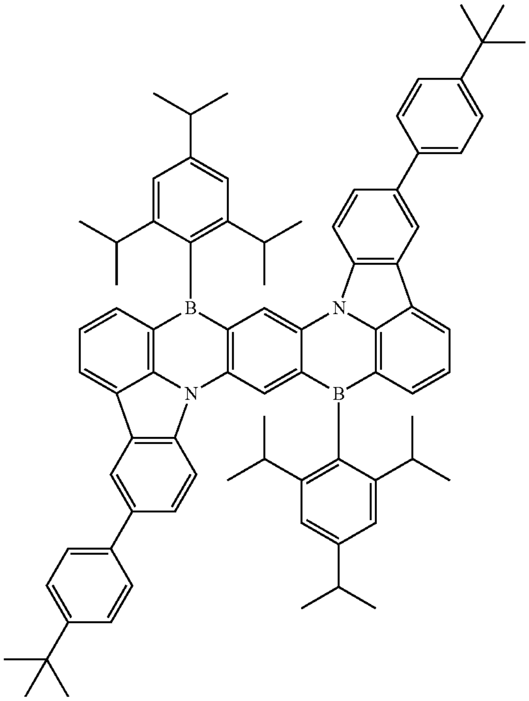

-continued
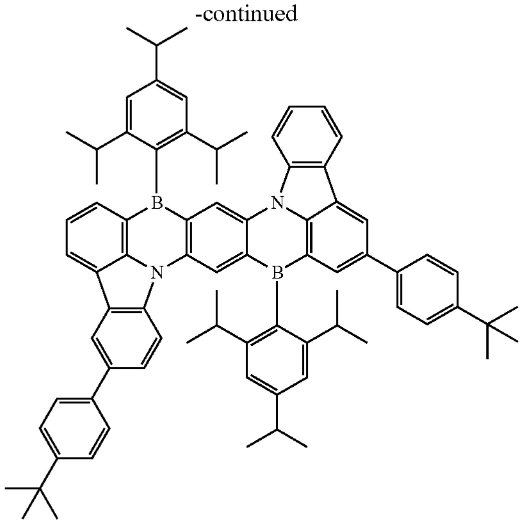
-continued
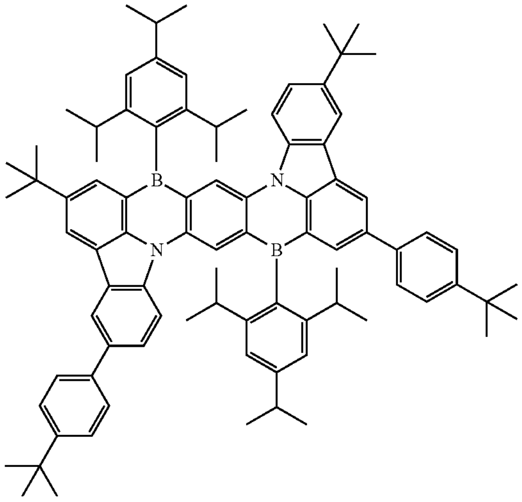
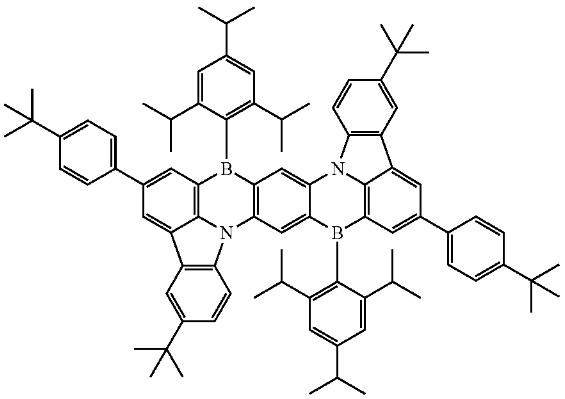
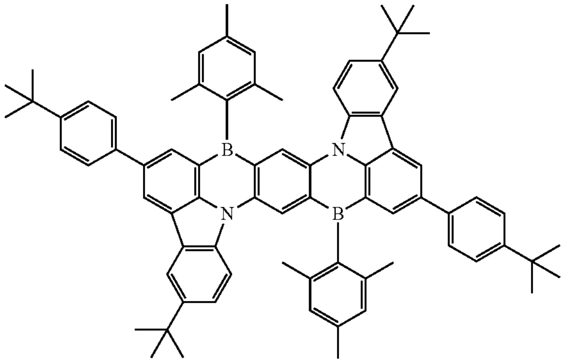
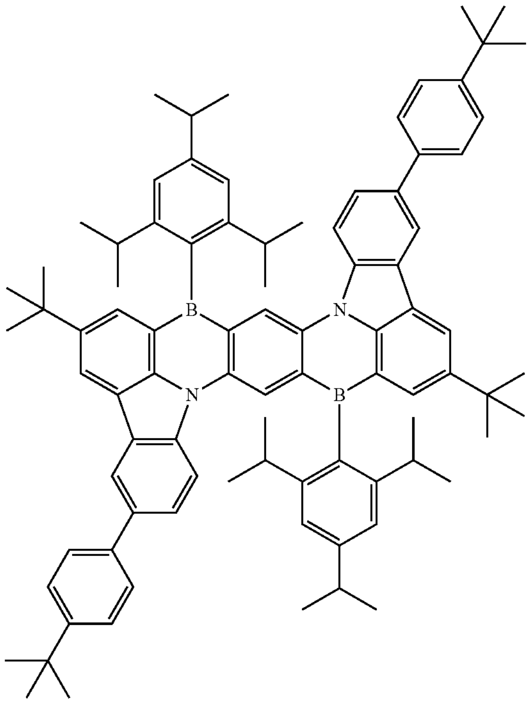
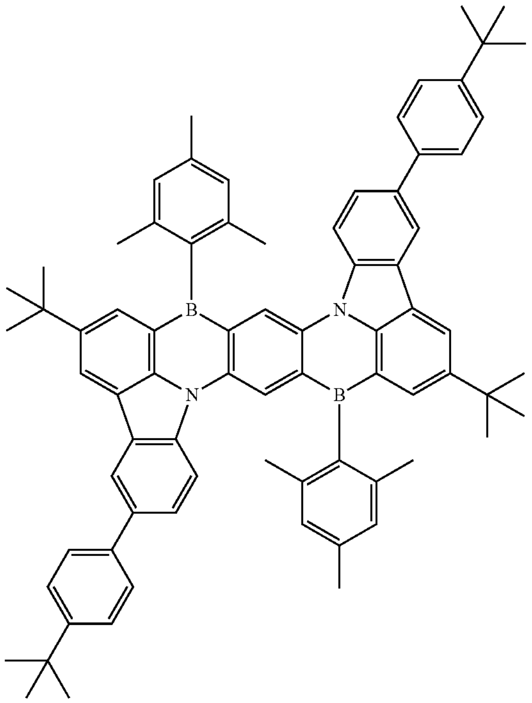

-continued
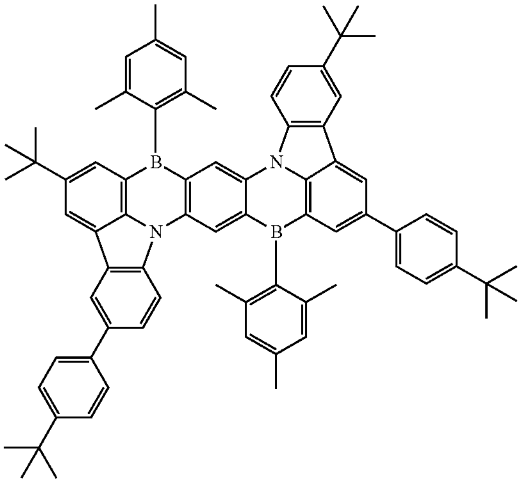
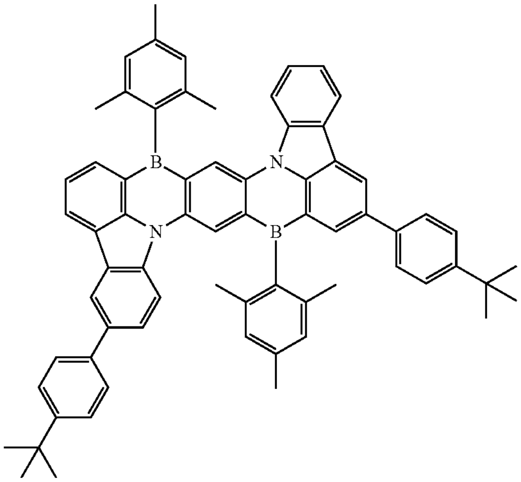
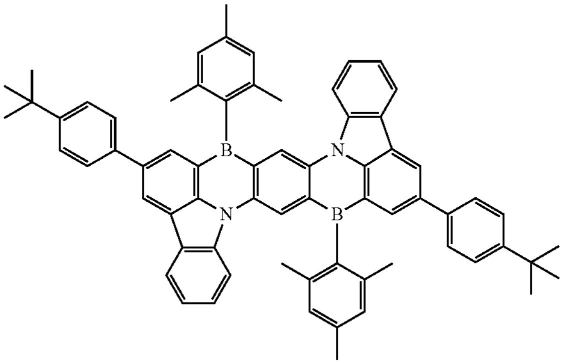
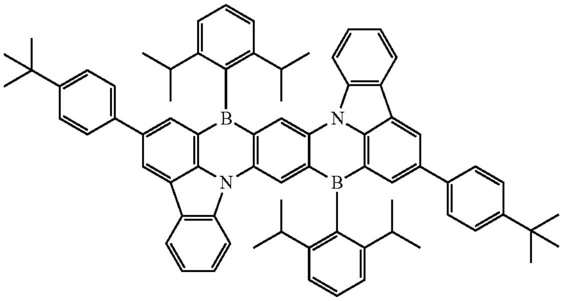
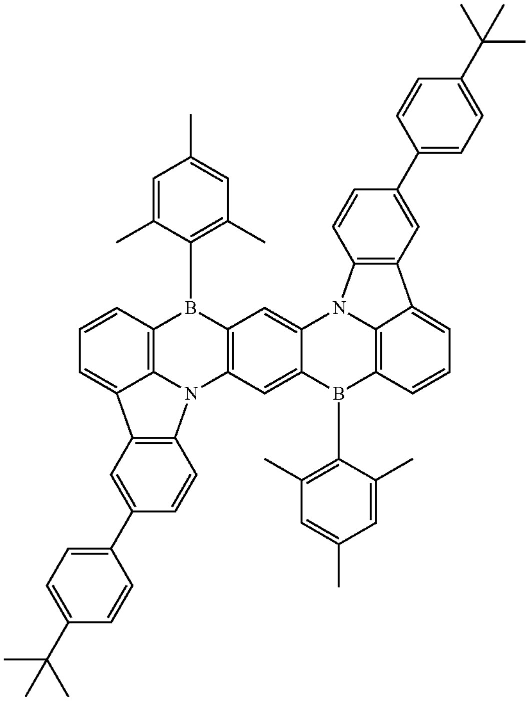
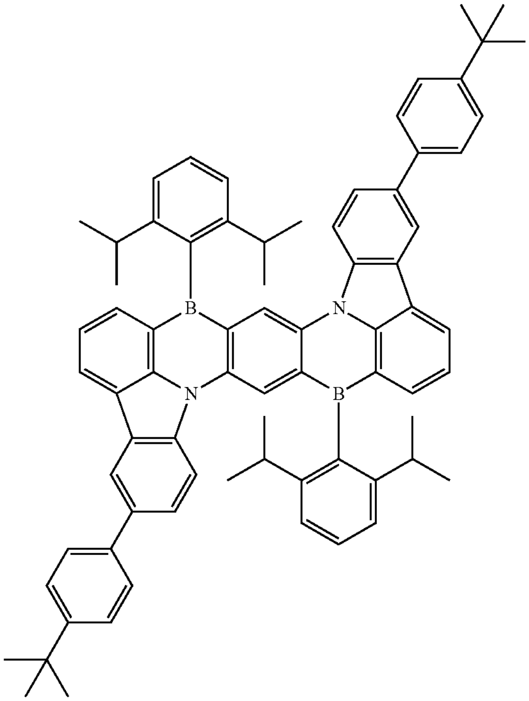
-continued -continued
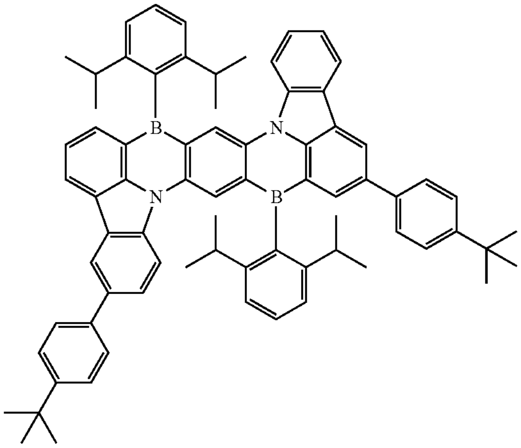
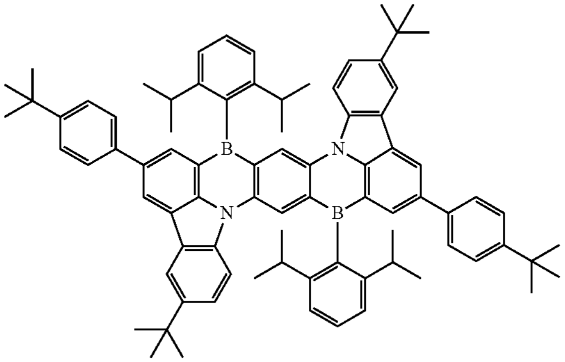
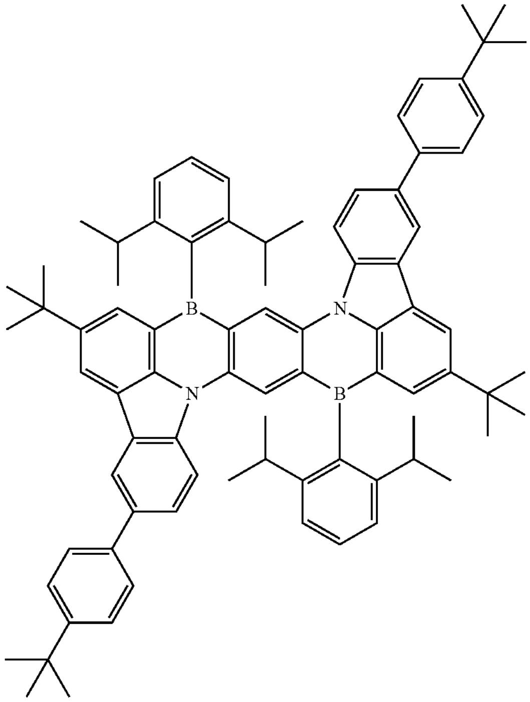
-continued
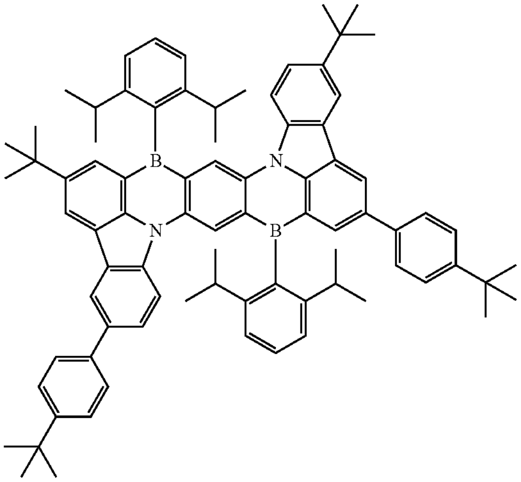
Hereinafter, another group of specific examples of the compound represented by the formula (1a) will be given. Compounds of the formula (1a) that may be used in the present invention are not construed as limiting to specific examples in the following one group.
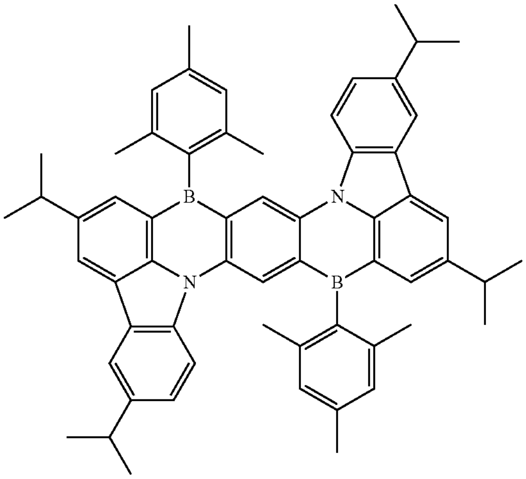
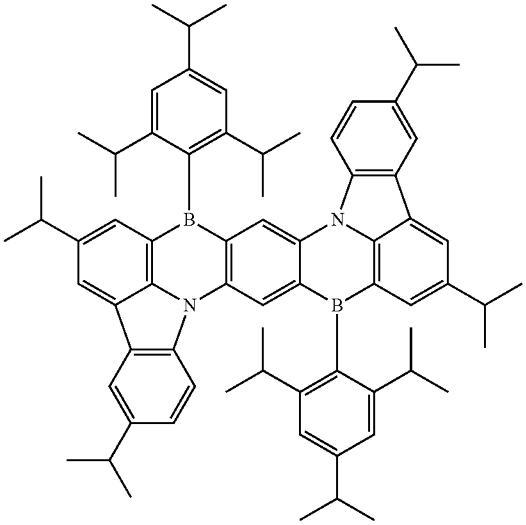

-continued
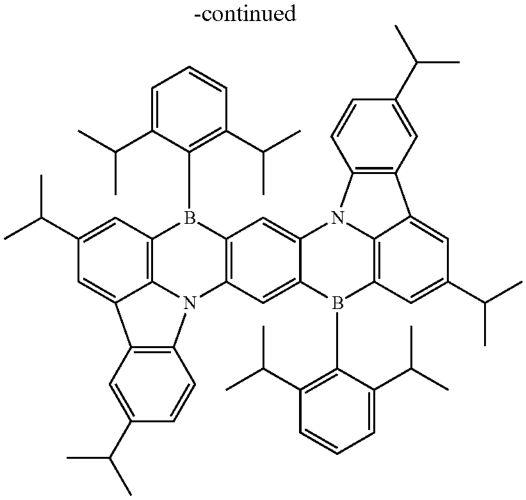
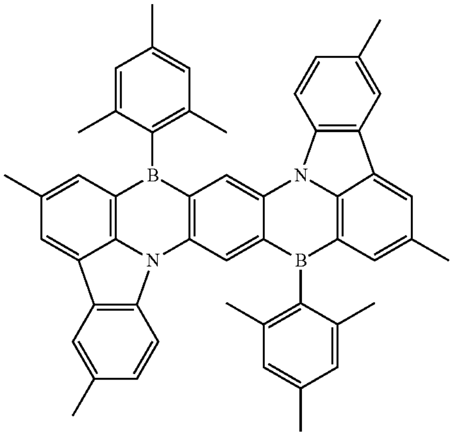
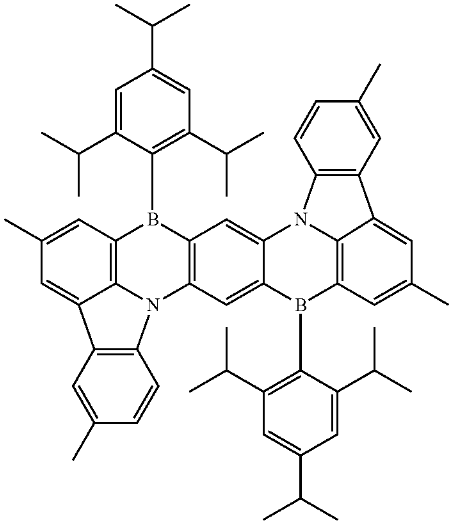
-continued
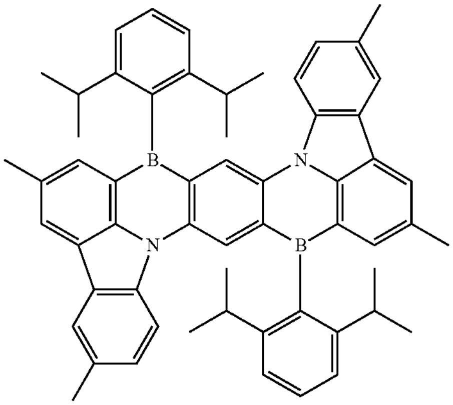
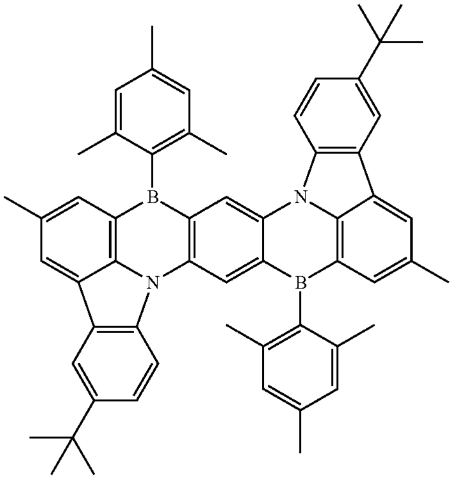
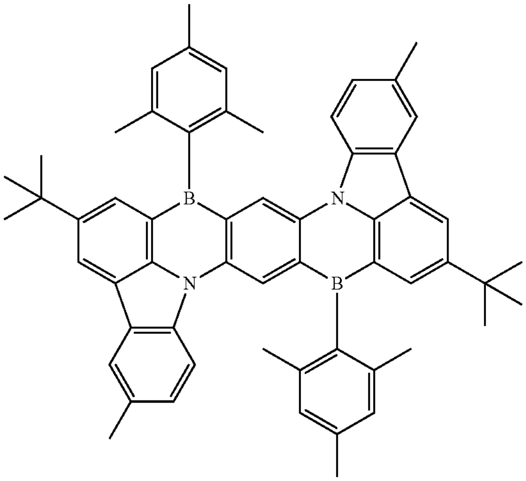

-continued
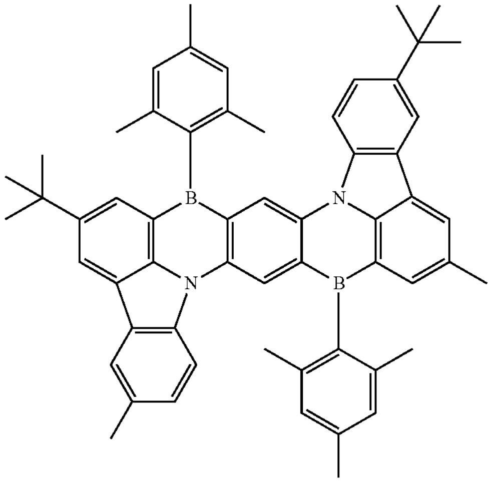
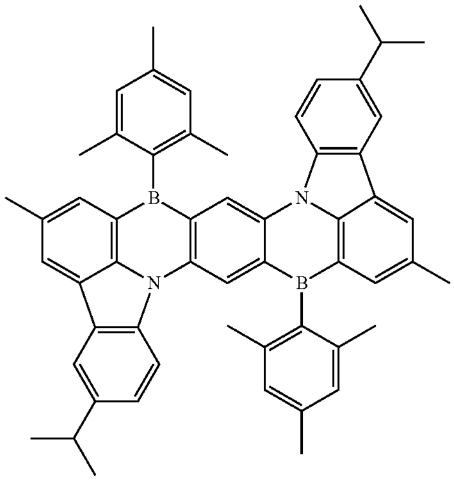
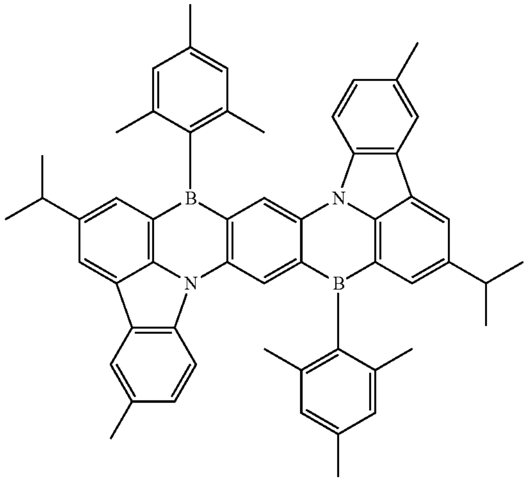
-continued
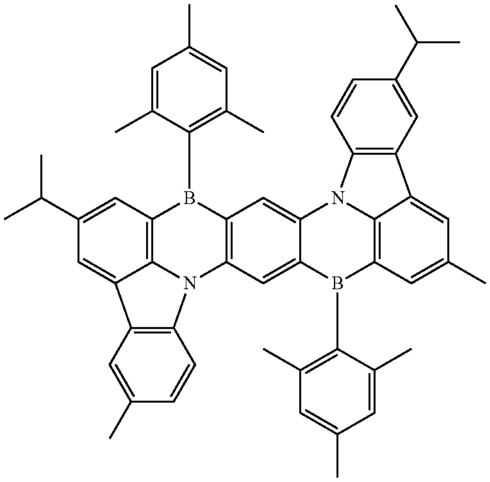
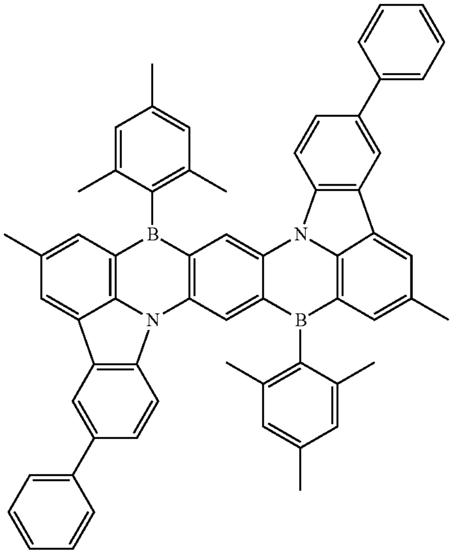
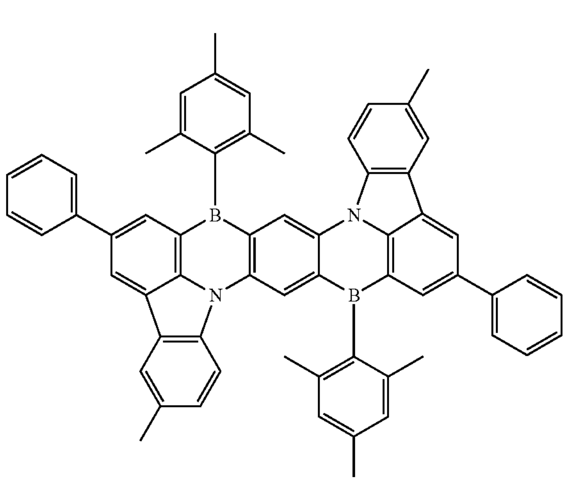

-continued
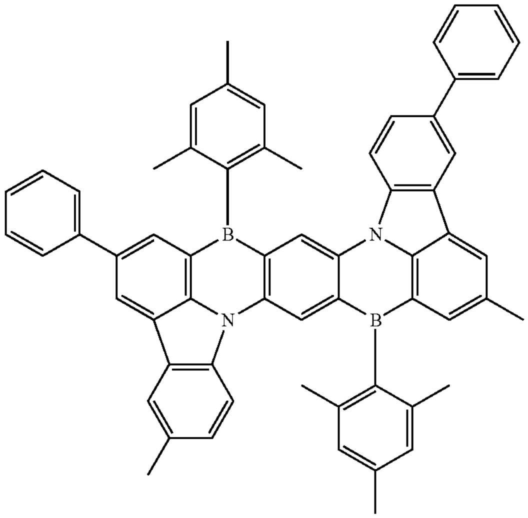
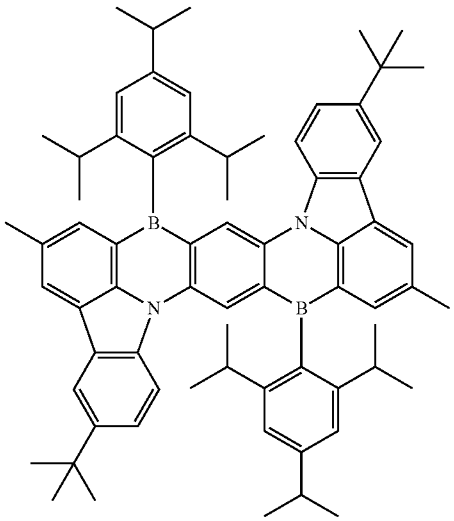
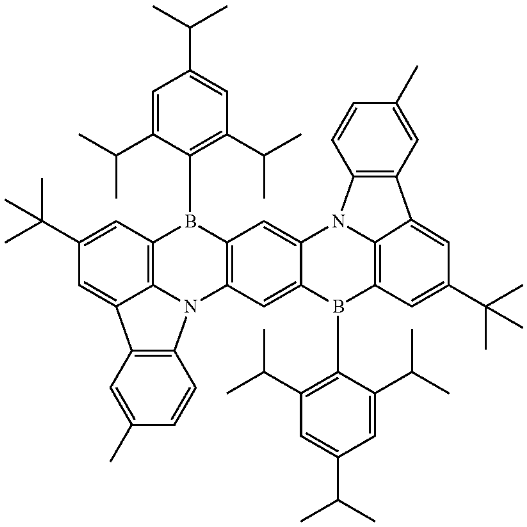
-continued
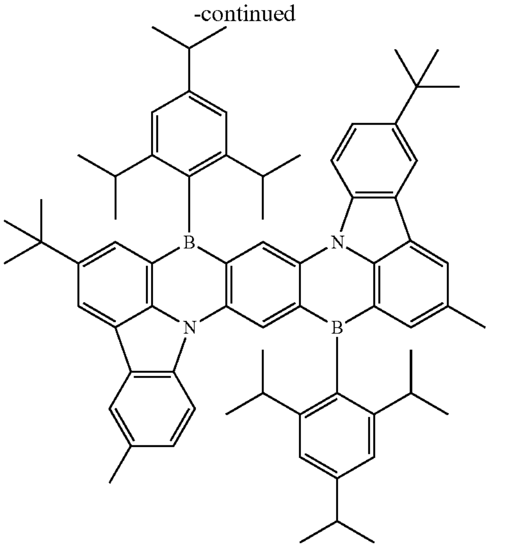
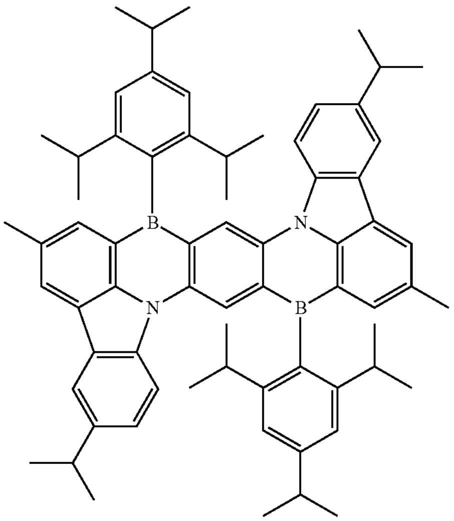
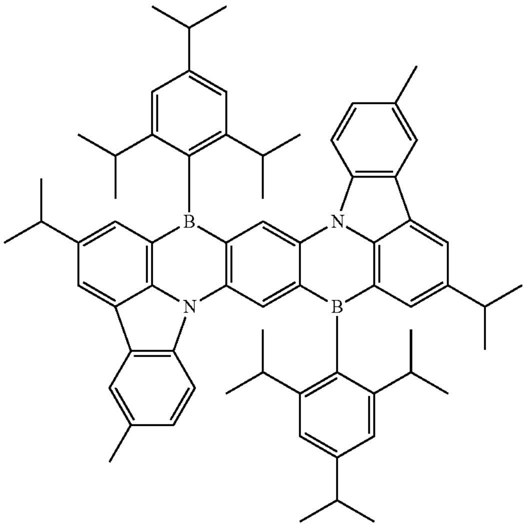

-continued
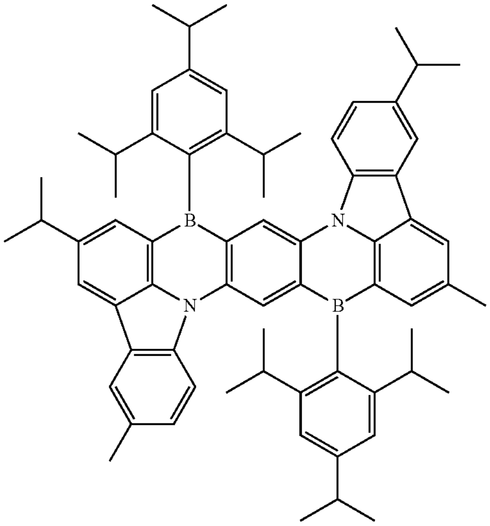
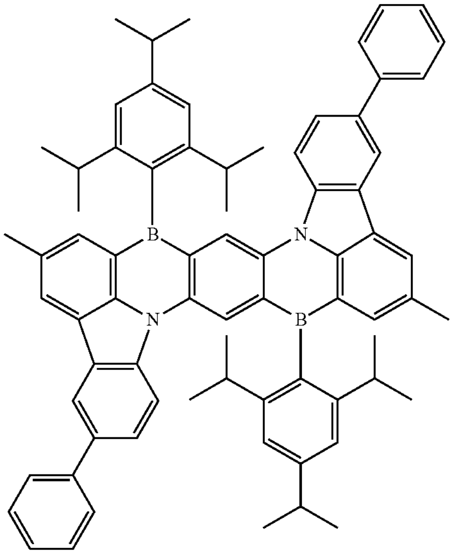
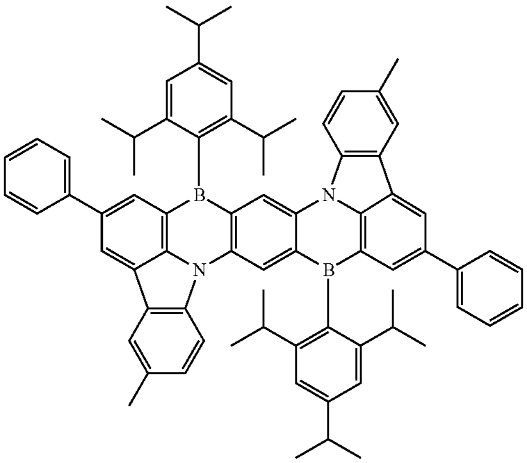
-continued
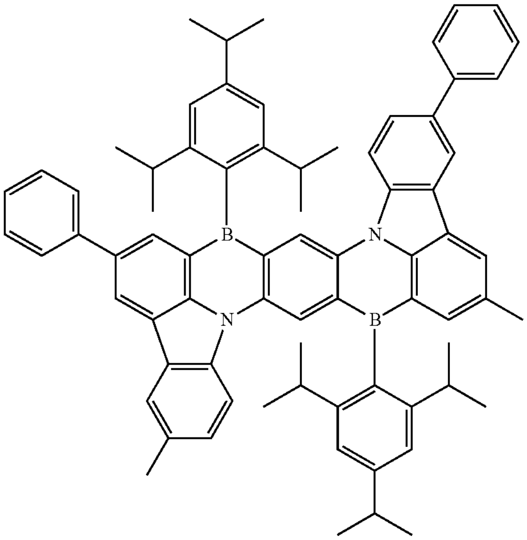
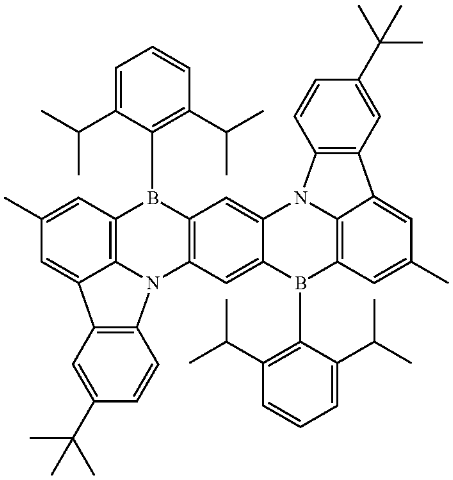
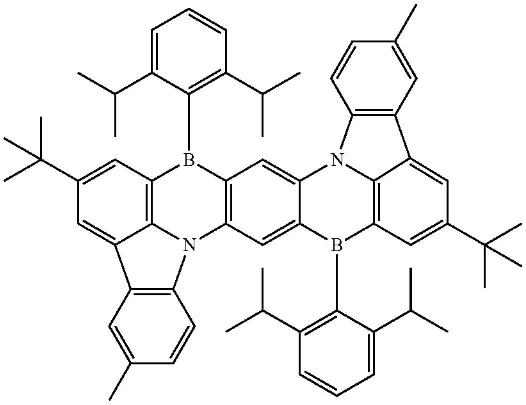

-continued
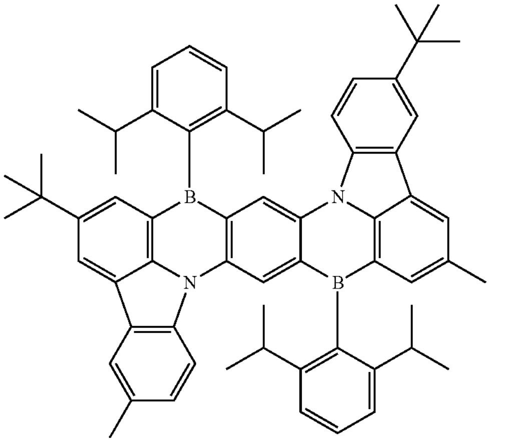
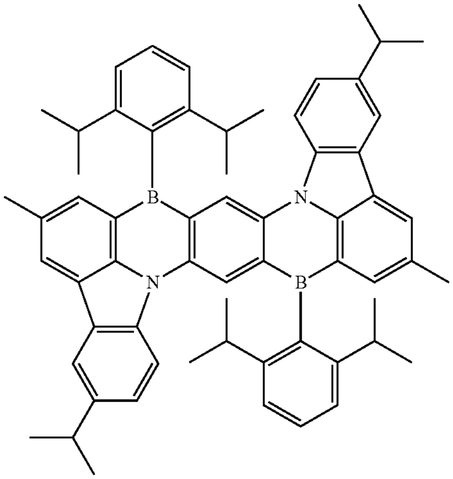
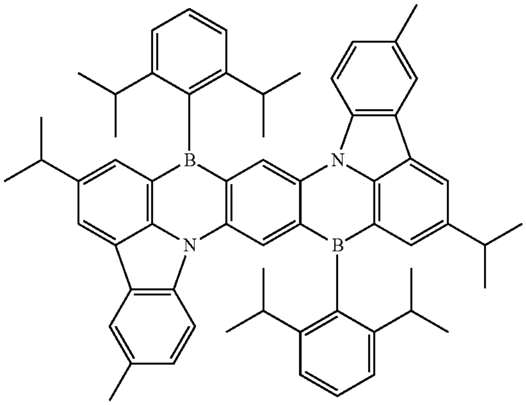
-continued
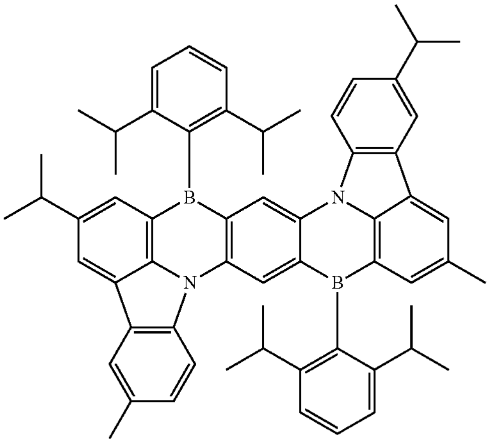
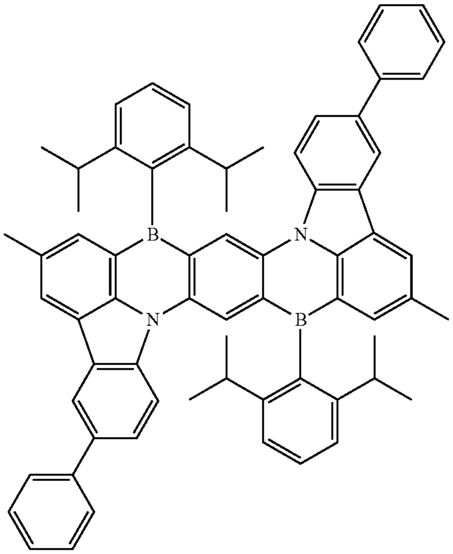
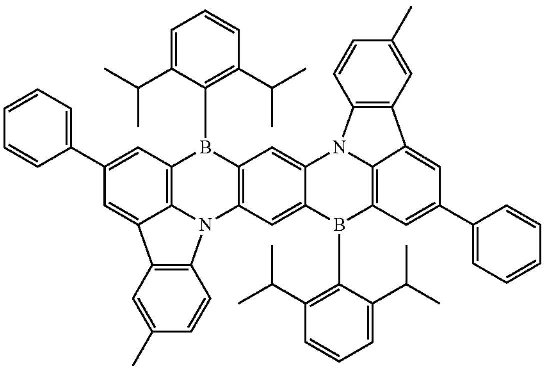

-continued
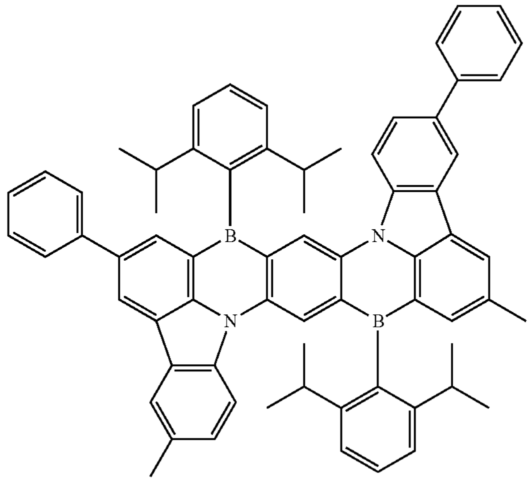
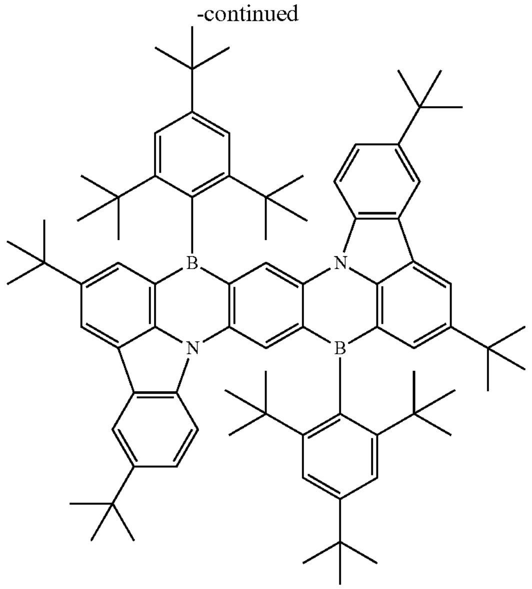
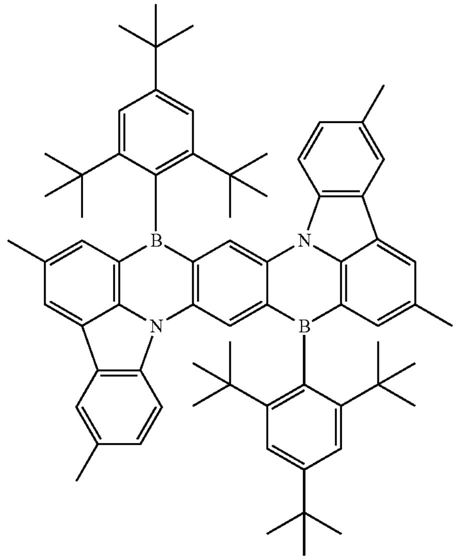
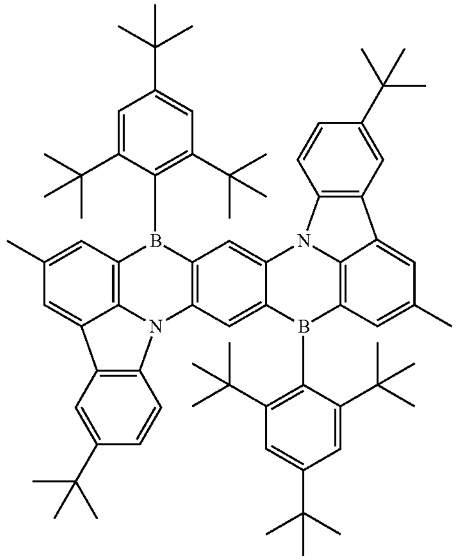
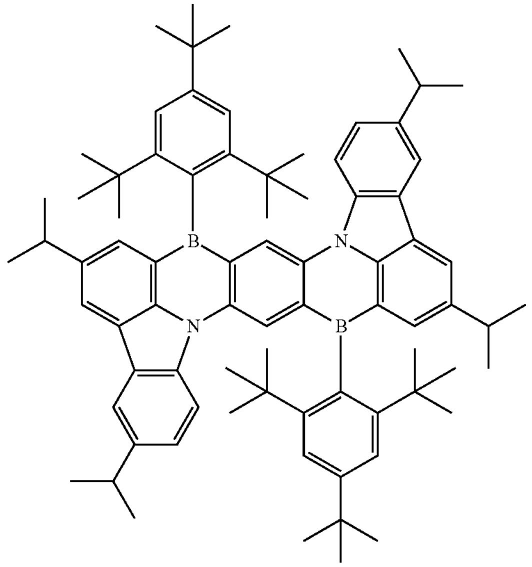
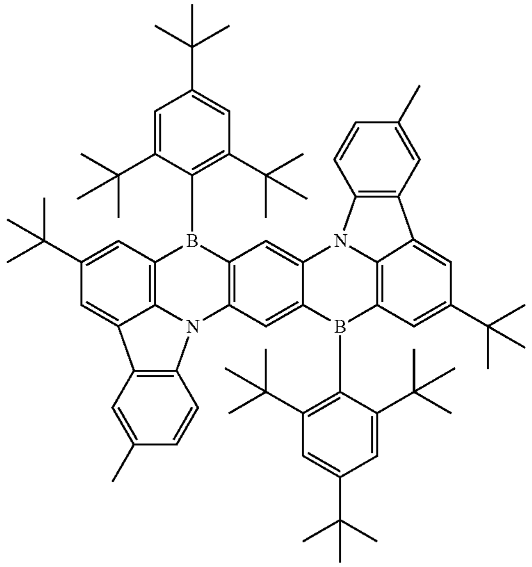
-continued -continued
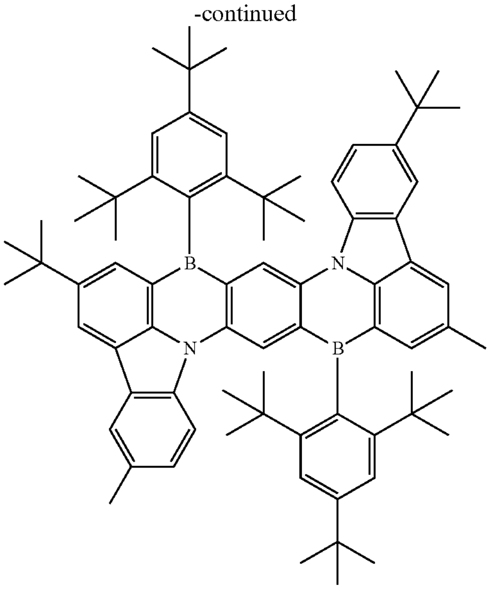
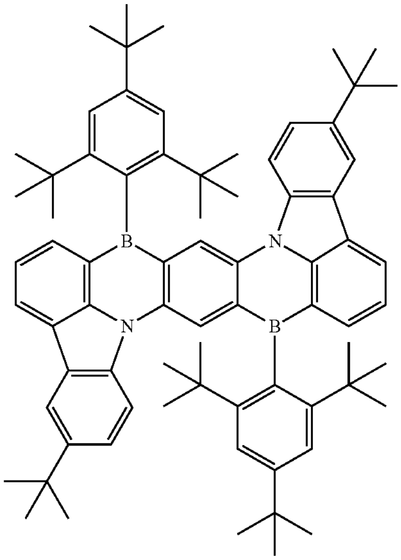
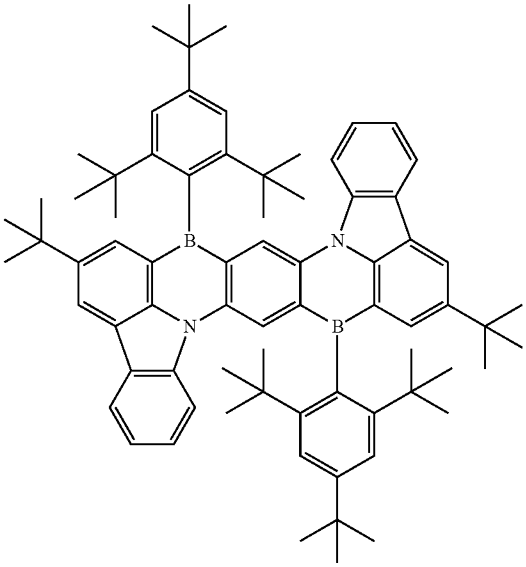
-continued
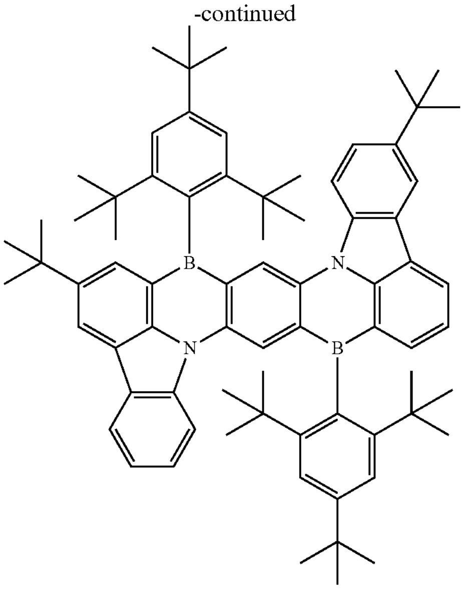
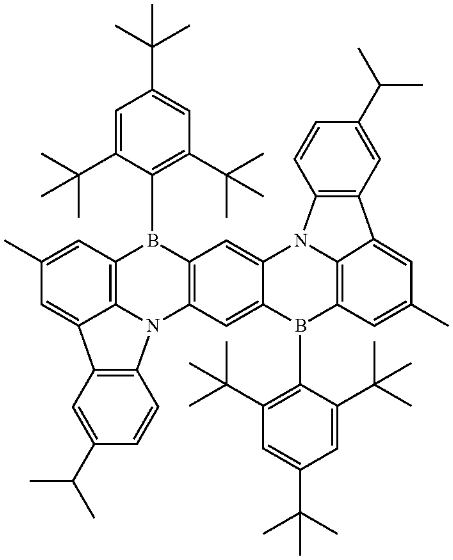
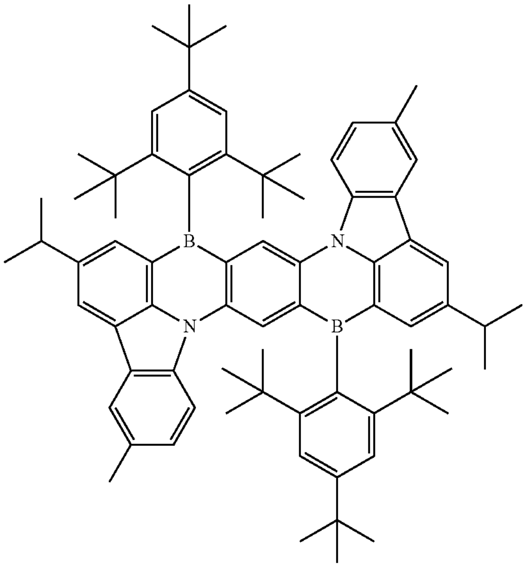

-continued
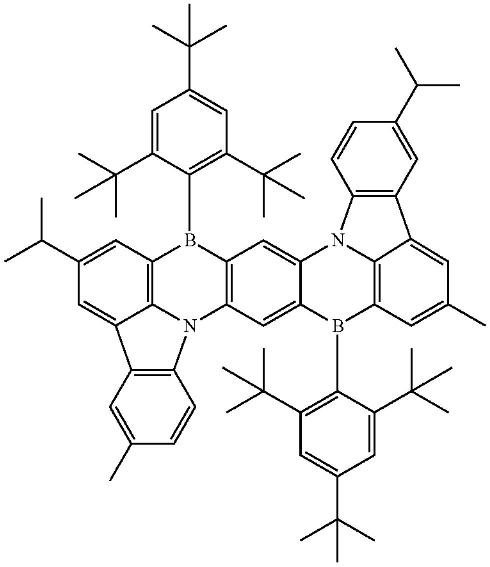
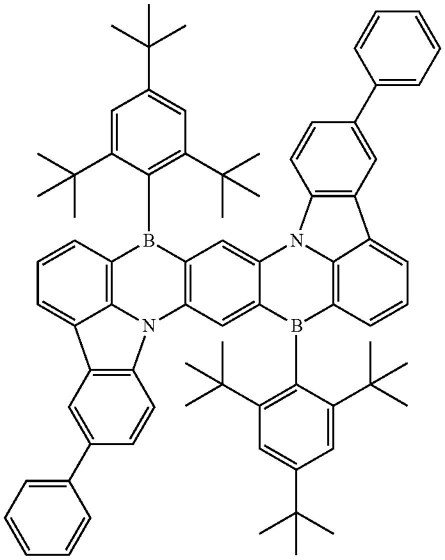
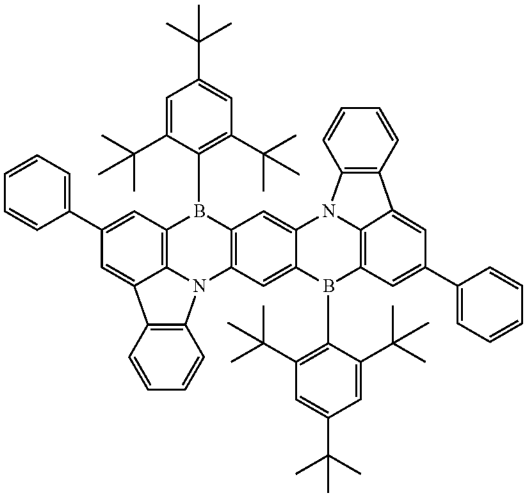
-continued
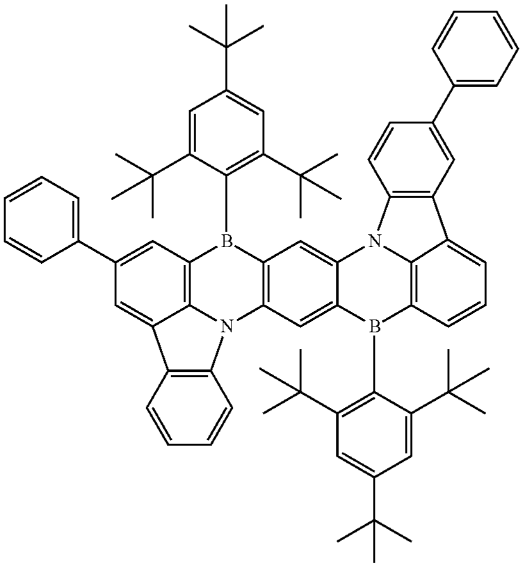
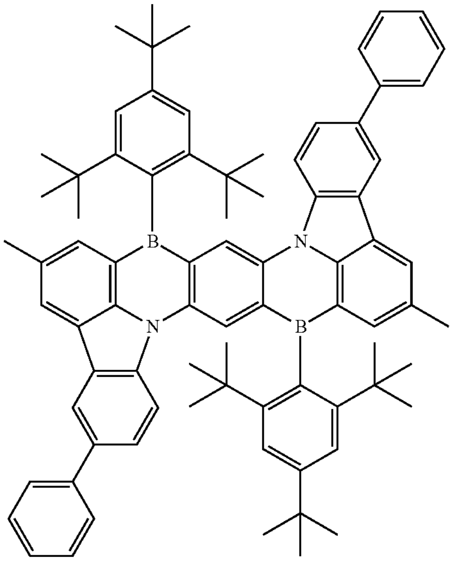
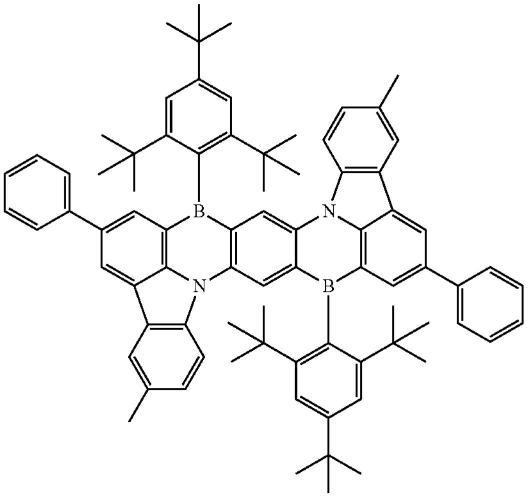

-continued
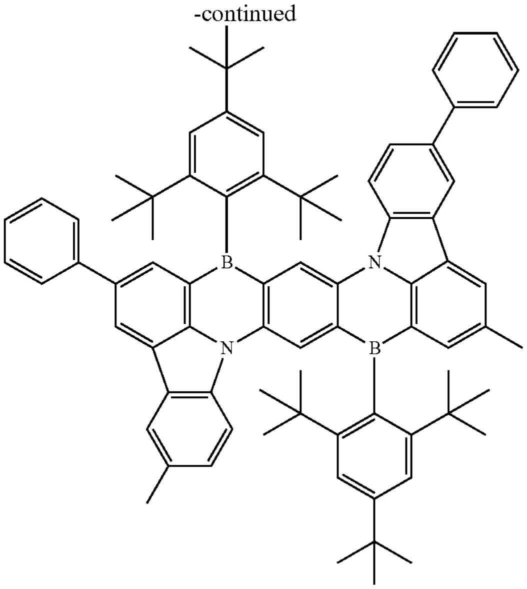
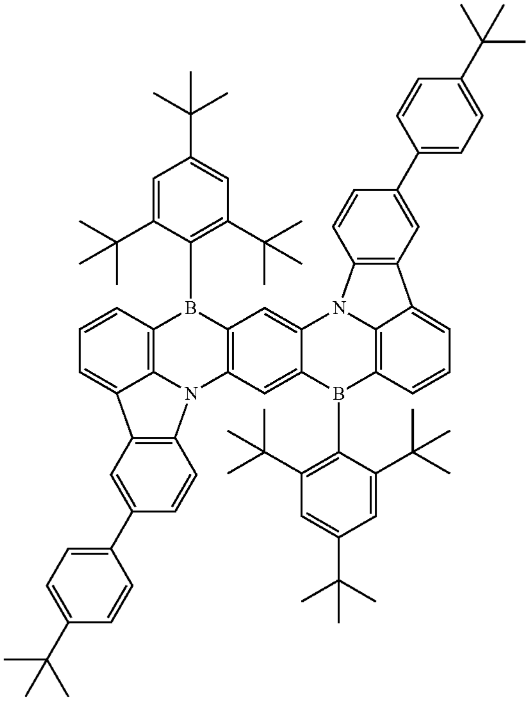
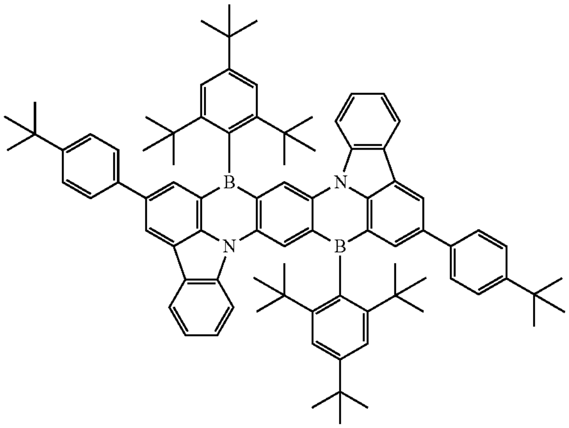
-continued
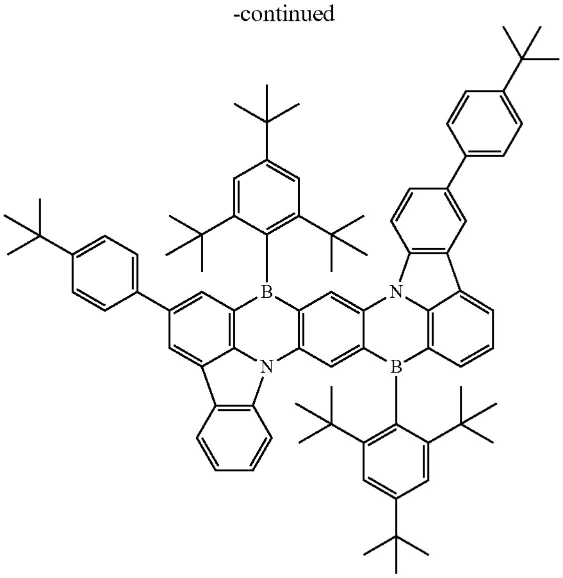
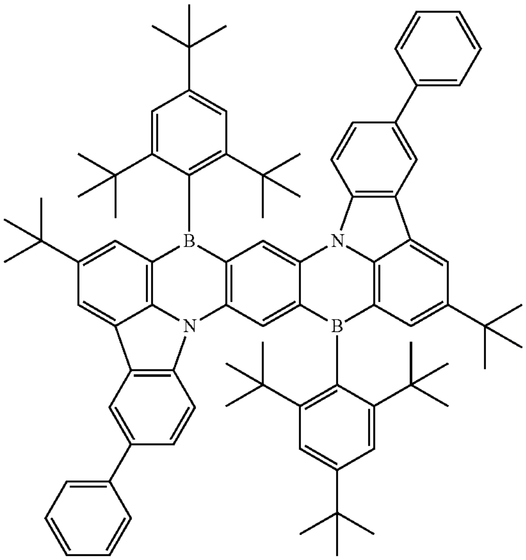
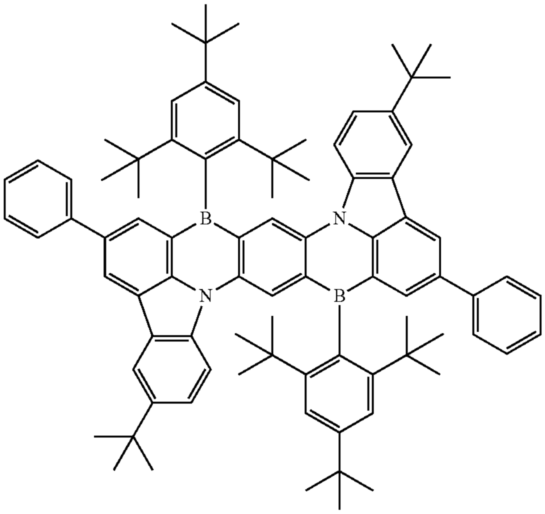

-continued

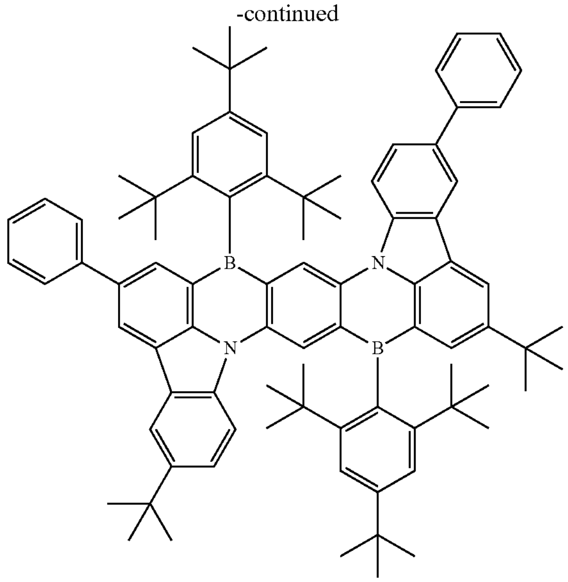

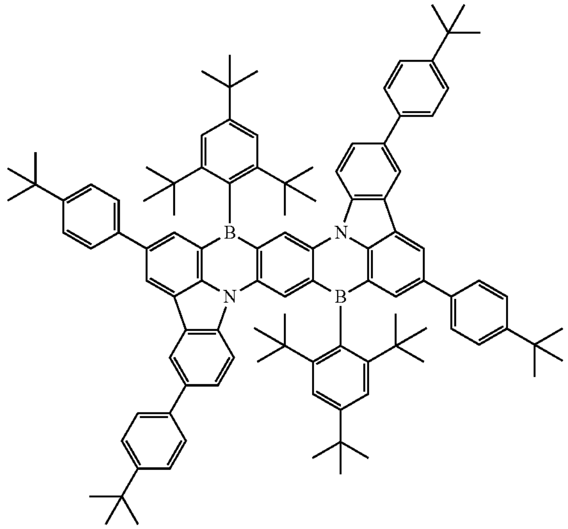

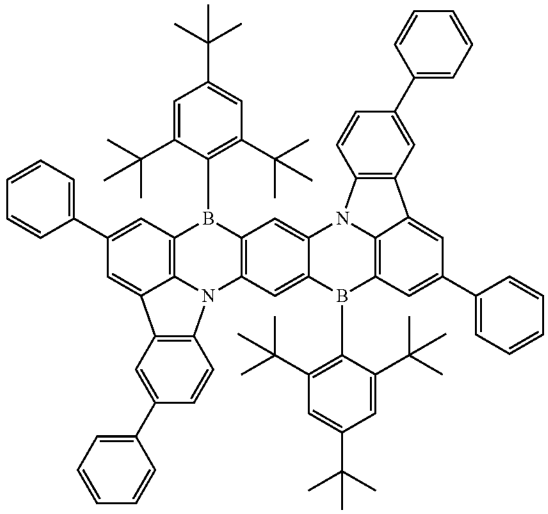

-continued

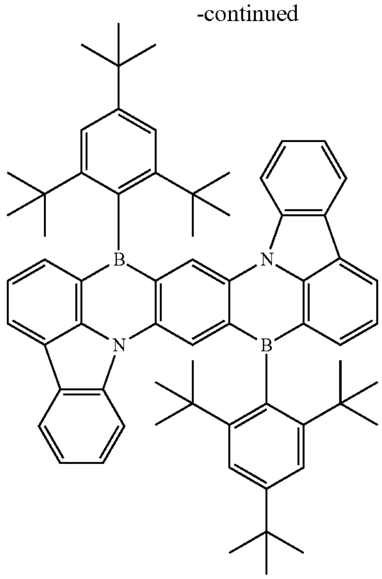

As one preferable group of compounds having the skeleton (1b), compounds represented by the following formula (1 b) may be exemplified.

Formula (1b)

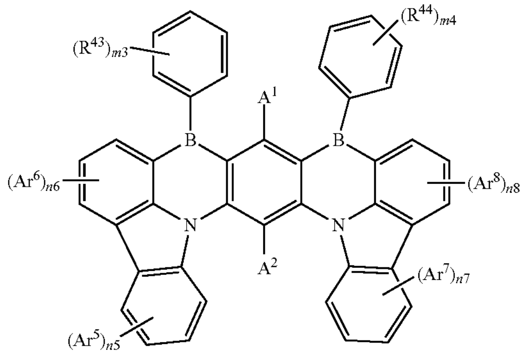

In the formula (1b), each of $Ar^5$ to $Ar^8$ independently represents a substituted or unsubstituted aryl group, a substituted or unsubstituted heteroaryl group, or a substituted or unsubstituted alkyl group, and, for example, a substituted or unsubstituted aryl group may be preferably selected. Each of $R^{43}$ and $R^{44}$ independently represents a substituted or unsubstituted alkyl group. Each of m3 and m4 independently represents an integer of 0 to 5, each of n6 and n8 independently represents an integer of 0 to 3, and each of n5 and n7 independently represents an integer of 0 to 4. Each of $A^1$ and $A^2$ independently represents a hydrogen atom, a deuterium atom, or a substituent. In relation to details of $Ar^5$ to $Ar^8$, $R^{43}$ and $R^{44}$, m3 and m4, n5 to n8, $A^1$, and $A^2$, the descriptions on $Ar^1$ to $Ar^4$, $R^{41}$ and $R^{42}$, m1 and m2, n1 to n4, $A^1$, and $A^2$ in the formula (1a) may be referred to.

Hereinafter, specific examples of the compound represented by the formula (1b) will be given. Compounds of the formula (1b) that may be used in the present invention are not construed as limiting to the following specific examples.

-continued
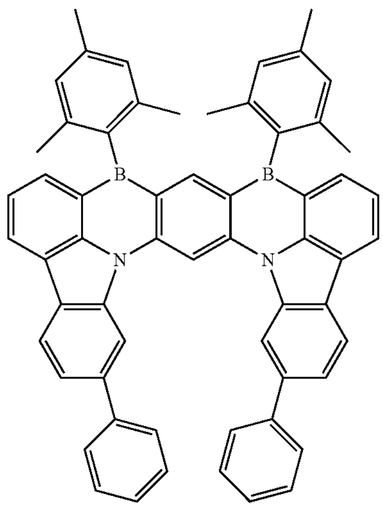
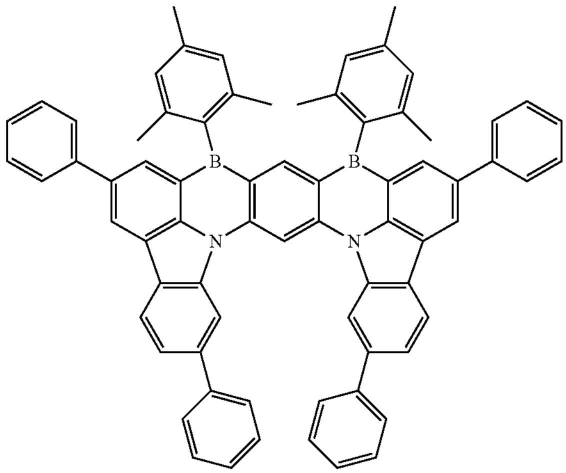
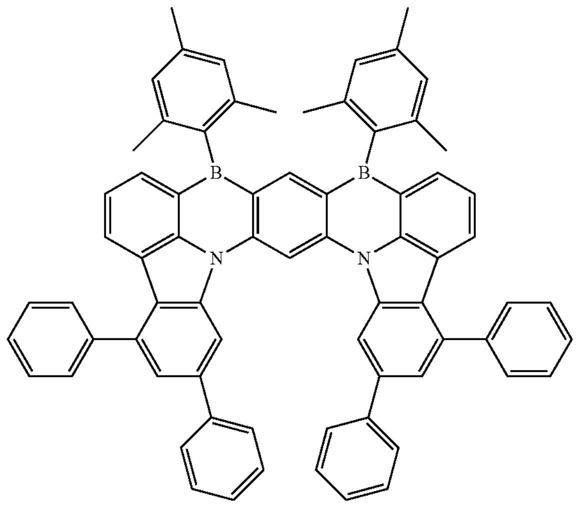
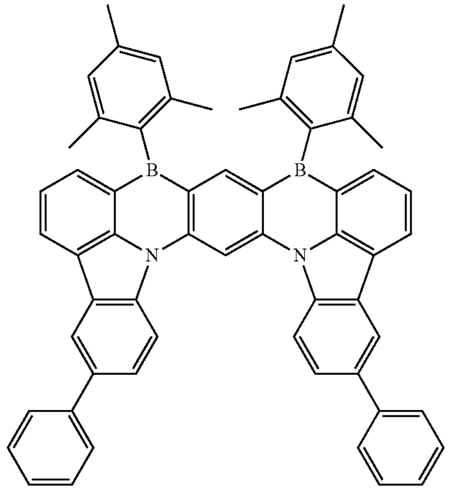
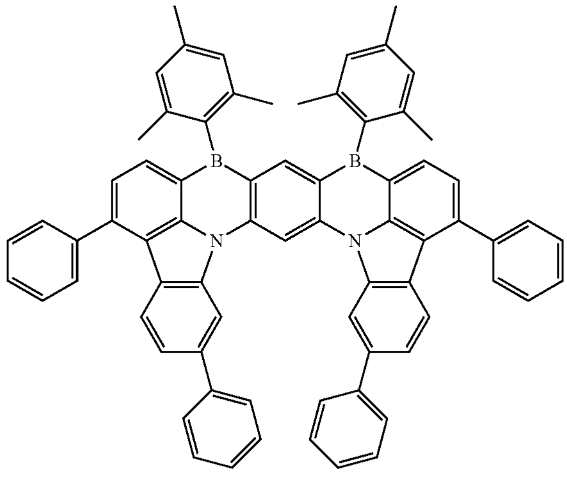
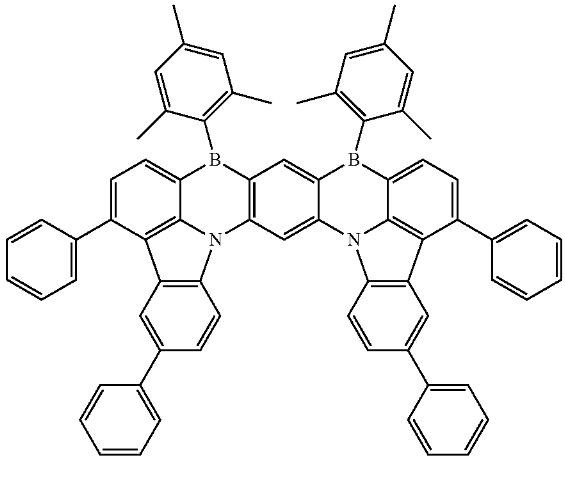

-continued
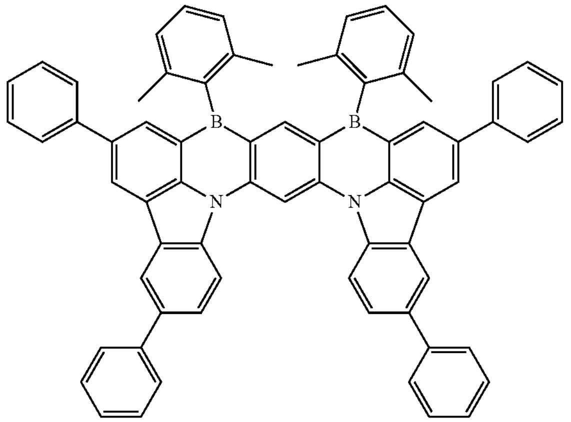
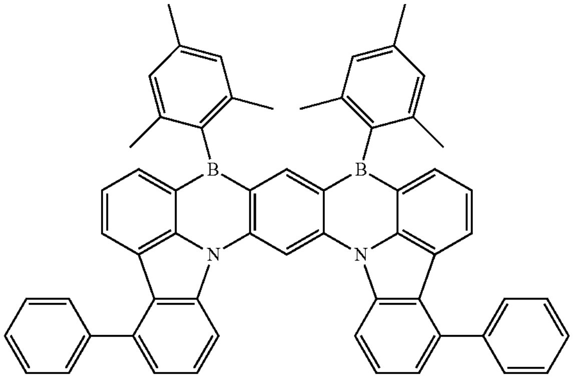
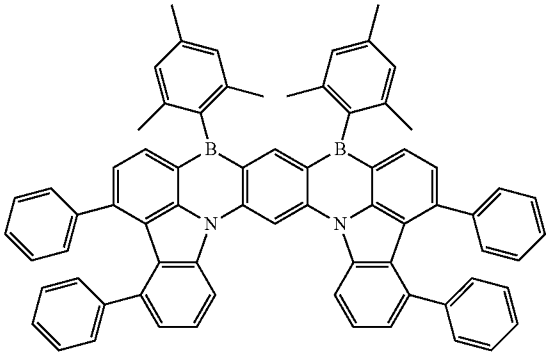
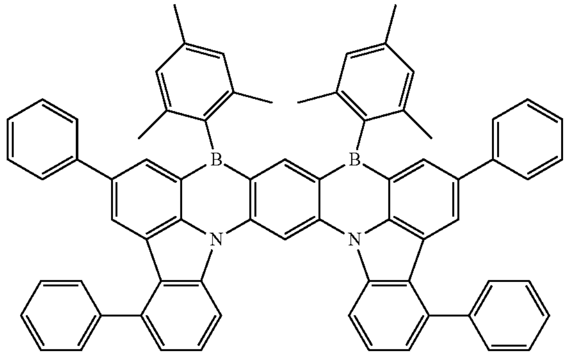
-continued
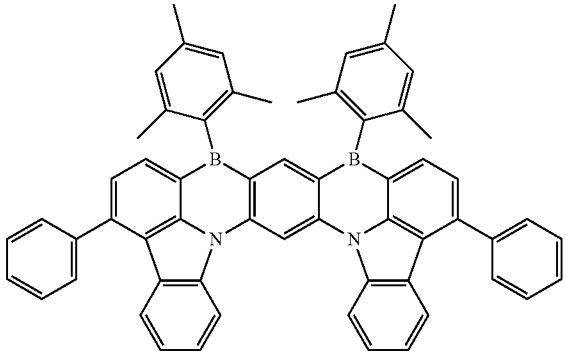
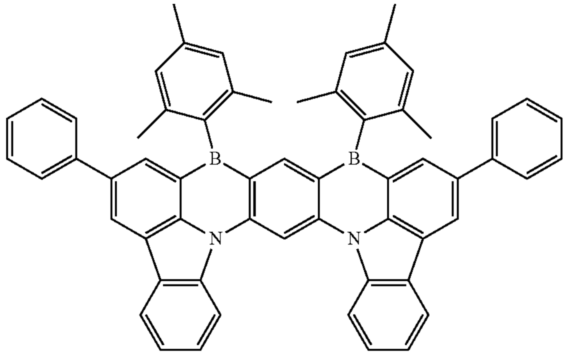
When $R^7$ and $R^8$ in the formula (1) are bonded to each other to form N-Ph, the compound of the present invention has, for example, the following skeleton (2a) if $X^1$ is a nitrogen atom, and, has for example, the following skeleton (2b) if $X^2$ is a nitrogen atom. Ph is a phenyl group.
Skeleton (2a)
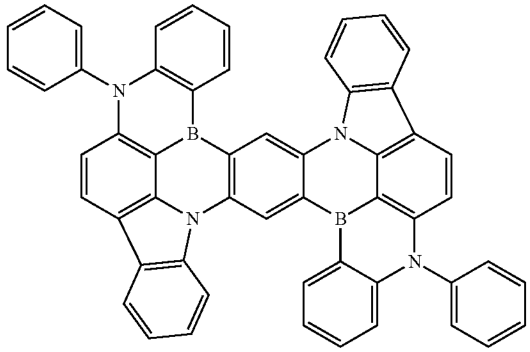
Skeleton (2b)
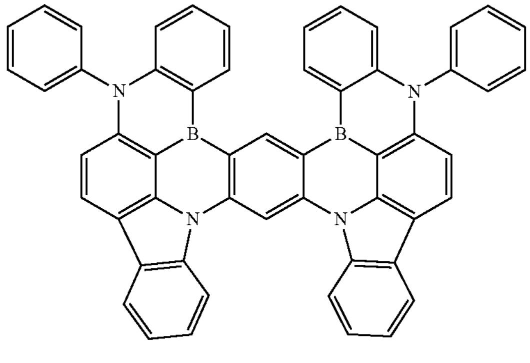

In the skeletons (2a) and (2b), each hydrogen atom may be substituted with a deuterium atom or a substituent. Further, it may be substituted with a linking group together with an adjacent hydrogen atom to form a ring structure. For details, corresponding descriptions on $R^1$ to $R^{26}$, $A^1$, and $A^2$ in the formula (1) may be referred to. At least one hydrogen atom of a benzene ring forming a carbazole partial structure included in the skeleton (2a) is substituted with a substituted or unsubstituted aryl group. In one aspect of the present invention, each hydrogen atom in the skeletons (2a) and (2b) is not substituted with a linking group together with an adjacent hydrogen atom to form a ring structure.

As one preferable group of compounds having the skeleton (2a), compounds represented by the following formula (2a) may be exemplified.

Formula (2a)

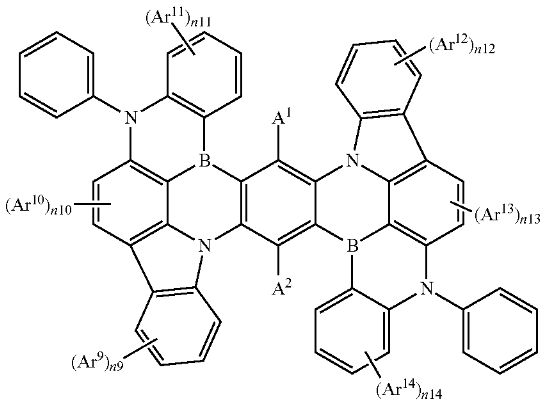

In the formula (2a), each of $Ar^9$ to $Ar^{14}$ independently represents a substituted or unsubstituted aryl group, a substituted or unsubstituted heteroaryl group, or a substituted or unsubstituted alkyl group, and for example, a substituted or unsubstituted aryl group may be preferably selected. Each of n9, n11, n12, and n14 independently represents an integer of 0 to 4, and each of n10 and n13 independently represents an integer of 0 to 2. Meanwhile, at least one of n9, n10, n12, and n13 is 1 or more. Each of $A^1$, and $A^2$ independently represents a hydrogen atom, a deuterium atom, or a substituent.

In one aspect of the present invention, each of n9 to n14 independently represents an integer of 0 to 2. In one aspect of the present invention, at least one of n9 to n14 is 1 or more. For example, n9 and n12 may be 1 or more or n10 and n13 may be 1 or more. In a preferred aspect of the present invention, at least one of n9, n10, n12, and n13 is 1 or more. In one aspect of the present invention, each of n9 and n12 is independently 1 or 2, and n10, n11, n13, and n14 are 0. In one aspect of the present invention, each of n10 and n13 is independently 1 or 2, and n9, n11, n12, and n14 are 0. In one aspect of the present invention, each of n9 and n12 is independently 1 or 2, each of n10 and n13 is independently 1 or 2, and n11 and n14 are 0. In one aspect of the present invention, n9 to n14 are all 1. The bond positions of $Ar^9$ to $Ar^{14}$ may be 3 and 6 positions of a carbazole ring, or may be other positions. In a preferred aspect of the present invention, $Ar^9$ to $Ar^{14}$ are all the same group. For preferable groups for $Ar^9$ to $Ar^{14}$, corresponding descriptions on $Ar^1$ to $Ar^4$ may be referred to. For descriptions and preferable ranges of $A^1$ and $A^2$, corresponding descriptions on the formula (1) may be referred to.

Hereinafter, specific examples of the compound represented by the formula (2a) will be given. Compounds of the formula (2a) that may be used in the present invention are not construed as limiting to the following specific examples.

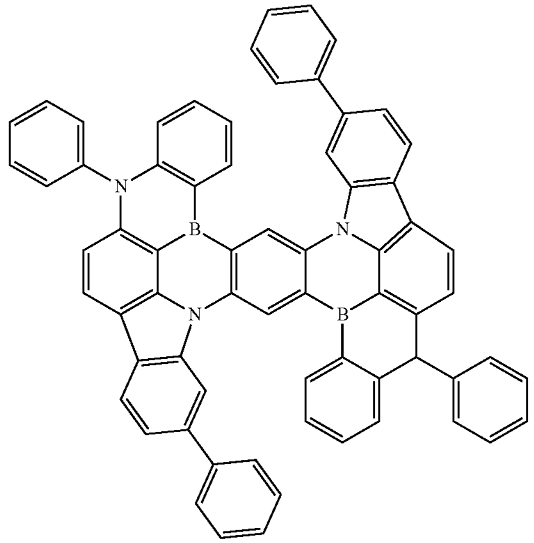

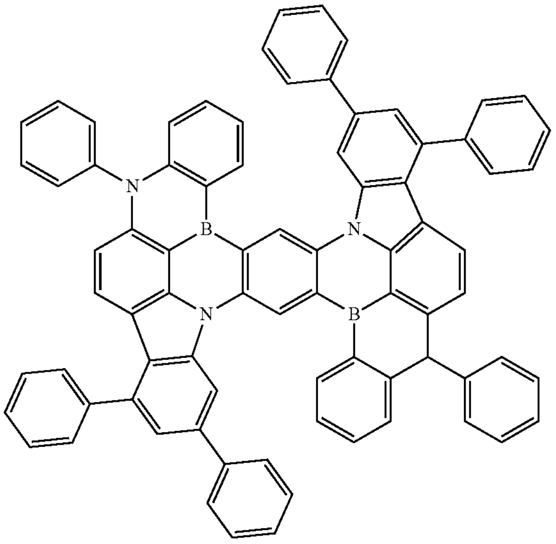

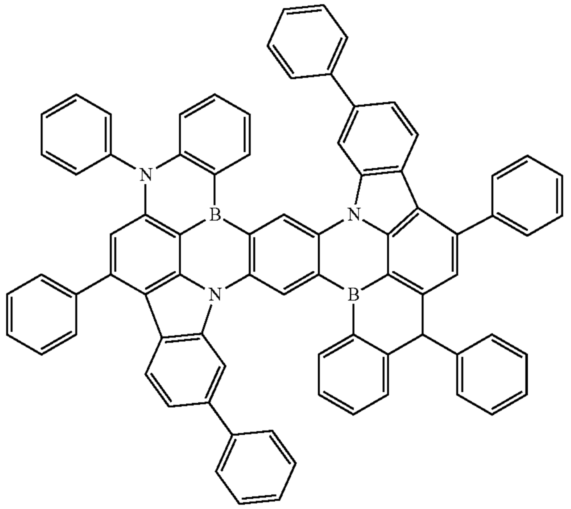

-continued
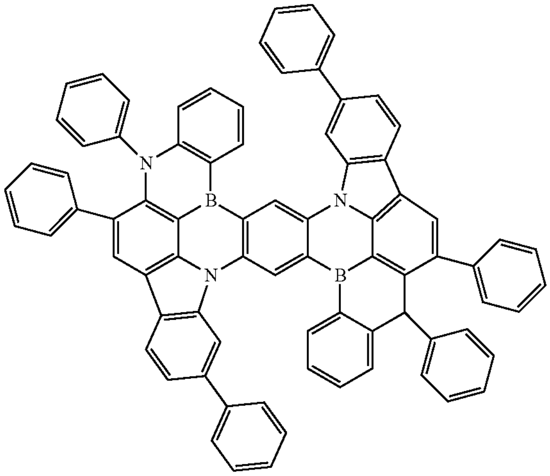
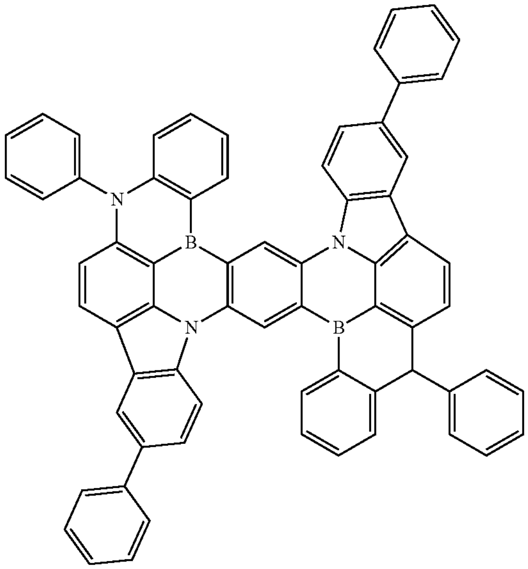
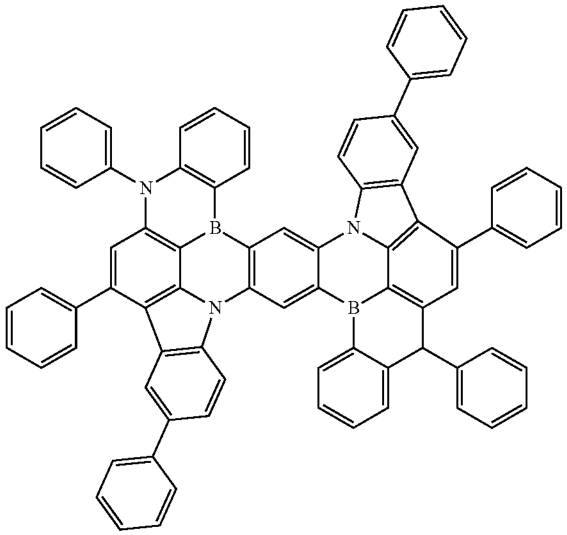
-continued
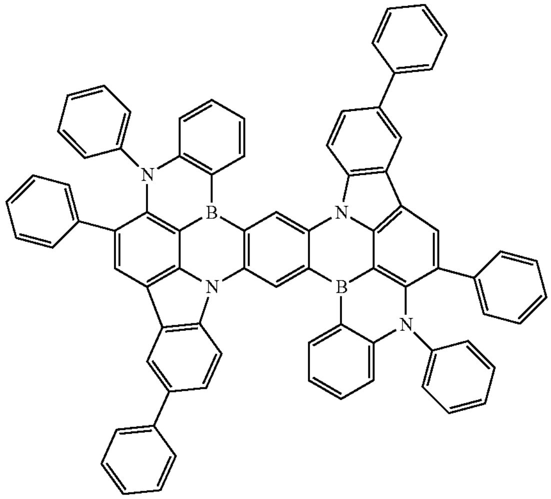
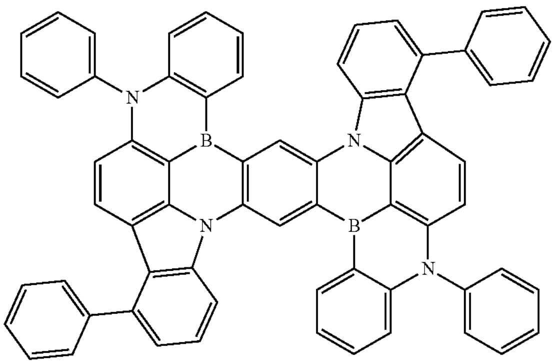
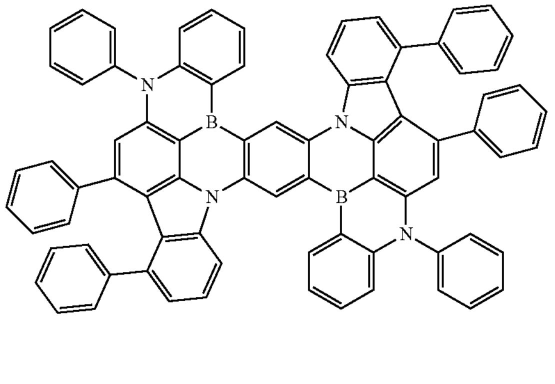
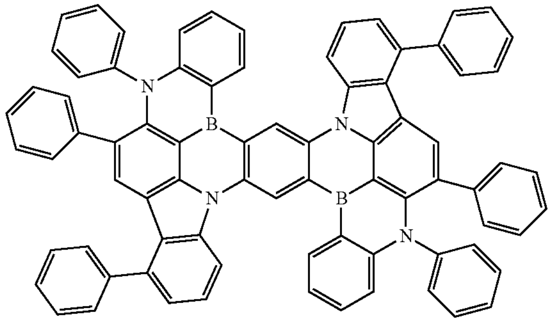

-continued

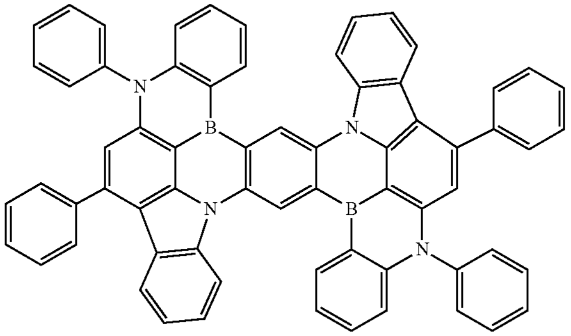

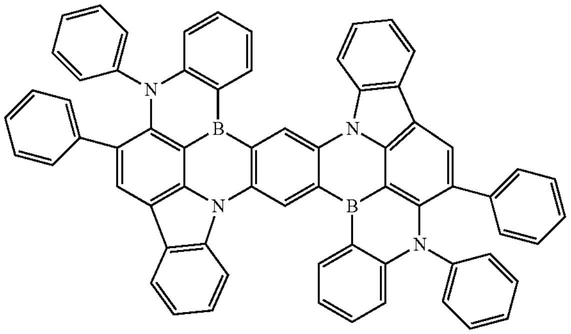

As one preferable group of compounds having the skeleton (2b), compounds represented by the following formula (2b) may be exemplified.

Formula (2b)

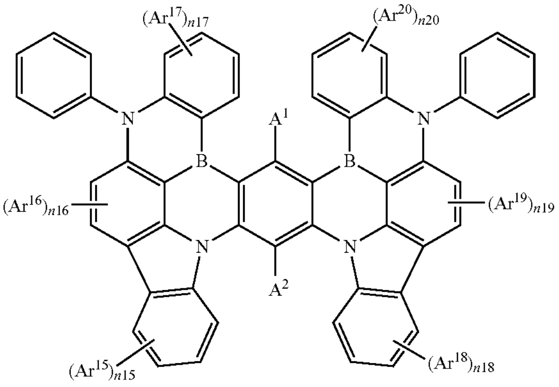

In the formula (2b), each of $Ar^{15}$ to $Ar^{20}$ independently represents a substituted or unsubstituted aryl group, a substituted or unsubstituted heteroaryl group, or a substituted or unsubstituted alkyl group, and, for example, a substituted or unsubstituted aryl group may be preferably selected. Each of n15, n17, n18, and n20 independently represents an integer of 0 to 4, and each of n16 and n19 independently represents an integer of 0 to 2. Each of $A^1$, and $A^2$ independently represents a hydrogen atom, a deuterium atom, or a substituent. For details of $Ar^{15}$ to $Ar^{20}$, n15 to n20, $A^1$, and $A^2$, descriptions on $Ar^9$ to $Ar^{14}$, n9 to n14, $A^1$, and $A^2$ in the formula (2a) may be referred to in this order.

Hereinafter, specific examples of the compound represented by the formula (2b) will be given. Compounds of the formula (2b) that may be used in the present invention are not construed as limiting to the following specific examples.

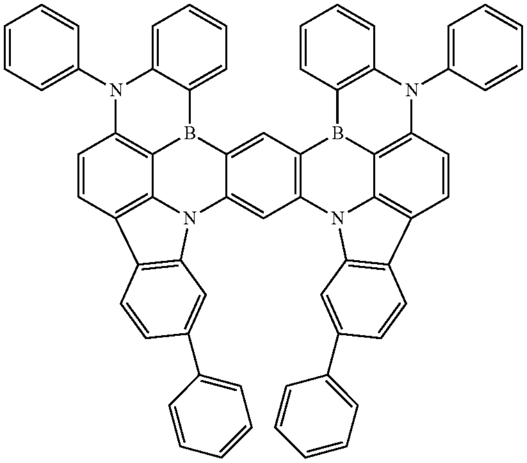

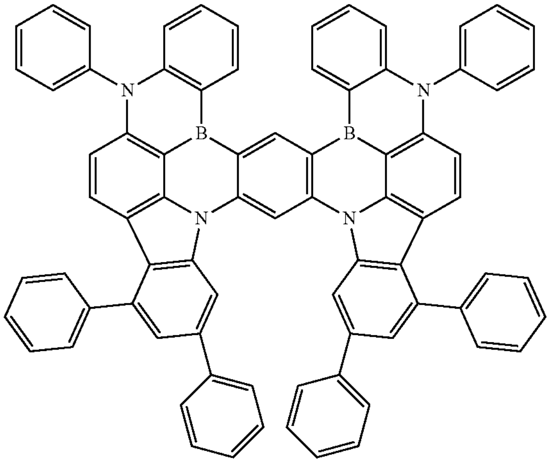

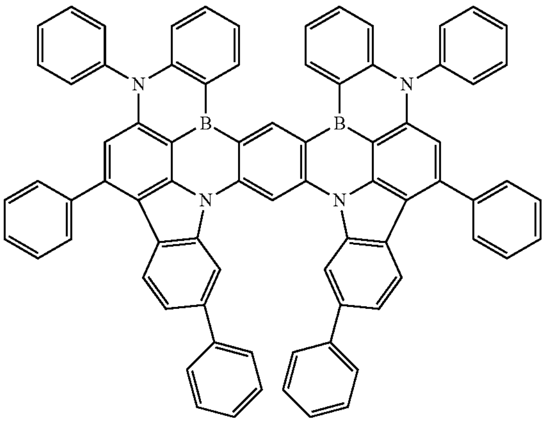

-continued
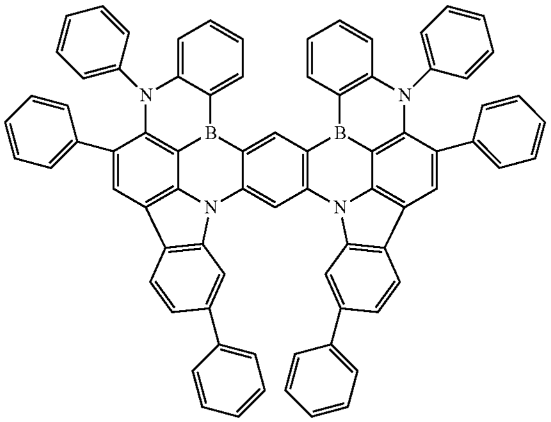
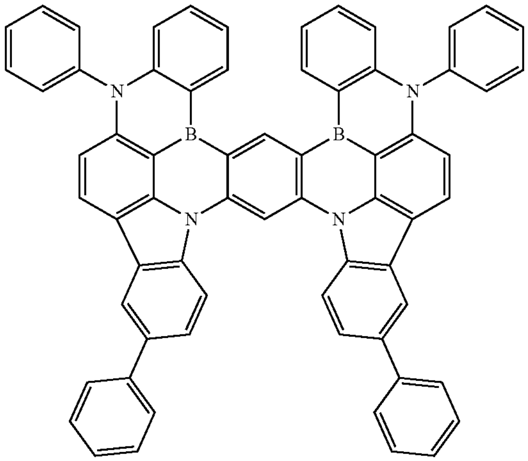
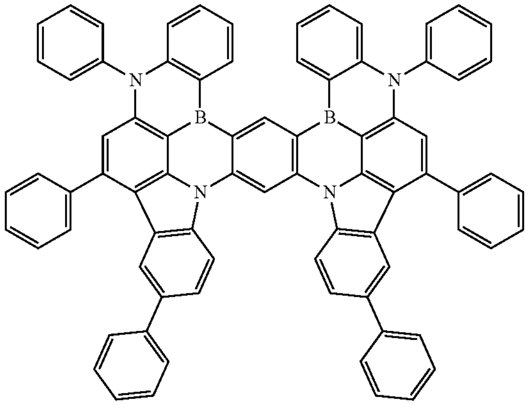
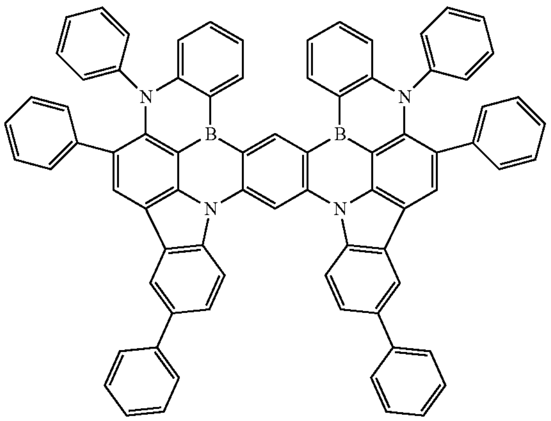
-continued
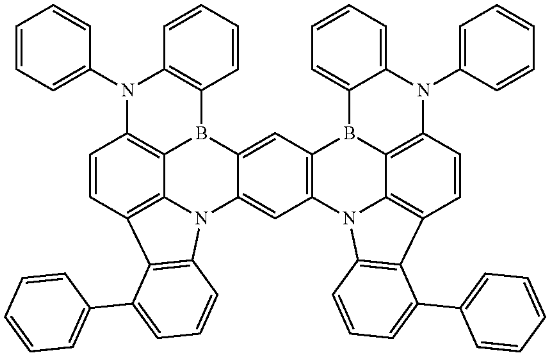
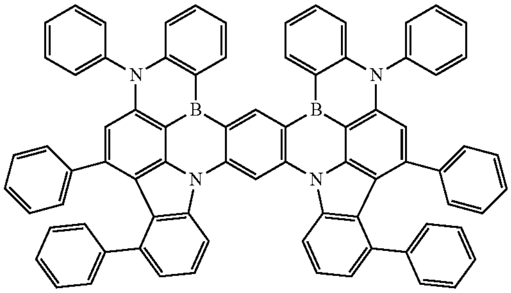
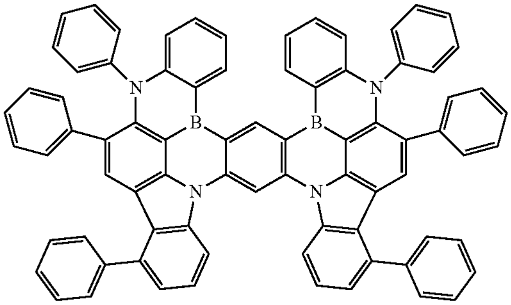
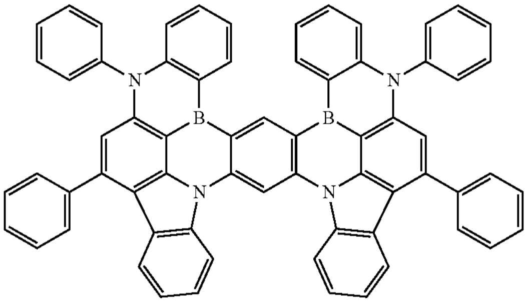
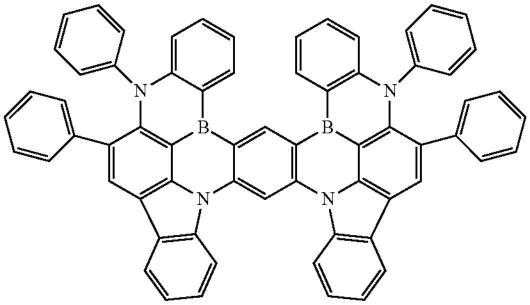
When $R^7$ and $R^8$ in the formula (1) are bonded to each other to form a single bond, the compound of the present invention has, for example, the following skeleton (3a) if $X^1$ is a nitrogen atom, and has, for example, the following skeleton (3b) if $X^2$ is a nitrogen atom.

Skeleton (3a)

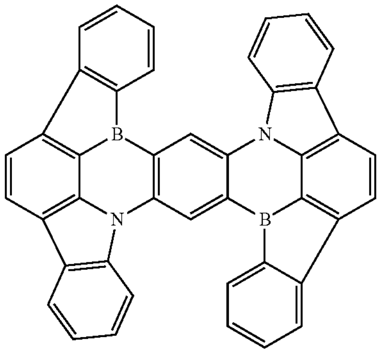

Skeleton (3b)

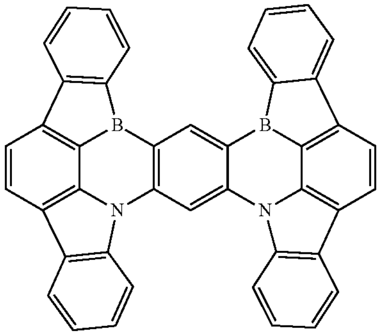

In the skeletons (3a) and (3b), each hydrogen atom may be substituted with a deuterium atom or a substituent. Further, it may be substituted with a linking group together with an adjacent hydrogen atom to form a ring structure. For details, corresponding descriptions on $R^1$ to $R^{26}$, $A^1$, and $A^2$ in the formula (1) may be referred to. In one aspect of the present invention, each hydrogen atom in the skeletons (3a) and (3b) is not substituted with a linking group together with an adjacent hydrogen atom to form a ring structure.

As one preferable group of compounds having the skeleton (3a), compounds represented by the following formula (3a) may be exemplified.

Formula (3a)

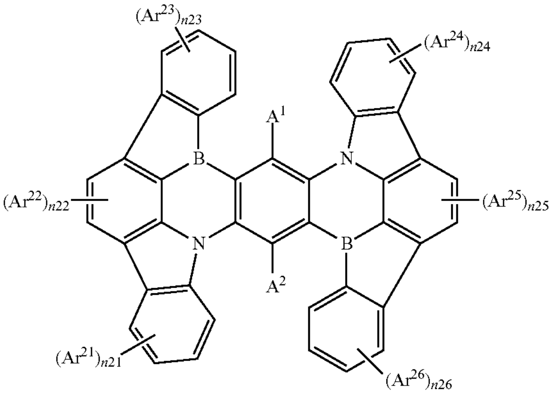

In the formula (3a), each of $Ar^{21}$ to $Ar^{26}$ independently represents a substituted or unsubstituted aryl group, a substituted or unsubstituted heteroaryl group, or a substituted or unsubstituted alkyl group, and for example, a substituted or unsubstituted aryl group may be preferably selected. Each of n21, n23, n24, and n26 independently represents an integer of 0 to 4, and each of n22 and n25 independently represents an integer of 0 to 2. Each of $A^1$ and $A^2$ independently represents a hydrogen atom, a deuterium atom, or a substituent. For details of $Ar^{21}$ to $Ar^{25}$, and n21 to n25, descriptions on $Ar^9$ to $Ar^{\prime\prime\prime}$, n9 to n14. $A^1$, and $A^2$ in the formula (2a) may be referred to.

Hereinafter, specific examples of the compound represented by the formula (3a) will be given. Compounds of the formula (3a) that may be used in the present invention are not construed as limiting to the following specific examples.

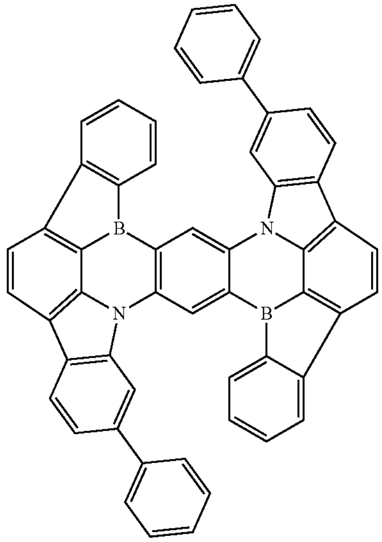

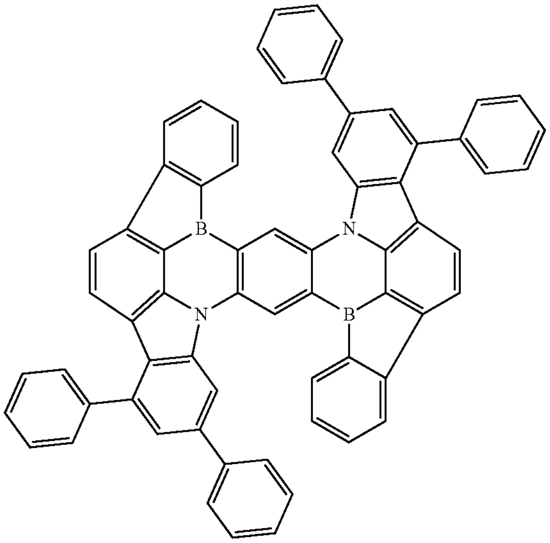

-continued
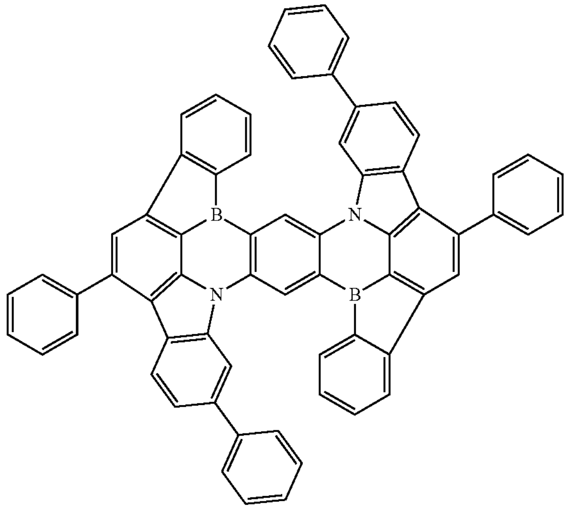
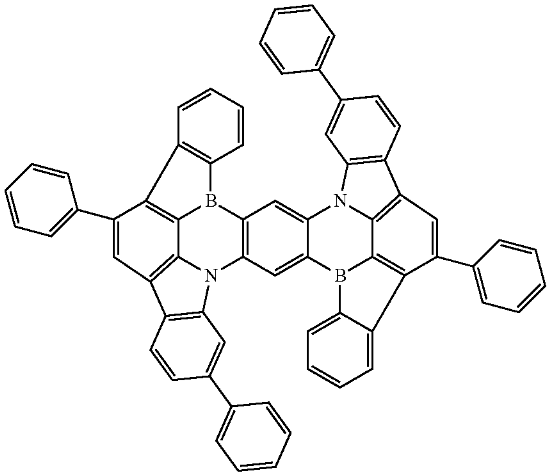
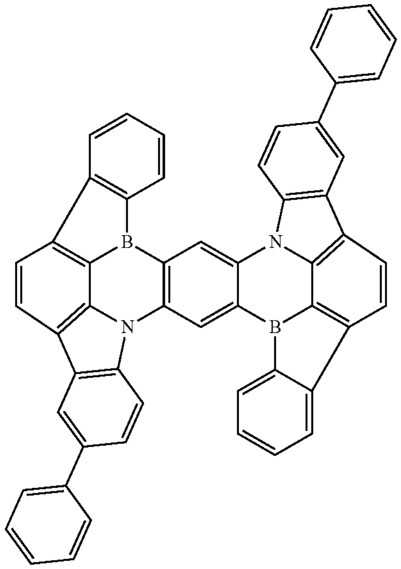
-continued
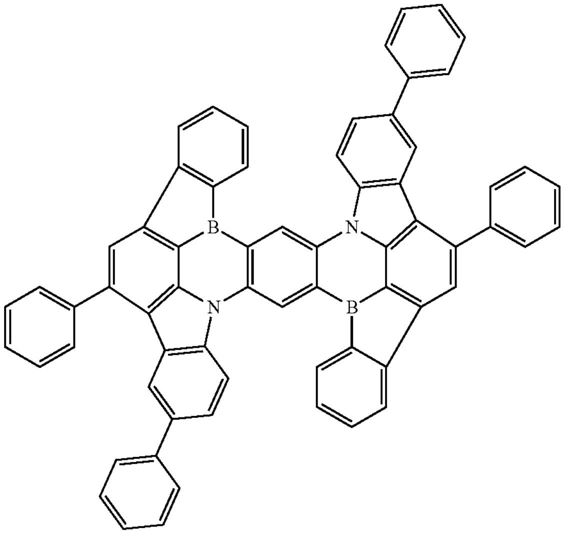
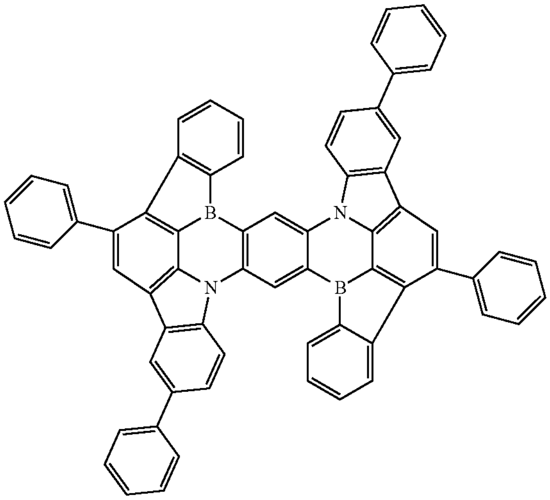
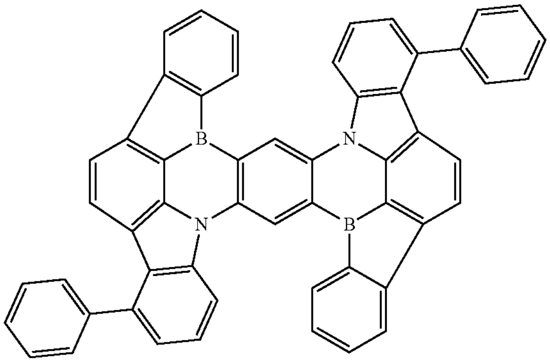
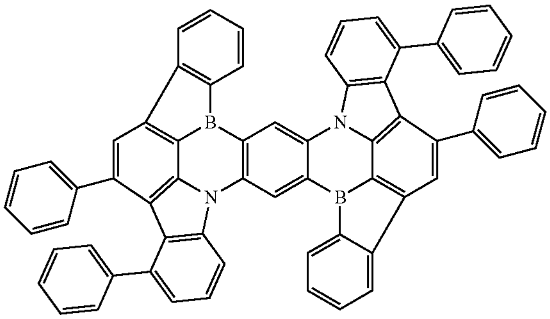

-continued

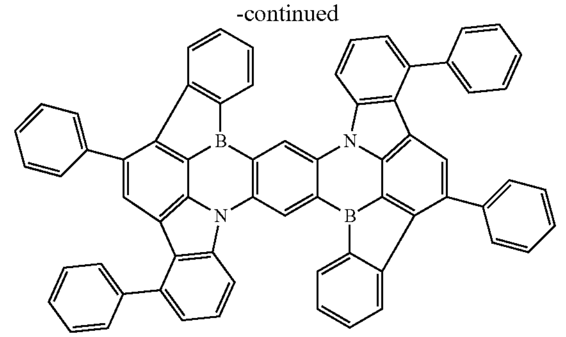

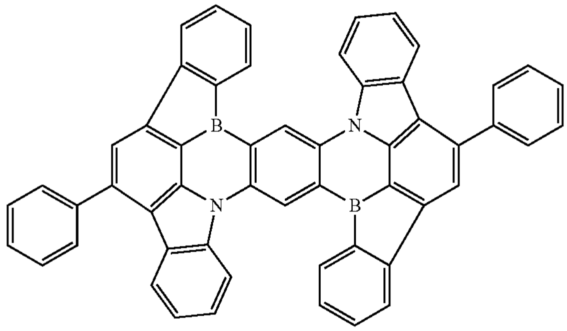

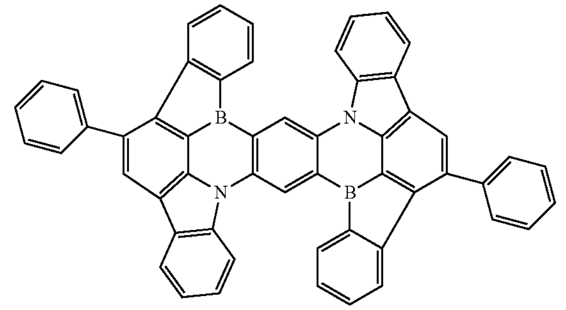

As one preferable group of compounds having the skeleton (3b), compounds represented by the following formula (3b) may be exemplified.

Formula (3b)

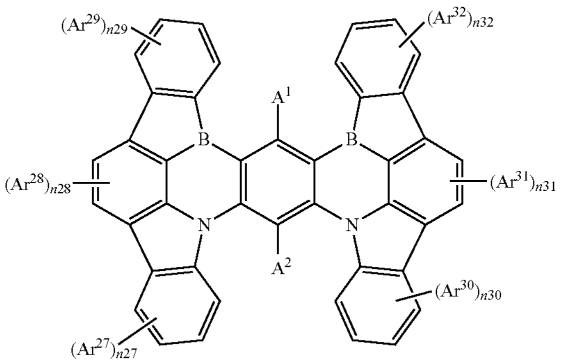

In the formula (3b), each of $Ar^{27}$ to $Ar^{32}$ independently represents a substituted or unsubstituted aryl group, a substituted or unsubstituted heteroaryl group, or a substituted or unsubstituted alkyl group, and for example, a substituted or unsubstituted aryl group may be preferably selected. Each of n27, n29, n30, and n32 independently represents an integer of 0 to 4, and each of n28 and n31 independently represents an integer of 0 to 2. Each of $A^1$ and $A^2$ independently represents a hydrogen atom, a deuterium atom, or a substituent. For details of $Ar^{27}$ to $Ar^{32}$, n27 to n32, $A^1$, and $A^2$, descriptions on $Ar^{15}$ to $Ar^{20}$, n15 to n20, $A^1$, and $A^2$ in the formula (2b) may be referred to in this order.

Hereinafter, specific examples of the compound represented by the formula (3b) will be given. Compounds of the formula (3b) that may be used in the present invention are not construed as limiting to the following specific examples.

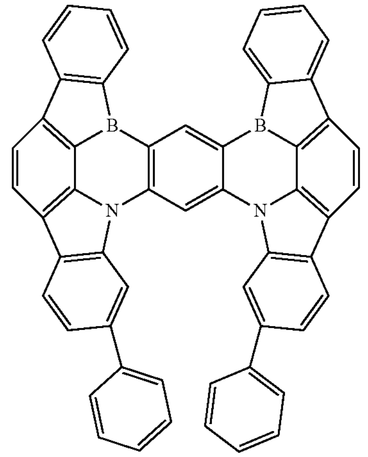

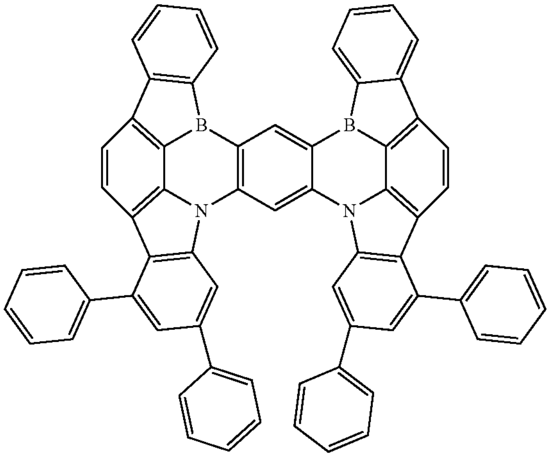

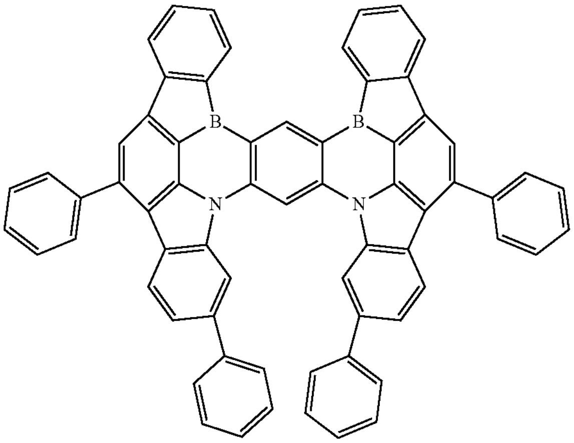

-continued
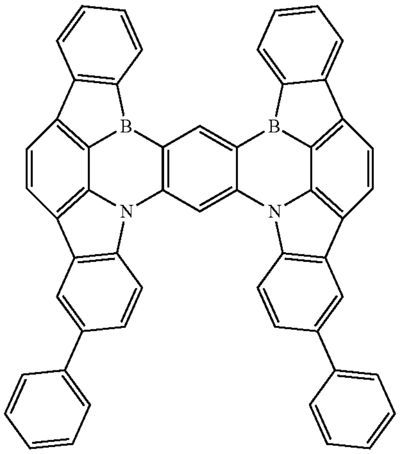
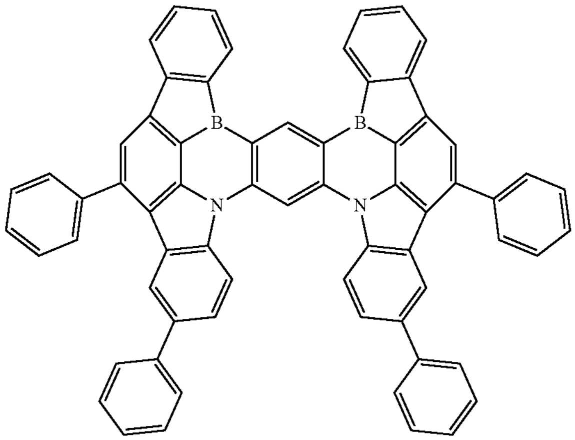
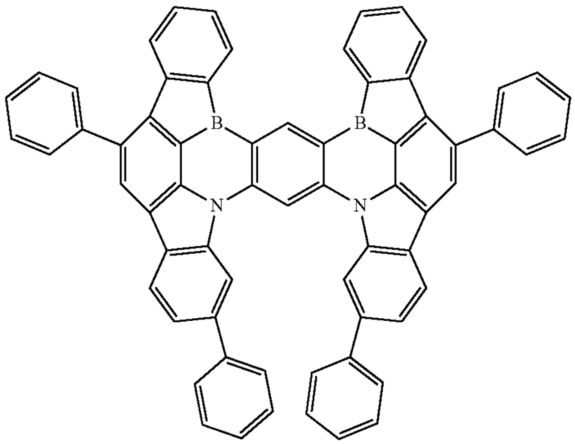
-continued
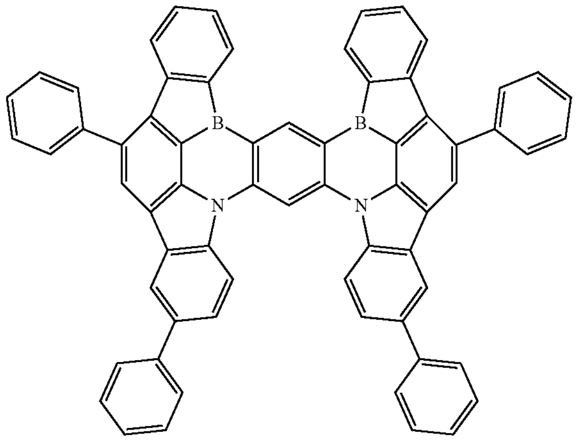
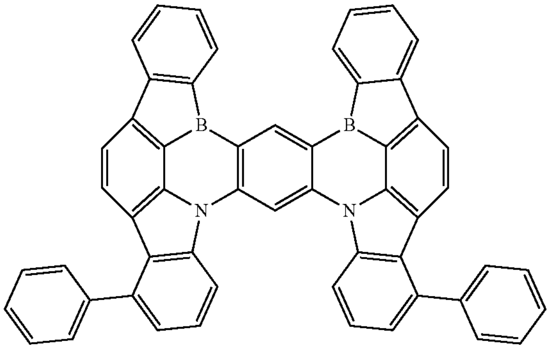
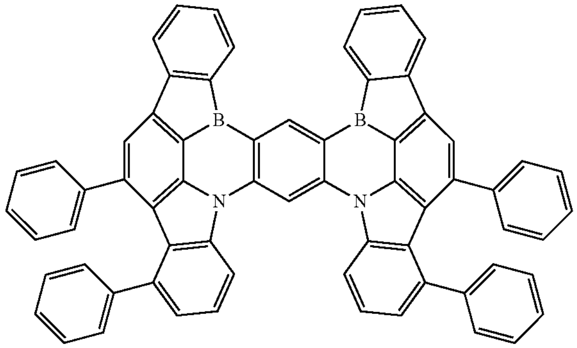
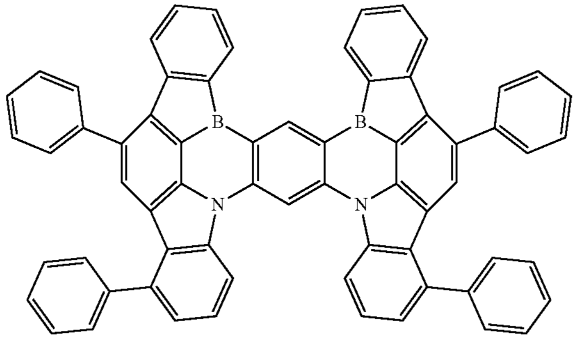

-continued

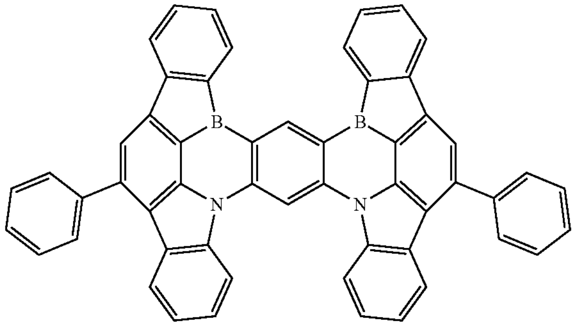

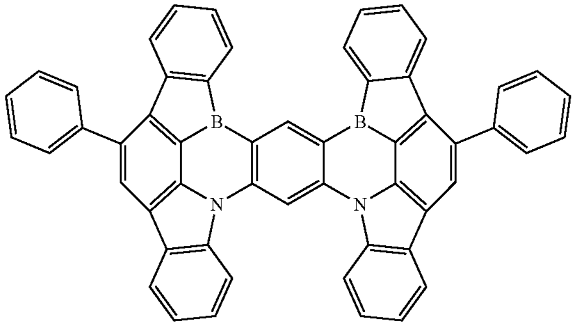

In a preferred aspect of the present invention, compounds in which another ring is condensed with two benzene rings forming a carbazole partial structure existing in the formula (1) are selected. Among them, a compound in which a benzofuran ring is condensed, a compound in which a benzothiophene ring is condensed, and a compound in which a benzene ring is condensed may be particularly preferably selected. Hereinafter, compounds in which these rings are condensed will be described with reference to specific examples.

A compound in which a benzofuran ring or a benzothiophene ring is condensed with a benzene ring to which a boron atom is not directly bonded, between two benzene rings forming a carbazole partial structure existing in the formula (1), may be preferably mentioned. Examples of such a compound include a compound having the following skeleton (4a), and a compound having the following skeleton (4b).

Skeleton (4a)

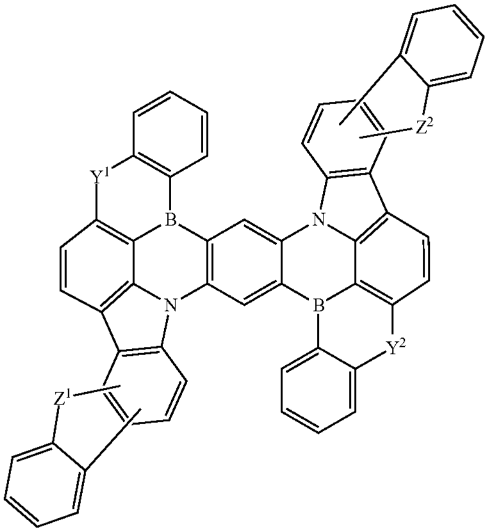

Skeleton (4b)

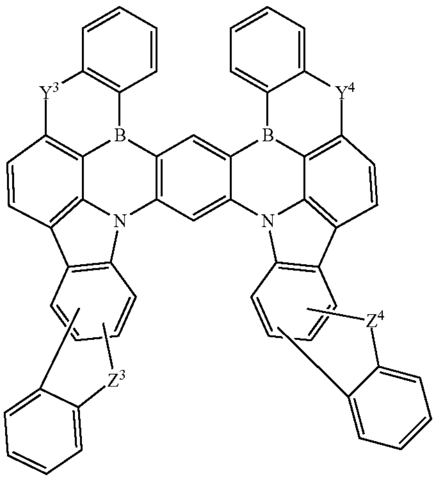

In the skeletons (4a) and (4b), each of $Y^1$ to $Y^4$ independently represents two hydrogen atoms, a single bond or $N(R^{27})$. Two hydrogen atoms mentioned herein indicate a state where two benzene rings bonded to a boron atom are not linked to each other. It is preferable that $Y^1$ and $Y^2$ are the same, and $Y^3$ and $Y^4$ are the same, but they may be different from each other. In one aspect of the present invention, $Y^1$ to $Y^4$ are single bonds. In one aspect of the present invention, $Y^1$ to $Y^4$ are $N(R^{27})$. $R^{27}$ represents a hydrogen atom, a deuterium atom, or a substituent. Each of $Z^1$ to $Z^4$ independently represents an oxygen atom or a sulfur atom. It is preferable that $Z^1$ and $Z^2$ are the same, and $Z^3$ and $Z^4$ are the same, but they may be different from each other. In one aspect of the present invention, $Z^1$ to $Z^4$ are oxygen atoms. Here, a furan ring of benzofuran is condensed with the benzene ring forming the carbazole partial structure in (4a) and (4b). The orientation of the condensed furan ring is not limited. In one aspect of the present invention, $Z^1$ to $Z^4$ are sulfur atoms. Here, a thiophene ring of benzothiophene is condensed with the benzene ring forming the carbazole partial structure in (4a) and (4b). The orientation of the condensed thiophene ring is not limited.

each hydrogen atom in the skeletons (4a) and (4b) may be substituted with a deuterium atom or a substituent. Further, it may be substituted with a linking group together with an adjacent hydrogen atom to form a ring structure. For details, corresponding descriptions on $R^1$ to $R^{26}$, $A^1$, and $A^2$ in the formula (1) may be referred to. In one aspect of the present invention, each hydrogen atom in the skeletons (4a) and (4b) is not substituted with a linking group together with an adjacent hydrogen atom to form a ring structure.

As one preferable group of compounds having the skeleton (4a), compounds represented by the following formula (4a) may be exemplified. It is assumed that X in specific examples is an oxygen atom or a sulfur atom, and a compound in which X is an oxygen atom and a compound in which X is a sulfur atom are disclosed, respectively. Further, in specific examples of compounds represented by other subsequent formulas, X has the same meaning.

Formula (4a)

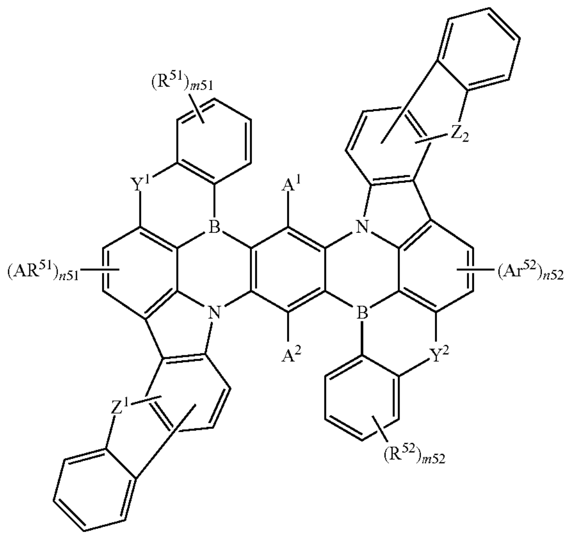

In the formula (4a), each of $Ar^{51}$ and $Ar^{52}$ independently represents a substituted or unsubstituted aryl group, a substituted or unsubstituted heteroaryl group, or a substituted or unsubstituted alkyl group, and for example, a substituted or unsubstituted aryl group may be preferably selected. Each of $R^{51}$ and $R^{52}$ independently represents a substituted or unsubstituted alkyl group. Each of m51 and m52 independently represents an integer of 0 to 4. Each of n51 and n52 independently represents an integer of 0 to 2. Each of $Y^1$ to $Y^4$ independently represents two hydrogen atoms, a single bond or $N(R^{27})$. $R^{27}$ represents a hydrogen atom, a deuterium atom, or a substituent. Each of $Z^1$ to $Z^4$ independently represents an oxygen atom or a sulfur atom. Each of $A^1$ and $A^2$ independently represents a hydrogen atom, a deuterium atom, or a substituent.

In one aspect of the present invention, n51 and n52 are the same number. For example, n51 and n52 may be 0, and n51 and n52 may be 1. In one aspect of the present invention, m51 and m52 are the same number. In one aspect of the present invention, m51 and m52 are integers of 0 to 3. For example, m51 and m52 may be 0, m51 and m52 may be 1, m51 and m52 may be 2, and m51 and m52 may be 3. In relation to preferable groups for $Ar^{se}$, $Ar^{52}$, $R^{51}$, $R^{52}$, $A^1$, and $A^2$, corresponding descriptions on $Ar^1$ to $Ar^4$, $R^{41}$ to $R^{42}$, $A^1$, and $A^2$ in the formula (1a) may be referred to.

Hereinafter, specific examples of the compound represented by the formula (4a) will be given. Compounds of the formula (4a) that may be used in the present invention are not construed as limiting to specific examples in the following one group. In relation to specific examples including X, it is assumed that a compound in which all X's in the molecule are oxygen atoms, and a compound in which all X's in the molecule are sulfur atoms are disclosed, respectively. A compound in which some of X's in the molecule are oxygen atoms, and the rest are sulfur atoms may also be adopted.

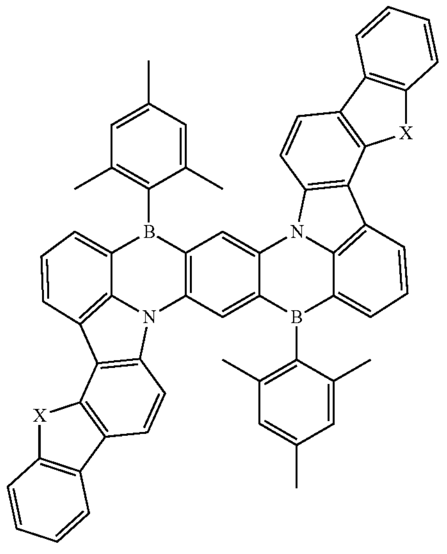

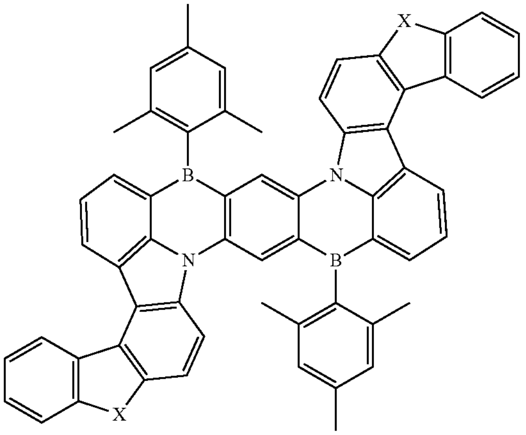

-continued
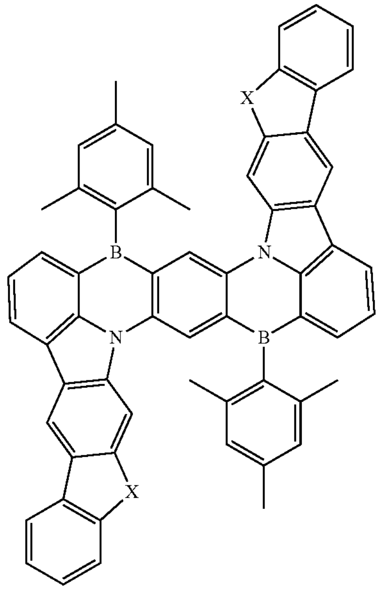
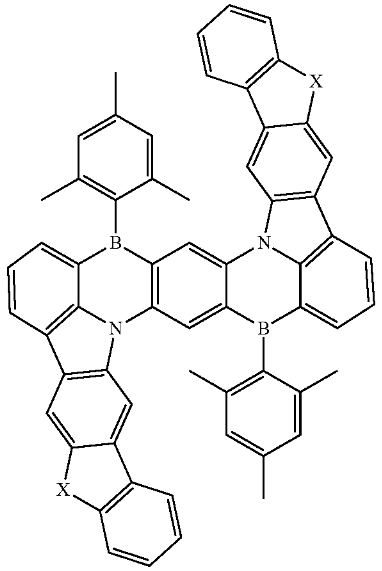
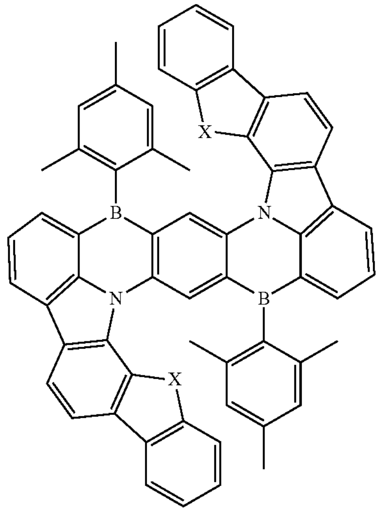
-continued
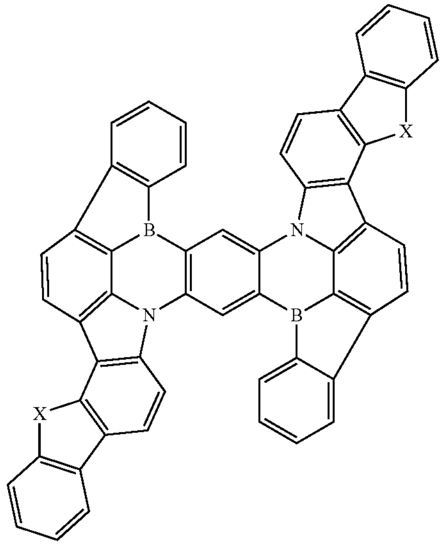
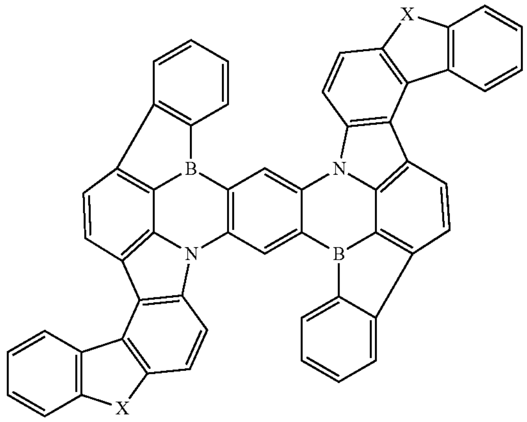
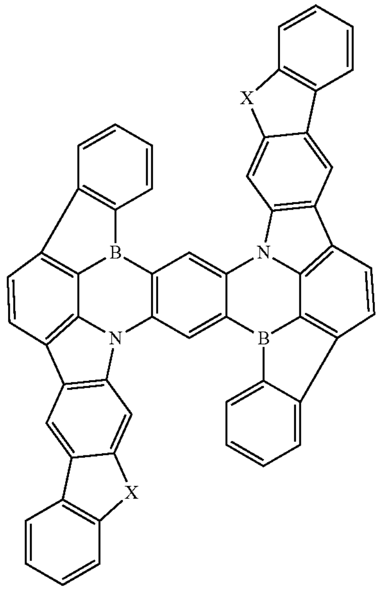

-continued
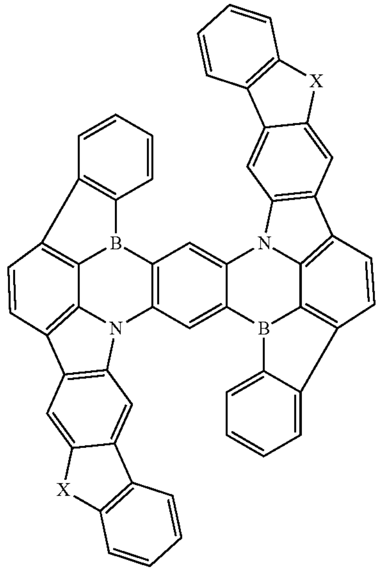
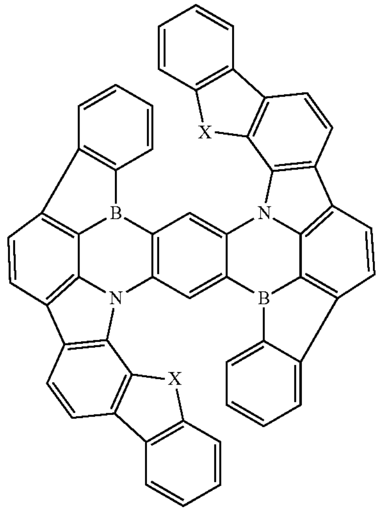
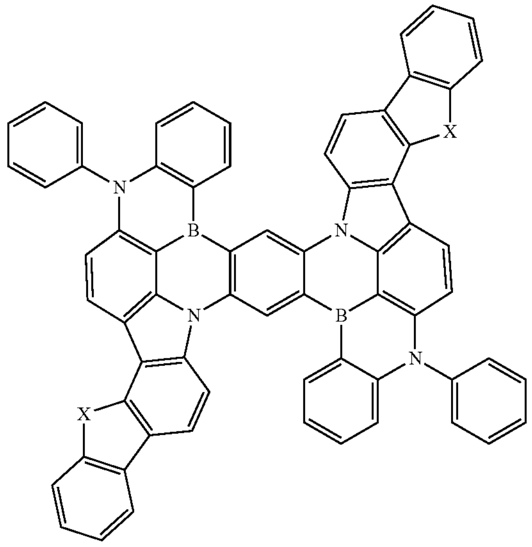
-continued
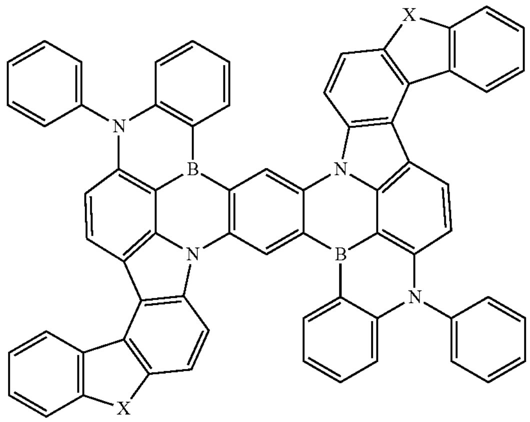
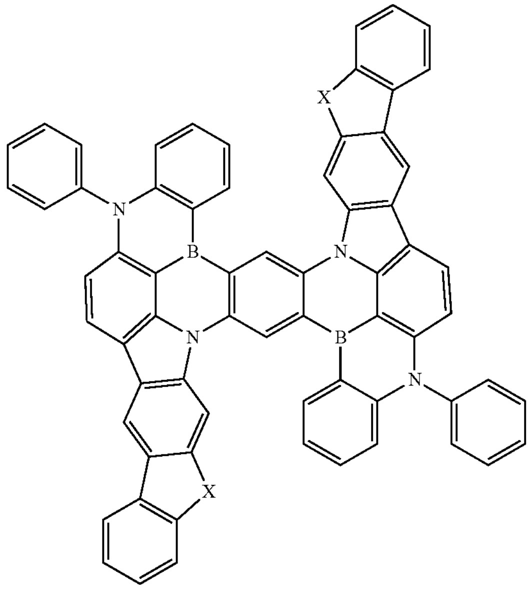
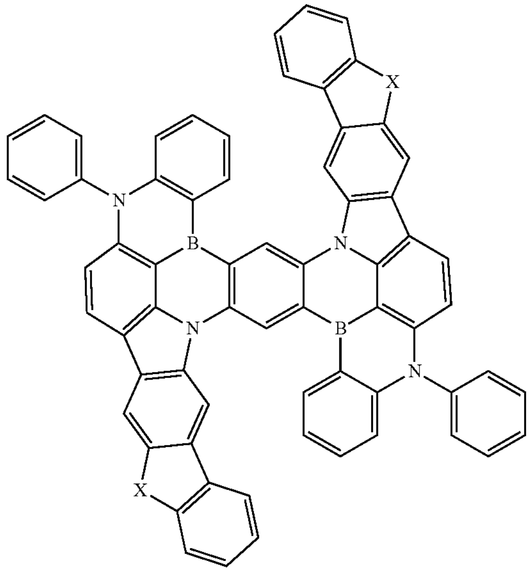

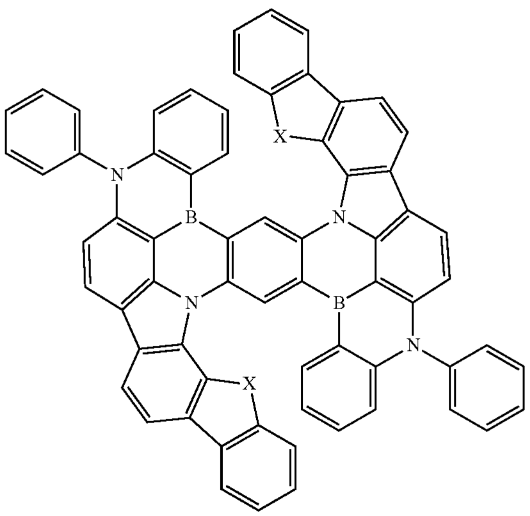
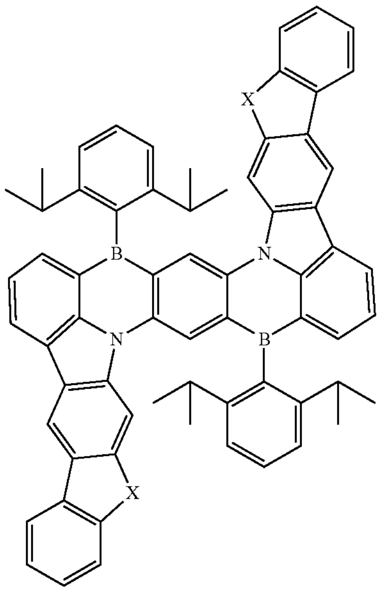
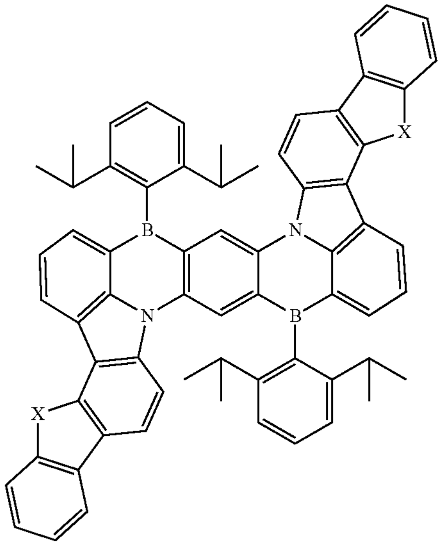
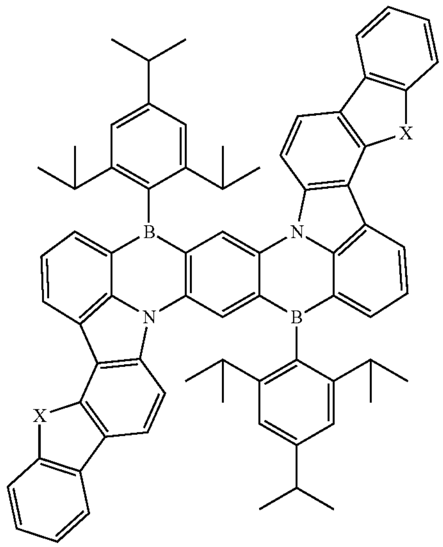
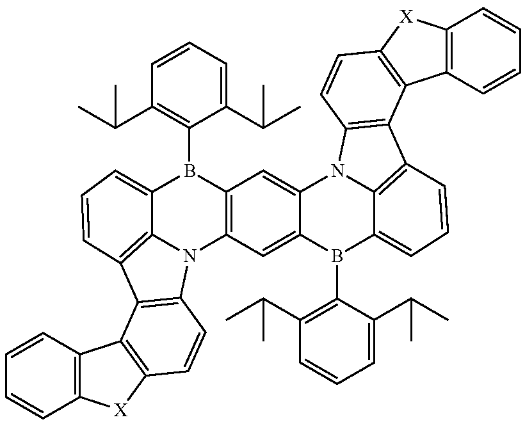
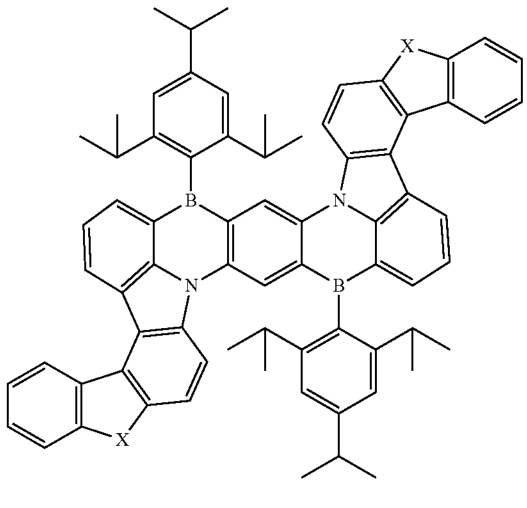

-continued
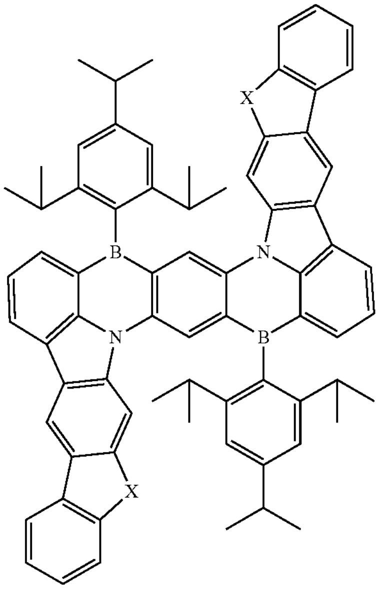
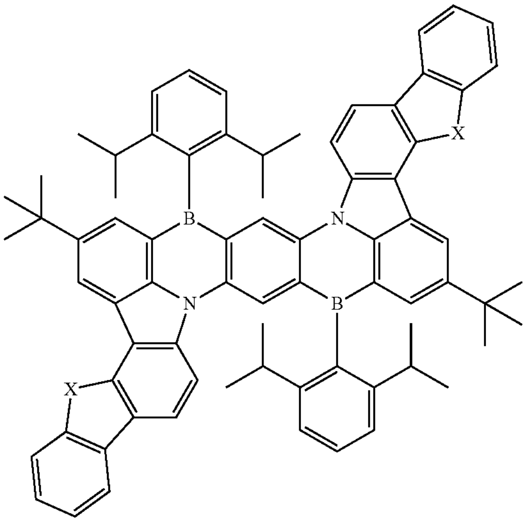
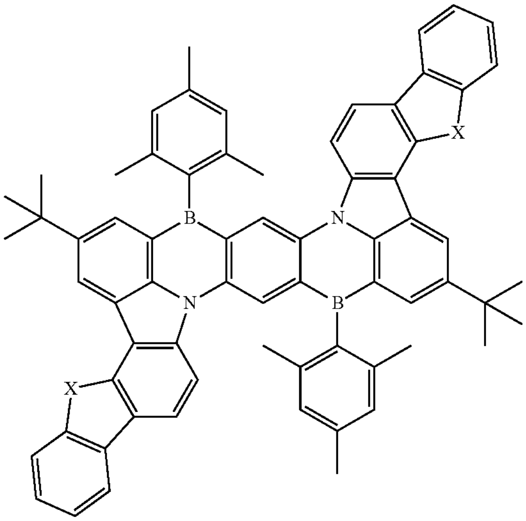
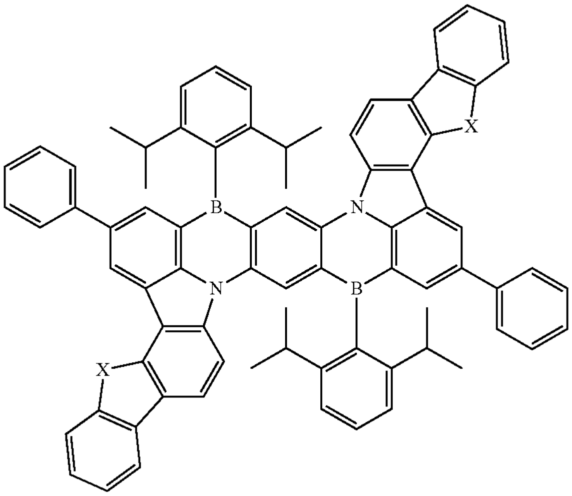
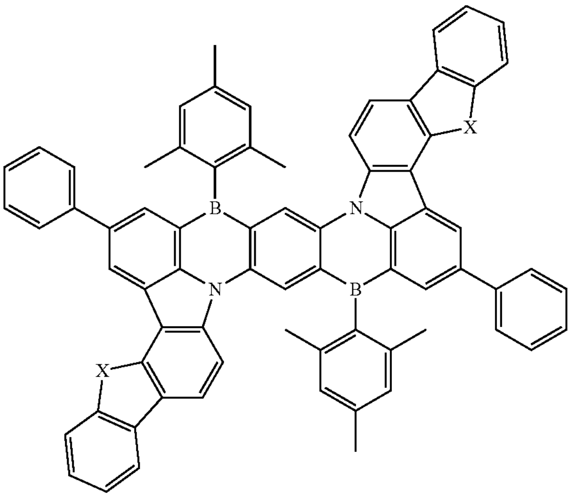
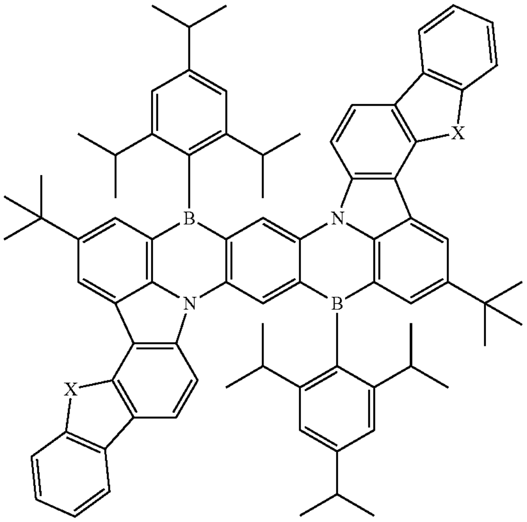

-continued
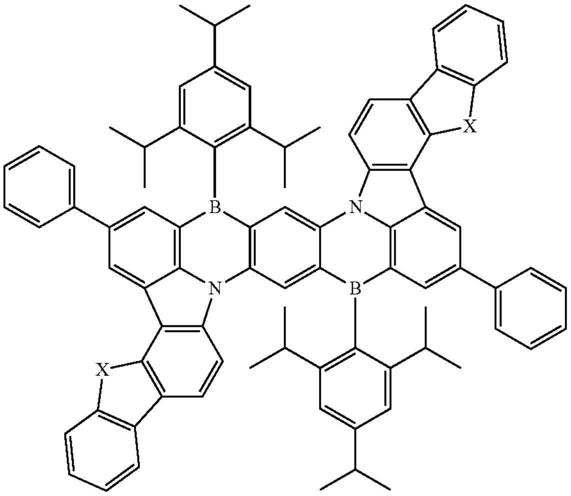
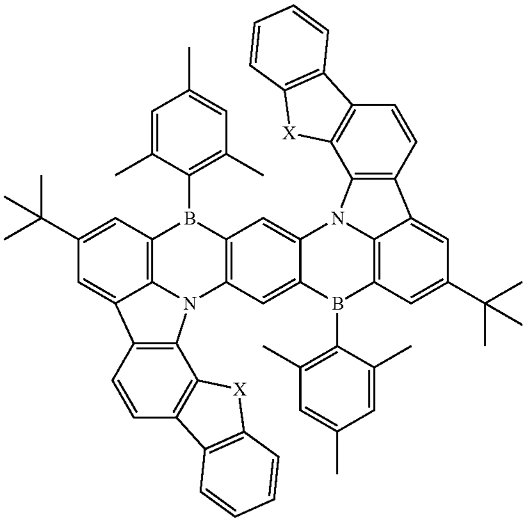
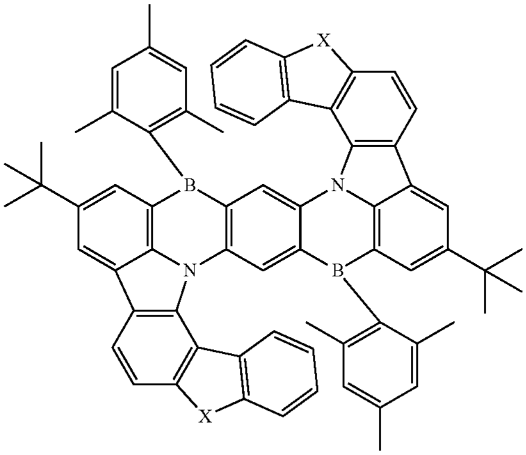
-continued
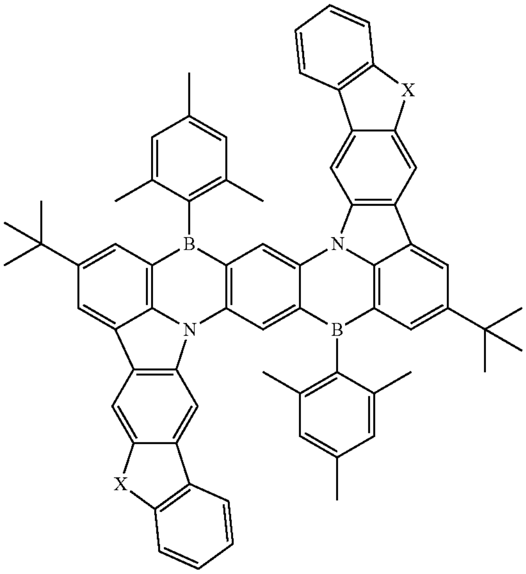
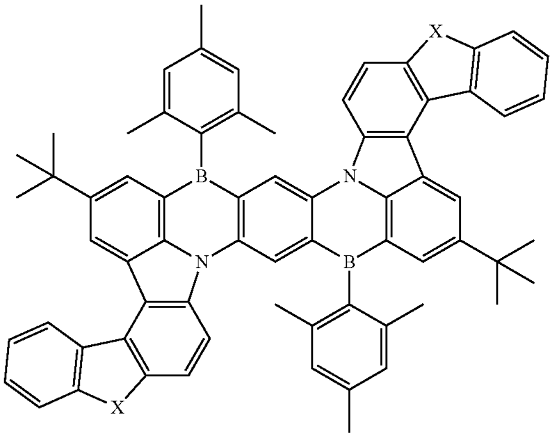
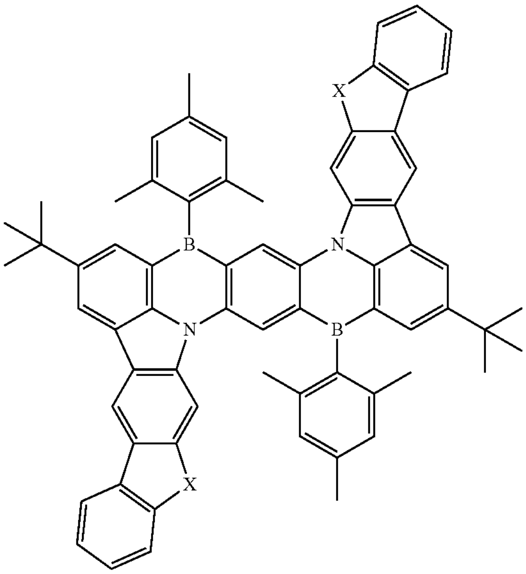

-continued
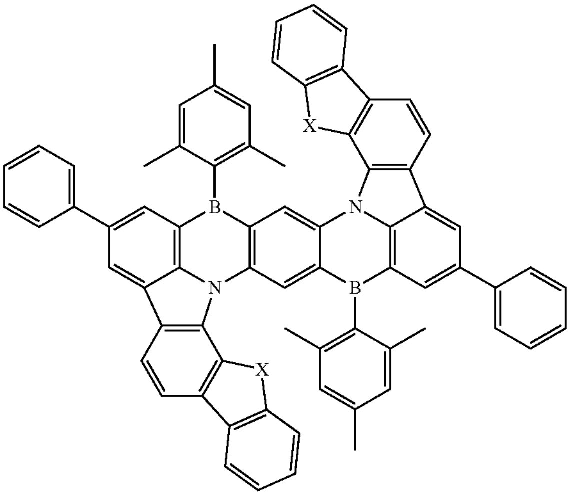
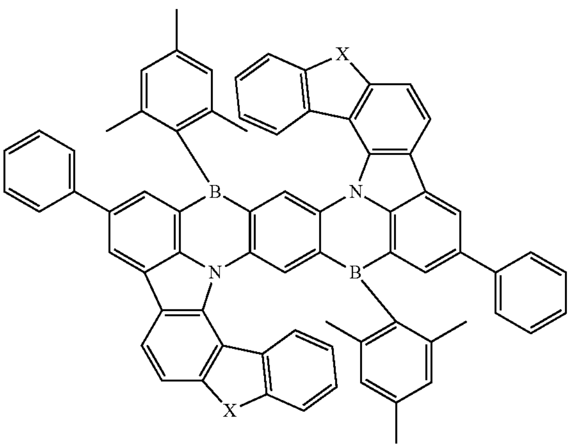
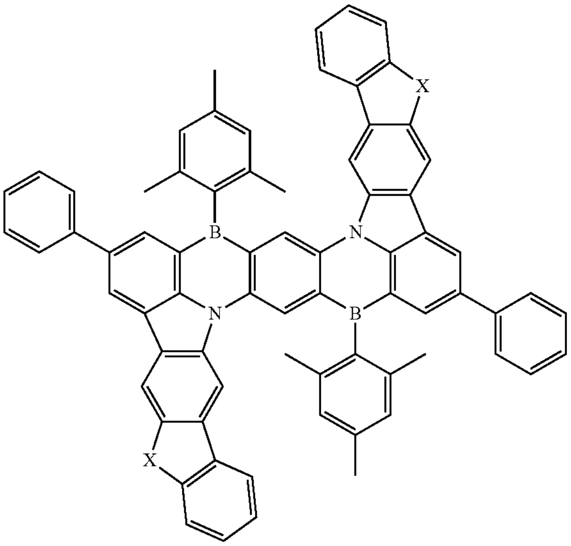
-continued
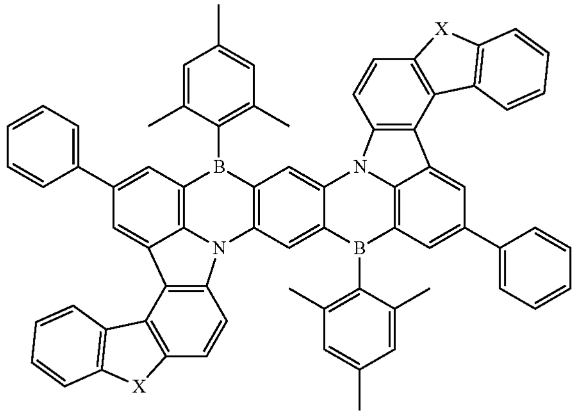
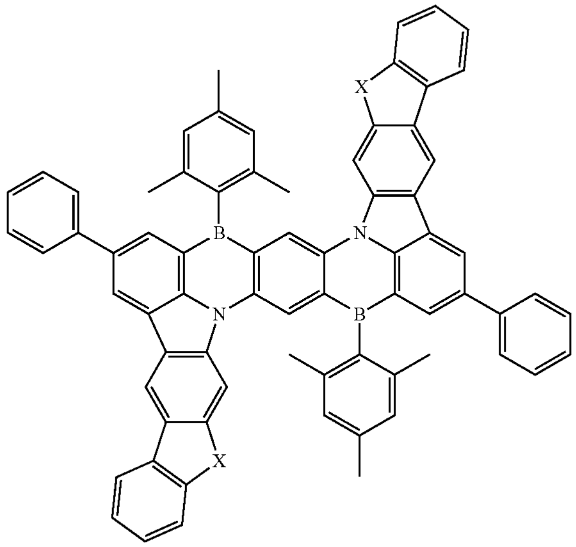
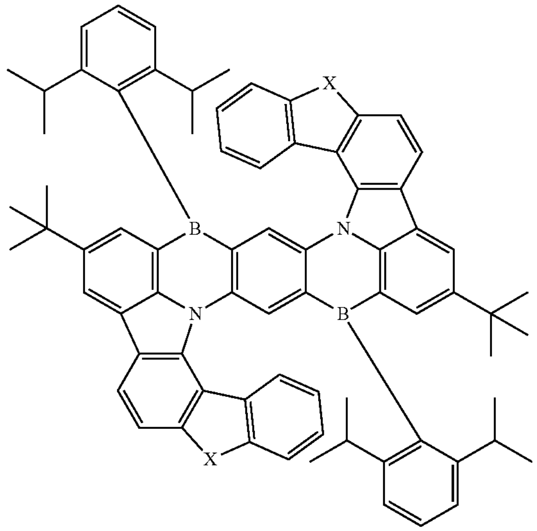

-continued
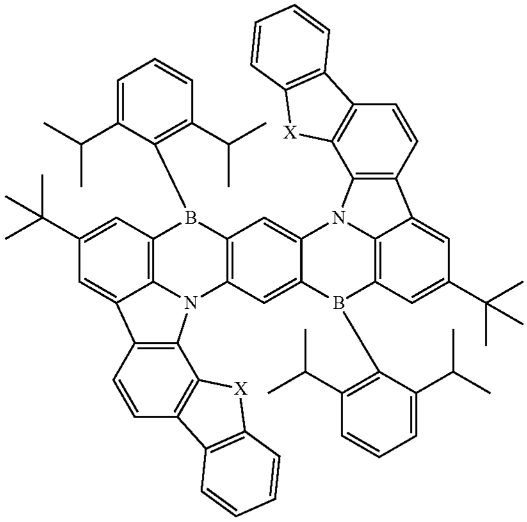
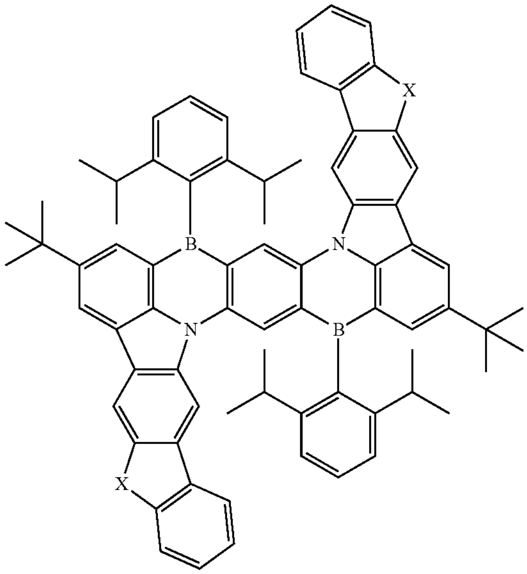
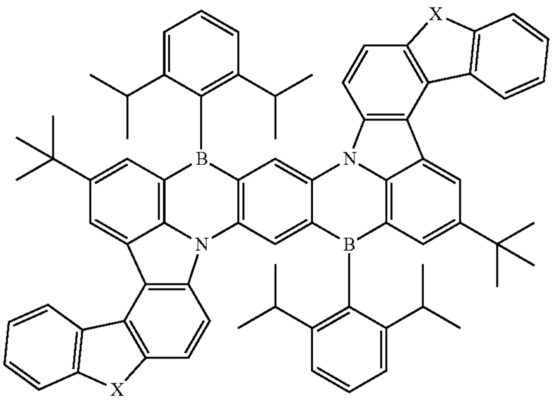
-continued
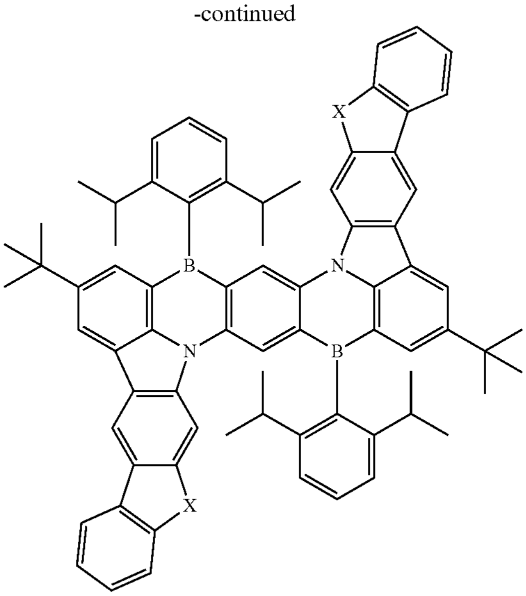
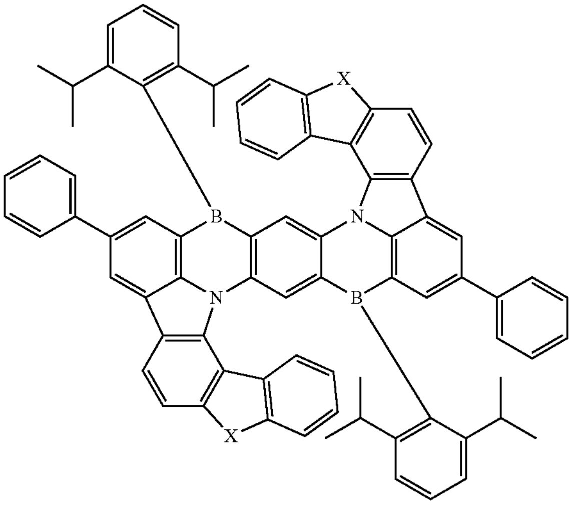
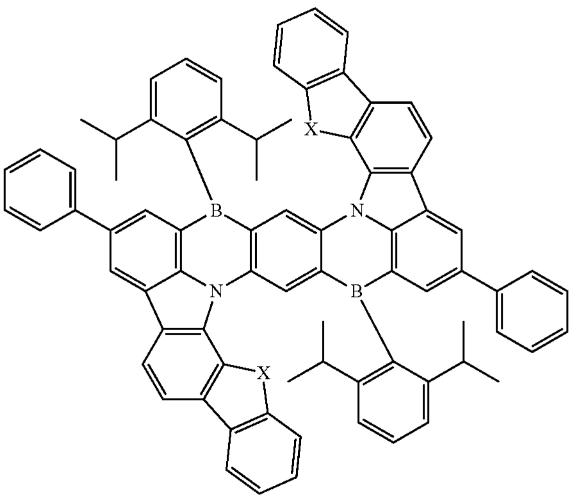

-continued
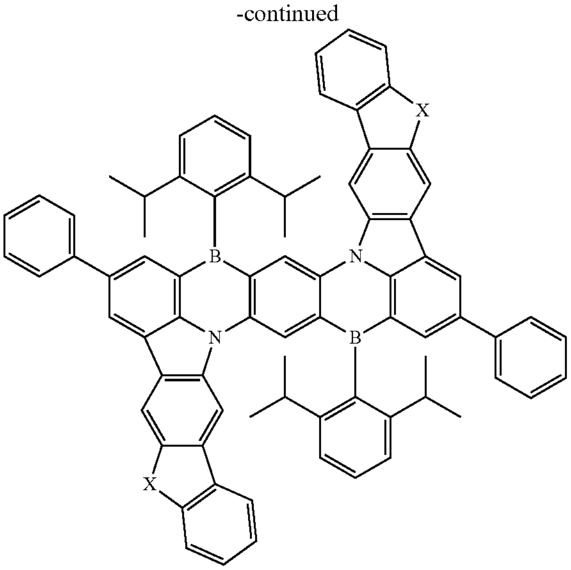
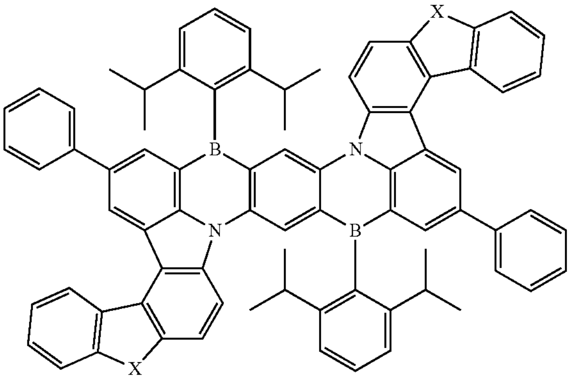
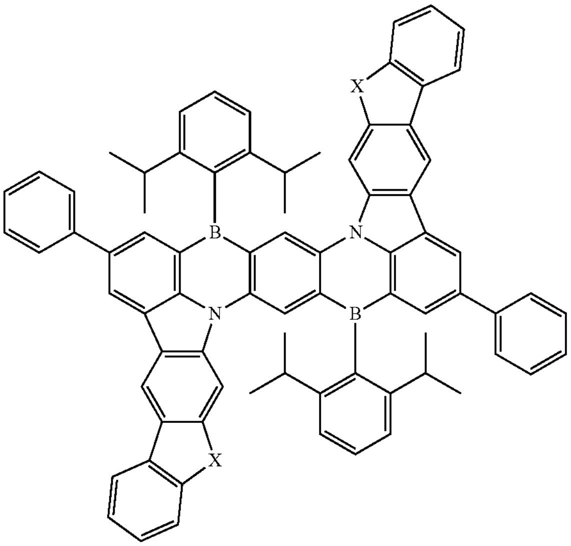
-continued
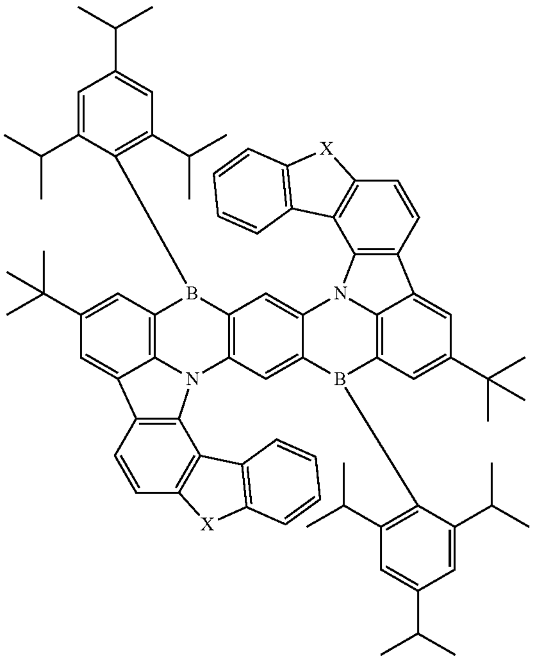
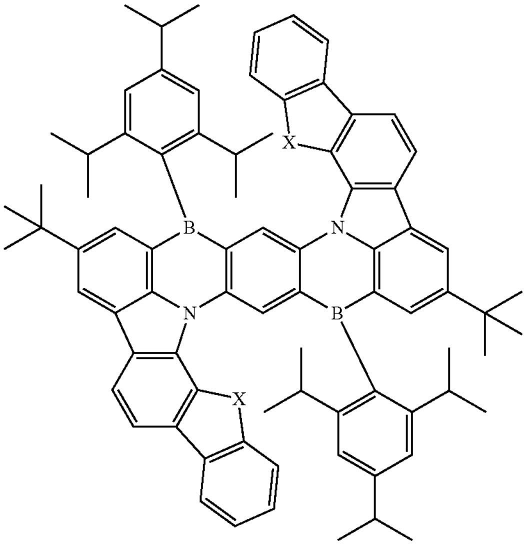

-continued
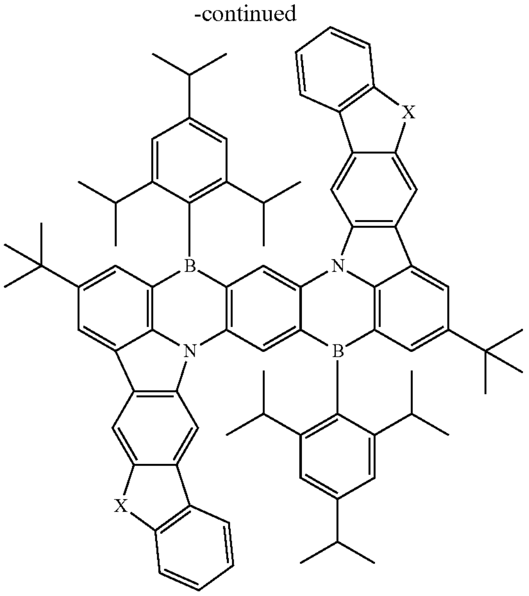
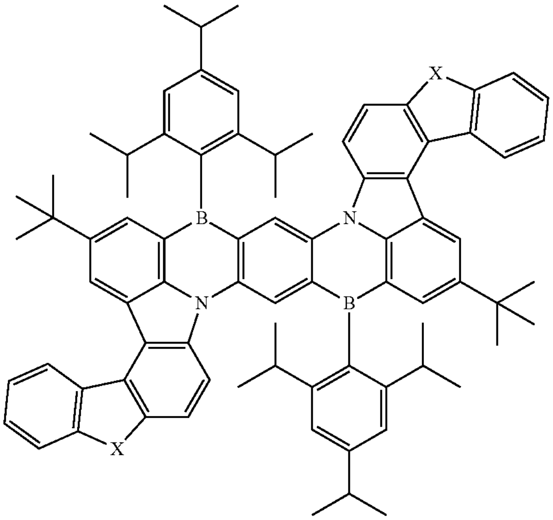
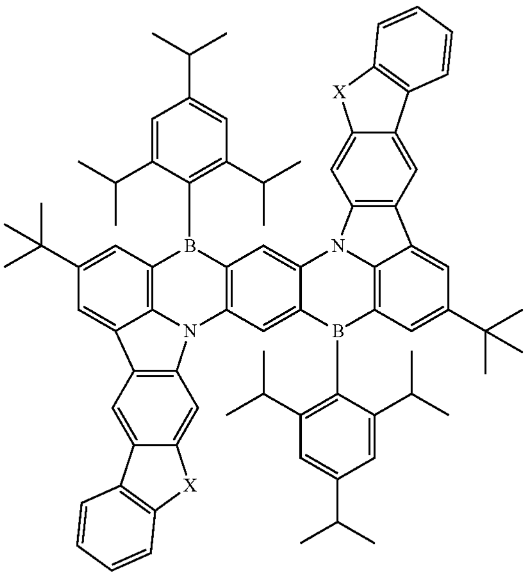
-continued
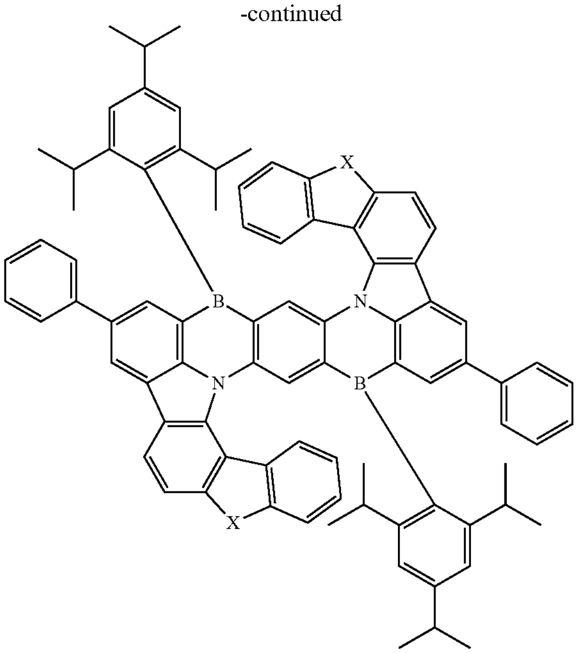
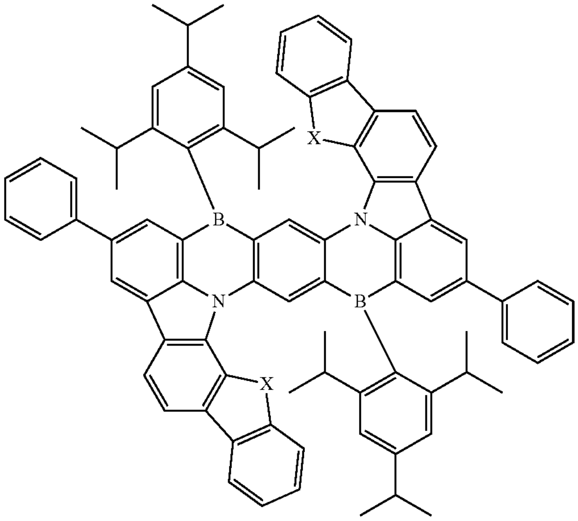
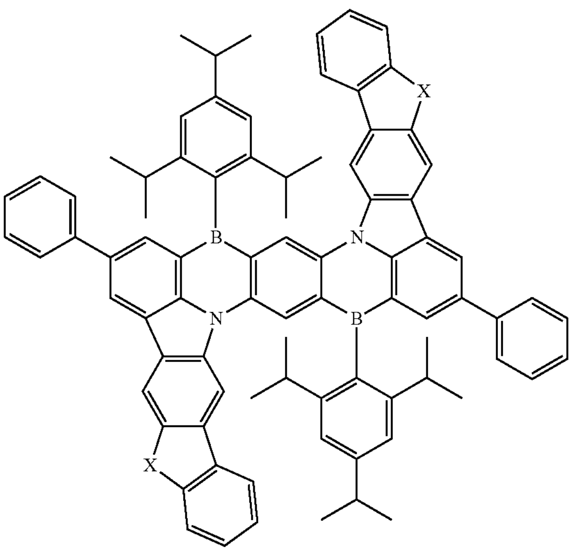

-continued
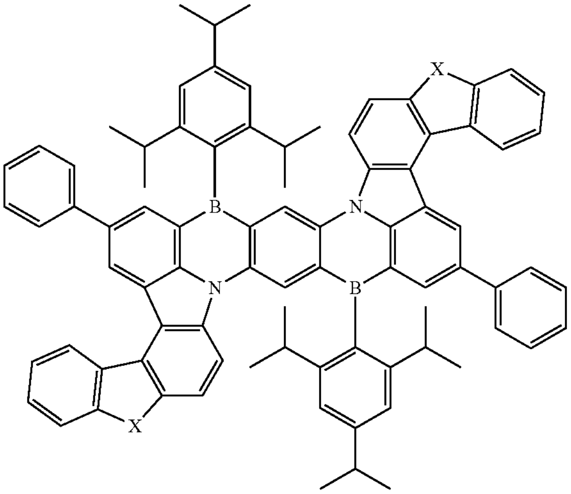
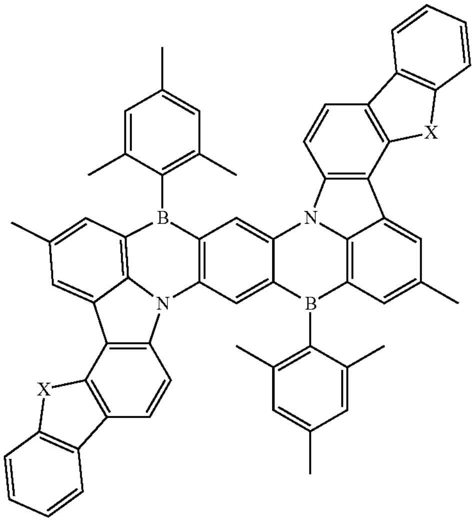
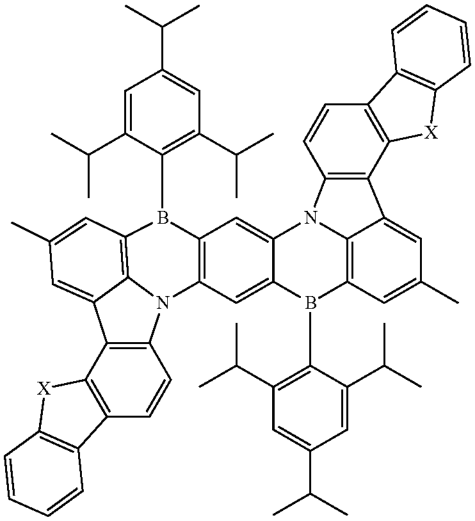
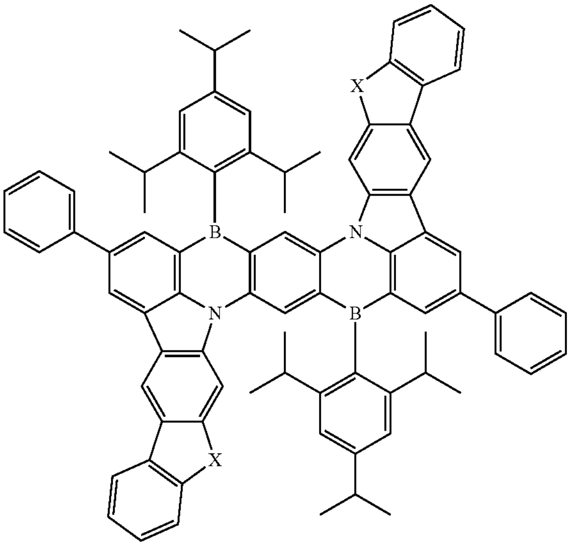
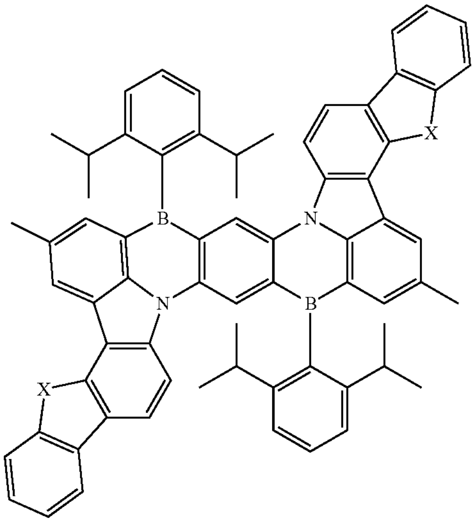
Hereinafter, another group of specific examples of the compound represented by the formula (4a) will be given. Compounds of the formula (4a) that may be used in the present invention are not construed as limiting to specific examples in the following one group.

-continued
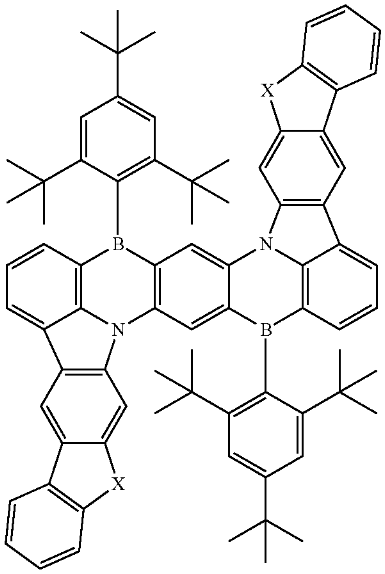
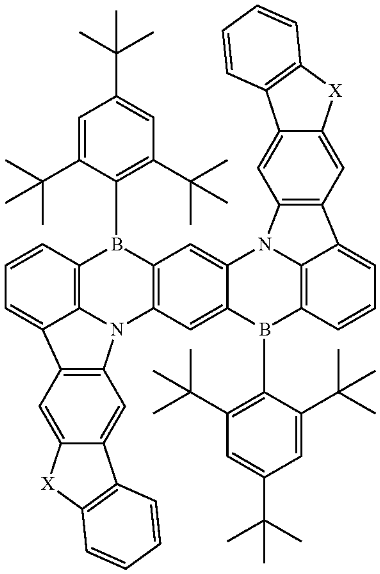
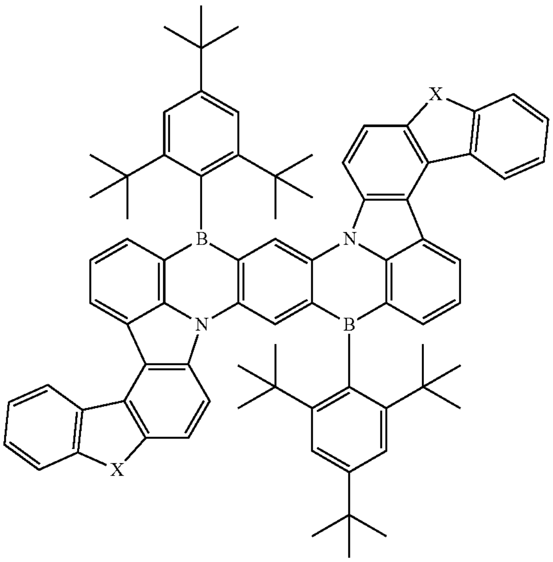
-continued
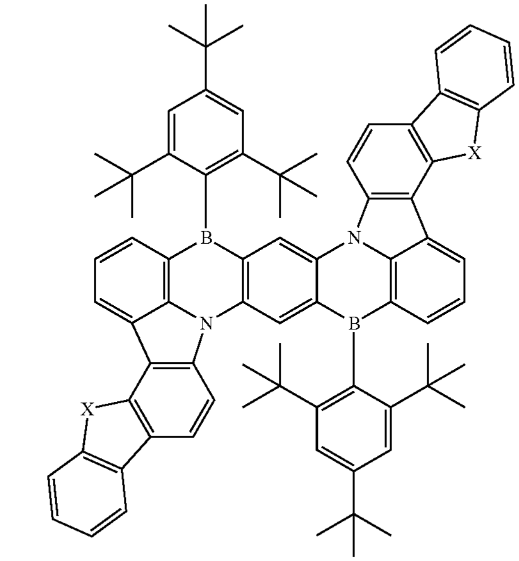
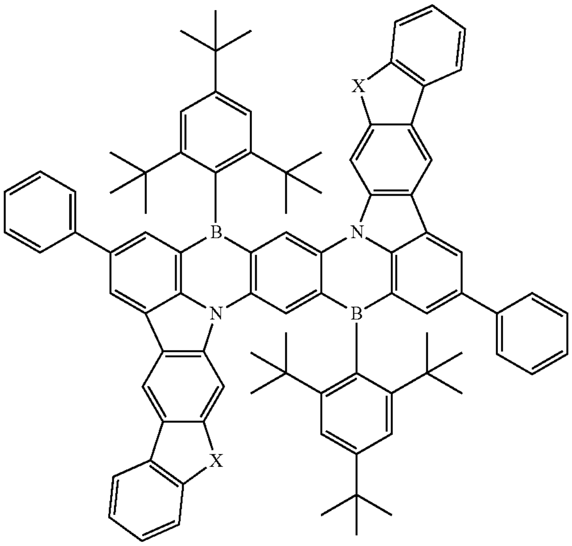
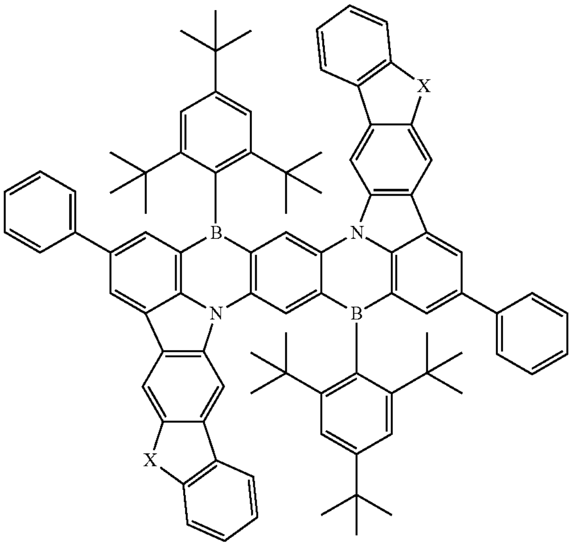

-continued
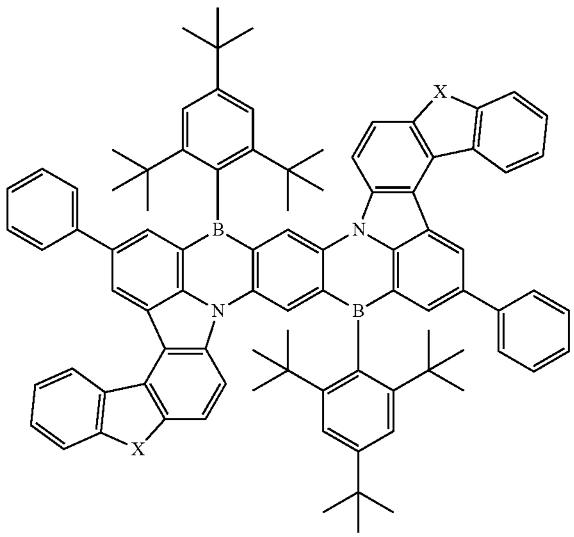
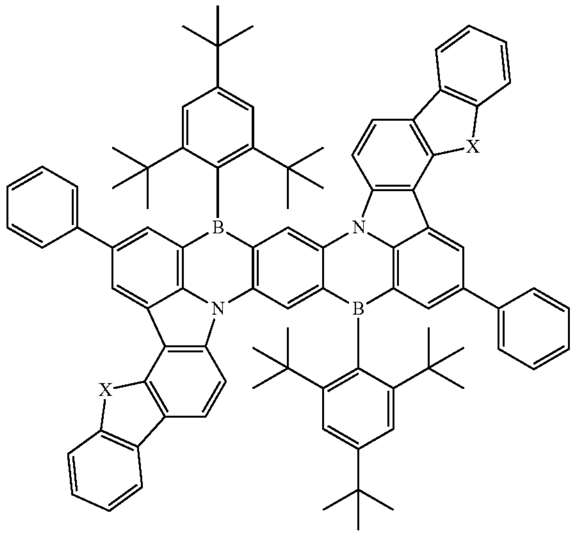
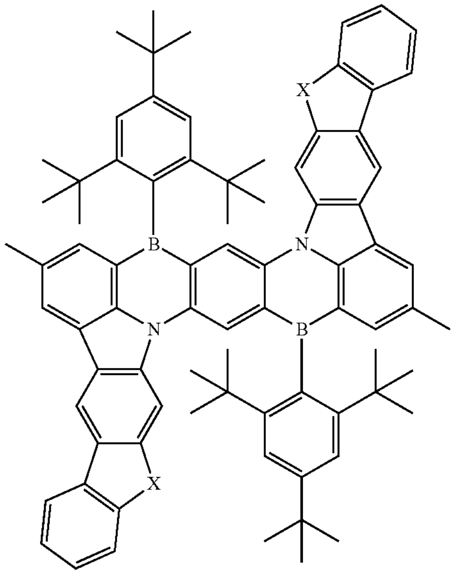
-continued
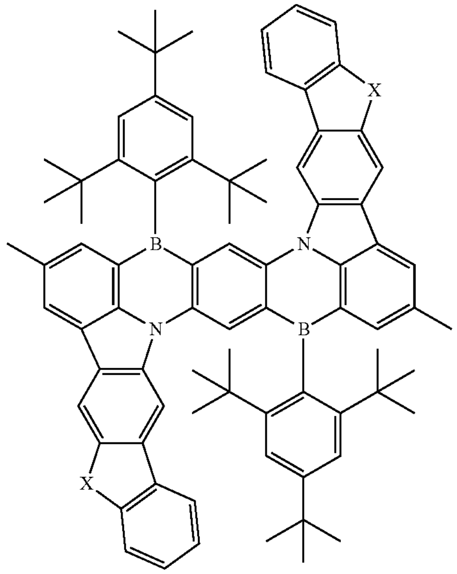
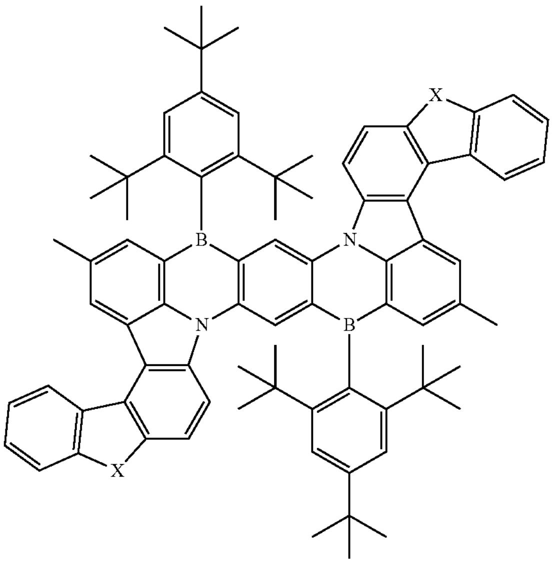
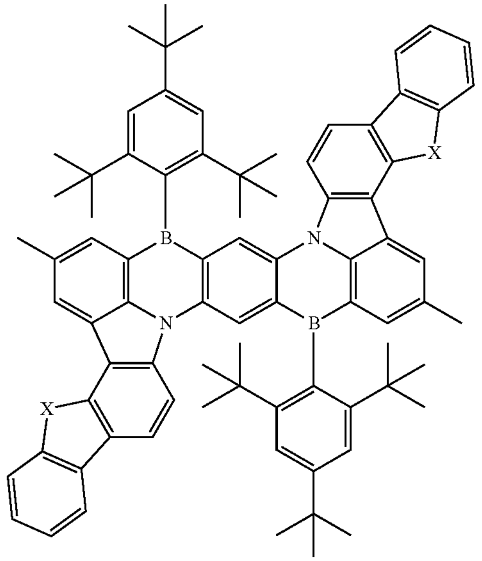

-continued

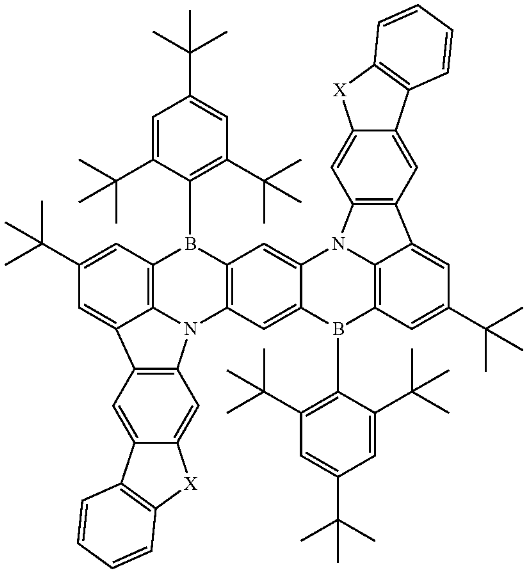

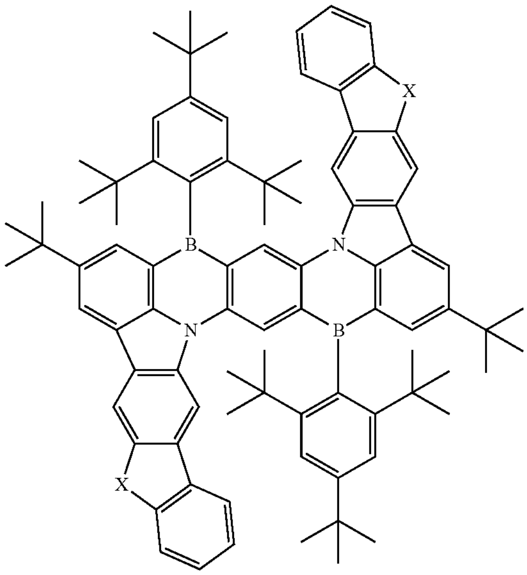

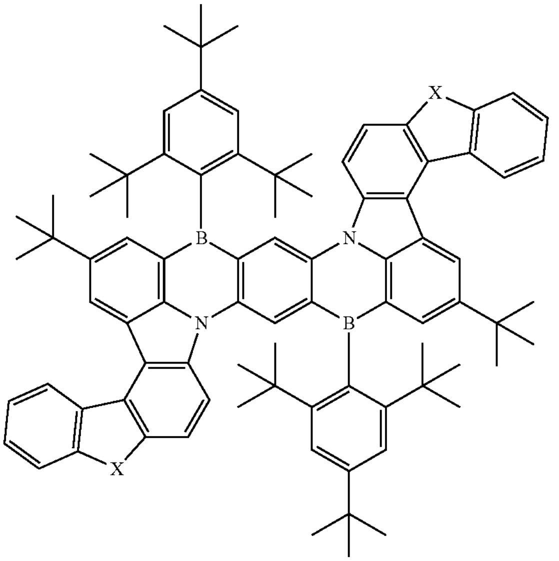

-continued

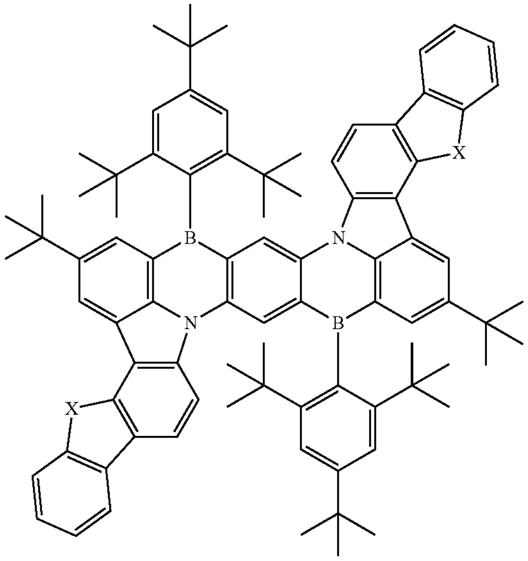

As one preferable group of compounds having the skeleton (4b), compounds represented by the following formula (4b) may be exemplified.

Formula (4b)

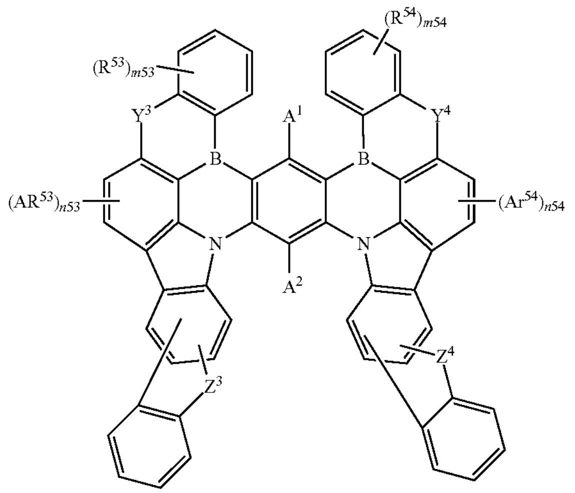

In the formula (4b), each of $Ar^{53}$ and $Ar^{54}$ independently represents a substituted or unsubstituted aryl group, a substituted or unsubstituted heteroaryl group, or a substituted or unsubstituted alkyl group, and for example, a substituted or unsubstituted aryl group may be preferably selected. Each of $R^{53}$ and $R^{54}$ independently represents a substituted or unsubstituted alkyl group. Each of m53 and m54 independently represents an integer of 0 to 4. Each of n53 and n54 independently represents an integer of 0 to 2. Each of $Y^3$ and $Y^4$ independently represents two hydrogen atoms, a single bond or $N(R^{27})$. $R^{27}$ represents a hydrogen atom, a deuterium atom, or a substituent. Each of $Z^3$ and $Z^4$ independently represents an oxygen atom or a sulfur atom. Each of $A^1$ and $A^2$ independently represents a hydrogen atom, a deuterium atom, or a substituent. In relation to details of $Ar^{53}$, $Ar^{51}$, $R^{53}$, $R^{54}$, m53, m54, n53, n54, $A^1$, and $A^2$, the descriptions on $Ar^{51}$, $Ar^{52}$, $R^{51}$, $R^{52}$, m51, m52, n51, n52, $A^1$, and $A^2$ in the formula (4a) may be referred to.

Hereinafter, specific examples of the compound represented by the formula (4b) will be given. Compounds of the formula (4b) that may be used in the present invention are not construed as limiting to the following specific examples. In relation to specific examples including X, it is assumed that a compound in which all X's in the molecule are oxygen atoms, and a compound in which all X's in the molecule are sulfur atoms are disclosed, respectively. A compound in which some of X's in the molecule are oxygen atoms, and the rest are sulfur atoms may also be adopted.

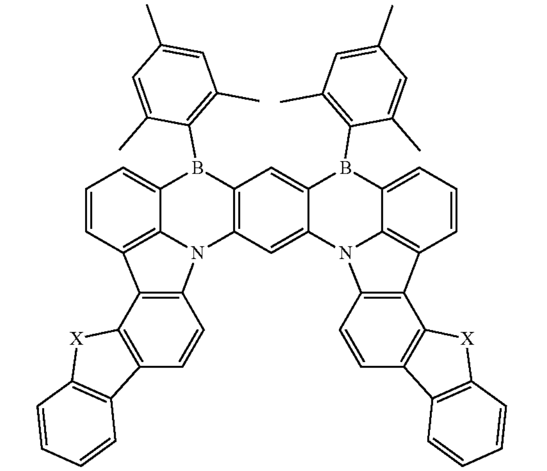

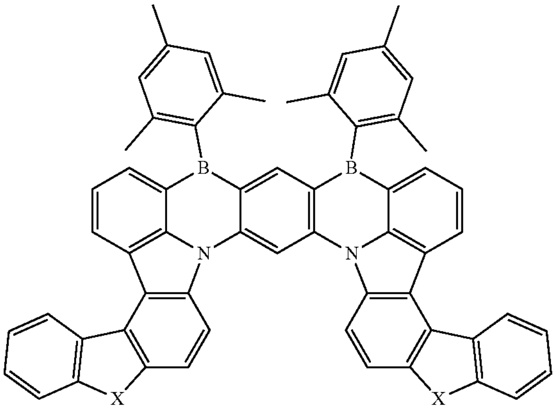

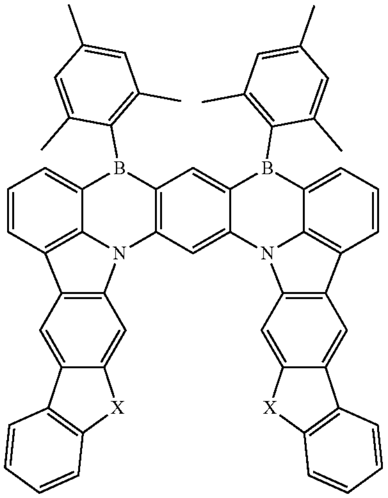

-continued

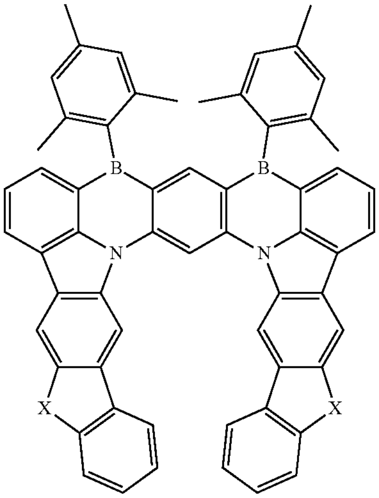

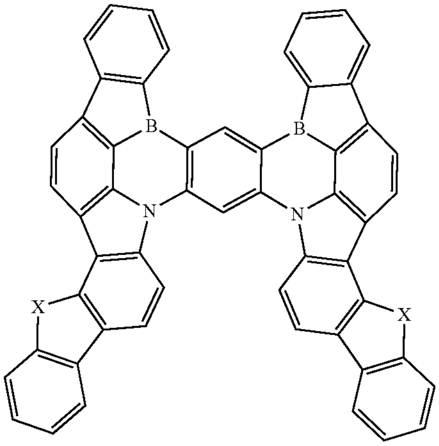

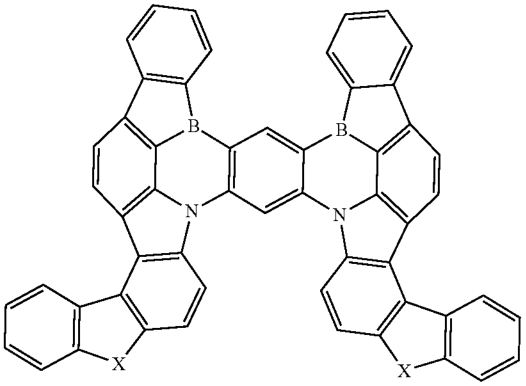

-continued

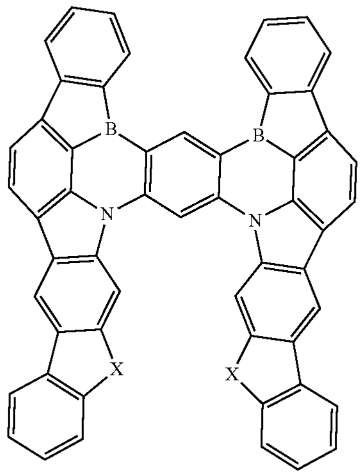

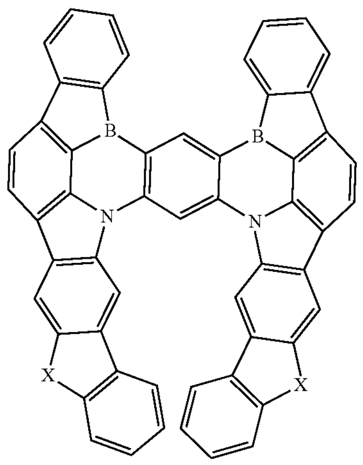

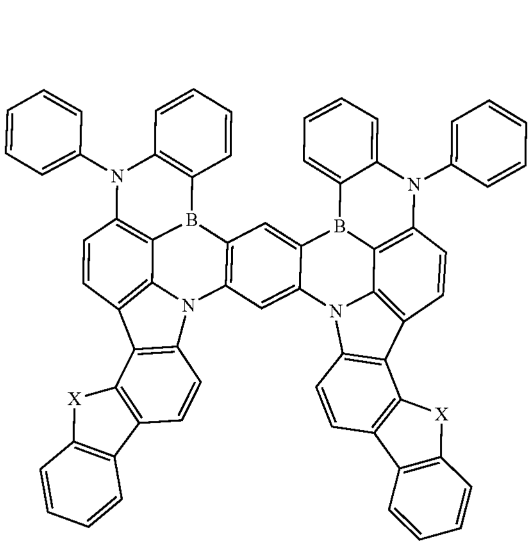

-continued

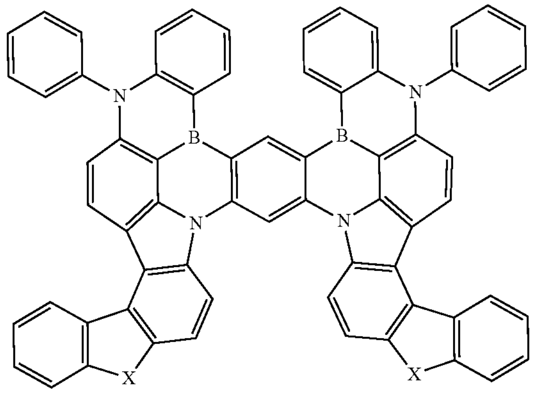

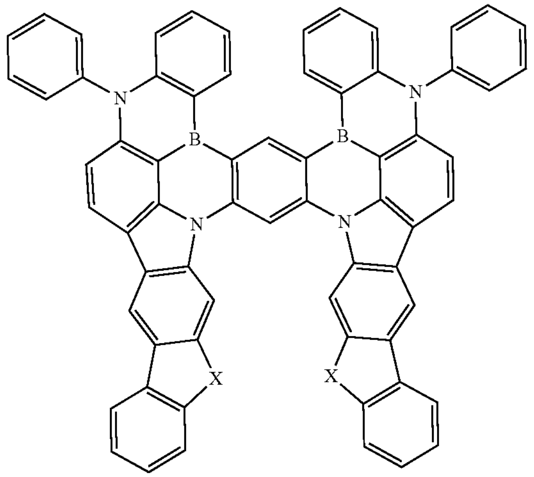

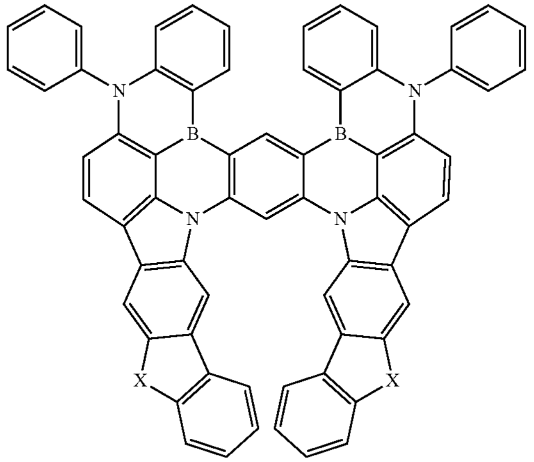

A compound in which a benzofuran ring or a benzothiophene ring is condensed with a benzene ring to which a boron atom is directly bonded, between two benzene rings forming a carbazole partial structure existing in the formula (1), may be preferably mentioned. Examples of such a compound include a compound having the following skeleton (5a) and a compound having the following skeleton (5b).

Skeleton (5a)

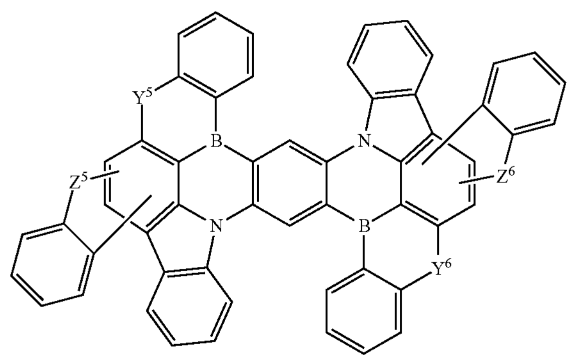

Skeleton (5b)

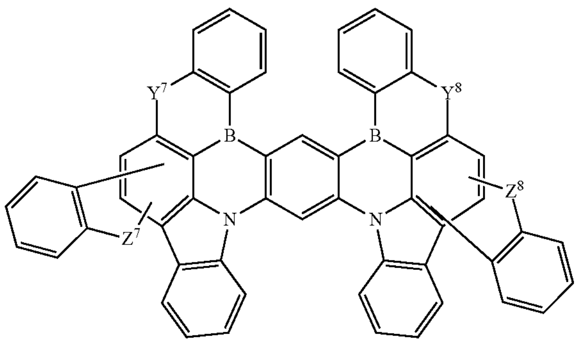

In the skeletons (5a) and (5b), each of $Y^5$ to $Y^8$ independently represents two hydrogen atoms, a single bond or $N(R^{27})$. Each of $Z^5$ to $Z^8$ independently represents an oxygen atom or a sulfur atom. In relation to details of $Y^5$ to $Y^8$, and $Z^5$ to $Z^8$, corresponding descriptions for the skeletons (4a) and (4b) may be referred to. In one aspect of the present invention, each hydrogen atom in the skeletons (5a) and (5b) is not substituted with a linking group together with an adjacent hydrogen atom to form a ring structure.

As one preferable group of compounds having the skeleton (5a), compounds represented by the following formula (5a) may be exemplified.

Formula (5a)

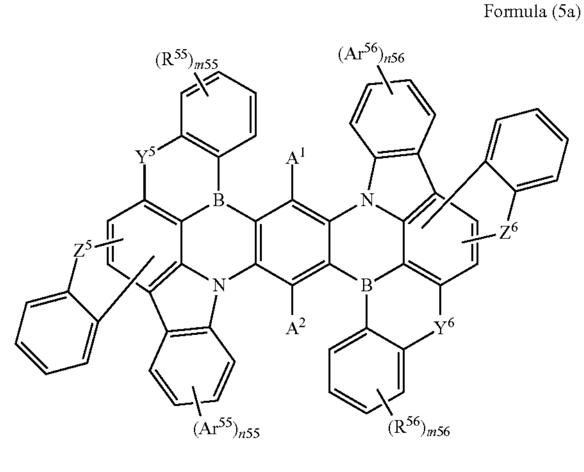

In the formula (5a), each of $Ar^{55}$ and $Ar^{56}$ independently represents a substituted or unsubstituted aryl group, a substituted or unsubstituted heteroaryl group, or a substituted or unsubstituted alkyl group, and for example, a substituted or unsubstituted aryl group may be preferably selected. Each of $R^{55}$ and $R^{56}$ independently represents a substituted or unsubstituted alkyl group. Each of m55 and m56 independently represents an integer of 0 to 4. Each of n55 and n56 independently represents an integer of 0 to 4. Each of $Y^5$ and $Y^6$ independently represents two hydrogen atoms, a single bond or $N(R^{17})$. $R^{27}$ represents a hydrogen atom, a deuterium atom, or a substituent. Each of $Z^5$ and $Z^6$ independently represents an oxygen atom or a sulfur atom. Each of $A^1$ and $A^2$ independently represents a hydrogen atom, a deuterium atom, or a substituent.

In one aspect of the present invention, n55 and n56 are integers of 0 to 2. For example, n55 and n56 may be 0, and n55 and n56 may be 1. In one aspect of the present invention, m51 and m52 are the same number. In relation to details of m55 and m56, descriptions on m51 and m52 in the formula (4a) may be referred to. In relation to preferable groups for $Ar^{55}$, $Ar^{56}$, $R^{55}$, $R^{56}$, $A^1$, and $A^2$, corresponding descriptions on $A^1$, $Ar^3$, $R^{41}$, $R^{42}$, $A^1$, and $A^2$ in the formula (1a) may be referred to.

Hereinafter, specific examples of the compound represented by the formula (5a) will be given. Compounds of the formula (5a) that may be used in the present invention are not construed as limiting to specific examples in the following one group. In relation to specific examples including X, it is assumed that a compound in which all X's in the molecule are oxygen atoms, and a compound in which all X's in the molecule are sulfur atoms are disclosed, respectively. A compound in which some of X's in the molecule are oxygen atoms, and the rest are sulfur atoms may also be adopted.

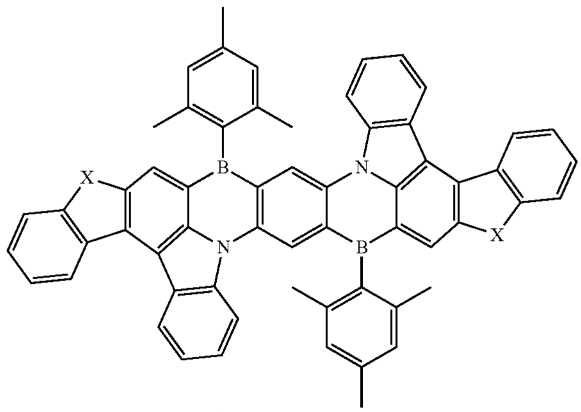

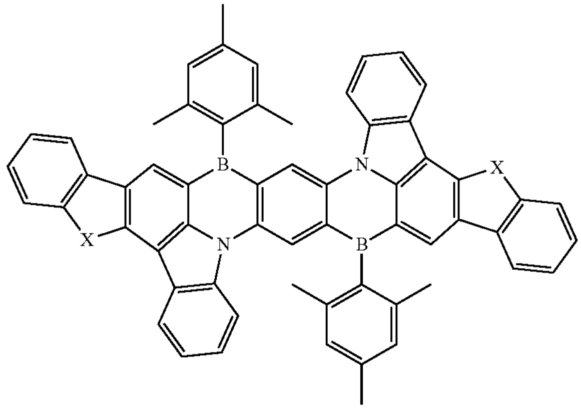

-continued
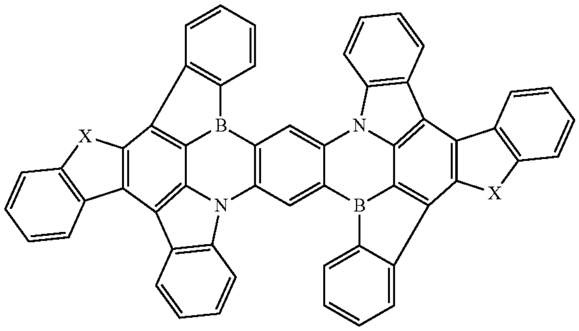
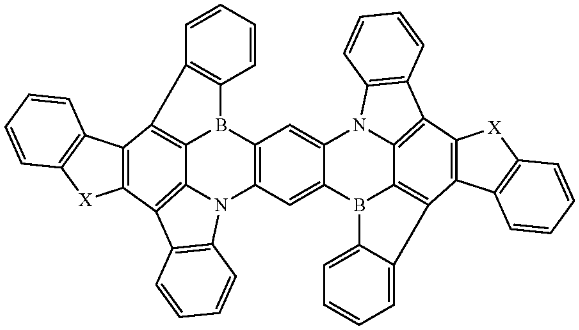
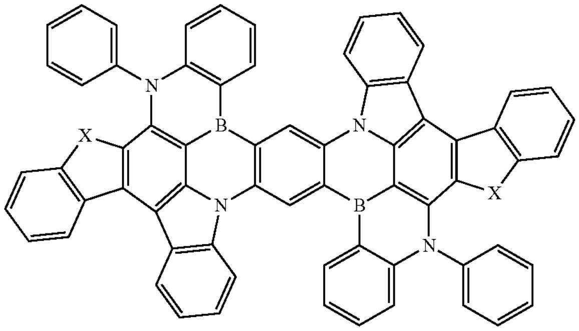
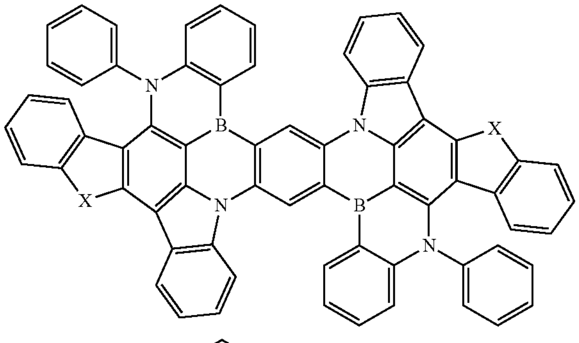
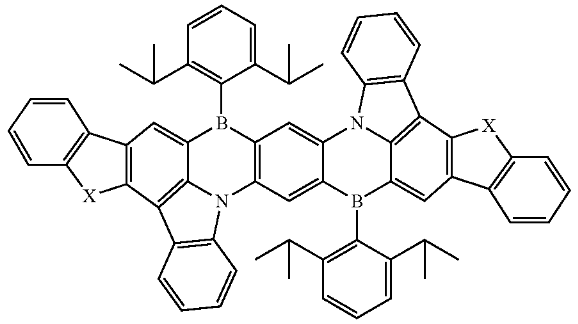
-continued
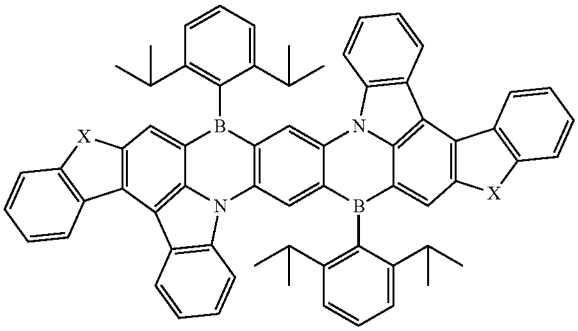
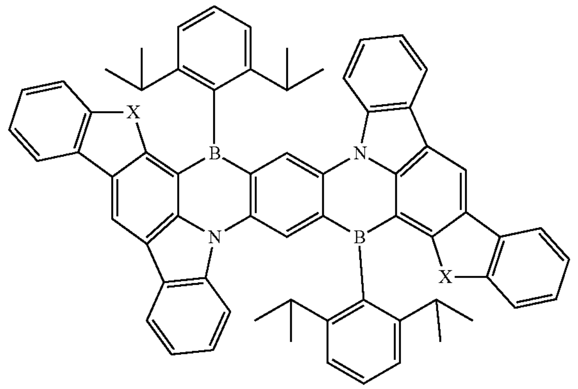
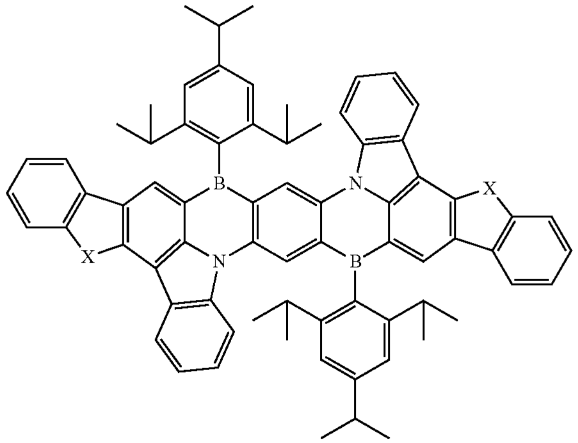
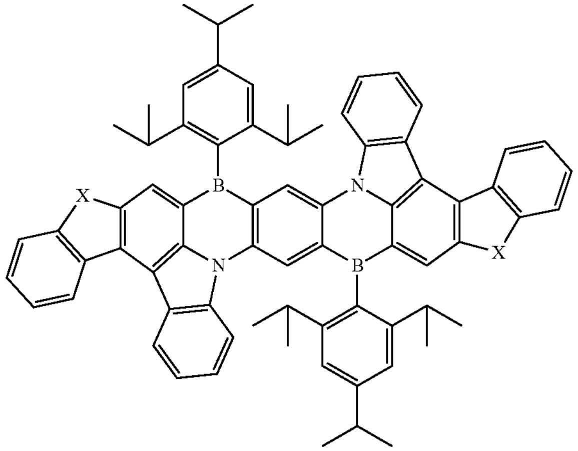

-continued
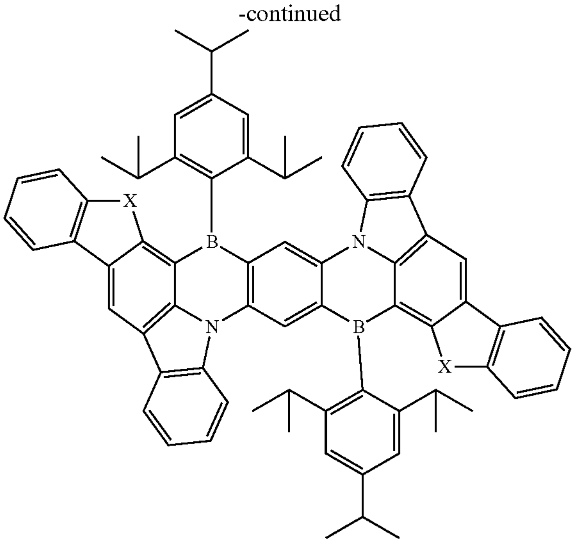
-continued
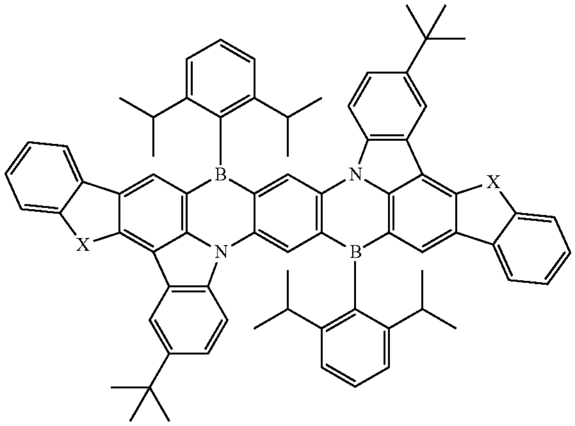
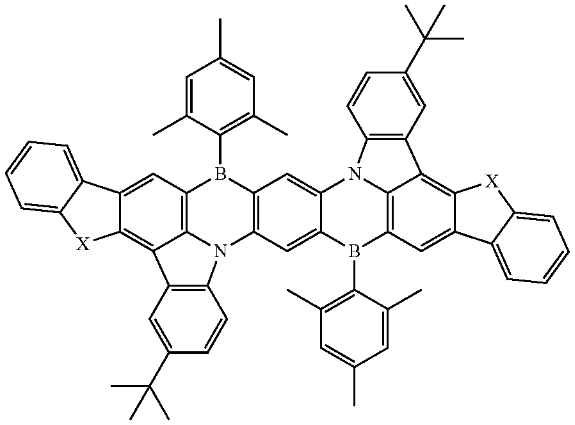
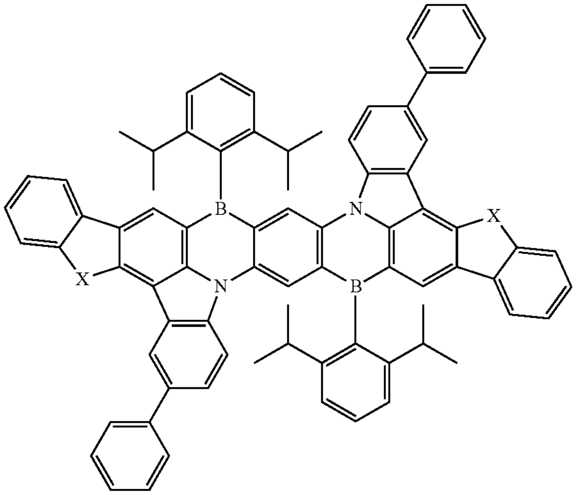
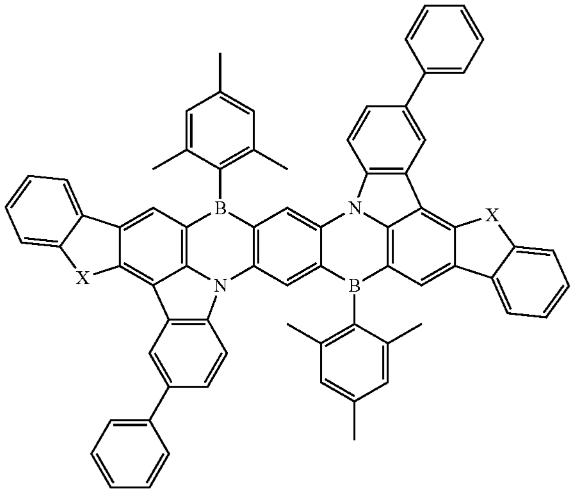
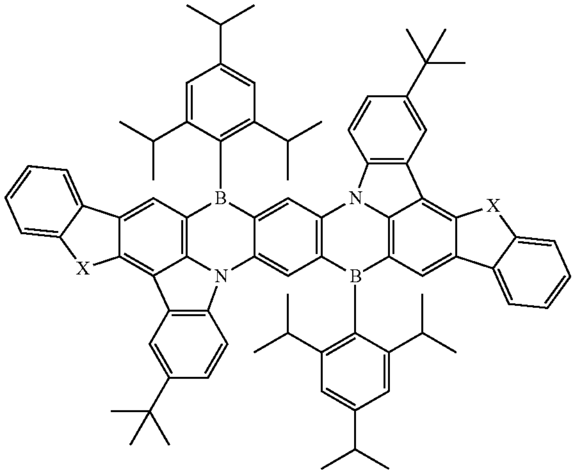

-continued
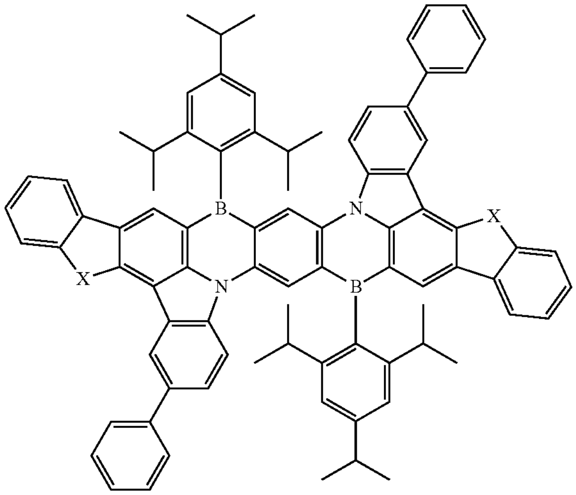
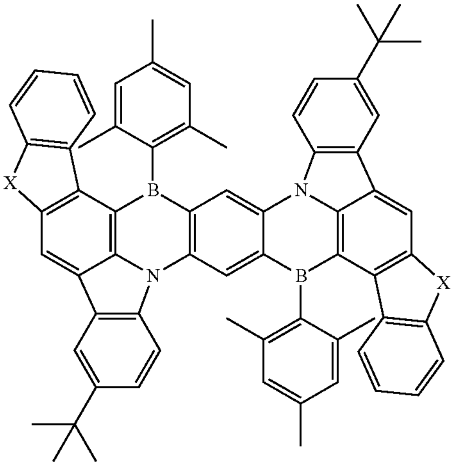
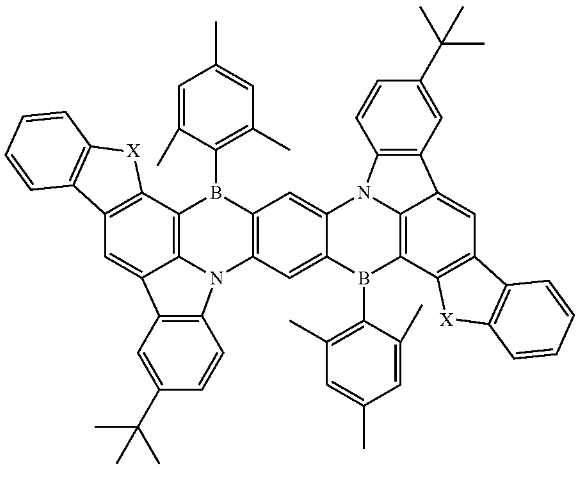
-continued
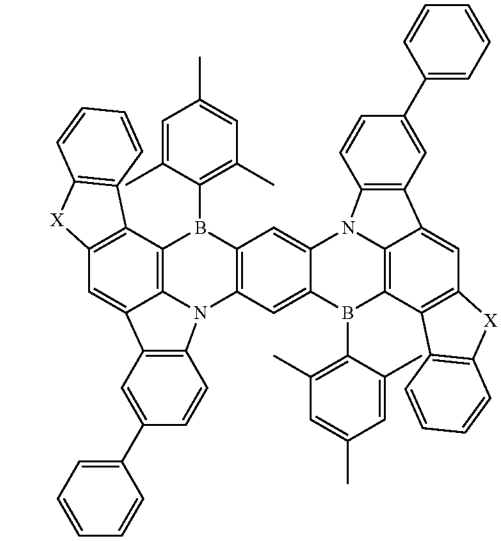
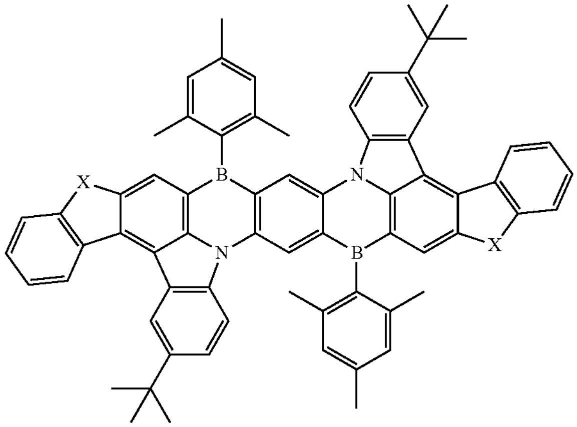
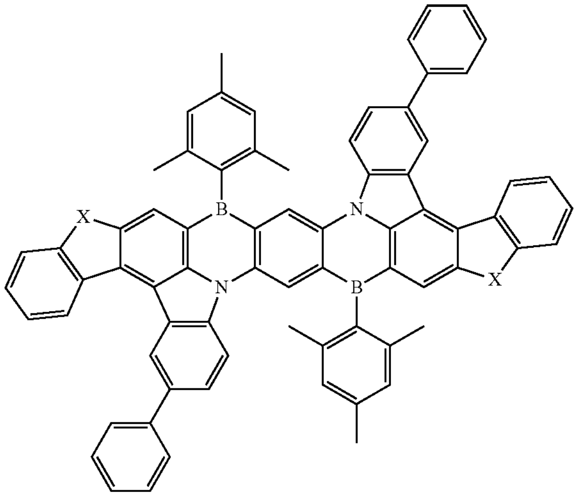

-continued
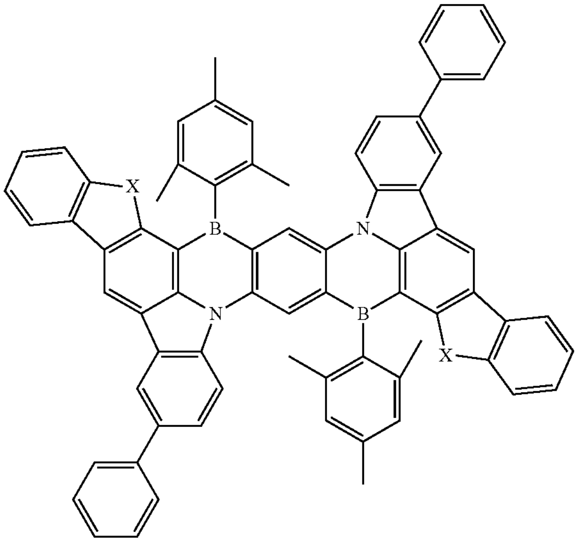
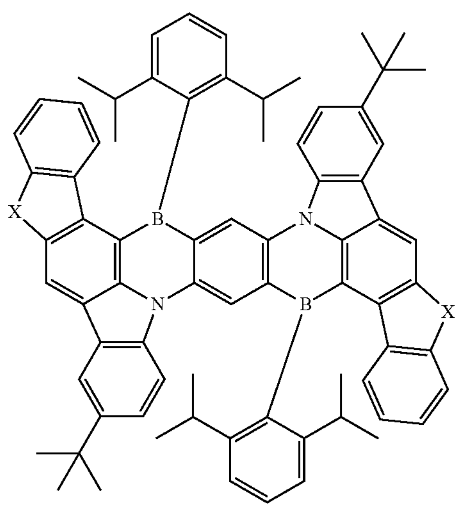
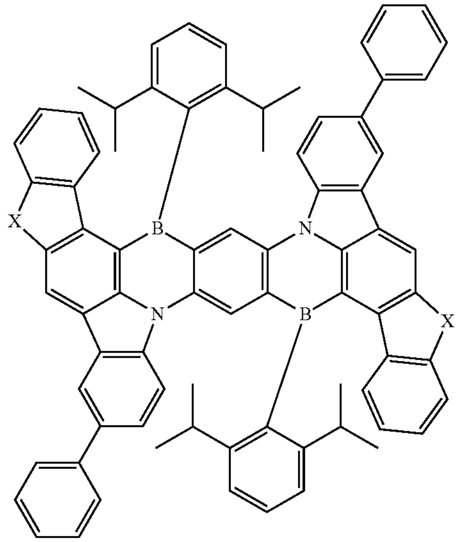
-continued
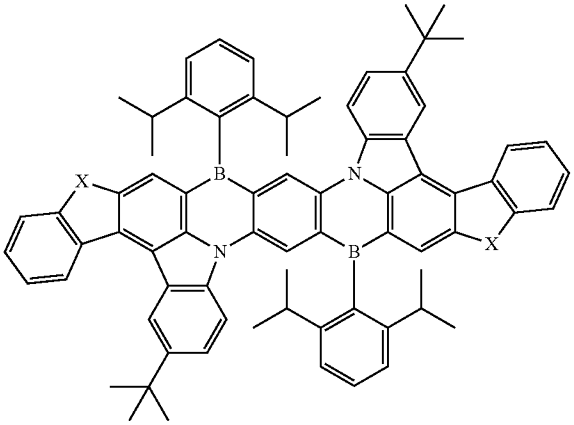
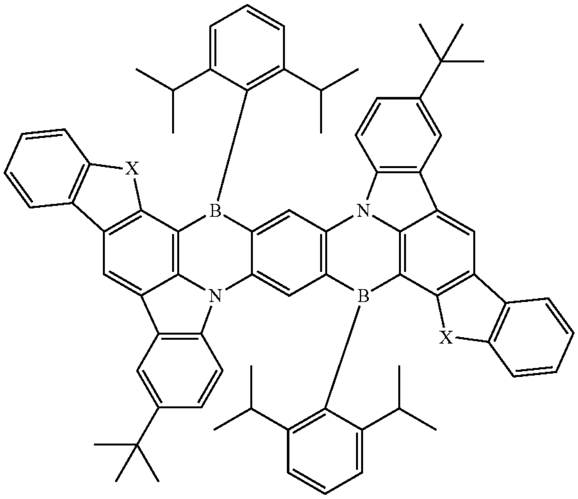
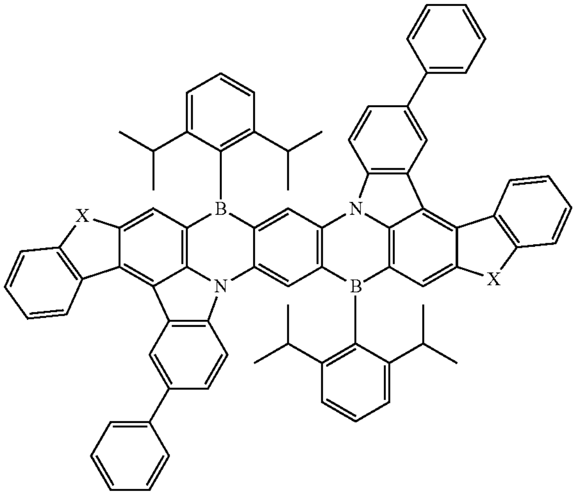

-continued
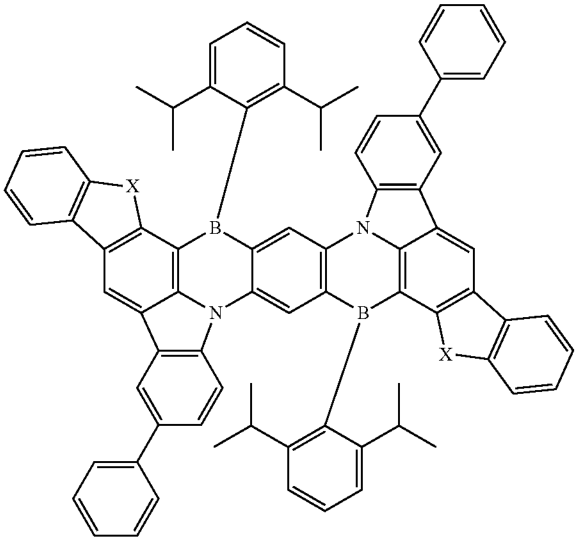
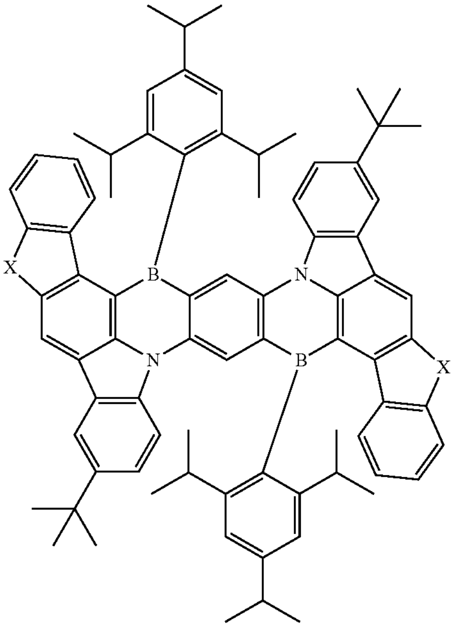
-continued
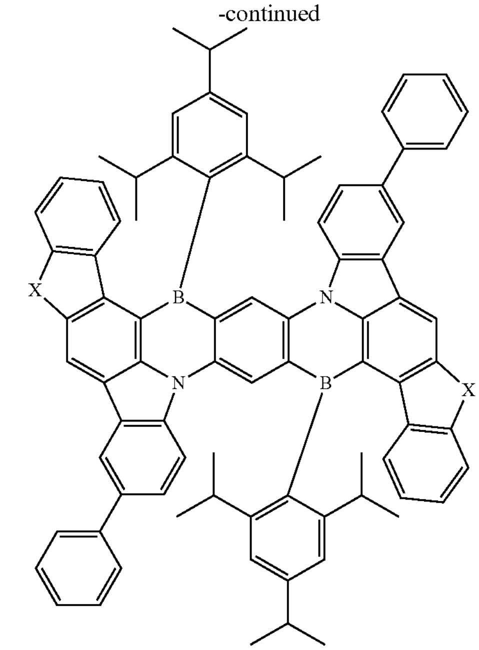
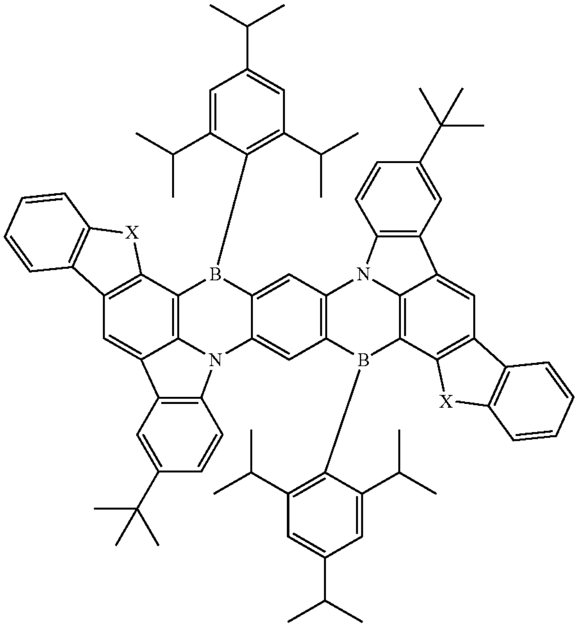
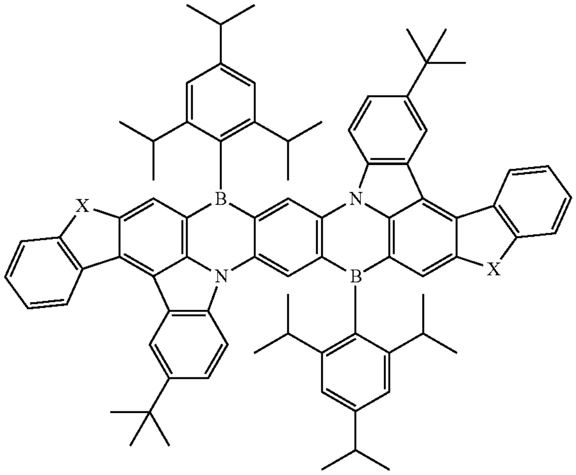

-continued

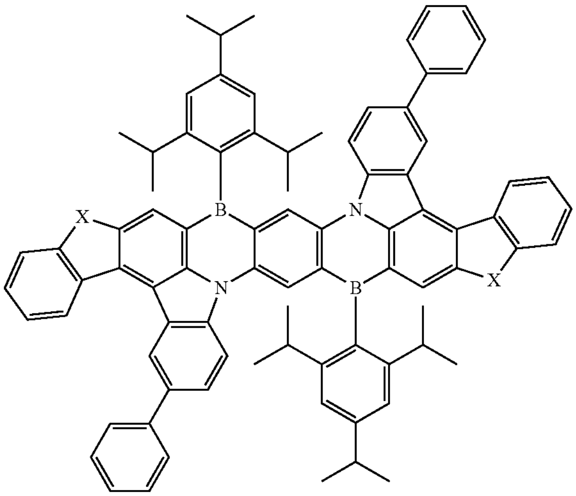

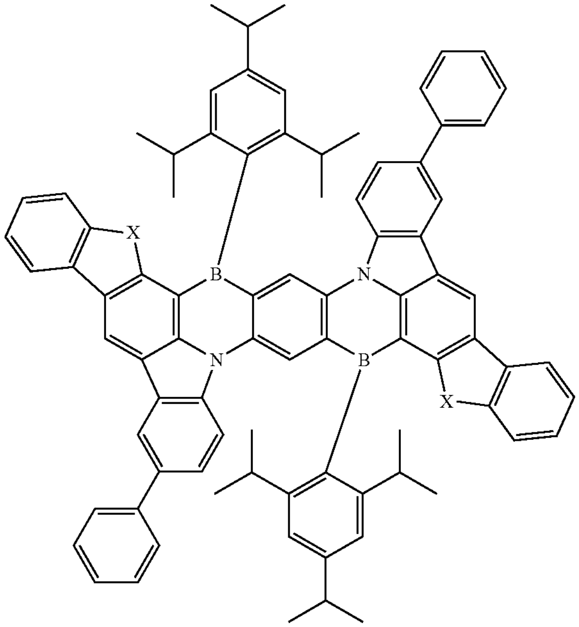

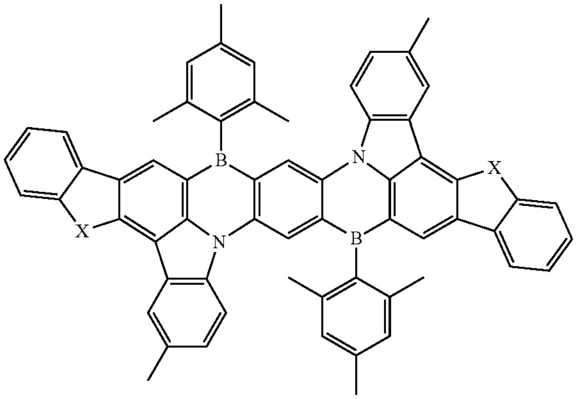

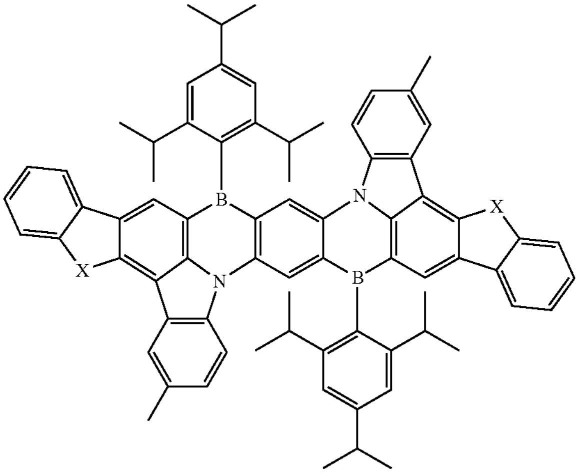

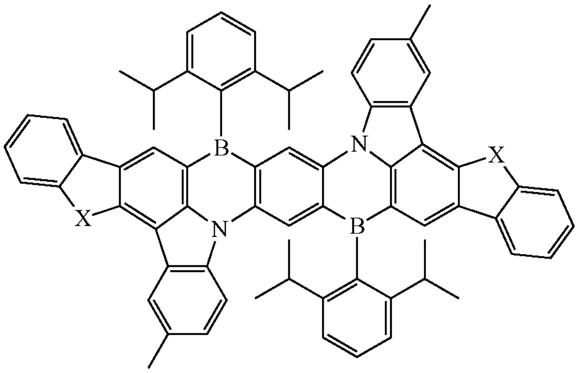

Hereinafter, another group of specific examples of the compound represented by the formula (5a) will be given. Compounds of the formula (5a) that may be used in the present invention are not construed as limiting to specific examples in the following one group.

As one preferable group of compounds having the skeleton (5b), compounds represented by the following formula (5b) may be exemplified.

Formula (5b)

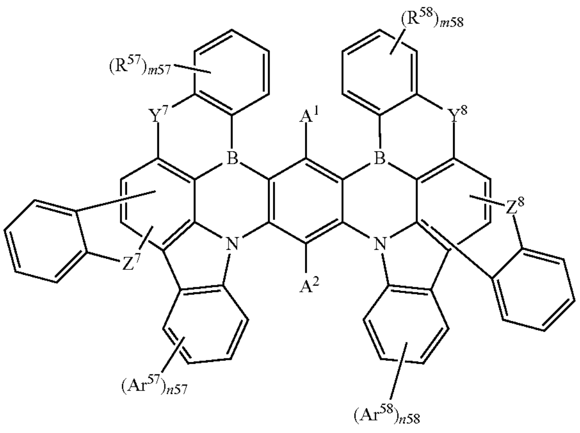

In the formula (5b), each of $Ar^{57}$ and $Ar^{58}$ independently represents a substituted or unsubstituted aryl group, a substituted or unsubstituted heteroaryl group, or a substituted or unsubstituted alkyl group, and for example, a substituted or unsubstituted aryl group may be preferably selected. Each of $R^{57}$ and $R^{58}$ independently represents a substituted or unsubstituted alkyl group. Each of m57 and m58 independently represents an integer of 0 to 4. Each of n57 and n58 independently represents an integer of 0 to 4. Each of $Y^7$ and $Y^8$ independently represents two hydrogen atoms, a single bond or $N(R^{27})$. $R^{27}$ represents a hydrogen atom a deuterium atom, or a substituent. Each of $Z^7$ and $Z^8$ independently represents an oxygen atom or a sulfur atom. Each of $A^1$ and $A^2$ independently represents a hydrogen atom, a deuterium atom, or a substituent. In relation to details of $Ar^{57}$, $Ar^{58}$, $R^{57}$, $R^{58}$, m57, m58, n57, n58, $A^1$, and $A^2$, descriptions on $Ar^{55}$, $Ar^{56}$, $R^{55}$, $R^{56}$, m55, m56, n55, n56, $A^1$, and $A^2$ in the formula (5a) may be referred to.

Hereinafter, specific examples of the compound represented by the formula (5b) will be given. Compounds of the formula (5b) that may be used in the present invention are not construed as limiting to specific examples in the following one group. In relation to specific examples including X, it is assumed that a compound in which all X's in the molecule are oxygen atoms, and a compound in which all X's in the molecule are sulfur atoms are disclosed, respectively. A compound in which some of X's in the molecule are oxygen atoms and the rest are sulfur atoms may also be adopted.

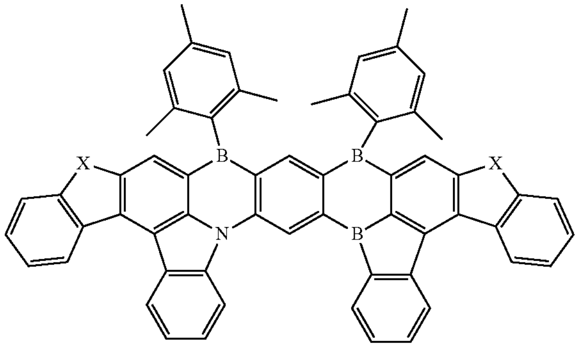

-continued

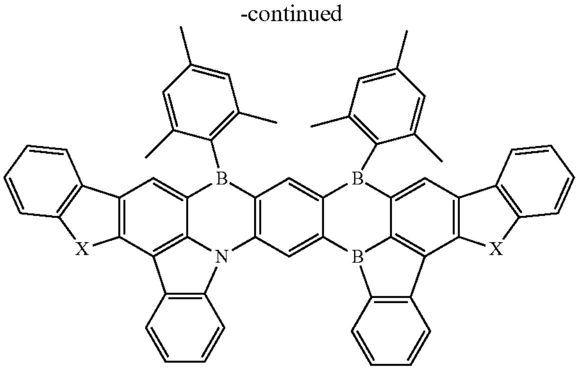

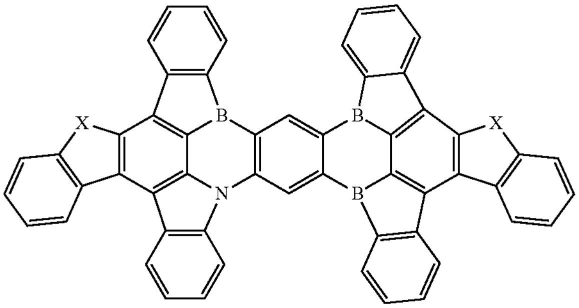

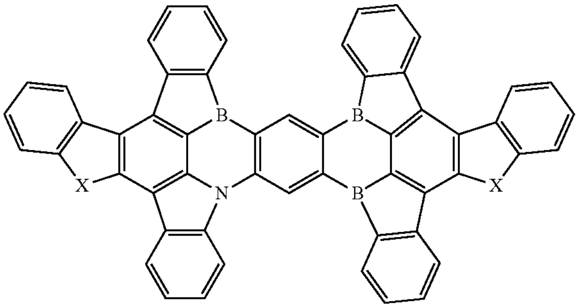

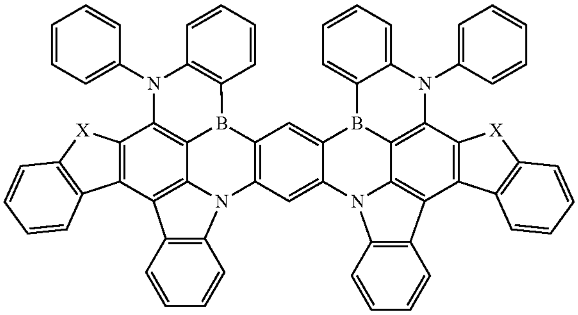

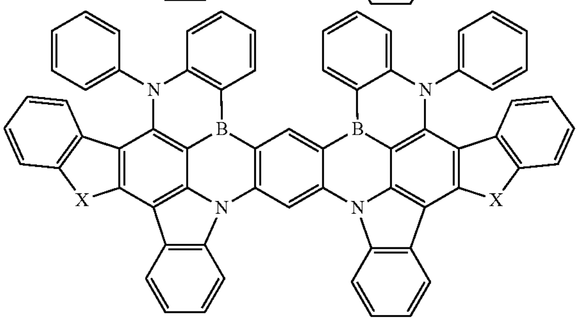

Hereinafter, another group of specific examples of the compound represented by the formula (5b) will be given. Compounds of the formula (5b) that may be used in the present invention are not construed as limiting to specific examples in the following one group.

-continued
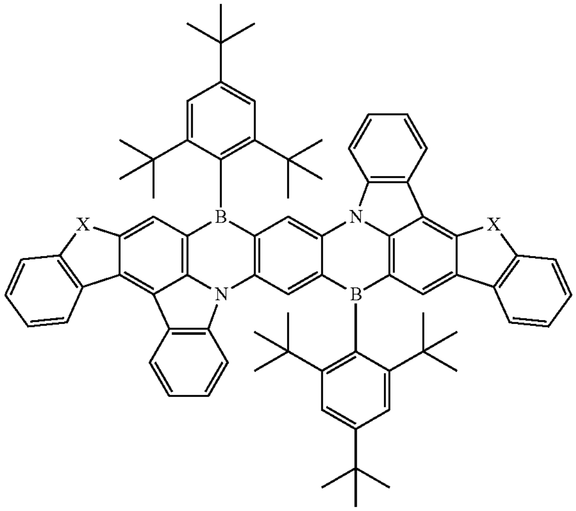
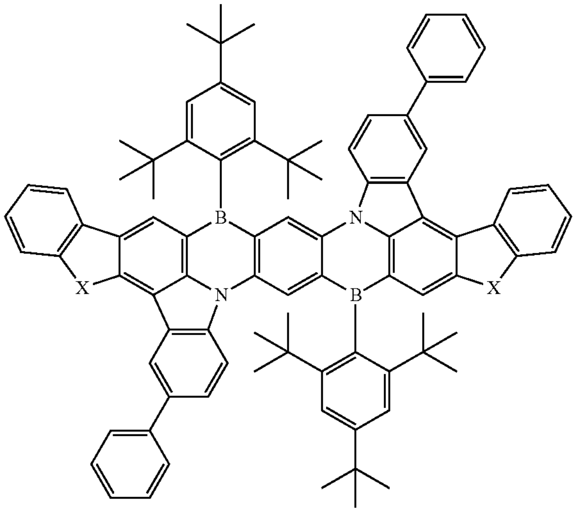
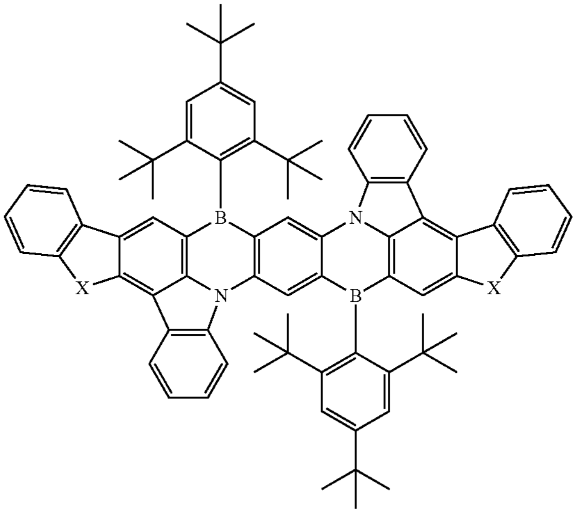
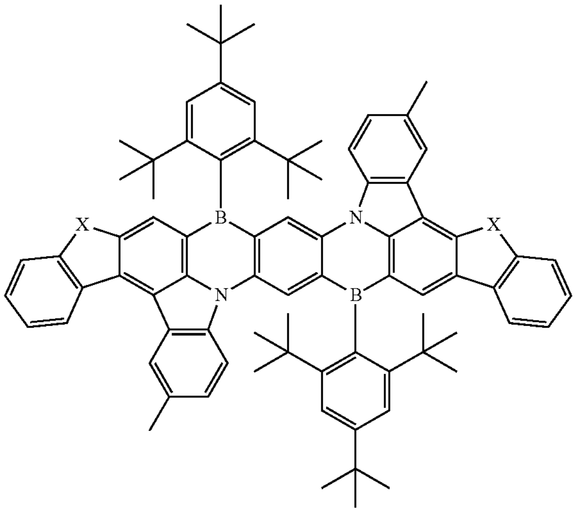
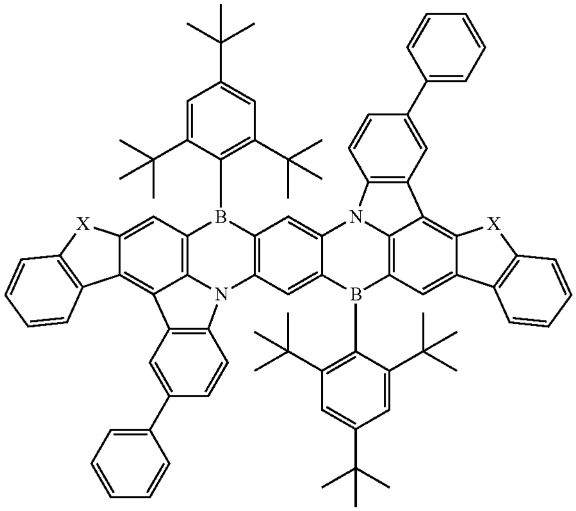
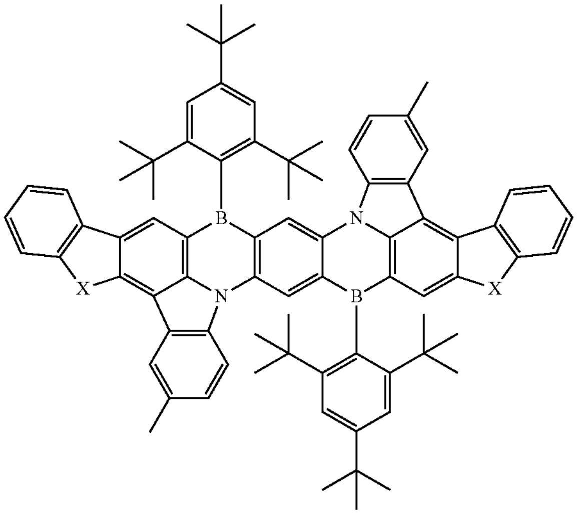

-continued

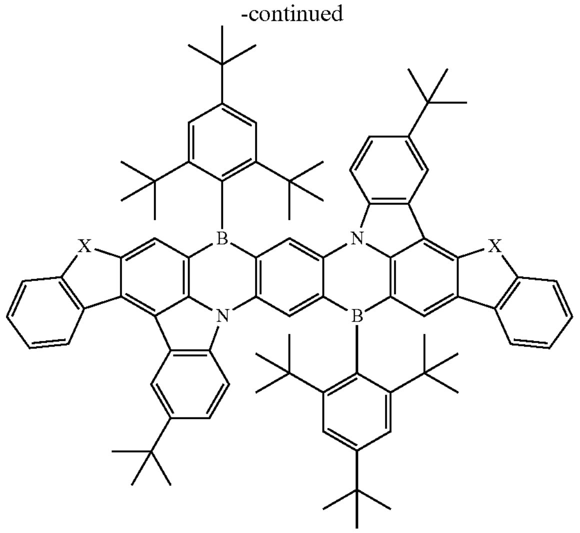

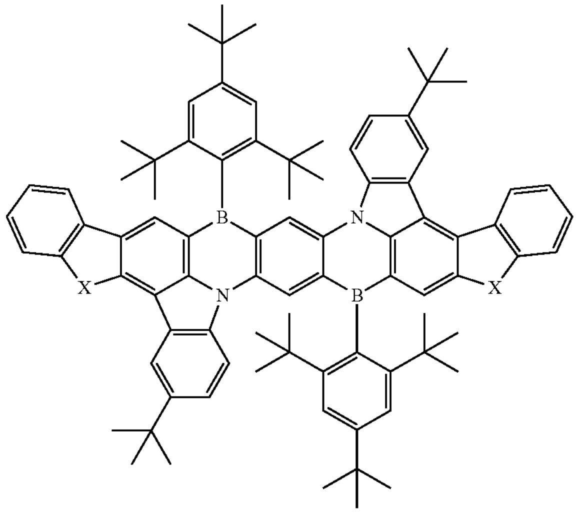

A compound in which benzofuran rings or benzothiophene rings are condensed with both of two benzene rings forming a carbazole partial structure existing in the formula (1) may be preferably mentioned. Examples of such a compound include a compound having the following skeleton (6a), and a compound having the following skeleton (6b).

Skeleton (6a)

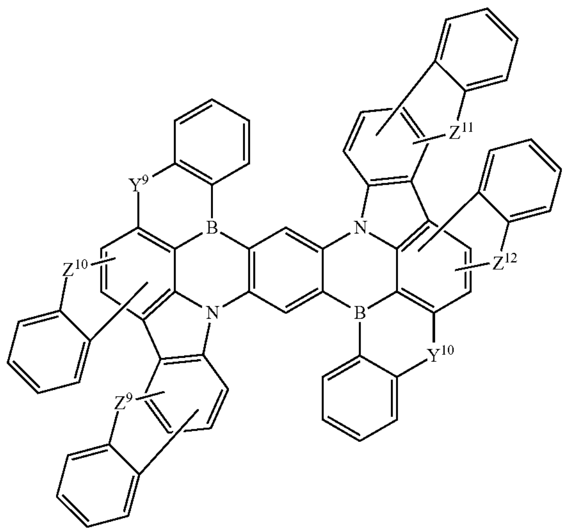

Skeleton (6b)

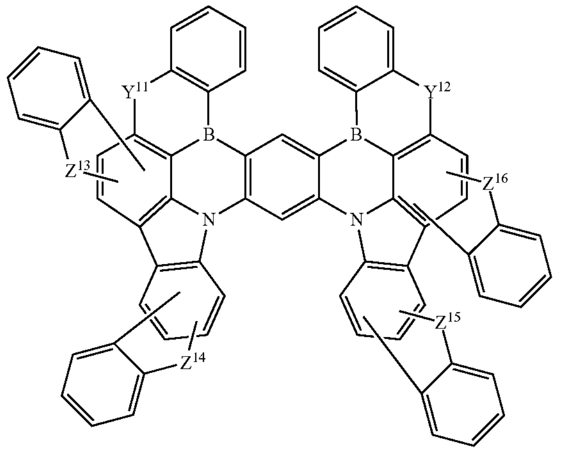

In the skeletons (6a) and (6b), each of $Y^9$ to $Y^{12}$ independently represents two hydrogen atoms, a single bond or $N(R^{27})$. Each of $Z^9$ to $Z^{16}$ independently represents an oxygen atom or a sulfur atom. It is preferable that $Z^9$ to $Z^{16}$ are the same, but they may be different. In one aspect of the present invention, $Z^9$ to $Z^{16}$ are oxygen atoms. In one aspect of the present invention, $Z^9$ to $Z^1$ are sulfur atoms. In relation to details of $Y^9$ to $Y^{12}$, corresponding descriptions for the skeletons (4a) and (4b) may be referred to. In one aspect of the present invention, each hydrogen atom in the skeletons (6a) and (6b) is not substituted with a linking group together with an adjacent hydrogen atom to form a ring structure.

As one preferable group of compounds having the skeleton (6a), compounds represented by the following formula (6a) may be exemplified.

Formula (6a)

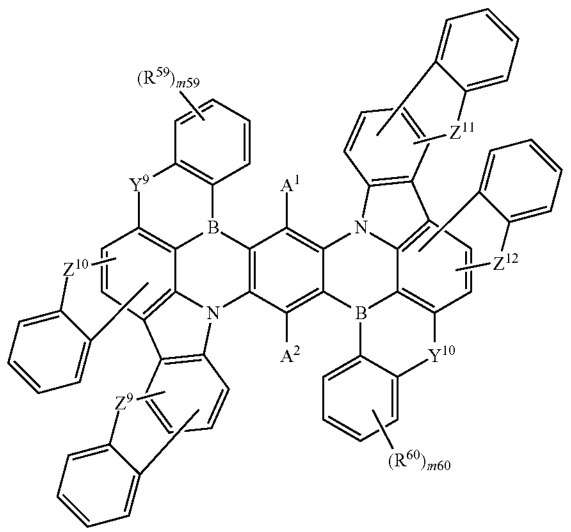

In the formula (6a), each of $R^{59}$ and $R^{60}$ independently represents a substituted or unsubstituted alkyl group. Each of m59 and m60 independently represents an integer of 0 to 4. Each of $Y^9$ and $Y^{10}$ independently represents two hydrogen atoms, a single bond or $N(R^{27})$. $R^{27}$ represents a hydrogen atom a deuterium atom, or a substituent. Each of $Z^9$ to $Z^{12}$ independently represents an oxygen atom or a sulfur atom. Each of $A^1$ and $A^2$ independently represents a hydrogen atom, a deuterium atom, or a substituent. In relation to details of $R^{59}$, $R^{60}$, m59, m60, $Z^9$ to $Z^{12}$, $A^1$, and $A^2$, descriptions on $R^{55}$, $R^{56}$, m55, m56, $A^1$, and $A^2$ in the formula (5a) and $Z^9$ to $Z^{12}$ in the skeleton (6a) may be referred to.

Hereinafter, specific examples of the compound represented by the formula (6a) will be given. Compounds of the formula (6a) that may be used in the present invention are not construed as limiting to the following specific examples. In relation to specific examples including X, it is assumed that a compound in which all X's in the molecule are oxygen atoms, and a compound in which all X's in the molecule are sulfur atoms are disclosed, respectively. A compound in which some of X's in the molecule are oxygen atoms, and the rest are sulfur atoms may also be adopted.

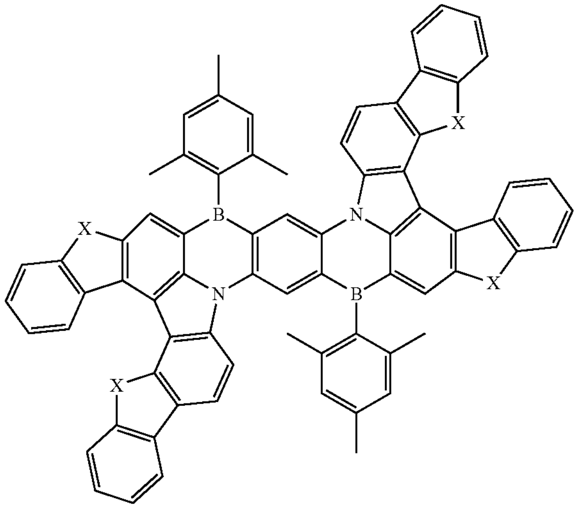

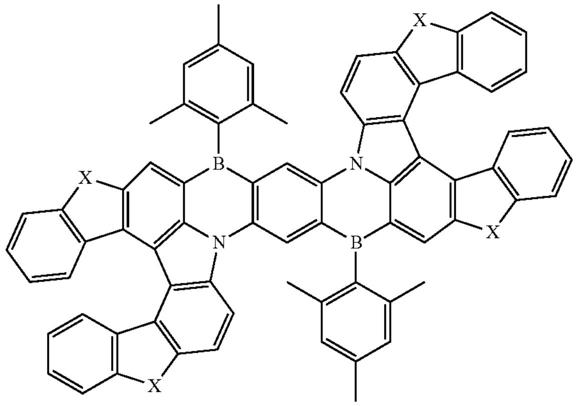

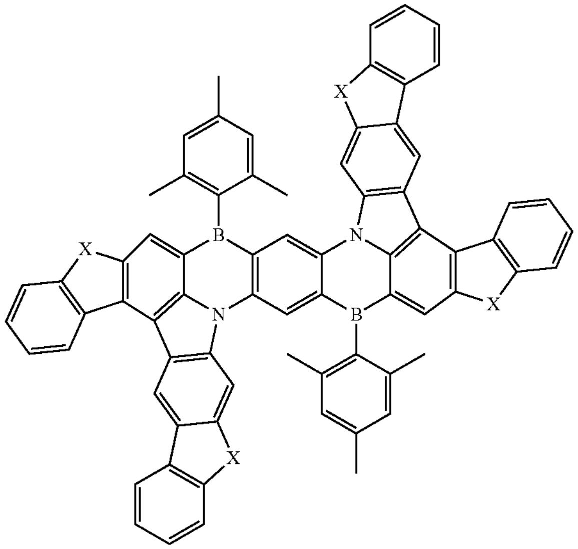

-continued
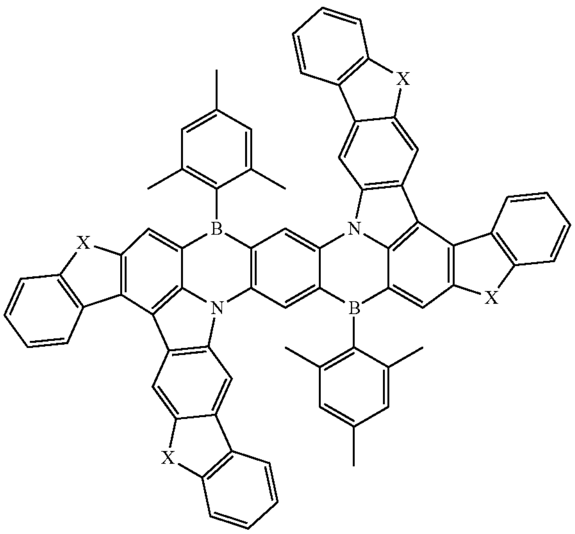
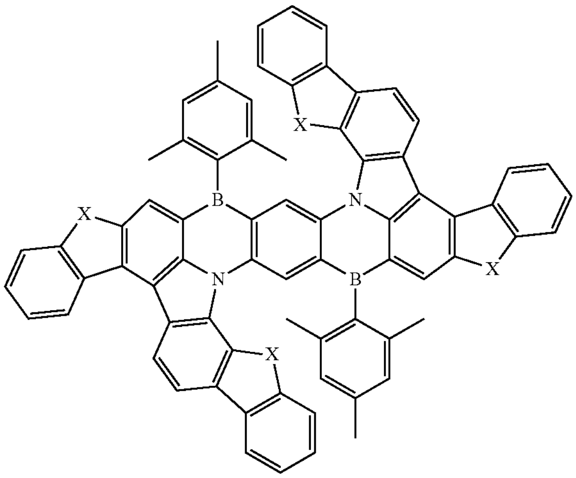
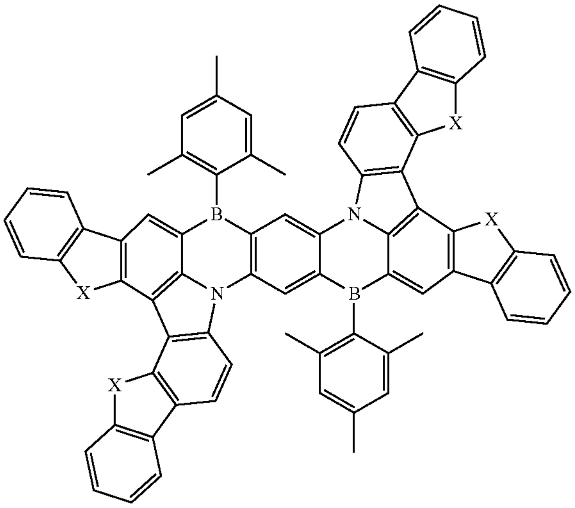
-continued
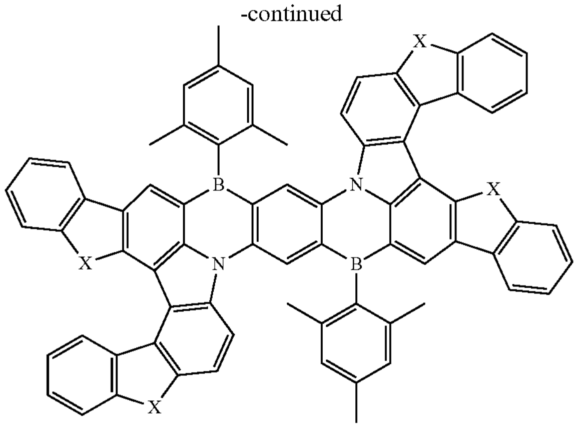
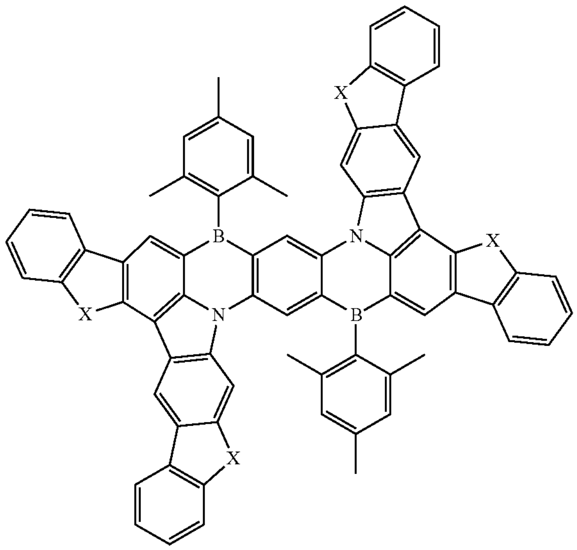
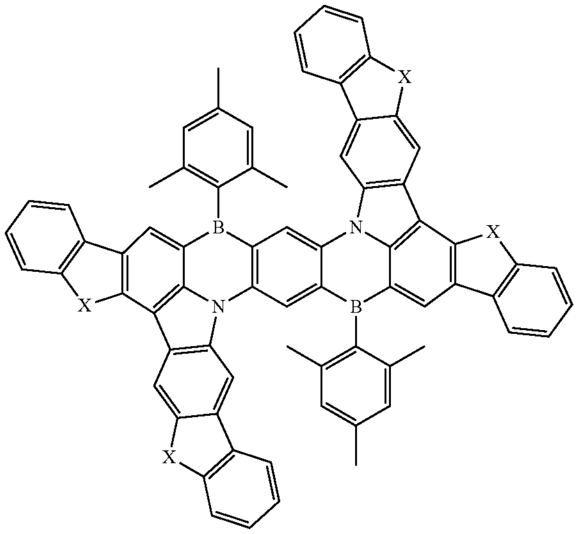

-continued
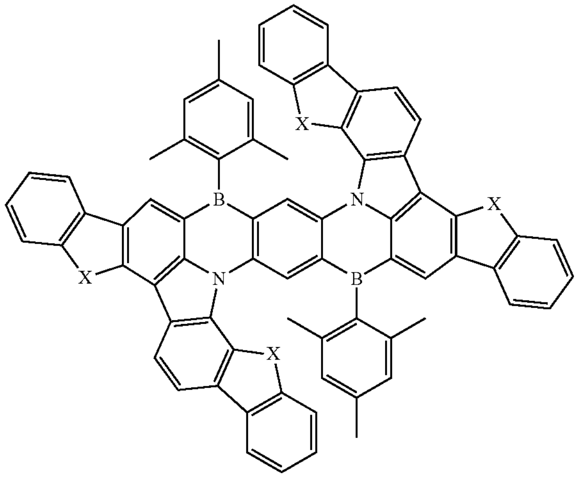
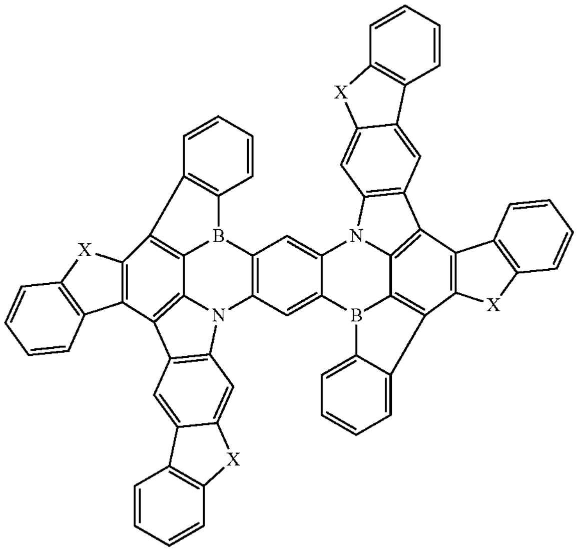
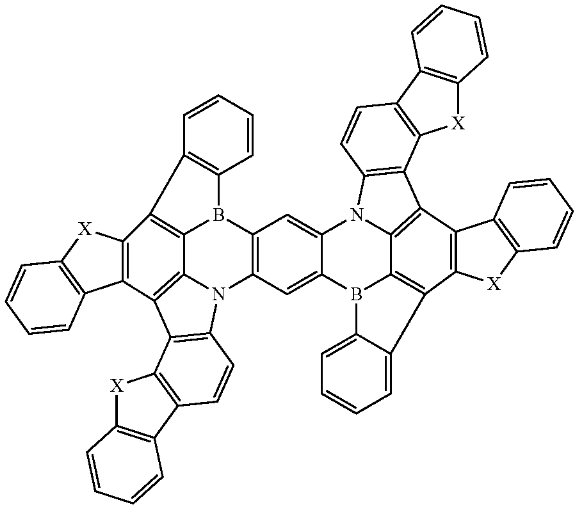
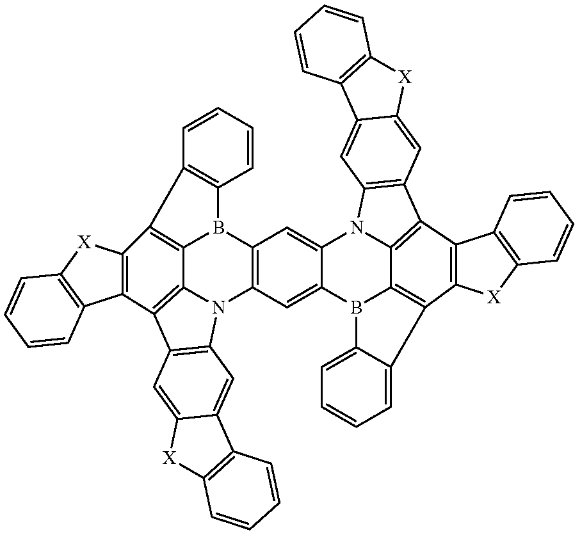
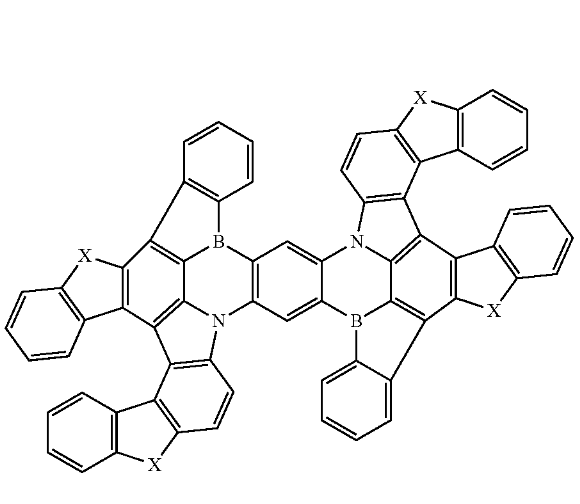
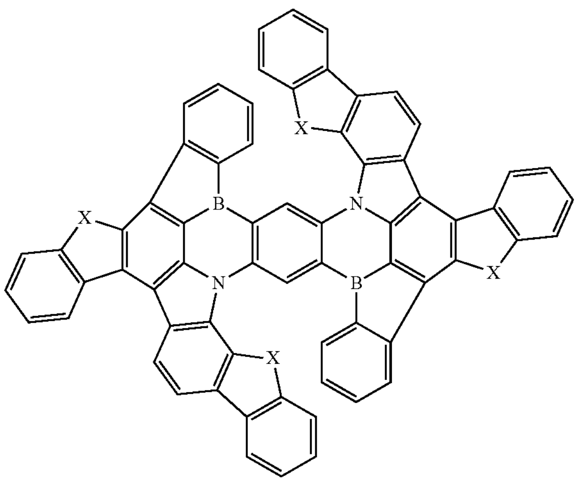
-continued -continued
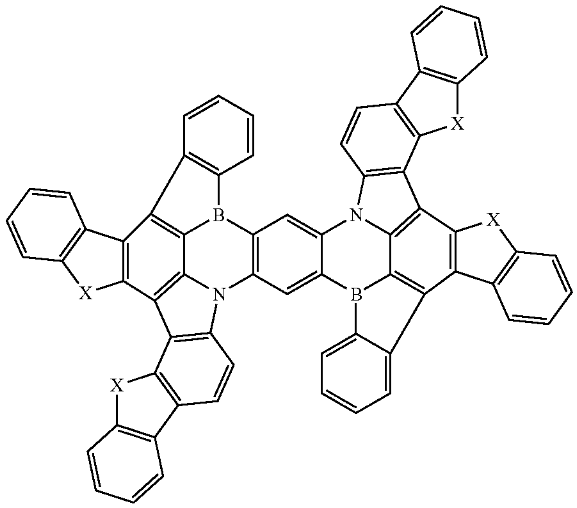
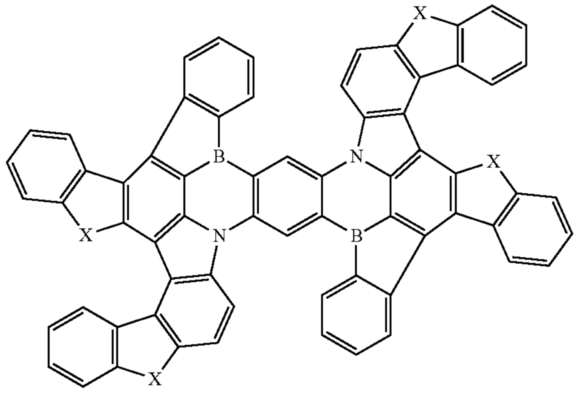
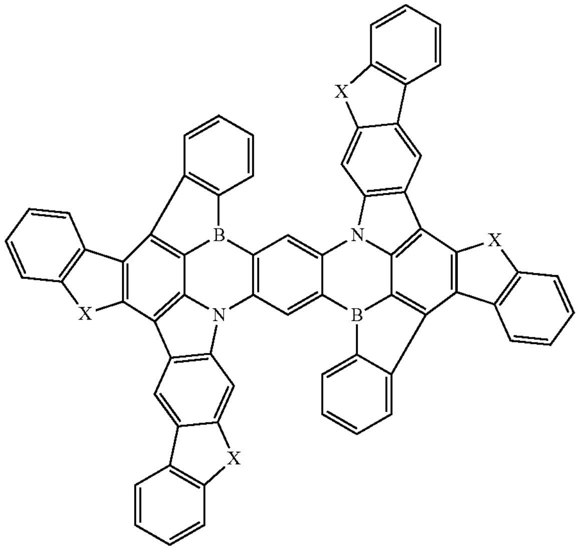
-continued
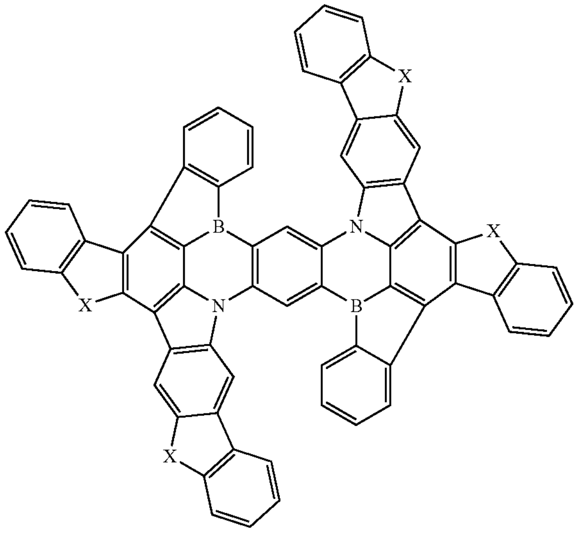
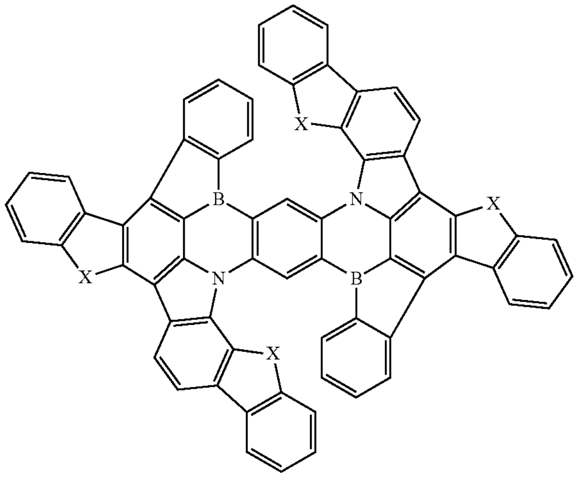
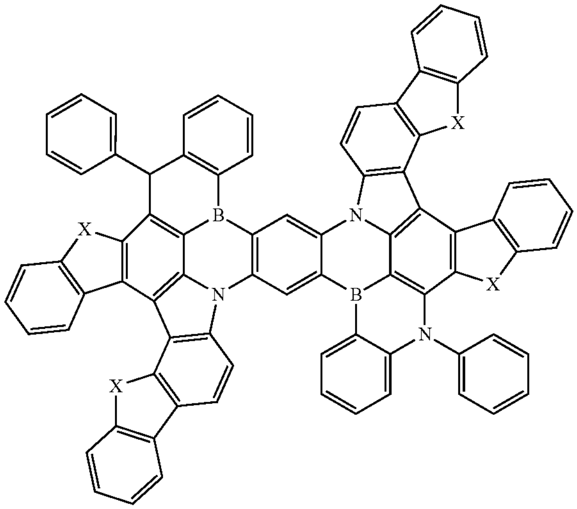

-continued
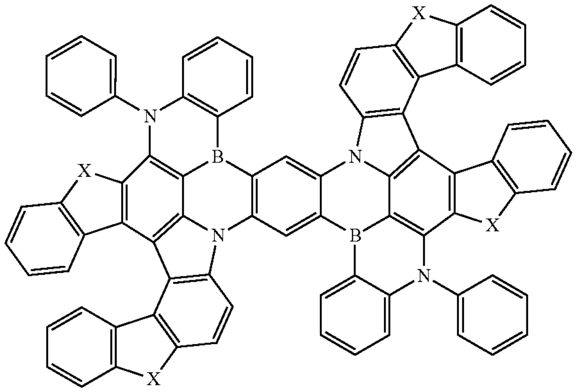
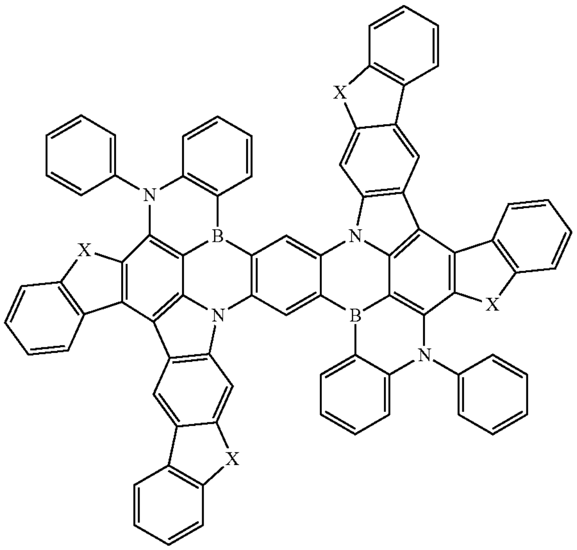
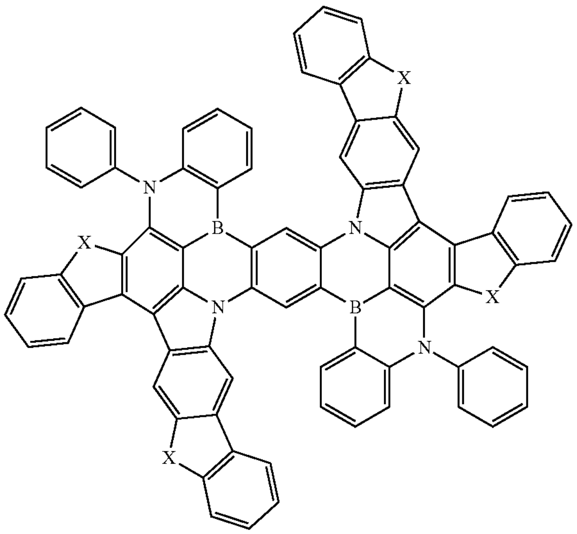
-continued
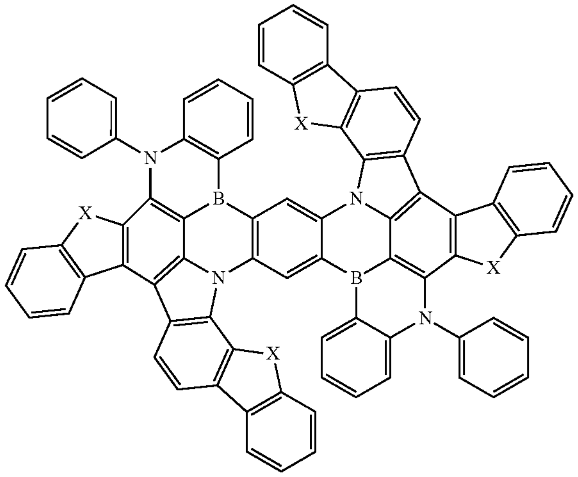
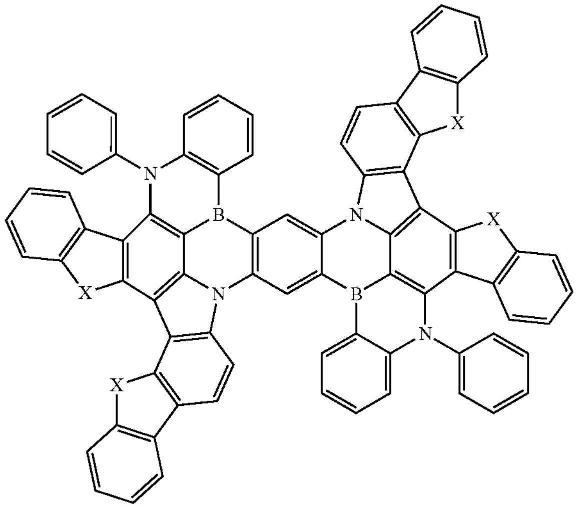
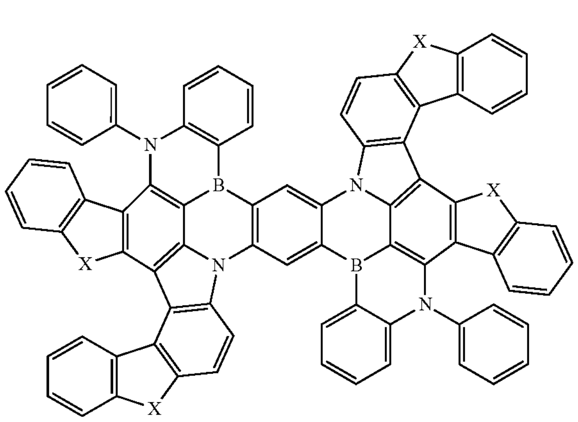

-continued

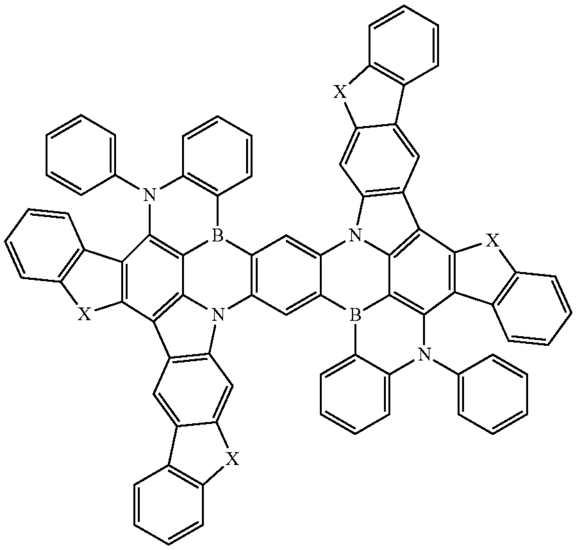

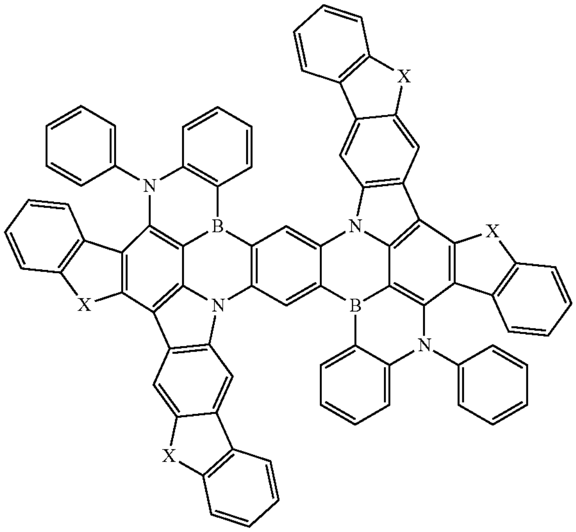

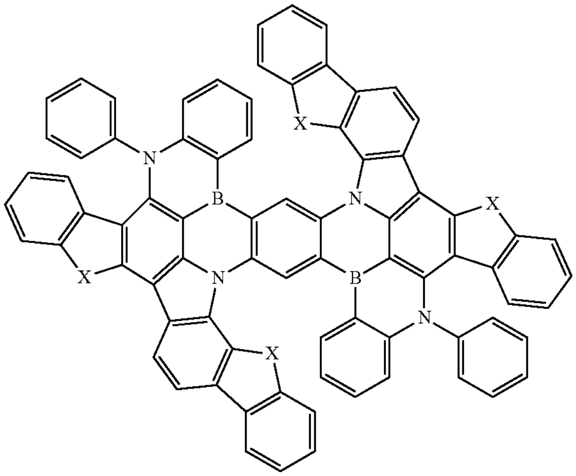

As one preferable group of compounds having the skeleton (6b), compounds represented by the following formula (6b) may be exemplified.

Formula (6b)

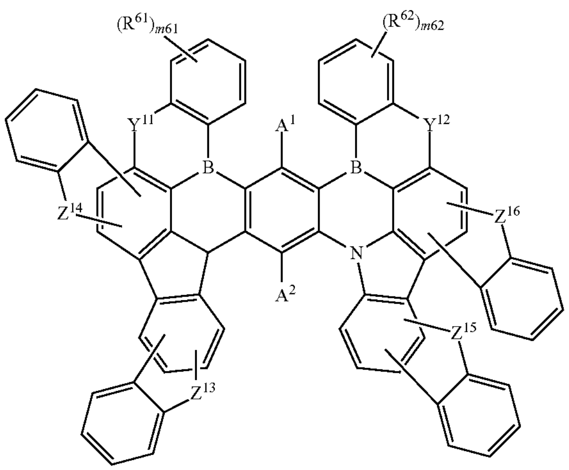

In the formula (6b), each of $R^{61}$ and $R^{62}$ independently represents a substituted or unsubstituted alkyl group. Each of m61 and m60 independently represents an integer of 0 to 4. Each of $Y^{11}$ and $Y^{12}$ independently represents two hydrogen atoms, a single bond or $N(R^{27})$. $R^{27}$ represents a hydrogen atom, a deuterium atom, or a substituent. Each of $Z^{13}$ to $Z^{16}$ independently represents an oxygen atom or a sulfur atom. Each of $A^1$ and $A^2$ independently represents a hydrogen atom, a deuterium atom, or a substituent. In relation to details of $R^{61}$, $R^{62}$, m61, m62, $Z^{13}$ to $Z^{16}$, $A^1$, and $A^2$, descriptions on $R^{59}$, $R^{60}$, m59, m60, $A^1$, and $A^2$ in the formula (6a), and $Z^{13}$ to $Z^{16}$ in the skeleton (6b) may be referred to.

Hereinafter, specific examples of the compound represented by the formula (6b) will be given. Compounds of the formula (6b) that may be used in the present invention are not construed as limiting to the following specific examples. In relation to specific examples including X, it is assumed that a compound in which all X's in the molecule are oxygen atoms, and a compound in which all X's in the molecule are sulfur atoms are disclosed, respectively. A compound in which some of X's in the molecule are oxygen atoms, and the rest are sulfur atoms may also be adopted.

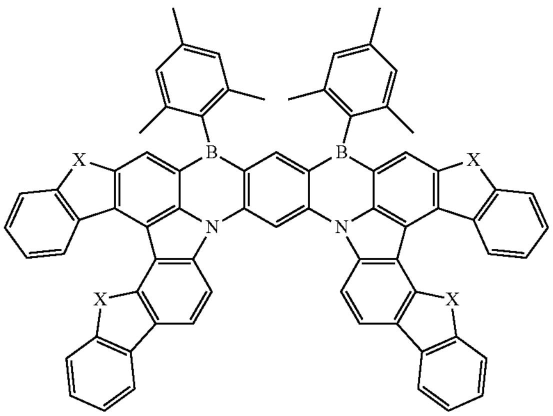

-continued
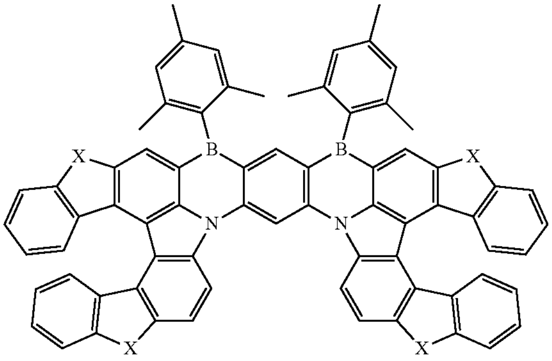
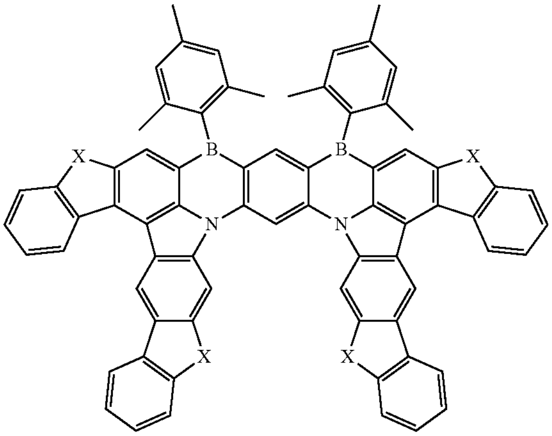
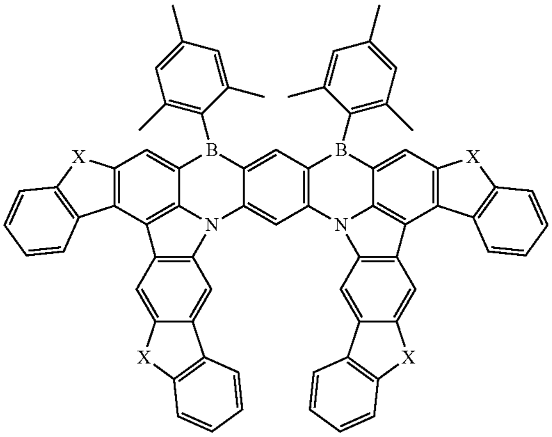
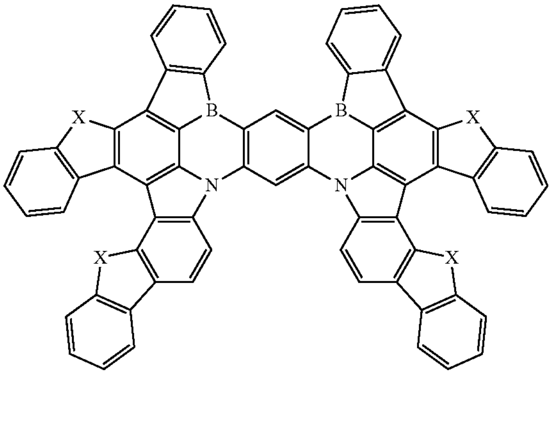
-continued
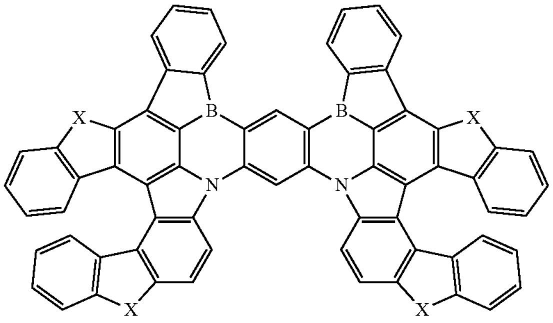
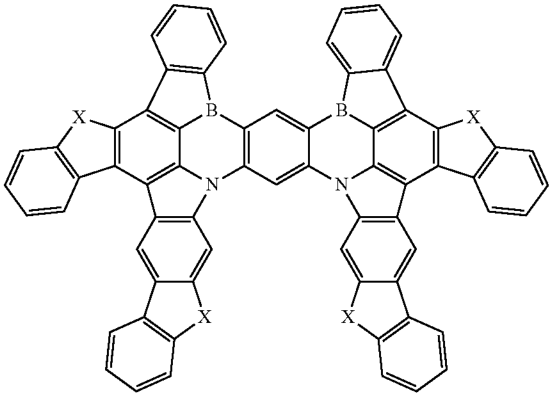
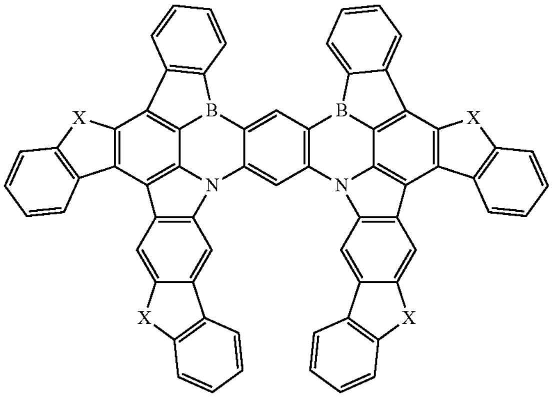
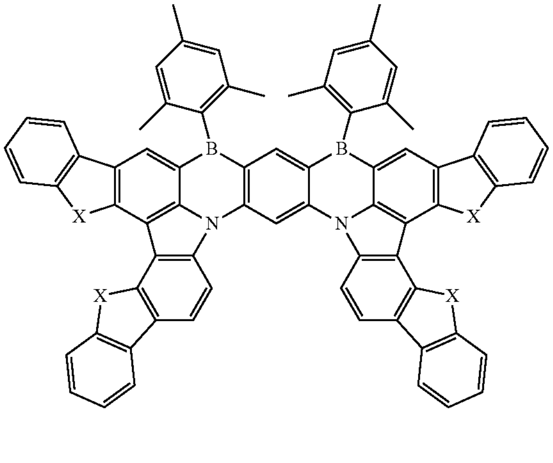

-continued
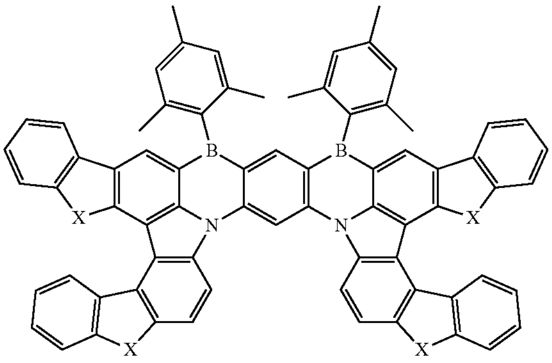
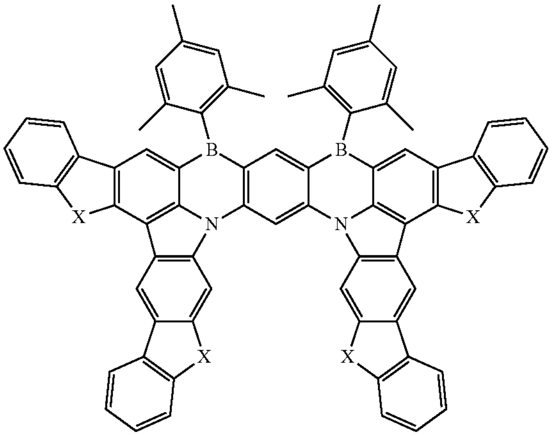
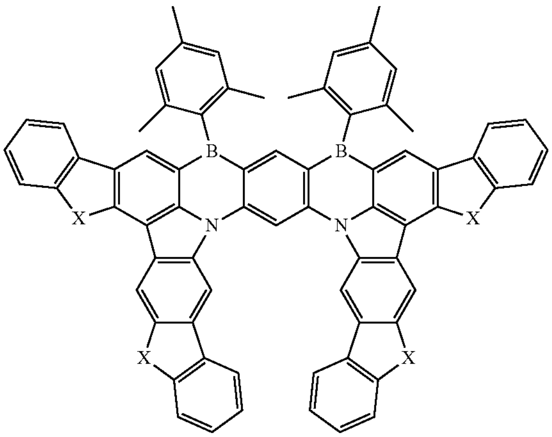
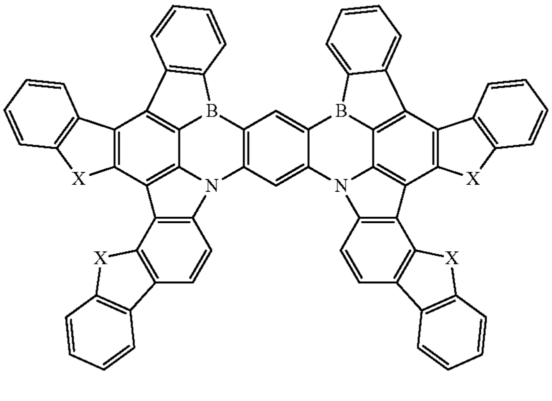
-continued
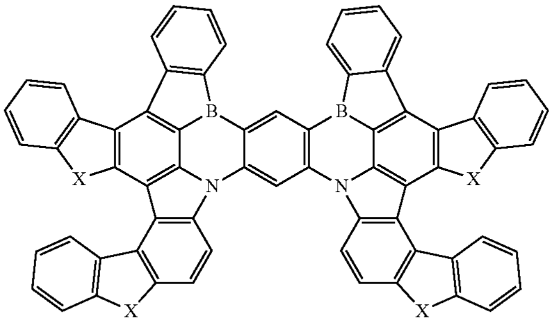
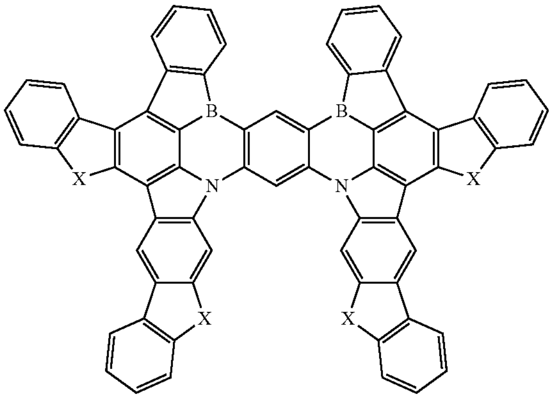
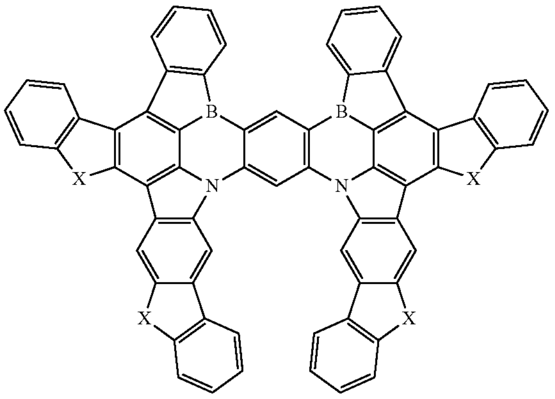
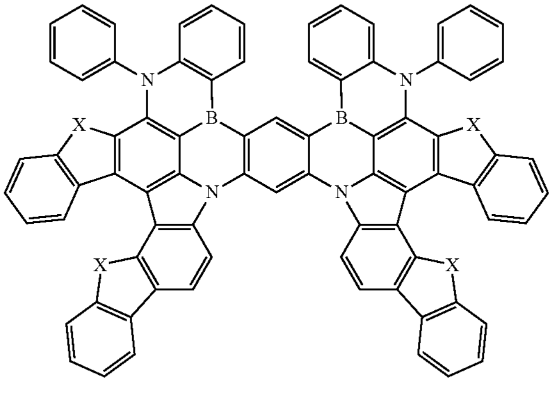

-continued

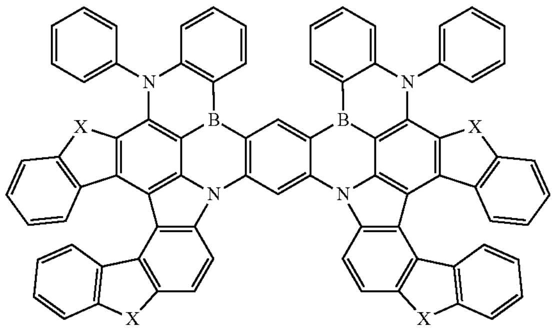

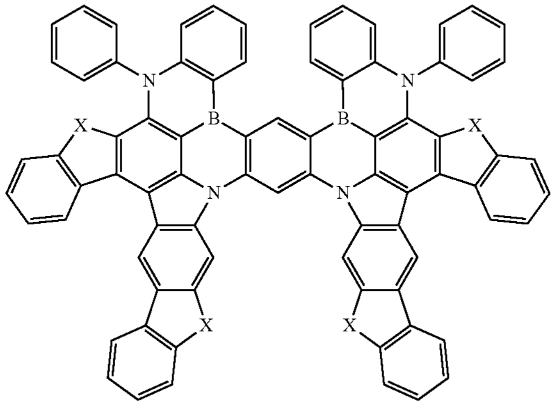

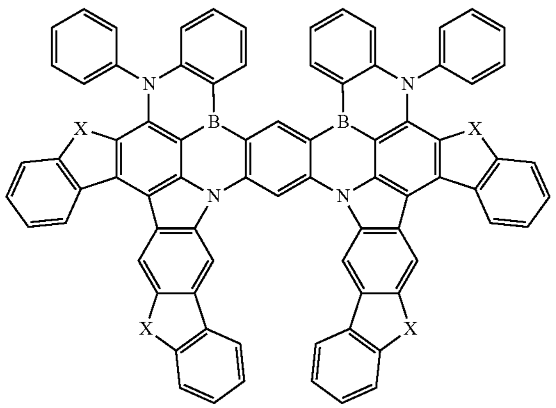

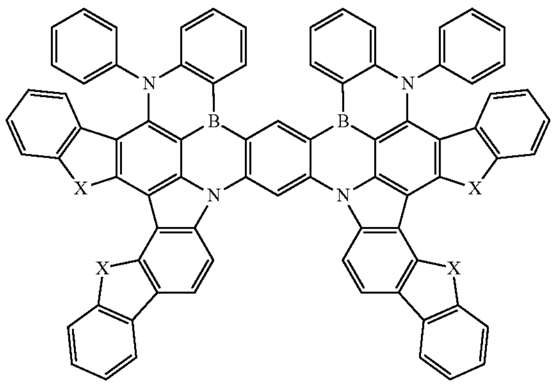

-continued

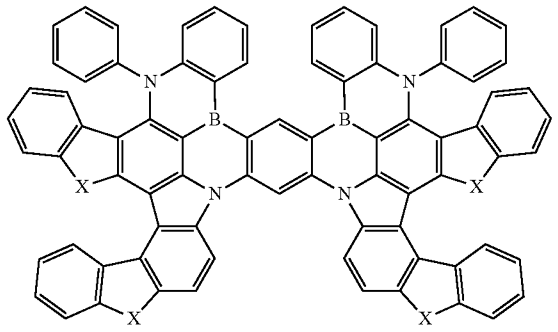

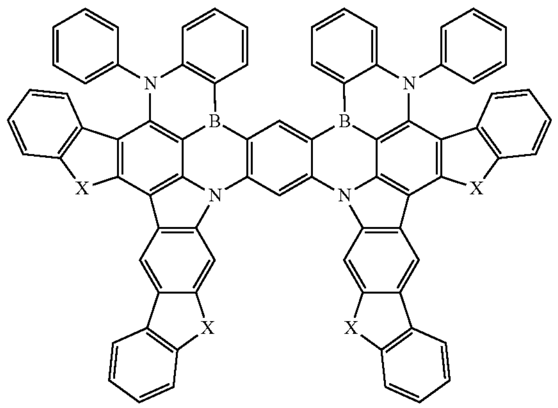

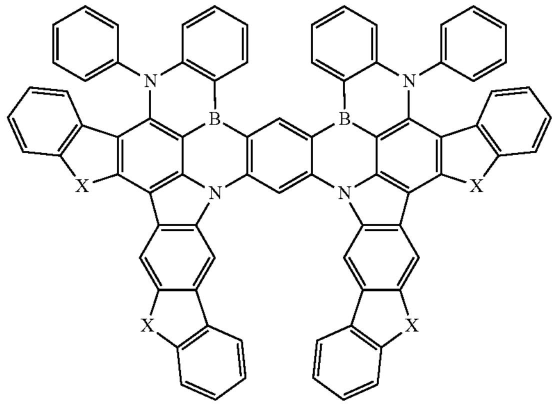

A compound in which a benzene ring is condensed with a benzene ring to which a boron atom is not directly bonded, between two benzene rings forming a carbazole partial structure existing in the formula (1), may be preferably mentioned. Examples of such a compound include a compound having the following skeleton (7a), and a compound having the following skeleton (7b).

Skeleton (7a)

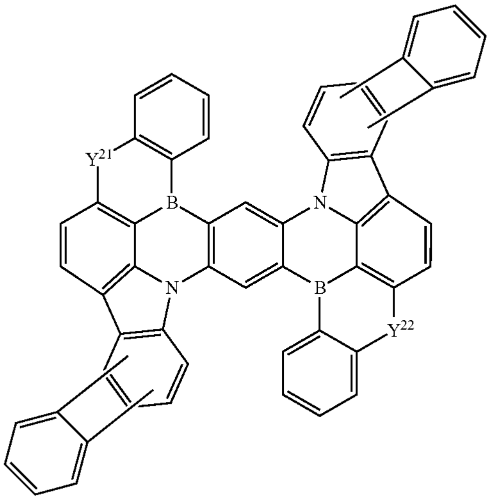

Formula (7a)

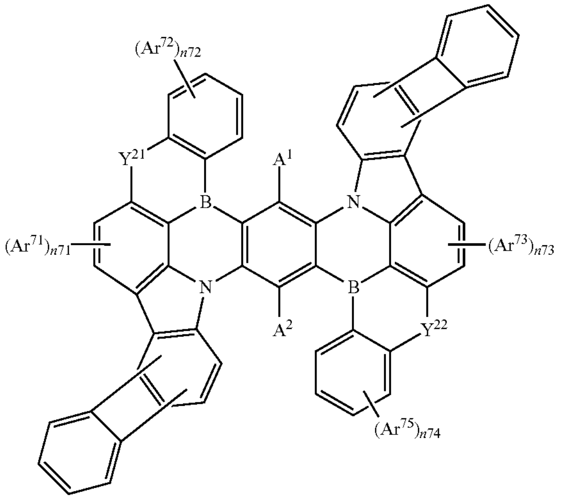

In the formula (7a), each of $Ar^{71}$ to $Ar^{74}$ independently represents a substituted or unsubstituted aryl group, a substituted or unsubstituted heteroaryl group, or a substituted or unsubstituted alkyl group, and, for example, a substituted or unsubstituted aryl group may be preferably selected. Each of n71 and n73 independently represents an integer of 0 to 2. Each of n72 and n74 independently represents an integer of 0 to 4. Each of $Y^{21}$ and $Y^{22}$ independently represents two hydrogen atoms, a single bond or $N(R^{27})$. $R^{27}$ represents a hydrogen atom, a deuterium atom, or a substituent. Each of $A^1$ and $A^2$ independently represents a hydrogen atom, a deuterium atom, or a substituent.

In one aspect of the present invention, n71 to n74 are integers of 0 to 2. In one aspect of the present invention, n71 and n73 are the same number, and n72 and n74 are the same number. n71 to n74 may be the same number. For example, n71 to n74 may be 0. n71 to n74 may be all 1. Further, for example, n71 and n73 may be 0, and n72 and n74 may be 1. In relation to preferable groups for $Ar^{71}$ to $Ar^{74}$, $A^1$, and $A^2$, corresponding descriptions on $Ar^1$ to $Ar^4$, $A^1$, and $A^2$ in the formula (1a) may be referred to.

Hereinafter, specific examples of the compound represented by the formula (7a) will be given. Compounds of the formula (7a) that may be used in the present invention are not construed as limiting to the following specific examples.

Skeleton (7b)

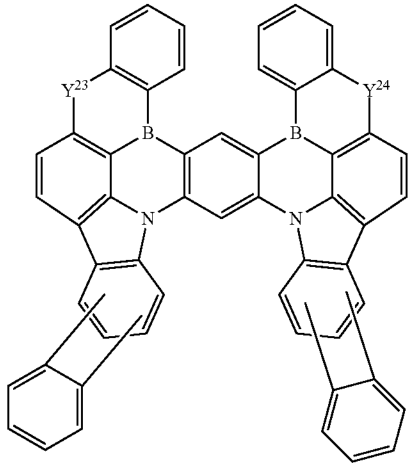

In the skeletons (7a) and (7b), each of $Y^{21}$ to $Y^{24}$ independently represents two hydrogen atoms, a single bond or $N(R^{27})$. In relation to details of $Y^{21}$ to $Y^{24}$, descriptions on $Y^1$ to $Y^4$ in the skeletons (4a) and (4b) may be referred to. In one aspect of the present invention, each hydrogen atom in the skeletons (7a) and (7b) is not substituted with a linking group together with an adjacent hydrogen atom to form a ring structure.

As one preferable group of compounds having the skeleton (7a), compounds represented by the following formula (7a) may be exemplified.

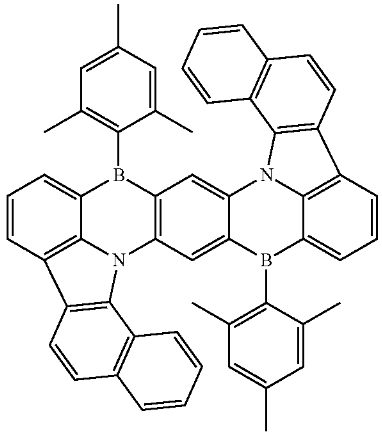

-continued
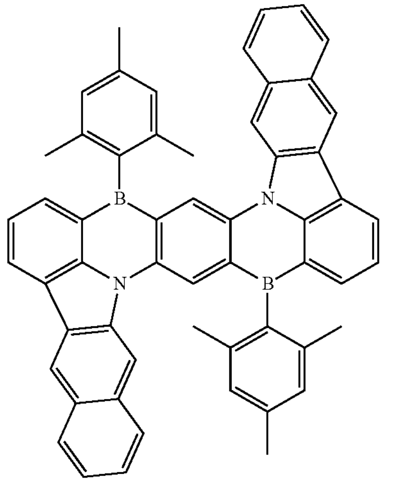
-continued
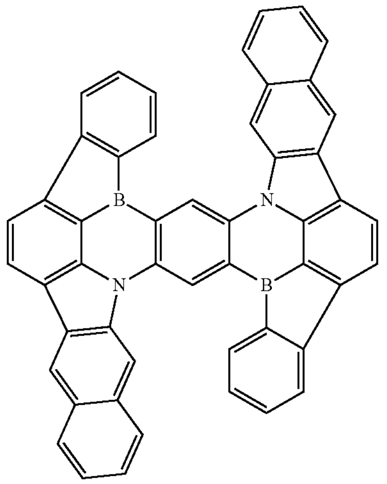
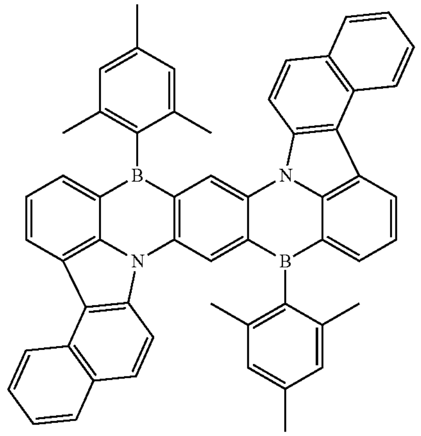
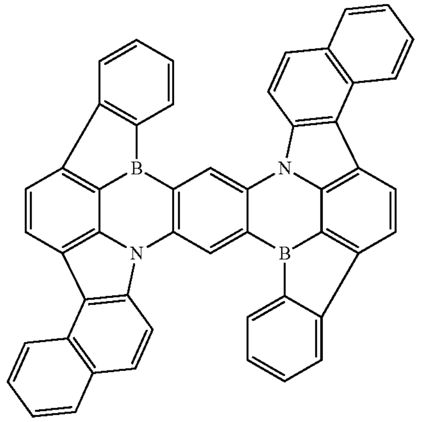
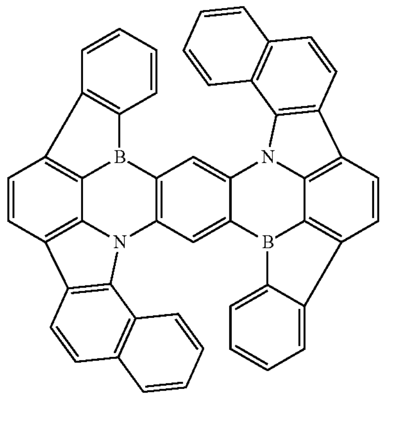
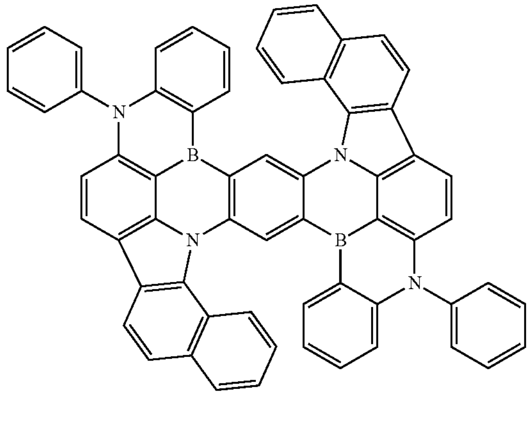

-continued

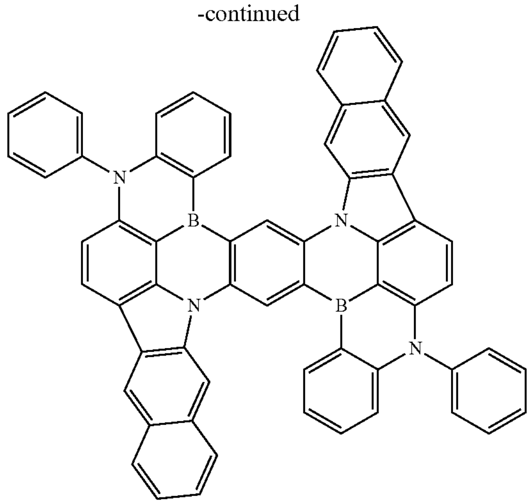

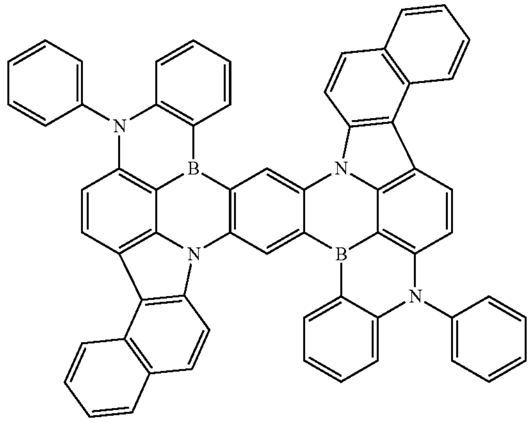

As one preferable group of compounds having the skeleton (7b), compounds represented by the following formula (7b) may be exemplified.

Formula (7b)

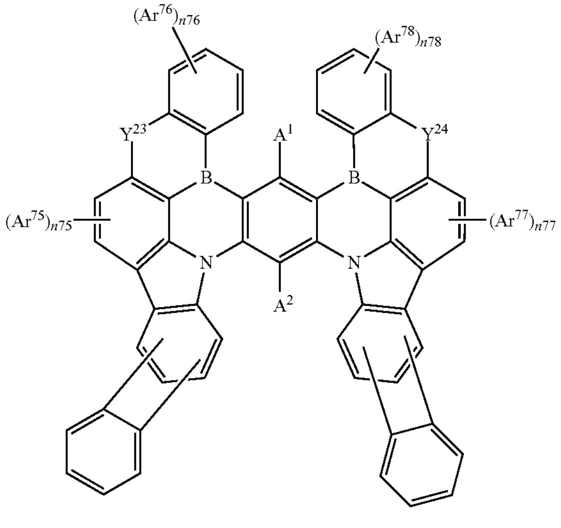

In the formula (7b), each of $Ar^{75}$ to $Ar^{78}$ independently represents a substituted or unsubstituted aryl group, a substituted or unsubstituted heteroaryl group, or a substituted or unsubstituted alkyl group, and, for example, a substituted or unsubstituted aryl group may be preferably selected. Each of n75 and n77 independently represents an integer of 0 to 2. Each of n76 and n78 independently represents an integer of 0 to 4. Each of $Y^{23}$ and $Y^{24}$ independently represents two hydrogen atoms, a single bond or $N(R^{27})$. $R^{27}$ represents a hydrogen atom, a deuterium atom, or a substituent. For detailed descriptions of n75 to n78, descriptions on n71 to n74 in the formula (7a) may be referred to in this order. In relation to preferable groups for $Ar^{75}$ to $Ar^{78}$, corresponding descriptions on $Ar^1$ to $Ar^4$ in the formula (1a) may be referred to.

Hereinafter, specific examples of the compound represented by the formula (7b) will be given. Compounds of the formula (7b) that may be used in the present invention are not construed as limiting to the following specific examples.

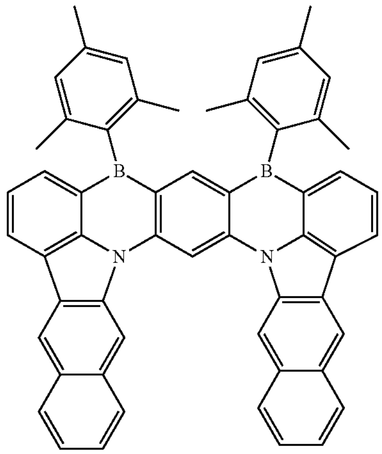

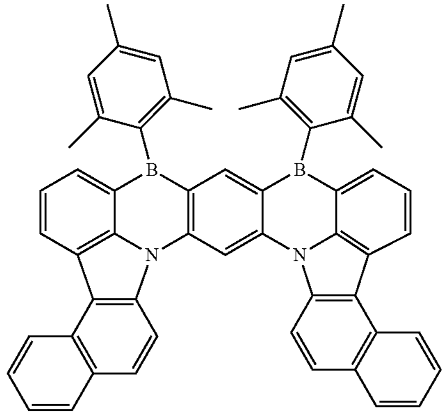

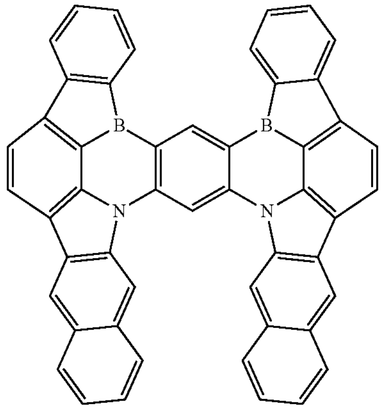

-continued

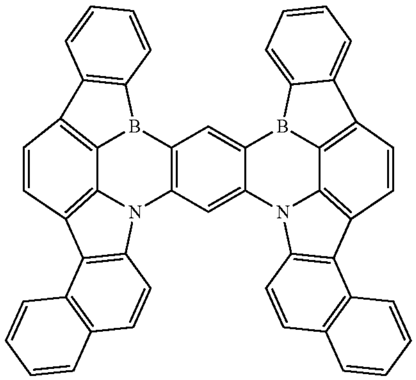

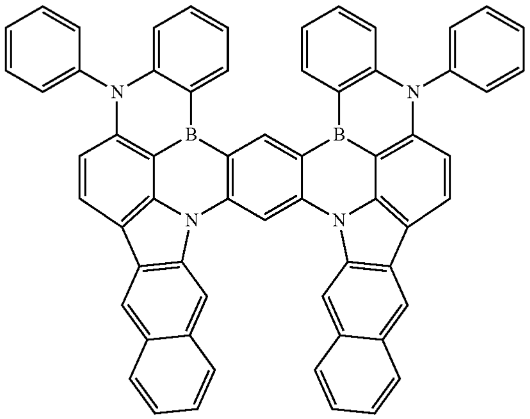

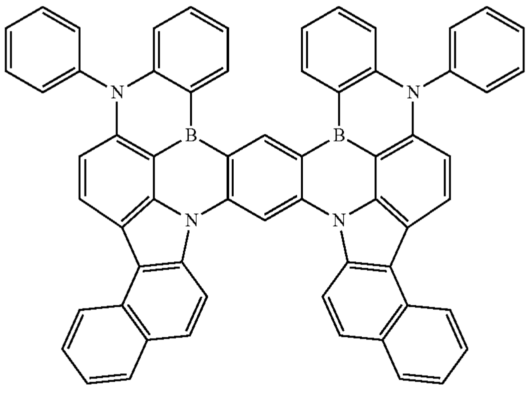

A compound in which a benzene ring is condensed with a benzene ring to which a boron atom is directly bonded, between two benzene rings forming a carbazole partial structure existing in the formula (1), may be preferably mentioned. Examples of such a compound include a compound having the following skeleton (8a), and a compound having the following skeleton (8b).

Skeleton (8a)

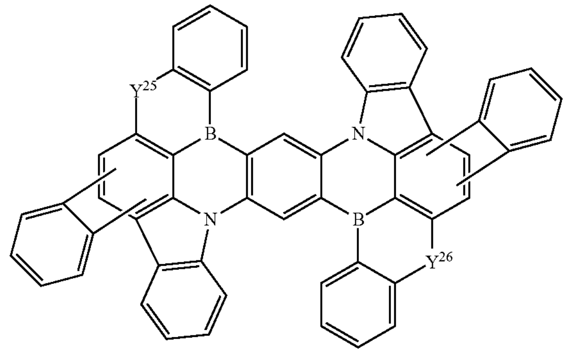

Skeleton (8b)

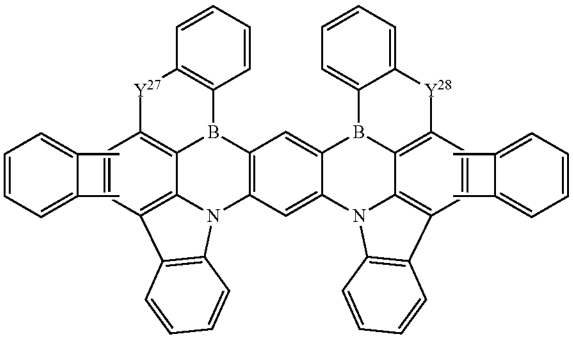

In the skeletons (8a) and (8b), each of $Y^{25}$ to $Y^{28}$ independently represents two hydrogen atoms, a single bond or $N(R^{27})$. In relation to details of $Y^{25}$ to $Y^{28}$, corresponding descriptions for the skeletons (4a) and (4b) may be referred to. In one aspect of the present invention, each hydrogen atom in the skeletons (8a) and (8b) is not substituted with a linking group together with an adjacent hydrogen atom to form a ring structure.

As one preferable group of compounds having the skeleton (8a), compounds represented by the following formula (8a) may be exemplified.

Formula (8a)

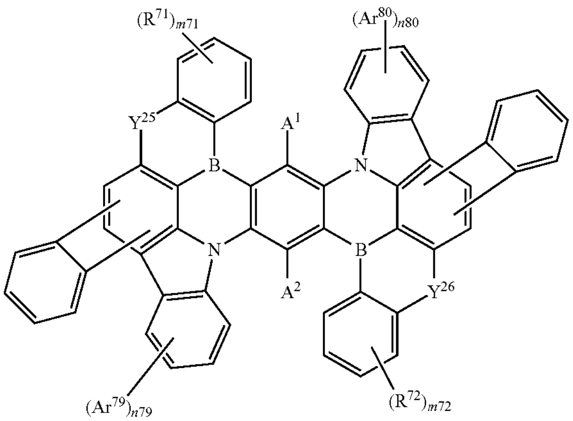

In the formula (8a), each of $Ar^{79}$ and $Ar^{80}$ independently represents a substituted or unsubstituted aryl group, a substituted or unsubstituted heteroaryl group, or a substituted or unsubstituted alkyl group, and, for example, a substituted or unsubstituted aryl group may be preferably selected. Each of $R^{71}$ and $R^{72}$ independently represents a substituted or unsubstituted alkyl group. Each of m71 and m72 independently represents an integer of 0 to 4. Each of n79 and n80 independently represents an integer of 0 to 4. Each of $Y^{25}$ and $Y^{26}$ independently represents two hydrogen atoms, a single bond or $N(R^{27})$. $R^{27}$ represents a hydrogen atom, a deuterium atom, or a substituent. Each of $A^1$ and $A^2$ independently represents a hydrogen atom, a deuterium atom, or a substituent.

In one aspect of the present invention, n79 and n80 are integers of 0 to 2. In one aspect of the present invention, n79 and n80 are the same number, and for example, may be all 0, or may be all 1. In one aspect of the present invention, m71 and m72 are integers of 0 to 2. In one aspect of the present invention, m71 and m72 are the same number, and for example may be all 0, or may be all 1. In relation to preferable groups for $Ar^{79}$, $Ar^{80}$, $R^{71}$, $R^{72}$, $A^1$, and $A^2$, corresponding descriptions on $Ar^1$, $Ar^3$, $R^{41}$, $R^{42}$, $A^1$, and $A^2$ in the formula (1a) may be referred to.

Hereinafter, specific examples of the compound represented by the formula (8a) will be given. Compounds of the formula (8a) that may be used in the present invention are not construed as limiting to the following specific examples.

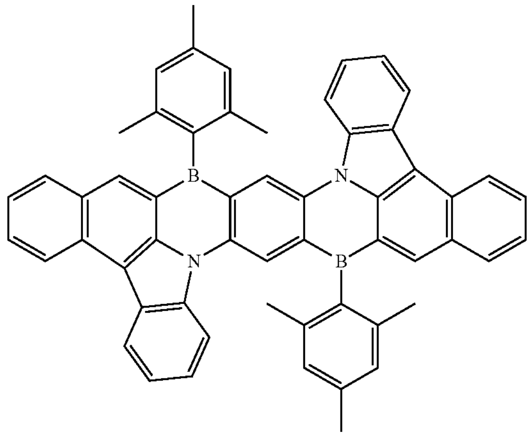

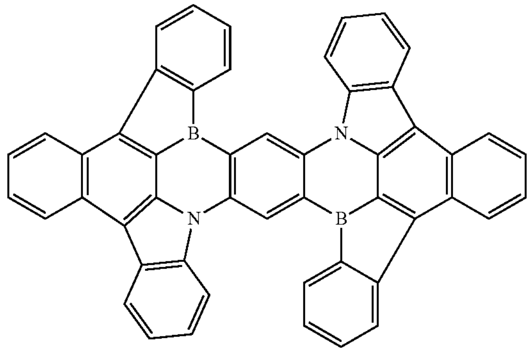

-continued

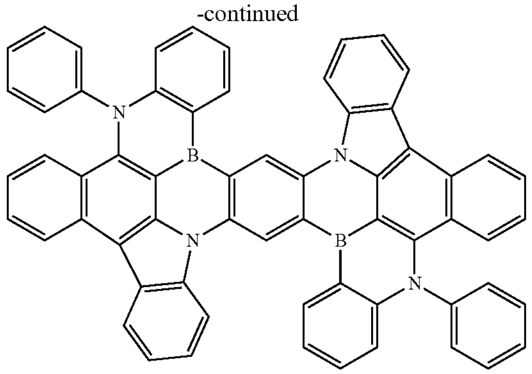

As one preferable group of compounds having the skeleton (8b), compounds represented by the following formula (8b) may be exemplified.

Formula (8b)

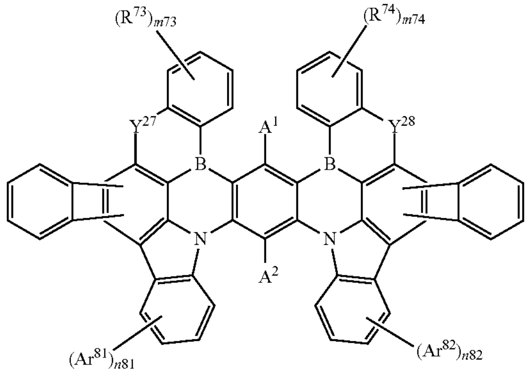

In the formula (8b), each of $Ar^{81}$ and $Ar^{82}$ independently represents a substituted or unsubstituted aryl group, a substituted or unsubstituted heteroaryl group, or a substituted or unsubstituted alkyl group, and, for example, a substituted or unsubstituted aryl group may be preferably selected. Each of $R^{73}$ and $R^{74}$ independently represents a substituted or unsubstituted alkyl group. Each of m73 and m74 independently represents an integer of 0 to 4. Each of n81 and n82 independently represents an integer of 0 to 4. Each of $Y^{27}$ and $Y^{28}$ independently represents two hydrogen atoms, a single bond or $N(R^{27})$. $R^{27}$ represents a hydrogen atom, a deuterium atom, or a substituent. Each of $A^1$ and $A^2$ independently represents a hydrogen atom, a deuterium atom, or a substituent.

In relation to detailed descriptions of m73, m74, n81, and n82, descriptions on m71, m72, n79, and n80 in the formula (8a) may be referred to. In relation to preferable groups for $Ar^{81}$, $Ar^{82}$, $R^{73}$, $R^{74}$, $A^1$, and $A^2$, corresponding descriptions on $Ar^1$, $Ar^3$, $R^{41}$, $R^{42}$, $A^1$, and $A^2$ in the formula (1a) may be referred to.

Hereinafter, specific examples of the compound represented by the formula (8b) will be given. Compounds of the formula (8b) that may be used in the present invention are not construed as limiting to the following specific examples.

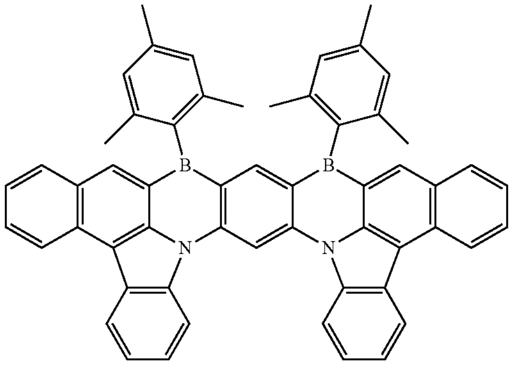

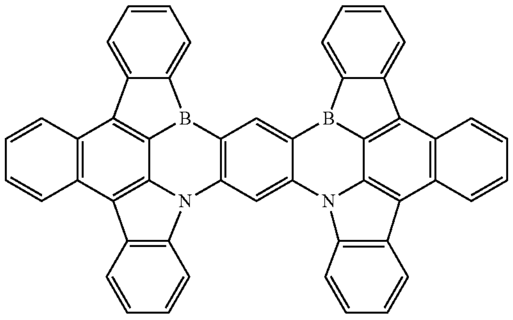

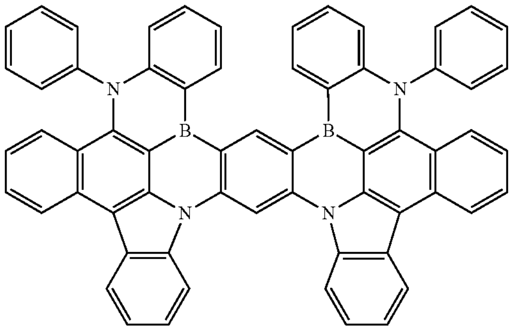

A compound in which benzene rings are condensed with both of two benzene rings forming a carbazole partial structure existing in the formula (1) may be preferably mentioned. Examples of such a compound include a compound having the following skeleton (9a), and a compound having the following skeleton (9b).

Skeleton (9a)

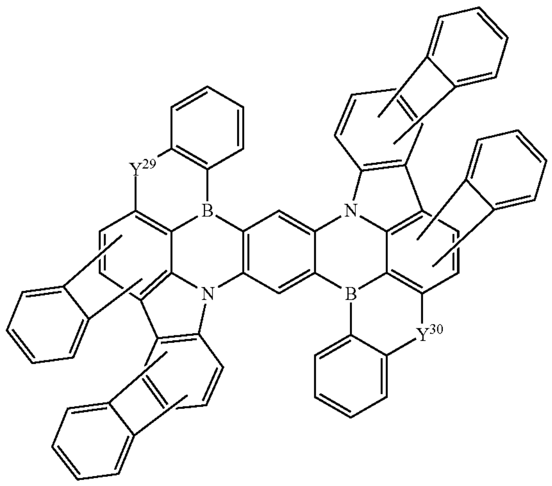

Skeleton (9b)

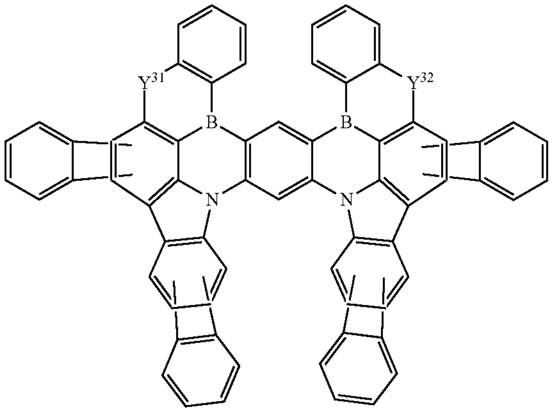

In the skeletons (9a) and (9b), each of $Y^{29}$ to $Y^{12}$ independently represents two hydrogen atoms, a single bond or $N(R^{27})$. In relation to details of $Y^{29}$ to $Y^{32}$, corresponding descriptions for the skeletons (4a) and (4b) may be referred to. In one aspect of the present invention, each hydrogen atom in the skeletons (9a) and (9b) is not substituted with a linking group together with an adjacent hydrogen atom to form a ring structure.

As one preferable group of compounds having the skeleton (9a), compounds represented by the following formula (9a) may be exemplified.

Formula (9a)

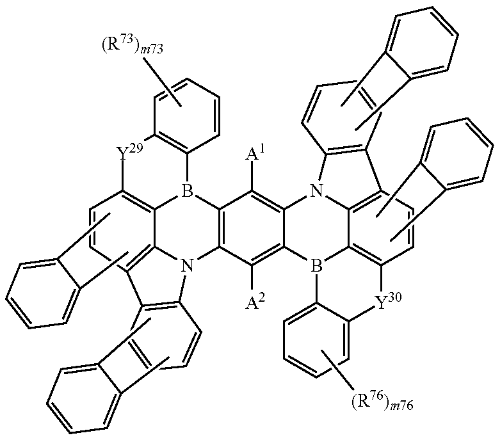

In the formula (9a), each of $R^{75}$ and $R^{76}$ independently represents a substituted or unsubstituted alkyl group. Each of m75 and m76 independently represents an integer of 0 to 4. Each of $Y^{29}$ and $Y^{30}$ independently represents two hydrogen atoms, a single bond or $N(R^{27})$. $R^{27}$ represents a hydrogen atom, a deuterium atom, or a substituent. Each of $A^1$ and $A^2$ independently represents a hydrogen atom, a deuterium atom, or a substituent. In relation to details of $R^{75}$, $R^{76}$, m75, m76, $A^1$, and $A^2$, descriptions on $R^{71}$, $R^{72}$, m71, m72, $A^1$, and $A^2$ in the formula (8a) may be referred to.

Hereinafter, specific examples of the compound represented by the formula (9a) will be given. Compounds of the formula (9a) that may be used in the present invention are not construed as limiting to the following specific examples.

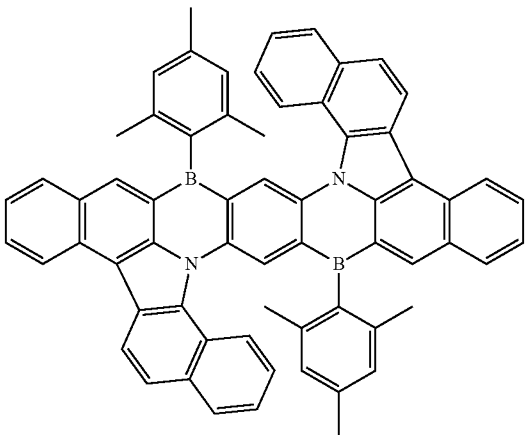

-continued

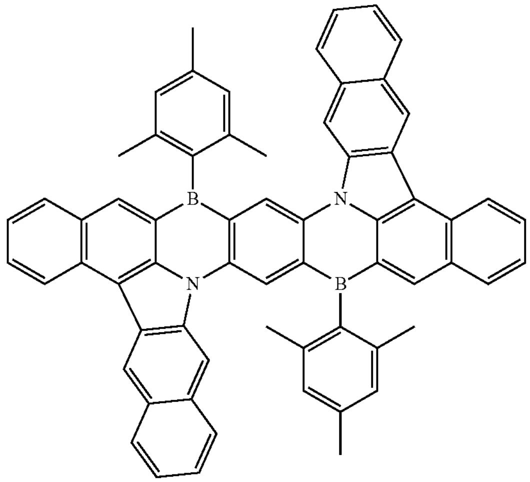

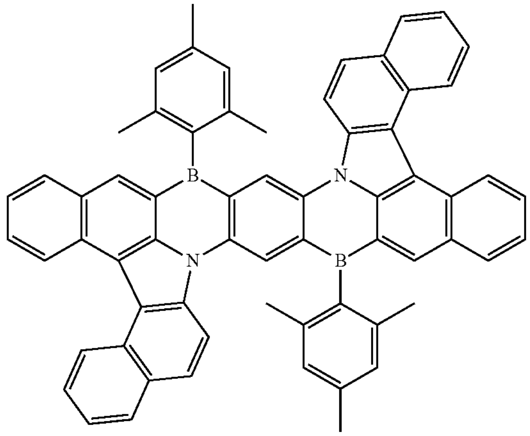

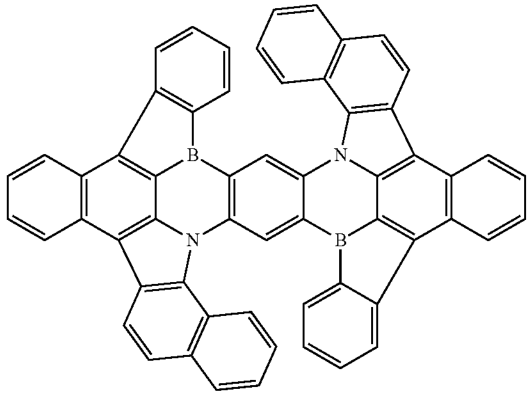

-continued

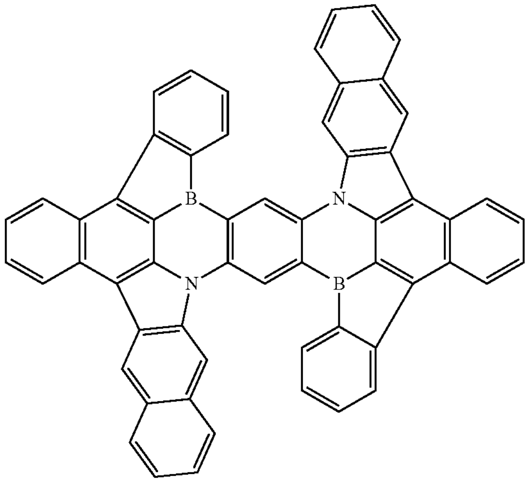

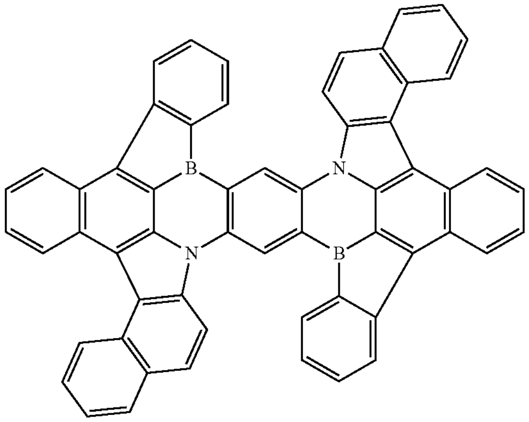

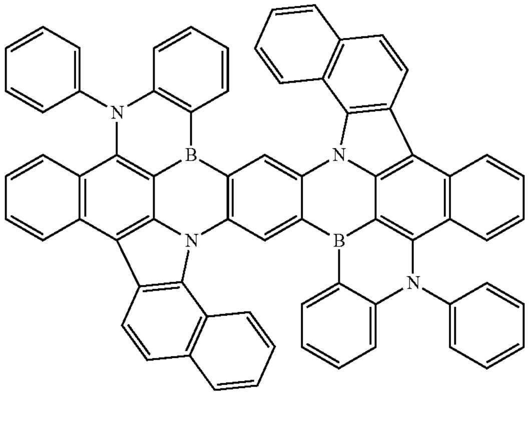

-continued

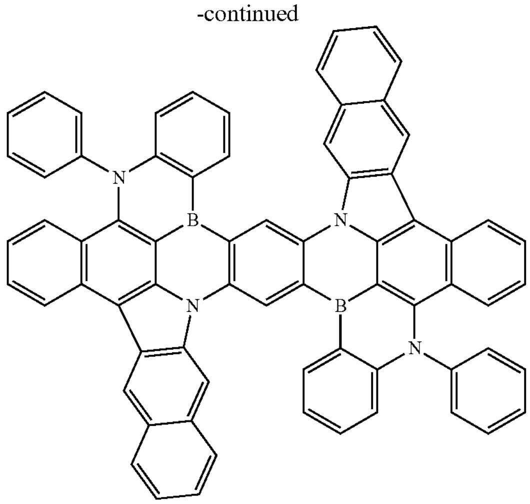

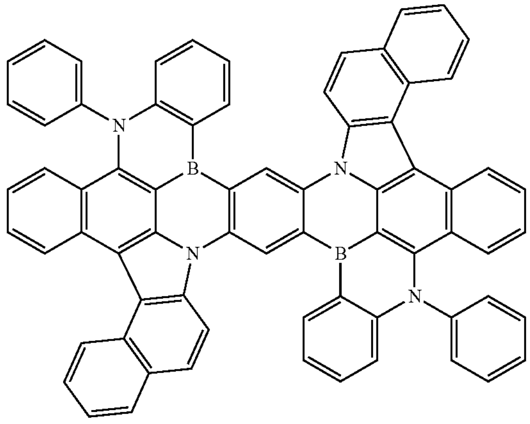

As one preferable group of compounds having the skeleton (9b), compounds represented by the following formula (9b) may be exemplified.

Formula (9b)

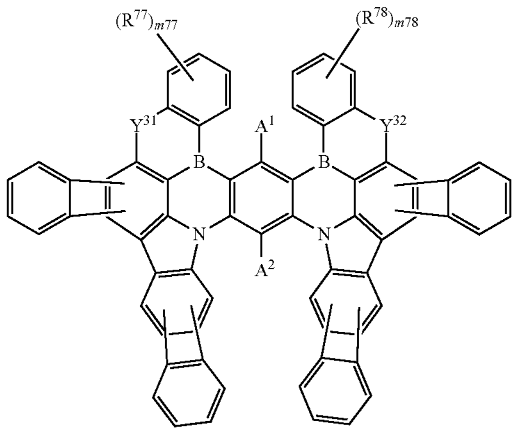

In the formula (9b), each of $R^{77}$ and $R^{78}$ independently represents a substituted or unsubstituted alkyl group. Each of m77 and m78 independently represents an integer of 0 to 4. Each of $Y^{31}$ and $Y^{32}$ independently represents two hydrogen atoms, a single bond or $N(R^{27})$. $R^{27}$ represents a hydrogen atom, a deuterium atom, or a substituent. Each of $A^1$ and $A^2$ independently represents a hydrogen atom, a deuterium atom, or a substituent. In relation to details of $R^{77}$, $R^{78}$, m77, m78, $A^1$, and $A^2$, descriptions on $R^{71}$, $R^{72}$, m71, m72, $A^1$, and $A^2$ in the formula (8a) may be referred to.

Hereinafter, specific examples of the compound represented by the formula (9b) will be given. Compounds of the formula (9b) that may be used in the present invention are not construed as limiting to the following specific examples.

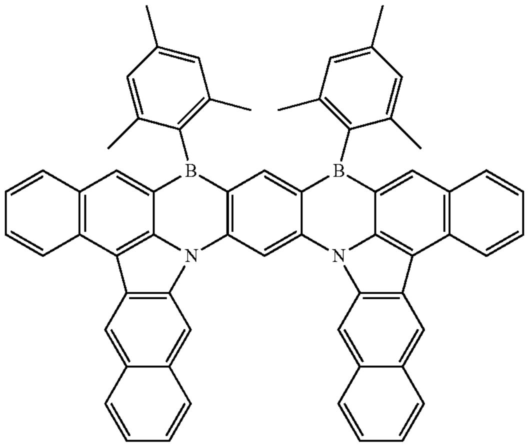

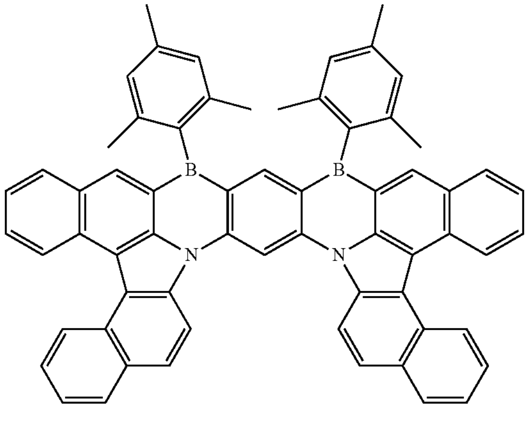

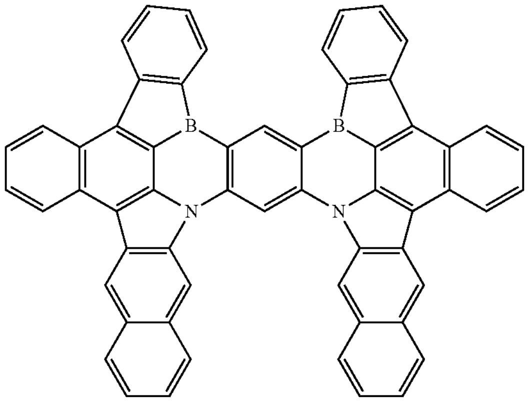

-continued

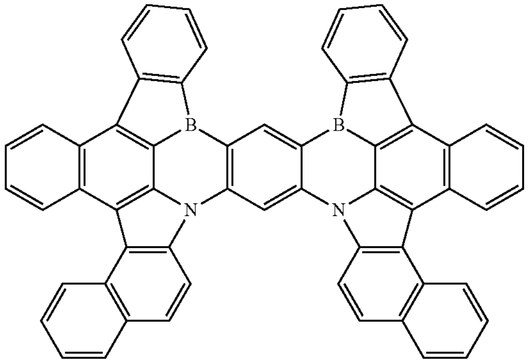

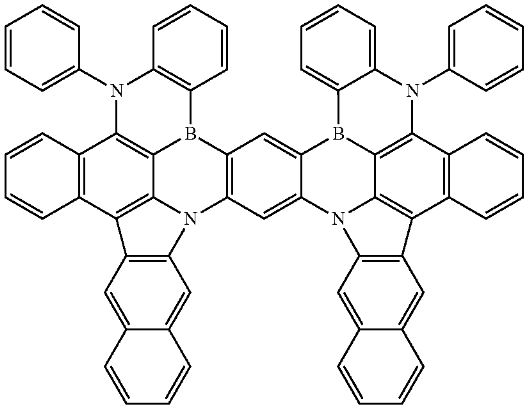

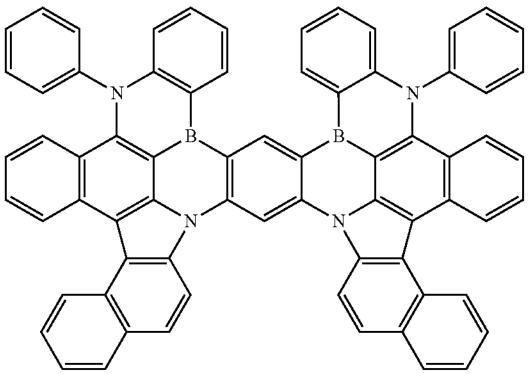

As the compound represented by the formula (1), a compound in which four or more carbazole partial structures are included in the molecule is also preferable. As an example of such a compound, a compound having the following skeleton (10) may be exemplified.

Skeleton (10)

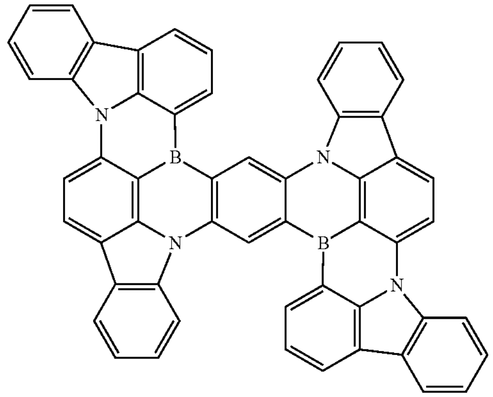

Each hydrogen atom in the skeleton (10) may be substituted with a deuterium atom or a substituent. Further, it may be substituted with a linking group together with an adjacent hydrogen atom to form a ring structure. For details, corresponding descriptions on $R^1$ to $R^{26}$, $A^1$, and $A^2$ in the formula (1) may be referred to. At least one hydrogen atom of a benzene ring forming a carbazole partial structure included in the skeleton (10) is substituted with a substituted or unsubstituted aryl group. In one aspect of the present invention, each hydrogen atom in the skeleton (10) is not substituted with a linking group together with an adjacent hydrogen atom to form a ring structure.

As one preferable group of compounds having the skeleton (10), compounds represented by the following formula (10) may be exemplified.

Formula (10)

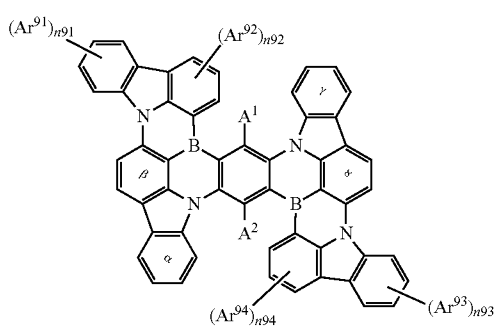

In the formula (10), each of $Ar^{91}$ to $Ar^{94}$ independently represents a substituted or unsubstituted aryl group, a substituted or unsubstituted heteroaryl group, or a substituted or unsubstituted alkyl group, and, for example, a substituted or unsubstituted aryl group may be preferably selected. Each of n91 and n93 independently represents an integer of 0 to 4, and each of n92 and n94 independently represents an integer of 0 to 3. An α ring, a Bring, a γ ring, and a δ ring may be substituted. At least one ring is substituted with a substituted or unsubstituted aryl group, is condensed with a benzene ring that may be substituted, or is condensed with a substituted or unsubstituted furan ring of benzofuran or a substituted or unsubstituted thiophene ring of thiophene. Each of $A^1$ and $A^1$ independently represents a hydrogen atom, a deuterium atom, or a substituent.

In one aspect of the present invention, n91 to n94 are integers of 0 to 2. In one aspect of the present invention, n91 and n93 are the same number, and n92 and n94 are the same number. n91 to n94 may be all the same number, and for example may be all 0, or may be all 1. In relation to preferable groups for $Ar^{91}$ to $Ar^{94}$, corresponding descriptions on $Ar^1$ to $Ar^4$ in the formula (1a) may be referred to. In one aspect of the present invention, the α ring and the γ ring have the same substituents or have the same condensed structures, and the β ring and the δ ring have the same substituents or have the same condensed structures. In one aspect of the present invention, both the β ring and the δ ring are substituted with substituted or unsubstituted aryl groups, are condensed with benzene rings that may be substituted, or are condensed with substituted or unsubstituted furan rings of benzofuran or substituted or unsubstituted thiophene rings of thiophene. In one aspect of the present invention, both the α ring and they ring are substituted with substituted or unsubstituted aryl groups, are condensed with benzene rings that may be substituted, or are condensed with substituted or unsubstituted furan rings of benzofuran or substituted or unsubstituted thiophene rings of thiophene. In one aspect of the present invention, all of the α ring, the β ring, the γ ring, and the δ ring are substituted with substituted or unsubstituted aryl groups, are condensed with benzene rings that may be substituted, or are condensed with substituted or unsubstituted furan rings of benzofuran or substituted or unsubstituted thiophene rings of thiophene. In relation to descriptions and preferable ranges of $A^1$ and $A^2$, corresponding descriptions for the formula (1) may be referred to.

Hereinafter, specific examples of the compound represented by the formula (10) will be given. Compounds of the formula (10) that may be used in the present invention are not construed as limiting to the following specific examples.

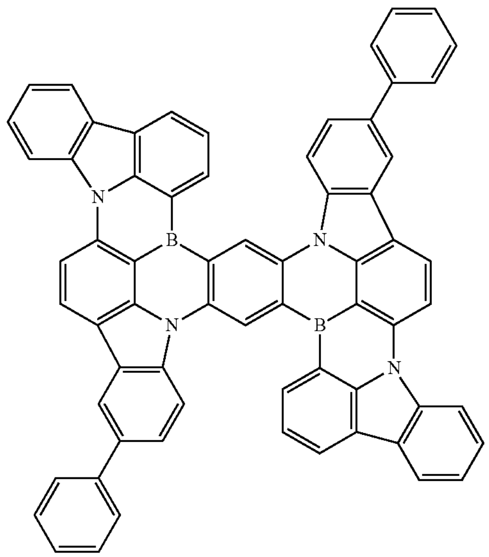

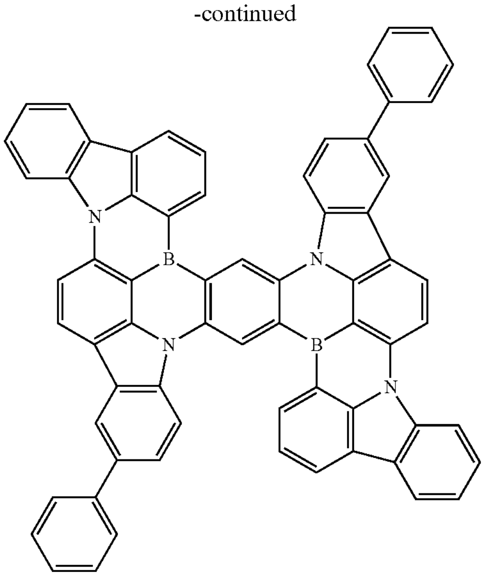
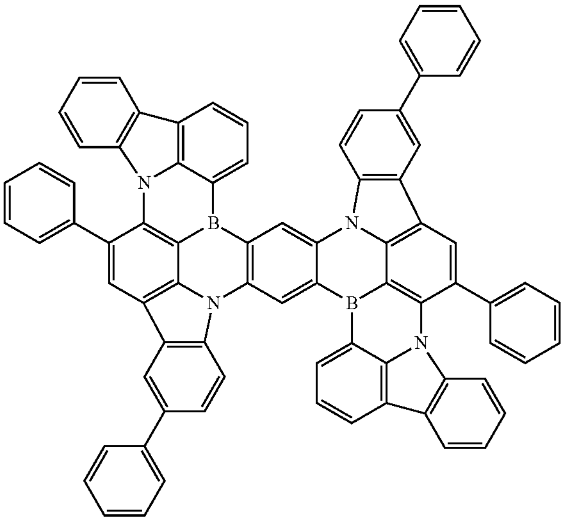
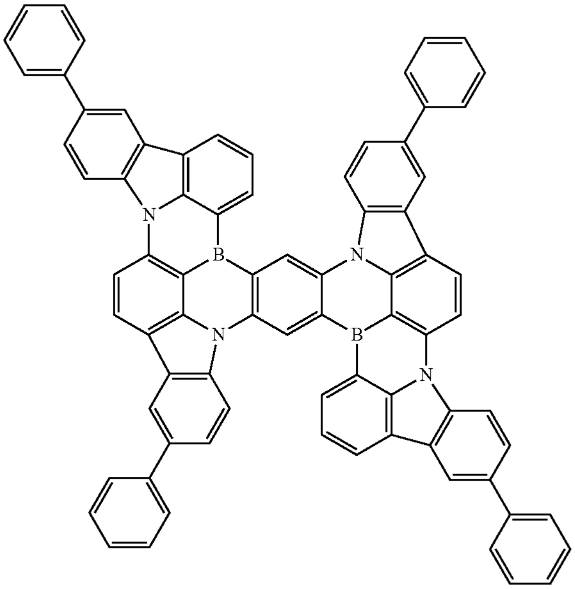
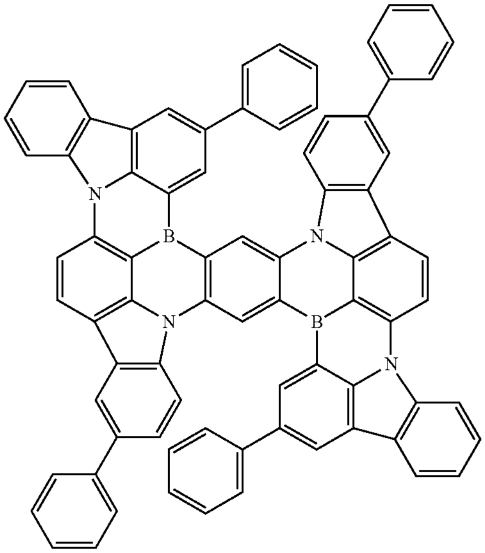
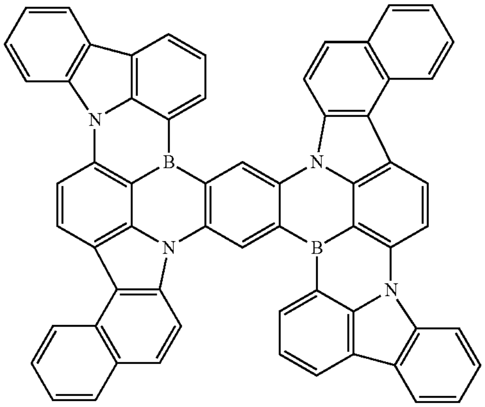
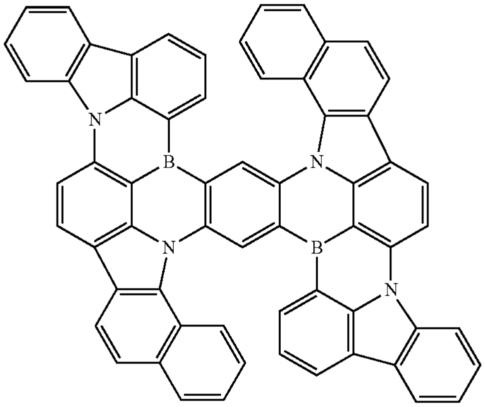

-continued
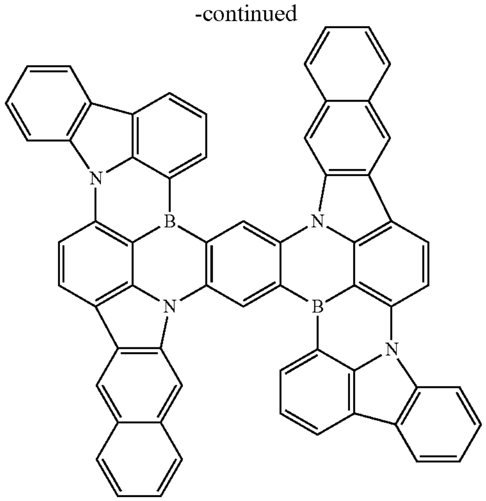
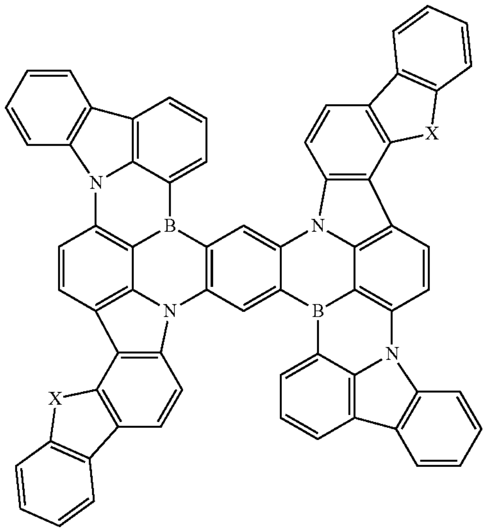
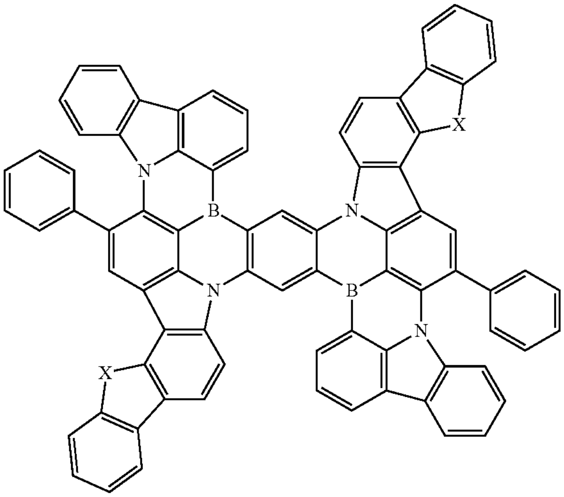
-continued
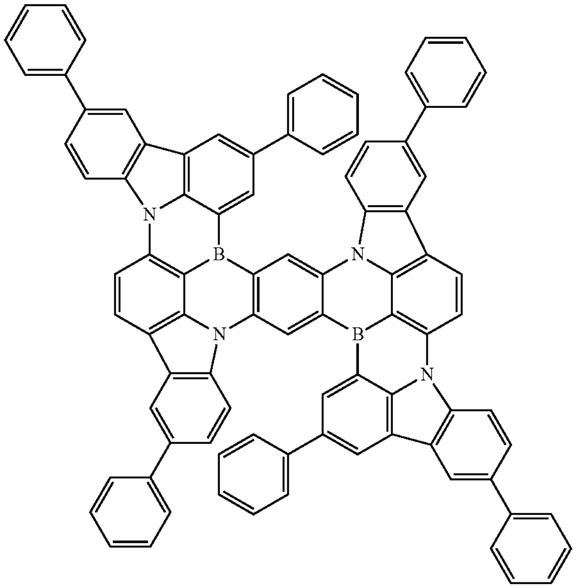
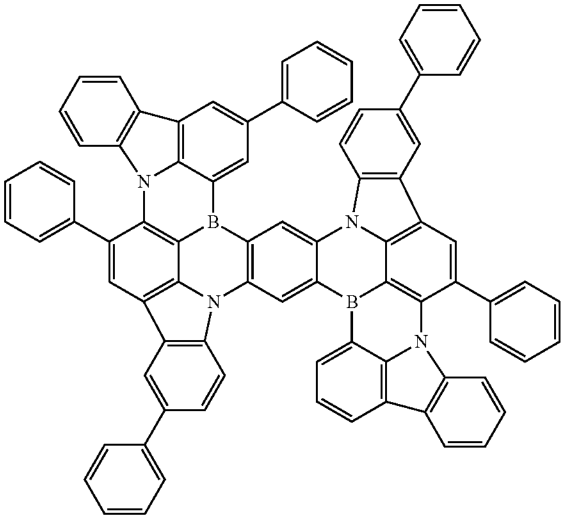
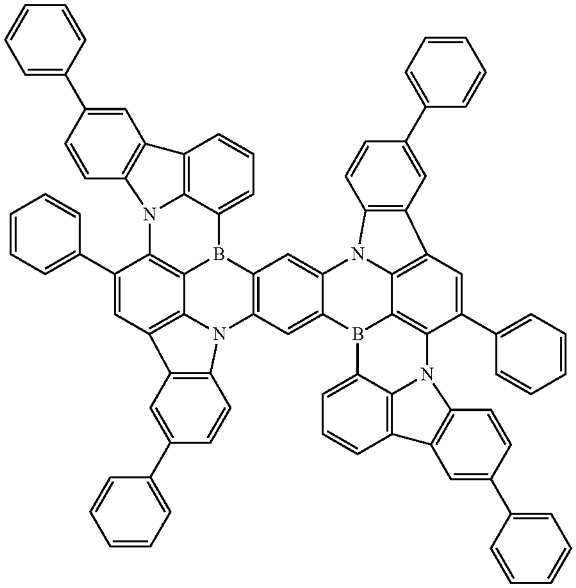

-continued

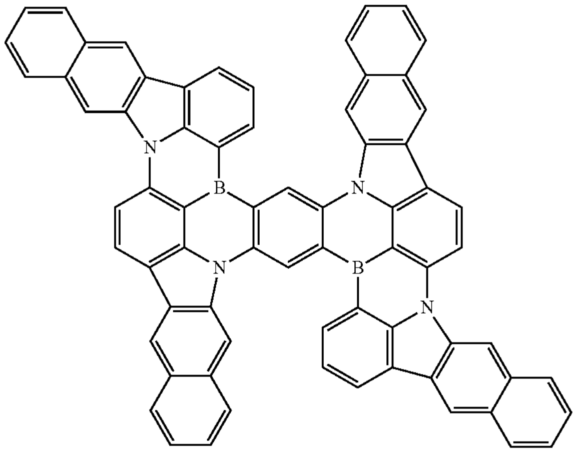

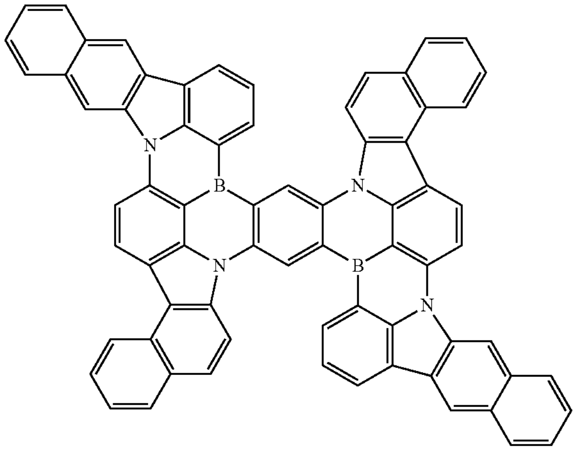

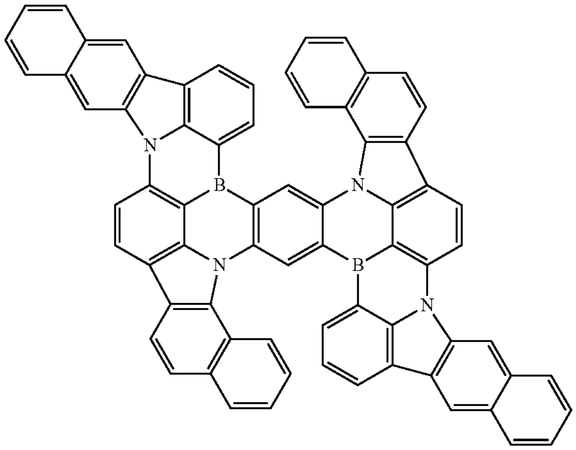

The compound represented by the formula (1) may have a skeleton having no symmetry. For example, it may be a compound having an asymmetric skeleton such as the following skeleton (11a) or the following skeleton (11b).

Skeleton (11a)

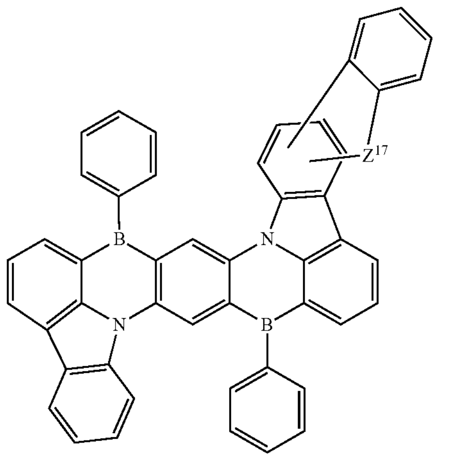

Skeleton (11b)

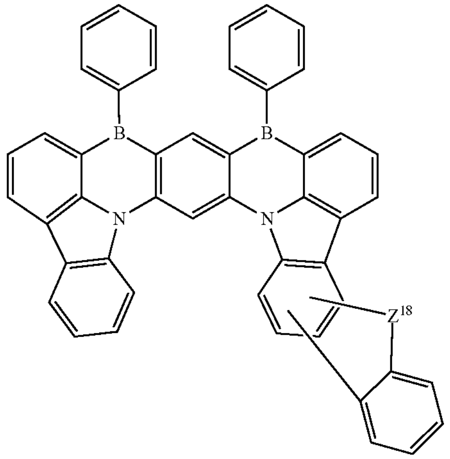

In the skeletons (11a) and (11 b), each of $Z^{17}$ and $Z^{18}$ independently represents an oxygen atom or a sulfur atom. In one aspect of the present invention, each hydrogen atom in the skeletons (11a) and (11b) is not substituted with a linking group together with an adjacent hydrogen atom to form a ring structure.

As one preferable group of compounds having the skeleton (11a), compounds represented by the following formula (11a) may be exemplified.

Formula (11a)

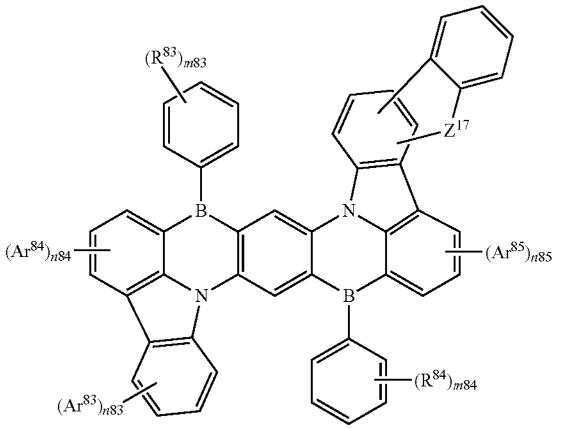

In the formula (11a), each of $Ar^{83}$ to $Ar^{85}$ independently represents a substituted or unsubstituted aryl group, a substituted or unsubstituted heteroaryl group, or a substituted or unsubstituted alkyl group, and, for example, a substituted or unsubstituted aryl group may be preferably selected. Each of $R^{83}$ and $R^{84}$ independently represents a substituted or unsubstituted alkyl group. $Z^{17}$ represents an oxygen atom or a sulfur atom. Each of m83 and m84 independently represents an integer of 0 to 5. n83 represents an integer of 0 to 4, and each of n84 and n85 independently represents an integer of 0 to 3.

For detailed descriptions and preferable ranges of $Ar^{83}$ to $Ar^{85}$, $R^{83}$, $R^{84}$, m83, m84, and n83 to n85, descriptions on $Ar^1$, $Ar^1$, $Ar^1$, $R^{41}$, $R^{42}$, m1, m2, n1, n2, and n4 in the formula (1a) may be referred to.

Hereinafter, specific examples of the compound represented by the formula (11a) will be given. Compounds of the formula (11a) that may be used in the present invention are not construed as limiting to the following specific examples. In relation to the following specific examples, it is assumed that a compound in which all X's in the molecule are oxygen atoms, and a compound in which all X's in the molecule are sulfur atoms are disclosed, respectively. A compound in which some of X's in the molecule are oxygen atoms, and the rest are sulfur atoms may also be adopted.

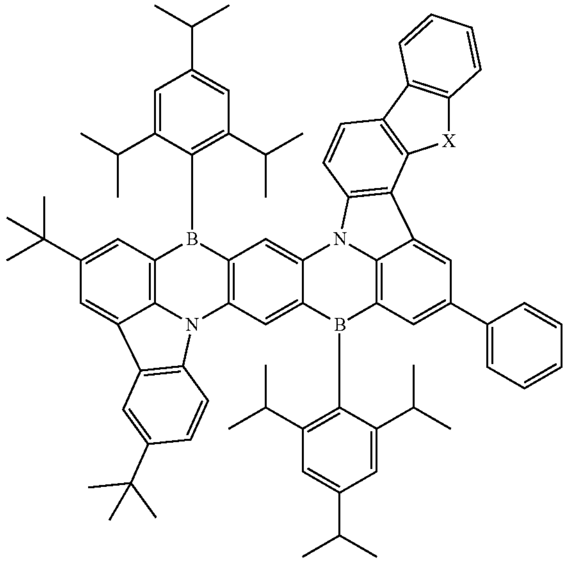

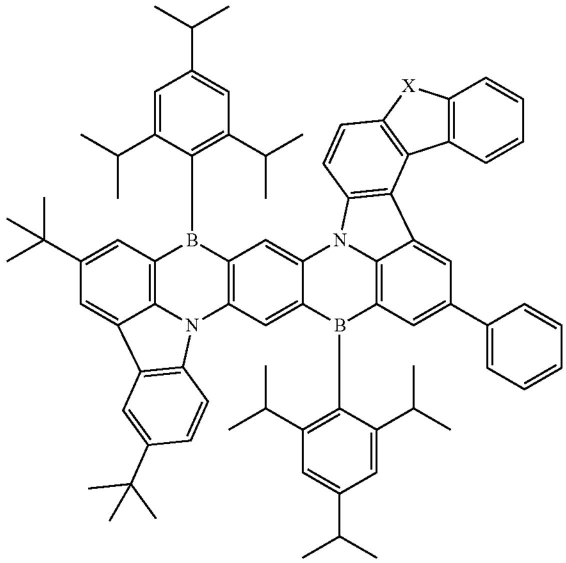

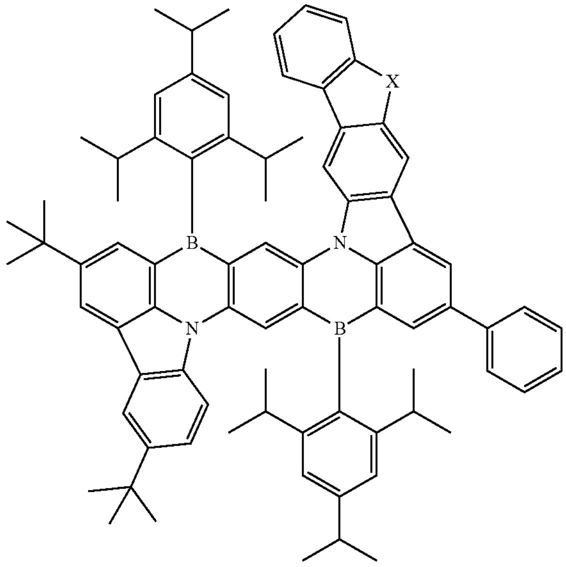

-continued
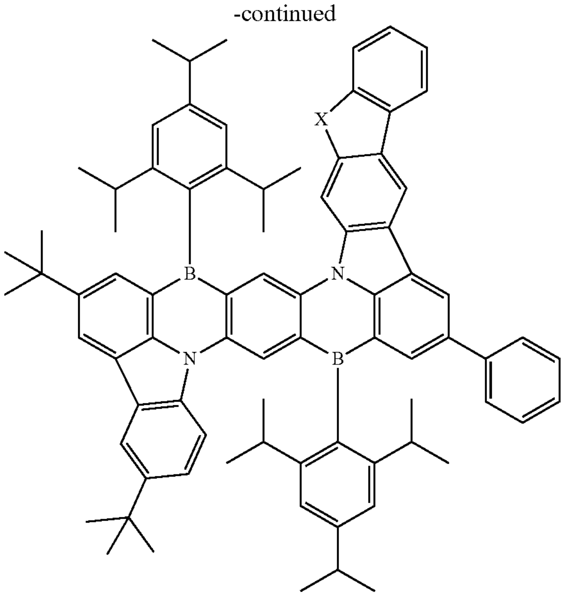
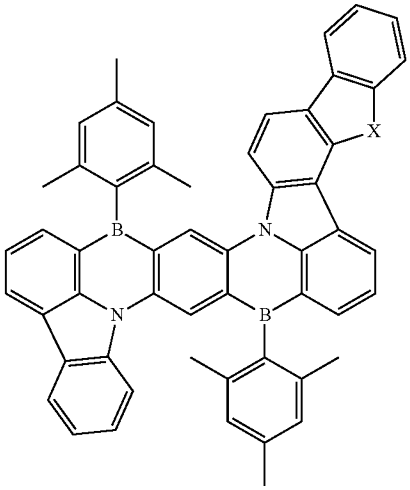
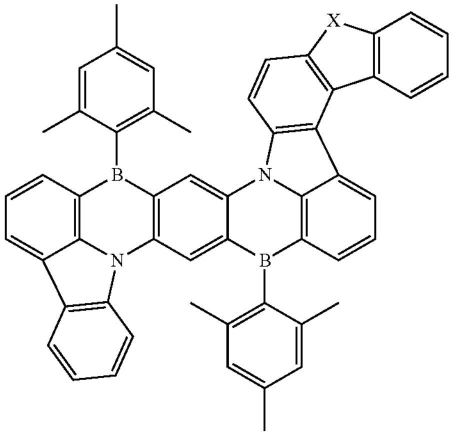
-continued
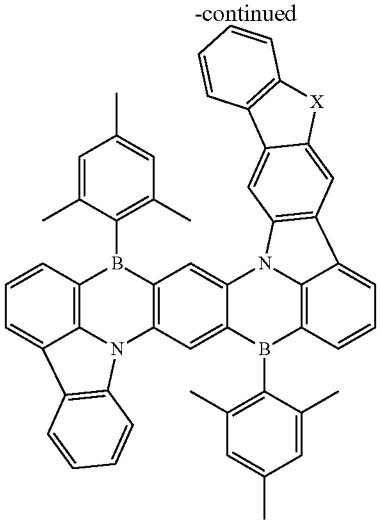
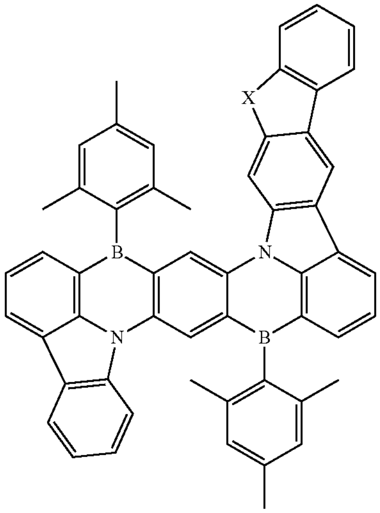
As one preferable group of compounds having the skeleton (11b), compounds represented by the following formula (11b) may be exemplified.
Formula (11b)
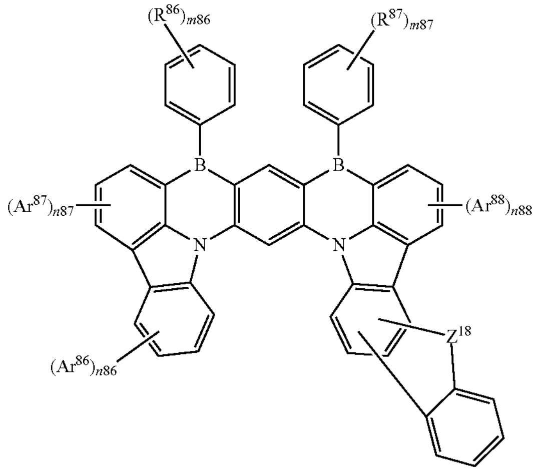

In the formula (11b), each of $Ar^{86}$ to $Ar^{88}$ independently represents a substituted or unsubstituted aryl group, a substituted or unsubstituted heteroalkyl group, or a substituted or unsubstituted alkyl group, and, for example, a substituted or unsubstituted aryl group may be preferably selected. Each of $R^{86}$ and $R^{87}$ independently represents a substituted or unsubstituted alkyl group. $Z^{18}$ represents an oxygen atom or a sulfur atom. Each of m86 and m87 independently represents an integer of 0 to 5. n86 represents an integer of 0 to 4, and each of n87 and n88 independently represents an integer of 0 to 3.

For detailed descriptions and preferable ranges of $Ar^{86}$ to $Ar^{88}$, $R^{86}$, $R^{87}$, m86, m87, and n86 to n88, descriptions on $Ar^1$, $Ar^2$, $Ar^4$, $R^{41}$, $R^{42}$, m1, m2, n1, n2, and n4 in the formula (1a) may be referred to.

Hereinafter, specific examples of the compound represented by the formula (11b) will be given. Compounds of the formula (11b) that may be used in the present invention are not construed as limiting to the following specific examples. In relation to the following specific examples, it is assumed that a compound in which all X's in the molecule are oxygen atoms, and a compound in which all X's in the molecule are sulfur atoms are disclosed, respectively. A compound in which some of X's in the molecule are oxygen atoms, and the rest are sulfur atoms can also be adopted.

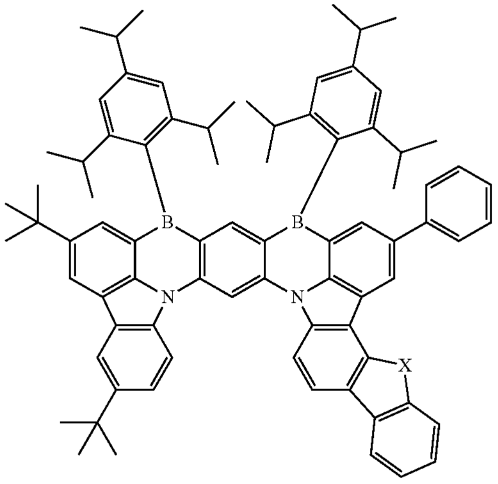

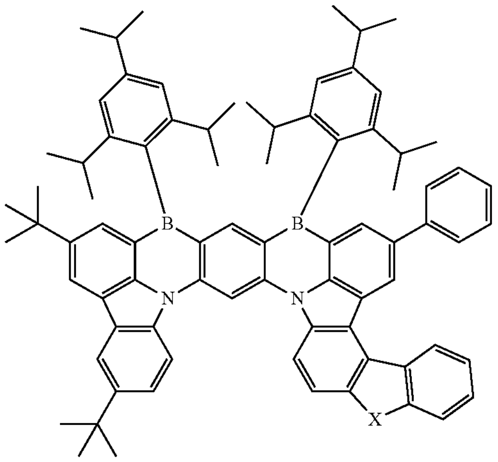

-continued

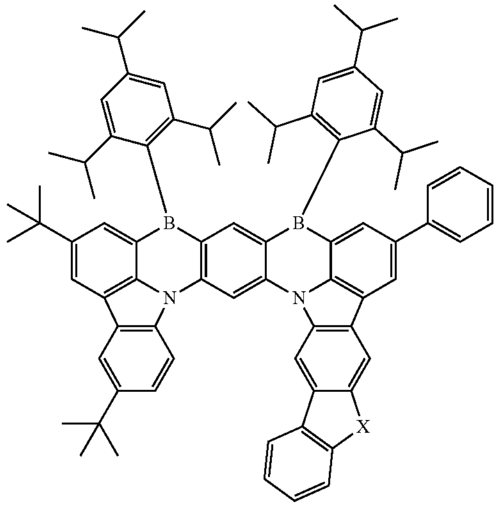

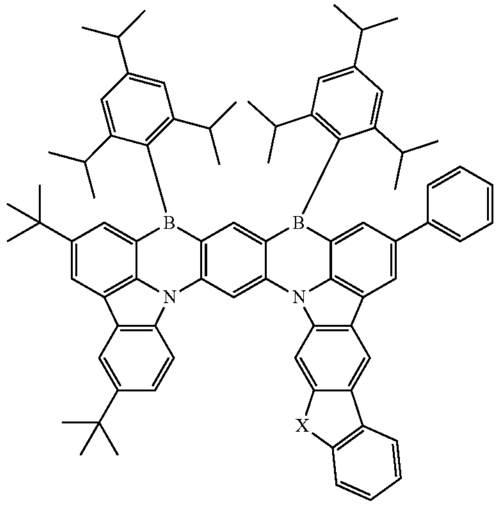

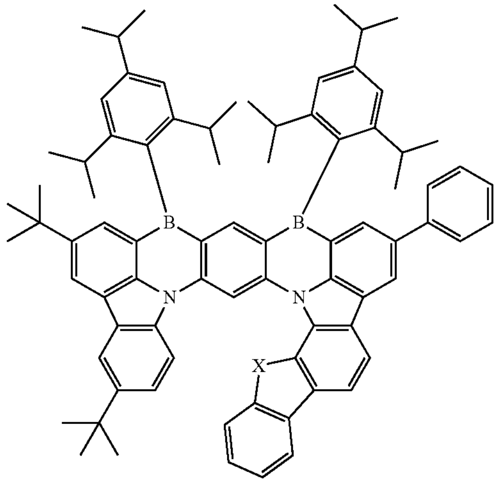

-continued

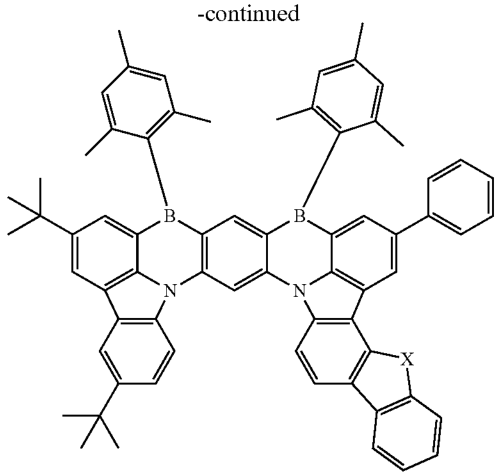

As the compound represented by the formula (1), a compound in which $R^5$ is a donor group may be preferably adopted. The compound in which $R^5$ is a donor group has a high molar coefficient extinction, and thus tends to have a high luminous efficiency. For example, it exhibits excellent luminescence characteristics as compared to a compound in which $R^3$ is a donor group. In a preferred aspect of the present invention, $R^3$ is not a donor group. In a preferred aspect of the present invention, among $R^1$ to $R^7$, only $R^5$ is a donor group, or none of them is a donor group (in particular, a donor group having a σp value of −0.2 or less). The donor group is a group having a negative Hammett σp value. The σp value of the donor group for $R^5$ is preferably −0.2 or less, and may be, for example, −0.4 or less, or may be, for example, −0.6 or less. As a preferable donor group, a substituted amino group may be mentioned, and a substituted or unsubstituted diarylamino group is preferable. The aryl group may be a monocycle, or may be a condensed ring in which two or more rings are condensed. In the case of the condensed ring, the number of rings after the condensation is preferably two to six, and, for example, may be selected from two to four, or may be two. Two aryl groups constituting the diarylamino group may be the same or different. Further, the two aryl groups may be linked by a single bond or a linking group. As the substituted or unsubstituted diarylamino group, a substituted or unsubstituted diphenylamino group is preferable. A substituted or unsubstituted carbazole-9-yl group in which two phenyl groups are bonded by a single bond may be adopted, or a substituted or unsubstituted diphenylamino group in which two phenyl groups are not bonded by a single bond may be adopted. In the present invention, when any of $R^1$ to $R^7$ in the formula (1) is a substituted amino group, at least $R^5$ is a substituted amino group, preferably only $R^5$ is a substituted amino group. In one aspect of the present invention, $R^3$ is not a substituted amino group.

When $R^5$ is a donor group, and $X^1$ is a nitrogen atom, it is preferable that $R^{16}$ or $R^{19}$ is a donor group, and it is more preferable that $R^{19}$ is a donor group. Here, all of the rest of $R^1$ to $R^{26}$ may be, for example, hydrogen atoms or deuterium atoms. For example, at least one of $R^3$, $R^6$, $R^{15}$, and $R^{20}$ may be a substituent (preferably, a substituted or unsubstituted alkyl group, or a substituted or unsubstituted aryl group) and the others may be hydrogen atoms or deuterium atoms.

When $R^5$ is a donor group, and $X^1$ is a boron atom, it is preferable that $R^{20}$ or $R^{23}$ is a donor group, and it is more preferable that $R^{20}$ is a donor group. Here, all of the rest of $R^1$ to $R^{26}$ may be, for example, hydrogen atoms or deuterium atoms. For example, at least one of $R^3$, $R^6$, $R^{19}$, and $R^{24}$ may be a substituent (preferably, a substituted or unsubstituted alkyl group, or a substituted or unsubstituted aryl group) and the others may be hydrogen atoms or deuterium atoms.

As one preferable group of compounds in which $R^5$ is a donor group, a compound represented by the following formula (12a) and a compound represented by the following formula (12b) may be exemplified.

Formula (12a)

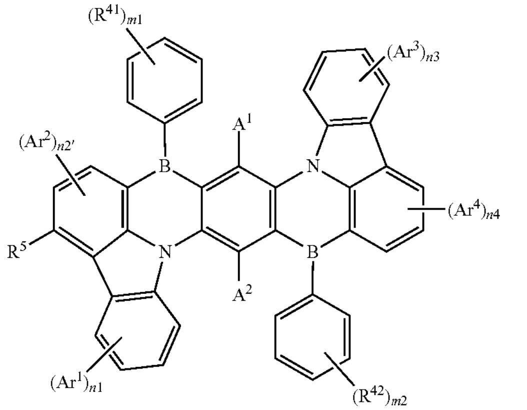

Formula (12b)

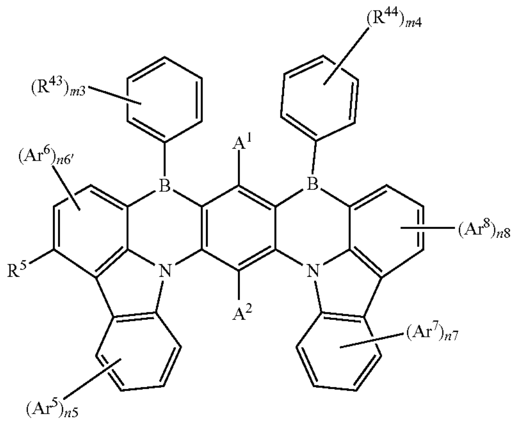

In the formula (12a) and the formula (12b), each of $Ar^1$ to $Ar^8$ independently represents a substituted or unsubstituted aryl group, a substituted or unsubstituted heteroaryl group, or a substituted or unsubstituted alkyl group. For example, a substituted or unsubstituted alkyl group may be preferably selected, or a substituted or unsubstituted aryl group may be preferably selected. $R^5$ represents a donor group. Each of $R^{41}$ to $R^{44}$ independently represents a substituted or unsubstituted alkyl group. Each of m1 to m4 independently represents an integer of 0 to 5. Each of n1, n3, n5, and n7 independently represents an integer of 0 to 4, n4 and n8 represent integers of 0 to 3, and n2' and n6' represent integers of 0 to 2. Each of $A^1$ and $A^2$ independently represents a hydrogen atom, a deuterium atom, or a substituent. In relation to details of $Ar^1$ to $Ar^8$, $R^{41}$ to $R^{44}$, m1 to m4, n1, n3 to n5, n7, n8, $A^1$, and $A^2$, the corresponding descriptions for the formula (1a) and the formula (1b) may be referred to. Meanwhile. $Ar^1$'s bonded to adjacent carbon atoms. $Ar^3$'s is bonded to adjacent carbon atoms, $Ar^5$'s bonded to adjacent carbon atoms, and $Ar^7$'s bonded to adjacent carbon atoms may be bonded to each other to form ring structures. Preferably, benzofuran (condensed as a furan ring) or benzothiophene (condensed as a thiophene ring) may be formed.

Hereinafter, specific examples of the compounds represented by the formula (12a) and the formula (12b) will be given. Meanwhile, the compounds of the formula (12a) and the formula (12b), which may be used in the present invention, are not construed as limiting to the following specific examples. In the following specific examples, R, Ar, and X in the formulas F1 to F56 are specified in the table so that the structure of each compound is defined. R is selected from A to D described below, Ar is selected from a to d described below; and X is selected from a to 7. For example, the No. 1 compound in the table is a compound of the formula F1, which has a structure in which R is A, and Ar is a.

F1

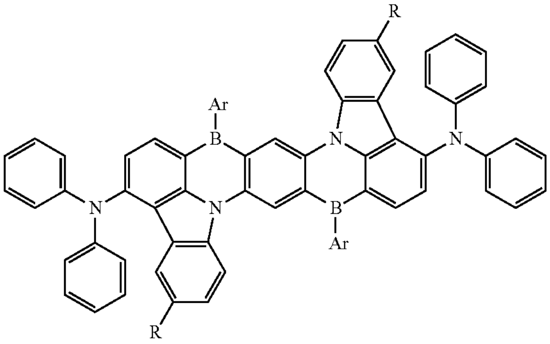

F2

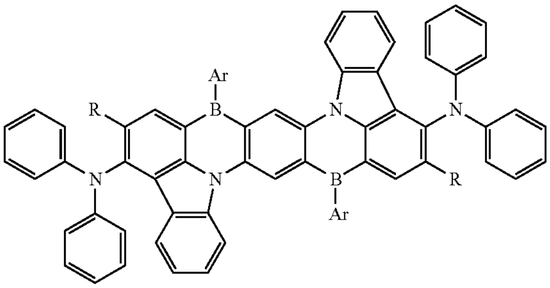

F3

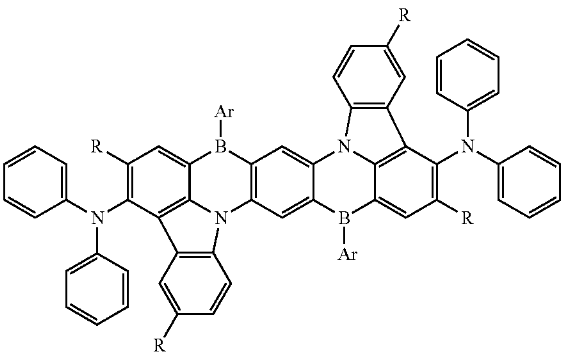

-continued

F4

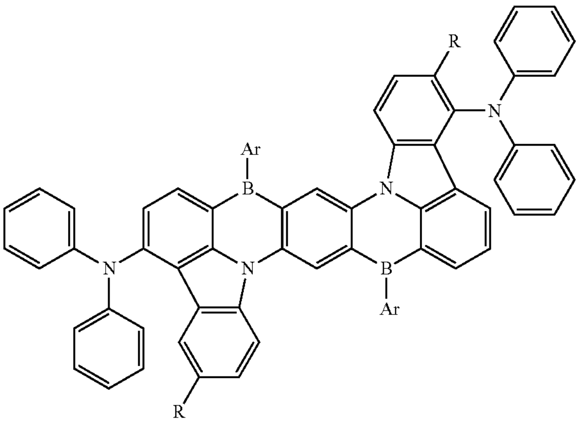

F5

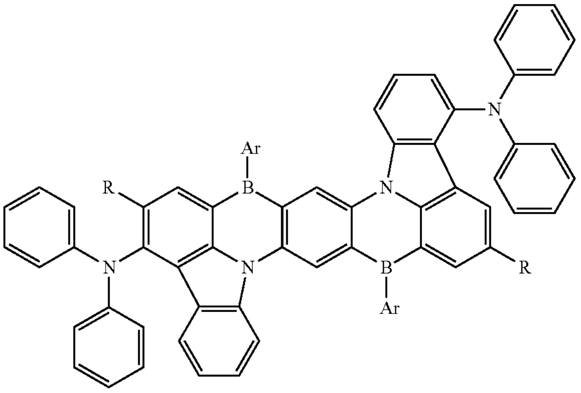

F6

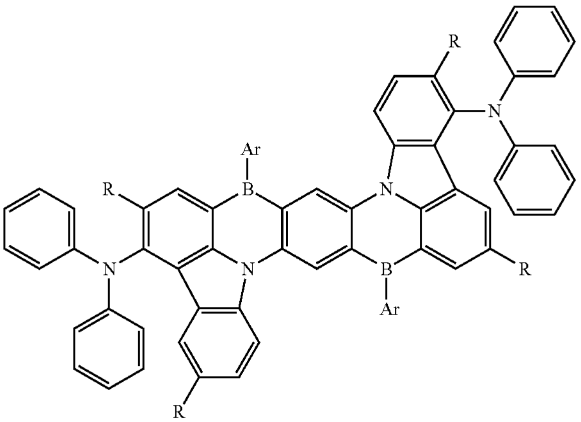

-continued
F7
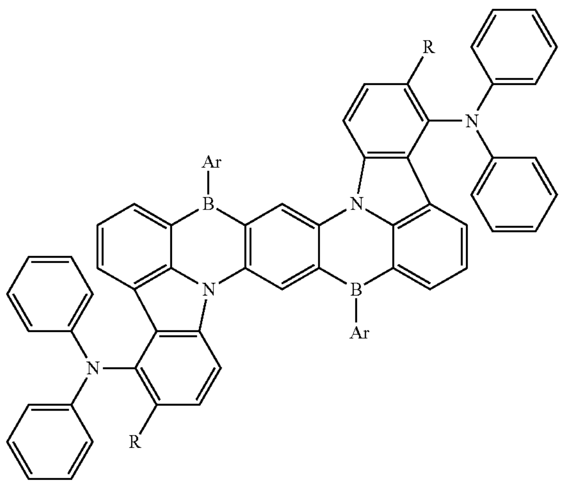
F8
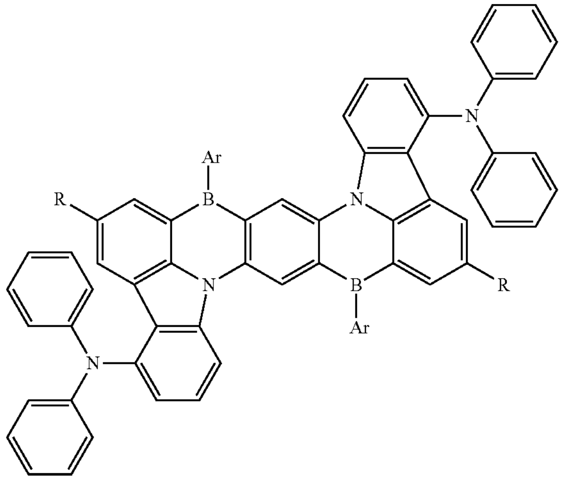
F9
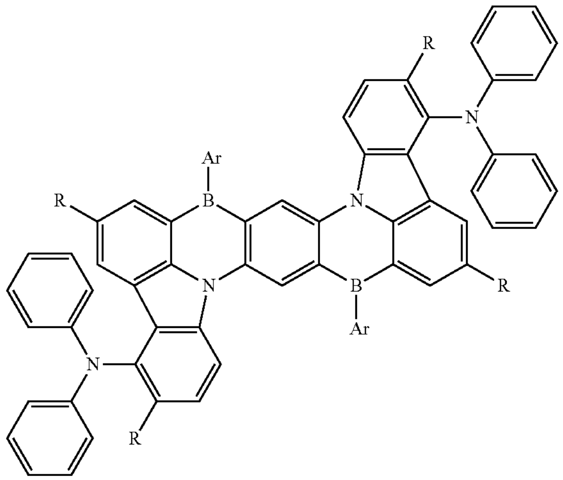
-continued
F10
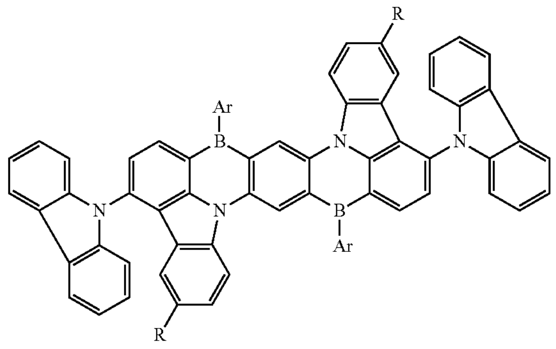
F11
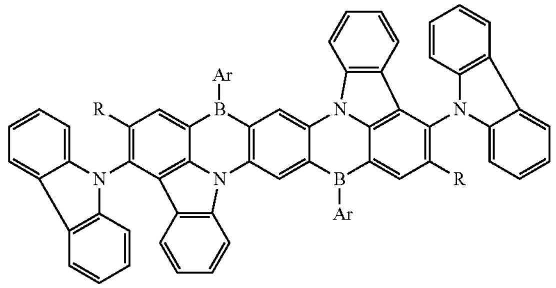
F12
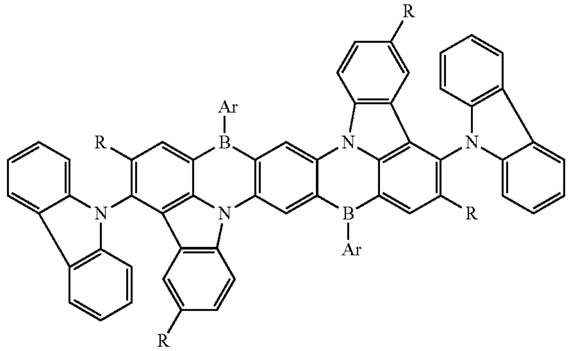
F13
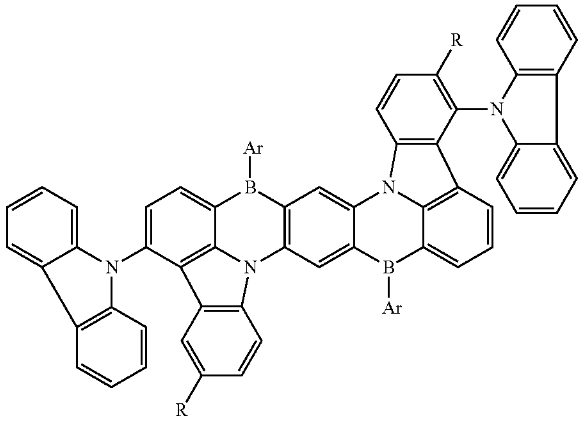

-continued
F14
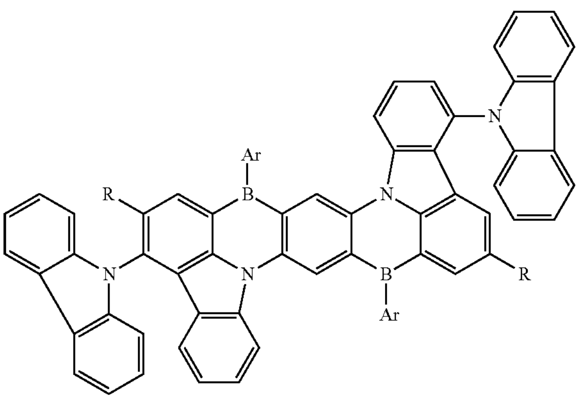
F15
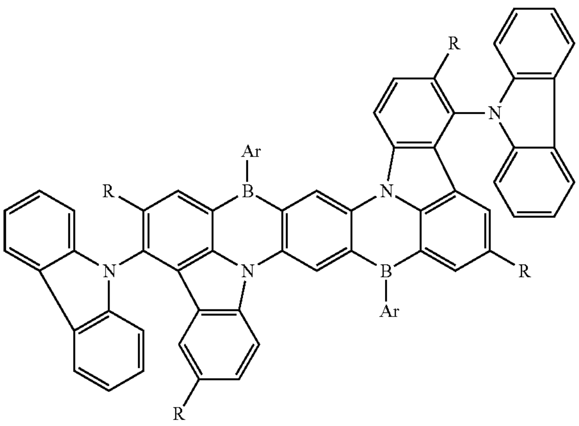
F16
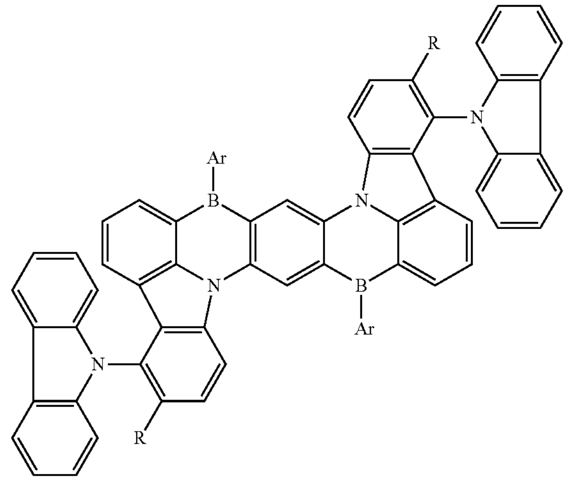
-continued
F17
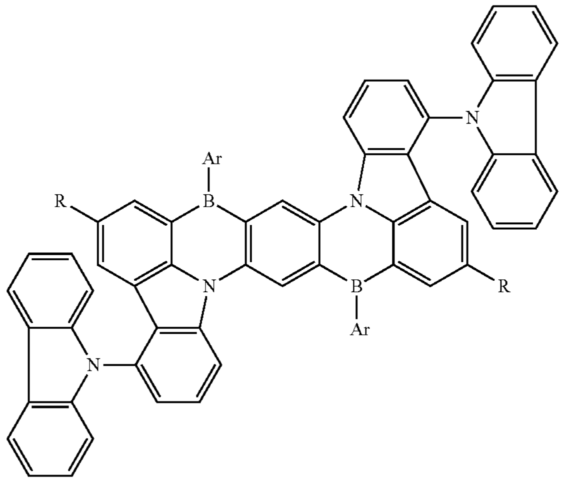
F18
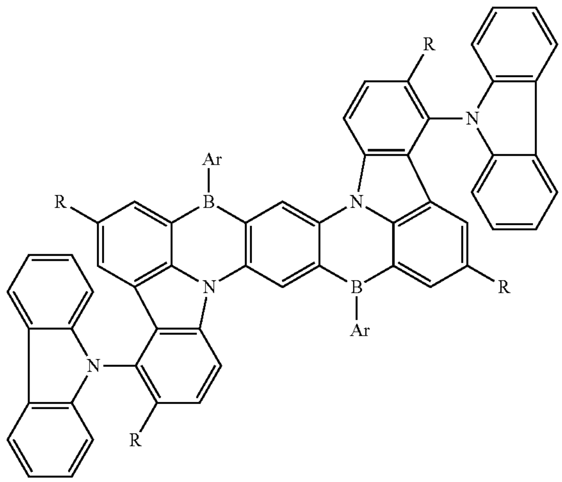
F19
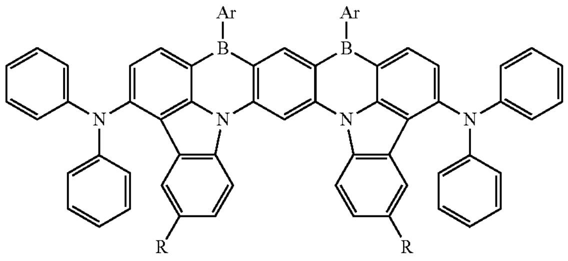
F20
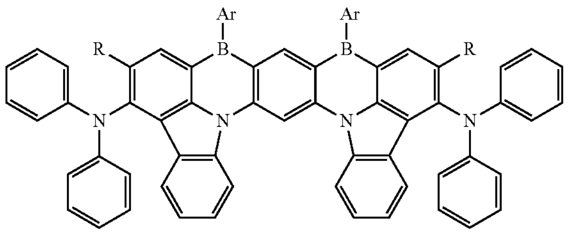

-continued
F21
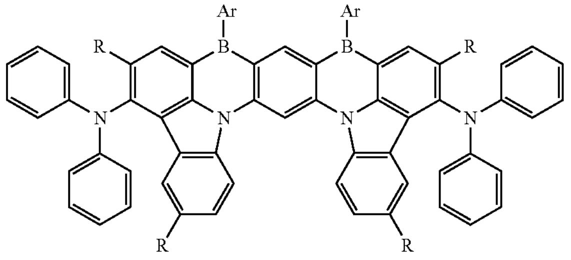
F22
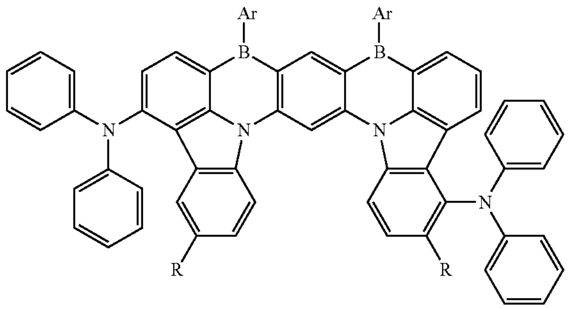
F23
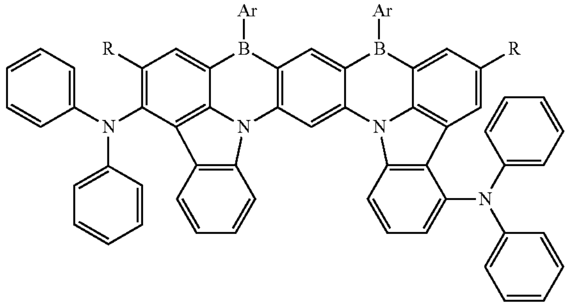
F24
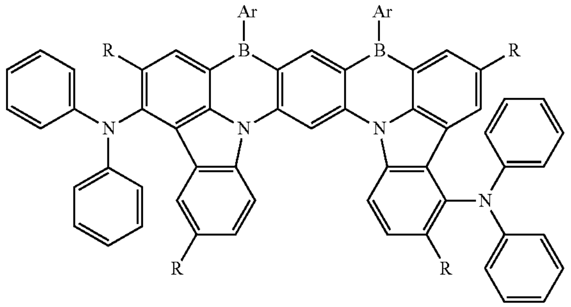
F25
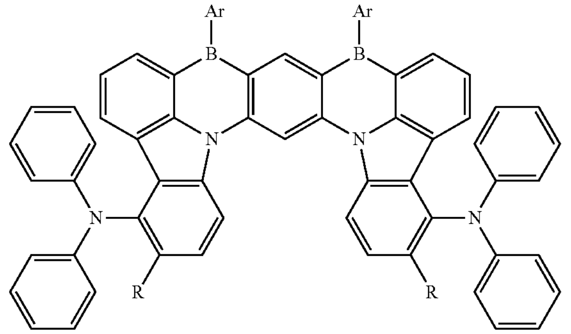
-continued
F26
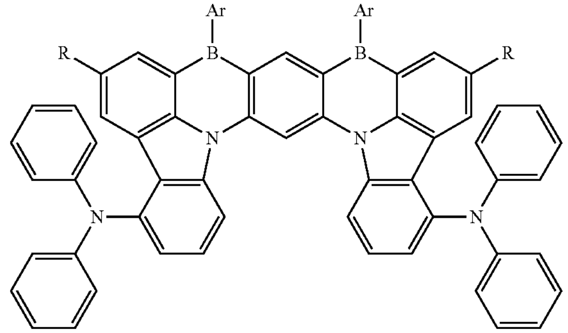
F27
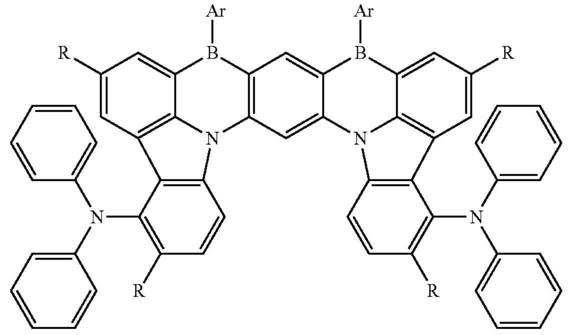
F28
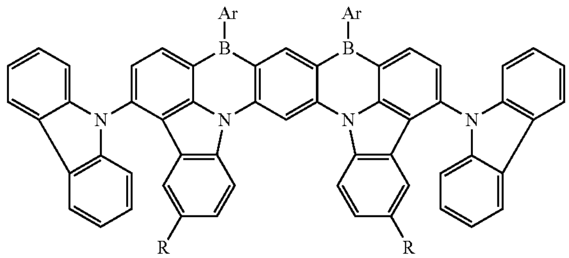
F29
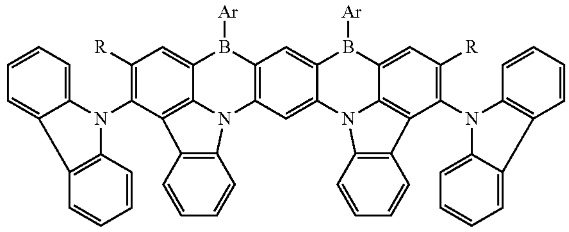
F30
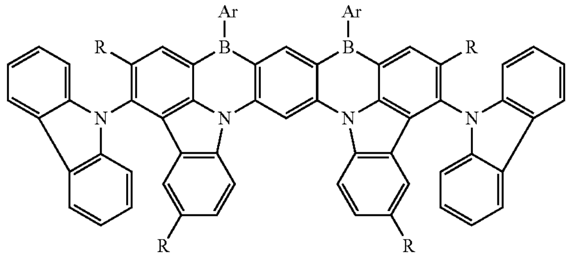

-continued
F31
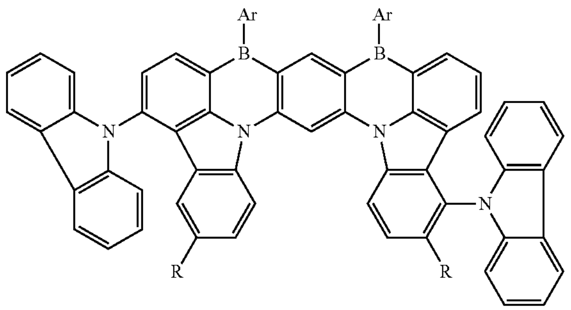
F32
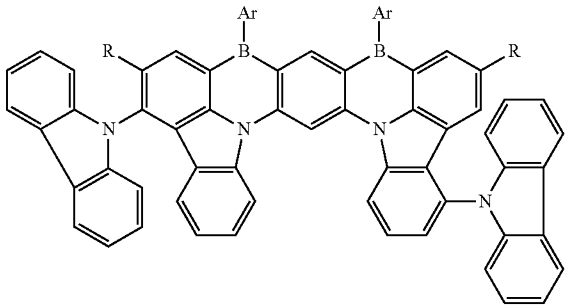
F33
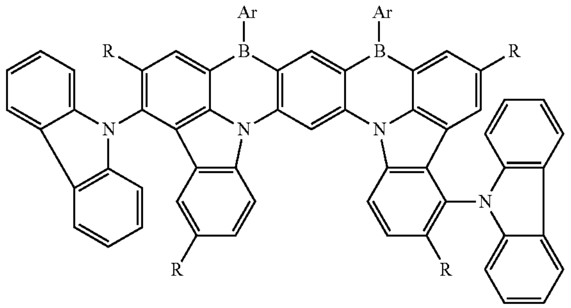
F34
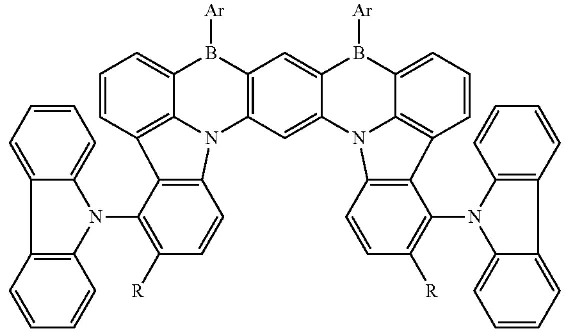
-continued
F35
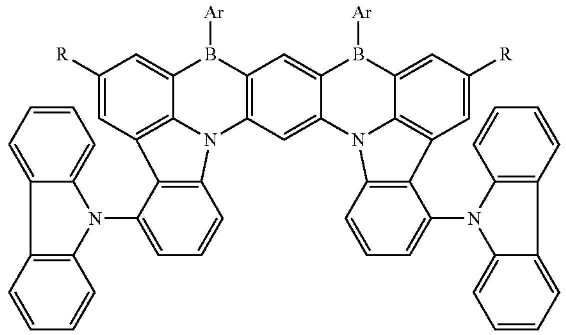
F36
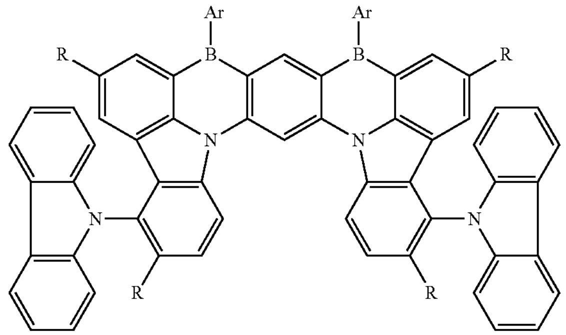
F37
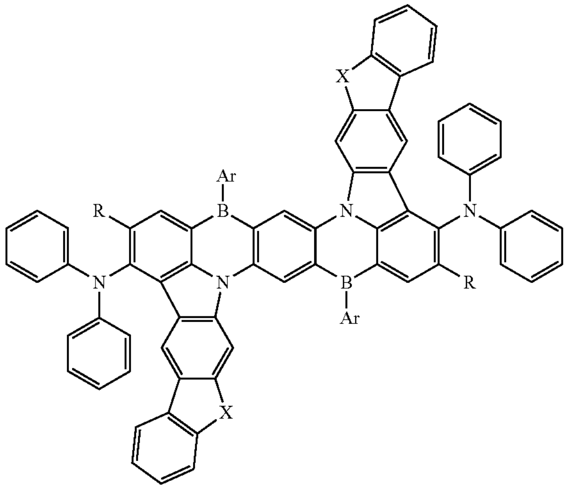

-continued
F38
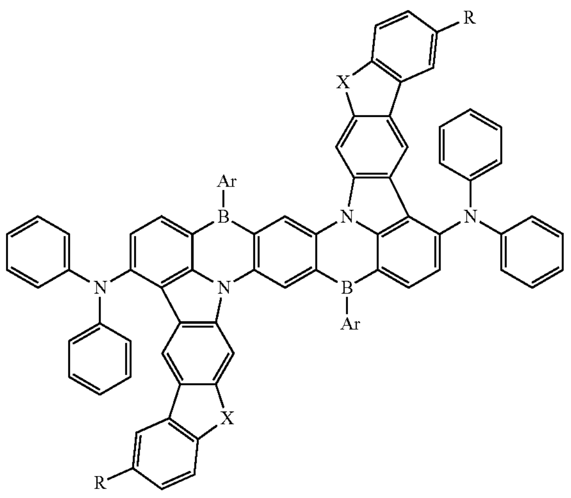
F39
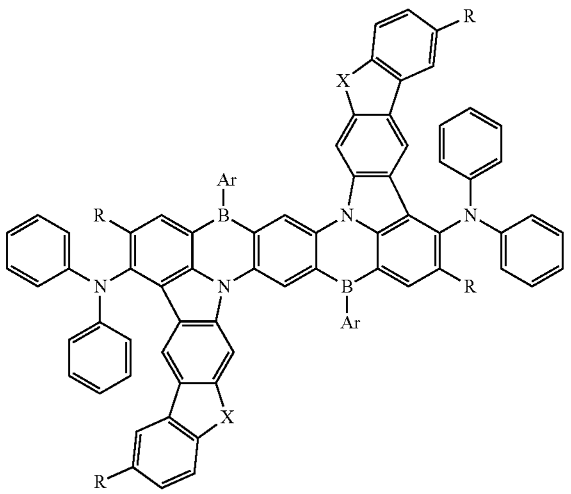
F40
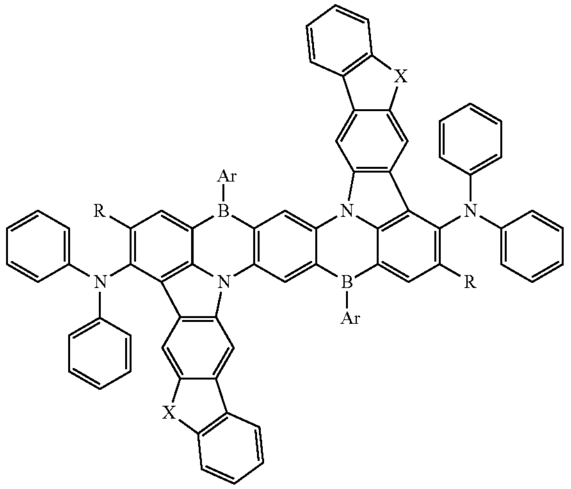
-continued
F41
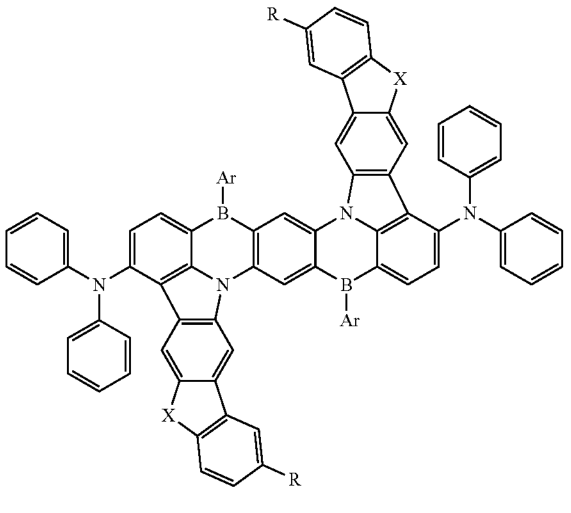
F42
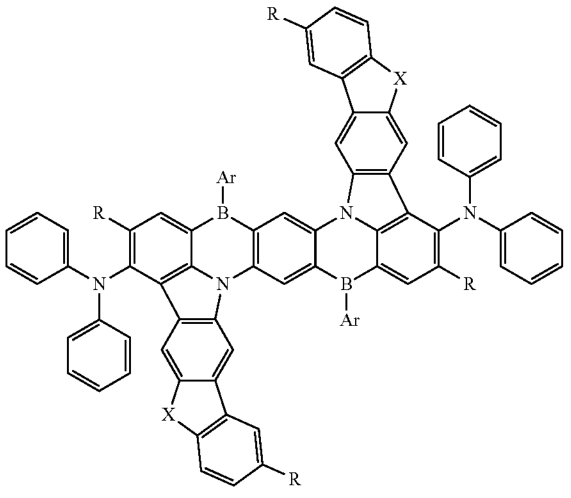
F43
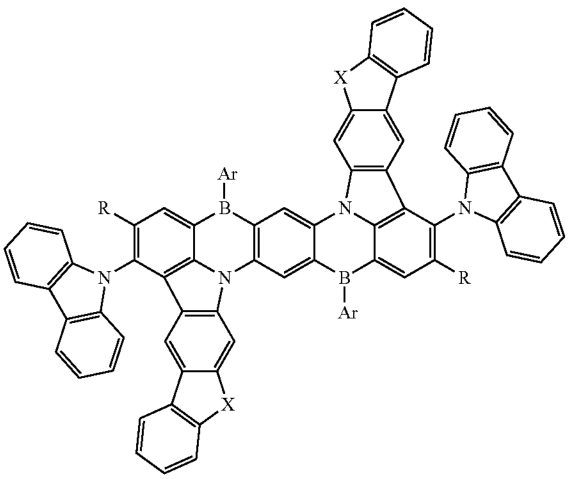

-continued
F44
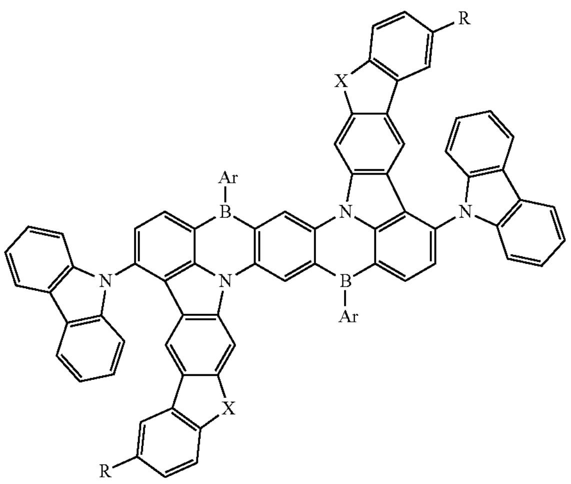
F45
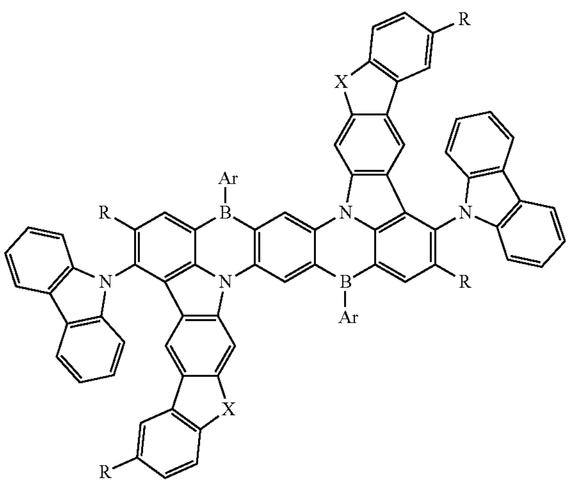
F46
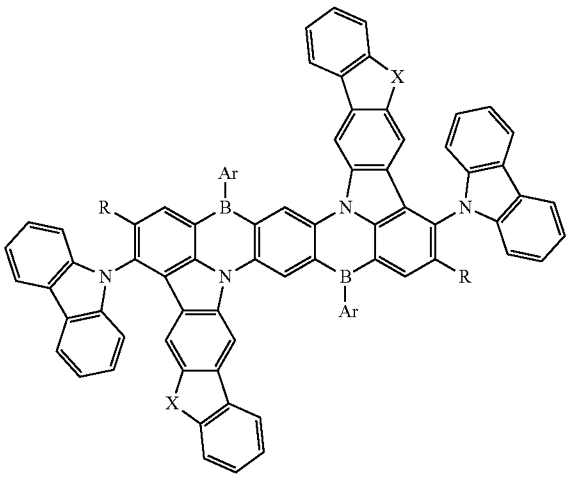
-continued
F47
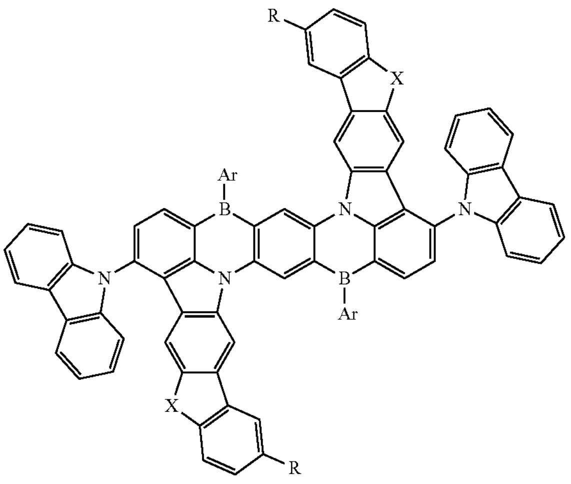
F48
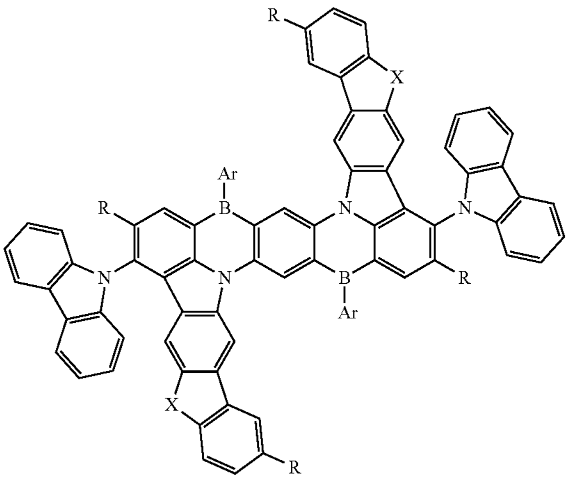
F49
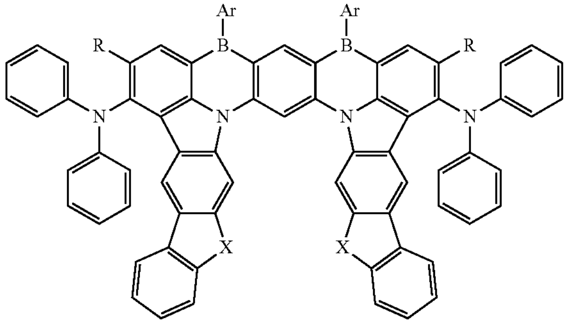

-continued
F50
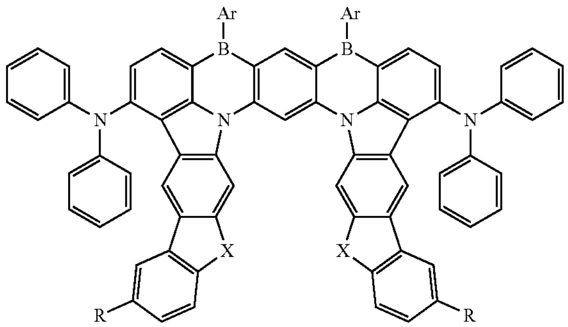
F51
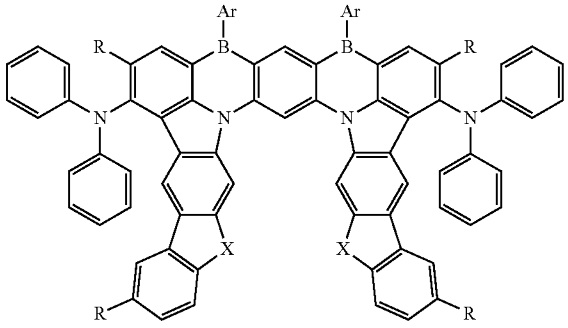
F52
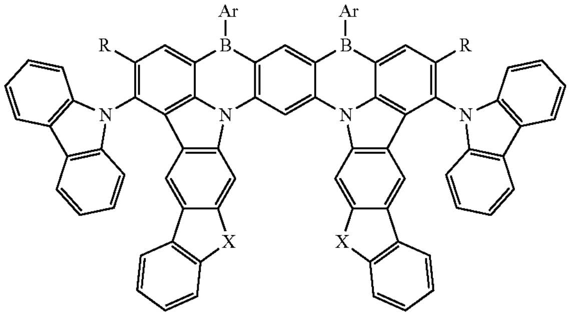
F53
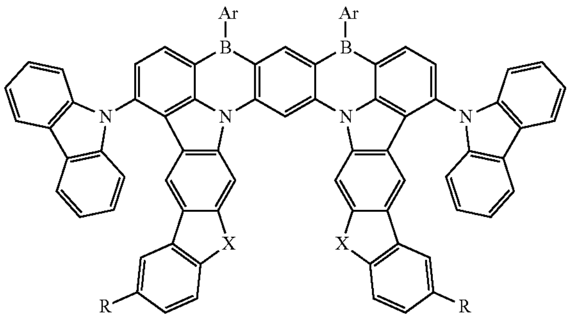
-continued
F54
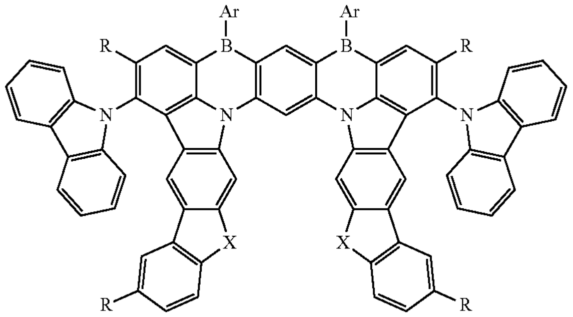
F55
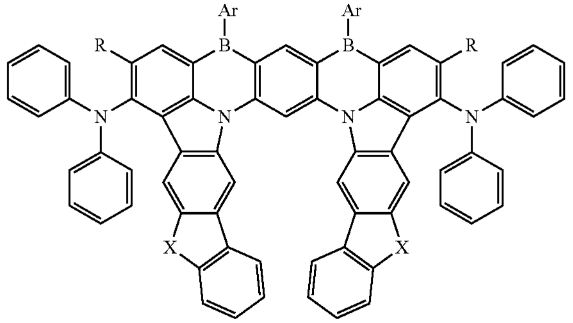
F56
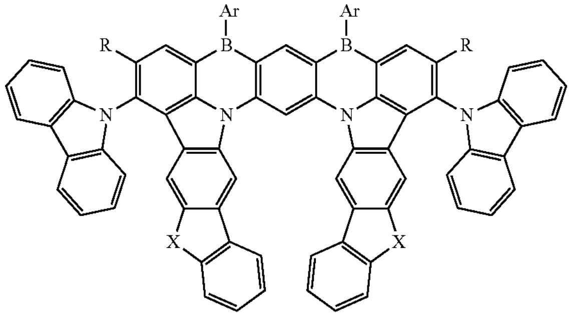
TABLE 1
| No. | F | R | Ar |
|---|---|---|---|
| 1 | F1 | A | a |
| 2 | F1 | A | b |
| 3 | F1 | A | c |
| 4 | F1 | A | d |
| 5 | F1 | B | a |
| 6 | F1 | B | b |
| 7 | F1 | B | c |
| 8 | F1 | B | d |
| 9 | Fl | C | a |
| 10 | F1 | C | b |
| 11 | F1 | C | c |
| 12 | F1 | C | d |
| 13 | F1 | D | a |
| 14 | F1 | D | b |
| 15 | F1 | D | c |
| 16 | F1 | D | d |
| 17 | F2 | A | a |
| 18 | F2 | A | b |
| 19 | F2 | A | c |
| 20 | F2 | A | d |
| 21 | F2 | B | a |
| 22 | F2 | B | b |
| 23 | F2 | B | c |

TABLE 1-continued

| | | | |
|---|---|---|---|
| 24 | F2 | B | d |
| 25 | F2 | C | a |
| 26 | F2 | C | b |
| 27 | F2 | C | c |
| 28 | F2 | C | d |
| 29 | F3 | A | a |
| 30 | F3 | A | b |
| 31 | F3 | A | c |
| 32 | F3 | A | d |
| 33 | F3 | B | a |
| 34 | F3 | B | b |
| 35 | F3 | B | c |
| 36 | F3 | B | d |
| 37 | F3 | C | a |
| 38 | F3 | C | b |
| 39 | F3 | C | c |
| 40 | F3 | C | d |
| 41 | F4 | A | a |
| 42 | F4 | A | b |
| 43 | F4 | A | c |
| 44 | F4 | A | d |
| 45 | F4 | B | a |
| 46 | F4 | B | b |
| 47 | F4 | B | c |
| 48 | F4 | B | d |
| 48 | F4 | C | a |
| 50 | F4 | C | b |
| 51 | F4 | C | c |
| 52 | F4 | C | d |
| 53 | F4 | D | a |
| 54 | F4 | D | b |
| 55 | F4 | D | c |
| 56 | F4 | D | d |
| 57 | F5 | A | a |
| 58 | F5 | A | b |
| 59 | F5 | A | c |
| 60 | F5 | A | d |
| 61 | F5 | B | a |
| 62 | F5 | B | b |
| 63 | F5 | B | c |
| 64 | F5 | B | d |
| 65 | F5 | C | a |
| 66 | F5 | C | b |
| 67 | F5 | C | c |
| 68 | F5 | C | d |
| 69 | F6 | A | a |
| 70 | F6 | A | b |
| 71 | F6 | A | c |
| 72 | F6 | A | d |
| 73 | F6 | B | a |
| 74 | F6 | B | b |
| 75 | F6 | B | c |
| 76 | F6 | B | d |
| 77 | F6 | C | a |
| 78 | F6 | C | b |
| 79 | F6 | C | c |
| 80 | F6 | C | d |
| 81 | F7 | A | a |
| 82 | F7 | A | b |
| 83 | F7 | A | c |
| 84 | F7 | A | d |
| 85 | F7 | B | a |
| 86 | F7 | B | b |
| 87 | F7 | B | c |
| 88 | F7 | B | d |
| 89 | F7 | C | a |
| 90 | F7 | C | b |
| 91 | F7 | C | c |
| 92 | F7 | C | d |
| 93 | F7 | D | a |
| 94 | F7 | D | b |
| 95 | F7 | D | c |
| 96 | F7 | D | d |
| 97 | F8 | A | a |
| 98 | F8 | A | b |
| 99 | F8 | A | c |
| 100 | F8 | A | d |
| 101 | F8 | B | a |
| 102 | F8 | B | b |
| 103 | F8 | B | c |
| 104 | F8 | B | d |
| 105 | F8 | C | a |
| 106 | F8 | C | b |
| 107 | F8 | C | c |
| 108 | F8 | C | d |
| 109 | F9 | A | a |
| 110 | F9 | A | b |
| 111 | F9 | A | c |
| 112 | F9 | A | d |
| 113 | F9 | B | a |
| 114 | F9 | B | b |
| 115 | F9 | B | c |
| 116 | F9 | B | d |
| 117 | F9 | C | a |
| 118 | F9 | C | b |
| 119 | F9 | C | c |
| 120 | F9 | C | d |
| 121 | F10 | A | a |
| 122 | F10 | A | b |
| 123 | F10 | A | c |
| 124 | F10 | A | d |
| 125 | F10 | B | a |
| 126 | F10 | B | b |
| 127 | F10 | B | c |
| 128 | F10 | B | d |
| 129 | F10 | C | a |
| 130 | F10 | C | b |
| 131 | F10 | C | c |
| 132 | F10 | C | d |
| 133 | F10 | D | a |
| 134 | F10 | D | b |
| 135 | F10 | D | c |
| 136 | F10 | D | d |
| 137 | F11 | A | a |
| 138 | F11 | A | b |
| 139 | F11 | A | c |
| 140 | F11 | A | d |
| 141 | F11 | B | a |
| 142 | F11 | B | b |
| 143 | F11 | B | c |
| 144 | F11 | B | d |
| 145 | F11 | C | a |
| 146 | F11 | C | b |
| 147 | F11 | C | c |
| 148 | F11 | C | d |
| 149 | F12 | A | a |
| 150 | F12 | A | b |
| 151 | F12 | A | c |
| 152 | F12 | A | d |
| 153 | F12 | B | a |
| 154 | F12 | B | b |
| 155 | F12 | B | c |
| 156 | F12 | B | d |
| 157 | F12 | C | a |
| 158 | F12 | C | b |
| 159 | F12 | C | c |
| 160 | F12 | C | d |
| 161 | F13 | A | a |
| 162 | F13 | A | b |
| 163 | F13 | A | c |
| 164 | F13 | A | d |
| 165 | F13 | B | a |
| 166 | F13 | B | b |
| 167 | F13 | B | c |
| 168 | F13 | B | d |
| 169 | F13 | C | a |
| 170 | F13 | C | b |
| 171 | F13 | C | c |
| 172 | F13 | C | d |
| 173 | F13 | D | a |
| 174 | F13 | D | b |
| 175 | F13 | D | c |
| 176 | F13 | D | d |
| 177 | F14 | A | a |
| 178 | F14 | A | b |
| 179 | F14 | A | c |
| 180 | F14 | A | d |
| 181 | F14 | B | a |
| 162 | F14 | B | b |
| 183 | F14 | B | c |

TABLE 1-continued

| | | | |
|---|---|---|---|
| 184 | F14 | B | d |
| 185 | F14 | C | a |
| 186 | F14 | C | b |
| 187 | F14 | C | c |
| 188 | F14 | C | d |
| 189 | F15 | A | a |
| 190 | F15 | A | b |
| 191 | F15 | A | c |
| 192 | F15 | A | d |
| 193 | F15 | B | a |
| 194 | F15 | B | b |
| 195 | F15 | B | c |
| 196 | F15 | B | d |
| 197 | F15 | C | a |
| 198 | F15 | C | b |
| 199 | F15 | C | c |
| 200 | F15 | C | d |
| 201 | F16 | A | a |
| 202 | F16 | A | b |
| 203 | F16 | A | c |
| 204 | F16 | A | d |
| 205 | F16 | B | a |
| 206 | F16 | B | b |
| 207 | F16 | B | c |
| 208 | F16 | B | d |
| 209 | F16 | C | a |
| 210 | F16 | C | b |
| 211 | F16 | C | c |
| 212 | F16 | C | d |
| 213 | F16 | D | a |
| 214 | F16 | D | b |
| 215 | F16 | D | c |
| 216 | F16 | D | d |
| 217 | F17 | A | a |
| 218 | F17 | A | b |
| 219 | F17 | A | c |
| 220 | F17 | A | d |
| 221 | F17 | B | a |
| 222 | F17 | B | b |
| 223 | F17 | B | c |
| 224 | F17 | B | d |
| 225 | F17 | C | a |
| 226 | F17 | C | b |
| 227 | F17 | C | c |
| 228 | F17 | C | d |
| 229 | F18 | A | a |
| 230 | F18 | A | b |
| 231 | F18 | A | c |
| 232 | F18 | A | d |
| 233 | F18 | B | a |
| 234 | F18 | B | b |
| 235 | F18 | B | c |
| 236 | F18 | B | d |
| 237 | F18 | C | a |
| 238 | F18 | C | b |
| 239 | F18 | C | c |
| 240 | F18 | C | d |
| 241 | F19 | A | a |
| 242 | F19 | A | b |
| 243 | F19 | A | c |
| 244 | F19 | A | d |
| 245 | F19 | B | a |
| 246 | F19 | B | b |
| 247 | F19 | B | c |
| 248 | F19 | B | d |
| 249 | F19 | C | a |
| 250 | F19 | C | b |
| 251 | F19 | C | c |
| 252 | F19 | C | d |
| 253 | F19 | D | a |
| 254 | F19 | D | b |
| 255 | F19 | D | c |
| 256 | F19 | D | d |
| 257 | F20 | A | a |
| 258 | F20 | A | b |
| 259 | F20 | A | c |
| 260 | F20 | A | d |
| 261 | F20 | B | a |
| 262 | F20 | B | b |
| 263 | F20 | B | c |

TABLE 1-continued

| | | | |
|---|---|---|---|
| 264 | F20 | B | d |
| 265 | F20 | C | a |
| 266 | F20 | C | b |
| 267 | F20 | C | c |
| 268 | F20 | C | d |
| 269 | F21 | A | a |
| 270 | F21 | A | b |
| 271 | F21 | A | c |
| 272 | F21 | A | d |
| 273 | F21 | B | a |
| 274 | F21 | B | b |
| 275 | F21 | B | c |
| 276 | F21 | B | d |
| 277 | F21 | C | a |
| 278 | F21 | C | b |
| 279 | F21 | C | c |
| 280 | F21 | C | d |
| 281 | F22 | A | a |
| 282 | F22 | A | b |
| 283 | F22 | A | c |
| 284 | F22 | A | d |
| 285 | F22 | B | a |
| 286 | F22 | B | b |
| 287 | F22 | B | c |
| 288 | F22 | B | d |
| 289 | F22 | C | a |
| 290 | F22 | C | b |
| 291 | F22 | C | c |
| 292 | F22 | C | d |
| 293 | F22 | D | a |
| 294 | F22 | D | b |
| 295 | F22 | D | c |
| 296 | F22 | D | d |
| 297 | F23 | A | a |
| 298 | F23 | A | b |
| 299 | F23 | A | c |
| 300 | F23 | A | d |
| 301 | F23 | B | a |
| 302 | F23 | B | b |
| 303 | F23 | B | c |
| 304 | F23 | B | d |
| 305 | F23 | C | a |
| 306 | F23 | C | b |
| 307 | F23 | C | c |
| 308 | F23 | C | d |
| 309 | F24 | A | a |
| 310 | F24 | A | b |
| 311 | F24 | A | c |
| 312 | F24 | A | d |
| 313 | F24 | B | a |
| 314 | F24 | B | b |
| 315 | F24 | B | c |
| 316 | F24 | B | d |
| 317 | F24 | C | a |
| 318 | F24 | C | b |
| 319 | F24 | C | c |
| 320 | F24 | C | d |
| 321 | F25 | A | a |
| 322 | F25 | A | b |
| 323 | F25 | A | c |
| 324 | F25 | A | d |
| 325 | F25 | B | a |
| 326 | F25 | B | b |
| 327 | F25 | B | c |
| 328 | F25 | B | d |
| 329 | F25 | C | a |
| 330 | F25 | C | b |
| 331 | F25 | C | c |
| 332 | F25 | C | d |
| 333 | F25 | D | a |
| 334 | F25 | D | b |
| 335 | F25 | D | c |
| 336 | F25 | D | d |
| 337 | F26 | A | a |
| 338 | F26 | A | b |
| 339 | F26 | A | c |
| 340 | F26 | A | d |
| 341 | F26 | B | a |
| 342 | F26 | B | b |
| 343 | F26 | B | c |

TABLE 1-continued

| | | | |
|---|---|---|---|
| 344 | F26 | B | d |
| 345 | F26 | C | a |
| 346 | F26 | C | b |
| 347 | F26 | C | c |
| 348 | F26 | C | d |
| 349 | F27 | A | a |
| 350 | F27 | A | b |
| 351 | F27 | A | c |
| 352 | F27 | A | d |
| 353 | F27 | B | a |
| 354 | F27 | B | b |
| 355 | F27 | B | c |
| 356 | F27 | B | d |
| 357 | F27 | C | a |
| 358 | F27 | C | b |
| 359 | F27 | C | c |
| 360 | F27 | C | d |
| 361 | F28 | A | a |
| 362 | F28 | A | b |
| 363 | F28 | A | c |
| 364 | F28 | A | d |
| 365 | F28 | B | a |
| 366 | F28 | B | b |
| 367 | F28 | B | c |
| 368 | F28 | B | d |
| 369 | F28 | C | a |
| 370 | F28 | C | b |
| 371 | F28 | C | c |
| 372 | F28 | C | d |
| 373 | F28 | D | a |
| 374 | F28 | D | b |
| 375 | F28 | D | c |
| 376 | F28 | D | d |
| 377 | F29 | A | a |
| 378 | F29 | A | b |
| 379 | F29 | A | c |
| 380 | F29 | A | d |
| 381 | F29 | B | a |
| 382 | F29 | B | b |
| 383 | F29 | B | c |
| 384 | F29 | B | d |
| 385 | F29 | C | a |
| 386 | F29 | C | b |
| 387 | F29 | C | c |
| 388 | F29 | C | d |
| 389 | F30 | A | a |
| 390 | F30 | A | b |
| 391 | F30 | A | c |
| 392 | F30 | A | d |
| 393 | F30 | B | a |
| 394 | F30 | B | b |
| 395 | F30 | B | c |
| 396 | F30 | B | d |
| 397 | F30 | C | a |
| 398 | F30 | C | b |
| 399 | F30 | C | c |
| 400 | F30 | C | d |
| 401 | F31 | A | a |
| 402 | F31 | A | b |
| 403 | F31 | A | c |
| 404 | F31 | A | d |
| 405 | F31 | B | a |
| 406 | F31 | B | b |
| 407 | F31 | B | c |
| 408 | F31 | B | d |
| 409 | F31 | C | a |
| 410 | F31 | C | b |
| 411 | F31 | C | c |
| 412 | F31 | C | d |
| 413 | F31 | D | a |
| 414 | F31 | D | b |
| 415 | F31 | D | c |
| 416 | F31 | D | d |
| 417 | F32 | A | a |
| 418 | F32 | A | b |
| 419 | F32 | A | c |
| 420 | F32 | A | d |
| 421 | F32 | B | a |
| 422 | F32 | B | b |
| 423 | F32 | B | c |

TABLE 1-continued

| | | | |
|---|---|---|---|
| 424 | F32 | B | d |
| 425 | F32 | C | a |
| 426 | F32 | C | b |
| 427 | F32 | C | c |
| 428 | F32 | C | d |
| 429 | F33 | A | a |
| 430 | F33 | A | b |
| 431 | F33 | A | c |
| 432 | F33 | A | d |
| 433 | F33 | B | a |
| 434 | F33 | B | b |
| 435 | F33 | B | c |
| 436 | F33 | B | d |
| 437 | F33 | C | a |
| 438 | F33 | C | b |
| 439 | F33 | C | c |
| 440 | F33 | C | d |
| 441 | F34 | A | a |
| 442 | F34 | A | b |
| 443 | F34 | A | c |
| 444 | F34 | A | d |
| 445 | F34 | B | a |
| 446 | F34 | B | b |
| 447 | F34 | B | c |
| 448 | F34 | B | d |
| 449 | F34 | C | a |
| 450 | F34 | C | b |
| 451 | F34 | C | c |
| 452 | F34 | C | d |
| 453 | F34 | D | a |
| 454 | F34 | D | b |
| 455 | F34 | D | c |
| 456 | F34 | D | d |
| 457 | F35 | A | a |
| 458 | F35 | A | b |
| 459 | F35 | A | c |
| 460 | F35 | A | d |
| 461 | F35 | B | a |
| 462 | F35 | B | b |
| 463 | F35 | B | c |
| 464 | F35 | B | d |
| 465 | F35 | C | a |
| 466 | F35 | C | b |
| 467 | F35 | C | c |
| 468 | F35 | C | d |
| 469 | F36 | A | a |
| 470 | F36 | A | b |
| 471 | F36 | A | c |
| 472 | F36 | A | d |
| 473 | F36 | B | a |
| 474 | F36 | B | b |
| 475 | F36 | B | c |
| 476 | F36 | B | d |
| 477 | F36 | C | a |
| 478 | F36 | C | b |
| 479 | F36 | C | c |
| 480 | F36 | C | d |

| No. | F | R | Ar | X |
|---|---|---|---|---|
| 481 | F37 | A | a | α |
| 482 | F37 | A | a | β |
| 483 | F37 | A | a | γ |
| 484 | F37 | A | b | α |
| 485 | F37 | A | b | β |
| 486 | F37 | A | b | γ |
| 487 | F37 | A | c | α |
| 488 | F37 | A | c | β |
| 489 | F37 | A | c | γ |
| 490 | F37 | A | d | α |
| 491 | F37 | A | d | β |
| 492 | F37 | A | d | γ |
| 493 | F37 | B | a | α |
| 494 | F37 | B | a | β |
| 495 | F37 | B | a | γ |
| 496 | F37 | B | b | α |
| 497 | F37 | B | b | β |
| 498 | F37 | B | b | γ |
| 499 | F37 | B | c | α |
| 500 | F37 | B | c | β |

TABLE 1-continued

| | | | | |
|---|---|---|---|---|
| 501 | F37 | B | c | γ |
| 502 | F37 | B | d | α |
| 503 | F37 | B | d | β |
| 504 | F37 | B | d | γ |
| 505 | F37 | C | a | α |
| 506 | F37 | C | a | β |
| 507 | F37 | C | a | γ |
| 508 | F37 | C | b | α |
| 509 | F37 | C | b | β |
| 510 | F37 | C | b | γ |
| 511 | F37 | C | c | α |
| 512 | F37 | C | c | β |
| 513 | F37 | C | c | γ |
| 514 | F37 | C | d | α |
| 515 | F37 | C | c | β |
| 516 | F37 | C | d | γ |
| 517 | F37 | D | a | α |
| 518 | F37 | D | a | β |
| 519 | F37 | D | a | γ |
| 520 | F37 | D | b | α |
| 521 | F37 | D | b | β |
| 522 | F37 | D | b | γ |
| 523 | F37 | D | c | α |
| 524 | F37 | D | c | β |
| 525 | F37 | D | c | γ |
| 526 | F37 | D | d | α |
| 527 | F37 | D | d | β |
| 528 | F37 | D | d | γ |
| 529 | F38 | A | a | α |
| 530 | F38 | A | a | β |
| 531 | F38 | A | a | γ |
| 532 | F38 | A | b | α |
| 533 | F38 | A | b | β |
| 534 | F38 | A | b | γ |
| 535 | F38 | A | c | α |
| 536 | F38 | A | c | β |
| 537 | F38 | A | c | γ |
| 538 | F38 | A | d | α |
| 539 | F38 | A | d | β |
| 540 | F38 | A | d | γ |
| 541 | F38 | B | a | α |
| 542 | F38 | B | a | β |
| 543 | F38 | B | a | γ |
| 544 | F38 | B | b | α |
| 545 | F38 | B | b | β |
| 546 | F38 | B | b | γ |
| 547 | F38 | B | c | α |
| 548 | F38 | B | c | β |
| 549 | F38 | B | c | γ |
| 550 | F38 | B | d | α |
| 551 | F38 | B | d | β |
| 552 | F38 | B | d | γ |
| 553 | F38 | C | a | α |
| 554 | F38 | C | a | β |
| 555 | F38 | C | a | γ |
| 556 | F38 | C | b | α |
| 557 | F38 | C | b | β |
| 558 | F38 | C | b | γ |
| 559 | F38 | C | c | α |
| 560 | F38 | C | c | β |
| 561 | F38 | C | c | γ |
| 562 | F38 | C | d | α |
| 563 | F38 | C | d | β |
| 564 | F38 | C | d | γ |
| 565 | F39 | A | a | α |
| 566 | F39 | A | a | β |
| 567 | F39 | A | a | γ |
| 568 | F39 | A | b | α |
| 569 | F39 | A | b | β |
| 570 | F39 | A | b | γ |
| 571 | F39 | A | c | α |
| 572 | F39 | A | c | β |
| 573 | F39 | A | c | γ |
| 574 | F39 | A | d | α |
| 575 | F39 | A | d | β |
| 576 | F39 | A | d | γ |
| 577 | F39 | B | a | α |
| 578 | F39 | B | a | β |
| 579 | F39 | B | a | γ |
| 580 | F39 | B | b | α |

TABLE 1-continued

| | | | | |
|---|---|---|---|---|
| 581 | F39 | B | b | β |
| 582 | F39 | B | b | γ |
| 583 | F39 | B | c | α |
| 584 | F39 | B | c | β |
| 585 | F39 | B | c | γ |
| 586 | F39 | B | d | α |
| 587 | F39 | B | d | β |
| 588 | F39 | B | d | γ |
| 589 | F39 | C | a | α |
| 590 | F39 | C | a | β |
| 591 | F39 | C | a | γ |
| 592 | F39 | C | b | α |
| 593 | F39 | C | b | β |
| 594 | F39 | C | b | γ |
| 595 | F39 | C | c | α |
| 596 | F39 | C | c | β |
| 597 | F39 | C | c | γ |
| 598 | F39 | C | d | α |
| 599 | F39 | C | d | β |
| 600 | F39 | C | d | γ |
| 601 | F40 | A | a | α |
| 602 | F40 | A | a | β |
| 603 | F40 | A | a | γ |
| 604 | F40 | A | b | α |
| 605 | F40 | A | b | β |
| 606 | F40 | A | b | γ |
| 607 | F40 | A | c | α |
| 608 | F40 | A | c | β |
| 609 | F40 | A | c | γ |
| 610 | F40 | A | d | α |
| 611 | F40 | A | d | β |
| 612 | F40 | A | d | γ |
| 613 | F40 | B | a | α |
| 614 | F40 | B | a | β |
| 615 | F40 | B | a | γ |
| 616 | F40 | B | b | α |
| 617 | F40 | B | b | β |
| 618 | F40 | B | b | γ |
| 619 | F40 | B | c | α |
| 620 | F40 | B | c | β |
| 621 | F40 | B | c | γ |
| 622 | F40 | B | d | α |
| 623 | F40 | B | d | β |
| 624 | F40 | B | d | γ |
| 625 | F40 | C | a | α |
| 626 | F40 | C | a | β |
| 627 | F40 | C | a | γ |
| 628 | F40 | C | b | α |
| 629 | F40 | C | b | β |
| 630 | F40 | C | b | γ |
| 631 | F40 | C | c | α |
| 632 | F40 | C | c | β |
| 633 | F40 | C | c | γ |
| 634 | F40 | C | d | α |
| 635 | F40 | C | d | β |
| 636 | F40 | C | d | γ |
| 637 | F40 | D | a | α |
| 638 | F40 | D | a | β |
| 639 | F40 | D | a | γ |
| 640 | F40 | D | b | α |
| 641 | F40 | D | b | β |
| 642 | F40 | D | b | γ |
| 643 | F40 | D | c | α |
| 644 | F40 | D | c | β |
| 645 | F40 | D | c | γ |
| 646 | F40 | D | d | α |
| 647 | F40 | D | d | β |
| 648 | F40 | D | d | γ |
| 649 | F41 | A | a | α |
| 650 | F41 | A | a | β |
| 651 | F41 | A | a | γ |
| 652 | F41 | A | b | α |
| 653 | F41 | A | b | β |
| 654 | F41 | A | b | γ |
| 655 | F41 | A | c | α |
| 656 | F41 | A | c | β |
| 657 | F41 | A | c | γ |
| 658 | F41 | A | d | α |
| 659 | F41 | A | d | β |
| 660 | F41 | A | d | γ |

TABLE 1-continued

| | | | | |
|---|---|---|---|---|
| 661 | F41 | B | a | α |
| 662 | F41 | B | a | β |
| 663 | F41 | B | a | γ |
| 664 | F41 | B | b | α |
| 665 | F41 | B | b | β |
| 666 | F41 | B | b | γ |
| 667 | F41 | B | c | α |
| 668 | F41 | B | c | β |
| 669 | F41 | B | c | γ |
| 670 | F41 | B | d | α |
| 671 | F41 | B | d | β |
| 672 | F41 | B | d | γ |
| 673 | F41 | C | a | α |
| 674 | F41 | C | a | β |
| 675 | F41 | C | a | γ |
| 676 | F41 | C | b | α |
| 677 | F41 | C | b | β |
| 678 | F41 | C | b | γ |
| 679 | F41 | C | c | α |
| 660 | F41 | C | c | β |
| 681 | F41 | C | c | γ |
| 682 | F41 | C | d | α |
| 683 | F41 | C | d | β |
| 684 | F41 | C | d | γ |
| 685 | F42 | A | a | α |
| 686 | F42 | A | a | β |
| 687 | F42 | A | a | γ |
| 688 | F42 | A | b | α |
| 689 | F42 | A | b | β |
| 690 | F42 | A | b | γ |
| 691 | F42 | A | c | α |
| 682 | F42 | A | c | β |
| 693 | F42 | A | c | γ |
| 694 | F42 | A | d | α |
| 695 | F42 | A | d | β |
| 606 | F42 | A | d | γ |
| 697 | F42 | B | a | α |
| 698 | F42 | B | a | β |
| 690 | F42 | B | a | γ |
| 700 | F42 | B | b | α |
| 701 | F42 | B | b | β |
| 702 | F42 | B | b | γ |
| 703 | F42 | B | c | α |
| 704 | F42 | B | c | β |
| 705 | F42 | B | c | γ |
| 706 | F42 | B | d | α |
| 707 | F42 | B | d | β |
| 708 | F42 | B | d | γ |
| 709 | F42 | C | a | α |
| 710 | F42 | C | a | β |
| 711 | F42 | C | a | γ |
| 712 | F42 | C | b | α |
| 713 | F42 | C | b | β |
| 714 | F42 | C | b | γ |
| 715 | F42 | C | c | α |
| 716 | F42 | C | c | β |
| 717 | F42 | C | c | γ |
| 718 | F42 | C | d | α |
| 719 | F42 | C | d | β |
| 720 | F42 | C | d | γ |
| 721 | F43 | A | a | α |
| 722 | F43 | A | a | β |
| 723 | F43 | A | a | γ |
| 724 | F43 | A | b | α |
| 725 | F43 | A | b | β |
| 726 | F43 | A | b | γ |
| 727 | F43 | A | c | α |
| 728 | F43 | A | c | β |
| 729 | F43 | A | c | γ |
| 730 | F43 | A | d | α |
| 731 | F43 | A | d | β |
| 732 | F43 | A | d | γ |
| 733 | F43 | B | a | α |
| 734 | F43 | B | a | β |
| 735 | F43 | B | a | γ |
| 736 | F43 | B | b | α |
| 737 | F43 | B | b | β |
| 738 | F43 | B | b | γ |
| 730 | F43 | B | c | α |
| 740 | F43 | B | c | β |

TABLE 1-continued

| | | | | |
|---|---|---|---|---|
| 741 | F43 | B | c | γ |
| 742 | F43 | B | d | α |
| 743 | F43 | B | d | β |
| 744 | F43 | B | d | γ |
| 745 | F43 | C | a | α |
| 746 | F43 | C | a | β |
| 747 | F43 | C | a | γ |
| 748 | F43 | C | b | α |
| 749 | F43 | C | b | β |
| 750 | F43 | C | b | γ |
| 751 | F43 | C | c | α |
| 752 | F43 | C | c | β |
| 753 | F43 | C | c | γ |
| 754 | F43 | C | d | α |
| 755 | F43 | C | d | β |
| 756 | F43 | C | d | γ |
| 757 | F43 | D | a | α |
| 758 | F43 | D | a | β |
| 759 | F43 | D | a | γ |
| 760 | F43 | D | b | α |
| 761 | F43 | D | b | β |
| 762 | F43 | D | b | γ |
| 763 | F43 | D | c | α |
| 764 | F43 | D | c | β |
| 765 | F43 | D | c | γ |
| 766 | F43 | D | d | α |
| 767 | F43 | D | d | β |
| 768 | F43 | D | d | γ |
| 769 | F44 | A | a | α |
| 770 | F44 | A | a | β |
| 771 | F44 | A | a | γ |
| 772 | F44 | A | b | α |
| 773 | F44 | A | b | β |
| 774 | F44 | A | b | γ |
| 775 | F44 | A | c | α |
| 776 | F44 | A | c | β |
| 777 | F44 | A | c | γ |
| 778 | F44 | A | d | α |
| 779 | F44 | A | d | β |
| 780 | F44 | A | d | γ |
| 781 | F44 | B | a | α |
| 782 | F44 | B | a | β |
| 783 | F44 | B | a | γ |
| 784 | F44 | B | b | α |
| 785 | F44 | B | b | β |
| 786 | F44 | B | b | γ |
| 787 | F44 | B | n | α |
| 788 | F44 | B | c | β |
| 789 | F44 | B | c | γ |
| 790 | F44 | B | d | α |
| 791 | F44 | B | d | β |
| 792 | F44 | B | d | γ |
| 793 | F44 | C | a | α |
| 794 | F44 | C | a | β |
| 795 | F44 | C | a | γ |
| 796 | F44 | C | b | α |
| 797 | F44 | C | b | β |
| 798 | F44 | C | b | γ |
| 799 | F44 | C | c | α |
| 800 | F44 | C | c | β |
| 801 | F44 | C | c | γ |
| 802 | F44 | C | d | α |
| 803 | F44 | C | d | β |
| 804 | F44 | C | d | γ |
| 805 | F45 | A | a | α |
| 806 | F45 | A | a | β |
| 807 | F45 | A | a | γ |
| 808 | F45 | A | b | α |
| 809 | F45 | A | b | β |
| 810 | F45 | A | b | γ |
| 811 | F45 | A | c | α |
| 812 | F45 | A | c | β |
| 813 | F45 | A | c | γ |
| 814 | F45 | A | d | α |
| 815 | F45 | A | d | β |
| 816 | F45 | A | d | γ |
| 817 | F45 | B | a | α |
| 818 | F45 | B | a | β |
| 819 | F45 | B | a | γ |
| 820 | F45 | B | b | α |

TABLE 1-continued

| | | | | |
|---|---|---|---|---|
| 821 | F45 | B | b | β |
| 822 | F45 | B | b | γ |
| 823 | F45 | B | c | α |
| 824 | F45 | B | c | β |
| 825 | F45 | B | c | γ |
| 826 | F45 | B | d | α |
| 827 | F45 | B | d | β |
| 828 | F45 | B | d | γ |
| 829 | F45 | C | a | α |
| 830 | F45 | C | a | β |
| 831 | F45 | C | a | γ |
| 832 | F45 | C | b | α |
| 833 | F45 | C | b | β |
| 834 | F45 | C | b | γ |
| 835 | F45 | C | c | α |
| 836 | F45 | C | c | β |
| 837 | F45 | C | c | γ |
| 838 | F45 | C | d | α |
| 839 | F45 | C | d | β |
| 840 | F45 | C | d | γ |
| 841 | F46 | A | a | α |
| 842 | F46 | A | a | β |
| 843 | F46 | A | a | γ |
| 844 | F46 | A | b | α |
| 845 | F46 | A | b | β |
| 846 | F46 | A | b | γ |
| 847 | F46 | A | c | α |
| 848 | F48 | A | c | β |
| 849 | F46 | A | c | γ |
| 850 | F46 | A | d | α |
| 851 | F46 | A | d | β |
| 852 | F46 | A | d | γ |
| 853 | F46 | B | a | α |
| 854 | F46 | B | a | β |
| 855 | F46 | B | a | γ |
| 856 | F46 | B | b | α |
| 857 | F46 | B | b | β |
| 858 | F46 | B | b | γ |
| 859 | F46 | B | c | α |
| 860 | F46 | B | c | β |
| 861 | F46 | B | c | γ |
| 862 | F46 | B | d | α |
| 863 | F46 | B | d | β |
| 864 | F46 | B | d | γ |
| 865 | F46 | C | a | α |
| 866 | F46 | C | a | β |
| 867 | F46 | C | a | γ |
| 868 | F46 | C | b | α |
| 869 | F46 | C | b | β |
| 870 | F46 | C | b | γ |
| 871 | F46 | C | c | α |
| 872 | F46 | C | c | β |
| 873 | F46 | C | c | γ |
| 874 | F46 | C | d | α |
| 875 | F46 | C | d | β |
| 876 | F46 | C | d | γ |
| 877 | F46 | D | a | α |
| 878 | F46 | D | c | β |
| 879 | F46 | D | a | γ |
| 880 | F46 | D | b | α |
| 881 | F46 | D | b | β |
| 882 | F46 | D | b | γ |
| 883 | F46 | D | c | α |
| 884 | F46 | D | c | β |
| 885 | F46 | D | c | γ |
| 886 | F46 | D | d | α |
| 887 | F46 | D | d | β |
| 888 | F46 | D | d | γ |
| 889 | F47 | A | a | α |
| 890 | F47 | A | a | β |
| 891 | F47 | A | a | γ |
| 892 | F47 | A | b | α |
| 893 | F47 | A | b | β |
| 894 | F47 | A | b | γ |
| 895 | F47 | A | c | α |
| 896 | F47 | A | c | β |
| 897 | F47 | A | c | γ |
| 898 | F47 | A | d | α |
| 899 | F47 | A | d | β |
| 900 | F47 | A | d | γ |

TABLE 1-continued

| | | | | |
|---|---|---|---|---|
| 901 | F47 | B | a | α |
| 902 | F47 | B | a | β |
| 903 | F47 | B | a | γ |
| 904 | F47 | B | b | α |
| 905 | F47 | B | b | β |
| 906 | F47 | B | b | γ |
| 907 | F47 | B | c | α |
| 908 | F47 | B | c | β |
| 909 | F47 | B | c | γ |
| 910 | F47 | B | d | α |
| 911 | F47 | B | d | β |
| 912 | F47 | B | d | γ |
| 913 | F47 | C | a | α |
| 914 | F47 | C | a | β |
| 915 | F47 | C | a | γ |
| 916 | F47 | C | b | α |
| 917 | F47 | C | b | β |
| 918 | F47 | C | b | γ |
| 919 | F47 | C | c | α |
| 920 | F47 | C | c | β |
| 921 | F47 | C | c | γ |
| 922 | F47 | C | d | α |
| 923 | F47 | C | d | β |
| 924 | F47 | C | d | γ |
| 925 | F48 | A | a | α |
| 926 | F48 | A | a | β |
| 927 | F48 | A | a | γ |
| 928 | F48 | A | b | α |
| 929 | F48 | A | b | β |
| 930 | F48 | A | b | γ |
| 931 | F48 | A | c | α |
| 932 | F48 | A | c | β |
| 933 | F48 | A | c | γ |
| 934 | F48 | A | d | α |
| 935 | F48 | A | d | β |
| 936 | F48 | A | d | γ |
| 937 | F48 | B | a | α |
| 938 | F48 | B | a | β |
| 939 | F48 | B | a | γ |
| 940 | F48 | B | b | α |
| 941 | F48 | B | b | β |
| 942 | F48 | B | b | γ |
| 943 | F48 | B | c | α |
| 944 | F48 | B | c | β |
| 945 | F48 | B | c | γ |
| 946 | F48 | B | d | α |
| 947 | F48 | B | d | β |
| 948 | F48 | B | d | γ |
| 949 | F48 | C | a | α |
| 950 | F48 | C | a | β |
| 951 | F48 | C | a | γ |
| 952 | F48 | C | b | α |
| 953 | F48 | C | b | β |
| 954 | F48 | C | b | γ |
| 955 | F48 | C | c | α |
| 956 | F48 | C | c | β |
| 957 | F48 | C | c | γ |
| 958 | F48 | C | d | α |
| 959 | F48 | C | d | β |
| 960 | F48 | C | d | γ |
| 961 | F49 | A | a | α |
| 962 | F49 | A | a | β |
| 963 | F49 | A | a | γ |
| 964 | F49 | A | b | α |
| 965 | F49 | A | b | β |
| 966 | F49 | A | b | γ |
| 967 | F49 | A | c | α |
| 968 | F49 | A | c | β |
| 969 | F49 | A | c | γ |
| 970 | F49 | A | d | α |
| 971 | F49 | A | d | β |
| 972 | F49 | A | d | γ |
| 973 | F49 | B | a | α |
| 974 | F49 | B | a | β |
| 975 | F49 | B | a | γ |
| 976 | F49 | B | b | α |
| 977 | F49 | B | b | β |
| 978 | F49 | B | b | γ |
| 979 | F49 | B | c | α |
| 980 | F49 | B | c | β |

TABLE 1-continued

| | | | | |
|---|---|---|---|---|
| 981 | F49 | B | c | γ |
| 982 | F49 | B | d | α |
| 983 | F49 | B | d | β |
| 984 | F49 | B | d | γ |
| 985 | F49 | C | a | α |
| 986 | F49 | C | a | β |
| 987 | F49 | C | a | γ |
| 988 | F49 | C | b | α |
| 989 | F49 | C | b | β |
| 990 | F49 | C | b | γ |
| 991 | F49 | C | c | α |
| 992 | F49 | C | c | β |
| 993 | F49 | C | c | γ |
| 994 | F49 | C | d | α |
| 995 | F49 | C | d | β |
| 996 | F49 | C | d | γ |
| 997 | F49 | D | a | α |
| 998 | F49 | D | a | β |
| 999 | F49 | D | a | γ |
| 1000 | F49 | D | b | α |
| 1001 | F49 | D | b | β |
| 1002 | F49 | D | b | γ |
| 1003 | F49 | D | c | α |
| 1004 | F49 | D | c | β |
| 1005 | F49 | D | c | γ |
| 1006 | F49 | D | d | α |
| 1007 | F49 | D | d | β |
| 1008 | F49 | D | d | γ |
| 1009 | F50 | A | a | α |
| 1010 | F50 | A | a | β |
| 1011 | F50 | A | a | γ |
| 1012 | F50 | A | b | α |
| 1013 | F50 | A | b | β |
| 1014 | F50 | A | b | γ |
| 1015 | F50 | A | c | α |
| 1016 | F50 | A | c | β |
| 1017 | F50 | A | c | γ |
| 1018 | F50 | A | d | α |
| 1019 | F50 | A | d | β |
| 1020 | F50 | A | d | γ |
| 1021 | F50 | B | a | α |
| 1022 | F50 | B | a | β |
| 1023 | F50 | B | a | γ |
| 1024 | F50 | B | b | α |
| 1025 | F50 | B | b | β |
| 1026 | F50 | B | b | γ |
| 1027 | F50 | B | c | α |
| 1028 | F50 | B | c | β |
| 1029 | F50 | B | c | γ |
| 1030 | F50 | B | d | α |
| 1031 | F50 | B | d | β |
| 1032 | F50 | B | d | γ |
| 1033 | F50 | C | a | α |
| 1034 | F50 | C | a | β |
| 1035 | F50 | C | a | γ |
| 1036 | F50 | C | b | α |
| 1037 | F50 | C | b | β |
| 1038 | F50 | C | b | γ |
| 1039 | F50 | C | c | α |
| 1040 | F50 | C | c | β |
| 1041 | F50 | C | c | γ |
| 1042 | F50 | C | d | α |
| 1043 | F50 | C | d | β |
| 1044 | F50 | C | d | γ |
| 1045 | F51 | A | a | α |
| 1046 | F51 | A | a | β |
| 1047 | F51 | A | a | γ |
| 1048 | F51 | A | b | α |
| 1049 | F51 | A | b | β |
| 1050 | F51 | A | b | γ |
| 1051 | F51 | A | c | α |
| 1052 | F51 | A | c | β |
| 1053 | F51 | A | c | γ |
| 1054 | F51 | A | d | α |
| 1055 | F51 | A | d | β |
| 1056 | F51 | A | d | γ |
| 1057 | F51 | B | a | α |
| 1058 | F51 | B | a | β |
| 1059 | F51 | B | a | γ |
| 1060 | F51 | B | b | α |
| 1061 | F51 | B | b | β |
| 1062 | F51 | B | b | γ |
| 1063 | F51 | B | c | α |
| 1064 | F51 | B | c | β |
| 1065 | F51 | B | c | γ |
| 1066 | F51 | B | d | α |
| 1067 | F51 | B | d | β |
| 1068 | F51 | B | d | γ |
| 1069 | F51 | C | a | α |
| 1070 | F51 | C | a | β |
| 1071 | F51 | C | a | γ |
| 1072 | F51 | C | b | α |
| 1073 | F51 | C | b | β |
| 1074 | F51 | C | b | γ |
| 1075 | F51 | C | c | α |
| 1076 | F51 | C | c | β |
| 1077 | F51 | C | c | γ |
| 1078 | F51 | C | d | α |
| 1079 | F51 | C | d | β |
| 1080 | F51 | C | d | γ |
| 1081 | F52 | A | a | α |
| 1082 | F52 | A | a | β |
| 1083 | F52 | A | a | γ |
| 1084 | F52 | A | b | α |
| 1085 | F52 | A | b | β |
| 1086 | F52 | A | b | γ |
| 1087 | F52 | A | c | α |
| 1088 | F52 | A | c | β |
| 1089 | F52 | A | c | γ |
| 1090 | F52 | A | d | α |
| 1091 | F52 | A | d | β |
| 1092 | F52 | A | d | γ |
| 1093 | F52 | B | a | α |
| 1094 | F52 | B | a | β |
| 1095 | F52 | B | a | γ |
| 1096 | F52 | B | b | α |
| 1097 | F52 | B | b | β |
| 1098 | F52 | B | b | γ |
| 1099 | F52 | B | c | α |
| 1100 | F52 | B | c | β |
| 1101 | F52 | B | c | γ |
| 1102 | F52 | B | d | α |
| 1103 | F52 | B | d | β |
| 1104 | F52 | B | d | γ |
| 1105 | F52 | C | a | α |
| 1106 | F52 | C | a | β |
| 1107 | F52 | C | a | γ |
| 1108 | F52 | C | b | α |
| 1109 | F52 | C | b | β |
| 1110 | F52 | C | b | γ |
| 1111 | F52 | C | c | α |
| 1112 | F52 | C | c | β |
| 1113 | F52 | C | c | γ |
| 1114 | F52 | C | d | α |
| 1115 | F52 | C | d | β |
| 1116 | F52 | C | d | γ |
| 1117 | F52 | D | a | α |
| 1118 | F52 | D | a | β |
| 1119 | F52 | D | a | γ |
| 1120 | F52 | D | b | α |
| 1121 | F52 | D | b | β |
| 1122 | F52 | D | b | γ |
| 1123 | F52 | D | c | α |
| 1124 | F52 | D | c | β |
| 1125 | F52 | D | c | γ |
| 1126 | F52 | D | d | α |
| 1127 | F52 | D | d | β |
| 1128 | F52 | D | d | γ |
| 1129 | F53 | A | a | α |
| 1130 | F53 | A | a | β |
| 1131 | F53 | A | a | γ |
| 1132 | F53 | A | b | α |
| 1133 | F53 | A | b | β |
| 1134 | F53 | A | b | γ |
| 1135 | F53 | A | c | α |
| 1136 | F53 | A | c | β |
| 1137 | F53 | A | c | γ |
| 1138 | F53 | A | d | α |
| 1139 | F53 | A | d | β |
| 1140 | F53 | A | d | γ |

TABLE 1-continued

| | | | | |
|---|---|---|---|---|
| 1141 | F53 | B | a | α |
| 1142 | F53 | B | a | β |
| 1143 | F53 | B | a | γ |
| 1144 | F53 | B | b | α |
| 1145 | F53 | B | b | β |
| 1146 | F53 | B | b | γ |
| 1147 | F53 | B | c | α |
| 1148 | F53 | B | c | β |
| 1149 | F53 | B | c | γ |
| 1150 | F53 | B | d | α |
| 1151 | F53 | B | d | β |
| 1152 | F53 | B | d | γ |
| 1153 | F53 | C | a | α |
| 1154 | F53 | C | a | β |
| 1155 | F53 | C | a | γ |
| 1156 | F53 | C | b | α |
| 1157 | F53 | C | b | β |
| 1158 | F53 | C | b | γ |
| 1159 | F53 | C | c | α |
| 1160 | F53 | C | c | β |
| 1161 | F53 | C | c | γ |
| 1162 | F53 | C | d | α |
| 1163 | F53 | C | d | β |
| 1164 | F53 | C | d | γ |
| 1165 | F54 | A | a | α |
| 1166 | F54 | A | 3 | β |
| 1167 | F54 | A | a | γ |
| 1168 | F54 | A | b | α |
| 1169 | F54 | A | b | β |
| 1170 | F54 | A | b | γ |
| 1171 | F54 | A | c | α |
| 1172 | F54 | A | c | β |
| 1173 | F54 | A | c | γ |
| 1174 | F54 | A | d | α |
| 1175 | F54 | A | d | β |
| 1176 | F54 | A | d | γ |
| 1177 | F54 | B | a | α |
| 1178 | F54 | B | a | β |
| 1179 | F54 | B | a | γ |
| 1180 | F54 | B | b | α |
| 1181 | F54 | B | b | β |
| 1182 | F54 | B | b | γ |
| 1183 | F54 | B | c | α |
| 1184 | F54 | B | c | β |
| 1185 | F54 | B | c | γ |
| 1186 | F54 | B | d | α |
| 1187 | F54 | B | d | β |
| 1188 | F54 | B | d | γ |
| 1189 | F54 | C | a | α |
| 1190 | F54 | C | a | β |
| 1191 | F54 | C | a | γ |
| 1192 | F54 | C | b | α |
| 1193 | F54 | C | b | β |
| 1194 | F54 | C | b | γ |
| 1195 | F54 | C | c | α |
| 1196 | F54 | C | c | β |
| 1197 | F54 | C | c | γ |
| 1198 | F54 | C | d | α |
| 1199 | F54 | C | d | β |
| 1200 | F54 | C | d | γ |
| 1201 | F55 | A | a | α |
| 1202 | F55 | A | a | β |
| 1203 | F55 | A | a | γ |
| 1204 | F55 | A | b | α |
| 1205 | F55 | A | b | β |
| 1206 | F55 | A | b | γ |
| 1207 | F55 | A | c | α |
| 1208 | F55 | A | c | β |
| 1209 | F55 | A | c | γ |
| 1210 | F55 | A | d | α |
| 1211 | F55 | A | d | β |
| 1212 | F55 | A | d | γ |
| 1213 | F55 | B | a | α |
| 1214 | F55 | B | a | β |
| 1215 | F55 | B | a | γ |
| 1216 | F55 | B | b | α |
| 1217 | F55 | B | b | β |
| 1218 | F55 | B | b | γ |
| 1219 | F55 | B | c | α |
| 1220 | F55 | B | c | β |
| 1221 | F55 | B | c | γ |
| 1222 | F55 | B | d | α |
| 1223 | F55 | B | d | β |
| 1224 | F55 | C | d | γ |
| 1225 | F55 | C | a | α |
| 1226 | F55 | C | a | β |
| 1227 | F55 | C | a | γ |
| 1228 | F55 | C | b | α |
| 1229 | F55 | C | b | β |
| 1230 | F55 | C | b | γ |
| 1231 | F55 | C | c | α |
| 1232 | F55 | C | c | β |
| 1233 | F55 | C | c | γ |
| 1234 | F55 | C | d | α |
| 1235 | F55 | C | d | β |
| 1236 | F55 | C | d | γ |
| 1237 | F55 | D | a | α |
| 1238 | F55 | D | a | β |
| 1239 | F55 | D | a | γ |
| 1240 | F55 | D | b | α |
| 1241 | F55 | D | b | β |
| 1242 | F55 | D | b | γ |
| 1243 | F55 | D | c | α |
| 1244 | F55 | D | c | β |
| 1245 | F55 | D | c | γ |
| 1246 | F55 | D | d | α |
| 1247 | F55 | D | d | β |
| 1248 | F55 | D | d | γ |
| 1249 | F56 | A | a | α |
| 1250 | F56 | A | a | β |
| 1251 | F56 | A | a | γ |
| 1252 | F56 | A | b | α |
| 1253 | F56 | A | b | β |
| 1254 | F56 | A | b | γ |
| 1255 | F56 | A | c | α |
| 1256 | F56 | A | c | β |
| 1257 | F56 | A | c | γ |
| 1258 | F56 | A | d | α |
| 1259 | F56 | A | d | β |
| 1260 | F56 | A | d | γ |
| 1261 | F56 | B | a | α |
| 1262 | F56 | B | a | β |
| 1263 | F56 | B | a | γ |
| 1264 | F56 | B | b | α |
| 1265 | F56 | B | b | β |
| 1266 | F56 | B | b | γ |
| 1267 | F56 | B | c | α |
| 1268 | F56 | B | c | β |
| 1269 | F56 | B | c | γ |
| 1270 | F56 | B | d | α |
| 1271 | F56 | B | d | β |
| 1272 | F56 | B | d | γ |
| 1273 | F56 | C | a | α |
| 1274 | F56 | C | a | β |
| 1275 | F56 | C | a | γ |
| 1276 | F56 | C | b | α |
| 1277 | F56 | C | b | β |
| 1278 | F56 | C | b | γ |
| 1279 | F56 | C | c | α |
| 1280 | F56 | C | c | β |
| 1281 | F56 | C | c | γ |
| 1282 | F56 | C | d | α |
| 1283 | F56 | C | d | β |
| 1284 | F56 | C | d | γ |
| 1285 | F56 | D | a | α |
| 1286 | F56 | D | a | β |
| 1287 | F56 | D | a | γ |
| 1288 | F56 | D | b | α |
| 1289 | F56 | D | b | β |
| 1290 | F56 | D | b | γ |
| 1291 | F56 | D | c | α |
| 1292 | F56 | D | c | β |

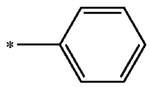
A

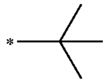
B

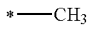
C

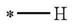
D

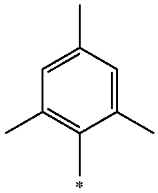
a

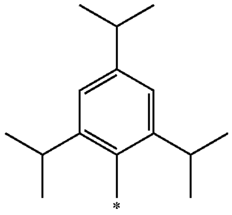
b

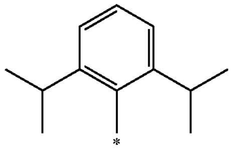
c

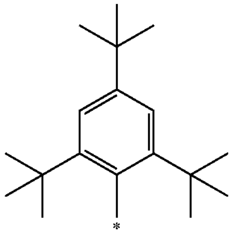
d

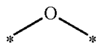
α

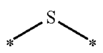
β

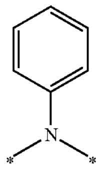
γ

In one aspect of the present invention, the skeletons (1a) to (12b) are skeletons in which other rings are not further condensed. In one aspect of the present invention, the skeletons (1a) to (12b) are skeletons in which other rings may be further condensed. Regarding other rings mentioned herein, the above descriptions on the ring structures formed by bonding $R^1$ and $R^2$, $R^2$ and $R^3$, $R^3$ and $R^4$, $R^4$ and $R^5$, $R^5$ and $R^6$, $R^6$ and $R^7$, $R^8$ and $R^9$, $R^9$ and $R^{10}$, $R^{10}$ and $R^{11}$, $R^{11}$ and $R^{12}$, $R^{13}$ and $R^{14}$, $R^{14}$ and $R^{15}$, $R^{15}$ and $R^{16}$, $R^{16}$ and $R^{17}$, $R^{18}$ and $R^{19}$, $R^{19}$ and $R^{20}$, $R^{20}$ and $R^{21}$, $R^{22}$ and $R^{23}$, $R^{23}$ and $R^{24}$, $R^{24}$ and $R^{25}$, and $R^{25}$ and $R^{26}$ to each other may be referred to.

In one aspect of the present invention, $A^1$ and $A^2$ in the formula (1) are acceptor groups. For example, a compound having acceptor groups at positions of $A^1$ and $A^2$ and having any of the skeletons (1a) to (12b) may be mentioned. In relation to descriptions and specific examples of the acceptor group, descriptions, and specific examples of the acceptor group for $A^1$ and $A^2$ in the formula (1) may be referred to.

Hereinafter, specific examples of a compound in which $A^1$ and $A^2$ are acceptor groups will be given. The compounds in which $A^1$ and $A^2$ are acceptor groups, which may be used in the present invention, are not construed as limiting to the following specific examples. The following specific examples have structures in which both $A^1$ and $A^2$ are "A", and the structure of each compound is specified by individually specifying the "A".

---

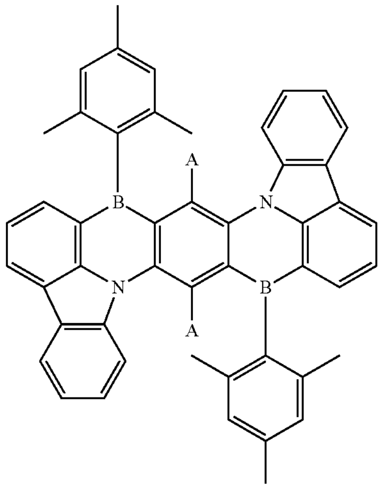

1a: A = A1
1b: A = A2
1c: A = A3
1d: A = A4
1e: A = A7
1f: A = A10
1g: A = A11
1h: A = A16
1i: A = A35
1j: A = A39
1k: A = A40
1l: A = A41
1m: A = A42

-continued
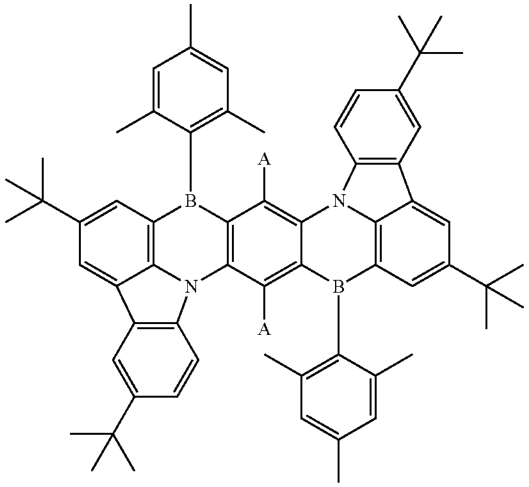
2a: A = A1
2b: A = A2
2c: A = A3
2d: A = A4
2e: A = A7
2f: A = A10
2g: A = A11
2h: A = A16
2i: A = A35
2j: A = A39
2k: A = A40
2l: A = A41
2m: A = A42
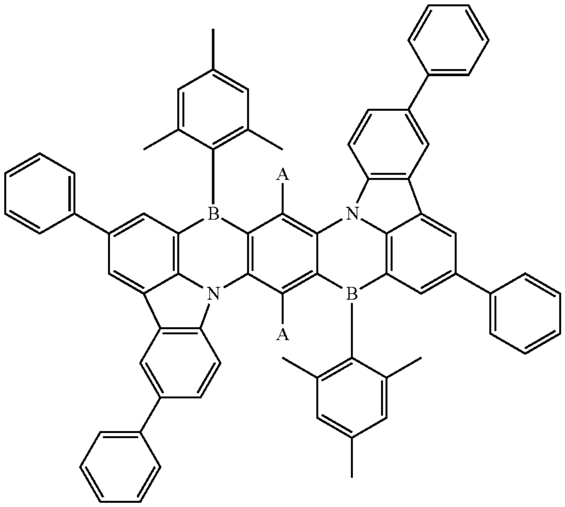
3a: A = A1
3b: A = A2
3c: A = A3
3d: A = A4
3e: A = A7
3f: A = A10
3g: A = A11
3h: A = A16
3i: A = A35
3j: A = A39
3k: A = A40
3l: A = A41
3m: A = A42
-continued
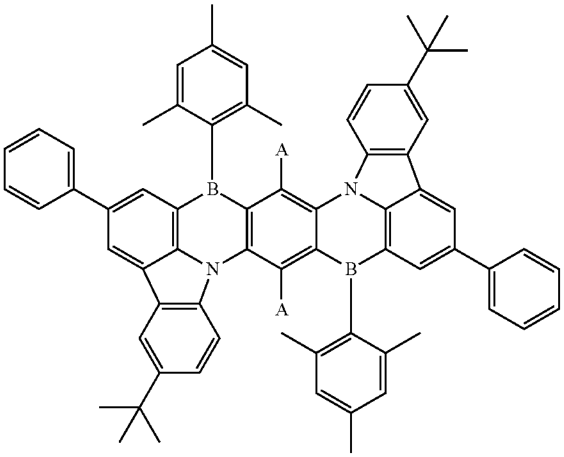
4a: A = A1
4b: A = A2
4c: A = A3
4d: A = A4
4e: A = A7
4f: A = A10
4g: A = A11
4h: A = A16
4i: A = A35
4j: A = A39
4k: A = A40
4l: A = A41
4m: A = A42
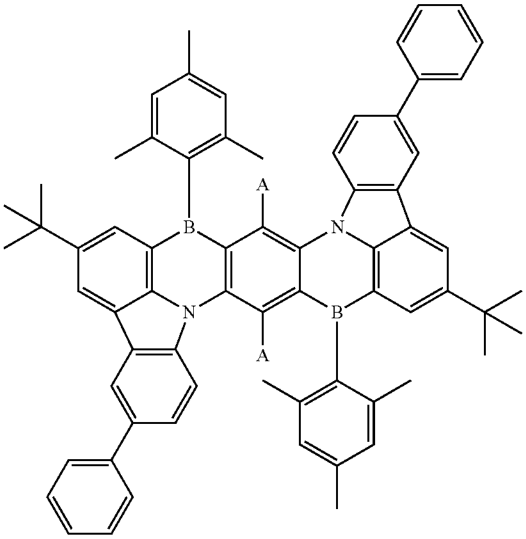
5a: A = A1
5b: A = A2
5c: A = A3
5d: A = A4
5e: A = A7
5f: A = A10
5g: A = A11
5h: A = A16
5i: A = A35
5j: A = A39
5k: A = A40
5l: A = A41
5m: A = A42

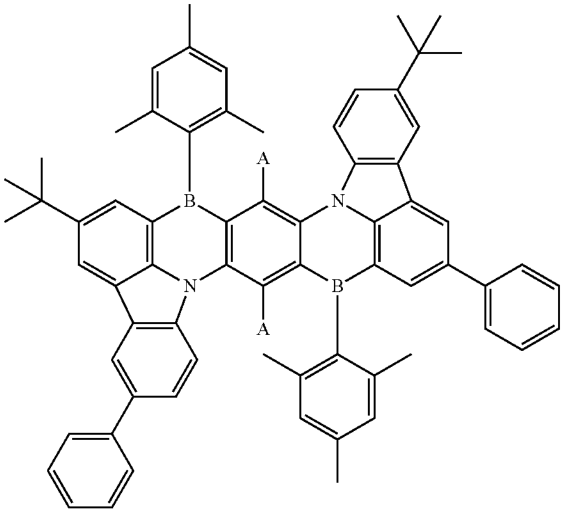
6a: A = A1
6b: A = A2
6c: A = A3
6d: A = A4
6e: A = A7
6f: A = A10
6g: A = A11
6h: A = A16
6i: A = A35
6j: A = A39
6k: A = A40
6l: A = A41
6m: A = A42
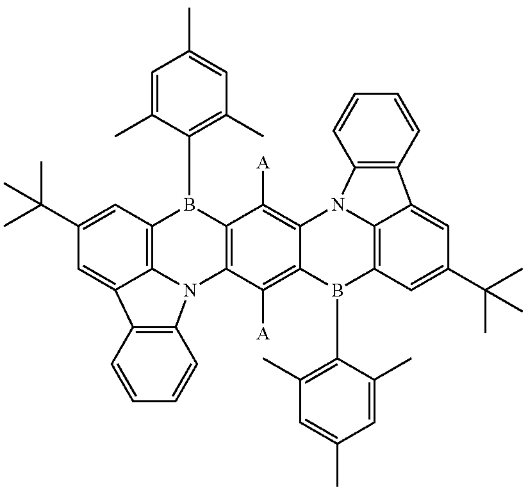
7a: A = A1
7b: A = A2
7c: A = A3
7d: A = A4
7e: A = A7
7f: A = A10
7g: A = A11
7h: A = A16
7i: A = A35
7j: A = A39
7k: A = A40
7l: A = A41
7m: A = A42
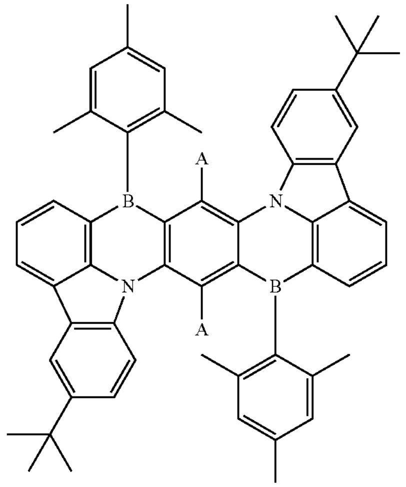
8a: A = A1
8b: A = A2
8c: A = A3
8d: A = A4
8e: A = A7
8f: A = A10
8g: A = A11
8h: A = A16
8i: A = A35
8j: A = A39
8k: A = A40
8l: A = A41
8m: A = A42
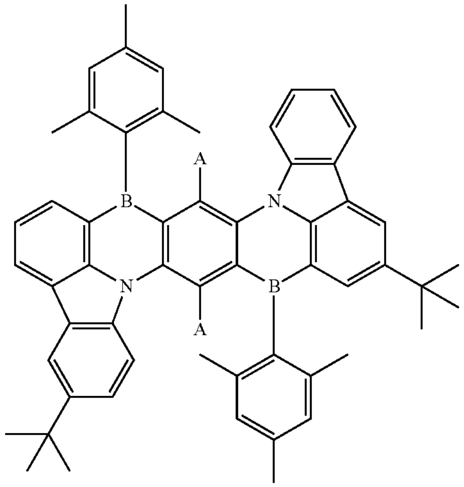
9a: A = A1
9b: A = A2
9c: A = A3
9d: A = A4
9e: A = A7
9f: A = A10
9g: A = A11
9h: A = A16
9i: A = A35
9j: A = A39
9k: A = A40
9l: A = A41
9m: A = A42

-continued
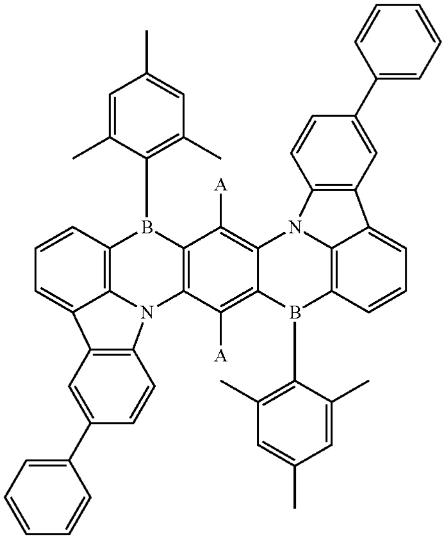
10a: A = A1
10b: A = A2
10c: A = A3
10d: A = A4
10e: A = A7
10f: A = A10
10g: A = A11
10h: A = A16
10i: A = A35
10j: A = A39
10k: A = A40
10l: A = A41
10m: A = A42
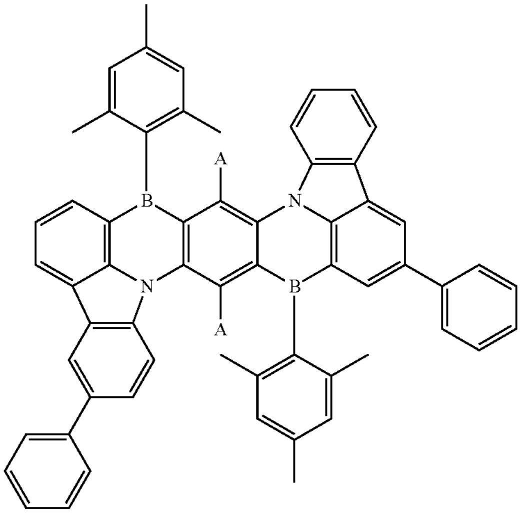
11a: A = A1
11b: A = A2
11c: A = A3
11d: A = A4
11e: A = A7
11f: A = A10
11g: A = A11
11h: A = A16
11i: A = A35
11j: A = A39
11k: A = A40
11l: A = A41
11m: A = A42
-continued
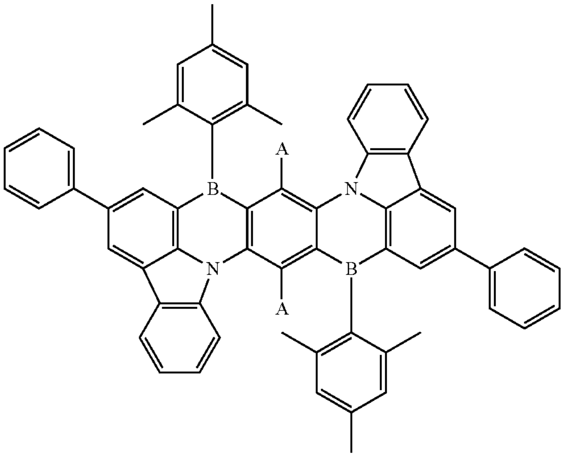
12a: A = A1
12b: A = A2
12c: A = A3
12d: A = A4
12e: A = A7
12f: A = A10
12g: A = A11
12h: A = A16
12i: A = A35
12j: A = A39
12k: A = A40
12l: A = A41
12m: A = A42
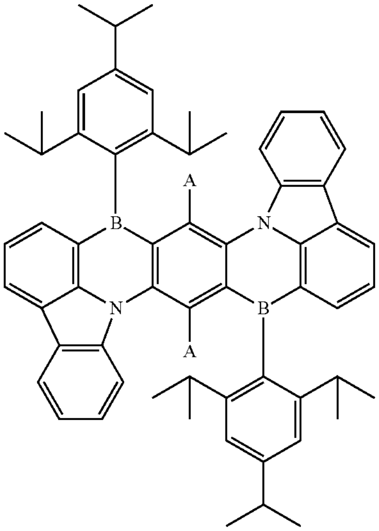
13a: A = A1
13b: A = A2
13c: A = A3
13d: A = A4
13e: A = A7
13f: A = A10
13g: A = A11
13h: A = A16
13i: A = A35
13j: A = A39
13k: A = A40
13l: A = A41
13m: A = A42

-continued
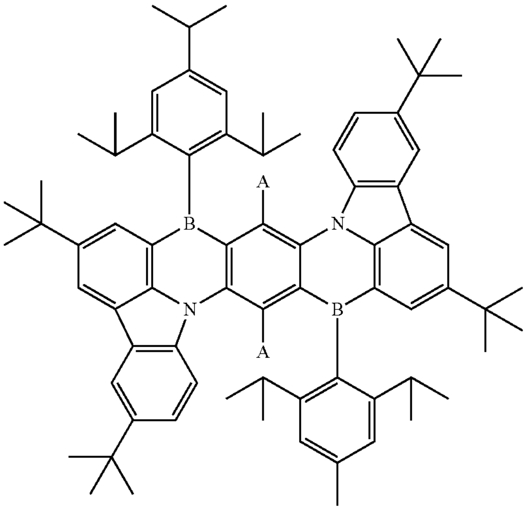
14a: A = A1
14b: A = A2
14c: A = A3
14d: A = A4
14e: A = A7
14f: A = A10
14g: A = A11
14h: A = A16
14i: A = A35
14j: A = A39
14k: A = A40
14l: A = A41
14m: A = A42
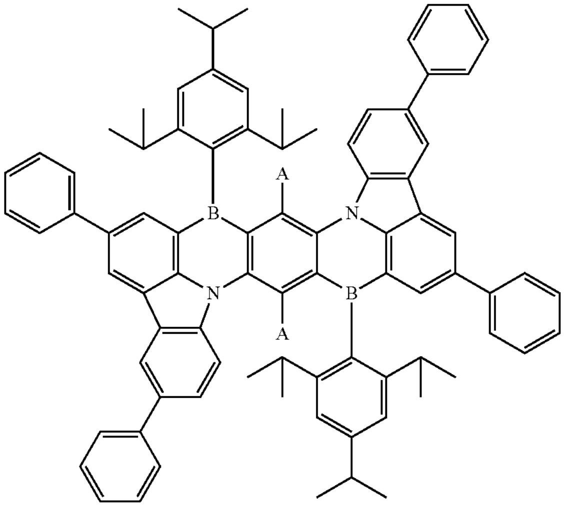
15a: A = A1
15b: A = A2
15c: A = A3
15d: A = A4
15e: A = A7
15f: A = A10
15g: A = A11
15h: A = A16
15i: A = A35
15j: A = A39
15k: A = A40
15l: A = A41
15m: A = A42
-continued
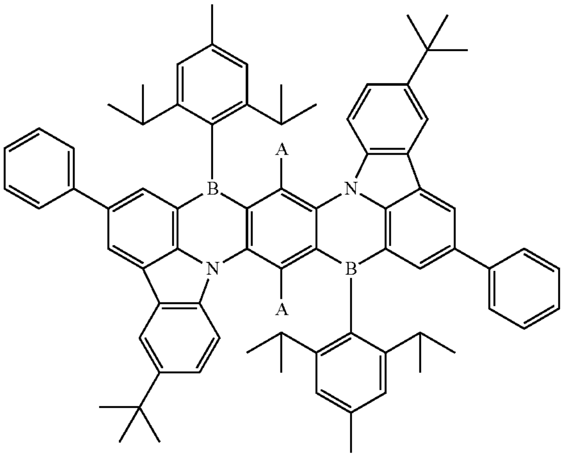
16a: A = A1
16b: A = A2
16c: A = A3
16d: A = A4
16e: A = A7
16f: A = A10
16g: A = A11
16h: A = A16
16i: A = A35
16j: A = A39
16k: A = A40
16l: A = A41
16m: A = A42
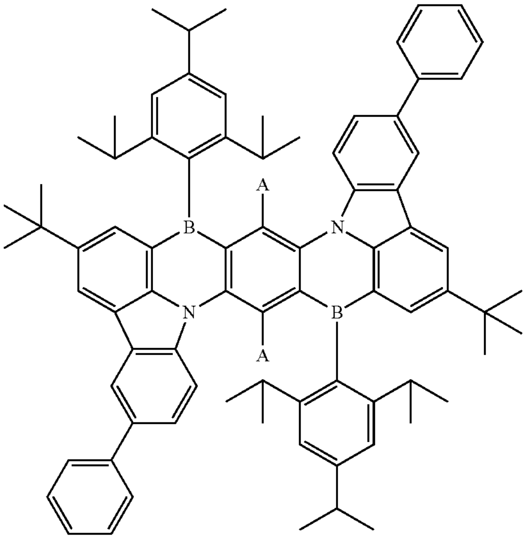
17a: A = A1
17b: A = A2
17c: A = A3
17d: A = A4
17e: A = A7
17f: A = A10
17g: A = A11
17h: A = A16
17i: A = A35
17j: A = A39
17k: A = A40
17l: A = A41
17m: A = A42

-continued
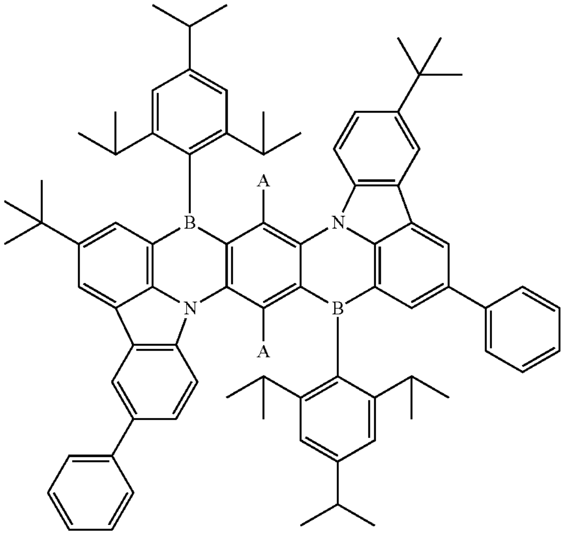
18a: A = A1
18b: A = A2
18c: A = A3
18d: A = A4
18e: A = A7
18f: A = A10
18g: A = A11
18h: A = A16
18i: A = A35
18j: A = A39
18k: A = A40
18l: A = A41
18m: A = A42
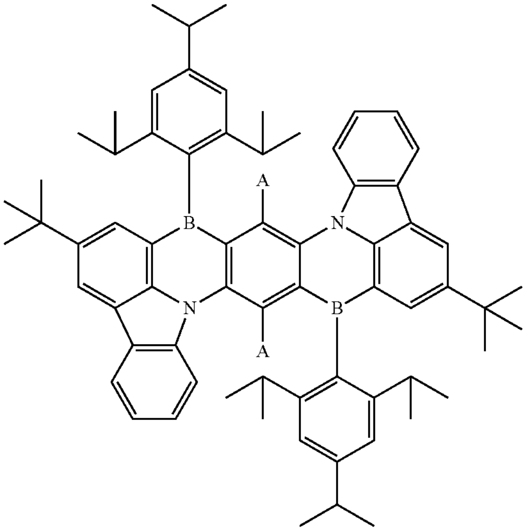
19a: A = A1
19b: A = A2
19c: A = A3
19d: A = A4
19e: A = A7
19f: A = A10
19g: A = A11
19h: A = A16
19i: A = A35
19j: A = A39
19k: A = A40
19l: A = A41
19m: A = A42
-continued
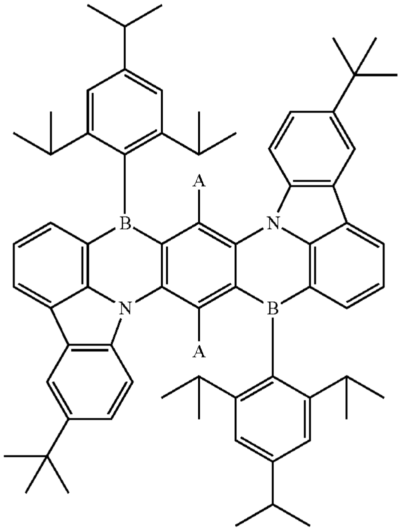
20a: A = A1
20b: A = A2
20c: A = A3
20d: A = A4
20e: A = A7
20f: A = A10
20g: A = A11
20h: A = A16
20i: A = A35
20j: A = A39
20k: A = A40
20l: A = A41
20m: A = A42
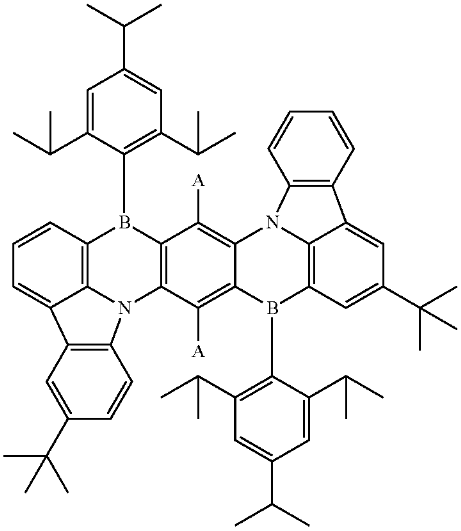
21a: A = A1
21b: A = A2
21c: A = A3
21d: A = A4
21e: A = A7
21f: A = A10
21g: A = A11
21h: A = A16
21i: A = A35
21j: A = A39
21k: A = A40
21l: A = A41
21m: A = A42

-continued
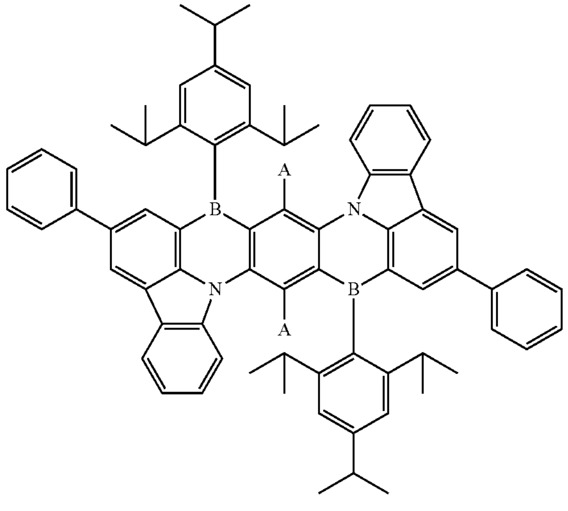
22a: A = A1
22b: A = A2
22c: A = A3
22d: A = A4
22e: A = A7
22f: A = A10
22g: A = A11
22h: A = A16
22i: A = A35
22j: A = A39
22k: A = A40
22l: A = A41
22m: A = A42
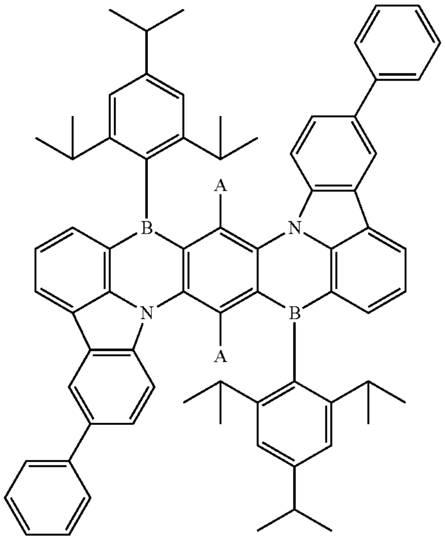
23a: A = A1
23b: A = A2
23c: A = A3
23d: A = A4
23e: A = A7
23f: A = A10
23g: A = A11
23h: A = A16
23i: A = A35
23j: A = A39
23k: A = A40
23l: A = A41
23m: A = A42
-continued
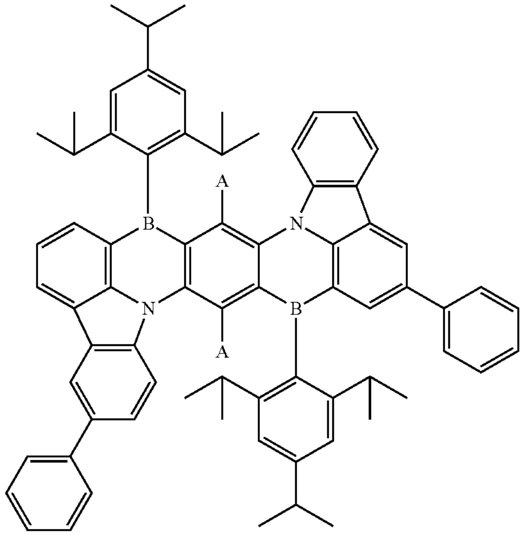
24a: A = A1
24b: A = A2
24c: A = A3
24d: A = A4
24e: A = A7
24f: A = A10
24g: A = A11
24h: A = A16
24i: A = A35
24j: A = A39
24k: A = A40
24l: A = A41
24m: A = A42
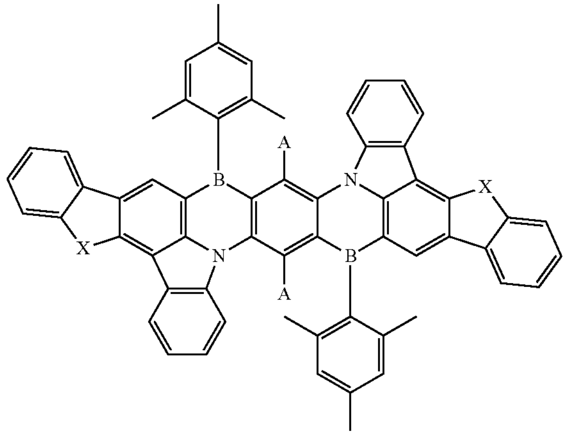
25a: A = A1
25b: A = A2
25c: A = A3
25d: A = A4
25e: A = A7
25f: A = A10
25g: A = A11
25h: A = A16
25i: A = A35
25j: A = A39
25k: A = A40
25l: A = A41
25m: A = A42

-continued
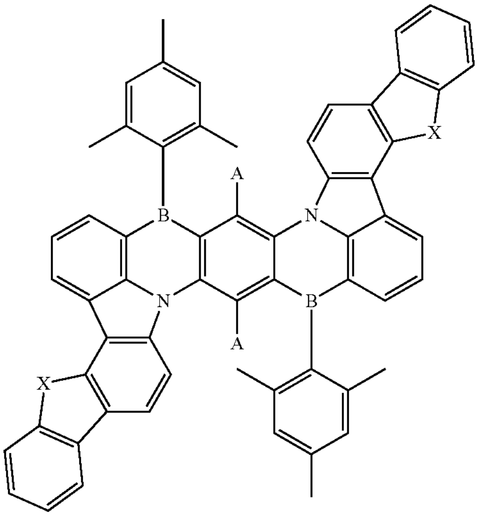
26a: A = A1
26b: A = A2
26c: A = A3
26d: A = A4
26e: A = A7
26f: A = A10
26g: A = A11
26h: A = A16
26i: A = A35
26j: A = A39
26k: A = A40
26l: A = A41
26m: A = A42
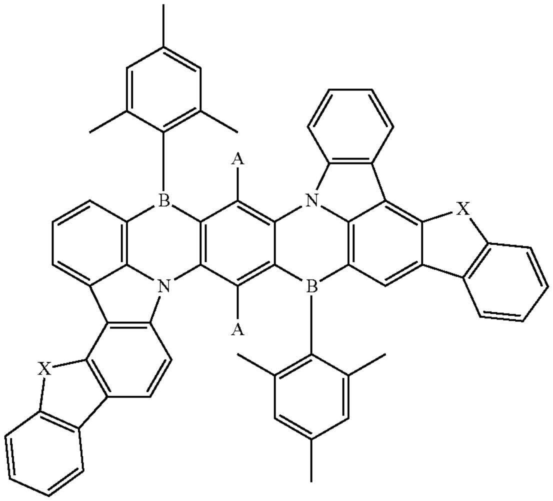
27a: A = A1
27b: A = A2
27c: A = A3
27d: A = A4
27e: A = A7
27f: A = A10
27g: A = A11
27h: A = A16
27i: A = A35
27j: A = A39
27k: A = A40
27l: A = A41
27m: A = A42
-continued
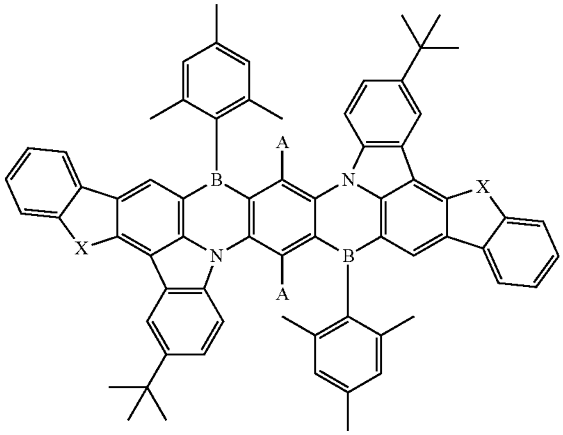
28a: A = A1
28b: A = A2
28c: A = A3
28d: A = A4
28e: A = A7
28f: A = A10
28g: A = A11
28h: A = A16
28i: A = A35
28j: A = A39
28k: A = A40
28l: A = A41
28m: A = A42
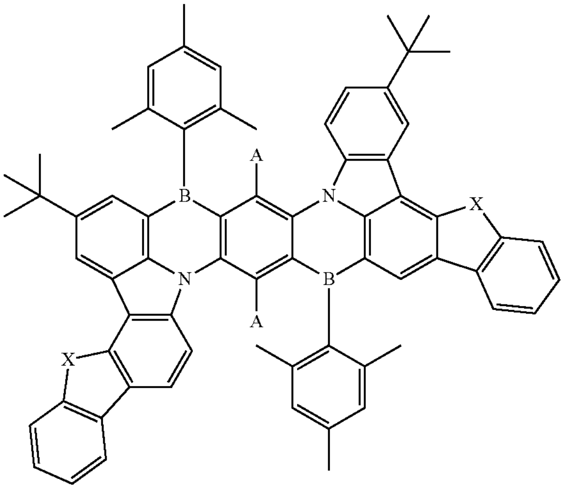
29a: A = A1
29b: A = A2
29c: A = A3
29d: A = A4
29e: A = A7
29f: A = A10
29g: A = A11
29h: A = A16
29i: A = A35
29j: A = A39
29k: A = A40
29l: A = A41
29m: A = A42

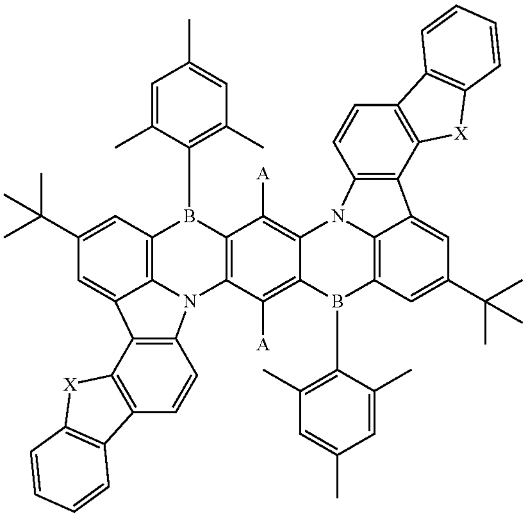
30a: A = A1
30b: A = A2
30c: A = A3
30d: A = A4
30e: A = A7
30f: A = A10
30g: A = A11
30h: A = A16
30i: A = A35
30j: A = A39
30k: A = A40
30l: A = A41
30m: A = A42
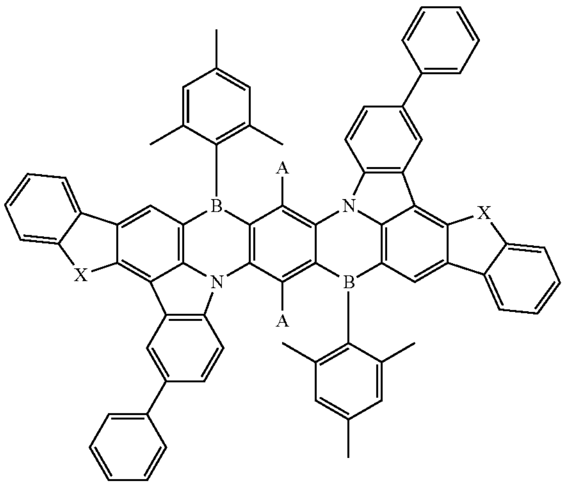
31a: A = A1
31b: A = A2
31c: A = A3
31d: A = A4
31e: A = A7
31f: A = A10
31g: A = A11
31h: A = A16
31i: A = A35
31j: A = A39
31k: A = A40
31l: A = A41
31m: A = A42
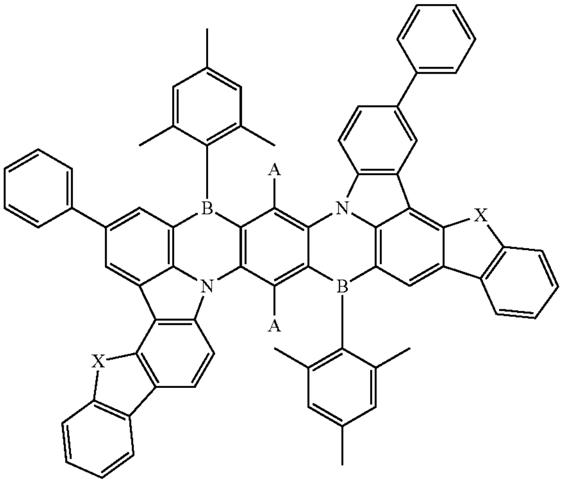
32a: A = A1
32b: A = A2
32c: A = A3
32d: A = A4
32e: A = A7
32f: A = A10
32g: A = A11
32h: A = A16
32i: A = A35
32j: A = A39
32k: A = A40
32l: A = A41
32m: A = A42
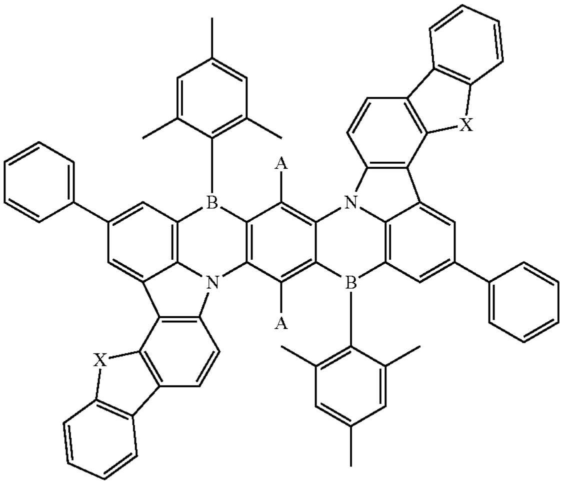
33a: A = A1
33b: A = A2
33c: A = A3
33d: A = A4
33e: A = A7
33f: A = A10
33g: A = A11
33h: A = A16
33i: A = A35
33j: A = A39
33k: A = A40
33l: A = A41
33m: A = A42

-continued
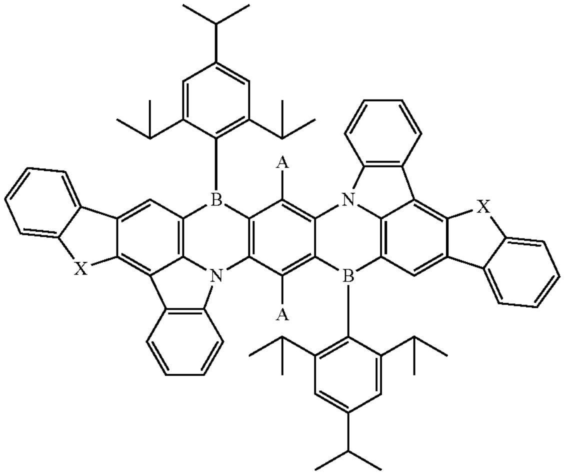
34a: A = A1
34b: A = A2
34c: A = A3
34d: A = A4
34e: A = A7
34f: A = A10
34g: A = A11
34h: A = A16
34i: A = A35
34j: A = A39
34k: A = A40
34l: A = A41
34m: A = A42
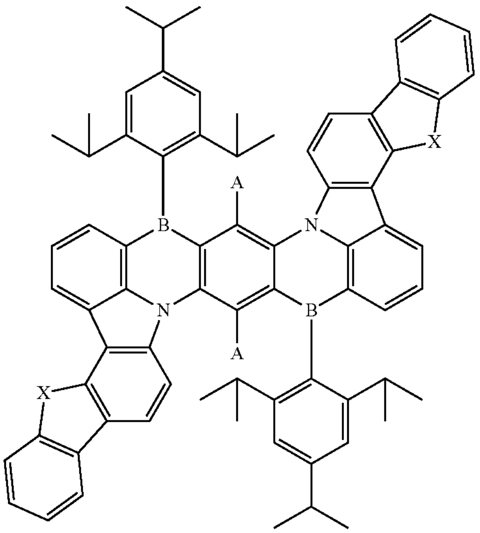
35a: A = A1
35b: A = A2
35c: A = A3
35d: A = A4
35e: A = A7
35f: A = A10
35g: A = A11
35h: A = A16
35i: A = A35
35j: A = A39
35k: A = A40
35l: A = A41
35m: A = A42
-continued
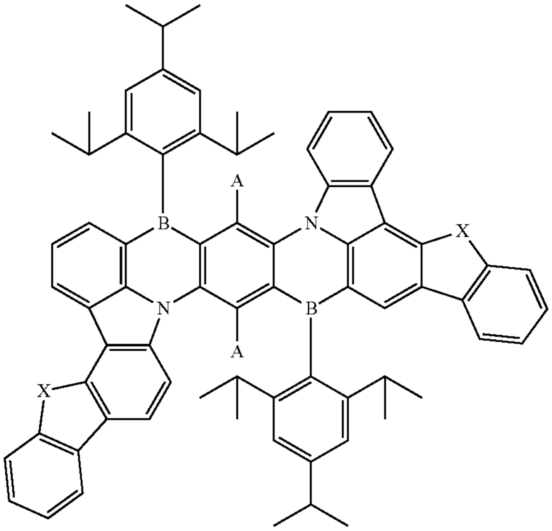
36a: A = A1
36b: A = A2
36c: A = A3
36d: A = A4
36e: A = A7
36f: A = A10
36g: A = A11
36h: A = A16
36i: A = A35
36j: A = A39
36k: A = A40
36l: A = A41
36m: A = A42
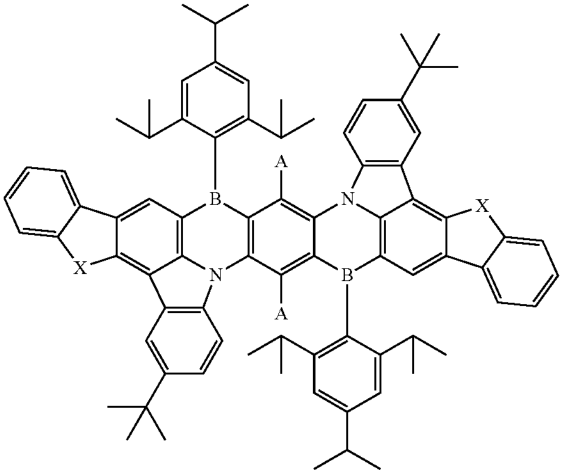
37a: A = A1
37b: A = A2
37c: A = A3
37d: A = A4
37e: A = A7
37f: A = A10
37g: A = A11
37h: A = A16
37i: A = A35
37j: A = A39
37k: A = A40
37l: A = A41
37m: A = A42

-continued
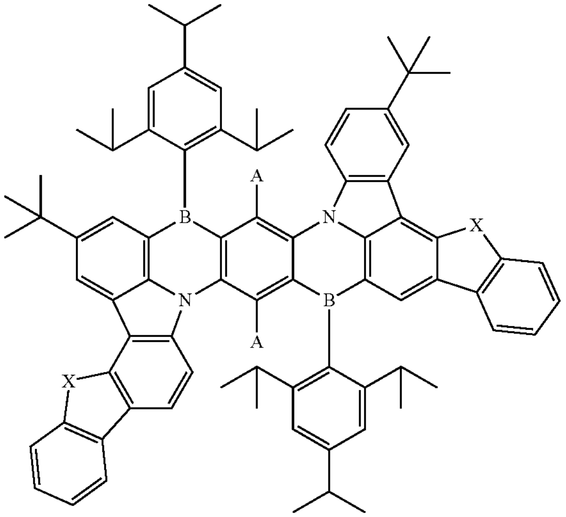
38a: A = A1
38b: A = A2
38c: A = A3
38d: A = A4
38e: A = A7
38f: A = A10
38g: A = A11
38h: A = A16
38i: A = A35
38j: A = A39
38k: A = A40
38l: A = A41
38m: A = A42
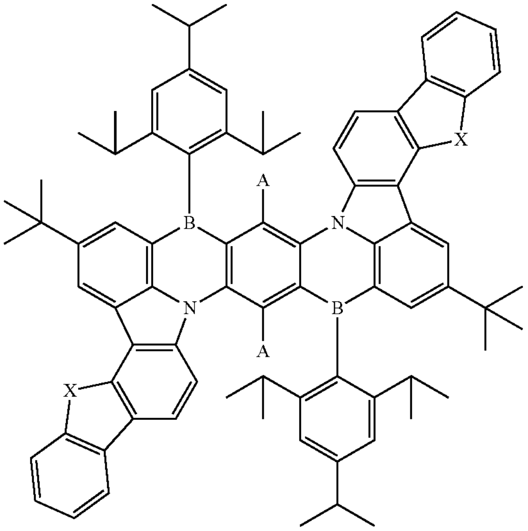
39a: A = A1
39b: A = A2
39c: A = A3
39d: A = A4
39e: A = A7
39f: A = A10
39g: A = A11
39h: A = A16
39i: A = A35
39j: A = A39
39k: A = A40
39l: A = A41
39m: A = A42
-continued
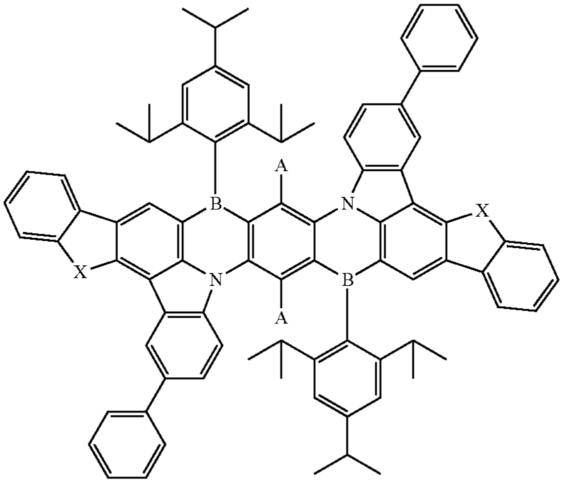
40a: A = A1
40b: A = A2
40c: A = A3
40d: A = A4
40e: A = A7
40f: A = A10
40g: A = A11
40h: A = A16
40i: A = A35
40j: A = A39
40k: A = A40
40l: A = A41
40m: A = A42
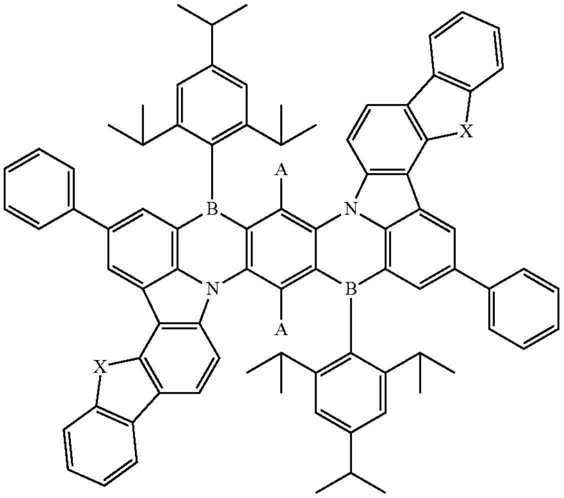
41a: A = A1
41b: A = A2
41c: A = A3
41d: A = A4
41e: A = A7
41f: A = A10
41g: A = A11
41h: A = A16
41i: A = A35
41j: A = A39
41k: A = A40
41l: A = A41
41m: A = A42

-continued
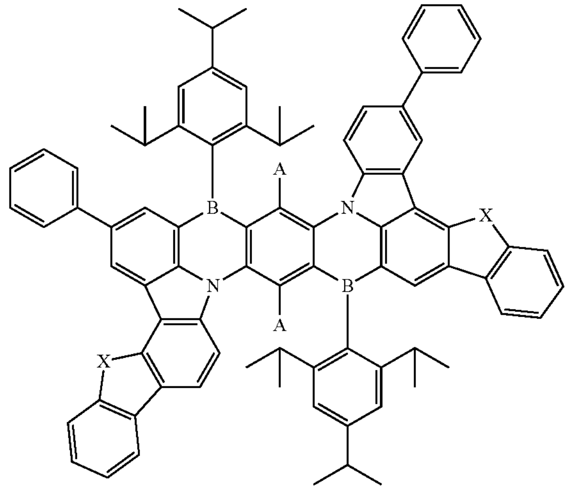
42a: A = A1
42b: A = A2
42c: A = A3
42d: A = A4
42e: A = A7
42f: A = A10
42g: A = A11
42h: A = A16
42i: A = A35
42j: A = A39
42k: A = A40
42l: A = A41
42m: A = A42
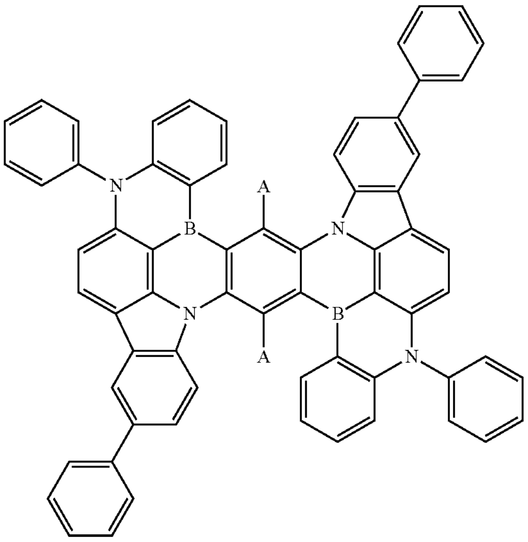
43a: A = A1
43b: A = A2
43c: A = A3
43d: A = A4
43e: A = A7
43f: A = A10
43g: A = A11
43h: A = A16
43i: A = A35
43j: A = A39
43k: A = A40
43l: A = A41
43m: A = A42
-continued
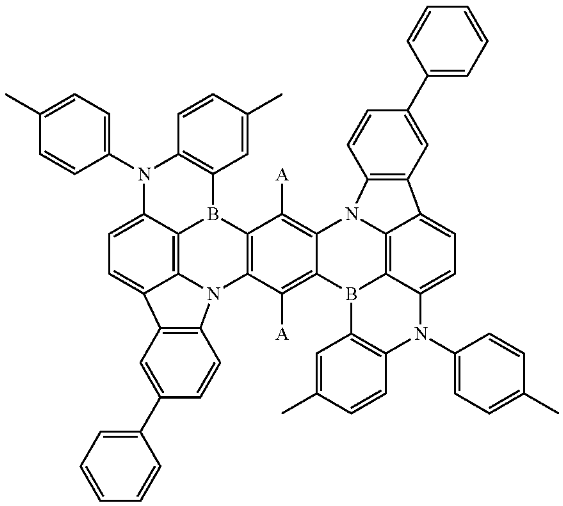
44a: A = A1
44b: A = A2
44c: A = A3
44d: A = A4
44e: A = A7
44f: A = A10
44g: A = A11
44h: A = A16
44i: A = A35
44j: A = A39
44k: A = A40
44l: A = A41
44m: A = A42
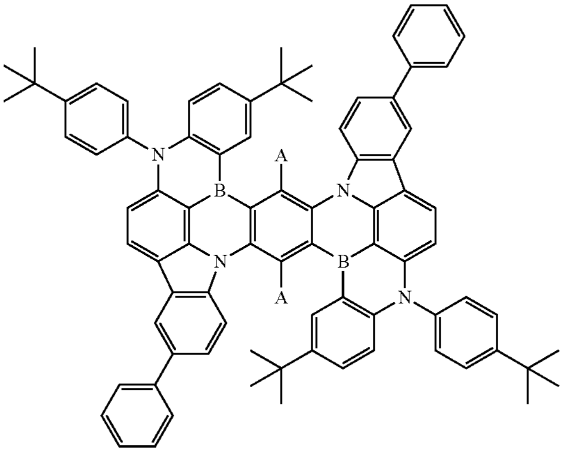
45a: A = A1
45b: A = A2
45c: A = A3
45d: A = A4
45e: A = A7
45f: A = A10
45g: A = A11
45h: A = A16
45i: A = A35
45j: A = A39
45k: A = A40
45l: A = A41
45m: A = A42

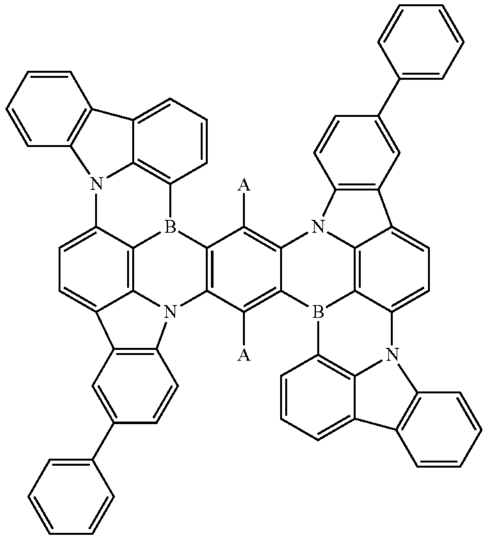
46a: A = A1
46b: A = A2
46c: A = A3
46d: A = A4
46e: A = A7
46f: A = A10
46g: A = A11
46h: A = A16
46i: A = A35
46j: A = A39
46k: A = A40
46l: A = A41
46m: A = A42
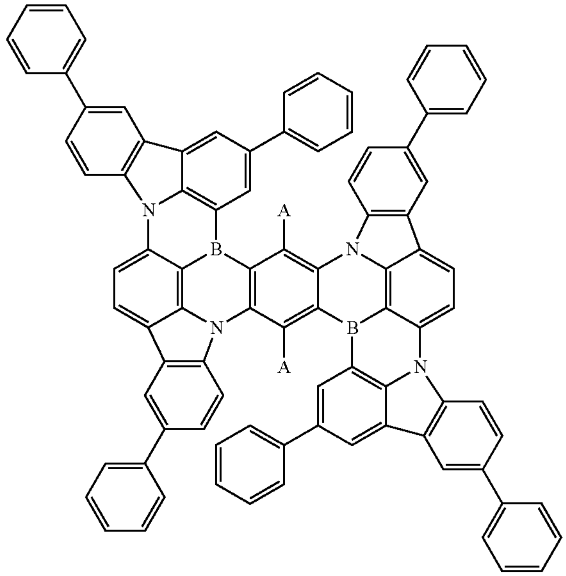
47a: A = A1
47b: A = A2
47c: A = A3
47d: A = A4
47e: A = A7
47f: A = A10
47g: A = A11
47h: A = A16
47i: A = A35
47j: A = A39
47k: A = A40
47l: A = A41
47m: A = A42
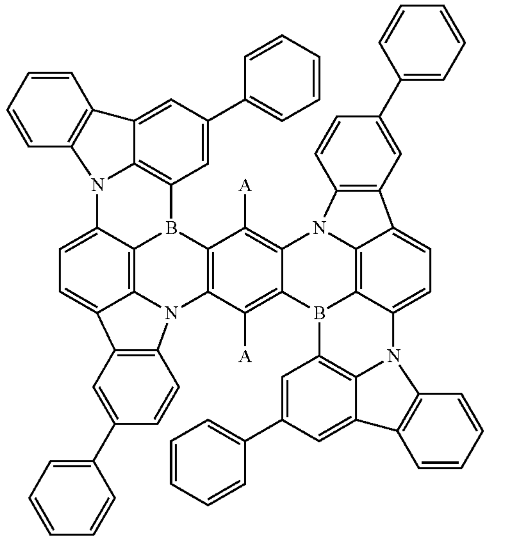
48a: A = A1
48b: A = A2
48c: A = A3
48d: A = A4
48e: A = A7
48f: A = A10
48g: A = A11
48h: A = A16
48i: A = A35
48j: A = A39
48k: A = A40
48l: A = A41
48m: A = A42
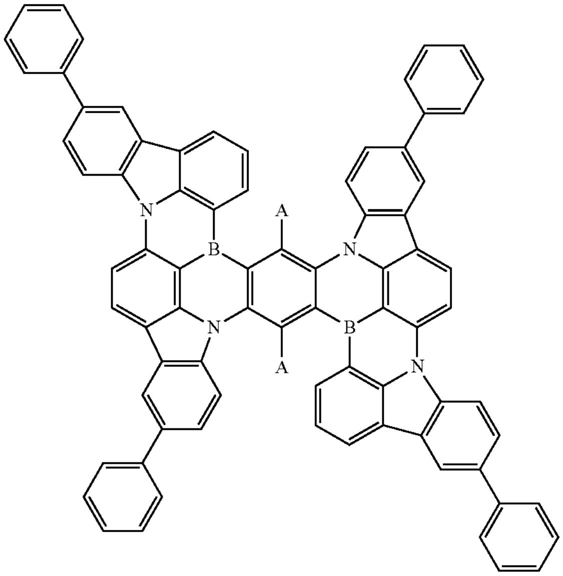
49a: A = A1
49b: A = A2
49c: A = A3
49d: A = A4
49e: A = A7
49f: A = A10
49g: A = A11
49h: A = A16

-continued

| |
|---|
| 49i: A = A35 |
| 49j: A = A39 |
| 49k: A = A40 |
| 49l: A = A41 |
| 49m: A = A42 |

In one aspect of the present invention, as for the compound represented by the formula (1), a compound having a rotationally symmetric structure is selected. In one aspect of the present invention, as the compound represented by the formula (1), a compound having an axially symmetric structure is selected. In one aspect of the present invention, as the compound represented by the formula (1), a compound having an asymmetric structure is selected.

Specific examples of a compound having an asymmetric skeleton will be given below. The compounds having asymmetric skeletons or the compounds having asymmetric structures, which may be used in the present invention, are not construed as limiting to the following specific examples. In relation to specific examples including X, it is assumed that a compound in which all X's in the molecule are oxygen atoms, and a compound in which all X's in the molecule are sulfur atoms are disclosed, respectively. A compound in which some of X's in the molecule are oxygen atoms, and the rest are sulfur atoms may also be adopted.

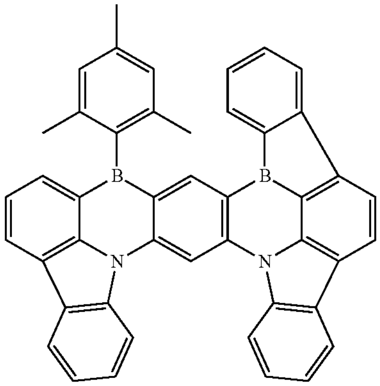

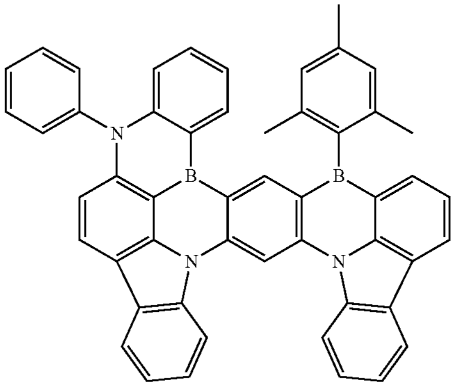

-continued

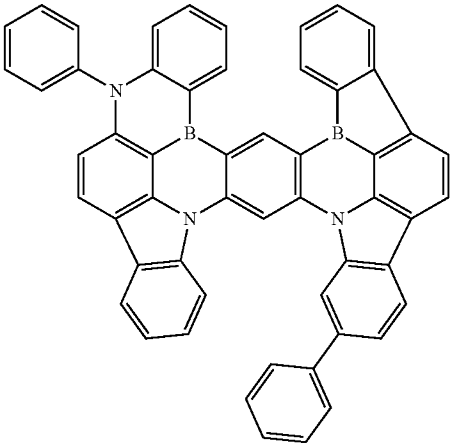

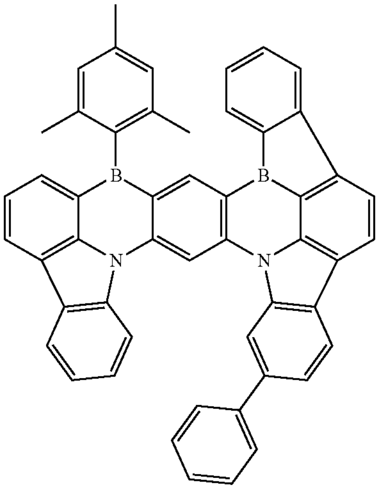

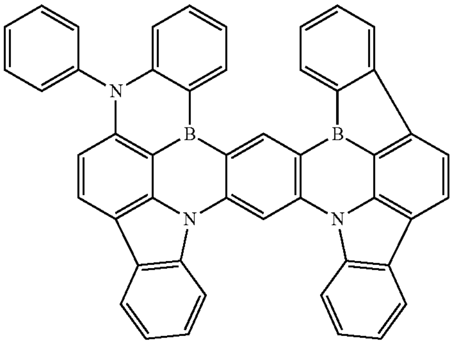

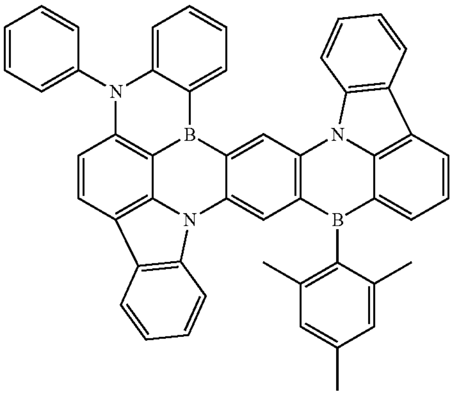

-continued
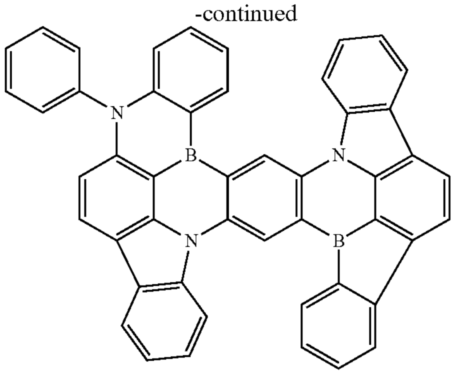
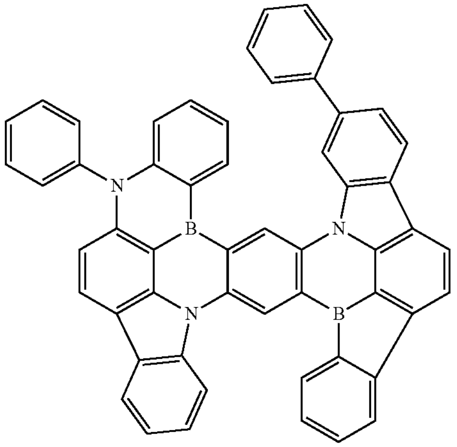
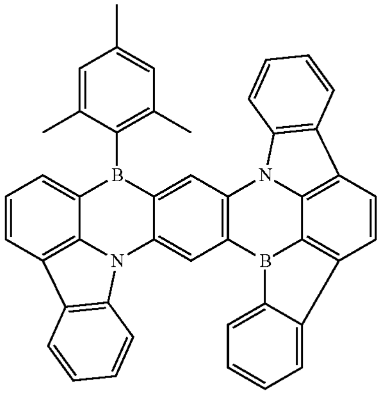
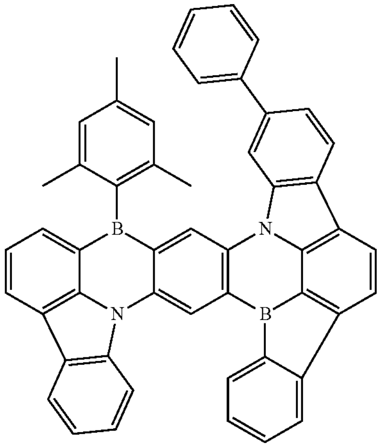
-continued
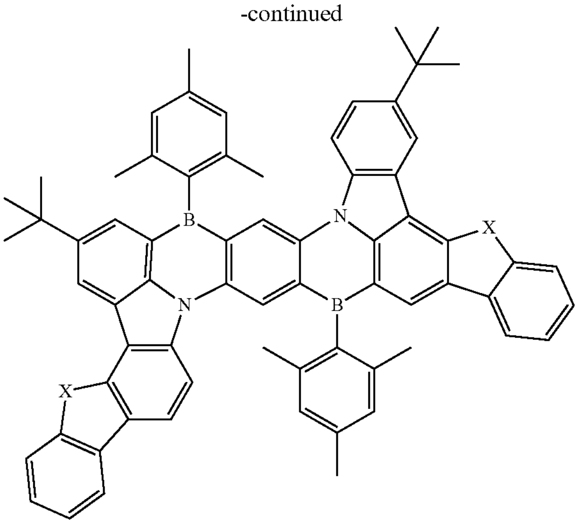
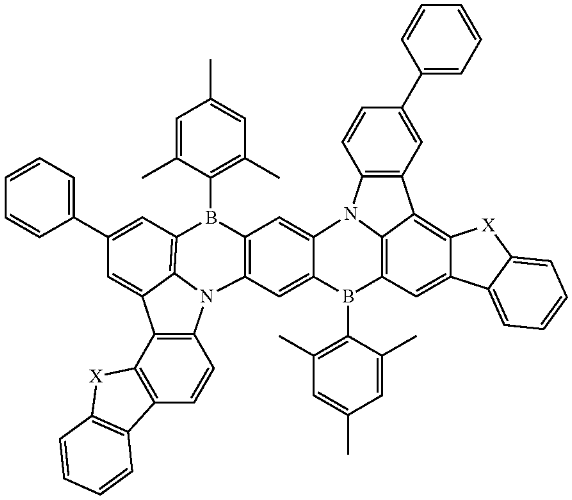
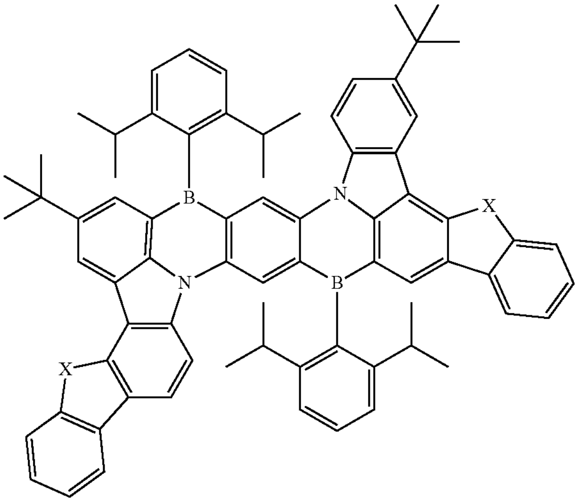

-continued
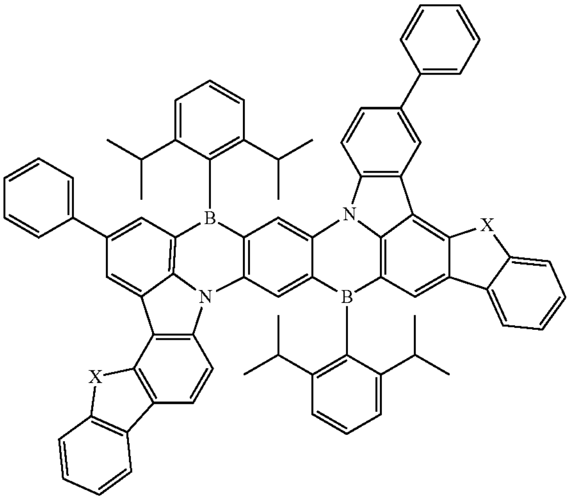
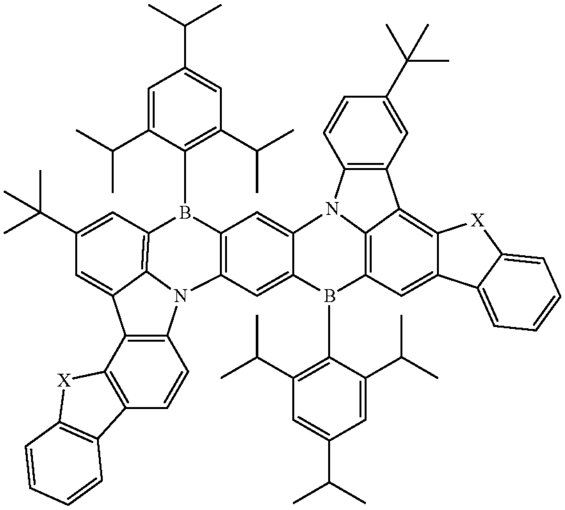
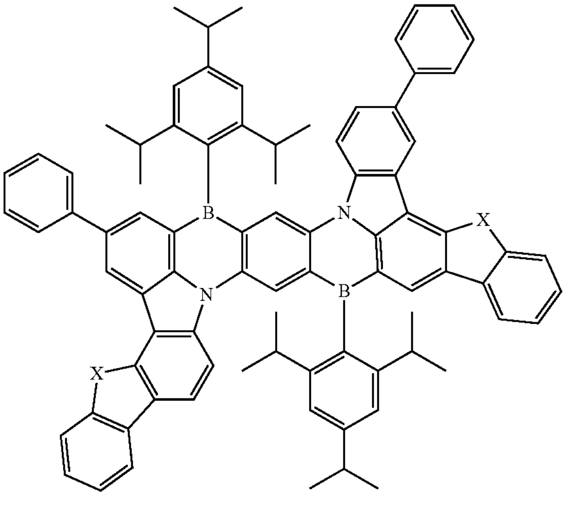
-continued
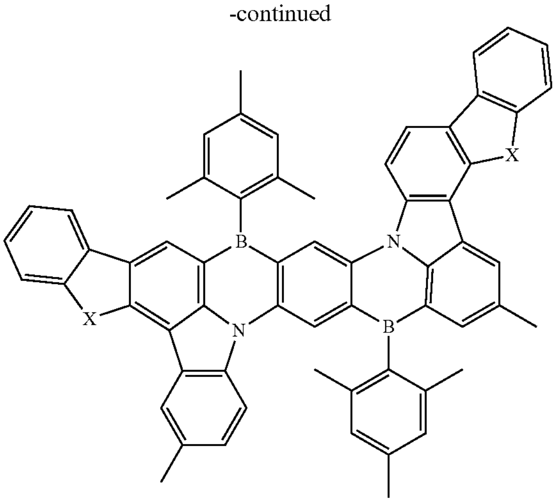
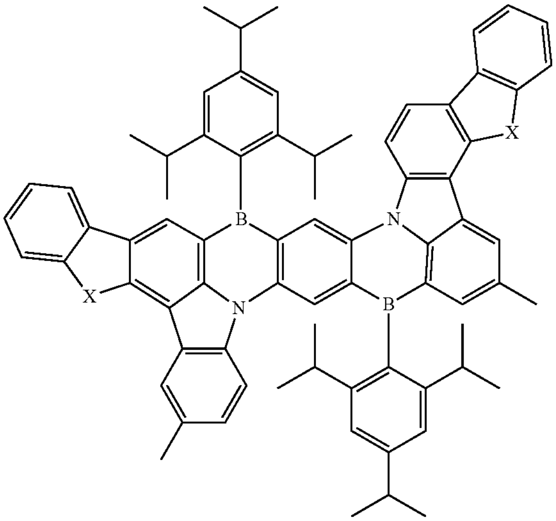
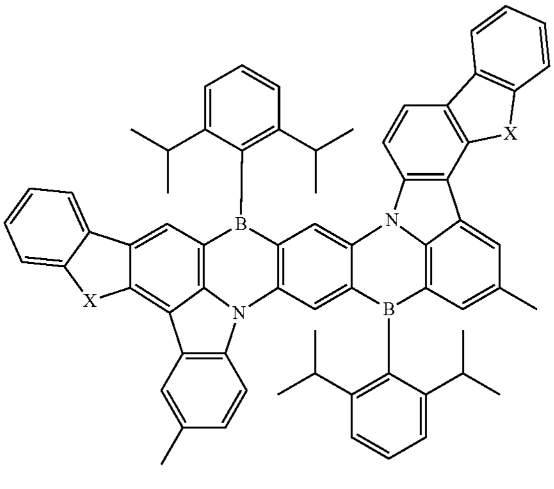

-continued
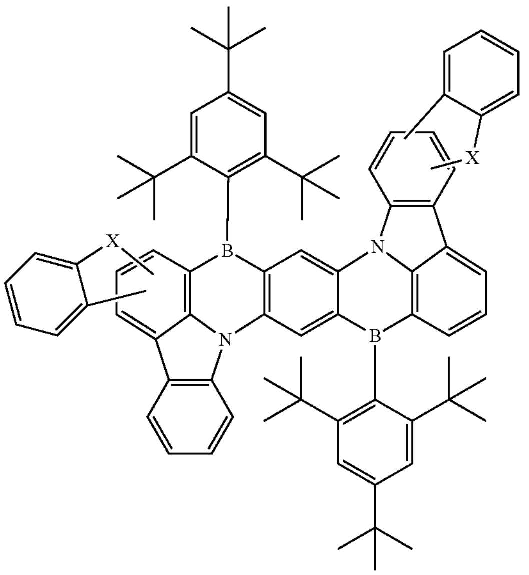
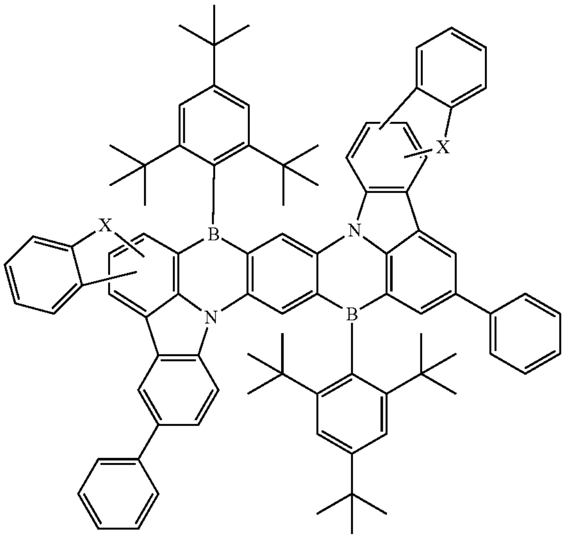
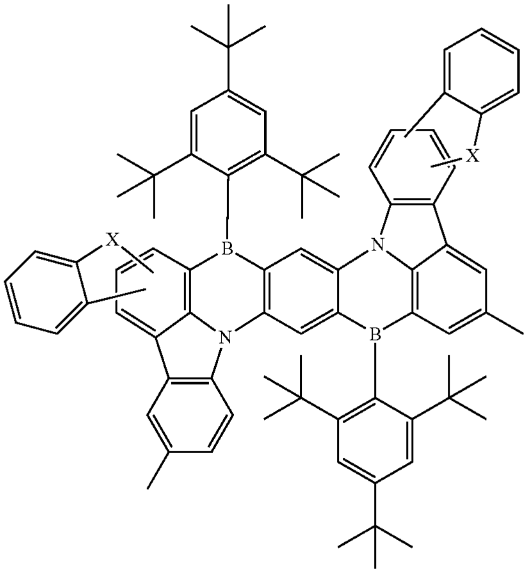
-continued
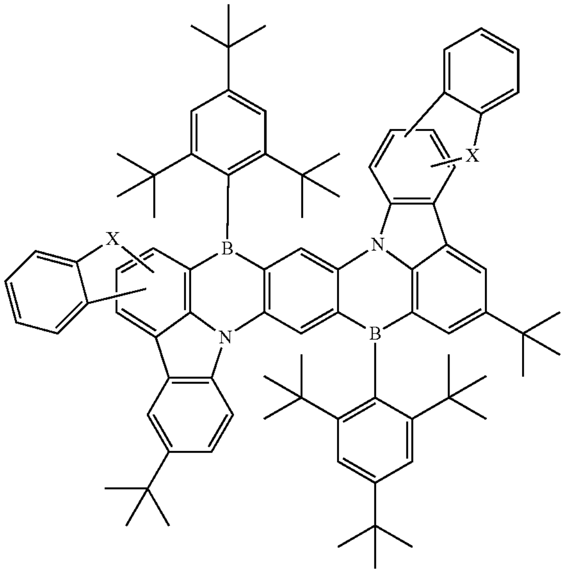
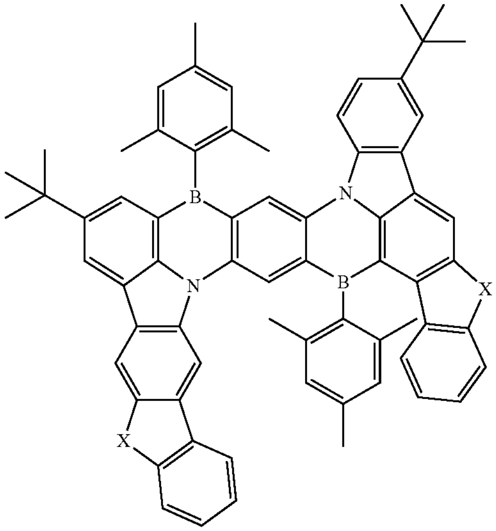
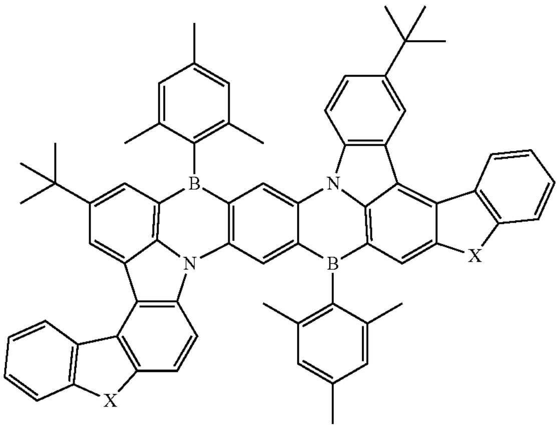

-continued
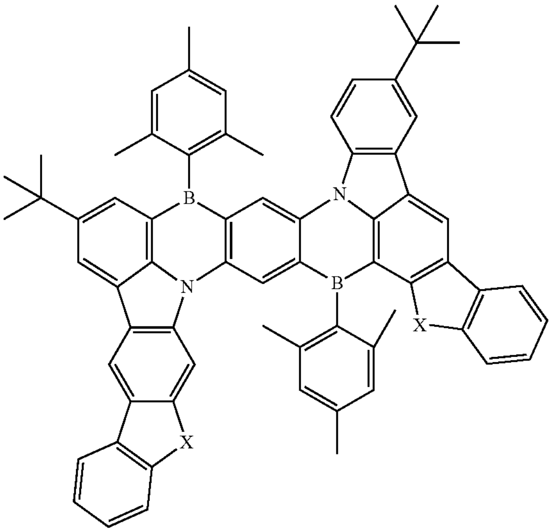
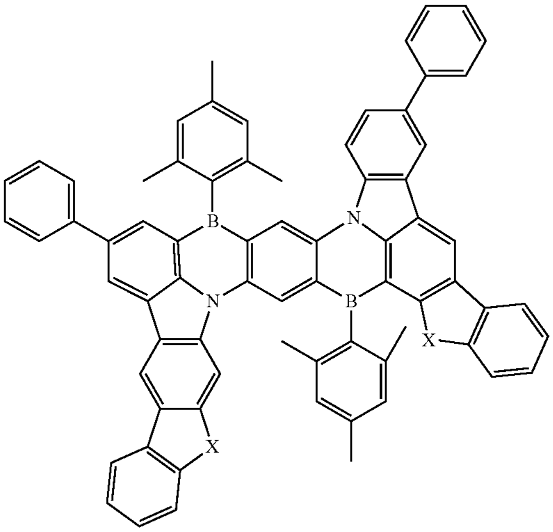
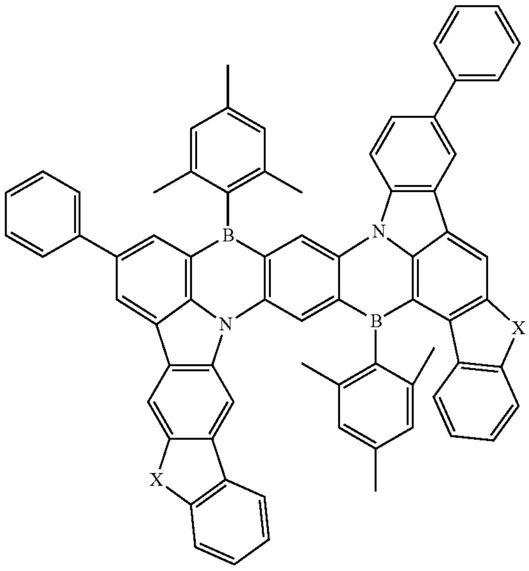
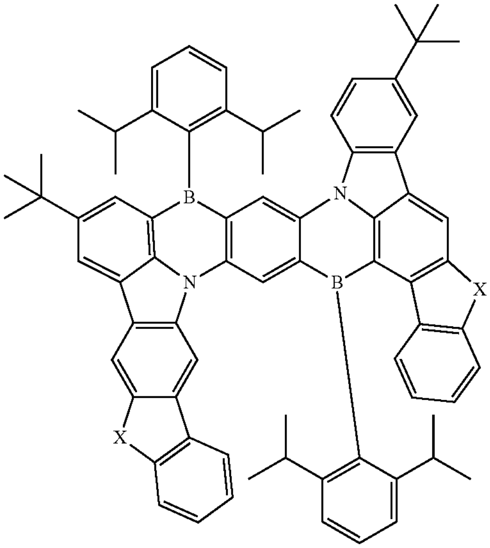
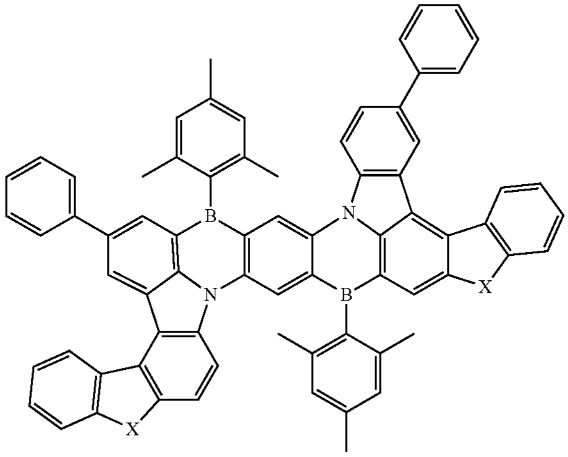
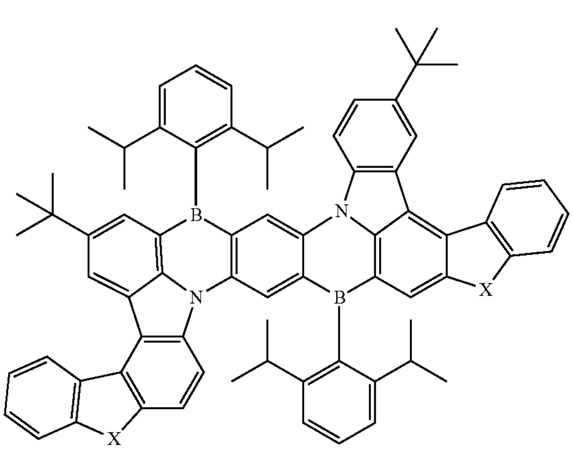

-continued
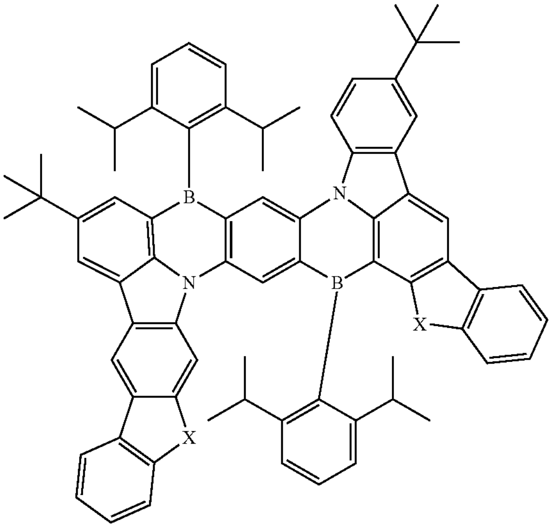
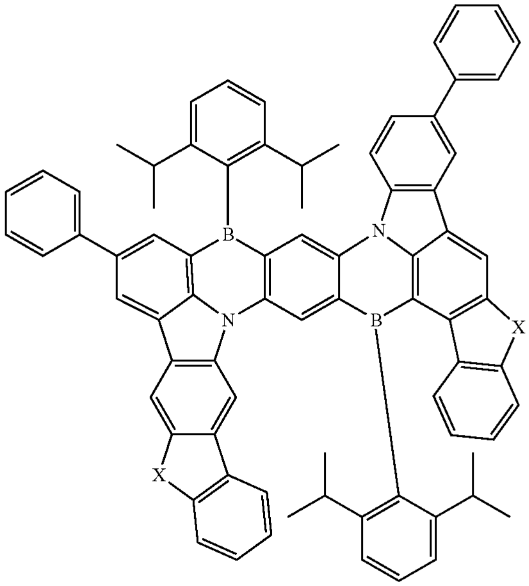
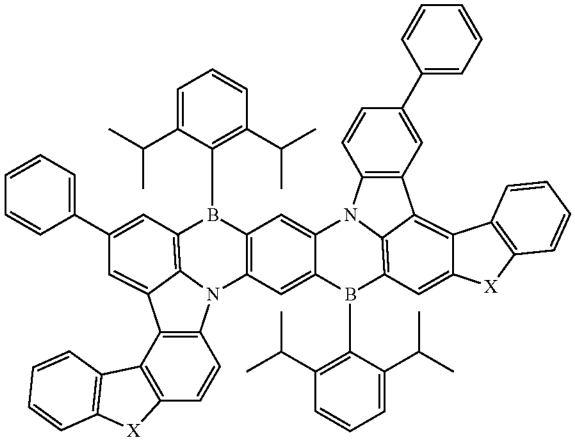
-continued
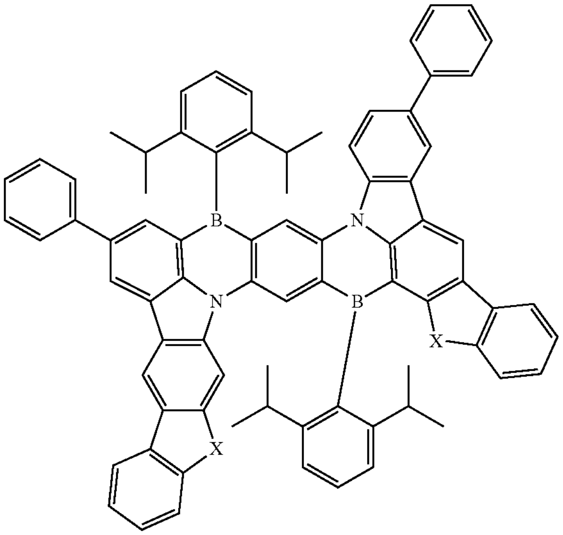
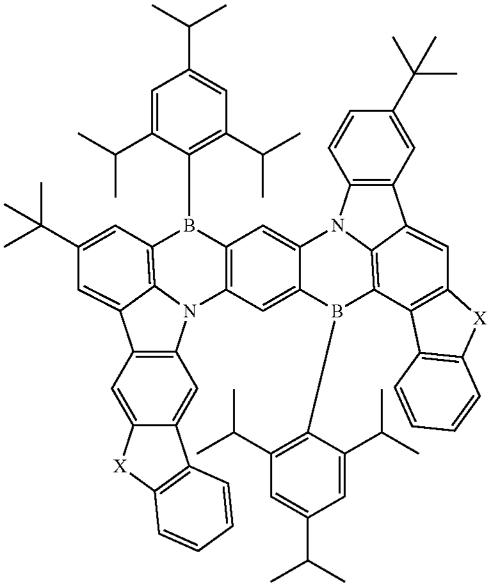
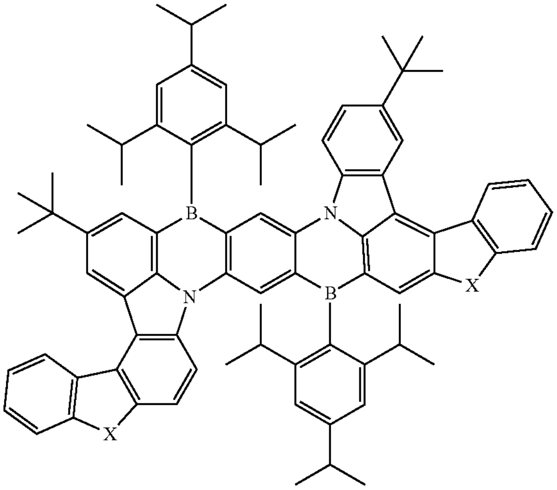

-continued
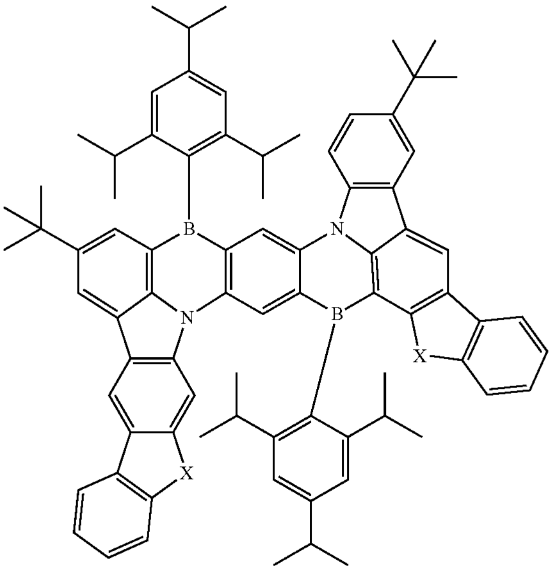
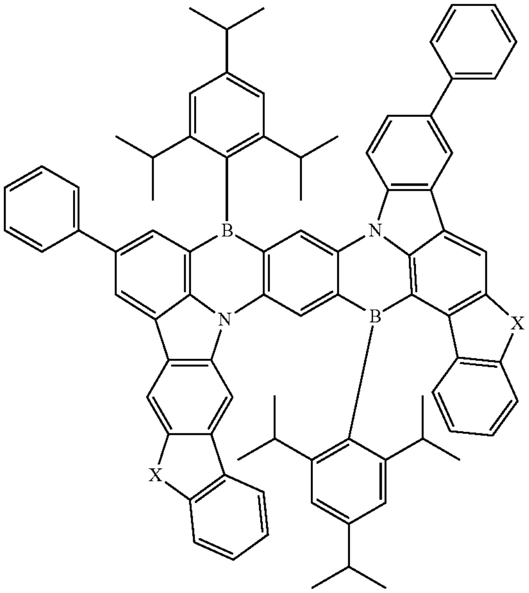
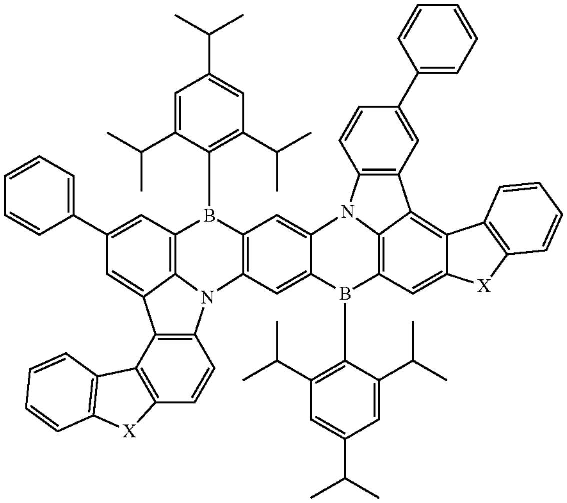
-continued
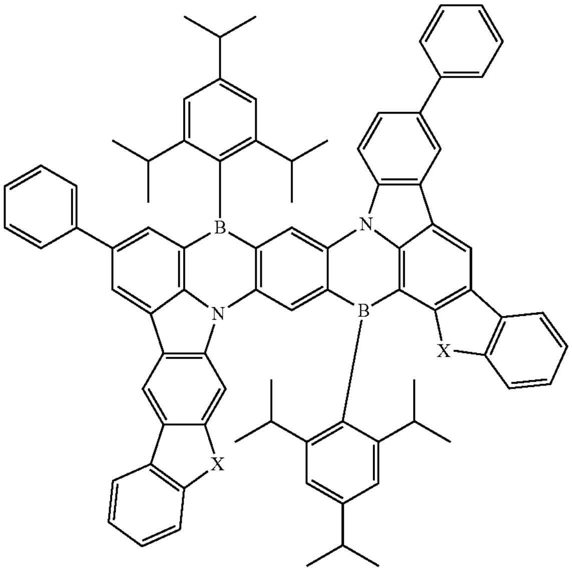
Hereinafter, specific examples of a compound that has a symmetric skeleton but has an asymmetric structure because a substituent is asymmetrically bonded will be given. The compounds having asymmetric structures, which may be used in the present invention, are not construed as limiting to the following specific examples.
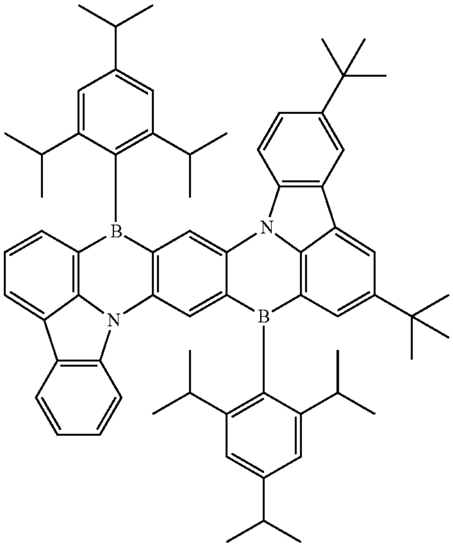

-continued
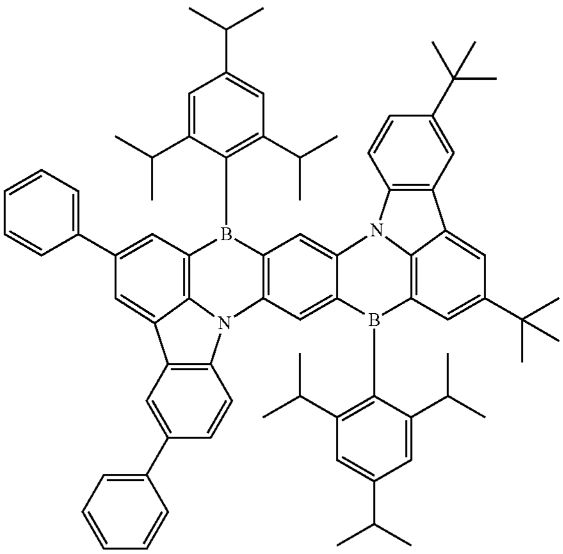
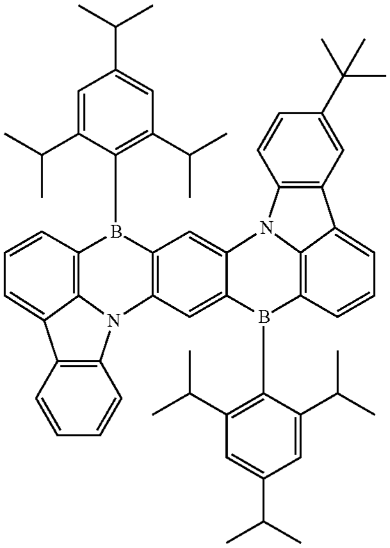
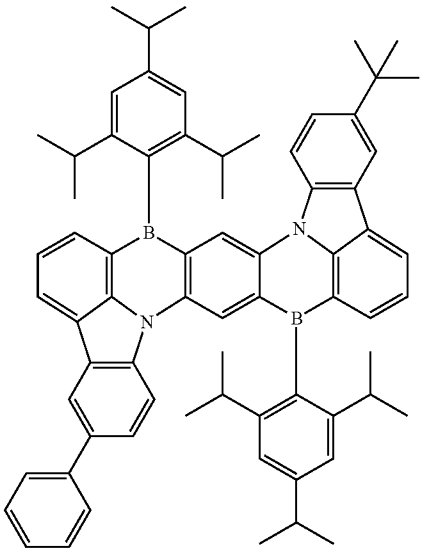
-continued
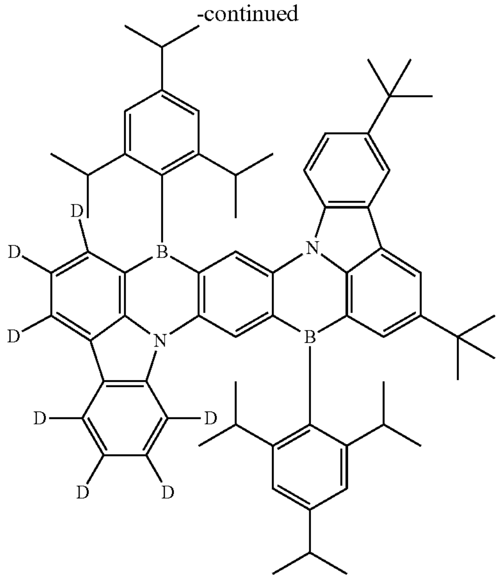
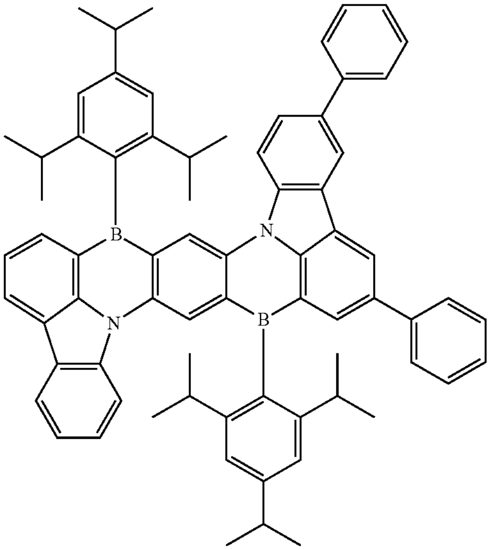
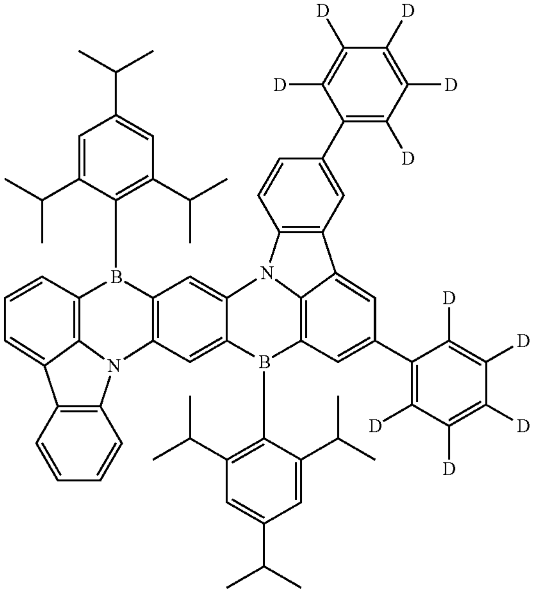

-continued

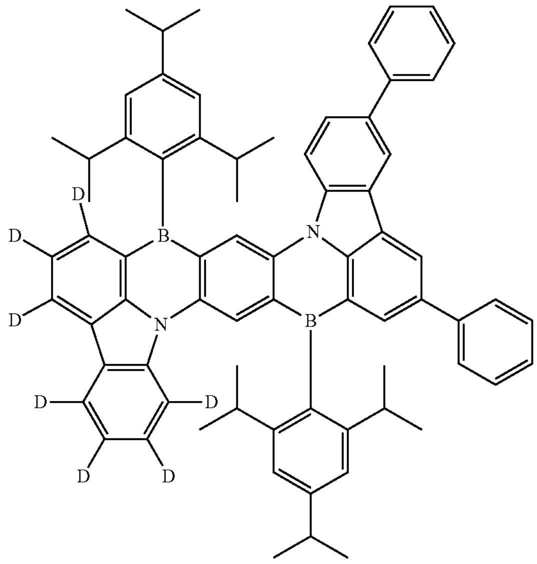

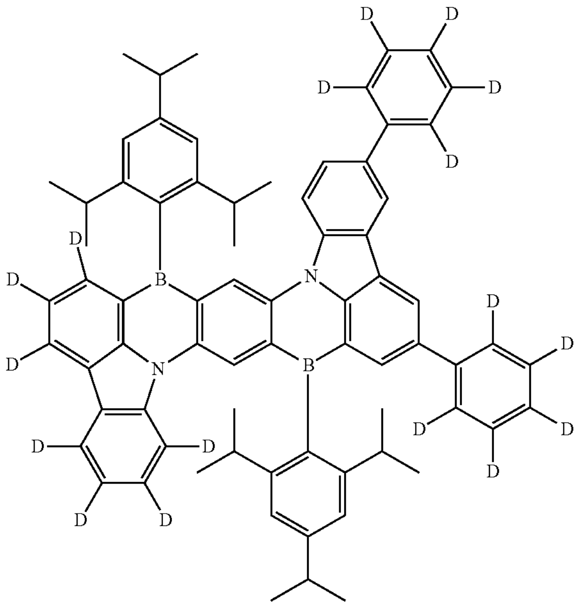

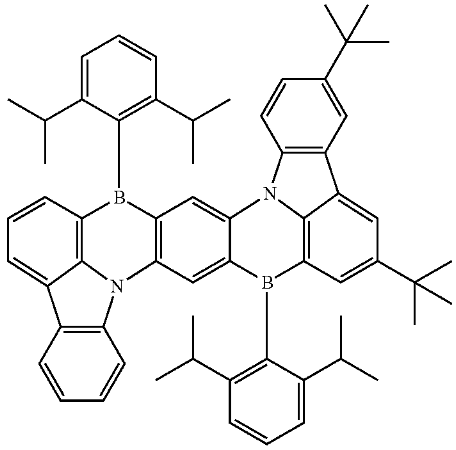

-continued

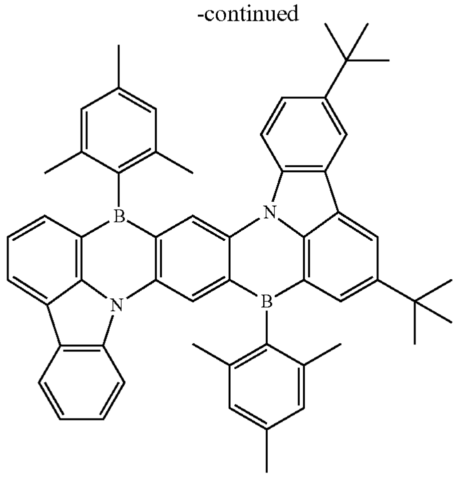

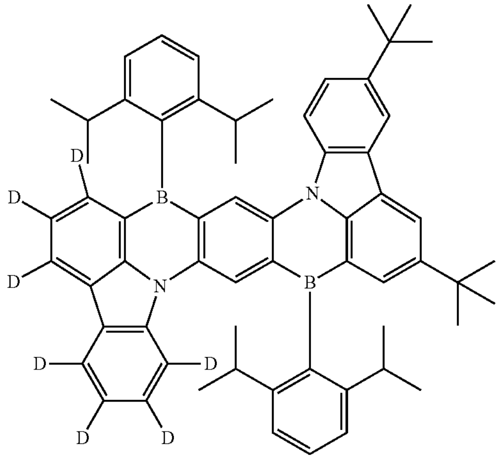

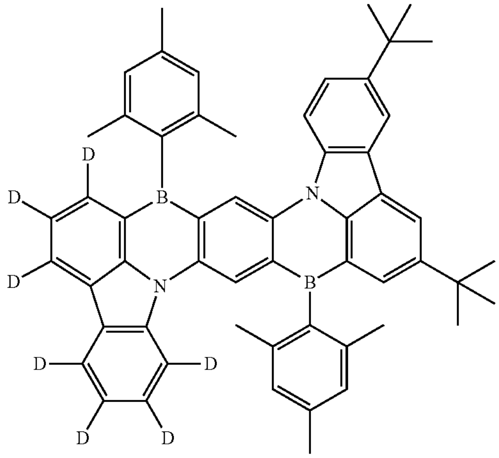

In one aspect of the present invention, $R^3$ in the formula (1) is not a diarylamino group (two aryl groups constituting the diarylamino group may be bonded to each other). In a preferred aspect of the present invention. $R^3$ in the formula (1) is a hydrogen atom, a deuterium atom, or an acceptor group (not a donor group).

In one aspect of the present invention, at least one of n1 to n4 in the formula (1a) is 1 or more. In a preferred aspect of the present invention, at least one of m1 and m2 in the formula (1a) is 1 or more. In a more preferable aspect of the present invention, at least one of n1 to n4 in the formula (1a) is 1 or more, and moreover, at least one of m1 and m2 in the formula (1a) is 1 or more.

In one aspect of the present invention, at least one of n5 to n8 in the formula (1b) is 1 or more. In a preferred aspect of the present invention, at least one of m3 and m4 in the formula (1b) is 1 or more. In a more preferable aspect of the present invention, at least one of n5 to n8 in the formula (1b) is 1 or more, and moreover, at least one of m3 and m4 in the formula (1a) is 1 or more.

When at least one of m1 and m2 is 1 or more, and at least one of m3 and m4 is 1 or more, it is preferable that at least one of $R^{41}$ and $R^{42}$ and at least one of $R^{43}$ and $R^{44}$ are alkyl groups which may be substituted with deuterium atoms. For example, all of $R^{41}$ to $R^{44}$ are alkyl groups which may be substituted with deuterium atoms. When at least one of n1 to n4 is 1 or more, and at least one of n5 to n8 is 1 or more, it is preferable that at least one of $Ar^1$ to $Ar^4$ and at least one of $Ar^5$ to $Ar^8$ are aryl groups which may be substituted with deuterium atoms or alkyl groups. For example, all of $Ar^1$ to $Ar^8$ are aryl groups which may be substituted with deuterium atoms or alkyl groups.

In one aspect of the present invention, when $X^1$ in the formula (1) is a boron atom, and $R^8$, $R^{10}$, $R^{12}$, $R^{13}$, $R^{15}$, and $R^{17}$ are alkyl groups (or methyl groups), at least one of $R^1$ to $R^7$, $R^{18}$ to $R^{20}$, and $R^{23}$ to $R^{26}$ is a substituent, preferably a group of a substituent group E, and is, for example, an aryl group that may be substituted with a deuterium atom or an alkyl group. In one aspect of the present invention, when $X^2$ in the formula (1) is a boron atom, and $R^8$, $R^{10}$, $R^{12}$, $R^{22}$, $R^{24}$, and $R^{26}$ are alkyl groups (or methyl groups), at least one of $R^1$ to $R^7$, $R^{13}$ to $R^{16}$, and $R^{19}$ to $R^{21}$ is a substituent, preferably a group of a substituent group E, and is, for example, an aryl group that may be substituted with a deuterium atom or an alkyl group.

In one aspect of the present invention, when $X^1$ in the formula (1) is a boron atom, and any one of sets of $R^8$ and $R^9$, and $R^9$ and $R^{10}$, and any one of sets of $R^{15}$ and $R^{16}$, and $R^{16}$ and $R^{17}$ are bonded to each other to form an aromatic ring (or a benzene ring), at least one of $R^1$ to $R^7$, $R^{18}$ to $R^{20}$, and $R^{23}$ to $R^{26}$ is a substituent, preferably a group of a substituent group E, and is, for example, an aryl group that may be substituted with a deuterium atom or an alkyl group. In one aspect of the present invention, when $X^2$ in the formula (1) is a boron atom, and any one of sets of $R^8$ and $R^9$, and $R^9$ and $R^{10}$, and any one of sets of $R^{22}$ and $R^{23}$, and $R^{23}$ and $R^{24}$ are bonded to each other to form an aromatic ring (or a benzene ring), at least one of $R^1$ to $R^7$, $R^{13}$ to $R^{16}$, and $R^{19}$ to $R^{21}$ is a substituent, preferably a group of a substituent group E, and is, for example, an aryl group that may be substituted with a deuterium atom or an alkyl group.

In one aspect of the present invention, $R^9$ and $R^{11}$ in the formula (1) are neither cyano groups nor alkyl groups. That is, $R^9$ and $R^{11}$ are hydrogen atoms, deuterium atoms, or substituents other than cyano groups and alkyl groups. In one aspect of the present invention, $R^9$ and $R^{11}$ in the formula (1) are neither cyano groups nor tert-butyl groups.

In a preferred aspect of the present invention, at least one of $R^8$ to $R^{12}$ in the formula (1) is a substituent.

In one aspect of the present invention, $R^3$ in the formula (1) is not a substituted amino group or aryl group. In one aspect of the present invention, $R^3$ in the formula (1) is not a substituted amino group or phenyl group. In one aspect of the present invention. $R^3$ in the formula (1) is not a dimethylamino group, a diphenylamino group, or a phenyl group.

In a preferred aspect of the present invention, at least one of $R^1$ to $R^{26}$ in the formula (1) is a substituent. More preferably, at least one of $R^1$ to $R^{26}$ is an alkyl group, and is, for example, an alkyl group having 1 to 4 carbon atoms.

The molecular weight of the compound represented by the formula (1) is preferably 1500 or less, more preferably 1200 or less, further preferably 1000 or less, still further preferably 900 or less, for example, when there is an intention to form and use a film of an organic layer containing the compound represented by the formula (1) through a vapor deposition method. The lower limit value of the molecular weight is the molecular weight of the smallest compound in the compound group represented by the formula (1). It is preferably 624 or more.

The compound represented by the formula (1) may be formed into a film through a coating method regardless of the molecular weight. When the coating method is used, it is possible to form a film even if the compound has a relatively large molecular weight. The compound represented by the formula (1) has an advantage of ease of dissolution in an organic solvent. Thus, for the compound represented by the formula (1), it is easy to apply a coating method, and moreover it is also easy to increase the purity through purification.

The compound represented by the formula (1) has high orientation in the film. In particular, the orientation in the film is particularly high when at least one of $R^1$ to $R^7$, and $R^{13}$ to $R^{26}$ in the formula (1) is a substituent, or when at least one of $R^1$ to $R^7$, $R^{14}$ to $R^{16}$, $R^{19}$, $R^{20}$, and $R^{23}$ to $R^{26}$ is preferably a substituent, further preferably a group of a substituent group E (for example, an aryl group that may be substituted with a deuterium atom or an alkyl group). Such high orientation is preferably exhibited in the film containing the compound represented by the formula (1) together with a host material. Further, such high orientation is preferably exhibited in the film containing the compound represented by the formula (1) together with a host material, and a delayed fluorescence material that functions as an assist dopant. When the compound exhibiting such high orientation is used, it is possible to provide an organic light-emitting device having high luminous efficiency. The orientation may be evaluated by an orientation value (S value). A larger negative value (a smaller numerical value) indicates that the orientation is higher. The orientation value (S value) may be determined by the method described in Scientific Reports 2017, 7, 8405. In the film of the present invention, the orientation value of the compound represented by the formula (1) is preferably less than −0.25, more preferably less than −0.30, further preferably less than −0.35, particularly preferably less than −0.40.

Through an application of the present invention, the use of a compound including a plurality of structures represented by the formula (1) in the molecule, as a light-emitting material, may be taken into consideration.

For example, when a polymerizable group exists in advance in the structure represented by the formula (1), the use of a polymer obtained by polymerizing the polymerizable group as the light-emitting material may be taken into consideration. Specifically, when a monomer including a polymerizable functional group is prepared in any of the structures represented by the formula (1), and this is polymerized alone, or is copolymerized with another monomer so as to obtain a polymer having repeating units, the use of the polymer as the light-emitting material may be taken into consideration. Alternatively, when a dimer or a trimer is obtained by coupling compounds represented by the formula (1) with each other, the use of these as the light-emitting material may also be taken into consideration.

As examples of the polymer having the repeating unit including the structure represented by the formula (1), polymers including the structures represented by the following formulas may be mentioned.

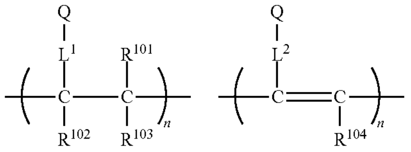

In the above formulas, Q represents a group including the structure represented by the formula (1), and $L^1$ and $L^2$ represent linking groups. The number of carbon atoms in the linking group is preferably 0 to 20, more preferably 1 to 15, further preferably 2 to 10. The linking group preferably has a structure represented by $-X^{11}-L^{11}-$. Here, $X^{11}$ represents an oxygen atom or a sulfur atom, and an oxygen atom is preferable. $L^{11}$ represents a linking group, and is preferably a substituted or unsubstituted alkylene group, or a substituted or unsubstituted arylene group, more preferably a substituted or unsubstituted alkylene group having 1 to 10 carbon atoms, or a substituted or unsubstituted phenylene group.

Each of $R^{101}$, $R^{102}$, $R^{103}$ and $R^{104}$ independently represents a substituent. It is preferably a substituted or unsubstituted alkyl group having 1 to 6 carbon atoms, a substituted or unsubstituted alkoxy group having 1 to 6 carbon atoms, or a halogen atom, more preferably an unsubstituted alkyl group having 1 to 3 carbon atoms, an unsubstituted alkoxy group having 1 to 3 carbon atoms, a fluorine atom, or a chlorine atom, further preferably an unsubstituted alkyl group having 1 to 3 carbon atoms, or an unsubstituted alkoxy group having 1 to 3 carbon atoms.

The linking group represented by $L^1$ and $L^2$ may be bonded to any position of the structure which is represented by the formula (1) and constitutes Q. Two or more linking groups may be linked to one Q to form a crosslinked structure or a network structure.

As specific structural examples of the repeating unit, structures represented by the following formulas may be mentioned.

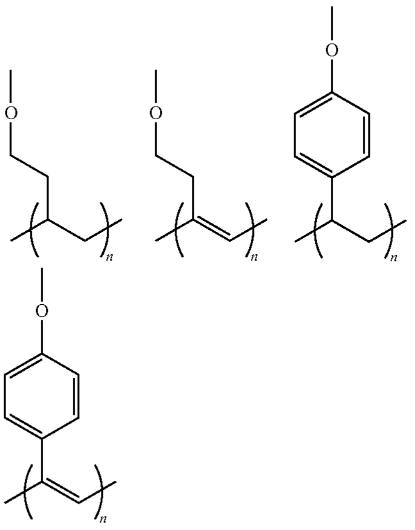

In synthesizing a polymer having repeating units including these formulas, a hydroxy group is introduced at any position of the structure represented by the formula (1), and the following compound is reacted using the hydroxy group as a linker so that a polymerizable group may be introduced, and the polymerizable group may be polymerized.

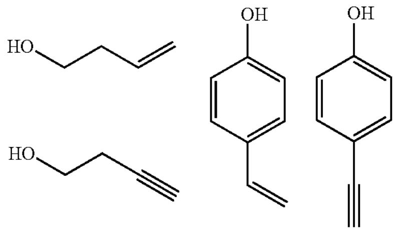

The polymer including the structure represented by the formula (1) in the molecule may be a polymer composed of only repeating units having the structure represented by the formula (1), or may be a polymer including repeating units having another structure. Further, the repeating units having the structure represented by the formula (1), which are included in the polymer, may be of a single type, or two or more types. As a repeating unit not having the structure represented by the formula (1), those derived from monomers used in a general copolymerization may be mentioned. For example, a repeating unit derived from a monomer having an ethylenically unsaturated bond such as ethylene, or styrene may be mentioned.

It is preferable that the compound represented by the formula (1) does not include a metal atom. The metal atom mentioned herein does not include a boron atom. For example, as the compound represented by the formula (1), a compound including an atom selected from the group consisting of a carbon atom, a hydrogen atom, a deuterium atom, a nitrogen atom, an oxygen atom, a sulfur atom, and a boron atom may be selected. For example, as the compound represented by the formula (1), a compound including an atom selected from the group consisting of a carbon atom, a hydrogen atom, a deuterium atom, a nitrogen atom, an oxygen atom, and a boron atom may be selected. For example, as the compound represented by the formula (1), a compound including an atom selected from the group consisting of a carbon atom, a hydrogen atom, a deuterium atom, a nitrogen atom, a sulfur atom, and a boron atom may be selected. For example, as the compound represented by the formula (1), a compound including an atom selected from the group consisting of a carbon atom, a hydrogen atom, a deuterium atom, a nitrogen atom, and a boron atom may be selected. For example, as the compound represented by the formula (1), a compound including an atom selected from the group consisting of a carbon atom, a hydrogen atom, a nitrogen atom, an oxygen atom, a sulfur atom, and a boron atom may be selected.

In the present specification, the "alkyl group" may take any of linear, branched, and cyclic shapes. Further, two or more types of the linear portion, the cyclic portion, and the branched portion may be mixed. The number of carbon atoms of the alkyl group may be, for example, one or more, two or more, or four or more. Further, the number of carbon atoms may be 30 or less, 20 or less, 10 or less, 6 or less, or 4 or less. Specific examples of the alkyl group include a methyl group, an ethyl group, a n-propyl group, an isopropyl group, a n-butyl group, an isobutyl group, a tert-butyl group, a n-pentyl group, an isopentyl group, a n-hexyl group, an isohexyl group, a 2-ethylhexyl group, a n-heptyl group, an isoheptyl group, a n-octyl group, an isooctyl group, a n-nonyl group, an isononyl group, a n-decanyl group, an isodecanyl group, a cyclopentyl group, a cyclohexyl group, and a cycloheptyl group. The alkyl group as a substituent may be further substituted with an aryl group.

The "alkenyl group" may take any of linear, branched, and cyclic shapes. Further, two or more types of the linear portion, the cyclic portion, and the branched portion may be mixed. The number of carbon atoms of the alkenyl group may be, for example, two or more, or four or more. Further, the number of carbon atoms may be 30 or less, 20 or less, 10 or less, 6 or less, or 4 or less. Specific examples of the alkenyl group include an ethenyl group, a n-propenyl group, an isopropenyl group, a n-butenyl group, an isobutenyl group, a n-pentenyl group, an isopentenyl group, a n-hexenyl group, an isohexenyl group, and a 2-ethylhexenyl group. The alkenyl group as a substituent may be further substituted with a substituent.

The "aryl group" and the "heteroaryl group" may be monocycles, or may be condensed rings in which two or more rings are condensed. In the case of the condensed ring, the number of rings for condensation is preferably two to six, and, for example, may be selected from two to four. Specific examples of the ring include a benzene ring, a pyridine ring, a pyrimidine ring, a triazine ring, a naphthalene ring, an anthracene ring, a phenanthrene ring, a triphenylene ring, a quinoline ring, a pyrazine ring, a quinoxaline ring, and a naphthiridine ring, and these may be condensed to form a ring. Specific examples of the aryl group or the heteroaryl group include a phenyl group, a 1-naphthyl group, a 2-naphthyl group, a 1-anthrasenyl group, a 2-anthrasenyl group, a 9-anthrasenyl group, a 2-pyridyl group, a 3-pyridyl group, and a 4-pyridyl group. The number of ring skeleton forming atoms of the aryl group is preferably 6 to 40, more preferably 6 to 20, and may be selected in a range of 6 to 14, or selected in a range of 6 to 10. The number of ring skeleton forming atoms of the heteroaryl group is preferably 4 to 40, more preferably 5 to 20, and may be selected in a range of 5 to 14, or selected in a range of 5 to 10. The "arylene group" and the "heteroaryl group" may be those obtained by changing the valence in the descriptions for the aryl group and the heteroaryl group, from 1 to 2.

The "substituent group A" in the present specification means one group selected from the group consisting of a hydroxy group, a halogen atom (e.g., a fluorine atom, a chlorine atom, a bromine atom, an iodine atom), an alkyl group (e.g., 1 to 40 carbon atoms), an alkoxy group (e.g., 1 to 40 carbon atoms), an alkylthio group (e.g., 1 to 40 carbon atoms), an aryl group (e.g., 6 to 30 carbon atoms), an aryloxy group (e.g., 6 to 30 carbon atoms), an arylthio group (e.g., 6 to 30 carbon atoms), a heteroaryl group (e.g., 5 to 30 ring skeleton forming atoms), a heteroaryloxy group (e.g., 5 to 30 ring skeleton forming atoms), a heteroarylthio group (e.g., 5 to 30 ring skeleton forming atoms), an acyl group (e.g., 1 to 40 carbon atoms), an alkenyl group (e.g., 1 to 40 carbon atoms), an alkynyl group (e.g., 1 to 40 carbon atoms), an alkoxycarbonyl group (e.g., 1 to 40 carbon atoms), an aryloxycarbonyl group (e.g., 1 to 40 carbon atoms), a heteroaryloxycarbonyl group (e.g., 1 to 40 carbon atoms), a silyl group (e.g., a trialkylsilyl group having 1 to 40 carbon atoms) and a nitro group, or a group formed by combining two or more thereof.

The "substituent group B" in the present specification means one group selected from the group consisting of an alkyl group (e.g., 1 to 40 carbon atoms), an alkoxy group (e.g., 1 to 40 carbon atoms), an aryl group (e.g., 6 to 30 carbon atoms), an aryloxy group (e.g., 6 to 30 carbon atoms), a heteroaryl group (e.g., 5 to 30 ring skeleton forming atoms), a heteroaryloxy group (e.g., 5 to 30 ring skeleton forming atoms), and a diarylaminoamino group (e.g., 0 to 20 carbon atoms), or a group formed by combining two or more thereof.

The "substituent group C" in the present specification means one group selected from the group consisting of an alkyl group (e.g., 1 to 20 carbon atoms), an aryl group (e.g., 6 to 22 carbon atoms), a heteroaryl group (e.g., 5 to 20 ring skeleton forming atoms), and a diarylamino group (e.g., 12 to 20 carbon atoms), or a group formed by combining two or more thereof.

The "substituent group D" in the present specification means one group selected from the group consisting of an alkyl group (e.g., 1 to 20 carbon atoms), an aryl group (e.g., 6 to 22 carbon atoms) and a heteroaryl group (e.g., 5 to 20 ring skeleton forming atoms), or a group formed by combining two or more thereof.

The "substituent group E" in the present specification means one group selected from the group consisting of an alkyl group (e.g., 1 to 20 carbon atoms) and an aryl group (e.g., 6 to 22 carbon atoms), or a group formed by combining two or more thereof.

In the present specification, in the case of the description of "substituent" or "substituted or unsubstituted", the substituent may be selected from, for example, the substituent group A, may be selected from the substituent group B, may be selected from the substituent group C, may be selected from the substituent group D, or may be selected from the substituent group E.

In some embodiments, the compound represented by the formula (1) is a light-emitting material.

In some embodiments, the compound represented by the formula (1) is a compound capable of emitting delayed fluorescence.

In some embodiments of the present disclosure, the compound represented by the formula (1) is, when excited thermally or by an electronic means, able to emit light in a UV region, light of blue, green, yellow, or orange in a visible region, in a red region (e.g., about 420 nm to about 500 nm, about 500 nm to about 600 nm, or about 600 nm to about 700 nm) or in a near IR region.

In some embodiments of the present disclosure, the compound represented by the formula (1) is, when excited thermally or by an electronic means, able to emit light of red or orange in a visible region (e.g., about 620 nm to about 780 nm, about 650 nm).

In some embodiments of the present disclosure, the compound represented by the formula (1) is, when excited thermally or by an electronic means, able to emit light of orange or yellow in a visible region (e.g., about 570 nm to about 620 nm, about 590 nm, about 570 nm).

In some embodiments of the present disclosure, the compound represented by the formula (1) is, when excited thermally or by an electronic means, able to emit light of green in a visible region (e.g., about 490 nm to about 575 nm, about 510 nm).

In some embodiments of the present disclosure, the compound represented by the formula (1) is, when excited thermally or by an electronic means, able to emit light of blue in a visible region (e.g., about 400 nm to about 490 nm, about 475 nm).

In some embodiments of the present disclosure, the compound represented by the formula (1) is, when excited thermally or by an electronic means, able to emit light in a UV region (e.g., about 280 to 400 nm).

In some embodiments of the present disclosure, the compound represented by the formula (1) is, when excited thermally or by an electronic means, able to emit light in an IR region (e.g., about 780 nm to 2 μm).

In some embodiments of the present disclosure, an organic semiconductor device using the compound represented by the formula (1) may be manufactured. For example, a CMOS (complementary metal oxide semiconductor) or the like using the compound represented by the formula (1) may be manufactured. In some embodiments of the present disclosure, an organic optical device such as an organic electroluminescence device or a solid-state image sensing device (e.g., a CMOS image sensor) may be manufactured by using the compound represented by the formula (1).

Electronic characteristics of small-molecule chemical substance libraries can be calculated by known ab initio quantum chemistry calculation. For example, according to time-dependent density functional theory calculation using 6-31G* as a basis, and a functional group known as Becke's three parameters, Lee-Yang-Parr hybrid functionals, the Hartree-Fock equation (TD-DFT7B3LYP/6-31G*) is analyzed and molecular fractions (parts) having HOMO not lower than a specific threshold value and LUMO not higher than a specific threshold value can be screened.

With that, for example, in the presence of a HOMO energy (for example, ionizing potential) of −6.5 eV or more, a donor part ("D") can be selected. On the other hand, for example, in the presence of a LUMO energy (for example, electron affinity) of −0.5 eV or less, an acceptor part ("A") can be selected. A bridge part ("B") is a strong conjugated system, for example, capable of strictly limiting the acceptor part and the donor part in a specific three-dimensional configuration, and therefore prevents the donor part and the acceptor part from overlapping in the pai-conjugated system.

In some embodiments, a compound library is screened using at least one of the following characteristics.

1. Light emission around a specific wavelength.
2. A triplet state over a calculated specific energy level.
3. $\Delta E_{ST}$ value lower than a specific value.
4. Quantum yield more than a specific value.
5. HOMO level.
6. LUMO level.

In some embodiments, the difference ($\Delta E_{ST}$) between the lowest singlet excited state and the lowest triplet excited state at 77 K is less than about 0.5 eV, less than about 0.4 eV, less than about 0.3 eV, less than about 0.2 eV, or less than about 0.1 eV. In some embodiments, $\Delta E_{ST}$ value is less than about 0.09 eV, less than about 0.08 eV, less than about 0.07 eV, less than about 0.06 eV, less than about 0.05 eV, less than about 0.04 eV, less than about 0.03 eV, less than about 0.02 eV, or less than about 0.01 eV.

In some embodiments, the compound represented by the formula (1) shows a quantum yield of more than 25%, for example, about 30%, about 35%, about 40%, about 45%, about 50%, about 55%, about 60%, about 65%, about 70%, about 75%, about 80%, about 85%, about 90%, about 95% or more.

[Synthesis Method of Compound Represented by Formula (1)]

The compound represented by the formula (1) is a novel compound.

The compound represented by the formula (1) can be synthesized by combining existing reactions. For example, synthesis can be performed by using a ring-closure reaction, or using a substitution reaction.

[Components Using Compound Represented by the Formula (1)]

In some embodiments, a solid-state film or layer is formed through combining with the compound represented by the formula (1), dispersing of the corresponding compound, covalent bonding with the corresponding compound, coating of the corresponding compound, carrying of the corresponding compound, or the co-use of one or more materials that associate with the corresponding compound (e.g., small molecules, polymers, metals, metal complexes, etc.). For example, the compound represented by the formula (1) can be combined with an electrically active material to form a film. In some cases, the compound represented by the formula (1) may be combined with a hole transport polymer. In some cases, the compound represented by the formula (1) may be combined with an electron transport polymer. In some cases, the compound represented by the formula (1) may be combined with a hole transport polymer and an electron transport polymer. In some cases, the compound represented by the formula (1) may be combined with a copolymer having both a hole transport part and an electron transport part. According to the above embodiment, electrons and/or holes formed within the solid-state film or layer can interact with the compound represented by the formula (1).

[Film Formation]

In some embodiments, a film containing the compound represented by the formula (1) can be formed in a wet process. In a wet process, a solution prepared by dissolving the compound of the present invention is applied onto a surface, and then the solvent is removed to form a film. The wet process includes a spin coating method, a slit coating method, an ink jet method (a spraying method), a gravure printing method, an offset printing method and flexographic printing method, which, however, are not limitative. In the wet process, an appropriate organic solvent capable of dissolving the compound of the present invention is selected and used. In some embodiments, a substituent (for example, an alkyl group) capable of increasing the solubility in an organic solvent can be introduced into the compound to be contained in the light emitting material.

In some embodiments, a film containing the compound of the present invention can be formed in a dry process. In some embodiments, a vacuum evaporation method is employable as a dry process, which, however, is not limitative. In the case where a vacuum evaporation method is employed, compounds to constitute a film can be co-evaporated from individual evaporation sources, or can be co-evaporated from a single evaporation source formed by mixing the compounds. In the case where a single evaporation source is used, a mixed powder prepared by mixing compound powders can be used, or a compression molded body prepared by compression-molding the mixed powder can be used, or a mixture prepared by heating and melting the constituent compounds and cooling the resulting melt can be used. In some embodiments, by co-evaporation under the condition where the evaporation rate (weight reduction rate) of the plural compounds contained in a single evaporation source is the same or is nearly the same, a film having a compositional ratio corresponding to the compositional ratio of the plural compounds contained in the evaporation source can be formed. When plural compounds are mixed in the same compositional ratio as the compositional ratio of the film to be formed to prepare an evaporation source, a film having a desired compositional ratio can be formed in a simplified manner. In some embodiments, the temperature at which the compounds to be co-evaporated has the same weight reduction ratio is specifically defined, and the temperature can be employed as the temperature of co-evaporation.

Application Example of Compound Represented by the Formula (1)

The compound represented by the formula (1) is useful as a material for an organic light-emitting device, and is particularly preferably used for an organic light emitting diode or the like.

Organic Light Emitting Diode:

One aspect of the present invention relates to the use of the compound represented by the formula (1) of the present invention, as a light-emitting material of the organic light-emitting device. In some embodiments, the compound represented by the formula (1) of the present invention can be effectively used as a light-emitting material in a light emitting layer of the organic light-emitting device. In some embodiments, the compound represented by the formula (1) includes delayed fluorescence (delayed fluorophore) that emits delayed fluorescence. In some embodiments, the present invention provides a delayed fluorophore having the structure represented by the formula (1). In some embodiments, the present invention relates to the use of the compound represented by the formula (1) as the delayed fluorophore. In some embodiments, in the present invention, the compound represented by the formula (1) can be used as a host material, and can be used together with one or more light-emitting materials. The light-emitting material may be a fluorescent material, a phosphorescent material, or a delayed fluorescence material (TADF). In some embodiments, the compound represented by the formula (1) can also be used as a hole transport material. In some embodiments, the compound represented by the formula (1) can be used as an electron transport material. In some embodiments, the present invention relates to a method of generating delayed fluorescence from the compound represented by the formula (1). In some embodiments, the organic light-emitting device including the compound as the light-emitting material emits delayed fluorescence, thereby exhibiting high light emission efficiency.

In some embodiments, the light emitting layer includes the compound represented by the formula (1), and the compound represented by the formula (1) is oriented parallel to a substrate. In some embodiments, the substrate is a film formation surface. In some embodiments, the orientation of the compound represented by the formula (1) with respect to the film formation surface affects the propagation direction of light emitted by the aligned compound or determines the corresponding direction. In some embodiments, the light extraction efficiency from the light emitting layer is improved by aligning the propagation direction of light emitted by the compound represented by the formula (1).

One aspect of the present invention relates to an organic light-emitting device. In some embodiments, the organic light-emitting device includes a light emitting layer. In some embodiments, the light emitting layer includes the compound represented by the formula (1), as a light-emitting material. In some embodiments, the organic light-emitting device is an organic photoluminescence device (organic PL device). In some embodiments, the organic light-emitting device is an organic electroluminescence device (organic EL device). In some embodiments, the compound represented by the formula (1) assists light emission of another light-emitting material included in the light emitting layer (as a so-called assist dopant). In some embodiments, the compound that is represented by the formula (1) and is included in the light emitting layer is at its lowest excited singlet energy level which is included between the lowest excited singlet energy level of a host material included in the light emitting layer and the lowest excited singlet energy level of another light-emitting material included in the light emitting layer.

In some embodiments, the organic photoluminescence device includes at least one light emitting layer. In some embodiments, the organic electroluminescence device includes at least an anode, a cathode, and an organic layer between the anode and the cathode. In some embodiments, the organic layer includes at least a light emitting layer. In some embodiments, the organic layer includes only a light emitting layer. In some embodiments, the organic layer includes one or more organic layers as well as the light emitting layer. Examples of the organic layer include a hole transport layer, a hole injection layer, an electron barrier layer, a hole barrier layer, an electron injection layer, an electron transport layer, and an exciton barrier layer. In some embodiments, the hole transport layer may be a hole injection transport layer having a hole injection function, and the electron transport layer may be an electron injection transport layer having an electron injection function. An example of the organic electroluminescence device is illustrated in the drawing.

Light Emitting Layer:

In some embodiments, a light emitting layer is a layer in which holes and electrons injected from an anode and a cathode, respectively, recombine to form excitons. In some embodiments, the layer emits light.

In some embodiments, only a light-emitting material is used as the light emitting layer. In some embodiments, the light emitting layer includes the light-emitting material and a host material. In some embodiments, the light-emitting material is the compound represented by the formula (1). In some embodiments, in order to improve the light emission efficiency of the organic electroluminescence device and the organic photoluminescence device, singlet excitons and triplet excitons generated in the light-emitting material are confined within the light-emitting material. In some embodiments, a host material is used in addition to the light-emitting material, in the light emitting layer. In some embodiments, the host material is an organic compound. In some embodiments, the organic compound has excited singlet energy and excited triplet energy, and at least one of these is higher than those of the light-emitting material of the present invention. In some embodiments, singlet excitons and triplet excitons generated in the light-emitting material of the present invention are confined in the molecules of the light-emitting material of the present invention. In some embodiments, singlet and triplet excitons are sufficiently confined in order to improve the light emission efficiency. In some embodiments, although the high light emission efficiency is still obtainable, singlet excitons and triplet excitons are not sufficiently confined. That is, a host material capable of achieving high light emission efficiency can be used in the present invention without any particular limitation. In some embodiments, light emission occurs in the light-emitting material in the light emitting layer of the device of the present invention. In some embodiments, emitted light includes both fluorescence and delayed fluorescence. In some embodiments, the emitted light includes light emitted from the host material. In some embodiments, the emitted light is composed of light emitted from the host material. In some embodiments, the emitted light includes light emitted from the compound represented by the formula (1), and light emitted from the host material. In some embodiments, TADF molecules and host materials are used. In some embodiments, TADF is an assist dopant, which has lower excited singlet energy than the host material in the light emitting layer, and has higher excited singlet energy than the light-emitting material in the light emitting layer.

When the compound represented by the formula (1) is used as an assist dopant, various compounds can be employed as a light-emitting material (preferably a fluorescent material). As such a light-emitting material, it is possible to use anthracene derivatives, tetracene derivatives, naphthacene derivatives, pyrene derivatives, perylene derivatives, chrysene derivatives, rubrene derivatives, coumarin derivatives, pyrane derivatives, stillben derivatives, fluorene derivatives, anthryl derivatives, pyromethene derivatives, terphenyl derivatives, terphenylene derivatives, fluoranthene derivative, amine derivatives, quinacridone derivatives, oxadiazole derivatives, malononitrile derivatives, pyran derivatives, carbazole derivatives, julolidine derivatives, thiazole derivatives, derivatives having metals (Al, Zn) and the like. These exemplified skeletons may have substituents, or may not have substituents. Further, these exemplified skeletons may be combined with each other.

Hereinafter, light-emitting materials that can be used in combination with an assist dopant having the structure represented by the formula (1) will be exemplified.

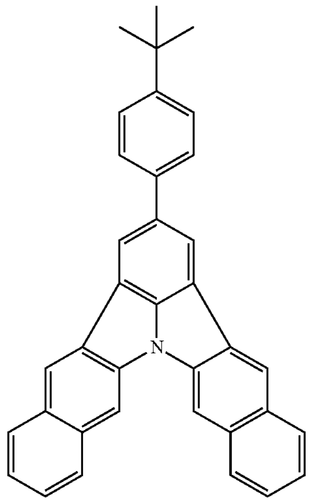

-continued

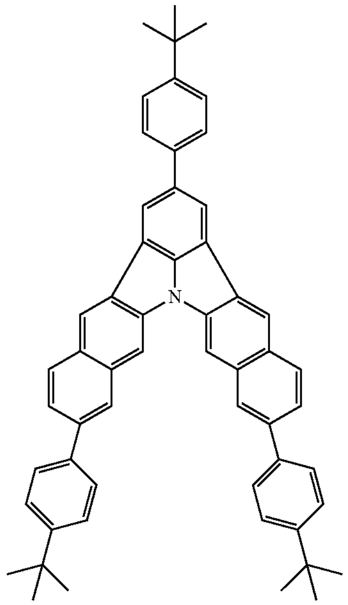

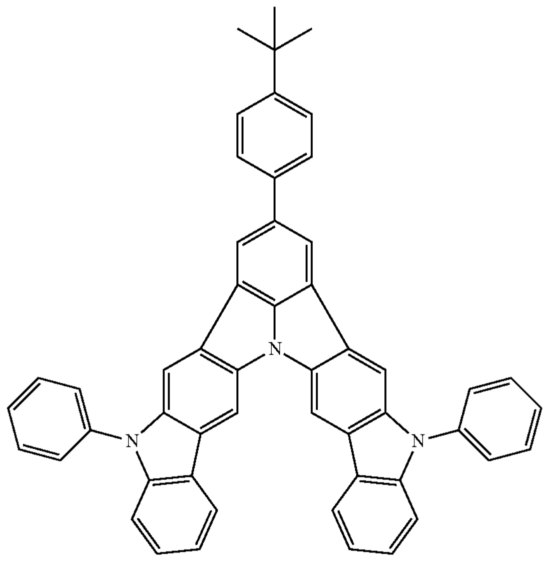

-continued
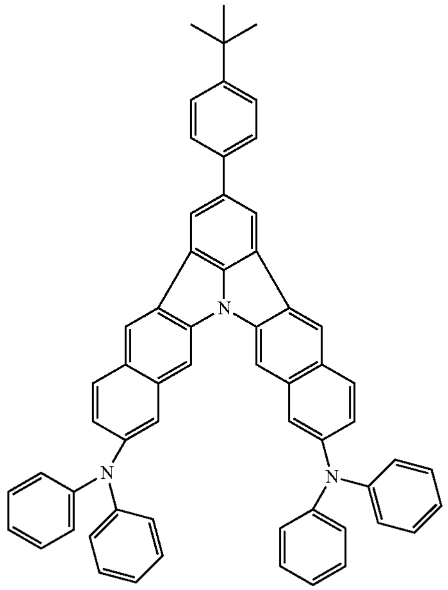
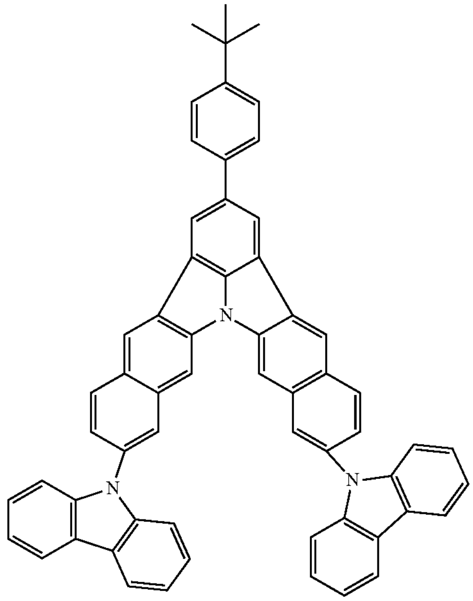
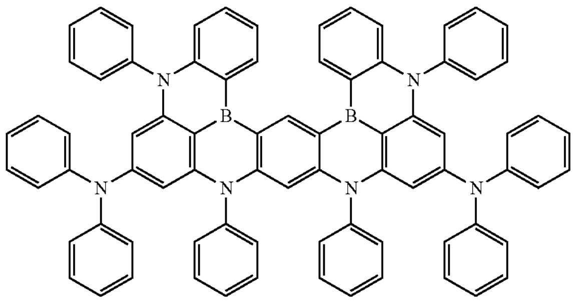
-continued
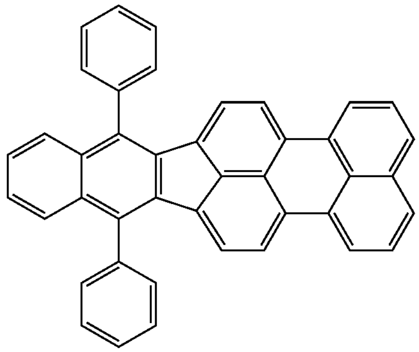
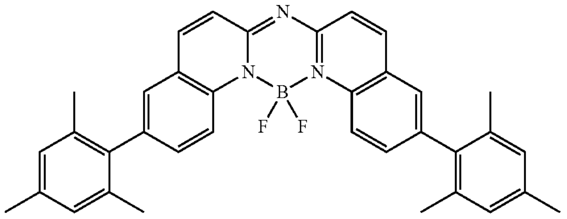
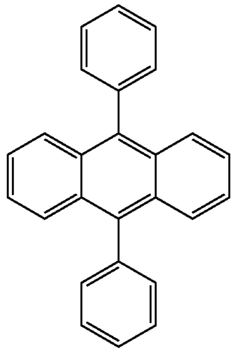
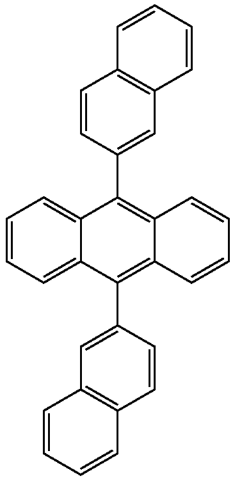
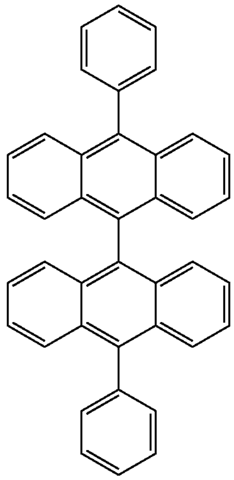
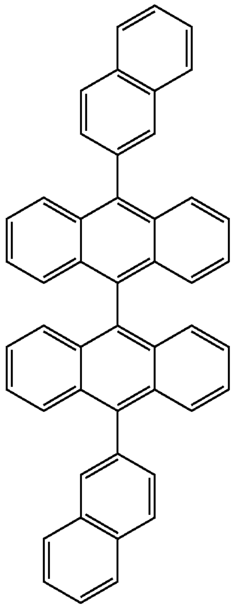

-continued
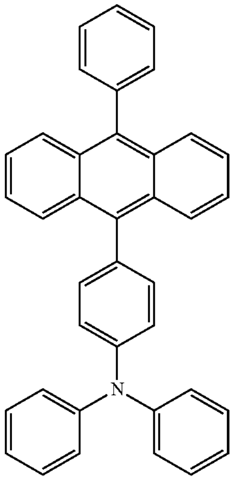
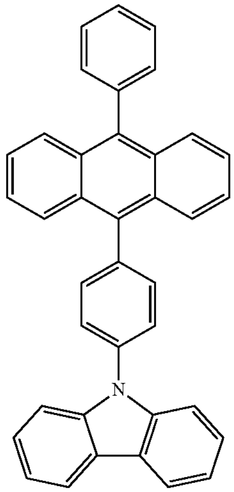
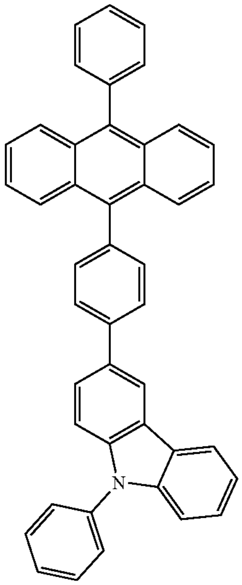
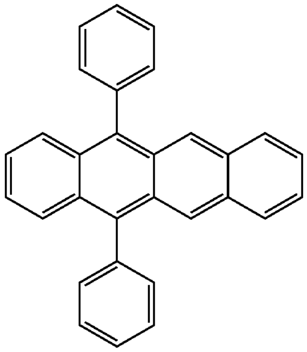
-continued
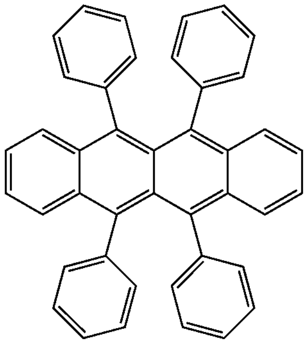
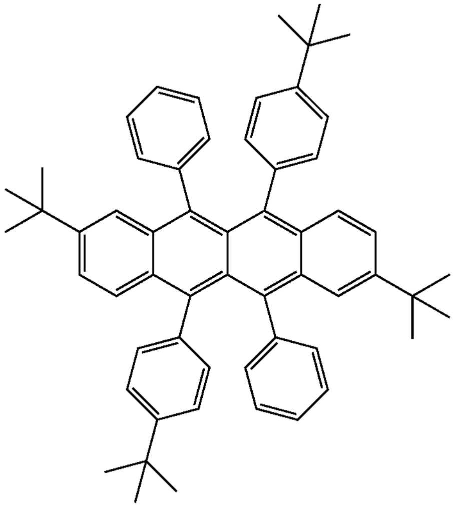
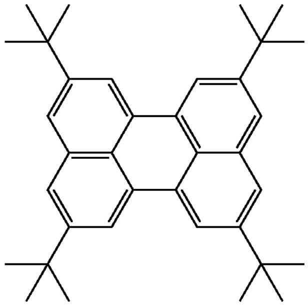
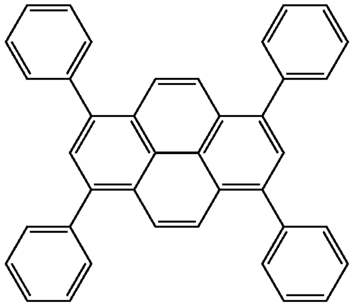

-continued
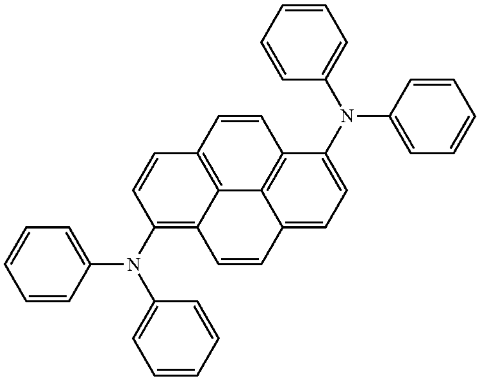
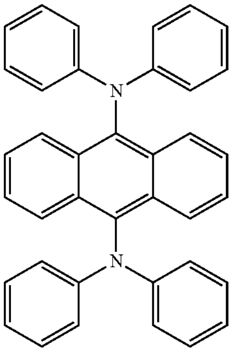
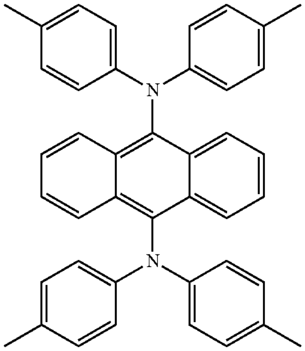
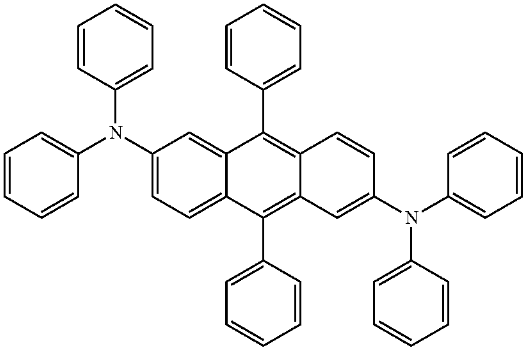
-continued
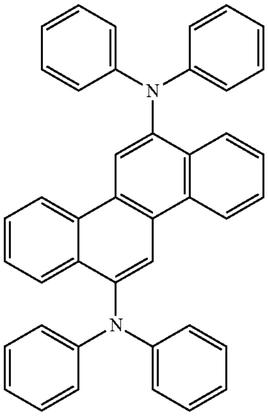
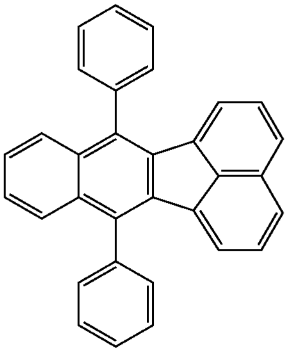
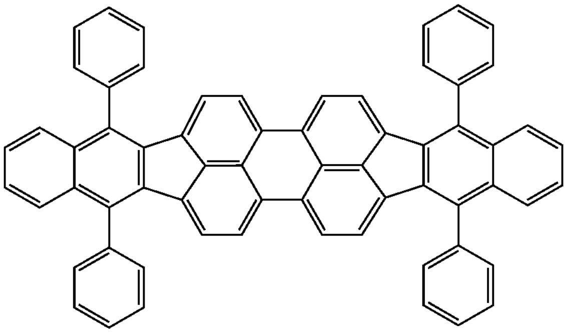
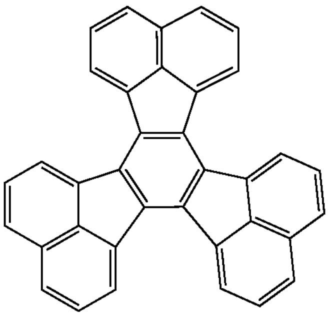
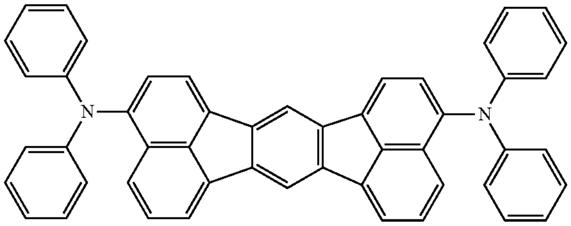

-continued

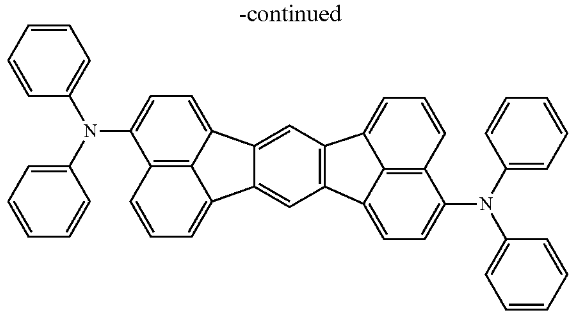

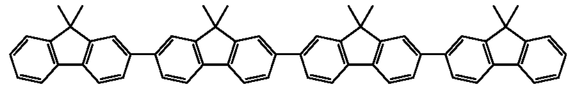

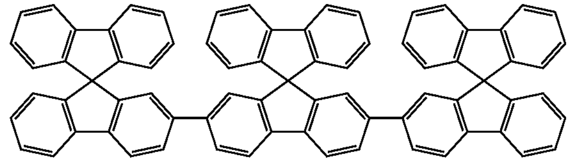

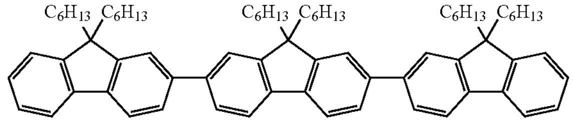

compounds obtained by replacing all hydrogen atoms in the above exemplified compounds with deuterium atoms may also be used as host materials. Further, among the above exemplified compounds, regarding those including carbazole-9-yl groups, compounds obtained by replacing all hydrogen atoms in the carbazole-9-yl groups with deuterium atoms may also be used as host materials.

Further, a compound described in paragraphs 0220 to 0239 of the gazette No. WO2015/022974 may also be particularly preferably adopted as a light-emitting material to be used together with an assist dopant having a structure represented by the formula (1).

In some embodiments, when a host material is used, the amount of the compound of the present invention as a light-emitting material contained in a light emitting layer is 0.1% by weight or more. In some embodiments, when a host material is used, the amount of the compound of the present invention as a light-emitting material contained in a light emitting layer is 1% by weight or more. In some embodiments, when a host material is used, the amount of the compound of the present invention as a light-emitting material contained in a light emitting layer is 50% by weight or less. In some embodiments, when a host material is used, the amount of the compound of the present invention as a light-emitting material contained in a light emitting layer is 20% by weight or less. In some embodiments, when a host material is used, the amount of the compound of the present invention as a light-emitting material contained in a light emitting layer is 10% by weight or less.

In some embodiments, the host material of the light emitting layer is an organic compound having a hole transport function and an electron transport function. In some embodiments, the host material for the light emitting layer is an organic compound that prevents the wavelength of emitted light from increasing. In some embodiments, the host material of the light emitting layer is an organic compound having a high glass transition temperature.

In some embodiments, a host material is selected from the group consisting of the followings:

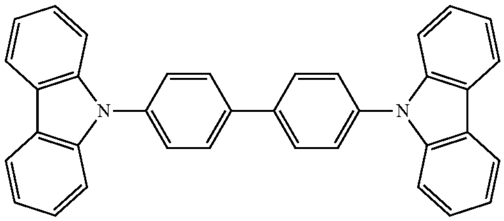

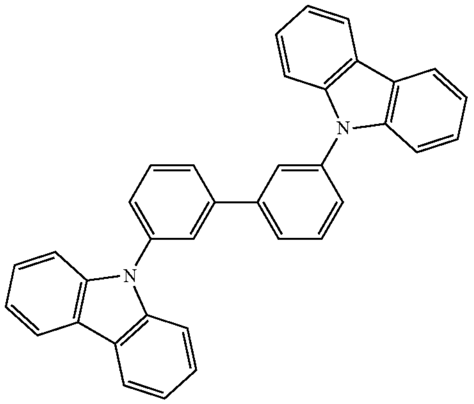

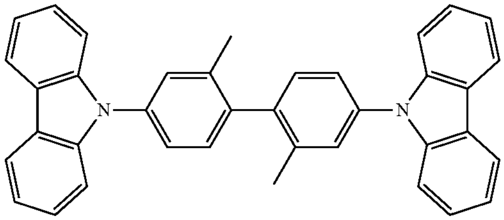

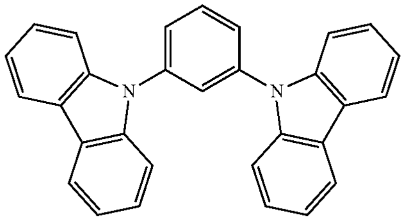

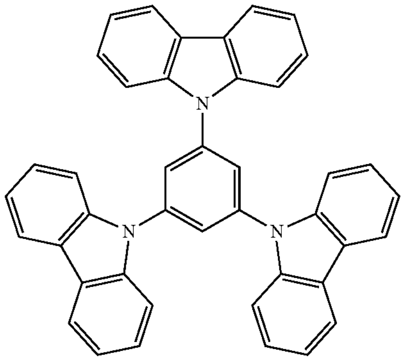

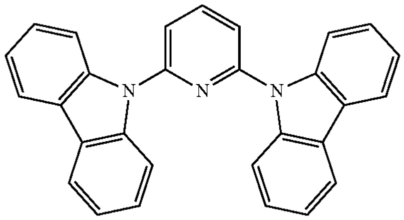

-continued
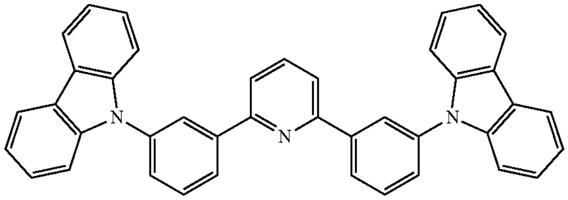
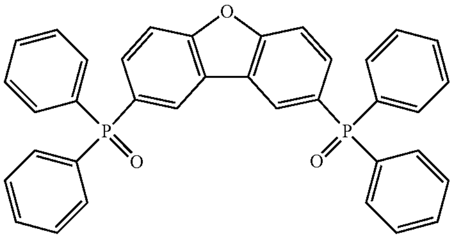
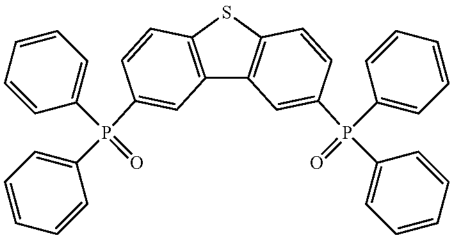
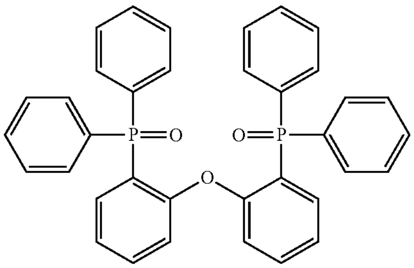
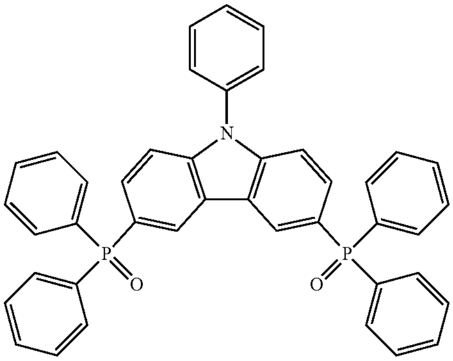
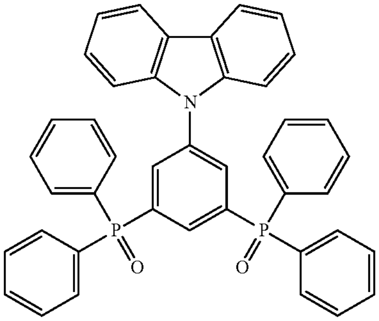
-continued
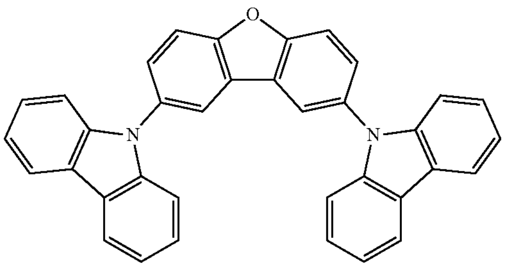
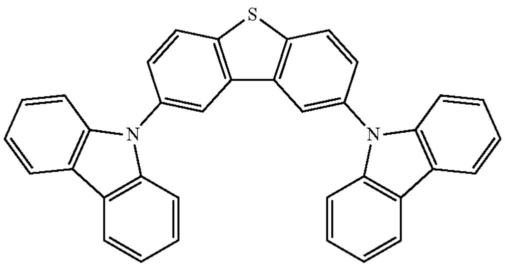
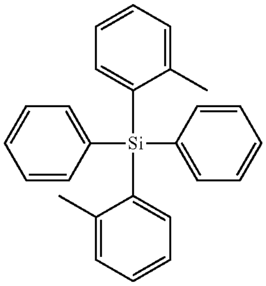
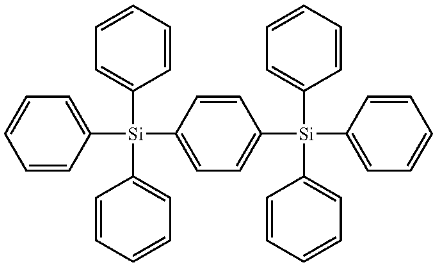
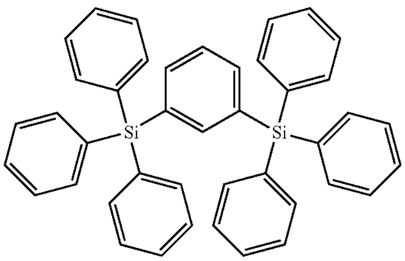
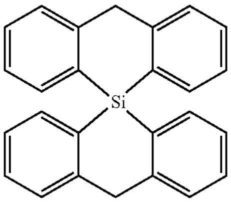

-continued
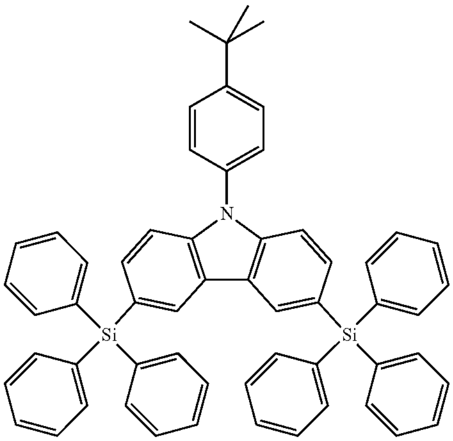
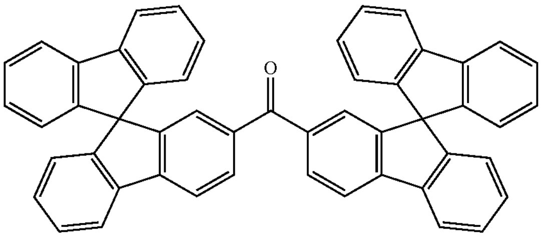
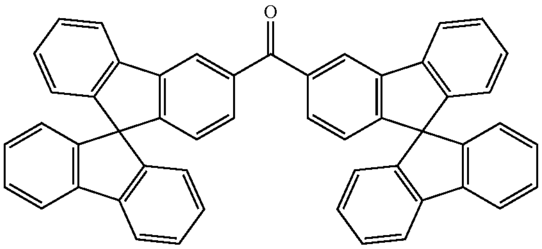
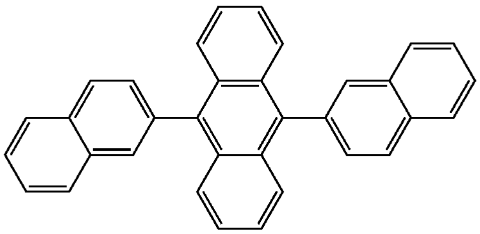
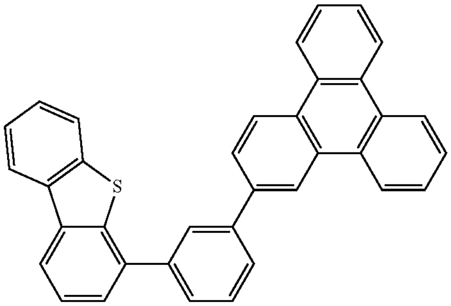
-continued
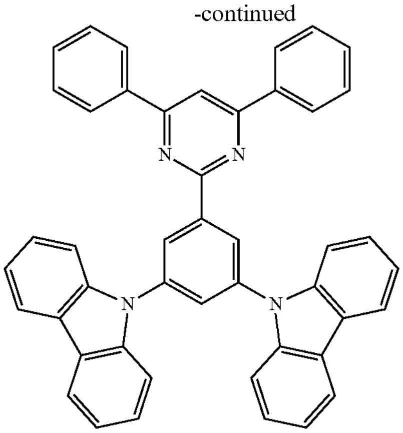
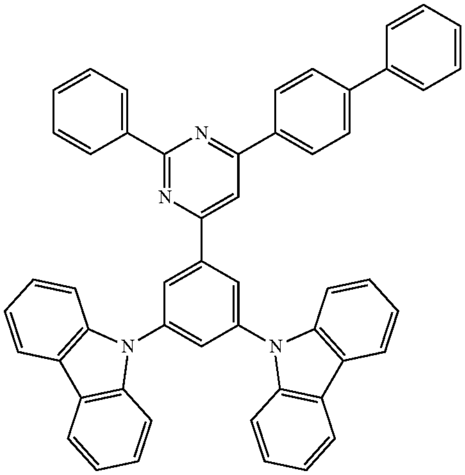
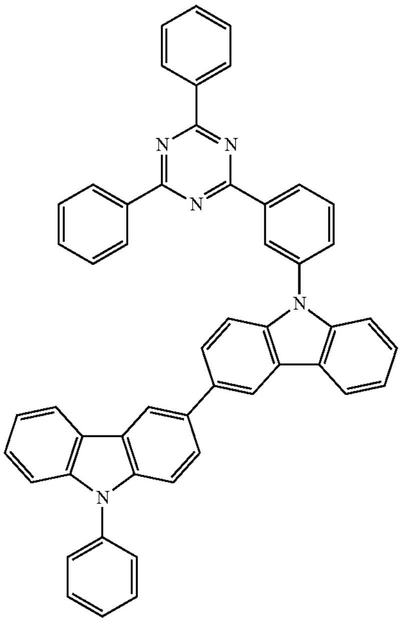

-continued

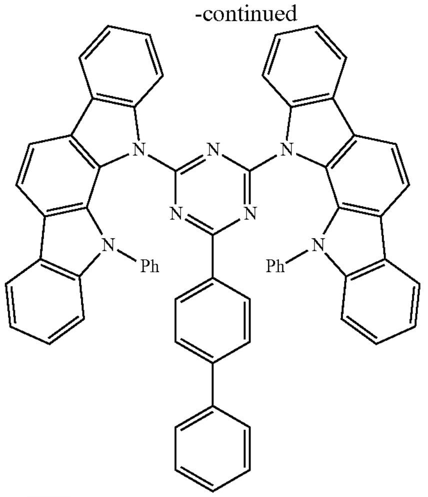

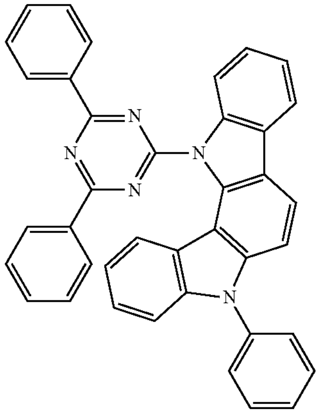

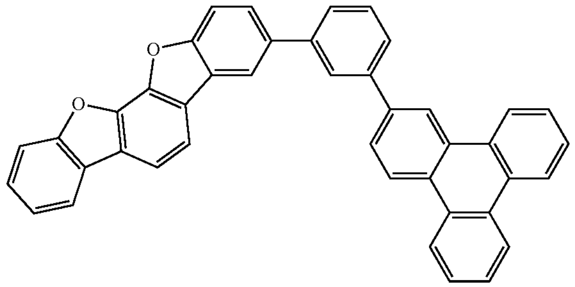

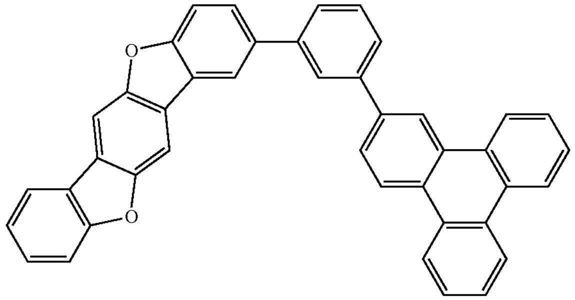

In some embodiments, a light emitting layer includes two or more types of TADF molecules having different structures. For example, the light emitting layer may include three types of materials, i.e., a host material, a first TADF molecule, and a second TADF molecule, which have excited singlet energy levels in descending order. Here, in both the first TADF molecule and the second TADF molecule, a difference DEBT between the lowest excited singlet energy level and the lowest excited triplet energy level of 77K is preferably 0.3 eV or less, more preferably 0.25 eV or less, more preferably 0.2 eV or less, more preferably 0.15 eV or less, further preferably 0.1 eV or less, still further preferably 0.07 eV or less, still further preferably 0.05 eV or less, still further preferably 0.03 eV or less, particularly preferably 0.01 eV or less. The concentration of the first TADF molecule in the light emitting layer is preferably larger than the concentration of the second TADF molecule. Further, the concentration of the host material in the light emitting layer is preferably larger than the concentration of the second TADF molecule. The concentration of the first TADF molecule in the light emitting layer may be larger than, smaller than, or the same as the concentration of the host material. In some embodiments, the composition within the light emitting layer may have 10 to 70% by weight of the host material, 10 to 80% by weight of the first TADF molecule, and 0.1 to 30% by weight of the second TADF molecule. In some embodiments, the composition within the light emitting layer may have 20 to 45% by weight of the host material, 50 to 75% by weight of the first TADF molecule, and 5 to 20% by weight of the second TADF molecule. In some embodiments, the emission quantum yield φPL1(A) obtained by photoexcitation in the co-deposited film of the first TADF molecule and the host material (the concentration of the first TADF molecule in this co-deposited film=A % by weight), and the emission quantum yield φPL2 (A) obtained by photoexcitation in the co-deposited film of the second TADF molecule and the host material (the concentration of the second TADF molecule in this co-deposited film=A % by weight) satisfy the relational expression of φPL1(A)>φPL2 (A). In some embodiments, the emission quantum yield φPL2(B) obtained by photoexcitation in the co-deposited film of the second TADF molecule and the host material (the concentration of the second TADF molecule in this co-deposited film=B % by weight), and the emission quantum yield φPL2 (100) obtained by photoexcitation in the single film of the second TADF molecule satisfy the relational expression of φPL2(B)>φPL2(100). In some embodiments, the light emitting layer may contain three types of TADF molecules having different structures. The compound of the present invention may be any of TADF compounds contained in the light emitting layer.

In some embodiments, the light emitting layer may be composed of a material selected from the group consisting of a host material, an assist dopant, and a light-emitting material. In some embodiments, the light emitting layer does not contain a metal element. In some embodiments, the light emitting layer can be made of a material composed of only atoms selected from the group consisting of a carbon atom, a hydrogen atom, a deuterium atom, a nitrogen atom, an oxygen atom, and a sulfur atom. Alternatively, the light emitting layer may also be made of a material composed of only atoms selected from the group consisting of a carbon atom, a hydrogen atom, a deuterium atom, a nitrogen atom, and an oxygen atom. Alternatively, the light emitting layer may also be made of a material composed of only atoms selected from the group consisting of a carbon atom, a hydrogen atom, a nitrogen atom, and an oxygen atom.

When the light emitting layer contains a TADF material other than the compound of the present invention, the TADF material may be a conventionally known delayed fluorescence material. Preferred delayed fluorescent materials are compounds included in the general formulae described in WO2013/154064, paragraphs 0008 to 0048 and 0095 to 0133; WO2013/011954, paragraphs 0007 to 0047 and 0073~0085; WO2013/011955, paragraphs 0007 to 0033 and 0059 to 0066; WO2013/081088, paragraphs 0008 to 0071 and 0118 to 0133; JP 2013-256490 A, paragraphs 0009 to 0046 and 0093 to 0134; JP 2013-116975 A, paragraphs 0008 to 0020 and 0038 to 0040; WO2013/133359, paragraphs 0007 to 0032 and 0079 to 0084; WO2013/161437, paragraphs 0008 to 0054 and 0101~0121; JP 2014-9352 A, paragraphs 0007 to 0041 and 0060 to 0069; and JP 2014-9224 A, paragraphs 0008 to 0048 and 0067 to 0076; JP 2017-119663 A, paragraphs 0013 to 0025; JP 2017-119664 A, paragraphs 0013 to 0026; JP 2017-222623 A, paragraphs 0012 to 0025; JP 2017-226838 A, paragraphs 0010 to 0050; JP 2018-100411 A, paragraphs 0012 to 0043; WO2018/047853, paragraphs 0016 to 0044; and exemplary compounds therein capable of emitting delayed fluorescence are especially preferred. In addition, light-emitting materials capable of emitting delayed fluorescence, as described in JP 2013-253121 A, WO2013/133359, WO2014/034535, WO2014/115743, WO2014/122895. WO2014/126200, WO2014/136758, WO2014/133121. WO2014/136860, WO2014/196585, WO2014/189122, WO2014/168101, WO2015/008580, WO2014/203840, WO2015/002213, WO2015/016200, WO2015/019725, WO2015/072470, WO2015/108049, WO2015/080182, WO2015/072537, WO2015/080183, JP 2015-129240 A, WO2015/129714, WO2015/129715, WO2015/133501, WO2015/136880, WO2015/137244, WO2015/137202, WO2015/137136, WO2015/146541, WO2015/159541, WO2014/208698, WO2016/158540, WO2019/191665, WO2018/155642, WO2019/004254, WO2022/025248 and WO2021/235549 are also preferably employed. These patent publications described in this paragraph are hereby incorporated as a part of this description by reference.

In the following, the constituent members and the other layers than a light-emitting layer of the organic electroluminescent device are described.

Substrate:

In some embodiments, the organic electroluminescent device of the invention is supported by a substrate, wherein the substrate is not particularly limited and may be any of those that have been commonly used in an organic electroluminescent device, for example those formed of glass, transparent plastics, quartz, and silicon.

Anode:

In some embodiments, the anode of the organic electroluminescent device is made of a metal, an alloy, an electroconductive compound, or a combination thereof. In some embodiments, the metal, alloy, or electroconductive compound has a large work function (4 eV or more). In some embodiments, the metal is Au. In some embodiments, the electroconductive transparent material is selected from CuI, indium tin oxide (ITO), SnO2, and ZnO. In some embodiments, an amorphous material capable of forming a transparent electroconductive film, such as IDIXO ($In_2O_3$—ZnO), is used. In some embodiments, the anode is a thin film. In some embodiments, the thin film is made by vapor deposition or sputtering. In some embodiments, the film is patterned by a photolithography method. In some embodiments, where the pattern may not require high accuracy (for example, approximately 100 μm or more), the pattern may be formed with a mask having a desired shape on vapor deposition or sputtering of the electrode material. In some embodiments, when a material can be applied as a coating, such as an organic electroconductive compound, a wet film forming method, such as a printing method and a coating method is used. In some embodiments, when the emitted light goes through the anode, the anode has a transmittance of more than 10%, and the anode has a sheet resistance of several hundred Ohm per square or less. In some embodiments, the thickness of the anode is from 10 to 1,000 nm. In some embodiments, the thickness of the anode is from 10 to 200 nm. In some embodiments, the thickness of the anode varies depending on the material used.

Cathode:

In some embodiments, the cathode is made of an electrode material such as a metal having a small work function (4 eV or less) (referred to as an electron injection metal), an alloy, an electroconductive compound, or a combination thereof. In some embodiments, the electrode material is selected from sodium, a sodium-potassium alloy, magnesium, lithium, a magnesium-cupper mixture, a magnesium-silver mixture, a magnesium-aluminum mixture, a magnesium-indium mixture, an aluminum-aluminum oxide ($Al_2O_3$) mixture, indium, a lithium-aluminum mixture, and a rare earth metal. In some embodiments, a mixture of an electron injection metal and a second metal that is a stable metal having a larger work function than the electron injection metal is used. In some embodiments, the mixture is selected from a magnesium-silver mixture, a magnesium-aluminum mixture, a magnesium-indium mixture, an aluminum-aluminum oxide ($Al_2O_3$) mixture, a lithium-aluminum mixture, and aluminium. In some embodiments, the mixture increases the electron injection property and the durability against oxidation. In some embodiments, the cathode is produced by forming the electrode material into a thin film by vapor deposition or sputtering. In some embodiments, the cathode has a sheet resistance of several hundred Ohm per square or less. In some embodiments, the thickness of the cathode ranges from 10 nm to 5 μm. In some embodiments, the thickness of the cathode ranges from 50 to 200 nm. In some embodiments, for transmitting the emitted light, any one of the anode and the cathode of the organic electroluminescent device is transparent or translucent. In some embodiments, the transparent or translucent electroluminescent devices enhance the light emission luminance.

In some embodiments, the cathode is formed with an electroconductive transparent material, as described for the anode, to form a transparent or translucent cathode. In some embodiments, a device comprises an anode and a cathode, both being transparent or translucent.

Injection Layer:

An injection layer is a layer between the electrode and the organic layer. In some embodiments, the injection layer decreases the driving voltage and enhances the light emission luminance. In some embodiments, the injection layer includes a hole injection layer and an electron injection layer. The injection layer can be positioned between the anode and the light-emitting layer or the hole transporting layer, and between the cathode and the light-emitting layer or the electron transporting layer. In some embodiments, an injection layer is present. In some embodiments, no injection layer is present.

Preferred compound examples for use as a hole injection material are shown below.

$MoO_3$,

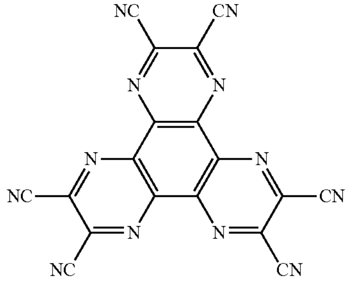

-continued

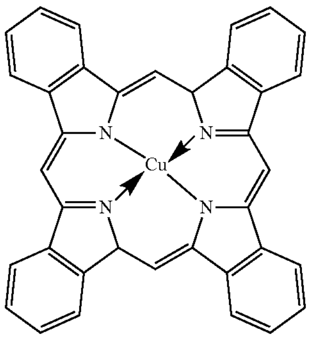

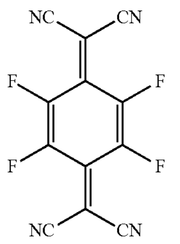

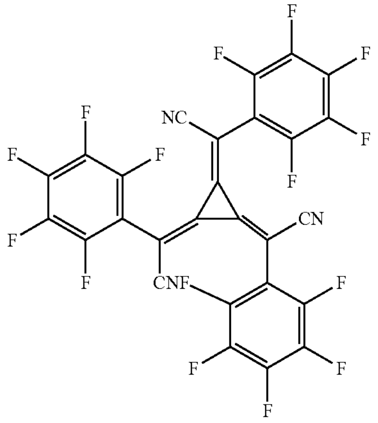

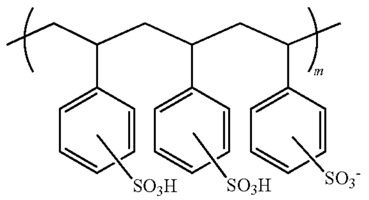

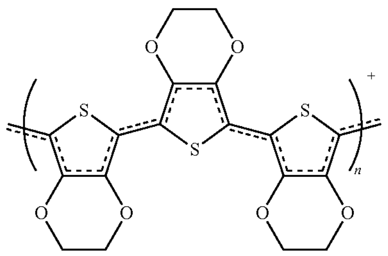

Next, preferred compound examples for use as an electron injection material are shown below.

LiF, CsF,

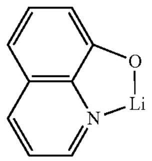

Barrier Layer:

A barrier layer is a layer capable of inhibiting charges (electrons or holes) and/or excitons present in the light-emitting layer from being diffused outside the light-emitting layer. In some embodiments, the electron barrier layer is between the light-emitting layer and the hole transporting layer, and inhibits electrons from passing through the light-emitting layer toward the hole transporting layer. In some embodiments, the hole barrier layer is between the light-emitting layer and the electron transporting layer, and inhibits holes from passing through the light-emitting layer toward the electron transporting layer. In some embodiments, the barrier layer inhibits excitons from being diffused outside the light-emitting layer. In some embodiments, the electron barrier layer and the hole barrier layer are exciton barrier layers. As used herein, the term "electron barrier layer" or "exciton barrier layer" includes a layer that has the functions of both electron barrier layer and of an exciton barrier layer.

Hole Barrier Layer:

A hole barrier layer acts as an electron transporting layer. In some embodiments, the hole barrier layer inhibits holes from reaching the electron transporting layer while transporting electrons. In some embodiments, the hole barrier layer enhances the recombination probability of electrons and holes in the light-emitting layer. The material for the hole barrier layer may be the same materials as the ones described for the electron transporting layer.

Preferred compound examples for use for the hole barrier layer are shown below.

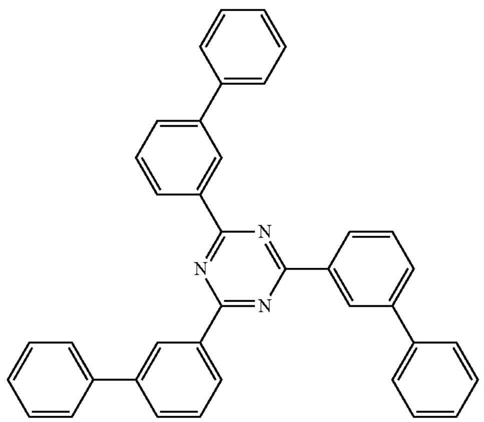

-continued

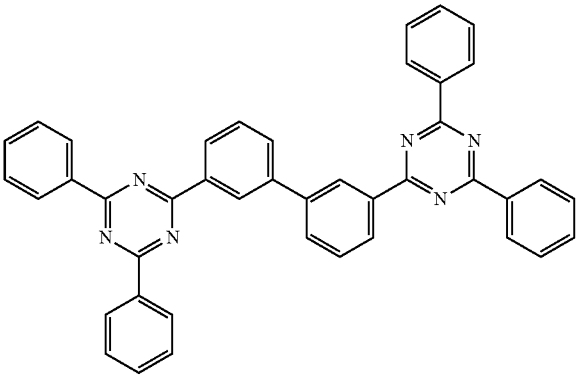

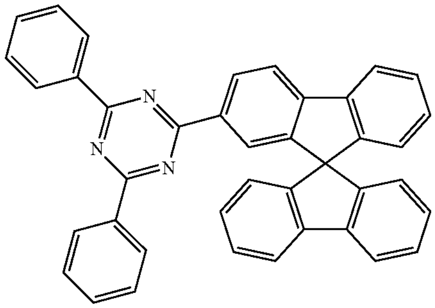

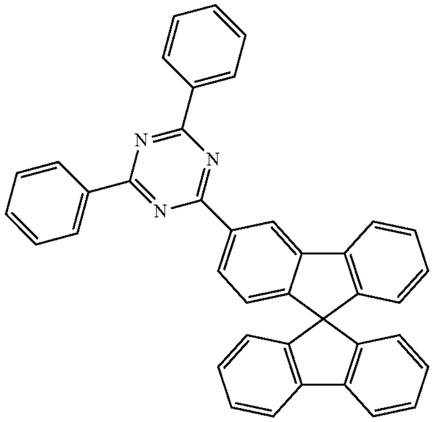

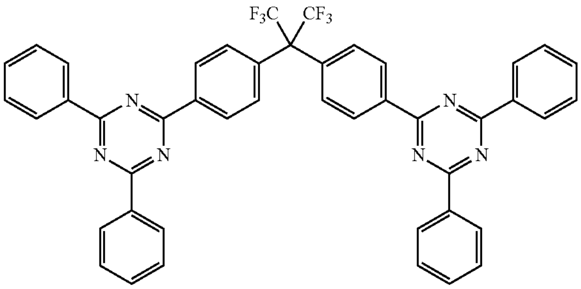

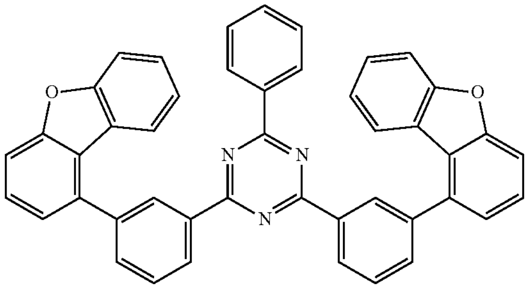

-continued

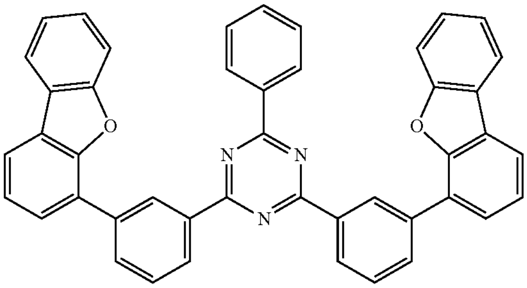

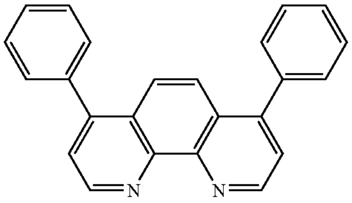

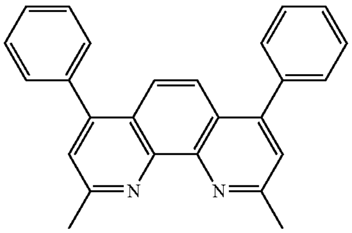

Electron Barrier Layer:

An electron barrier layer transports holes. In some embodiments, the electron barrier layer inhibits electrons from reaching the hole transporting layer while transporting holes. In some embodiments, the electron barrier layer enhances the recombination probability of electrons and holes in the light-emitting layer. The materials for use for the electron barrier layer may be the same materials as those mentioned hereinabove for the hole transporting layer.

Preferred compound examples for use as the electron barrier material are shown below.

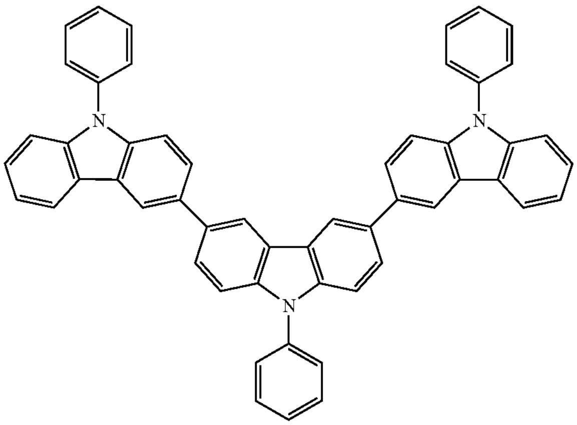

-continued

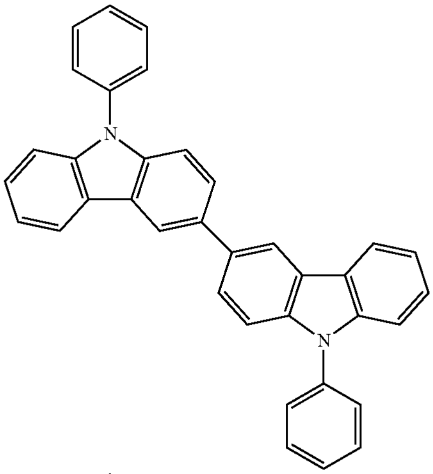

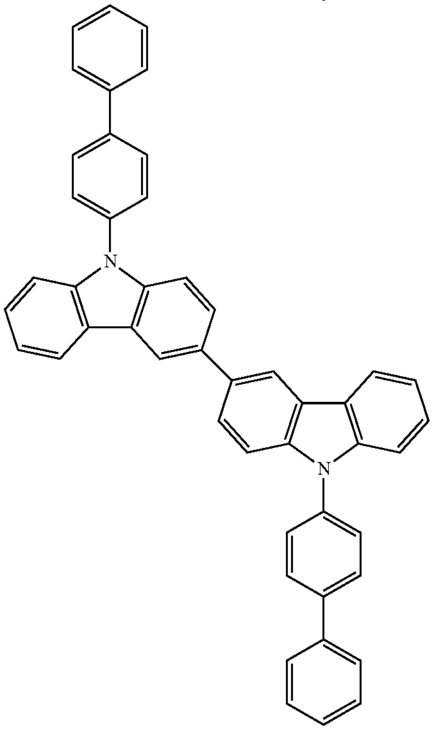

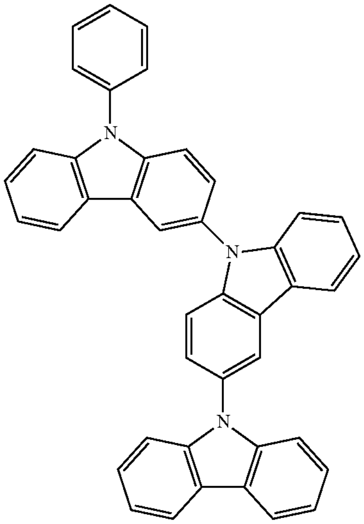

-continued

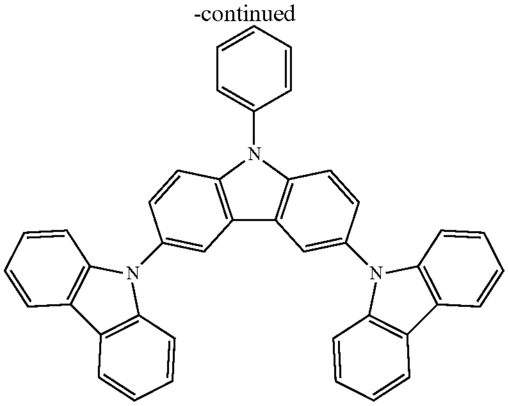

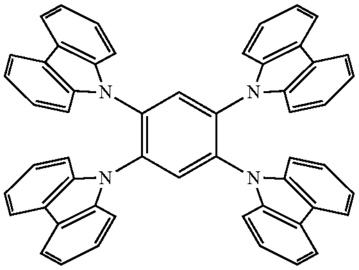

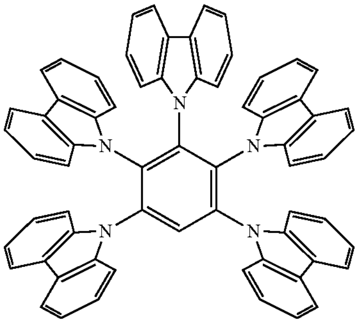

Exciton Barrier Layer:

An exciton barrier layer inhibits excitons generated through recombination of holes and electrons in the light-emitting layer from being diffused to the charge transporting layer. In some embodiments, the exciton barrier layer enables effective confinement of excitons in the light-emitting layer. In some embodiments, the light emission efficiency of the device is enhanced. In some embodiments, the exciton barrier layer is adjacent to the light-emitting layer on any of the side of the anode and the side of the cathode, and on both the sides. In some embodiments, where the exciton barrier layer is on the side of the anode, the layer can be between the hole transporting layer and the light-emitting layer and adjacent to the light-emitting layer. In some embodiments, where the exciton barrier layer is on the side of the cathode, the layer can be between the light-emitting layer and the cathode and adjacent to the light-emitting layer. In some embodiments, a hole injection layer, an electron barrier layer, or a similar layer is between the anode and the exciton barrier layer that is adjacent to the light-emitting layer on the side of the anode. In some embodiments, a hole injection layer, an electron barrier layer, a hole barrier layer, or a similar layer is between the cathode and the exciton barrier layer that is adjacent to the light-emitting layer on the side of the cathode. In some embodiments, the exciton barrier layer comprises excited singlet energy and excited triplet energy, at least one of which is higher than the excited singlet energy and the excited triplet energy of the light-emitting material, respectively.

Hole Transporting Layer:

The hole transporting layer comprises a hole transporting material. In some embodiments, the hole transporting layer is a single layer. In some embodiments, the hole transporting layer comprises a plurality of layers.

In some embodiments, the hole transporting material has one of injection or transporting property of holes and barrier property of electrons. In some embodiments, the hole transporting material is an organic material. In some embodiments, the hole transporting material is an inorganic material. Examples of known hole transporting materials that may be used herein include but are not limited to a triazole derivative, an oxadiazole derivative, an imidazole derivative, a carbazole derivative, an indolocarbazole derivative, a polyarylalkane derivative, a pyrazoline derivative, a pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a silazane derivative, an aniline copolymer and an electroconductive polymer oligomer, particularly a thiophene oligomer, or a combination thereof. In some embodiments, the hole transporting material is selected from a porphyrin compound, an aromatic tertiary amine compound, and a styrylamine compound. In some embodiments, the hole transporting material is an aromatic tertiary amine compound. Preferred compound examples for use as the hole transporting material are shown below.

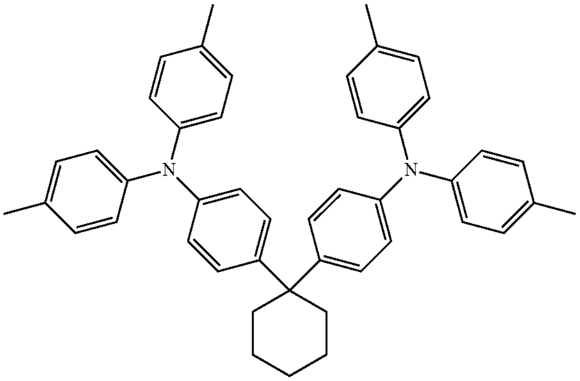

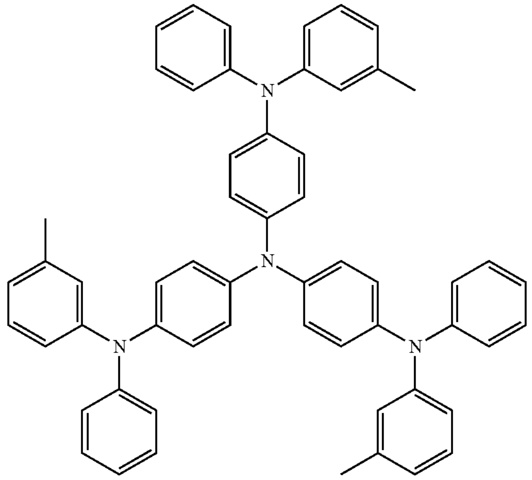

-continued

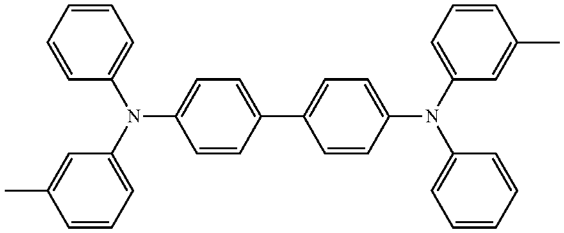

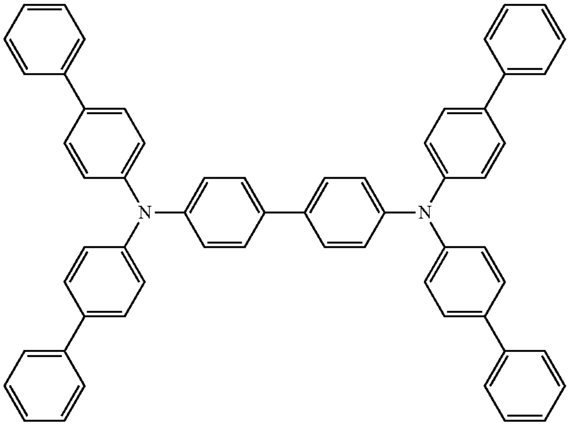

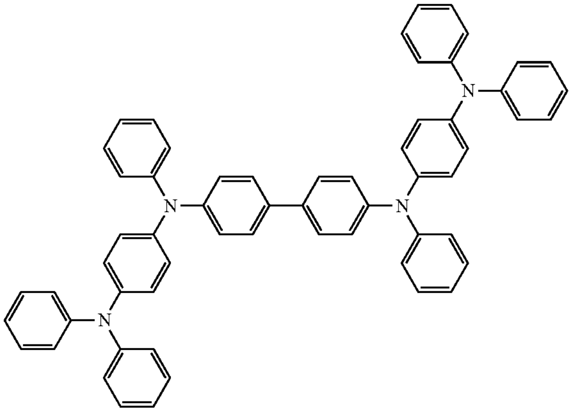

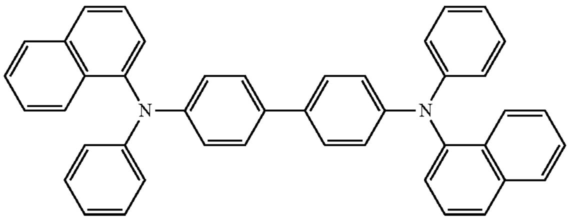

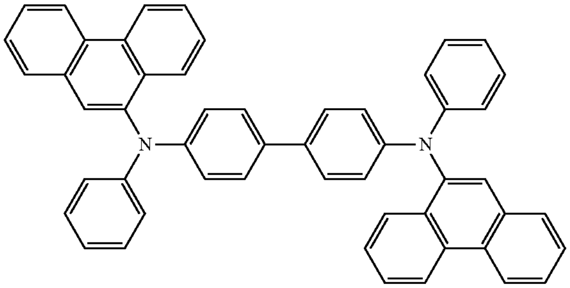

-continued

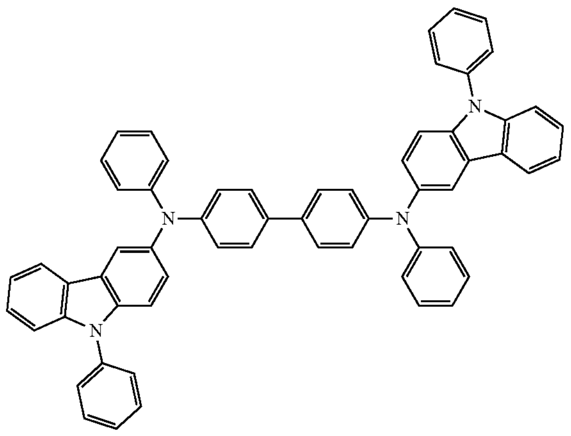

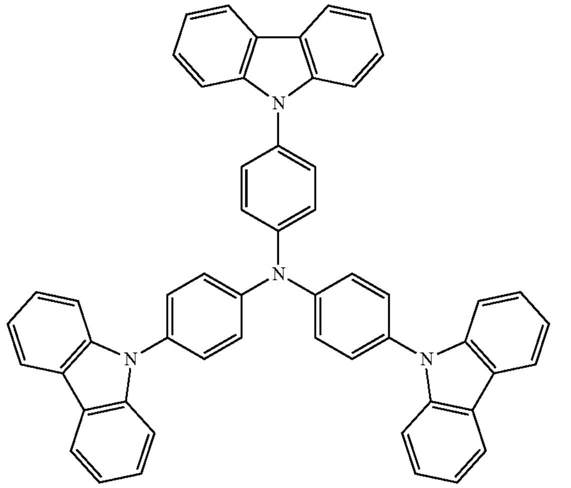

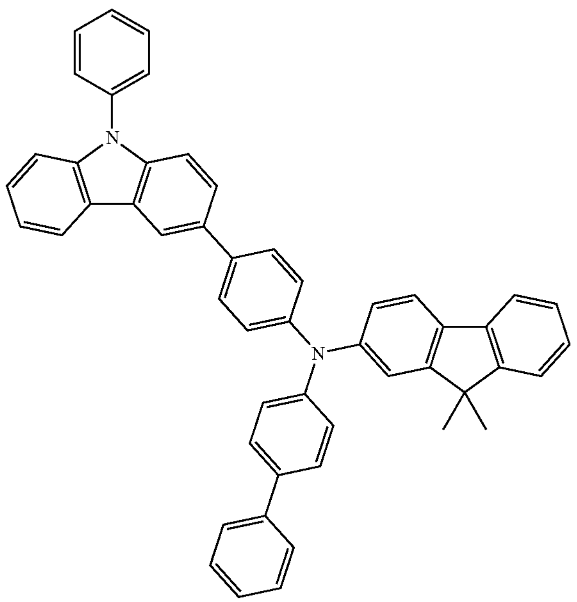

-continued

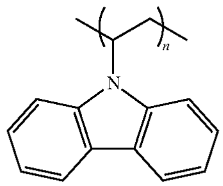

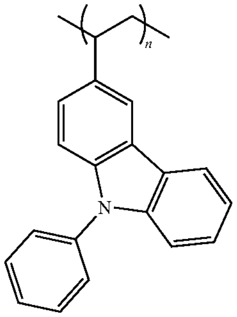

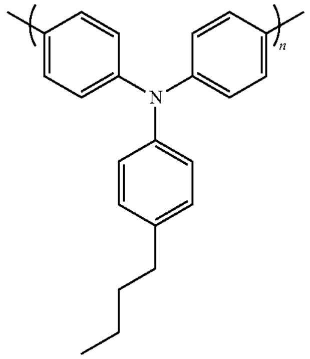

Electron Transporting Layer

The electron transporting layer comprises an electron transporting material. In some embodiments, the electron transporting layer is a single layer. In some embodiments, the electron transporting layer comprises a plurality of layers.

In some embodiments, the electron transporting material needs only to have a function of transporting electrons, which are injected from the cathode, to the light-emitting layer. In some embodiments, the electron transporting material also functions as a hole barrier material. Examples of the electron transporting layer that may be used herein include but are not limited to a nitro-substituted fluorene derivative, a diphenylquinone derivative, a thiopyran dioxide derivative, carbodiimide, a fluorenylidene methane derivative, anthraquinodimethane, an anthrone derivatives, an oxadiazole derivative, an azole derivative, an azine derivative, or a combination thereof, or a polymer thereof. In some embodiments, the electron transporting material is a thiadiazole derivative, or a quinoxaline derivative. In some embodiments, the electron transporting material is a polymer material. Preferred compound examples for use as the electron transporting material are shown below.

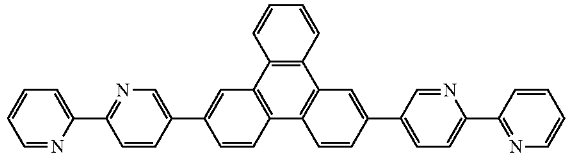

-continued
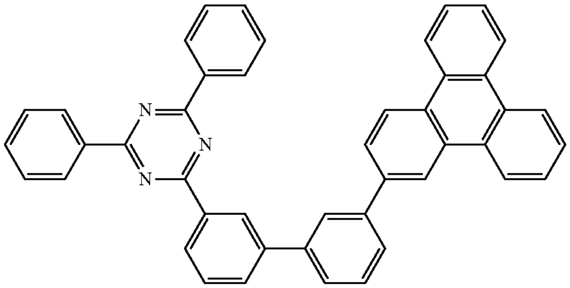
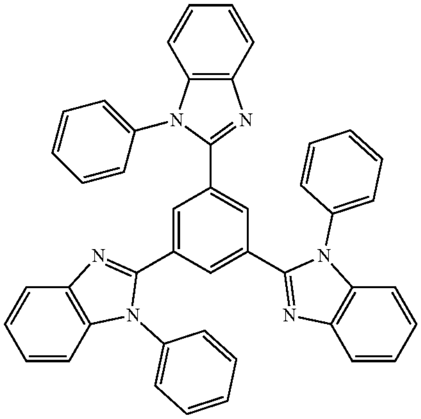
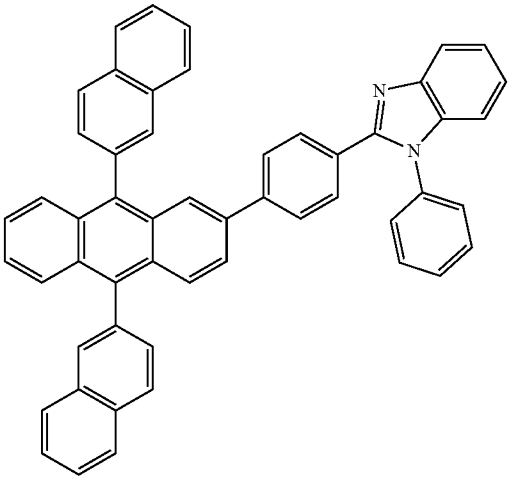
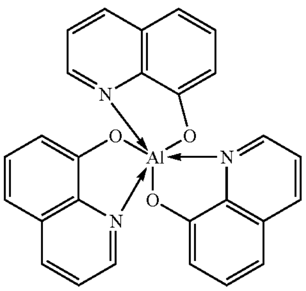
-continued
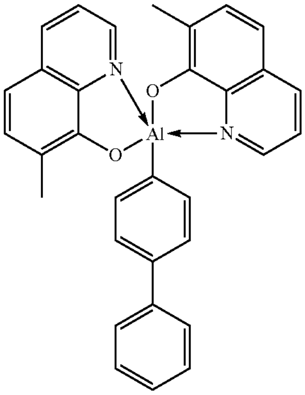
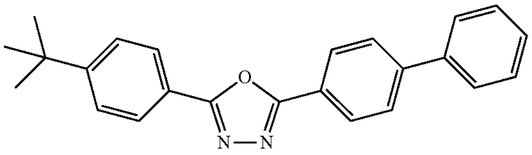
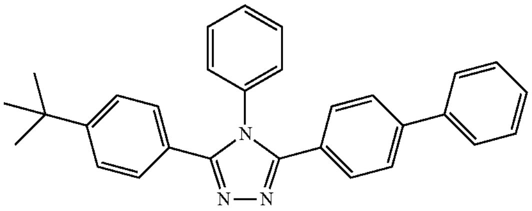
Preferred examples of compounds usable as materials that can be added to each organic layer are shown below.
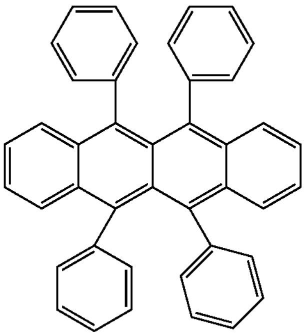
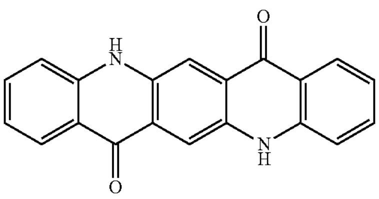

-continued

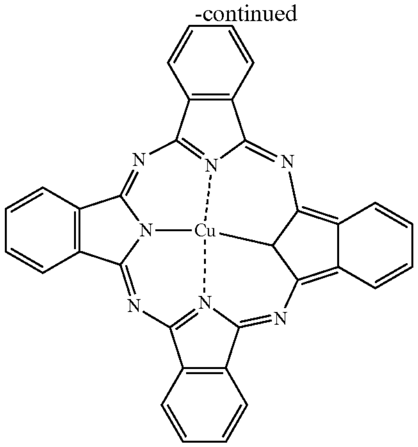

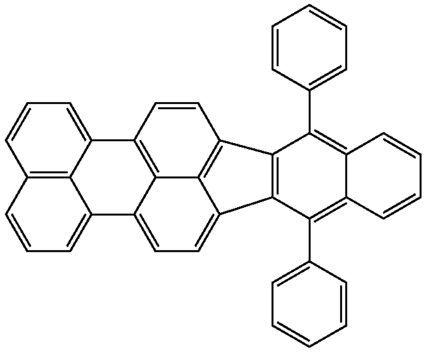

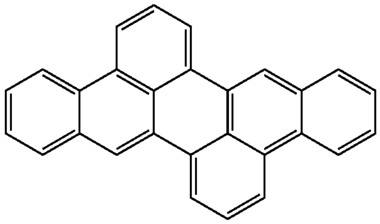

Hereinunder preferred materials for use in an organic electroluminescent device are specifically shown. However, the materials usable in the present invention should not be limitatively interpreted by the following exemplary compounds. Compounds that are exemplified as materials having a specific function can also be used as materials having any other function.

Devices:

In some embodiments, the light-emitting layers are incorporated into a device. For example, the device includes, but is not limited to an OLED bulb, an OLED lamp, a television screen, a computer monitor, a mobile phone, and a tablet.

In some embodiments, an electronic device comprises an OLED comprising an anode, a cathode, and at least one organic layer comprising a light emitting layer between the anode and the cathode.

In some embodiments, compositions described herein may be incorporated into various light-sensitive or light-activated devices, such as OLEDs or photovoltaic devices. In some embodiments, the composition may be useful in facilitating charge transfer or energy transfer within a device and/or as a hole-transport material. The device may be, for example, an organic light-emitting diode (OLED), an organic integrated circuit (OTC), an organic field-effect transistor (O-FET), an organic thin-film transistor (O-TFT), an organic light-emitting transistor (O-LET), an organic solar cell (O-SC), an organic optical detector, an organic photoreceptor, an organic field-quench device (O-FQD), a light-emitting electrochemical cell (LEC) or an organic laser diode (O-laser).

Bulbs or Lamps:

In some embodiments, an electronic device comprises an OLED comprising an anode, a cathode, and at least one organic layer comprising a light emitting layer between the anode and the cathode.

In some embodiments, a device comprises OLEDs that differ in color. In some embodiments, a device comprises an array comprising a combination of OLEDs. In some embodiments, the combination of OLEDs is a combination of three colors (e.g., RGB).

In some embodiments, the combination of OLEDs is a combination of colors that are not red, green, or blue (for example, orange and yellow green). In some embodiments, the combination of OLEDs is a combination of two, four, or more colors.

In some embodiments, a device is an OLED light comprising:

a circuit board having a first side with a mounting surface and an opposing second side, and defining at least one aperture;

at least one OLED on the mounting surface, the at least one OLED configured to emanate light, comprising an anode, a cathode, and at least one organic layer comprising a light emitting layer between the anode and the cathode;

a housing for the circuit board; and at least one connector arranged at an end of the housing, the housing and the connector defining a package adapted for installation in a light fixture.

In some embodiments, the OLED light comprises a plurality of OLEDs mounted on a circuit board such that light emanates in a plurality of directions. In some embodiments, a portion of the light emanated in a first direction is deflected to emanate in a second direction. In some embodiments, a reflector is used to deflect the light emanated in a first direction.

Displays or Screens:

In some embodiments, the light-emitting layer in the present invention can be used in a screen or a display. In some embodiments, the compounds in the present invention are deposited onto a substrate using a process including, but not limited to, vacuum evaporation, deposition, vapor deposition, or chemical vapor deposition (CVD). In some embodiments, the substrate is a photoplate structure useful in a two-sided etch that provides a unique aspect ratio pixel. The screen (which may also be referred to as a mask) is used in a process in the manufacturing of OLED displays. The corresponding artwork pattern design facilitates a very steep and narrow tie-bar between the pixels in the vertical direction and a large, sweeping bevel opening in the horizontal direction. This allows the close patterning of pixels needed for high definition displays while optimizing the chemical deposition onto a TFT backplane.

The internal patterning of the pixel allows the construction of a 3-dimensional pixel opening with varying aspect ratios in the horizontal and vertical directions. Additionally, the use of imaged “stripes” or halftone circles within the pixel area inhibits etching in specific areas until these specific patterns are undercut and fall off the substrate. At that point, the entire pixel area is subjected to a similar etch rate but the depths are varying depending on the halftone pattern. Varying the size and spacing of the halftone pattern allows etching to be inhibited at different rates within the pixel allowing for a localized deeper etch needed to create steep vertical bevels.

A preferred material for the deposition mask is invar. Invar is a metal alloy that is cold rolled into long thin sheet in a steel mill. Invar cannot be electrodeposited onto a rotating mandrel as the nickel mask. A preferred and more cost feasible method for forming the open areas in the mask used for deposition is through a wet chemical etching.

In some embodiments, a screen or display pattern is a pixel matrix on a substrate. In some embodiments, a screen or display pattern is fabricated using lithography (e.g., photolithography and e-beam lithography). In some embodiments, a screen or display pattern is fabricated using a wet chemical etch. In further embodiments, a screen or display pattern is fabricated using plasma etching.

Methods of Manufacturing Devices:

An OLED display is generally manufactured by forming a large mother panel and then cutting the mother panel in units of cell panels. In general, each of the cell panels on the mother panel is formed by forming a thin film transistor (TFT) including an active layer and a source/drain electrode on a base substrate, applying a planarization film to the TFT; and sequentially forming a pixel electrode, a light-emitting layer, a counter electrode, and an encapsulation layer, and then is cut from the mother panel.

An OLED display is generally manufactured by forming a large mother panel and then cutting the mother panel in units of cell panels. In general, each of the cell panels on the mother panel is formed by forming a thin film transistor (TFT) including an active layer and a source/drain electrode on a base substrate, applying a planarization film to the TFT, and sequentially forming a pixel electrode, a light-emitting layer, a counter electrode, and an encapsulation layer, and then is cut from the mother panel.

In another aspect, provided herein is a method of manufacturing an organic light-emitting diode (OLED) display, the method comprising:

- forming a barrier layer on a base substrate of a mother panel;
- forming a plurality of display units in units of cell panels on the barrier layer;
- forming an encapsulation layer on each of the display units of the cell panels; and
- applying an organic film to an interface portion between the cell panels.

In some embodiments, the barrier layer is an inorganic film formed of, for example, SiNx, and an edge portion of the barrier layer is covered with an organic film formed of polyimide or acryl. In some embodiments, the organic film helps the mother panel to be softly cut in units of the cell panel.

In some embodiments, the thin film transistor (TFT) layer includes a light-emitting layer, a gate electrode, and a source/drain electrode. Each of the plurality of display units may include a thin film transistor (TFT) layer, a planarization film formed on the TFT layer, and a light-emitting unit formed on the planarization film, wherein the organic film applied to the interface portion is formed of a same material as a material of the planarization film and is formed at a same time as the planarization film is formed. In some embodiments, a light-emitting unit is connected to the TFT layer with a passivation layer and a planarization film therebetween and an encapsulation layer that covers and protects the light-emitting unit. In some embodiments of the method of manufacturing, the organic film contacts neither the display units nor the encapsulation layer.

Each of the organic film and the planarization film may include any one of polyimide and acryl. In some embodiments, the barrier layer may be an inorganic film. In some embodiments, the base substrate may be formed of polyimide. The method may further include, before the forming of the barrier layer on one surface of the base substrate formed of polyimide, attaching a carrier substrate formed of a glass material to another surface of the base substrate, and before the cutting along the interface portion, separating the carrier substrate from the base substrate. In some embodiments, the OLED display is a flexible display.

In some embodiments, the passivation layer is an organic film disposed on the TFT layer to cover the TFT layer. In some embodiments, the planarization film is an organic film formed on the passivation layer. In some embodiments, the planarization film is formed of polyimide or acryl, like the organic film formed on the edge portion of the barrier layer. In some embodiments, the planarization film and the organic film are simultaneously formed when the OLED display is manufactured. In some embodiments, the organic film may be formed on the edge portion of the barrier layer such that a portion of the organic film directly contacts the base substrate and a remaining portion of the organic film contacts the barrier layer while surrounding the edge portion of the barrier laver.

In some embodiments, the light-emitting layer includes a pixel electrode, a counter electrode, and an organic light-emitting layer disposed between the pixel electrode and the counter electrode. In some embodiments, the pixel electrode is connected to the source/drain electrode of the TFT layer.

In some embodiments, when a voltage is applied to the pixel electrode through the TFT layer, an appropriate voltage is formed between the pixel electrode and the counter electrode, and thus the organic light-emitting layer emits light, thereby forming an image. Hereinafter, an image forming unit including the TFT layer and the light-emitting unit is referred to as a display unit.

In some embodiments, the encapsulation layer that covers the display unit and prevents penetration of external moisture may be formed to have a thin film encapsulation structure in which an organic film and an inorganic film are alternately stacked. In some embodiments, the encapsulation layer has a thin film encapsulation structure in which a plurality of thin films are stacked. In some embodiments, the organic film applied to the interface portion is spaced apart from each of the plurality of display units. In some embodiments, the organic film is formed such that a portion of the organic film directly contacts the base substrate and a remaining portion of the organic film contacts the barrier layer while surrounding an edge portion of the barrier layer.

In some embodiments, the OLED display is flexible and uses the soft base substrate formed of polyimide. In some embodiments, the base substrate is formed on a carrier substrate formed of a glass material, and then the carrier substrate is separated.

In some embodiments, the barrier layer is formed on a surface of the base substrate opposite to the carrier substrate. In some embodiments, the barrier layer is patterned according to a size of each of the cell panels. For example, while the base substrate is formed over the entire surface of a mother panel, the barrier layer is formed according to a size of each of the cell panels, and thus a groove is formed at an interface portion between the barrier layers of the cell panels. Each of the cell panels can be cut along the groove.

In some embodiments, the method of manufacture further comprises cutting along the interface portion, wherein a groove is formed in the barrier layer, wherein at least a portion of the organic film is formed in the groove, and wherein the groove does not penetrate into the base substrate. In some embodiments, the TFT layer of each of the cell panels is formed, and the passivation layer which is an inorganic film and the planarization film which is an organic film are disposed on the TFT layer to cover the TFT layer. At the same time as the planarization film formed of, for example, polyimide or acryl is formed, the groove at the interface portion is covered with the organic film formed of, for example, polyimide or acryl. This is to prevent cracks from occurring by allowing the organic film to absorb an impact generated when each of the cell panels is cut along the groove at the interface portion. That is, if the entire barrier layer is entirely exposed without the organic film, an impact generated when each of the cell panels is cut along the groove at the interface portion is transferred to the barrier layer, thereby increasing the risk of cracks. However, in some embodiments, since the groove at the interface portion between the barrier layers is covered with the organic film and the organic film absorbs an impact that would otherwise be transferred to the barrier layer, each of the cell panels may be softly cut and cracks may be prevented from occurring in the barrier layer. In some embodiments, the organic film covering the groove at the interface portion and the planarization film are spaced apart from each other. For example, if the organic film and the planarization film are connected to each other as one layer, since external moisture may penetrate into the display unit through the planarization film and a portion where the organic film remains, the organic film and the planarization film are spaced apart from each other such that the organic film is spaced apart from the display unit.

In some embodiments, the display unit is formed by forming the light-emitting unit, and the encapsulation layer is disposed on the display unit to cover the display unit. As such, once the mother panel is completely manufactured, the carrier substrate that supports the base substrate is separated from the base substrate. In some embodiments, when a laser beam is emitted toward the carrier substrate, the carrier substrate is separated from the base substrate due to a difference in a thermal expansion coefficient between the carrier substrate and the base substrate.

In some embodiments, the mother panel is cut in units of the cell panels. In some embodiments, the mother panel is cut along an interface portion between the cell panels by using a cutter. In some embodiments, since the groove at the interface portion along which the mother panel is cut is covered with the organic film, the organic film absorbs an impact during the cutting. In some embodiments, cracks may be prevented from occurring in the barrier layer during the cutting.

In some embodiments, the methods reduce a defect rate of a product and stabilize its quality.

Another aspect is an OLED display including: a barrier layer that is formed on a base substrate; a display unit that is formed on the barrier layer; an encapsulation layer that is formed on the display unit; and an organic film that is applied to an edge portion of the barrier layer.

The present specification discloses at least the following invention.

[1] A compound represented by the following formula (1).

Formula (1)

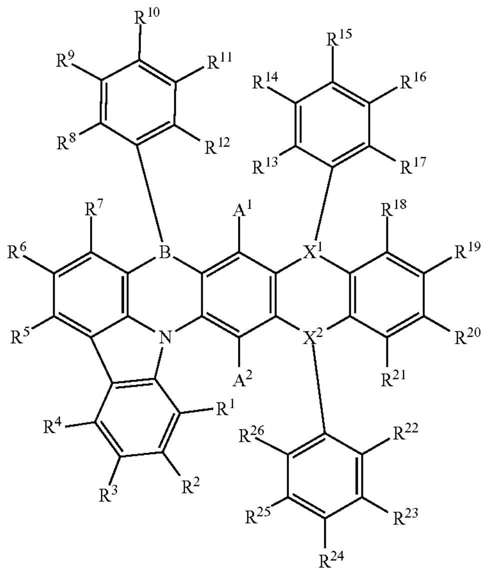

[In the formula (1), one of $X^1$ and $X^2$ is a nitrogen atom, and the other is a boron atom. Each of $R^1$ to $R^{26}$, $A^1$, and $A^2$ independently represents a hydrogen atom, a deuterium atom, or a substituent. $R^1$ and $R^2$, $R^2$ and $R^3$, $R^3$ and $R^4$, $R^4$ and $R^5$, $R^5$ and $R^6$, $R^6$ and $R^7$, $R^7$ and $R^8$, $R^8$ and $R^9$, $R^9$ and $R^{10}$, $R^{10}$ and $R^{11}$, $R^{11}$ and $R^{12}$, $R^{13}$ and $R^{14}$, $R^{14}$ and $R^{15}$, $R^{15}$ and $R^{16}$, $R^{16}$ and $R^{17}$, $R^{17}$ and $R^{18}$, $R^{18}$ and $R^{19}$, $R^{19}$ and $R^{20}$, $R^{20}$ and $R^{21}$, $R^{21}$ and $R^{22}$, $R^{22}$ and $R^{23}$, $R^{23}$ and $R^{24}$, $R^{24}$ and $R^{25}$, and $R^{25}$ and $R^{26}$ may be bonded to each other to form ring structures. Here, when $X^1$ is a nitrogen atom, $R^{17}$ and $R^{18}$ are bonded to each other to form a single bond and to form a pyrrole ring, and when $X^2$ is a nitrogen atom, $R^{21}$ and $R^{22}$ are bonded to each other to form a single bond and to form a pyrrole ring. Here, when $X^1$ is a nitrogen atom, $R^7$ and $R^8$ and $R^{21}$ and $R^{22}$ are bonded via nitrogen atoms to form 6-membered rings, and $R^{17}$ and $R^{18}$ are bonded to each other to form a single bond, at least one of $R^1$ to $R^6$ is a substituted or unsubstituted aryl group, or an aromatic ring or a heteroaromatic ring is formed through bonding in any of $R^1$ and $R^2$, $R^2$ and $R^3$, $R^3$ and $R^4$, $R^4$ and $R^5$, and $R^5$ and $R^6$.]

[2] The compound described in [1], in which the compound has the following skeleton (1a) or skeleton (1 b).

Skeleton (1a)

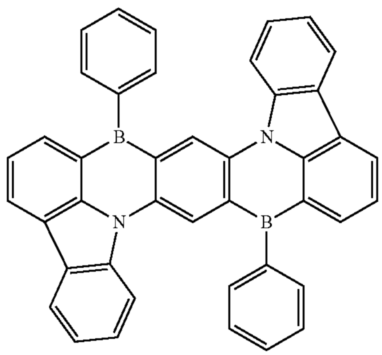

-continued

Skeleton (1b)

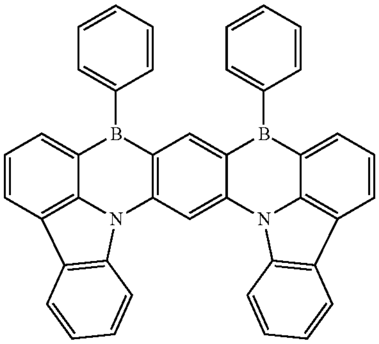

[In the skeletons (1a) and (1b), each hydrogen atom may be substituted with a deuterium atom or a substituent, or may be substituted with a linking group together with an adjacent hydrogen atom to form a ring structure.]

[3] The compound described in [1], in which the compound has the following skeleton (2a) or skeleton (2b).

Skeleton (2a)

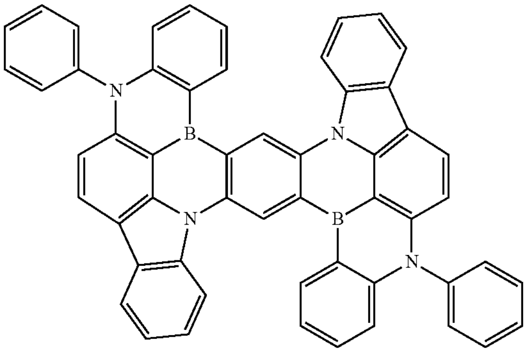

Skeleton (2b)

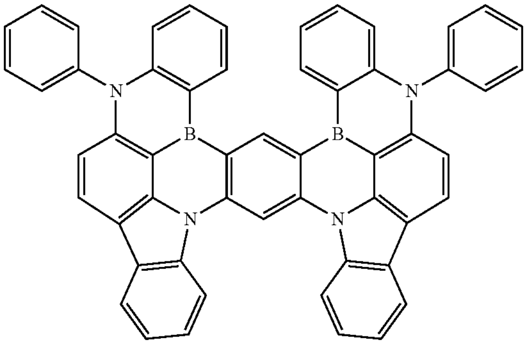

[In the skeletons (2a) and (2b), each hydrogen atom may be substituted with a deuterium atom or a substituent, or may be substituted with a linking group together with an adjacent hydrogen atom to form a ring structure.]

[4] The compound described in [1], in which the compound has the following skeleton (3a) or skeleton (3b).

Skeleton (3a)

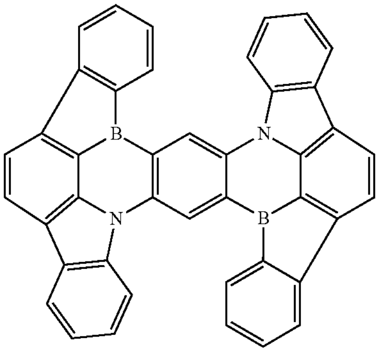

Skeleton (3b)

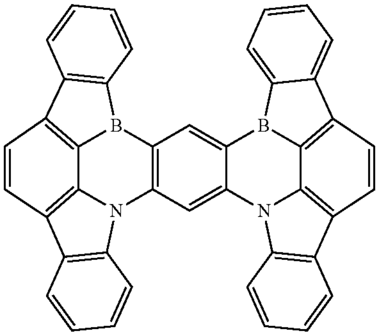

[In the skeletons (3a) and (3b), each hydrogen atom may be substituted with a deuterium atom or a substituent, or may be substituted with a linking group together with an adjacent hydrogen atom to form a ring structure.]

[5] The compound described in [1], in which the compound has the following skeleton (4a) or skeleton (4b).

Skeleton (4a)

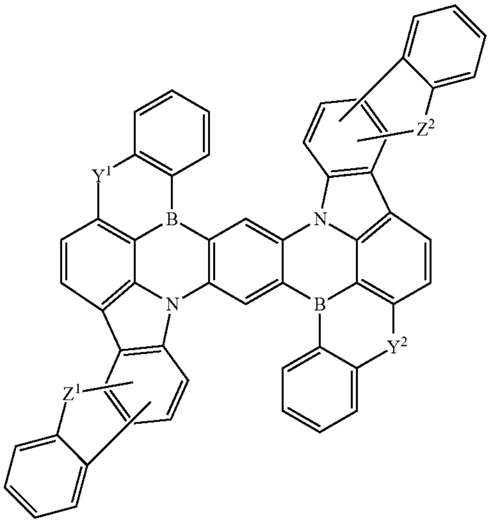

-continued

Skeleton (4b)

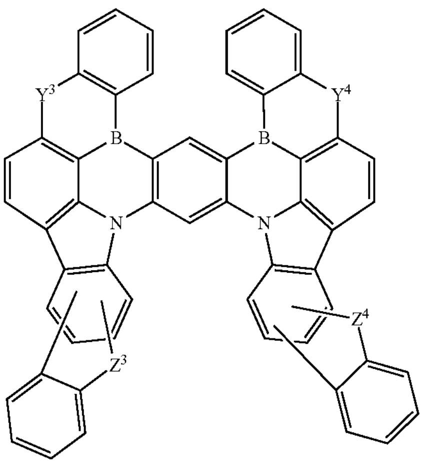

[In the skeletons (4a) and (4b), each of $Y^1$ to $Y^4$ independently represents two hydrogen atoms, a single bond or $N(R^{27})$, each of $Z^1$ to $Z^4$ independently represents an oxygen atom or a sulfur atom and $R^{27}$ represents a hydrogen atom, a deuterium atom, or a substituent. In the skeletons (4a) and (4b), each hydrogen atom may be substituted with a deuterium atom or a substituent, or may be substituted with a linking group together with an adjacent hydrogen atom to form a ring structure.]

[6] The compound described in [1], in which the compound has the following skeleton (5a) or skeleton (5b).

Skeleton (5a)

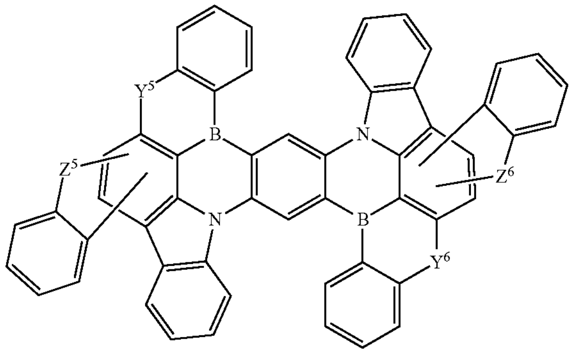

Skeleton (5b)

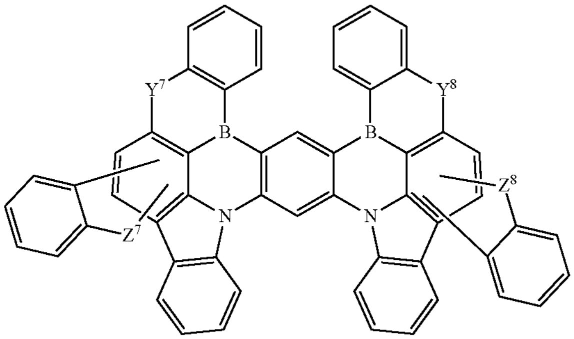

[In the skeletons (5a) and (5b), each of $Y^5$ to $Y^8$ independently represents two hydrogen atoms, a single bond or $N(R^{27})$, each of $Z^5$ to $Z^8$ independently represents an oxygen atom or a sulfur atom, and $R^{27}$ represents a hydrogen atom, a deuterium atom, or a substituent. In the skeletons (5a) and (5b), each hydrogen atom may be substituted with a deuterium atom or a substituent, or may be substituted with a linking group together with an adjacent hydrogen atom to form a ring structure.]

[7] The compound described in [1], in which the compound has the following skeleton (6a) or skeleton (6b).

Skeleton (6a)

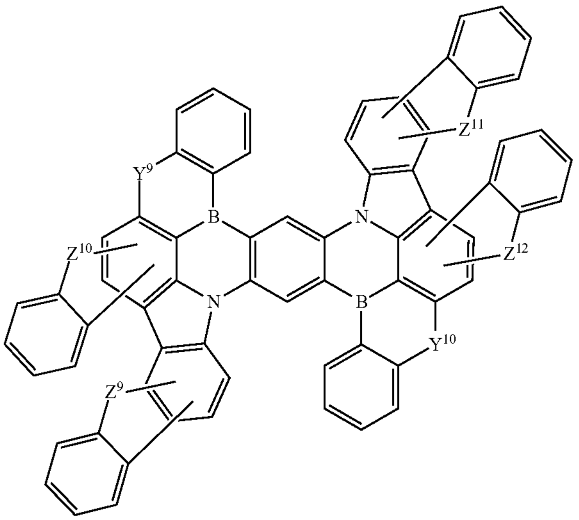

Skeleton (6b)

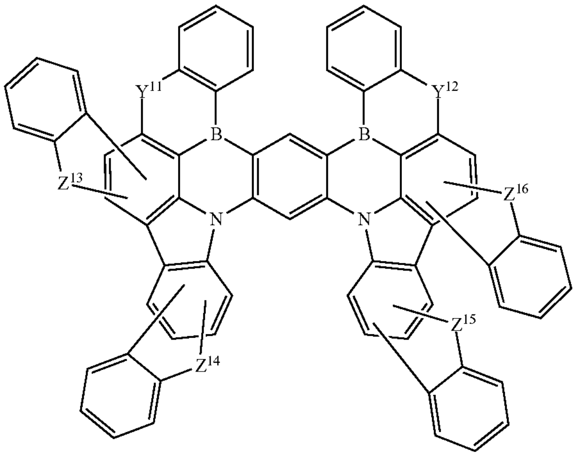

[In the skeletons (6a) and (6b), each of $Y^9$ to $Y^{12}$ independently represents two hydrogen atoms, a single bond or $N(R^{27})$, each of $Z^9$ to $Z^{16}$ independently represents an oxygen atom or a sulfur atom, and $R^{27}$ represents a hydrogen atom, a deuterium atom, or a substituent. In the skeletons (6a) and (6b), each hydrogen atom may be substituted with a deuterium atom or a substituent, or may be substituted with a linking group together with an adjacent hydrogen atom to form a ring structure.]

[8] The compound described in [1], in which the compound has the following skeleton (7a) or skeleton (7b).

Skeleton (7a)

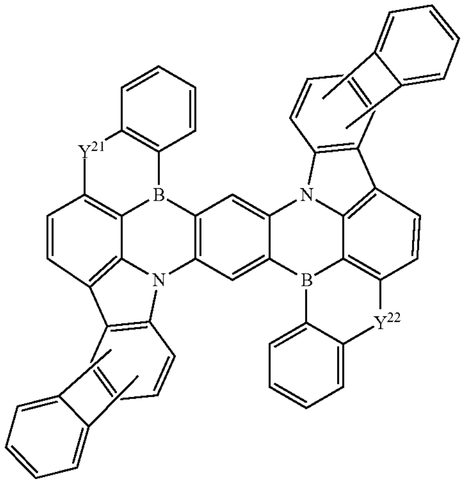

Skeleton (7b)

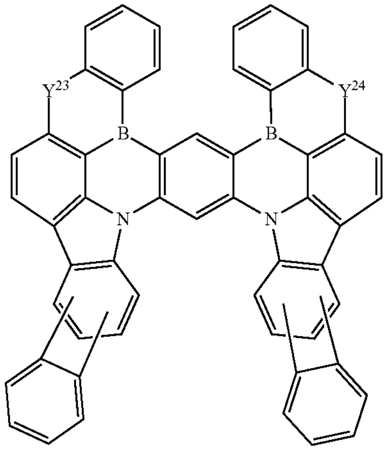

[In the skeletons (7a) and (7b), each of $Y^{21}$ to $Y^{24}$ independently represents two hydrogen atoms, a single bond or $N(R^{27})$, and $R^{27}$ represents a hydrogen atom, a deuterium atom, or a substituent. In the skeletons (7a) and (7b), each hydrogen atom may be substituted with a deuterium atom or a substituent, or may be substituted with a linking group together with an adjacent hydrogen atom to form a ring structure.]

[9] The compound described in [1], in which the compound has the following skeleton (8a) or skeleton (8b).

Skeleton (8a)

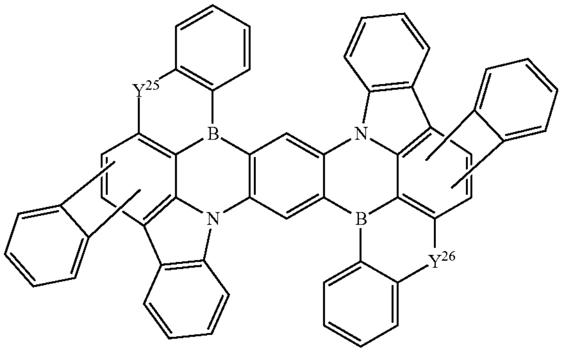

Skeleton (8b)

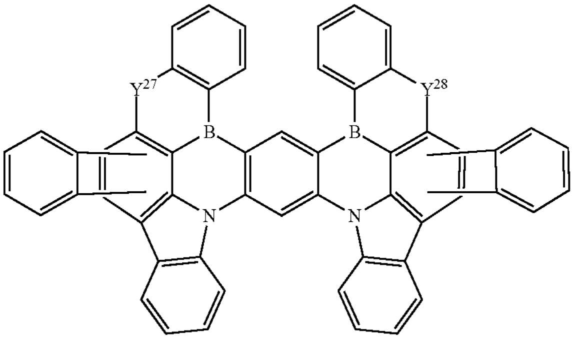

[In the skeletons (8a) and (8b), each of $Y^{25}$ to $Y^{28}$ independently represents two hydrogen atoms, a single bond or $N(R^{27})$, and $R^{27}$ represents a hydrogen atom, a deuterium atom, or a substituent. In the skeletons (8a) and (8b), each hydrogen atom may be substituted with a deuterium atom or a substituent, or may be substituted with a linking group together with an adjacent hydrogen atom to form a ring structure.]

[10] The compound described in [1], in which the compound has the following skeleton (9a) or skeleton (9b).

Skeleton (9a)

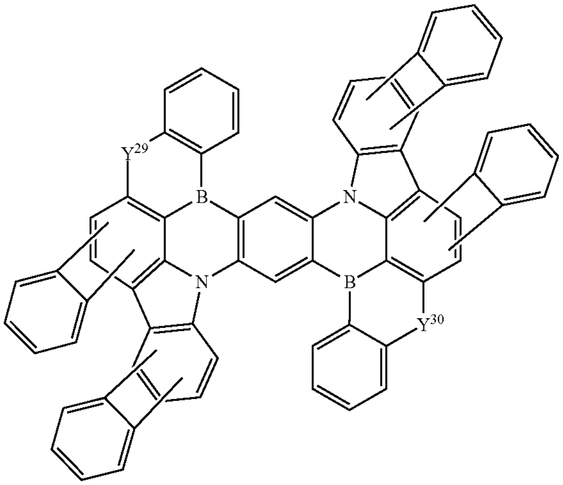

-continued

Skeleton (9b)

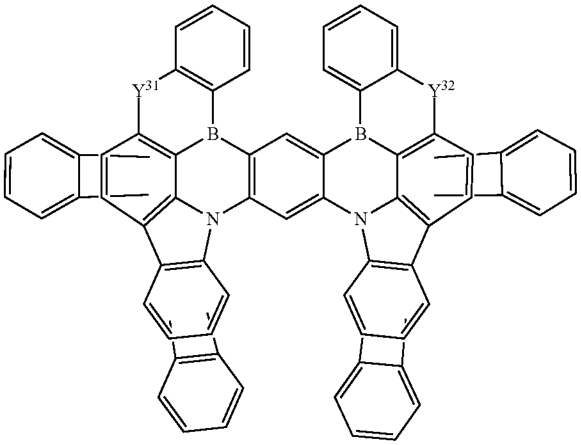

[In the skeletons (9a) and (9b), each of $Y^{29}$ to $Y^{92}$ independently represents two hydrogen atoms, a single bond or $N(R^{27})$, and $R^{27}$ represents a hydrogen atom, a deuterium atom, or a substituent. In the skeletons (9a) and (9b), each hydrogen atom may be substituted with a deuterium atom or a substituent, or may be substituted with a linking group together with an adjacent hydrogen atom to form a ring structure.]

[11] The compound described in [1], in which the compound has the following skeleton (10).

Skeleton (10)

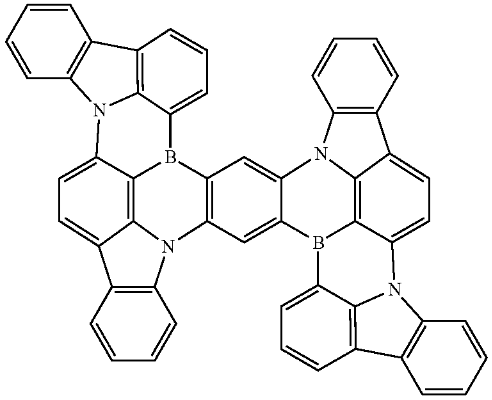

[In the skeleton (10), each hydrogen atom may be substituted with a deuterium atom or a substituent, or may be substituted with a linking group together with an adjacent hydrogen atom to form a ring structure.]

[12] The compound described in any one of [1] to [11], in which a substituted or unsubstituted aryl group is bonded to a benzene ring forming a carbazole partial structure constituting the compound.

[13] The compound described in any one of [11] to [12], which has a rotationally symmetric structure.

[14] The compound described in any one of [11] to [12], which has an axially symmetric structure.

[15] A light-emitting material including the compound described in any one of [1] to [14].

[16] A film including the compound described in any one of [1] to [14].

[17] An organic semiconductor device including the compound described in any one of [1] to [14].

[18] An organic light-emitting device including the compound described in any one of [1] to [14].

[19] The organic light-emitting device described in [18], in which the device has a layer including the compound, and the layer also includes a host material.

[20] The organic light-emitting device described in [19], in which the layer including the compound also includes a delayed fluorescence material as well as the host material, and the lowest excited singlet energy of the delayed fluorescence material is lower than that of the host material, and higher than that of the compound.

[21] The organic light-emitting device described in [18], in which the device has a layer including the compound, and the layer also includes a light-emitting material having a structure different from that of the compound.

[22] The organic light-emitting device described in any one of [18] to [20], in which among materials included in the device, the amount of light emitted from the compound is the largest.

[23] The organic light-emitting device described in [20], in which the amount of light emitted from the light-emitting material is larger than the amount of light emitted from the compound.

[24] The organic light-emitting device described in any one of [18] to [23], which emits delayed fluorescence.

All of the above patent publications are hereby incorporated as a part of the present specification in their entities.

The present disclosure relates to the subject matter contained in Japanese Patent Application No. 2021-103702 filed on Jun. 23, 2021; and Japanese Patent Application No. 2021-151805 filed on Sep. 17, 2021.

EXAMPLES

The features of the present invention will be described more specifically with reference to Synthesis Examples and Examples given below. The materials, processes, procedures and the like shown below may be appropriately modified unless they deviate from the substance of the invention. Accordingly, the scope of the invention is not construed as being limited to the specific examples shown below. Hereinunder the light emission characteristics were evaluated using a source meter (available from Keithley Instruments Corporation: 2400 series), a semiconductor parameter analyzer (available from Agilent Corporation. E5273A), an optical power meter device (available from Newport Corporation, 1930C), an optical spectroscope (available from Ocean Optics Corporation, USB2000), a spectroradiometer (available from Topcon Corporation, SR-3), and a streak camera (available from Hamamatsu Photonics K.K., Model C4334). Further, the molar absorbance coefficient was measured using a high-performance UV/Vis/NIR spectrophotometer (available from PerkinElmer, Inc, Lambda 950). The orientation value (S value) was measured using a molecular orientation characteristic measurement system (available from Hamamatsu Photonics K. K., C14234-01).

(Synthesis Example 1) Synthesis of Standard Compound 1

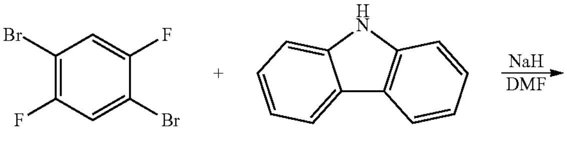

-continued

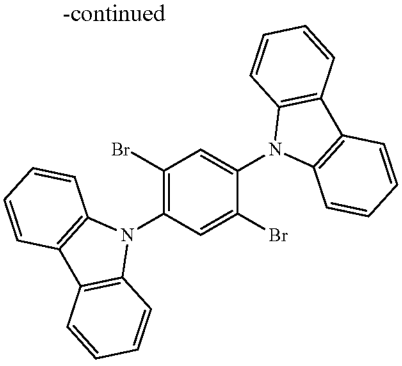

A

Under a nitrogen stream, carbazole (7.69 g, 46.0 mmol) was added to a N,N-dimethylformamide solution (160 mL) of sodium hydride (1.16 g, 29.0 mmol), followed by stirring at room temperature for 30 min. Then, 2,5-dibromo-1,4-difluorobenzene (5.00 g, 18.4 mmol) was added thereto, followed by stirring at 60° C. for 16 h. This mixture was returned to room temperature, and water was added thereto. Then, the precipitated solid was filtered. This was purified with silica gel column chromatography (toluene), and the resultant solid was washed with acetonitrile to obtain Intermediate A (5.83 g, 10.3 mmol, yield 56%) as a white solid.

$^1$HNMR (400 MHz, $CDCl_3$, δ): 8.19 (d, J=8.0 Hz, 4H), 8.01 (s, 2H), 7.58-7.48 (m, 4H), 7.39-7.35 (m, 4H), 7.27-7.24 (m, 4H)

MS (ASAP): 567.01 ($M+H^+$). Calcd for. $C_{30}H_{18}Br_2N_2$: 565.98

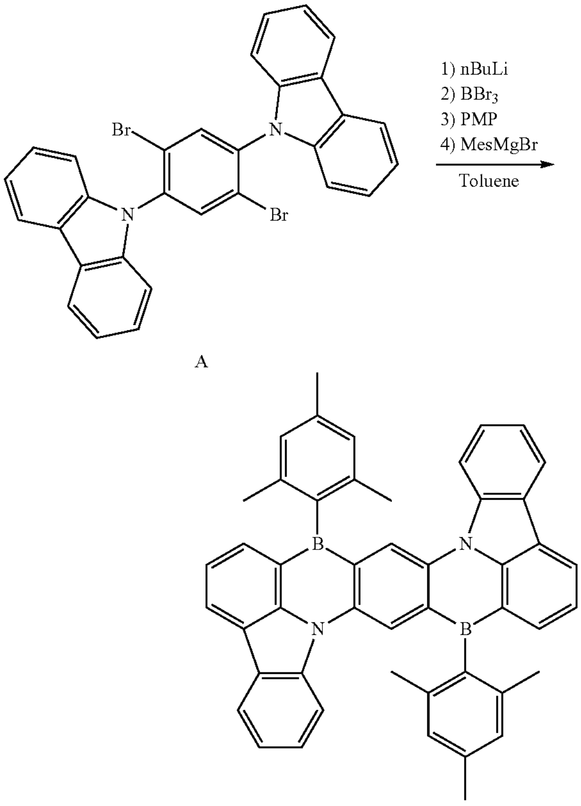

A

Standard 1

Under a nitrogen stream, to a toluene solution (100 mL) of the intermediate A (1.00 g, 1.80 mmol), n-butyllithium (1.6 mol/L hexane solution, 4.5 mL, 7.19 mmol) was added at −30° C., followed by stirring at room temperature for 1 h. The reaction mixture was cooled to −30° C., and boron tribromide (0.991 g, 3.96 mmol) was added thereto, followed by stirring at room temperature for 30 min. To the reaction mixture, 1,2,2,6,6-pentamethylpiperidine (0.558 g, 3.60 mmol) was added, followed by stirring at 120° C. for 17 h. The reaction mixture was cooled to room temperature, and 2-mesitylmagnesium bromide (1.0 mol/L tetrahydrofuran solution, 5.4 mL, 5.40 mmol) was added thereto, followed by stirring at room temperature for 2.5 h. The solvent in the resultant reaction mixture was distilled off, and methanol was added, and then the precipitate was filtered. This solid was purified with silica gel column chromatography (toluene:hexane=4:6) to obtain Standard Compound 1 as an orange solid (0.258 g, 0.388 mmol, yield 22%).

$^1$HNMR (400 MHz, $CDCl_3$, δ): 9.26 (s, 2H), 8.52 (d, J=6.8 Hz, 2H), 8.28-8.21 (m, 4H), 7.94-7.90 (m, 2H), 7.64-7.60 (m, 2H), 7.45-7.42 (m, 4H), 7.15-7.14 (m, 4H), 2.56 (s, 6H), 2.16 (s, 12H)

MS (ASAP): 664.23 ($M^+$). Calcd for. $C_{48}H_{38}B_2N_2$: 664.32

(Synthesis Example 2) Synthesis of Compound 2

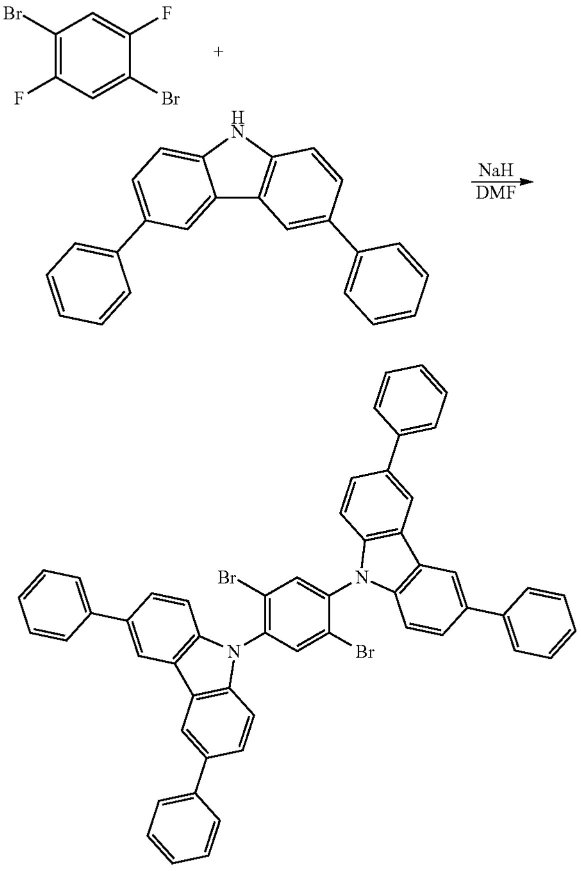

B

Under a nitrogen stream, 3,6-diphenylcarbazole (3.00 g, 9.39 mmol) was added to a N,N-dimethylformamide solution (70 mL) of sodium hydride (0.376 g, 9.39 mmol), followed by stirring at room temperature for 30 min. Then, 2,5-dibromo-1,4-difluorobenzene (1.02 g, 3.76 mmol) was added thereto, followed by stirring at 60° C. for 14 h. This mixture was returned to room temperature, and water and methanol were added thereto. Then, the precipitated solid was filtered. This solid was dissolved in hot toluene, and was filtered through a silica gel pad (toluene). Then, the solvent of the filtrate was distilled off. The resultant solid was washed with acetonitrile to obtain Intermediate B as a white solid (2.36 g, 2.71 mmol, yield 72%).

$^{1}$HNMR (400 MHz, $CDCl_3$, 6): 8.46-8.44 (m, 4H), 8.10 (s, 2H), 7.79-7.75 (m, 12H), 7.54-7.49 (m, 8H), 7.41-7.35 (m, 8H)

MS (ASAP): 870.20 ($M^+$). Calcd for. $C_{34}H_{34}Br_2N_2$: 870.11

Under a nitrogen stream, to a toluene solution (300 mL) of the intermediate B (1.00 g, 1.15 mmol), n-butyllithium (1.6 mol/L hexane solution, 2.9 mL, 4.60 mmol) was added at −30° C., followed by stirring at room temperature for 1 h. The reaction mixture was cooled to −30° C., and boron tribromide (0.633 g, 2.53 mmol) was added thereto, followed by stirring at room temperature for 30 min. To the reaction mixture, 1,2,2,6,6-pentamethylpiperidine (0.357 g, 2.30 mmol) was added, followed by stirring at 120° C. for 17 h. The reaction mixture was cooled to room temperature, and 2-mesitylmagnesium bromide (tetrahydrofuran solution of 1.0 mol/L, 3.4 mL, 3.40 mmol) was added thereto, followed by stirring at room temperature for 4 h. The resultant reaction mixture was filtered through a silica pad (toluene), and the solvent of the filtrate was distilled off. Ethyl acetate was added to the resultant viscous body, and the precipitate was filtered to obtain Compound 2 as an orange solid (0.0710 g, 0.0732 mmol, yield 6%).

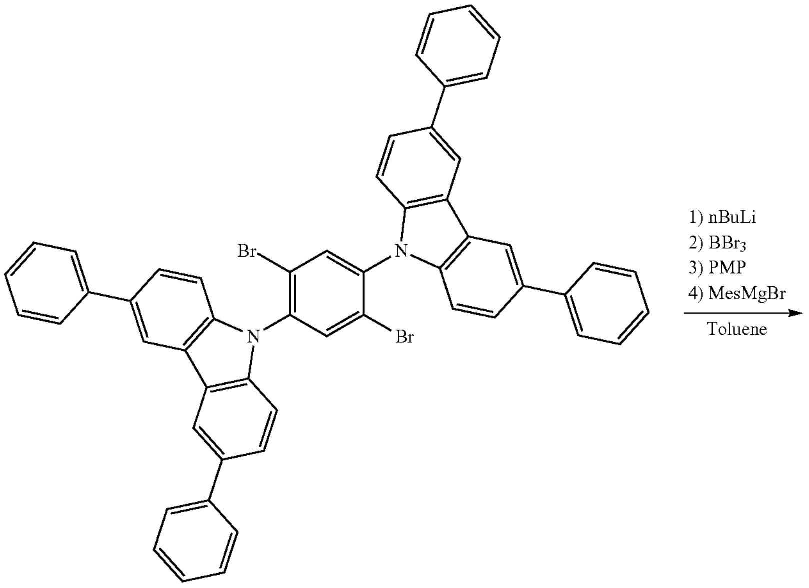

B

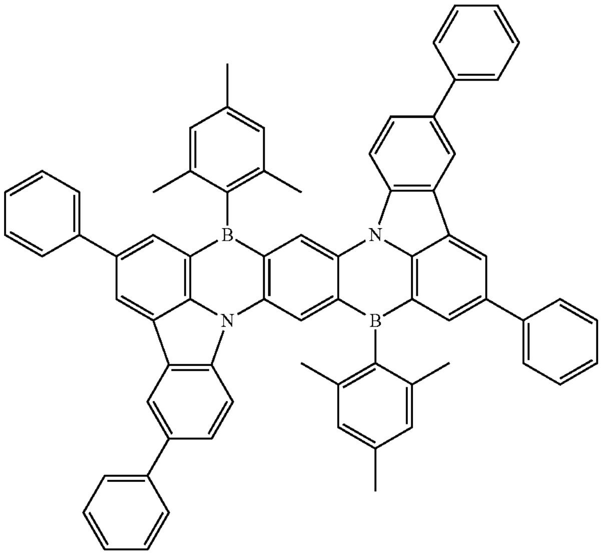

2

$^1$HNMR (400 MHz, $CDCl_3$, δ): 9.29 (s, 2H), 8.81-8.79 (m, 2H), 8.53-8.52 (m, 2H), 8.46-8.45 (m, 2H), 7.82-7.78 (m, 8H), 7.59-7.36 (m, 14H), 7.20-7.18 (m, 4H), 2.59 (s, 6H), 2.22 (s, 12H)

MS (ASAP): 968.67 ($M^+$). Calcd for. $C_{72}H_{54}B_2N_2$: 968.45

(Synthesis Example 3) Synthesis of Compound 3

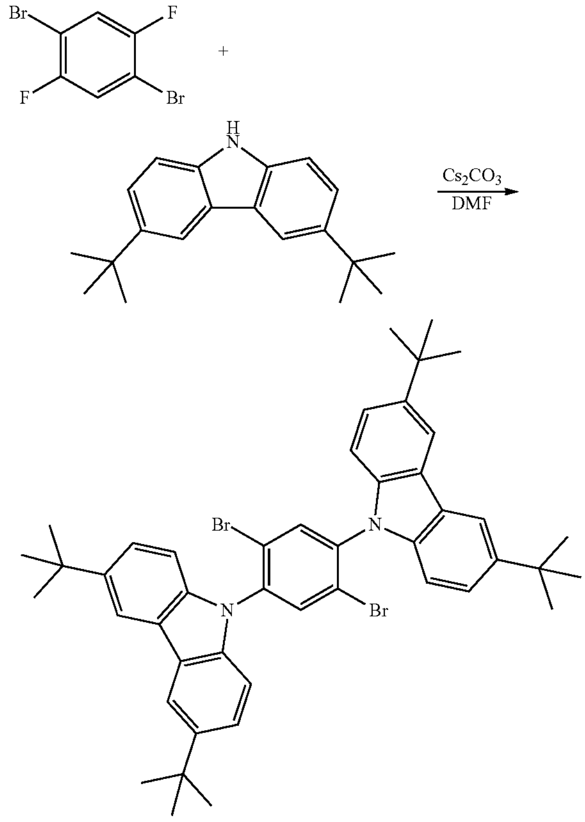

C

Intermediate C

Under a nitrogen stream, a N,N-dimethylformamide solution (360 mL) of 3,6-ditert-butyl-9H-carbazole (29.2 g, 105 mmol), cesium carbonate (61.9 g, 190 mmol) and 2,5-dibromo-1,4-difluorobenzene (12.9 g, 47.5 mmol) was stirred at 120° C. for 17 h. This mixture was returned to room temperature, and water was added thereto, and then, the precipitated solid was filtered. This was purified with silica gel column chromatography (toluene), and the resultant solid was recrystallized by toluene/methanol to obtain Intermediate C as a %% bite solid (17.5 g, 22.1 mmol, yield 47%).

$^1$HNMR (400 MHz, $CDCl_3$, δ): 8.2-8.17 (m, 4H), 7.93 (s, 2H), 7.55-7.52 (m, 4H), 7.17 (d, J=8.4 Hz, 4H), 1.49 (s, 36H)

MS (ASAP): 791.47 ($M+H^+$). Calcd for. $C_{46}H_{50}Br_2N_2$: 790.23

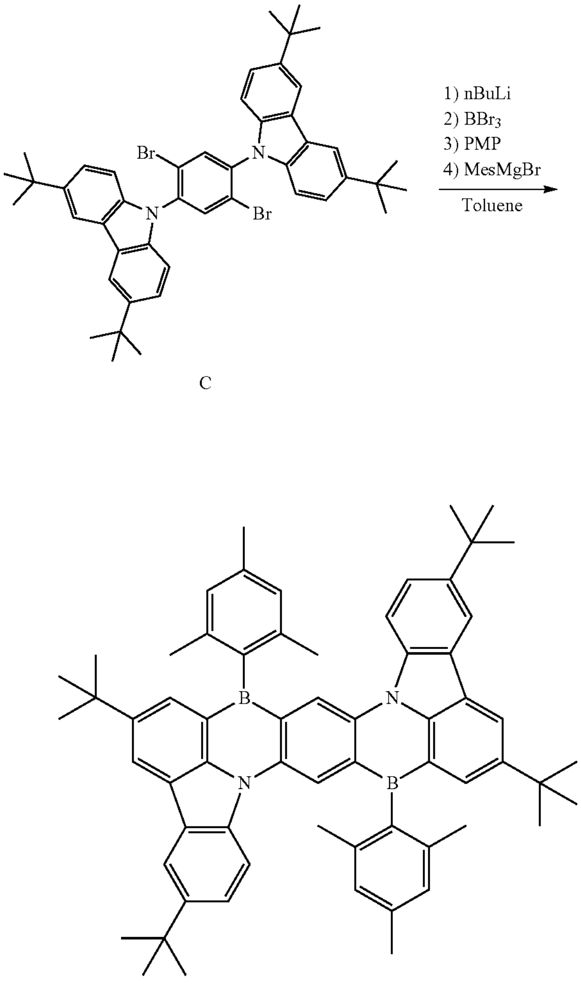

C

3

Compound 3

Under a nitrogen stream, to a toluene solution (100 mL) of the intermediate C (2.00 g, 2.52 mmol), n-BuLi (1.6 mol/L hexane solution, 4.7 mL, 7.56 mmol) was added at −30° C., followed by stirring at 50° C. for 30 min. The reaction mixture was cooled to 30° C., and boron tribromide (3.16 g, 12.6 mmol) was added thereto, followed by stirring at room temperature for 30 min. To the reaction mixture, 1,2,2,6,6-pentamethylpiperidine (1.96 g, 12.6 mmol) was added, followed by stirring at 130° C. for 2 h. To the reaction mixture, 2-mesitylmagnesium bromide (1.0 mol/L tetrahydrofuran solution, 25.2 mL, 25.2 mmol) was added and was stirred for 17 h while returned to room temperature. The solvent in the resultant reaction mixture was distilled off, and methanol was added, and then the precipitate was filtered. This solid was purified with silica gel column chromatography (toluene:hexane=1:9) to obtain Compound 3 as an orange solid (0.292 g, 0.328 mmol, yield 13%).

$^1$HNMR (400 MHz, $CDCl_3$, δ): 9.11 (s, 2H), 8.58 (d, 0.1=2.0 Hz, 2H), 8.25 (d, J=2.0 Hz, 2H), 8.23 (d, J=1.6 Hz, 2H), 7.75 (d, J=9.2 Hz, 2H), 7.44-7.41 (m, 2H), 7.17 (s, 4H), 2.60 (s, 6H), 2.16 (s, 12H), 1.53-1.51 (m, 36H)

MS (ASAP): 888.85 ($M^+$). Calcd for. $C_{64}H_{70}B_2N_2$: 888.57

(Synthesis Example 4) Synthesis of Compound 4

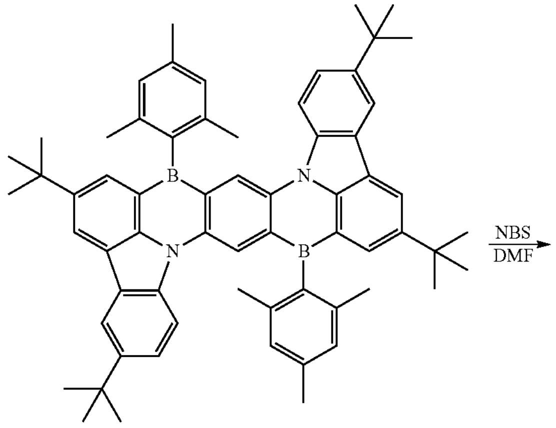

3

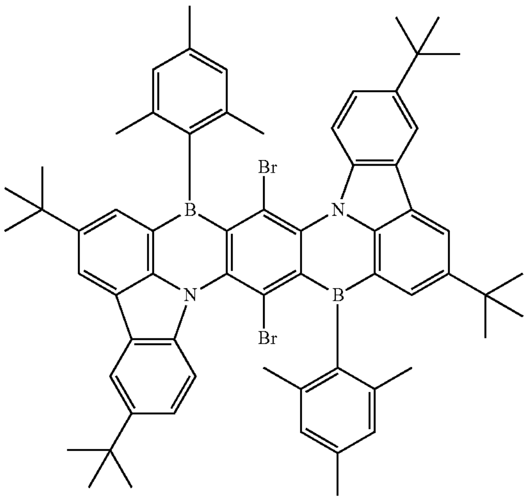

4

Compound 4

Under a nitrogen stream, a N, N-dimethylformamide solution (20 mL) of Compound 3 (250 mg, 0.281 mmol) and N-bromosuccinimide (99.6 mg, 0.562 mmol) was stirred at room temperature for 16 h. To this mixture, water was added, and then the precipitated solid was filtered. This was purified with silica gel column chromatography to obtain Compound 4 as an orange solid.

(Synthesis Example 5) Synthesis of Compound 5

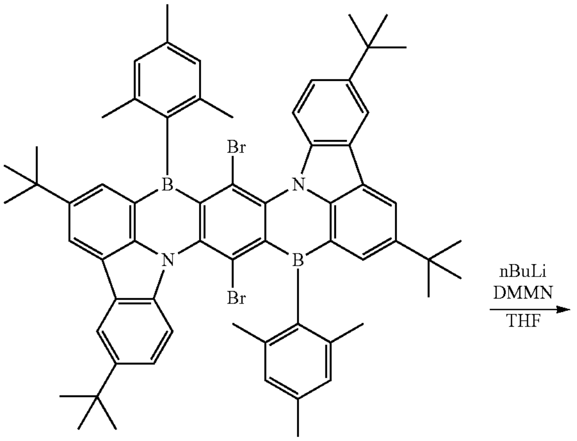

4

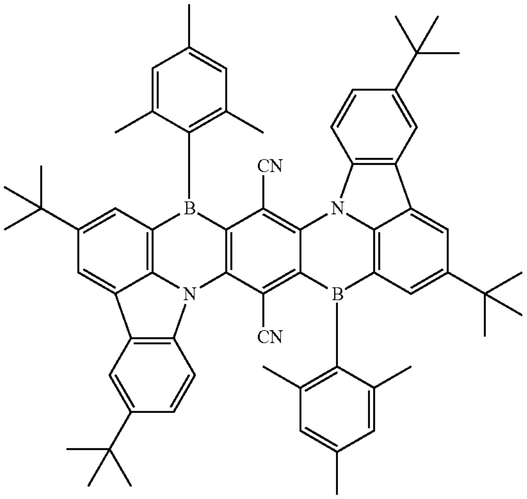

5

Compound 5

Under a nitrogen stream, n-BuLi (1.6 mol/L hexane solution, 0.13 mL, 0.201 mmol) was added to a tetrahydrofuran solution (10 mL) of Compound 4 (100 mg, 0.0955 mmol) at −30° C., followed by stirring at room temperature for 30 min. Dimethylmalononitrile (27.0 mg, 0.287 mmol) was added to the reaction mixture, followed by stirring at room temperature for 16 h. The solvent in the reaction mixture was distilled off, and then through purification with silica gel column chromatography, Compound 5 as a red solid was obtained.

(Synthesis Example 6) Synthesis of Compound 6

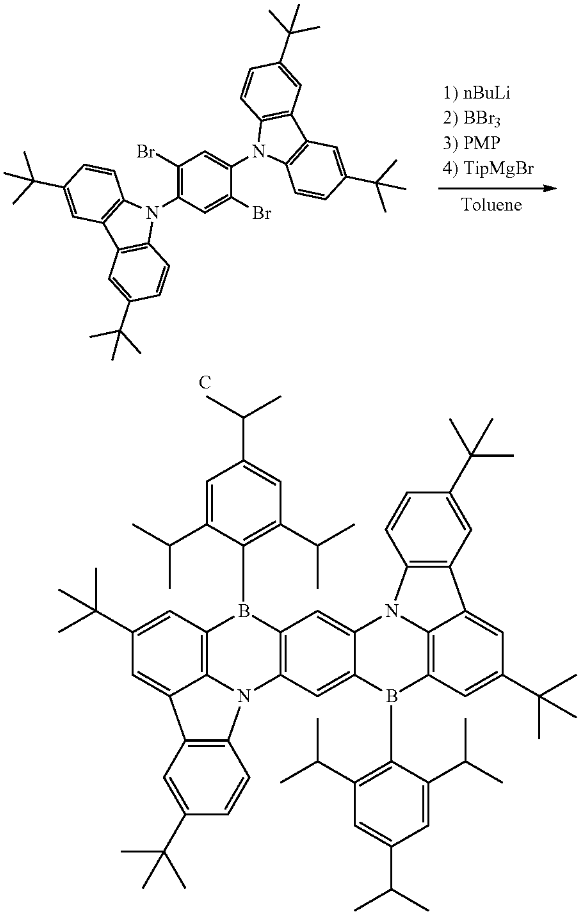

C

6

Compound 6

Under a nitrogen stream, to a toluene solution (100 mL) of the intermediate C (2.00 g, 2.53 mmol), n-BuLi (1.6 mol/L hexane solution, 4.7 mL, 7.56 mmol) was added at 0° C., followed by stirring at 50° C. for 30 min. The reaction mixture was cooled to 0° C., and boron tribromide (3.16 g, 12.6 mmol) was added thereto, followed by stirring at room temperature for 30 min. To the reaction mixture, 1,2,2,6,6-pentamethylpiperidine (1.96 g, 12.6 mmol) was added, followed by stirring at 135° C. for 2 h. To the reaction mixture, 2,4,6-triisopropylmagnesium bromide-lithium chloride complex (1.0 mol/L tetrahydrofuran solution, 25.2 mL, 25.2 mmol) was added and was stirred for 17 h while returned to room temperature. The solvent in the resultant reaction mixture was distilled off and methanol was added, and then the precipitate was filtered. This solid was purified with silica gel column chromatography (toluene:hexane=1:49), and was recrystallized by toluene/methanol to obtain Compound 6 as an orange solid (0.140 g, 0.328 mmol, yield 5%).

$^1$HNMR (400 MHz, $CDCl_3$, δ): 9.10 (s, 2H), 8.53 (d, J=1.6 Hz, 2H), 8.27 (d, J=1.6 Hz, 2H), 8.21 (d, J=1.6 Hz, 2H), 7.64 (d, J=8.8 Hz, 2H), 7.36 (dd, J=8.8, 1.6 Hz, 2H), 7.27 (s, 4H), 3.17 (sept, J=0.8 Hz, 2H), 2.55 (sept, J=6.8 Hz, 4H), 1.55 (d, J=8 Hz, 12H), 1.48 (s, 18H), 1.47 (s, 18H), 1.06 (d, J=6.8 Hz, 12H), 1.01 (d, J=0.8 Hz, 12H).

MS (MALDI): 1058.07 ($M^+$). Calcd for. $C_{76}H_{96}B_2N_2$: 1058.78

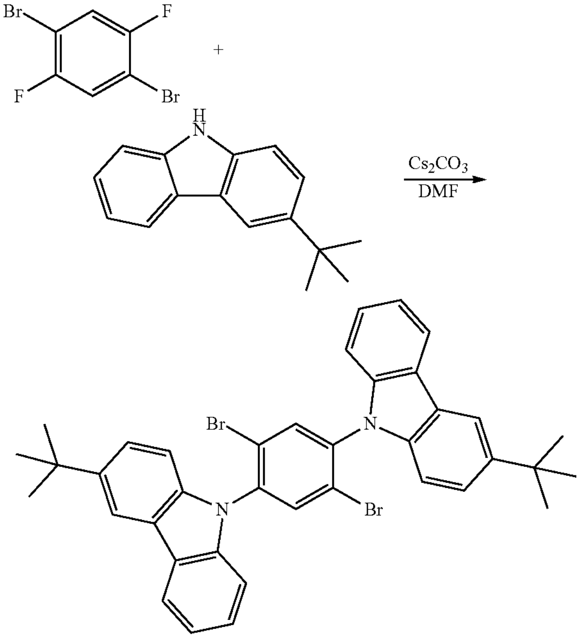

D

Intermediate D

Under a nitrogen stream, a N,N-dimethylformamide solution (50 mL) of 3-tert-butyl-9H-carbazole (1.8 g, 8.06 mmol), potassium carbonate (1.78 g, 12.9 mmol), and 2,5-dibromo-1,4-difluorobenzene (0.876 g, 3.22 mmol) was stirred at 120° C. for 17 h. This mixture was returned to room temperature, and water was added thereto, and then, the precipitated solid was filtered. This was purified with silica gel column chromatography (chloroform:hexane=1:4) to obtain Intermediate D as a white solid (0.44 g, 0.650 mmol, yield 20%).

$^1$HNMR (400 MHz, $CDCl_3$, δ): 8.2-8.18 (m, 4H), 7.97 (s, 2H), 7.56 (d, J=8.4 Hz, 2H), 7.48 (t, J=8.4 Hz, 2H), 7.35 (t, J=8.4 Hz, 2H), 7.25-7.18 (m, 6H), 1.49 (s, 18H)

(Synthesis Example 7) Synthesis of Compounds 7 and 8

MS (ASAP): 679.28 ($M+H^+$). Calcd for. $C_{38}H_{34}Br_2N_2$: 678.11

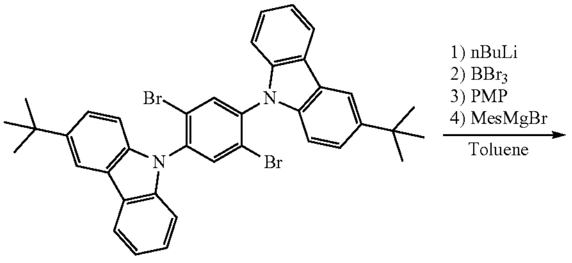

D

-continued

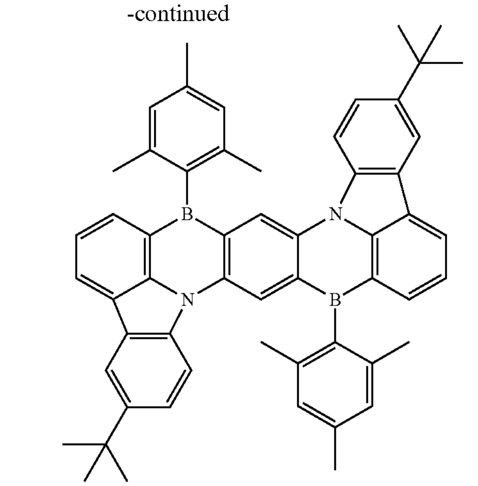

7

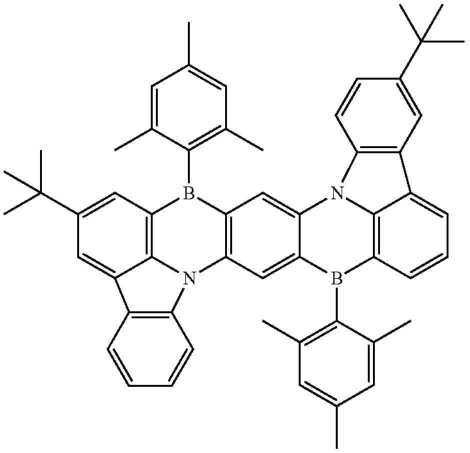

8

Compounds 7 and 8

Under a nitrogen stream, to a toluene solution (100 mL) of the intermediate D (1.90 g, 2.79 mmol), n-BuLi (1.6 mol/L hexane solution, 5.23 mL, 8.37 mmol) was added at −30° C., followed by stirring at 50° C. for 30 min. The reaction mixture was cooled to −30° C., and boron tribromide (3.49 g, 14.0 mmol) was added thereto, followed by stirring at room temperature for 30 min. To the reaction mixture, 1,2,2,6,6-pentamethylpiperidine (2.17 g, 14.0 mmol) was added, followed by stirring at 135° C. for 2 h. To the reaction mixture, 2-mesitylmagnesium bromide (1.0 mol/L tetrahydrofuran solution, 27.9 mL, 27.9 mmol) was added and was stirred for 17 h while returned to room temperature. The solvent in the resultant reaction mixture was distilled off, and methanol was added, and then the precipitate was filtered. This solid was purified with silica gel column chromatography (toluene:hexane=1:9) to obtain Compound 7 (0.243 g, 0.313 mmol, yield 11%) and Compound 8 (0.313 g, 0.403 mmol, yield 14%), as orange solids.

Compound 7

$^1$H NMR (400 MHz: $CDCl_3$, δ): 9.21 (s, 2H), 8.52 (dd, J=9.5, 2.0 Hz: 2H), 8.25 (d, J=2.0 Hz; 2H), 8.20 (dd, J=9.5, 2.0 Hz, 2H), 7.81 (d, J=11.5 Hz, 2H), 7.60 (t, J=9.5 Hz, 2H), 7.44 (dd, J=11.5, 9.0 Hz; 2H), 7.16 (s, 4H), 2.57 (s, 6H), 2.15 (s, 12H), 1.51 (s, 18H)

MS (MALDI): 776.90 ($M^+$). Calcd for. $C_{56}H_{54}B_2N_2$: 776.45

Compound 8

$^1$H NMR (400 MHz, $CDCl_3$, δ): 9.21 (s, 1H), 9.16 (5, 1H), 8.58 (d, J=2.0 Hz, 1H), 8.52 (d, J=7.6 Hz, 1H), 8.3-8.24 (m, 3H), 8.19 (d, J=7.2 Hz, 1H), 7.92-7.85 (m, 1H), 7.82-7.75 (m, 1H), 7.60 (t, J=7.2 Hz, 1H), 7.47-7.39 (m, 3H), 7.19-7.13 (m, 4H), 2.6-2.55 (m, 6H), 2.17-2.14 (m, 12H), 1.51 (s, 18H)

MS (MALDI): 776.98 ($M^+$). Calcd for. $C_{56}H_{54}B_2N_2$: 776.45

(Synthesis Example 8) Synthesis of Compound 9

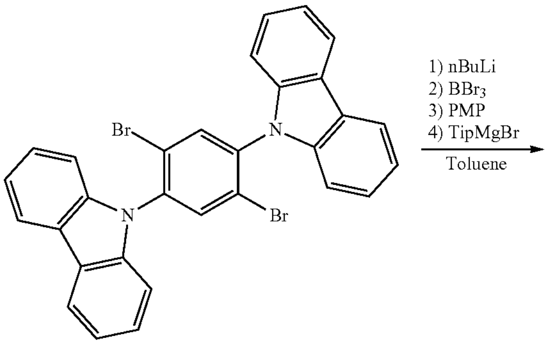

D

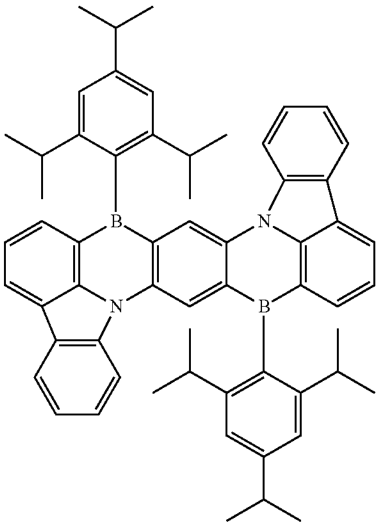

9

Compound 9

Under a nitrogen stream, to a toluene solution (100 mL) of the intermediate A (1.00 g, 1.77 mmol), n-BuLi (1.6 mol/L hexane solution, 3.3 mL, 5.30 mmol) was added at −30° C., followed by stirring at room temperature for 30 min. The reaction mixture was cooled to −30° C., and boron tribromide (2.21 g, 8.83 mmol) was added thereto, followed by stirring at room temperature for 30 min. To the reaction mixture, 1,2,2,6,6-pentamethylpiperidine (1.37 g, 8.83 mmol) was added, followed by stirring at 120° C. for 15 h. The reaction mixture was returned to room temperature, and 2,4,6-triisopropylmagnesium bromide-lithium chloride complex (1.0 mol/L tetrahydrofuran solution, 17.7 mL, 17.7 mmol) was added thereto, followed by stirring at 120° C. for 4 h. The resultant reaction mixture was filtered, and the solvent in the filtrate was distilled off. This residue was purified with silica gel column chromatography (toluene: hexane=15:85) to obtain Compound 9 as an orange solid (0.128 g, 0.154 mmol, yield 9%).

$^1$H NMR (400 MHz, $CDCl_3$, δ): 9.31 (s, 2H), 8.49 (d, J=7.2 Hz, 2H), 8.28 (d, 0.1=7.2 Hz, 2H), 8.25 (d, J=7.6 Hz, 2H), 7.85 (d, 0.1=8.4 Hz, 2H), 7.61 (t, 0.1=7.6 Hz, 2H), 7.41 (t, J=7.6 Hz, 2H), 7.38-7.33 (m, 2H), 7.28 (s, 4H), 3.16 (sept, J=6.8 Hz, 2H), 2.57 (sept, J=6.8 Hz, 4H), 1.52 (d, J=7.2 Hz, 12H), 1.09 (d, J=6.8 Hz, 12H), 1.04 (d, J=6.8 Hz, 12H)

MS (MALDI): 832.73 (MO. Calcd for. $C_{60}H_{62}B_2N_2$: 832.51

(Synthesis Example 9) Synthesis of Compound 10

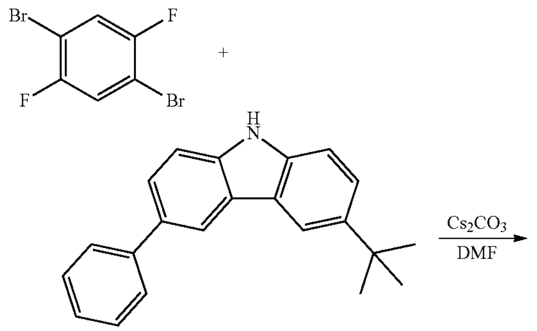

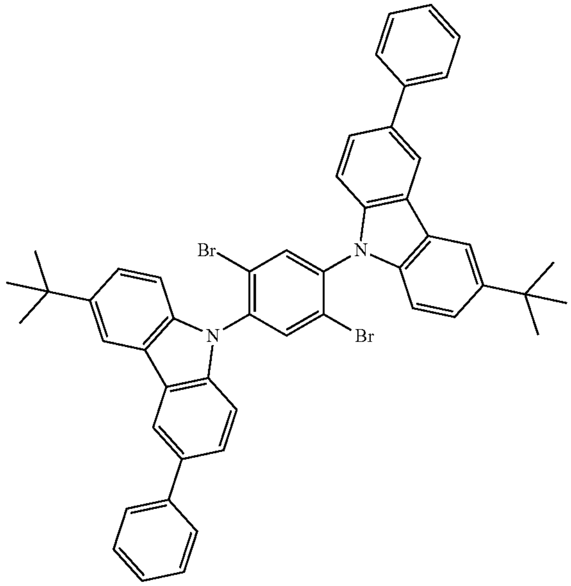

E

Intermediate E

Under a nitrogen stream, a N,N-dimethylformamide solution (50 mL) of 3-tert-butyl-6-phenyl-9H-carbazole (2.70 g, 9.02 mmol), cesium carbonate (5.34 g, 16.4 mmol), and 2,5-dibromo-1,4-difluorobenzene (1.11 g, 4.10 mmol) was stirred at 120° C. for 15 h. This mixture was returned to room temperature, and water was added thereto, and then, the precipitated solid was filtered. This was recrystallized by toluene to obtain Intermediate E as a white solid (3.06 g, 3.68 mmol, yield 90%).

$^1$HNMR (400 MHz, $CDCl_3$, δ): 8.40 (d, J=2.0 Hz, 2H), 8.23 (d, J=1.6 Hz, 2H), 8.02 (s, 2H), 7.79-7.76 (m, 4H), 7.73 (dd, J=8.8, 1.6 Hz, 2H), 7.59 (dd, 0.1=8.4, 1.6 Hz, 2H), 7.53-7.48 (m, 4H), 7.41-7.35 (m, 2H), 7.31 (d, J=7.6 Hz, 2H), 7.23 (d, J=8.8 Hz, 2H), 1.50 (s, 18H)

MS (ASAP): 831.43 ($M+H^+$). Calcd for. $C_{50}H_{42}Br_2N_2$: 830.17

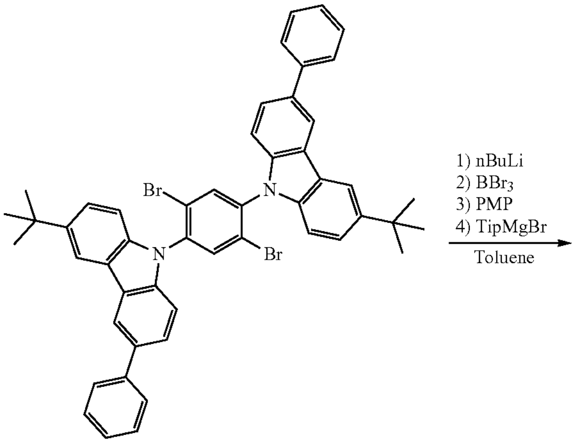

E

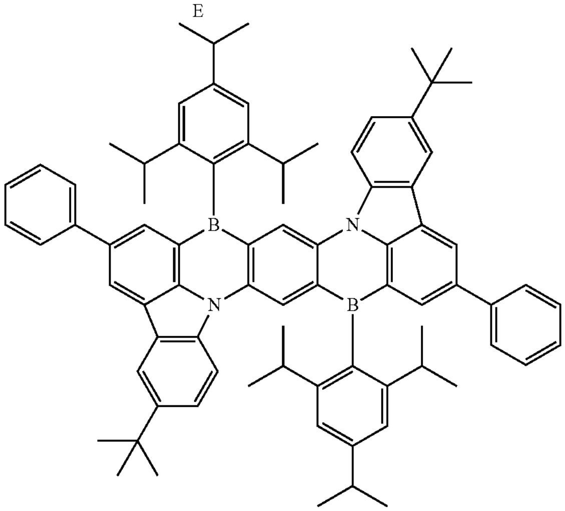

10

Compound 10

Under a nitrogen stream, to a toluene solution (100 mL) of the intermediate E (1.00 g, 1.21 mmol), n-BuLi (1.6 mol/L hexane solution, 2.27 mL, 3.63 mmol) was added at −30° C., followed by stirring at 50° C. for 30 min. The reaction mixture was cooled to 30° C., and boron tribromide (1.52 g, 6.05 mmol) was added thereto, followed by stirring at room temperature for 30 min. To the reaction mixture, 1,2,2,6,6-pentamethylpiperidine (0.939 g, 6.05 mmol) was added, followed by stirring at 135° C. for 2 h. To the reaction mixture, 2,4,6-triisopropylmagnesium bromide-lithium chloride complex (1.0 mol/L tetrahydrofuran solution, 12.1 mL, 12.1 mmol) was added and was stirred for 17 h while returned to room temperature. The solvent in the resultant reaction mixture was distilled off, and methanol was added, and then the precipitate was filtered. This solid was purified with silica gel column chromatography (toluene:hexane=1:9) and was recrystallized by toluene/methanol to obtain Compound 10 as an orange solid (0.364 g, 0.332 mmol, yield 27%).

$^1$H NMR (400 MHz, $CDCl_3$, δ): 9.24-9.19 (m, 2H), 8.62-8.60 (m, 2H), 8.50-8.47 (m, 2H), 8.35-8.32 (m, 2H), 7.85-7.69 (m, 6H), 7.64-7.60 (m, 2H), 7.56-7.46 (m, 4H), 7.45-7.35 (m, 2H), 7.31 (s, 4H), 3.23-3.16 (m, 2H), 2.65-2.56 (m, 4H), 1.60-1.55 (m, 18H), 1.51-1.48 (m, 12H), 1.14-1.02 (m, 24H)

MS (MALDI): 1098.09 (M+H$^+$). Calcd for. $C_{80}H_{86}B_2N_2$: 1096.70

(Synthesis Example 10) Synthesis of Compound 11

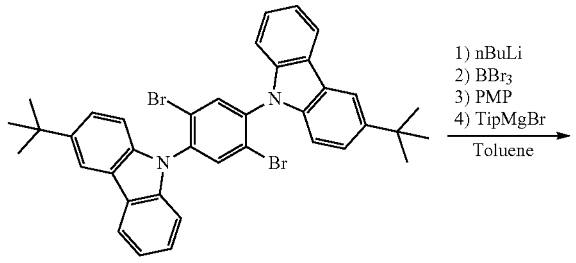

D

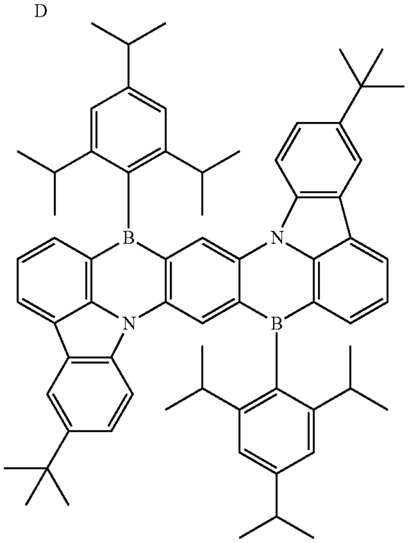

11

Compound 11

Under a nitrogen stream, to a toluene solution (100 mL) of Compound D (2.00 g, 2.12 mmol), n-BuLi (1.6 mol/L hexane solution, 4.0 mL, 6.35 mmol) was added at 0° C., followed by stirring at 50° C. for 30 min. The reaction mixture was cooled to 0° C., and boron tribromide (2.65 g, 10.6 mmol) was added thereto, followed by stirring at room temperature for 30 min. To the reaction mixture, 1,2,2,6,6-pentamethylpiperidine (1.64 g, 10.6 mmol) was added, followed by stirring at 135° C. for 2 h. To the reaction mixture, 2,4,6-triisopropylphenylmagnesium bromide-lithium chloride complex (1.0 mol/L tetrahydrofuran solution, 12.7 mL, 12.7 mmol) was added and was stirred for 17 h while returned to room temperature. The solvent in the resultant reaction mixture was distilled off and methanol was added, and then the precipitate was filtered. This solid was purified with silica gel column chromatography (chloroform:hexane=5:95) to obtain Compound 11 as an orange solid (0.250 g, 0.265 mmol, yield 13%).

MS(ASAP): 944.91(M$^+$). Calcd for. $C_{68}H_{78}B_2N_2$: 944.64

(Synthesis Example 11) Synthesis of Compound 12

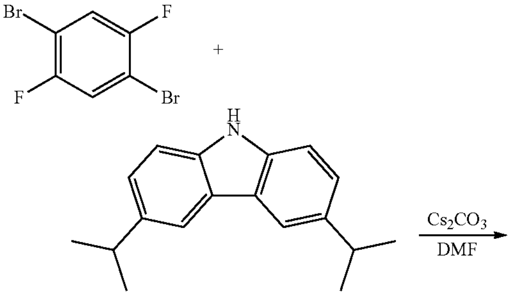

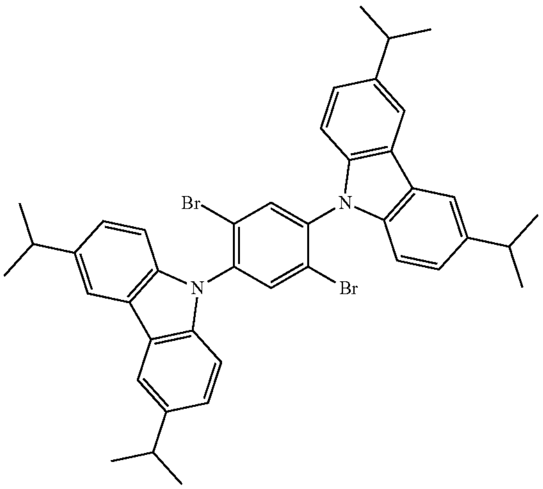

F

Compound F

Under a nitrogen stream, a N,N-dimethylformamide solution (100 mL) of 3,6-diisopropyl-9H-carbazole (10.0 g, 39.8 mmol), cesium carbonate (23.6 g, 72.3 mmol) and 2,5-dibromo-1,4-difluorobenzene (4.92 g, 18.1 mmol) was stirred at 150° C. for 17 h. This mixture was returned to room temperature, and water was added thereto, and then, the precipitated solid was filtered. This was purified with silica gel column chromatography (toluene:hexane=3:7) and the resultant solid was recrystallized by toluene/methanol to obtain Compound F as a white solid (5.60 g, 7.62 mmol, yield 42%).

$^1$HNMR (400 MHz, $CDCl_3$, δ): 8.01 (d, J=1.2 Hz, 4H), 7.93 (s, 2H), 7.35 (dd, J=8.4 Hz, 1.2 Hz, 4H), 7.15 (d, J=8.4 Hz, 4H), 3.20-3.10 (m, 4H), 1.42-1.39 (m, 24H)

MS (ASAP): 735.10 (M+H$^+$). Calcd for. $C_{42}H_{42}Br_2N_2$: 734.17

-continued

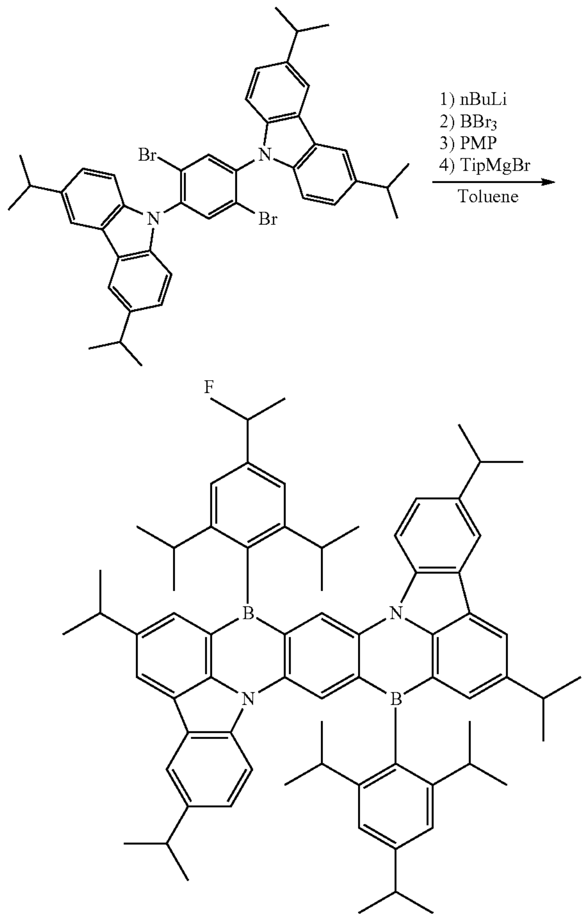

12

Compound 12

Under a nitrogen stream, to a toluene solution (150 mL) of the Compound F (3.00 g, 4.08 mmol), n-BuLi (1.6 mol/L hexane solution, 7.7 mL, 12.2 mmol) was added at 0° C., followed by stirring at 75° C. for 1 h. The reaction mixture was cooled to 0° C., and boron tribromide (5.11 g, 20.4 mmol) was added thereto, followed by stirring at room temperature for 30 min. To the reaction mixture, 1,2,2,6,6-pentamethylpiperidine (3.17 g, 20.4 mmol) was added, followed by stirring at 135° C. for 3 h. To the reaction mixture, 2,4,6-triisopropylphenylmagnesium bromide-lithium chloride complex (1.0 mol/L tetrahydrofuran solution, 40.8 mL, 40.8 mmol) was added and was stirred for 17 h while returned to room temperature. The solvent in the resultant reaction mixture was distilled off. This residue was purified with silica gel column chromatography (toluene: hexane=5:95) and was recrystallized by toluene/methanol to obtain Compound 12 as an orange solid (0.106 g, 0.106 mmol, yield 3%).

MS (ASAP): 1000.81 ($M^+$). Calcd for. $C_{72}H_{86}B_2N_2$: 1000.70

(Synthesis Example 12) Synthesis of Compound 13

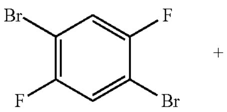

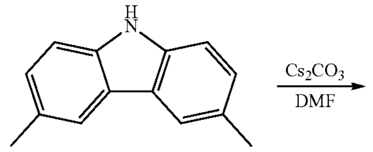

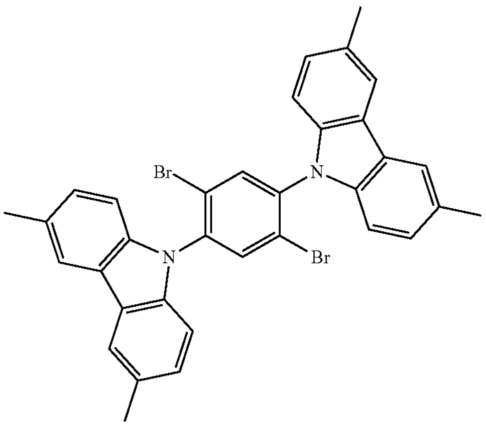

G

Compound G under a nitrogen stream, a N,N-dimethylformamide solution (50 mL) of 3,6-dimethyl-9H-carbazole (5.00 g, 25.6 mmol), cesium carbonate (15.2 g, 46.6 mmol) and 2,5-dibromo-1,4-difluorobenzene (3.16 g, 11.6 mmol) was stirred at 150° C. for 17 h. This mixture was returned to room temperature, and water was added thereto, and then, the precipitated solid was filtered. This was purified with silica gel column chromatography (toluene:hexane=3:7), and the resultant solid was recrystallized by o-dichlorobenzene/methanol to obtain Compound G as a white solid (5.48 g, 8.80 mmol, yield 76%).

$^1$HNMR (400 MHz, $CDCl_3$, δ): 7.95 (s, 2H), 7.93 (d, J=1.2 Hz, 4H), 7.29 (dd, J=8.4 Hz, 1.2 Hz, 4H), 7.12 (d, J=8.4 Hz, 4H), 2.72 (s, 12H)

MS (ASAP): 623.04 ($M+H^+$). Calcd for. $C_{34}H_{26}Br_2N_2$: 622.04

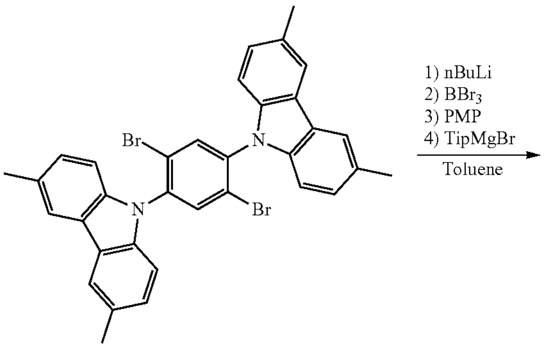

G

-continued

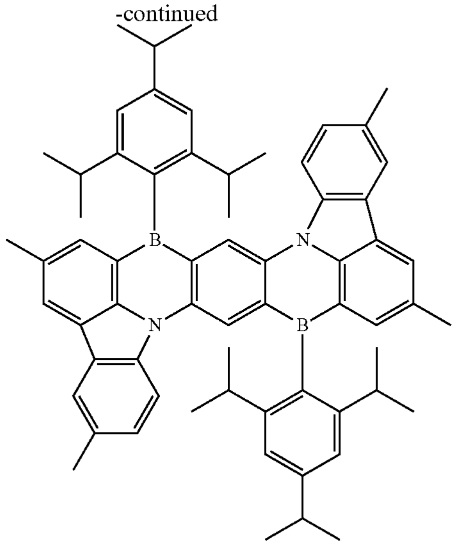

13

Compound 13

Under a nitrogen stream, to a toluene solution (200 mL) of the Compound G (2.00 g, 3.21 mmol), n-BuLi (1.6 mol/L hexane solution, 6.0 mL, 9.64 mmol) was added at 0° C., followed by stirring at 50° C. for 1 h. The reaction mixture was cooled to 0° C., and boron tribromide (4.02 g, 16.1 mmol) was added thereto, followed by stirring at room temperature for 1 h. To the reaction mixture, 1,2,2,6,6-pentamethylpiperidine (2.50 g, 16.1 mmol) was added, followed by stirring at 135° C. for 3 h. To the reaction mixture, 2,4,6-triisopropylphenylmagnesium bromide-lithium chloride complex (1.0 mol/L tetrahydrofuran solution, 32.1 mL, 32.1 mmol) was added and was stirred for 17 h while returned to room temperature. The solvent in the resultant reaction mixture was distilled off. This residue was purified with silica gel column chromatography (toluene: hexane=5:95), and was recrystallized by toluene/methanol to obtain Compound 13 as an orange solid (0.270 g, 0.304 mmol, yield 9%).

MS (ASAP): 888.59 ($M^+$). Calcd for. $C_{64}H_{70}B_2N_2$: 888.57

(Synthesis Example 13) Synthesis of Compound 14

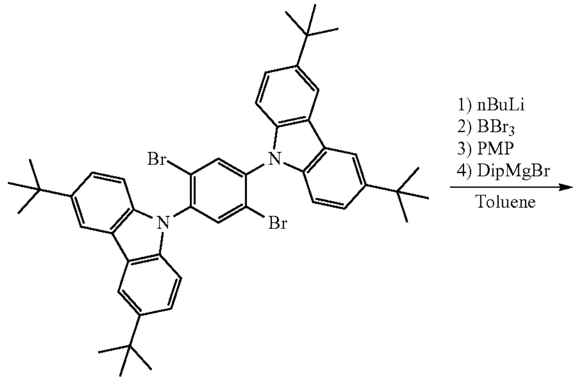

A

-continued

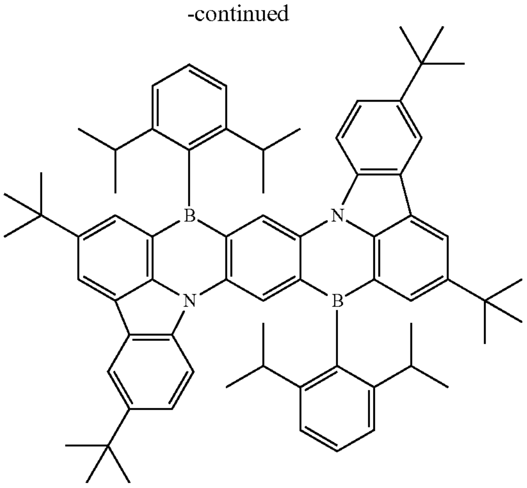

14

Compound 14

Under a nitrogen stream, n-BuLi (1.6 mol/L hexane solution, 5.4 mL, 8.58 mmol) was added to a toluene solution (100 mL) of Compound A (2.26 g, 2.86 mmol) at 0° C., followed by stirring at 50° C. for 1 h. The reaction mixture was cooled to 0° C., and boron tribromide (3.58 g, 14.3 mmol) was added thereto, followed by stirring at room temperature for 1 h. To the reaction mixture, 1,2,2,6,6-pentamethylpiperidine (2.22 g, 14.3 mmol) was added, followed by stirring at 135° C. for 3 h. To the reaction mixture, 2,6-diisopropylphenylmagnesium bromide-lithium chloride complex (1.0 mol/L tetrahydrofuran solution, 28.6 mL, 28.6 mmol) was added and was stirred for 17 h while returned to room temperature. The solvent in the resultant reaction mixture was distilled off. This residue was purified with silica gel column chromatography (toluene:hexane=5:95), and was recrystallized by toluene/methanol to obtain Compound 14 as an orange solid (0.198 g, 0.203 mmol, yield 7%).

MS (ASAP): 972.64 ($M^+$). Calcd for. $C_{70}H_{82}B_2N_2$: 972.67

(Synthesis Example 14) Synthesis of Compound 15

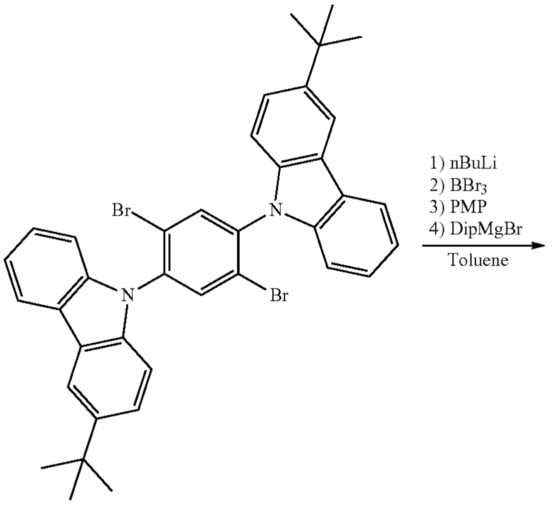

D

-continued

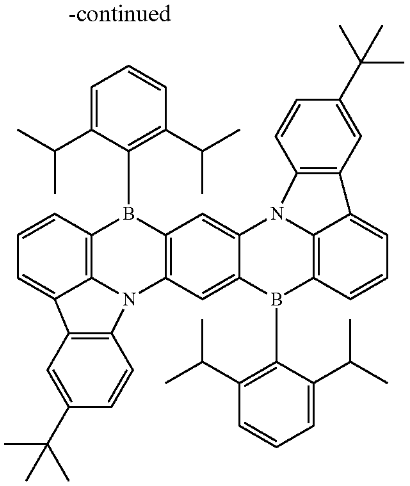

15

Compound 15

Under a nitrogen stream, to a toluene solution (70 mL) of Compound D (1.40 g, 1.77 mmol), n-BuLi (1.6 mol/L hexane solution, 3.3 mL, 5.31 mmol) was added at 0° C., followed by stirring at 50° C. for 30 min. The reaction mixture was cooled to 0° C., and boron tribromide (2.21 g, 8.85 mmol) was added thereto, followed by stirring at room temperature for 30 min. To the reaction mixture, 1,2,2,6,6-pentamethylpiperidine (1.37 g, 8.85 mmol) was added, followed by stirring at 135° C. for 3 h. To the reaction mixture, 2,6-diisopropylphenylmagnesium bromide-lithium chloride complex (1.0 mol/L tetrahydrofuran solution, 17.7 mL, 17.7 mmol) was added and was stirred for 17 h while returned to room temperature. The solvent in the resultant reaction mixture was distilled off. This residue was purified with silica gel column chromatography (toluene:hexane=5:95), and was recrystallized by toluene/methanol to obtain Compound 15 as an orange solid (0.100 g, 0.116 mmol, yield 7%).

MS (ASAP): 861.82 (M+H$^+$). Calcd for. $C_{62}H_{66}B_2N_2$: 860.54

(Synthesis Example 15) Synthesis of Compound 16

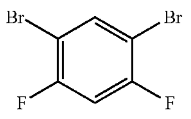

+

-continued

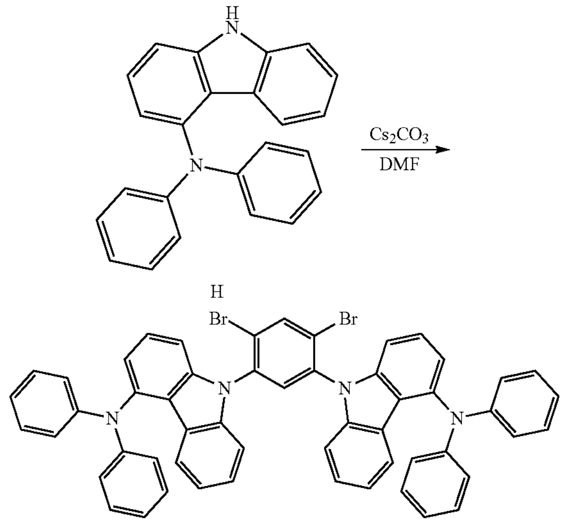

I

Compound I

Under a nitrogen atmosphere, a N,N-dimethylformamide solution (30 mL) of 1,5-dibromo-2,4-difluorobenzene (2.00 g, 5.98 mmol), Compound H (0.74 g, 2.72 mmol), and cesium carbonate (3.54 g, 10.87 mmol) was stirred at 140 T for 17 h. After cooling to room temperature, water (120 mL) was added thereto, and then, the precipitate was filtered and washed with methanol. The resultant solid was purified with silica gel column chromatography (toluene:hexane=2:3) to obtain Compound 1 (1.648 g, 1.83 mmol, 67%).

$^1$H-NMR (400 MHz, $CDCl_3$, δ): 8.42 (s, 1H), 7.73 (d, J=7.8 Hz, 2H), 7.71 (d, J=3.2 Hz, 1H), 7.41 (q, J=8.1 Hz, 2H), 7.35 (q, J=7.9 Hz, 2H), 7.24-7.15 (m, 12H), 7.11 (d, J=7.3 Hz, 10H), 7.08-7.00 (m, 7H), 6.94 (t, J=7.1 Hz, 5H).

MS (ASAP): 901.20 (M+H$^+$). Calcd for. $C_{54}H_{36}Br_2N_4$: 900.13.

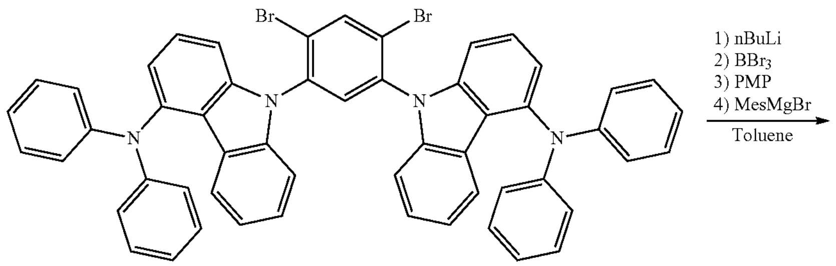

I

-continued

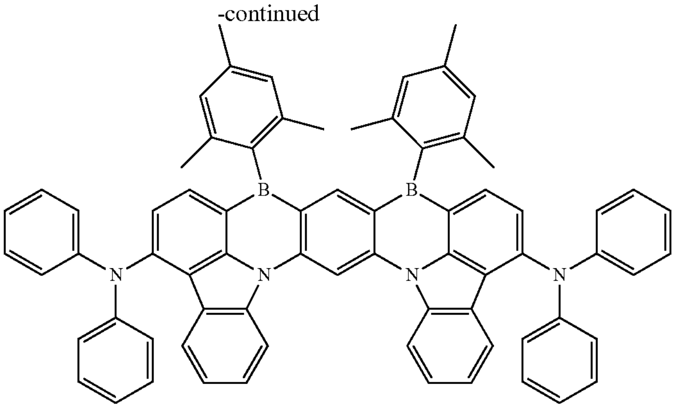

16

Compound 16

Under a nitrogen atmosphere, to a toluene solution (40 mL) of Compound 1(0.80 g, 0.89 mmol), n-BuLi (1.6 mol/L hexane solution, 1.63 mL, 2.67 mmol) was added at 0° C., followed by stirring at 50° C. for 30 min. The reaction mixture was cooled to 0° C., and boron tribromide (1.13 g, 4.44 mmol) was added thereto, followed by stirring at room temperature for 30 min. To the reaction mixture, 1,2,2,6,6-pentamethylpiperidine (0.670 g, 4.44 mmol) was added, followed by stirring at 120° C. for 2 h. 2-mesitylmagnesium bromide (1.0 mol/L tetrahydrofuran solution, 6.0 mL, 6.00 mmol) was added thereto, and this was cooled overnight. The reaction solution was filtered through a silica gel pad, and the filtrate was concentrated. The obtained residue was purified with silica gel column chromatography (chloroform:hexane=1:4) to obtain Compound 16 (150 mg, 0.150 mmol, 17%).

$^1$H-NMR (400 MHz, $CDCl_3$, δ): 9.85 (s, 1H), 8.74 (d, J=8.6 Hz, 2H), 8.36 (d, J=3.4 Hz, 1H), 7.97 (d, J=7.9 Hz, 2H), 7.80 (d, J=7.6 Hz, 2H), 7.59 (t, J=7.3 Hz, 1H), 7.42-7.40 (m, 2H), 7.23-7.15 (m, 15H), 7.05-6.94 (m, 8H), 6.80 (s, 4H), 2.36 (s, 6H), 1.97 (s, 12H).

MS (ASAP): 999.52 ($M+H^{-1}$). Calcd for. $C_{72}H_{56}B_2N_4$: 998.47.

A toluene solution of the synthesized compound 16 was prepared, and the molar coefficient extinction was measured, and then the result showed a high value of 122000 at 422 nm. This molar coefficient extinction was significantly higher than that of the compound of the formula (1) in which $R^3$ was substituted. Further, the photoluminescence quantum yield was measured by using a toluene solution, and as a result, a high value of 94% was obtained.

(Synthesis Example 16) Synthesis of Compound 17

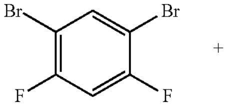

-continued

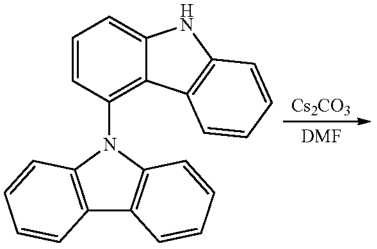

J

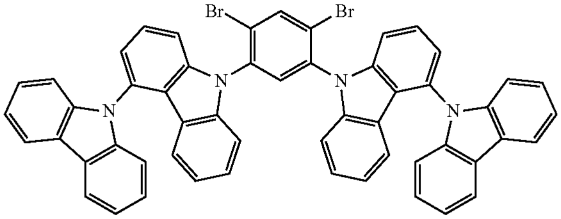

K

Compound J 1,5-dibromo-2,4-difluorobenzene (1.30 g, 3.91 mmol), Compound J (0.53 g, 1.96 mmol), and cesium carbonate (1.91 g, 5.88 mmol) were dissolved in N-methyl-2-pyrolidone (39 mL), followed by stirring at 140° C. for 16 h. Water (120 mL) was added to the reaction mixture, and the precipitate was filtered, and washed with methanol. The resultant solid was purified with silica gel chromatography (toluene:hexane=1:2) to obtain Compound K (0.47 g, 0.53 mmol, 27%).

$^1$H-NMR (400 MHz, $CDCl_3$, δ): 8.27-8.24 (m, 4H), 7.84 (d. J=0.9 Hz, 1H), 7.67 (t, J=8.0 Hz, 1H), 7.62 (d, J=7.8 Hz, 1H), 7.45-7.28 (m, 15H), 7.24-7.16 (m, 4H), 7.08 (td, J=4.7, 2.0 Hz, 2H), 6.86 (d, J=7.8 Hz, 1H), 6.82 (d, J=8.2 Hz, 1H), 6.56 (dd, J=8.2, 3.2 Hz, 2H).

MS (ASAP): 895.20 ($M+H^+$). Calcd for. $C_{54}H_{32}Br_2N_4$: 894.10.

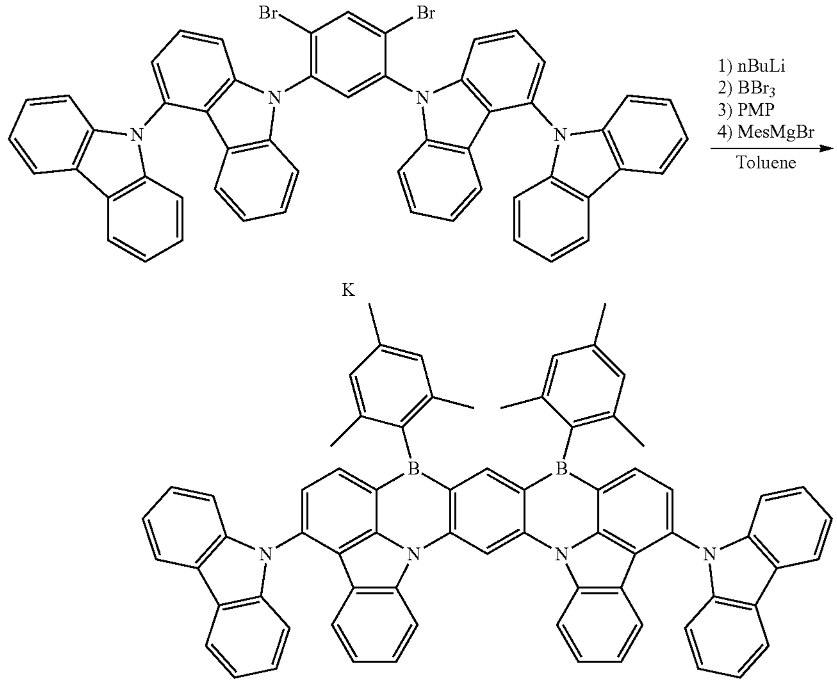

K

17

Compound 17

Under a nitrogen atmosphere, to a toluene solution (24 mL) of the Compound K (0.47 g, 0.52 mmol), n-BuLi (1.6 mol/L hexane solution, 0.98 mL, 1.57 mmol) was added at 0° C., followed by stirring at 50° C. for 30 min. The reaction mixture was cooled to 0° C., and boron tribromide (0.656 g, 2.62 mmol) was added thereto, followed by stirring at room temperature for 30 min. To the reaction mixture, 1,2,2,6,6-pentamethylpiperidine (0.407 g, 2.62 mmol) was added, followed by stirring at 120° C. for 2 h. 2-mesitylmagnesium bromide (1.0 mol/L tetrahydrofuran solution, 3.14 mL, 3.14 mmol) was added thereto, and this was cooled overnight. The reaction solution was filtered through a silica gel pad, and the filtrate was concentrated. The obtained residue was purified with silica gel column chromatography (toluene: hexane=1:9) to obtain Compound 17 (68.4 mg, 0.069 mmol, 13%).

$^1$H-NMR (400 MHz, $CDCl_3$, δ): 9.96 (5, 1H), 8.82 (d, J=8.4 Hz, 2H), 8.58 (5, 1H), 8.30-8.25 (m, 8H), 7.72-7.68 On, 2H), 7.64 (t, J=7.9 Hz, 2H), 7.41-7.35 (m, 6H), 7.29 (t, J=3.8 Hz, 4H), 7.13-7.08 (m, 2H), 6.91 (d, J=7.5 Hz, 2H), 6.88 (s, 4H), 2.41 (5, 6H), 2.06 (s, 12H).

MS (ASAP): 994.51 (M'). Calcd for. $C_{72}H_{52}B_2N_4$: 994.45.

The compounds synthesized in Synthesis Examples were used for following purposes after sublimation purification.

EXAMPLES

(Example 1) Manufacturing of Thin Film and Luminescence Evaluation

Compound 2 and mCBP were vapor-deposited on a quartz substrate by a vacuum vapor deposition method under a condition of a vacuum degree of less than $1\times10^{-3}$ Pa from different vapor deposition sources to form a thin film having a thickness of 100 nm in which the concentration of the Compound 2 was 0.5% by weight.

Instead of Compound 2, each of Standard Compound 1, and Compounds 7, 8, 9, and 11 was used in the same manner to obtain each thin film.

Each of the manufactured thin films was irradiated with excitation light of 300 nm, and as a result, light emission was recognized from all thin films. The results of measurement on the photoluminescence quantum yield (PLQY) of each thin film are noted in the following table. All the thin films using the compound represented by the formula (1) exhibited higher PLQY than the thin film using the standard compound 1.

TABLE 2

| Dopant type | Light emitting wavelength (mm) | PLQY (%) |
|---|---|---|
| Standard compound 1 | 520 | 84.9 |
| Compound 2 | 542 | 87.1 |
| Compound 7 | 527 | 89.9 |
| Compound 8 | 533 | 92.1 |
| Compound 9 | 511 | 89.1 |
| Compound 11 | 520 | 92.0 |

(Example 2) Manufacturing of Thin Film and Orientation Evaluation

Host 1, Delayed fluorescence material 1, and Compound 6 were vapor-deposited on a quartz substrate by a vacuum vapor deposition method under a condition of a vacuum degree of less than $1\times10^{-3}$ Pa from different vapor deposition sources to form a thin film having a thickness of 100 nm in which the concentration of the Host 1 was 64.5% by weight, the concentration of the delayed fluorescence material 1 was 35.0% by weight, and the concentration of the compound 6 was 0.5% by weight. Instead of Compound 6, each of Compounds 2, 3, 7, 8, 10, and 11 was used in the same manner to obtain each thin film.

Apart from this, Host 1, Delayed fluorescence material 2, and Compound 6 were vapor-deposited on a quartz substrate by a vacuum vapor deposition method under a condition of a vacuum degree of less than $1\times10^{-3}$ Pa from different vapor deposition sources to form a thin film having a thickness of 100 nm in which the concentration of the Host 1 was 64.5% by weight, the concentration of the delayed fluorescence material 2 was 35.0% by weight, and the concentration of the compound 6 was 0.5% by weight. Instead of Compound 6, the standard compound 1 was used in the same manner to obtain a thin film.

Further, apart from this, Host 1, Delayed fluorescence material 2, and Compound 6 were vapor-deposited on a quartz substrate by a vacuum vapor deposition method under a condition of a vacuum degree of less than $1\times10^{-3}$ Pa from different vapor deposition sources to form a thin film having a thickness of 100 nm, in which the concentration of the Host 1 was 54.5% by weight, the concentration of the delayed fluorescence material 2 was 45.0% by weight, and the concentration of the compound 6 was 0.5% by weight. Instead of Compound 6, each of Standard compound 1, and Compounds 7, 8, and 10 was used in the same manner to obtain each thin film.

Further, apart from this, Host 1, Delayed fluorescence material 3, and Compound 6 were vapor-deposited on a quartz substrate by a vacuum vapor deposition method under a condition of a vacuum degree of less than $1\times10^{-3}$ Pa from different vapor deposition sources to form a thin film having a thickness of 100 nm in which the concentration of the Host 1 was 54.2% by weight, the concentration of the delayed fluorescence material 3 was 45.0% by weight, and the concentration of the compound 6 was 0.8% by weight. Instead of Compound 6, each of Standard compound 1, and Compounds 3 and 11 was used in the same manner to obtain each thin film.

Regarding each manufactured thin film, results of measurement on the orientation value (S value) of the compound represented by the formula (1) are noted in the following table. The case where the compounds 2, 3, 6, 7, 8, 10, and 11 were used showed particularly better orientation than the case where the standard compound 1 was used.

TABLE 3

| | S value | | | |
|---|---|---|---|---|
| Dopant type | Host 1 (64.5%) Delayed fluorescence material 1 (35.0%) Dopant (0.5%) | Host 1 (64.5%) Delayed fluorescence material 2 (35.0%) Dopant (0.5%) | Host 1 (54.5%) Delayed fluorescence material 2 (45.0%) Dopant (0.5%) | Host 1 (64.2%) Delayed fluorescence material 3 (45.0%) Dopant (0.8%) |
| Standard Compound 1 | — | Exceeding −0.20 | Exceeding −0.20 | Exceeding −0.20 |
| Compound 2 | −0.31 | — | — | — |
| Compound 3 | −0.38 | — | — | −0.29 |
| Compound 6 | −0.39 | −0.42 | −0.42 | −0.42 |
| Compound 7 | −0.34 | — | −0.34 | — |
| Compound 8 | −0.28 | — | −0.30 | — |
| Compound 10 | −0.39 | — | −0.41 | — |
| Compound 11 | −0.43 | — | — | −0.37 |

(Example 3) Manufacturing and Evaluation of Organic Electroluminescence Device

On a glass substrate on which an anode made of indium Ain oxide (ITO) was formed with a film thickness of 100 nm, each thin film was laminated through a vacuum vapor deposition method at a vacuum degree of $1\times10^{-5}$ Pa. First, HATCN was formed with a thickness of 10 nm on ITO, and NPD was formed thereon, with a thickness of 30 nm, and further EBL 1 was formed with a thickness of 10 nm. Next, Host 1. Delayed fluorescence material 3, and Compound 2 were co-deposited from different vapor deposition sources to form a light emitting layer with a thickness of 40 nm. The contents of the Host 1, the Delayed fluorescence material 3, and the Compound 2 were 54.2% by weight, 45.0% by weight, and 0.8% by weight in this order. Next, SF3-TRZ was formed with a thickness of 10 nm, and then, Liq and SF3-TRZ were co-deposited from different vapor deposition sources to form a layer with a thickness of 30 nm. The contents of Liq and SF3-TRZ in this layer were 30% by weight and 70% by weight, respectively. Further, Liq was formed with a thickness of 2 nm, and then aluminum (Al) was vapor-deposited with a thickness of 100 nm to form a cathode. Then, an organic electroluminescence device was obtained.

Instead of Compound 2, each of Standard compound 1, and Compounds 6, 11, 13, and 15 was used in the same manner to manufacture each organic electroluminescence device. Further, an organic electroluminescence device of Comparative Example 1 was manufactured in the same manner, except that a light emitting layer made of the Host 1 (55% by weight) and the delayed fluorescence material 3 (45% by weight) was formed without using the compound 2.

As a result of electrification to each organic electroluminescence device, light emission was observed from all devices. In the device using the compound represented by the formula (1), the amount of light emitted from the compound represented by the formula (1) among materials included in the light emitting layer was the largest. The external quantum efficiency (EQE) of each organic electroluminescence device at 6.3 $mA/cm^2$ was measured. The results are noted in the following table, which are relative values when the EQE of the organic electroluminescence device of Comparative Example 1 was set as 1. All the organic electroluminescence devices using the compound of the formula (1) exhibited higher EQE than the organic electroluminescence device using the standard compound 1. Further, the organic electroluminescence device using the compound of the formula (1) also had good durability.

TABLE 4

| Dopant type | EQE (Relative value) |
|---|---|
| None (Comparative Example 1) | 1 |
| Standard compound 1 | 1.00 |
| Compound 3 | 1.33 |
| Compound 6 | 1.22 |
| Compound 11 | 1.28 |
| Compound 13 | 1.30 |
| Compound 15 | 1.18 |

(Example 4) Manufacturing and Evaluation of Organic Electroluminescence Device in which Delayed Fluorescence Material was Changed Delayed fluorescence material 3 in the light emitting layer in Example 3 was changed to Delayed fluorescence material 1, and in the composition of the light emitting layer, the contents of the Host 1, the delayed fluorescence material 1, and the compound 2 were 64.5% by weight, 45.0% by weight, and 0.5% by weight in this order. Except for these, in the same procedure as in Example 3, an organic electroluminescence device was manufactured.

Instead of Compound 2, each of Compounds 5, 6, and 7 was used in the same manner to manufacture each organic electroluminescence device. Further, an organic electroluminescence device of Comparative Example 2 was manufactured in the same manner, except that a light emitting layer made of the Host 1 (65% by weight) and the delayed fluorescence material 3 (35% by weight) was formed without using the compound 2.

As a result of electrification to each organic electroluminescence device, light emission was observed from all devices. In the device using the compound represented by the formula (1), the amount of light emitted from the compound represented by the formula (1) among materials included in the light emitting layer was the largest. The external quantum efficiency (EQE) of each organic electroluminescence device at 6.3 mA/$cm^2$ was measured. The results are noted in the following table, which are relative values when the EQE of the organic electroluminescence device of Comparative Example 2 was set as 1. All the organic electroluminescence devices using the compound of the formula (1) showed high EQE even in the case of a change into the delayed fluorescence material 1. Further, the organic electroluminescence device using the compound of the formula (1) also had good durability.

TABLE 5

| Dopant type | EQE (Relative value) |
|---|---|
| None (Comparative Example 2) | 1 |
| Compound 2 | 1.09 |
| Compound 5 | 1.12 |
| Compound 6 | 1.10 |
| Compound 7 | 1.01 |

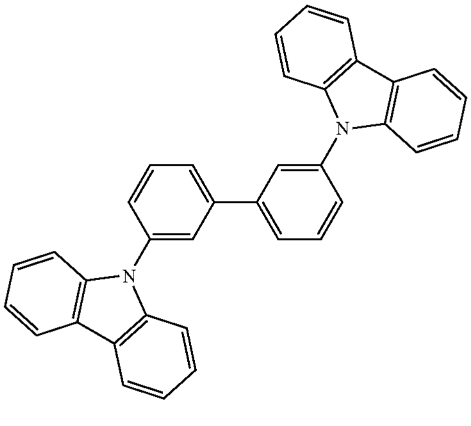

mCBP

-continued

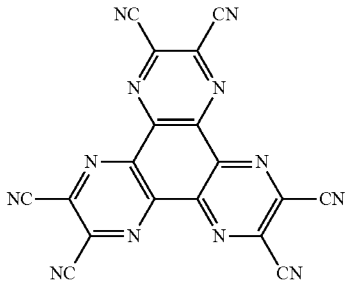

HATCN

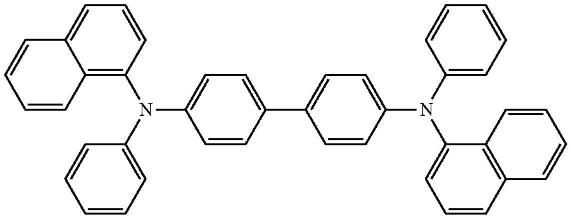

NPD

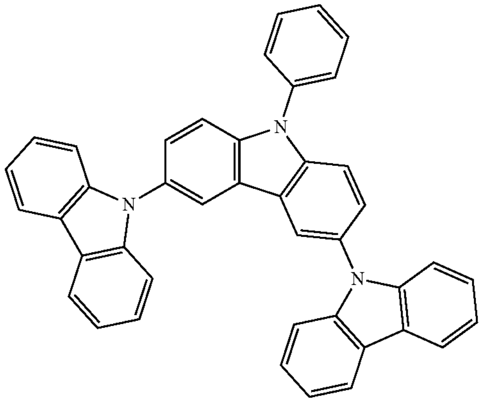

EBL1

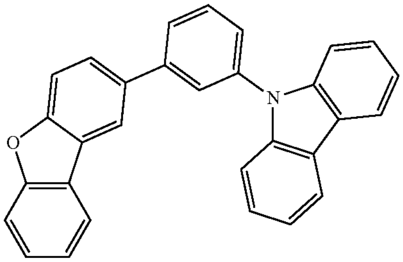

Host1

-continued

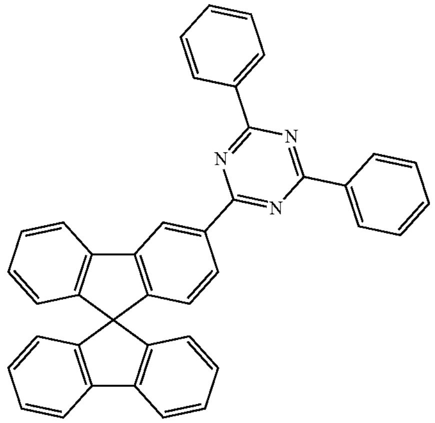

SF3TRZ

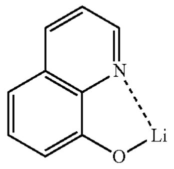

Liq

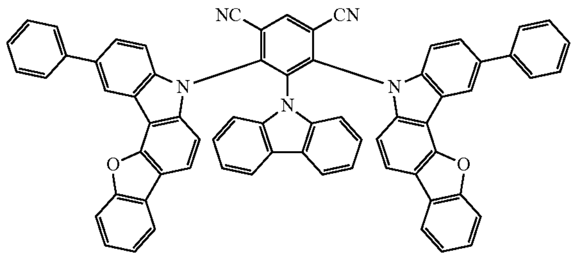

Delayed fluorescence material 1

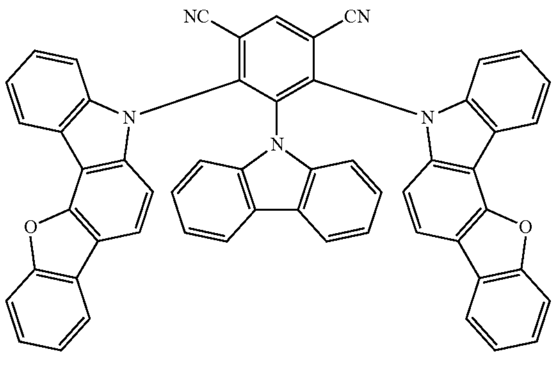

Delayed fluorescence material 2

-continued

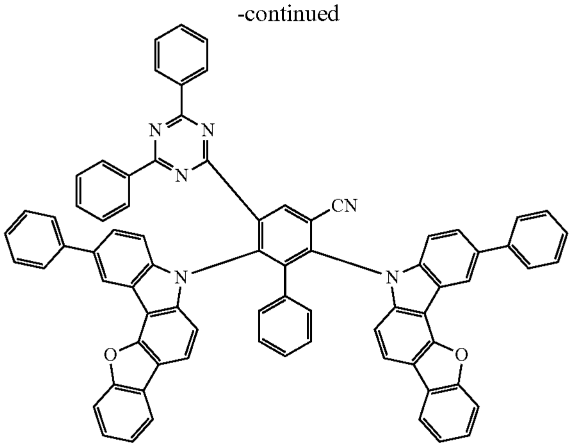

Delayed fluorescence material 3

REFERENCE SIGNS LIST

1: Substrate
2: Anode
3: Hole injection layer
4: Hole transport layer
5: Light emitting layer
6: Electron transport layer
7: Cathode

The invention claimed is:

1. A compound represented by a following formula (1):

Formula (1)

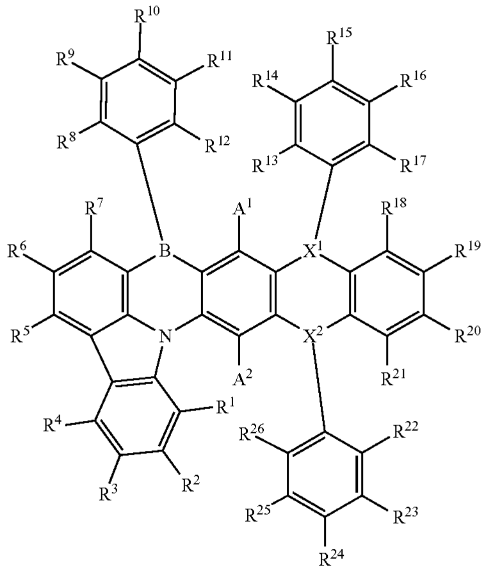

wherein, in the formula (1), one of $X^1$ and $X^2$ is a nitrogen atom, and the other is a boron atom: each of $R^1$ to $R^{26}$, $A^1$, and $A^2$ independently represents a hydrogen atom, a deuterium atom, or a substituent; $R^1$ and $R^2$, $R^2$ and $R^3$, $R^3$ and $R^4$, $R^4$ and $R^5$, $R^5$ and $R^6$, $R^6$ and $R^7$, $R^7$ and $R^8$, $R^8$ and $R^9$, $R^9$ and $R^{10}$, $R^{10}$ and $R^{11}$, $R^{11}$ and $R^{12}$, $R^{13}$ and $R^{14}$, $R^{14}$ and $R^{15}$, $R^{15}$ and $R^{16}$, $R^{16}$ and $R^{17}$, $R^{17}$ and $R^{18}$, $R^{18}$ and $R^{19}$, $R^{19}$ and $R^{20}$, $R^{20}$ and $R^{21}$, $R^{21}$ and $R^{22}$, $R^{22}$ and $R^{23}$, $R^{23}$ and $R^{24}$, $R^{24}$ and $R^{25}$, and $R^{25}$ and $R^{26}$ may be bonded to each other to form ring structures; here, when $X^1$ is a nitrogen atom, $R^{17}$ and $R^{18}$ are bonded to each other to form a single bond and to form a pyrrole ring, and when $X^2$ is a nitrogen atom, $R^{21}$ and $R^{22}$ are bonded to each other to form a single bond and to form a pyrrole ring;

when $X^1$ is a nitrogen atom, $R^7$ and $R^8$ and $R^{21}$ and $R^{22}$ are bonded via nitrogen atoms to form 6-membered rings, and $R^{17}$ and $R^{18}$ are bonded to each other to form a single bond, at least one of $R^1$ to $R^6$ is a substituted or unsubstituted aryl group, or an aromatic ring or a heteroaromatic ring is formed through bonding in any of $R^1$ and $R^2$, $R^2$ and $R^3$, $R^3$ and $R^4$, $R^4$ and $R^5$, and $R^5$ and $R^6$;

when $X^1$ is a boron atom, $X^2$ is a nitrogen atom, and $R^7$ and $R^8$, and $R^{17}$ and $R^{18}$ are bonded to each other to form boron atom-containing ring structures, the ring structure is a 5 to 7-membered ring; in the case of a 6-membered ring, $R^7$ and $R^8$, and $R^{17}$ and $R^{18}$ are bonded to each other to form —B($R^{32}$)—, —CO—, —CS— or —N($R^{77}$)—; $R^{27}$ represents a hydrogen atom, a deuterium atom, or a substituent;

when any of $R^1$ to $R^7$ is a substituted amino group, at least $R^5$ is a substituted amino group;

when $R^7$ and $R^8$ are not bonded to each other to form a ring structure, and at least one of $R^8$ to $R^{12}$ is a substituent, the compound represented by the formula (1) is represented by a following formula (1a) or a following formula (1b):

Formula (1a)

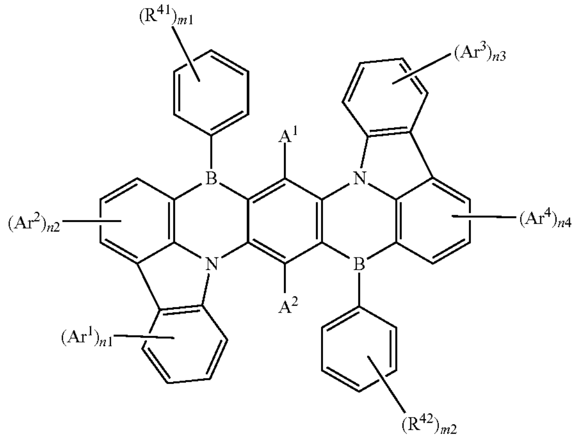

Formula (1b)

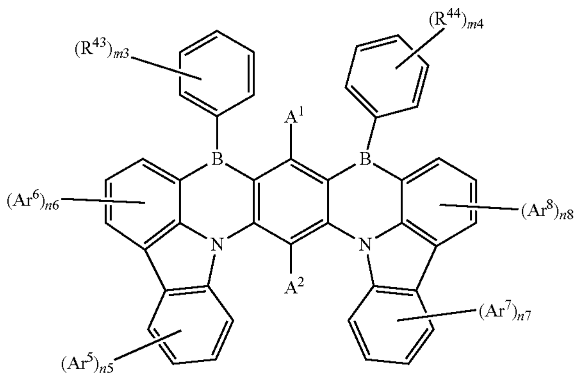

wherein, in the formula (1a), each of $Ar^1$ to $Ar^4$ independently represents a substituted or unsubstituted aryl group, a substituted or unsubstituted heteroaryl group, or a substituted or unsubstituted alkyl group; each of $R^{41}$ and $R^{42}$ independently represents a substituted or unsubstituted alkyl group; each of m1 and m2 independently represents an integer of 1 to 5, each of n1 and n3 independently represents an integer of 0 to 4, and each of n2 and n4 independently represents an integer of 0 to 3; here, at least one of n1 to n4 is 1 or more; each of $A^1$ and $A^2$ independently represents a hydrogen atom, a deuterium atom or a substituent; and in the formula (1b), each of $Ar^5$ to $Ar^8$ independently represents a substituted or unsubstituted aryl group, a substituted or unsubstituted heteroaryl group, or a substituted or unsubstituted alkyl group; each of $R^{43}$ and $R^{44}$ independently represents a substituted or unsubstituted alkyl group; each of m3 and m4 independently represents an integer of 1 to 5, each of n5 and n7 independently represents an integer of 0 to 4, and each of n6 and n8 independently represents an integer of 0 to 3; here, at least one of n5 to n8 is 1 or more; each of $A^1$ and $A^2$ independently represents a hydrogen atom, a deuterium atom, or a substituent.

2. The compound according to claim 1, wherein $X^1$ is a nitrogen atom, and $X^2$ is a boron atom.

3. The compound according to claim 1, wherein $X^1$ is a boron atom, and $X^2$ is a nitrogen atom.

4. The compound according to claim 1, wherein at least one of $R^3$ and $R^6$ is a substituent.

5. The compound according to claim 1, wherein both $R^3$ and $R^6$ are substituents.

6. The compound according to claim 5, wherein the substituent represented by $R^3$ and $R^6$ is one group selected from the group consisting of an alkyl group and an aryl group, or a group formed by combining two or more thereof.

7. The compound according to claim 1, wherein both $R^8$ and $R^{12}$ are substituents.

8. The compound according to claim 7, wherein both $R^8$ and $R^{12}$ are alkyl groups having 3 or more carbon atoms.

9. The compound according to claim 1, which is represented by the formula (1a).

10. The compound according to claim 1, which is represented by the formula (1b).

11. The compound according to claim 1, wherein each of $A^1$ and $A^2$ is independently a group having a Hammett σp value greater than 0.2.

12. The compound according to claim 1, which has a rotationally symmetric structure.

13. The compound according to claim 1, which has any of following structures:

-continued
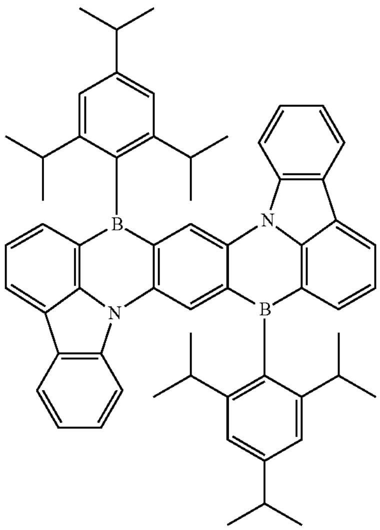
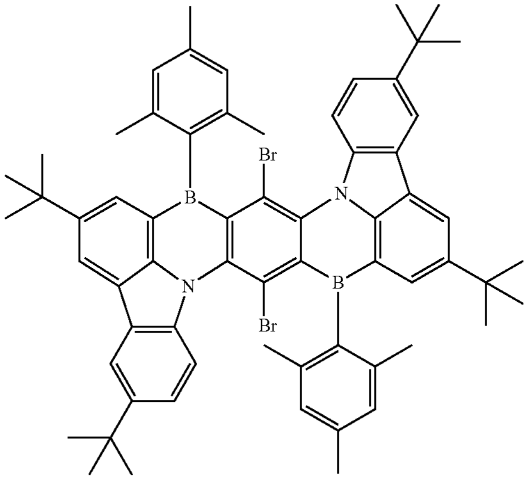
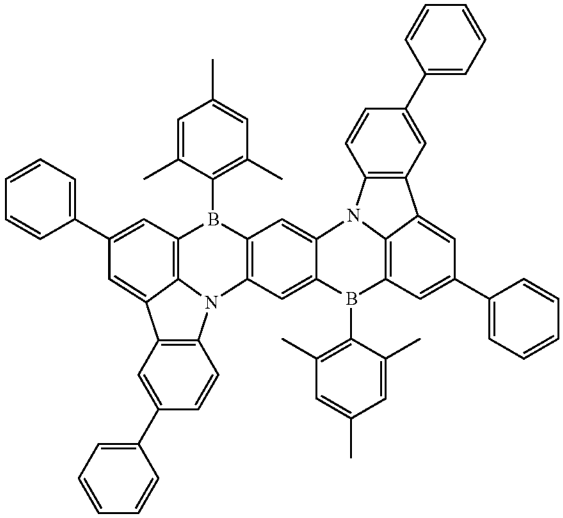
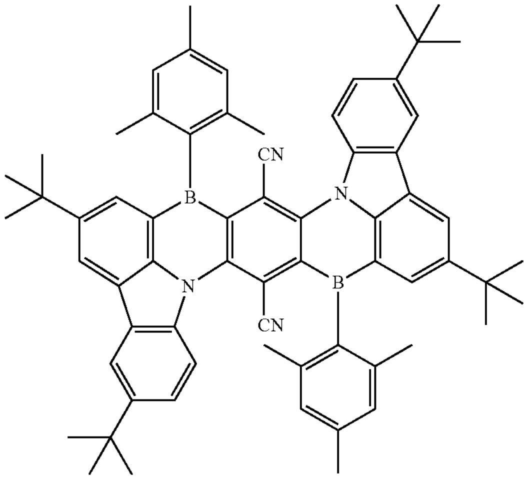
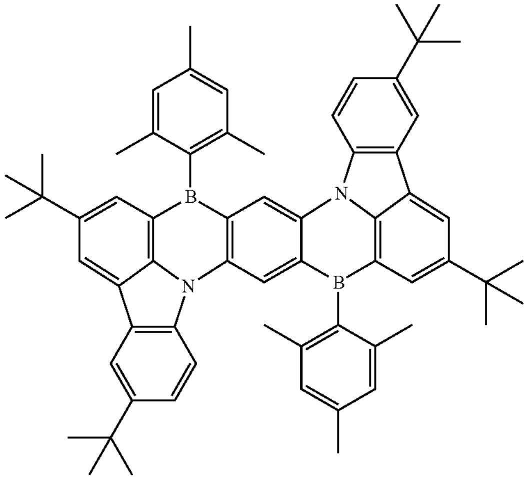
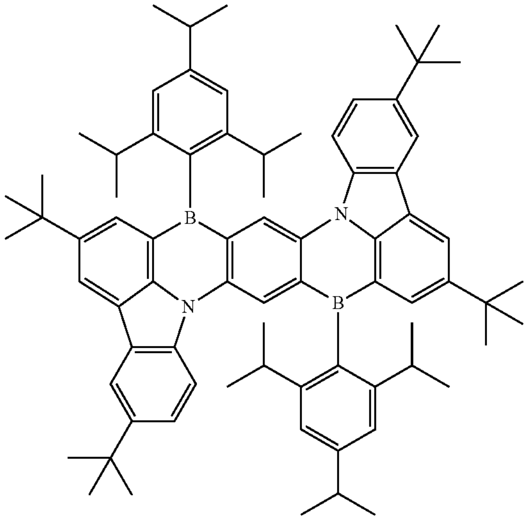

-continued

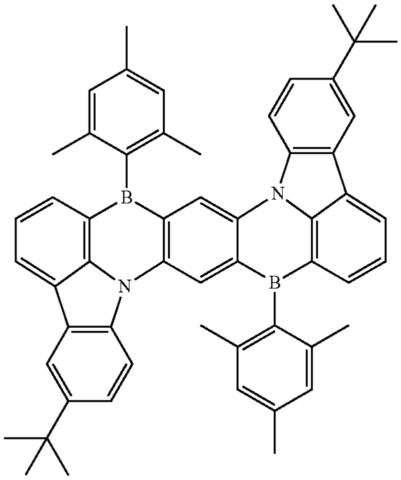

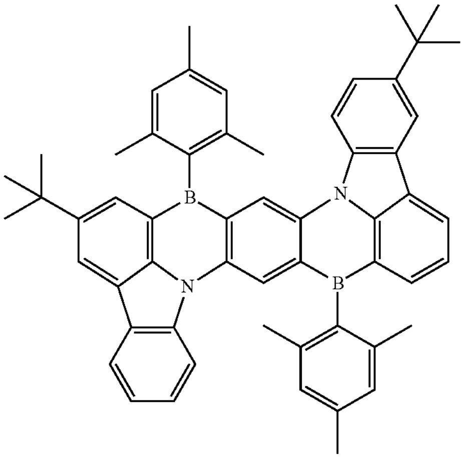

-continued

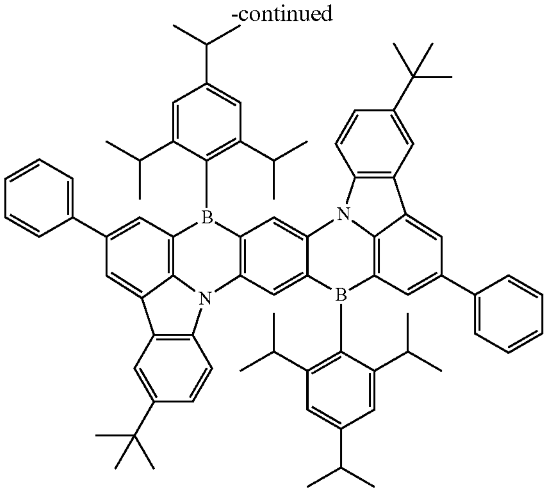

.

14. A light-emitting material comprising the compound according to claim 1.

15. A film comprising the compound according to claim 1.

16. An organic semiconductor device comprising the compound according to claim 1.

17. An organic light-emitting device comprising the compound according to claim 1.

18. The organic light-emitting device according to claim 17, which has a light emitting layer including a host material, a delayed fluorescence material, and the compound, in which among materials included in the device, an amount of light emitted from the compound is the largest.

19. The organic light-emitting device according to claim 17, which emits delayed fluorescence.

* * * * *